(12) United States Patent
Seebauer

(10) Patent No.: US 8,871,670 B2
(45) Date of Patent: Oct. 28, 2014

(54) DEFECT ENGINEERING IN METAL OXIDES VIA SURFACES

(75) Inventor: Edmund G. Seebauer, Urbana, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 0 days.

(21) Appl. No.: 13/343,527

(22) Filed: Jan. 4, 2012

(65) Prior Publication Data

US 2012/0172648 A1 Jul. 5, 2012

Related U.S. Application Data

(60) Provisional application No. 61/429,885, filed on Jan. 5, 2011.

(51) Int. Cl.
*B01J 23/00* (2006.01)
*B01J 23/02* (2006.01)
(Continued)

(52) U.S. Cl.
CPC .............. *B82Y 30/00* (2013.01); *H01L 21/3105* (2013.01); *B01J 27/08* (2013.01); *B01J 27/20* (2013.01); *B01J 27/24* (2013.01); *B01J 23/16* (2013.01); *H01L 21/425* (2013.01); *B01J 21/063* (2013.01); *B01J 35/004* (2013.01); *B01J 37/348* (2013.01); *B01J 37/0207* (2013.01); *B01J 27/14* (2013.01); *B01J 35/002* (2013.01); *H01L 21/465* (2013.01); *B01J 23/06* (2013.01); *B01J 27/10* (2013.01); *B01J 23/38* (2013.01); *B01J 27/12* (2013.01)
USPC .......................................... 502/300; 502/439

(58) Field of Classification Search
None
See application file for complete search history.

(56) References Cited

U.S. PATENT DOCUMENTS 3,959,025 A 5/1976 Polinsky
4,243,865 A 1/1981 Saxena
(Continued)

FOREIGN PATENT DOCUMENTS

JP 06084852 3/1994
JP 10272363 A * 10/1998
(Continued)

OTHER PUBLICATIONS

Hebenstreit et al, bulk defect dependent adsorption on a metal oxide surface: S/ TiO2 (110) 2001, surface science letters, 486.*

(Continued)

*Primary Examiner* — Melvin C Mayes
*Assistant Examiner* — Stefanie Cohen
(74) *Attorney, Agent, or Firm* — Lathrop & Gage LLP

(57) ABSTRACT

The present invention provides methods for controlling defects in materials, including point defects, such as interstitials and vacancies, and extended defects, including dislocations and clusters. Defect control provided by the present invention allows for fabrication and processing of materials and/or structures having a selected abundance, spatial distribution and/or concentration depth profile of one or more types of defects in a material, such as vacancies and/or interstitials in a crystalline material. Methods of the invention are useful for processing materials by controlling defects to access beneficial physical, optical, chemical and/or electronic properties.

38 Claims, 110 Drawing Sheets

(51) Int. Cl.

| | | |
|---|---|---|
| *B82Y 30/00* | (2011.01) | |
| *H01L 21/3105* | (2006.01) | |
| *B01J 27/08* | (2006.01) | |
| *B01J 27/20* | (2006.01) | |
| *B01J 27/24* | (2006.01) | |
| *B01J 23/16* | (2006.01) | |
| *H01L 21/425* | (2006.01) | |
| *B01J 21/06* | (2006.01) | |
| *B01J 35/00* | (2006.01) | |
| *B01J 37/34* | (2006.01) | |
| *B01J 37/02* | (2006.01) | |
| *B01J 27/14* | (2006.01) | |
| *H01L 21/465* | (2006.01) | |
| *B01J 23/06* | (2006.01) | |
| *B01J 27/10* | (2006.01) | |
| *B01J 23/38* | (2006.01) | |
| *B01J 27/12* | (2006.01) | |

(56) References Cited

U.S. PATENT DOCUMENTS

| | | | | |
|---|---|---|---|---|
| 4,750,822 | A * | 6/1988 | Rosencwaig et al. | 356/445 |
| 4,916,107 | A * | 4/1990 | Brand et al. | 502/309 |
| 5,198,372 | A | 3/1993 | Verret | |
| 5,429,708 | A | 7/1995 | Linford et al. | |
| 5,627,090 | A | 5/1997 | Marukawa et al. | |
| 5,731,626 | A | 3/1998 | Eaglesham et al. | |
| 5,766,695 | A | 6/1998 | Nguyen et al. | |
| 5,976,956 | A | 11/1999 | Gardner et al. | |
| 6,043,139 | A | 3/2000 | Eaglesham et al. | |
| 6,106,898 | A | 8/2000 | Takamatsu et al. | |
| 6,218,270 | B1 | 4/2001 | Yasunaga | |
| 6,537,886 | B2 | 3/2003 | Lee | |
| 6,555,451 | B1 | 4/2003 | Kub et al. | |
| 6,713,370 | B2 | 3/2004 | Falster | |
| 6,762,136 | B1 | 7/2004 | Bollinger et al. | |
| 6,897,118 | B1 | 5/2005 | Poon et al. | |
| 6,921,933 | B2 | 7/2005 | Umimoto et al. | |
| 6,941,063 | B2 | 9/2005 | Camm et al. | |
| 7,846,822 | B2 | 12/2010 | Seebauer et al. | |
| 7,968,440 | B2 | 6/2011 | Seebauer | |
| 2001/0002709 | A1 | 6/2001 | Wallace et al. | |
| 2002/0139975 | A1 | 10/2002 | Lewis et al. | |
| 2003/0054641 | A1 | 3/2003 | Binns et al. | |
| 2003/0068866 | A1 | 4/2003 | Chen et al. | |
| 2003/0124821 | A1 | 7/2003 | Robertson | |
| 2006/0024928 | A1* | 2/2006 | Seebauer et al. | 438/514 |
| 2006/0024934 | A1 | 2/2006 | Chan et al. | |
| 2007/0099402 | A1 | 5/2007 | Tseng et al. | |
| 2007/0111350 | A1* | 5/2007 | Weiss et al. | 438/25 |
| 2008/0014763 | A1 | 1/2008 | Lu et al. | |
| 2009/0005238 | A1* | 1/2009 | Falaras | 502/200 |
| 2010/0048005 | A1 | 2/2010 | Seebauer | |
| 2010/0270635 | A1* | 10/2010 | Sickler et al. | 257/431 |
| 2010/0276733 | A1 | 11/2010 | Li | |

FOREIGN PATENT DOCUMENTS

| | | |
|---|---|---|
| WO | WO 98/20525 | 5/1998 |
| WO | WO 01/80295 | 10/2001 |
| WO | WO 03/018465 | 3/2003 |
| WO | WO 03/049163 | 6/2003 |
| WO | WO 03/063218 | 7/2003 |

OTHER PUBLICATIONS

Nazeeruddin et al, Investigation of Sensitizer Adsorption and the Influence of Protons on Current and Voltage of a Dye-Sensitized Nanocrystalline TiO2 Solar Cell, 2003, j phys. chem B.*
Trivich, Photovoltaic Cells and Their Possible Use as Power Converters for Solar Energy, 1953, Ohio Journal of Science: vol. 53, Issue 5, pp. 300-314.*
Buzea et al, Nanomaterials and nanoparticles: Sources and toxicity, Biointerphases vol. 2, issue 4 (2007) pp. MR17-MR172.*
Aroutiounian et al, Manufacture and investigation of hydrogen sensitive TiO2-x or ZnO<Al> film-porous silicon devices, Armenian Journal of Physics, vol. 1, issue 3, 2008, pp. 219-226.*
Adachi et al. (2005) "Issues and Optimization of Millisecond Anneal Process for 45 nm Node and Beyond," Digest of Technical Papers—Symposium on VLSI Technology, IEEE, Kyoto, pp. 142-143.
Advani et al. (1980) "Oxygen Vacancy Diffusion in $SnO_2$ Thin Films," *Int. J. Electronics* 48(5):403-411.
Agarwal et al. (Oct. 5, 1998) "Transient Enhanced Diffusion from Decaborane Molecular Ion Implantation," *Appl. Phys. Lett.* 73(14):2015-2017.
Ahn et al. (2008) "Gas Sensing Properties of Defect-controlled ZnO-nanowire Gas Sensor", *Applied Physics Letters* 93:263103.
Ait-Younes et al. (Mar. 1984) "Isothermal Transport in $TiO_{2-x}$. Part II. Chemical Diffusion in $TiO_{2-x}$," *Solid State Ionics* 12:437-442.
Akbar et al. (May 1997) "Sensing Mechanism of a Carbon Monoxide Sensor Based on Anatase TItania," *J. Electrochem. Soc.* 144(5):1750-1753.
Akse et al. (1978) "Diffusion of Titanium in Slightly Reduced Rutile," *J. Phys. Chem. Solids* 39(5):457-465.
Allen et al. (Jan./Feb. 1996) "Surface Diffusion of In on Si(111): Evidence for Surface Ionization Effects," *J. Vac. Sci. Technol.* A14(1):22-29.
Alvarez et al. (2011) "Conductive-Probe Atomic Force Microscopy Characterization of Silicon Nanowire," *Nanoscale Res. Lett.* 6:110.
Anpo et al. (2005) "The Preparation and Characterization of Highly Efficient Titanium Oxide-Based Photofunctional Materials," *Annu. Rev. Mater. Res.* 35:1-27.
Aono et al. (Nov. 1, 1993) "Interaction and Ordering of Lattice Defects in Oxygen-deficient Rutile TiO2-x," *Phys. Rev. B* 48(17):12406-12414.
Aramendia et al. (2004) "Synthesis and Textural-Structural Characterization of Magnesia, Magnesia—Titania and Magnesia—Zirconia Catalysts," *Colloids Surf., A*, 234:17-25.
Aramendia et al. (2004) "Magnesium-Containing Mixed Oxides as Basic Catalysts: Base Characterization by Carbon Dioxide TPD-MS and Test Reactions," *J. Mol. Catal. A: Chem.* 218:81-90.
Aricò et al. (2001) "An XPS Study on Oxidation States of Pt and its Alloys with Co and Cr and its Relevance to Electroreduction of Oxygen," *Appl. Surf. Sci.*, 172:33-40.
Arita et al. (1979) "Depth Profile Measurement by Secondary Ion Mass-Spectrometry for Determining the Tracer Diffusivity of Oxygen in Rutile", *J. Am. Ceram. Soc.* 62(9-10):443-446.
Asahi et al. (Jul. 13, 2001) "Visible-Light Photocatalysis in Nitrogen-Doped Titanium Oxides," *Science* 293:269-271.
Aspnes et al. (Jul. 26, 1971) "High-Resolution Interband-Energy Measurements from Electroreflectance Spectra," *Phys. Rev. Lett.* 27(4):188-190.
Aspnes, D.E. (Jun. 1973) "Third-Derivative Modulation Spectroscopy with Low-Field Electroreflectance," *Surf. Sci.* 37:418-442.
Augustynski, J. (Jan. 1993) "The Role of the Surface Intermediates in the Photoelectrochemical Behaviour of Anatase and Rutile $TiO_2$," *Electrochim. Acta* 38(1):43-46.
Auriac et all. (2007) "Device Performance Improvement with Nitrogen Implanted During LDD Sequence," Extended Abstracts of the 7th International Workshop on Junction Technology, IEEE, Kyoto, 2007, pp. 13-16.
Axmann et al. (1977) "Implantation Doping of Germanium with Sb, As, and P," *Appl. Phys.* 12(2):173-178.
Baek et al. (Jan./Feb. 2005) "Chararcteristics of Healvily Doped p+/n Ultrashallow Junction Prepared by Plasma Doping and Laser Annealing," *J. Vac. Sci. Technol. B* 23(1):257-261.
Bagshaw et al.. (1976) "Oxygen Tracer Diffusion in Magneli Phases TiNO2n-1", *J. Phys Chem. Solids* 37:835-838.
Baiqi et al. (Feb. 15, 2006) "Enhancement of the Phtotcatalytic Activity of $TiO_2$ Nanopartivcles by Surface-Capping DBS Groups," *Appl. Surf. Sci.* 252(8):2817-2825.
Bak et al. (2003) "Defect Chemistry and Semiconducting Properties of Titanium Dioxide: II. Defect Diagrams", *J. Phys. Chem. Solids* 64:1057-1067.

(56) References Cited

OTHER PUBLICATIONS

Bak et al. (Web Release Aug. 2, 2008) "Effect of Prolonged Oxidation on Semiconducting Properties of Titanium Dioxide," *J. Phys. Chem. C* 112(34):13248-13257.
Bak et al. (Web Release Oct. 10, 2006) "Defect Disorder of Titanium Dioxide," *J. Phys.Chem. B* 110(43):21560-21567.
Baker et al. (1979)"Electron microscopy of supported metal particles II. Further studies of Pt/TiO2" *J. Catal.* 59(2):293-302.
Baker et al. (1983) "Electron Microscopy of supported metal particles:III. The role of the metal in an SMSI interaction" *J. Catal.* 79(2):348-358.
Bally et al. (1998) "Structural and Electrical Properties of Fe-Doped $TiO_2$ Thin Films," *J. Phys. D: Appl. Phys.*, 31(10):1149-1154.
Bao et al. (Web Release Feb. 28, 2006) "Broadband ZnO Single-Nanowire Light-Emitting Diode", *Nano Letters* 6(8):1719-1722.
Baratto et al. (Jul. 16, 2009) "Luminescence Response of ZnO Nanowires to Gas Adsorption," *Sens. Actuators B* 140(2):461-466.
Barrett et al. (Jun. 20, 2006) "Single-Reactor Process for Sequential Aldol-Condensation and Hydrogenation of Biomass-Derived Compounds in Water," *Appl. Catal., B*, 66(1-2):111-118.
Baruah et al. (Web Release Apr. 6, 2009) "Photoreactivity of ZnO Nanoparticles in Visible Light: Effect of Surface States on Electron Transfer Reaction," *J. Appl. Phys.* 105(7):074308.
Baumard et al. (1977) "Electrical Conductivity and Charge Compensation in Nb Doped $TiO_2$ Rutile," *The Journal of Chemical Physics* 67(3):857-860.
Baumberger et al. (Dec. 15, 2000) "Step-Induced One-Dimensional Surface State on Cu(332)," *Phys. Rev. B.* 62(23):15431-15434.
Baumvol (Dec. 1999) "Atomic Transport During Growth of Ultrathin Dielectrics on Silicon," *Surf. Sci. Rep.* 36(1-8):1-166.
Beaumont et al. (Sep. 2001) "Epitaxial Lateral Overgrowth of GaN," *Phys. Status Solidi B* 227(1):1-43.
Bennett et al. (2008) "Vacancy Engineering for Highly Activated 'Diffusionless' Boron Doping in Bulk Silicon," In: Proceedings of the 38th European Solid-State Device Research Conference, IEEE, Edinburgh, pp. 290-293.
Bernasik et al. (1994) "Electrical Surface Versus Bulk Properties of Fe-Doped $TiO_2$ Single Crystals," *Solid State Ionics* 72:12-18.
Bernstein et al. (Mar. 1, 2000) Atomistic Simulations of Solid-Phase Epitaxial Growth in Silicon, *Phys. Rev. B* 61(10):6696-6700.
Binari et al. (Jun. 2002) "Trapping Effects in GaN and SiC Microwave FETs," *Proc. IEEE* 90(6):1048-1058.
Blomiley et al. (Web Release Mar. 5, 1999) "New Approach to Manipulating and Characterizing Powdered Phtotadsorbents: NO On Cl-Treated $Fe_2O_3$," *Langmuir* 15(18):5970-5976.
Blumenthal et al. (Apr. 1966) "Electrical Conductivity of Nonstoichiometric Rutile Single Crystals from 1000° to 1500° C.," *J. Phys. Chem. Solids* 27(4):643-654.
Bonasewicz et al. (1982) "Diffusion of Zinc and Oxygen in Nonstoichiometric Zinc Oxide," *Transport in Non-Stoichiometric Compounds. Proceedings of the First International Conference,*, pp. 153-174.
Bond, G.C. (1997) "Preparation and Properties of Vanadia/Titania Monolayer Catalysts," *Appl. Catalysis A* 157:91-103.
Borkar (2004) "Temperatures and Kinetic of Anatase to Rutile Transformation in Doped $TiO_2$ Heated in Microwae Field," *J. Therm. Anal. Calorim.* 78:761-767.
Borland et al. (May 2006) "Annealing Techniques for Optimizing 45nm-Node USjs," *Solid State Technol.* 49-50:47-54.
Boschloo et al. (1997) "Investigation of the Potential Distribution in Porous Nanocrystalline $TiO_2$ Electrodes by Electrolyte Electroreflection," *J. Electroanal. Chem.* 428:25-32.
Boyes et al. (Feb. 21, 1985) "Cathodoluminescence of Catalyst Crystallites," *Nature* 313:666-668.
Bozzi et al. (2005) "Self-Cleaning of Wool-Polyamide and Polyester Textiles by $TiO_2$-Rutile Modification Under Daylight Irradiation at Ambient Temperature," *J. Photochem. Photobiol.* 172(1):27-34.
Bracht et al. (Jul. 13, 1998) "Silicon Self-Diffusion in Isotope Heterostructurs," *Phys. Rev. Lett.* 81(2):393-396.

Bracht et al. (Nov. 2, 2000) "Large Disparity Between Gallium and Antimony Self-Diffusion in Gallium Antimonide," *Nature* 408:69-72.
Bracht, H. (Jun. 2000) "Diffusion Mechanisms and Intrinsic Point-Defect Properties in Silicon," *MRS Bull.* 25:22-27.
Bratschun, A. (1999) "The Application of Rapid Thermal Processing Technology to the Manufacture of Integrated Circuits—An Overview," *J. Electron. Mater.* 28(12):1328-1332.
Breckenridge et al. (1953) Electrical Properties of Titanium Dioxide Semiconductors, *Phys. Rev.* 91(4):793-802.
Bu et al. (May 20, 1994) "Surface Chemistry of $N_2H_2$ on Si(100)-2x1," *Surf. Sci.* 311:385-394.
Bunluesin et al. (1996) "A Compatison of CO Oxidation on Ceria-Supported Pt, Pd, and Rh," *Catal. Lett.* 41:1-5.
Burda et al. (Web Release Jul. 9, 2003) "Enhanced Nitrogen Doping in $TiO_2$ Nanoparticles," *Nano Lett.* 3(8):1049-1051.
Burke et al. (1995) "Formation and Reuction of Hydrous Oxide Films on Platinum in Aqueous Solution at 273K," *J. Appl. Electrochem.* 25:913-922.
Burton et al. (Web Release Jan. 9, 2009) "Atomic Layer Deposition of MgO Using Bis(ethylcyclopentadienyl) Magnesium and $H_2O$," *J. Phys. Chem. C* 113(5):1939-1946.
Bush et al. (1994) "The Sodium Promoted Nitridation of Si(100)-2x1 Using $N_2$ Molecular Beams," *Surf. Sci.* 313:179-187.
Campbell, S.A. (2001) *The Science and Engineering of Microelectronic Fabrication*, $2^{nd}$ ed., New York, Oxford, pp. 16-21,98-122.
Cardona et al. (Feb. 15, 1967) "Electroreflectance at Semiconductor-Electrolyte Interface," *Phys. Rev.* 154(3):696-720.
Carlson et al. (Nov. 1, 1993) "Adsorption/Desorption Kinetics of $H_2O$ on GaAs(100) Measured by Photoreflectance," *J. Chem. Phys.* 99(9):7190-7197.
Castellanos et al. (Mar. 1, 1993) "Surface Magnetism: A Monte Carlo Study of Surface Critical Behavior," *Phys. Rev. B* 47(9):5037-5040.
Castleton et al. (2004) "Finite-Size Scaling as a VUre for Supercell Approximation Errors in Calculations of Neutral Native Defects in InP," *Phys. Rev. B* 70(19):195202.
Castleton et al. (2006) "Managing the Supercell Approximation for Charged Defects in Semicondictors: Finite-Size Scaling, Charge Correction Factors, the Band-Gap Problem, and the ab initio Dielectric Constant," *Phys. Rev. B* 73(3):035215.
Centoni et al. (2005) "First-Principles Calculation of Intrinsic Defect Formation Volumes in Silicon," *Phys. Rev. B* 72(19):195206.
Chadi et al. (Oct. 12, 1987) "Stabilities of Single-Layer and Bilayer Steps on Si(001) Surfaces," *Phys. Rev. Lett.* 59(15):1691-1694.
Chan et al. (2003) "Vacancy Charging on Si(200)-(2x1): Consequences for Surface Diffusion and STM Imaging," *Phys. Rev. B* 67(3):035311.
Chang et al. (Web Release Sep. 27, 2006) "High-Performance ZnO Nanowire Field Effect Transistors," *Appl. Phys. Lett.* 89(13):133113.
Chason et al. (May 15, 1997) "Ion Beams in Silicon Processing and Characterization," *J. Appl. Phys.* 81(10):6513-6561.
Chen et al. (1983) "Metal-Semiconductor Catalyst: Photocatalytic and Electrochemical Behavior of Pt—$TiO_2$ for the Water-Gas Shift Reaction," *J. Mol. Catal.* 21:275-289.
Cherif et al. (1991) "Surface Properties of Si(111) 7x7 Upon NH3 Adsorption and Vacuum Annealing," *Surf. Sci.* 351:113-120.
Chheda et al. (Web Release Jan. 7, 2007) "An Overview of Dehydration, Aldol-Condensation and Hydrogenation Process for Production of Liquid Alkanes from Biomass-Derived Carbohydrates," *Catal. Today* 123:59-70.
Cho et al. (2006) "First-Principles Study of Point Defects in Rutile $TiO_{2-x}$," *Physical Review B* 73(19):193202-193205.
Choi et al. (Dec. 1994) "The Role of Metal Ion Dopants in Quantum-Sized $TiO_2$: Correlation between Photoreactivity and Charge Carrier Recombination Dynamics," *J. Phys. Chem.* 98(51):13669-13679.
Chong et al. (May 29, 2009) "Annealing of Ultrashallow $p+/n$ Junction by 248 nm Excimer Laser and Rapid Thermal Processing with Difference Preamorphization Depths," *Appl. Phys. Lett.* 76(22):3197-3199.
Chu, P.K. (2003) "Semiconductor Applications of Plasma Immersion Ion Implantation," *Plasma Phys. Control. Fusion* 45:555-570.
Claeys et al. (2008) "Defect Engineering Aspects of Advanced Ge Process Modules," *Mater. Sci. Eng. B* 154-155:49-55.

(56) References Cited

OTHER PUBLICATIONS

Claverie et al. (2003) "Extended Defects in Shallow Implants," *Appl. Phys. A* 76:1025-1033.
Comini et al. (2007) "Single Crystal ZnO Nanowires as Optical and Conductometric Chemical Sensor," *J. Phys. D: Appl. Phys.* 40:7255-7259.
Comini et al. (2009) "Quasi-One Dimensional Metal Oxide Semiconductors: Preparation, Characterization and Application as Chemical Sensors," *Prog. Mater. Sci.* 54:1-67.
Comini, E. (Web Release Dec. 1, 2005) "Metal Oxide Nano-Crystals for Gas Sensing," *Anal. Chim. Acta* 568:28-40.
Cowern et al. (1997) "Low Energy Implantation and Transient Enhanced Diffusion: Physical Mechanisms and Technology Implications," *Mat. Res. Soc. Symp. Proc.* 469:265-276.
Cowern et al. (2005) "Understanding, Modeling and Optimizing Vacancy Engineering for Stable Highly Boron-Doped Ultrashallow Junctions," Technical Digest—International Electron Devices Meeting, IEEE, Washington, DC, pp. 968-971.
Cowern et al. (2008) "Vacancy Engineering—An Ultra-Low Thermal Budget Method for High-Concentration 'Diffusionless' Implantation Doping," *Mater. Sci. Forum* 573-574:295-304.
Cowern et al. (Dec. 15, 1990) "Transient Diffusion of Ion-Implanted B in Sl: Does, Time and Matrix Dependence of Atomic and Electrical Profiles," *J. Appl. Phys.* 68(12):6191-6196.
Cowern et al. (Jul. 8, 1991) "Experiments on Atomic-Scale Mechanisms of Diffusion," *Phys. Rev. Lett.* 67(2):212-215.
Cowern et al. (Nov. 5, 1990) "Impurity Diffusion Via an Intermediate Species: The B—Si System," *Phys. Rev. Lett.* 65(19):2434-2437.
Cowern et al. (Web Release Mar. 1, 2005) "Mechanisms of B Deactivation Control by F Co-Implantation," *Appl. Phys. Lett.* 86(10):101905.
Cronemeyer (Mar. 1, 1959) "Infrared Absorption of Reduced Rutils $TiO_2$ Single Crystals," *Phys. Rev.* 113(5):1222-1226.
Cui et al. (Web Release Jan. 1, 2003) "High Performance Silicon Nanowire Field Effect Transistors," *Nano Lett.* 3(2):149-152.
Current et al. (1993) "Defect Engineering of $P^+$-Junctions by Multiple-Species Ion Implantation," *Nucl. Instrum. Meth. Phys. Res. B* 74:175-180.
Dalton et al. (2004) "Structure and Mobility on Amorphous Silicon Surfaces," *Surf. Sci.* 550:140-148.
David et al. (1989) "Coherent Surface Fluorescence Versus Thermally Activated Energy Transfer to the Bulk in the Anthracene Crystal: Model Calculations and Some Experimental Results," *Chem. Phys.* 132:31-39.
De Souza et al. (2008) "Using $^{18}O/^{16}O$ Exchange to Probe an Rquilibrium Space-Charge Layer at the Surface of a Crystaline Oxide: Method and Application," *Physical Chemistry Chemical Physics* 10(17):2356-2367.
Demond et al. (Feb. 14, 1983) "Study of Si Self-Diffusion by Nuclear Techniques," *Phys. Lett.* 93A(19):503-506.
Derry et al. (1981) "A Study of Oxygen Self-Diffusion in the c-direction of Rutile using a Nuclear Technique", J. Phys. Chem. Solids 42(1):57-64.
Dev et al. (2002) "Measurement of Fermi Pinning at Si—SiO2 Interfaces: Implications for TED Spike Anneals," *Rapid Thermal and Other Short-Time Processing Technologies III* (ECS vol. PV-2002-11) :357-362.
Dev et al. (2003) "Surface Vacancy Charging on Semiconductors at Nonzero Temperatures," *Phys. Rev. B.* 67:035312(1-4).
Dev et al. (2003) "Vacancy Charging on Si(111)-(7x7) Investigated by Density Functional Theory," *Surf. Sci.* 538:L495-L499.
Dev et al. (2004) "Band Bending at the Si(111)—$SiO_2$ Interface Induced by Low-Energy Ion Bombardment," *Surf. Sci.* 550:185-191.
Dev et al. (Nov. 11, 2003) "Mechanism for Coupling Between Properties of Interfaces and Bulk Semiconductors," *Phys. Rev. B* 68:195311.
Dev et al. (Nov. 20, 2004) "Vacancy Charging on Si(1 1 1)-'1x1' Investigated by Density Functional Theory," *Surface Science* 572(2-3):483-489.

Dev et al. (Web Release Apr. 7, 2005) "Band Bending at the Si(100)—$Si_3N_4$ Interface Studied by Photoreflectance Spectroscopy," *Surf. Sci.* 583:80-87.
Di Valentin et al. (2005) "Theory of Carbon Doping of Titanium Dioxide," *Chem. Mater.* 17:6656-6665.
Diamant et al. (Web Release Feb. 11, 2003) "Core-Shell Nanoporous Electrode for Dye Sensitized Solar Cells," *J. Phys. Chem. B* 107:1977-1981.
Diebold (2003) "The Surface Science of Titanium Dioxide," Surface Science Reports, 48:53-229.
Ditchfield et al. (Feb. 8, 1999) "Direct Measurement of Ion-Influences Surface Diffusion," *Phys. Rev. Lett.* 82(6):1185-1188.
Ditchfield et al. (2001) "Semiconductor Surface Diffusion: Effects of Low-Energy Ion Bombardment," *Phys. Rev. B.* 63:125317.
Ditchfield et al. (Aug. 10, 1998) "Nonthermal Effects of Photon Illumination on Surface Diffusion," *Phys. Rev. Lett.* 81(6):1259-1262.
Ditchflield et al. (May 15, 2000) "Semiconductor Surface Diffusion: Nonthermal Effects of Photon Illumination," *Phys. Rev. B* 61(20):13710-13720.
Diwald et al. (Web Release Dec. 1, 2003) "The Effect of Nitrogen Ion Implantation on the Photoactivity of $TiO_2$ Rutile Singel Crystals," *J. Phys. Chem. B* 108(1):52-57.
Djurisic et al. (Web Release Jul. 18, 2006) "Optical Properties of ZnO Nanostructures", Small 2(8-9):944-961.
Dodson (Jul. 1, 1991) "Chemical effects in sub-keV ion-solid interactions" *Nucl. Instrum. Methods Phys. Res. B* 59-60(Part 1):481-486.
Dornberger et al. (Aug. 2001) "Modeling of Transient point defect dynamics in Czochralski silicon crystals" *J. Cryst. Growth* 230(1-2):291-299.
Downey et al. (1999) "Effects of 'Fast' Rapid Thermal Anneals on Sub-keV Boron and $BF_2$ Ion Implants," *J. Electronic Mater.* 28(12):1340-1343.
Drucker et al. (1991) "Biased Secondary Electron Imaging of Monatomic Surface Steps on Vicinal Si(100) in a UHV STEM," *Ultramicroscopy* 35:323-328.
Du et al. (May 1990) "Activation Energy Distribution in Temperature-Programmed Desorption: Modeling and Application to the Soot-Oxygen System," *Energy and Fuels* 4(3):296-302.
Duffy et al. (Web Release May 7, 2004) "Boron Diffusion in Amorphous Silicon and the Role of Fluorine," Appl. Phys. Lett. 84(21):4283-4285.
Dufour et al. (1994) "Contrasted Behavior of Si(001) and Si(111) Surfaces to NH/sub 3/ Adsorption and Thermal Nitridation: A N 1s and Si 2p Core Level Study with Sychrotron Radiation," *Surf. Sci.* 304:33-.
Dunlap Jr., W.C. (Jun. 15, 1954) "Diffusion of Impurities in Germanium," *Phys. Rev.* 94(6):1531-1540.
Eaglesham (Nov. 1995) "Dopants, Defects and Diffusion," *Phys. World* 8:41-46.
Earles et al. (Jul. 2002) "Nonmelt Laser Annealing of 5-KeV and 1-KeV Boron-Implanted Silicon," *IEEE Trans. Electron Devices* 49(7):1118-1123.
Edwards et al. (Apr. 2005) "Improved Reliability of AlGaN—GaN HEMTs Using an $NH_3$ Plasma Treatment Prior to SiN Passivation," IEEE Electron Device Lett. 26(4):225-227.
Enache et al. (2004) "The Photoresponse od Iron- and Carbon-Doped TiO2 (Anatase) Photoelectrodes," *J. Electroceram.* 13:177-182.
Erhart et al. (2006) "First-principles study of intrinsic point defects in ZnO: Role of band structure, volume relaxation, and finite-size effects," Physical Review B 73:115207.
Faglia et al. (Web Release Dec. 28, 2004) "Adsorption Effects of $NO_2$ at mm, Level on Visible Photoluminescene of $SnO_2$ Nanobelts," *Appl. Phys. Lett.* 86(1):011923.
Fahey et al. (Apr. 1989) "Point Defects and Dopant Diffusion in Silicon," *Rev. Mod. Phys.* 61(2):289-384.
Fair et al. (Apr. 15, 1998) "Photonic Effects in the Deactivation of Ion Implanted Arsenic," *J. Appl. Phys.* 83(8):4081-4090.
Fan et al. (2005) "Gate-Refrechable Nanowire Chemical Sensors," *Appl. Phys. Lett.* 86:123510.
Fan et al. (May 15, 1990) "Role of Recoil Implanted Oxygen in Determining Boron Diffusion in Silicon," *J. Appl. Phys.* 67(10):6135-6140.

(56) References Cited

OTHER PUBLICATIONS

Fergus, J.W. (2003) "Doping and Defect Association in Oxides for Use in Oxygen Sensors," *Mater. Sci.* 38:4259-4270.
Florakis et al. (Dec. 2, 2006) "Laser annealing of plasma implanted boron for ultra-shallow junctions in Silicon" *Nucl. Instrum. Methods Phys. Res. B* 253(1):13-17.
Foggiato et al. (2005) "Millisecond Flash Annealing: Application for USJ Formation and Optimization of Device Electrical Characteristics," *Mater. Sci. Eng. B* 124:219-222.
Forland (1964) "The Defect Structure of Rutile," *Acta Chemica Scandinavica* 18(5):16-20.
Franco et al. (Jul. 28, 1997) "Local Structure of $NH_2$ on Si(100)-(2x1) and Its Effect on the Asymmetry of the Si Surface Dimers," *Phys. Rev. Lett.* 79(4):673-676.
Frank et al. (1984) "Diffusion in Silicon and Germanium," In; *Diffusion in Crystalline Solids*, Murch et al. Eds., Academic Press, New York, pp. 63-142.
Fujishima et al. (1972) "Electrochemical Photolysis of Water at a Semiconductor Electrode," *Nature* 238:37-38.
Fujishima et al. (2000) "Titanium Dioxide Phtocatalysis," *J.Photochem. Photobiol.* 1:1-21.
Fukami et al. (Jul. 1, 2002) "Effects of Sputtering Atmosphere Oxygen Pressure on Photocatalytic Phenomena in Anatase Films," *Jap. J. Appl. Phys., Part 2 Lett.* 41:L794-L796.
Fukata et al. (Aug. 15, 2001) "Vacancy Formation Energy of Silicon Determined by a New Quenching Method," *Jpn. J. Appl. Phys.* 40:L854-L856.
Gai et al. (Jan. 23, 2009) "Design a of Narrow-Gap $TiO_2$: A Passivated Codoping Approach for Enhanced Photoelectrochemical Activity," *Phys. Rev. Lett.* 102:036402.
Gao et al. (1996) "Thermal Stability and the Role of Oxygen Vacancy Defects in Strong Metal Support Interaction—Pt on Nb-Doped $TiO_2(100)$," *Surf. Sci.* 365:638-648.
Gardeniers et al. (Jun. 15, 1998) "Preferred Orientation and Piezoelectricity in Sputtered ZnO Films", Journal of Applied Physics 83(12):7844-7854.
Gärtner, B. Weber (2003) "Molecular Dynamics Simulations of Solid-Phase Epitaxial Growth in Silicon," *Nucl. Instrum. Methods Phys. Res. B* 202:255-260.
Geburt (2008) "Rare Earth Doped Zinc Oxide Nanowires," *J. Nanosci. Nanotechnol.* 8(1):244-251.
Geisz et al. (Web Release Jul. 10, 2007) "High-Efficiency GaInP/GaAs/InGaAs Triple-Junction Solar Cells Grown Inverted with a Metamorphic Bottom Junction," *Appl. Phys. Lett.* 91(2):023502.
Gelpey et al. (2008) "Ultra-Shallow Junction Formation Using Flash Annealing and Advanced Doping Techniques," Extended Abstracts of the 8th International Workshop on Junction Technology, IEEE, Shanghai, pp. 82-86.
Ghicov et al. (Web Release Apr. 27, 2006) "Ion Implantation and Annealing for an Efficient N-Doping of $TiO_2$ Nanotubes," *Nano Lett.* 6(5):1080-1082.
Gillespie et al. (May 15, 2009) "Atomistic examinations of the solid-phase epitaxial growth of silicon" *J. Cryst. Growth* 311(11):3195-3203.
Girginoudi et al. (Aug. 2008) "Comparative Study on EOR and deep Level defects in preamophised Si implanted with B+, BF2, and F+—B+" *Nucl. Instrum. Methods Phys. Res. B* 266(16):3565-3576.
Gole et al. (2004) "Highly Efficient Formation of Visible Light Tunable $ATiO_{2-x}N_x$ Photocatalysts and Their Transformation at the Nanoscale," *J. Phys. Chem. B* 108:1230-1240.
Gorai et al. (Oct 17, 2011) "Electrostatic Coupling of Surface Charge to Bulk Defect Behavior in Metal Oxides," Abstract 172d, Presented at the 2011 AIChE Annual Meeting, Minneapolis MI.
Gorai et al. (Oct 19, 2011) "Control of Oxygen Self-Diffusion in Metal Oxides for Nanoelectronics," Abstract 604e, Presented at the 2011 AIChE Annual Meeting, Minneapolis MI.
Gossmann et al. (Sep. 11, 1995) Behavior of Intrinsic Si Point Defects During Annealing in Vacuum, *Appl. Phys. Lett.* 75:1558-1560.
Gossmann, H.L. (Jan./Feb. 2008) "Junction Formation and its Device Impact Through the Nodes: From Single to Coimplantsm From Beam Line to Plasma, from Single Ions to Clusters, and from Rapid Thermal Annealing to Laser Thermal Processing," *J. Vac. Sci. Technol. B* 26:267-272.
Goto et al. (1996) "Novel Shallow Junction Technology Using Decaborane ($B_{10}H_{14}$)," Technical Digest International Electron Devices Meeting, IEEE, pp. 435-438.
Gracia et al. (Web Release Oct. 14, 2004) "Structural, Optical, and Photoelectrical Properties of $M^{n+}$-$TiO_2$ Model Thin Film Photocatalysts," *J. Phys. Chem. B* 108(45):17466-17476.
Gratzel, M. (Nov. 15, 2001) "Photoelectrochemical Cells," *Nature* 414:338-344.
Grätzel, M. (Web Release Sep. 26, 2003) "Dye-Sensitized Solar Cells," *J. Photochem. Photobiol. C* 4(2):145-153.
Gregus et al. (1993) "Low-Temperature Plasma Etching of GaAs, AlGaAs, and AlAs," *Plasma Chem. Plasma Process* 13(3):521-537.
Gruenwald et al. (1971) "Oxygen Diffusion in Single Crystals of Titanium Dioxide," *J. Inorg. Nuc. Chem.* 33:1151-1155.
Guha et al. (Dec. 6, 1993) "Degradation of II-VI Based Blue-Green Light Emitters," *Appl. Phys. Lett.* 63(23):3107-3109.
Gunawan et al. (2002) "Identification of Kinetic Parameters in a Multidimensional Crystallization Process," *Int. J. Modern. Phys. B* 16(1-2):367-374.
Gunawan et al. (2004) "Optimal Control of Rapid Thermal Annealing in a Semiconductor Process," *J. Process Control* 14:423-430.
Gunawan et al. (Aug. 2003) "Maximum A Posteriori Estimation of Transient Enhanced Diffusion Energetics," *AIChE J.* 49(8):2114-2123.
Gunawan et al. (Web Release Oct. 10, 2003) "Parameter Sensitivity Analysis Applied to Modeling Transient Enhanced Diffusion and Activation of Boron in Silicon," *J. Electrochem. Soc.* 150(12):G758-G765.
Guo et al. (2008) "Characterization of Integrated Tin Oxide Gas Sensors with Metal Additives and Ion Implantations," *IEEE Sens. J.* 8:1397-1398.
Gwilliam et al. (2006) Ultra-Shallow Junction Formation in SOI Using Vacancy Engineering, *AIP Conf. Proc.* 876:181-190.
Gyulai et al. (Jan. 1994) "Athermal Effects in Ion Implanted Layers," *Rad. Effects Defects Solids* 127:397-404.
Ha et al. (Web Release May 4, 2008) "Photoluminescence of ZnO Nanowires Dependent on $O_2$ and Ar Annealing," *J. Phys. Chem. Solids* 69(10):2453-2456.
Haber et al. (1997) "Vanadium Pentoxide I: Structure and Properties," *Appl. Catal. A* 157:3-22.
Hakala et al. (Mar. 15, 2000) "First-Principles Calculations of Interstitial Boron in Silicon," *Phys. Rev. B* 61(12):8155-8161.
Hallen et al. (Jul. 7, 1999) "Migration Energy for the Silicon Self-Interstitial," *J. Appl. Phys.* 86(1):214-216.
Haneda et al. (1999) "Oxygen Diffusion in Single and Poly-Crystalline Zinc Oxides", Journal of Electroceramics 4:41.
Hasegawa et al. (Jul./Aug. 2003) "Mechanisms of Currect Collapse and Gate Leakage Currents in AlGaN/GaN Heterostructures Fiels Effect Transistors," *J. Vac. Sci. Technol. B* 21(4):1844-1855.
Hashizume et al. (Web Release May 25, 2004) "Leakage Mechanism in GaN and AlGaN Schottky Interfaces," *Appl. Phys. Lett.* 84(24):4884-4886.
Haul et al. (1965) "Sauerstoff-Selbstdiffusion in Rutilkristallen", J. Phys. Chem. Solids 26(1):1-10.
He et al. (2005) "Ab Initio Calculations of Intrinsic Defects in Rutile $TiO_2$," *Journal of American Ceramics Society* 88(3):737-741.
He et al. (2007) "Prediction of High-Temperature Point Defect Formation in $TiO_2$ from Combined ab initio and Thermodynamic Calculations," *Acta Materialia* 55(13):4325-4337.
Hebenstreit et al. (2001) "Sulfur on $TiO_2(110)$ Studied with Resonant Photoemission," *Physical Review B* 64(11):115418.
Hebenstreit et al. (Jan. 1, 2001) "Structures of Sulfur on $TiO_2(1\ 1\ 0)$ Determined by Scanning Tunneling Microscopy, X-Ray Photoelectron Spectroscopy and Low-Energy Electron Diffraction," *Surface Science* 470(3):347-360.
Heegemann et al. (1975) "The Adsorption of Sulfur on the (100) and (111) Faces of Platinum: A LEED and AES Study," *Surface Science* 49(1):161-180.

(56) References Cited

OTHER PUBLICATIONS

Heinrich et al. (May 31, 1976) "Observation of Two-Dimensional Phases Associated with Defect States on the Surface of $TiO_2$," *Phys. Rev. Lett.* 36(22):1335-1339.

Henderson (1999) "A Surface Perspective on Self-diffusion in Rutile TiO2", *Surface Science* 419:174-187.

Heo et al. (2006) "Sub-15 nm $n^+$/p-Germanium Shallow Junction Formed by $PH_3$ Plasma Doping and Excimer Laser Annealing," *Electrochem. Solid-State Lett.* 9:G136-G137.

Heo et al. (Web Release Dec. 15, 2006) "Ultrashallow (<10 nm) $p+/n$ Junction Formaed by $B_{18}H_{22}$ Cluster Ion Implantation and Excimer Laser Annealing," *Appl. Phys. Lett.* 89(24):243516.

Hermann et al. (1999) "Electronic Properties, Structure and Adsorption at Vanadium Oxide: Density Functional Studies," *Faraday Discuss* 114:53-.

Hersam et al. (Feb. 12, 2001) "Atomic-Level Study of the Robustness of the Si(100)-2x1:H Surface Following Exposure to Ambient Conditions," *Appl. Phys. Lett.* 78(7):886-888.

Hirvonen et al. (Nov. 1, 1979) "Self-Diffusion in Silicon as Probed by the (p,γ) Resonance Broadening Method," *Appl. Phys. Lett.* 35(9):703-705.

Hitosugi et al. (2008) "Electronic Band Structure of Transparent Conductor: Nb-Doped Anatase $TiO_2$," *Appl. Phys. Express* 1:111203.

Hlil et al. (Apr. 15, 1987) "Photoemission Study of Ammonia Dissociation on Si(100) Below 700K," *Phys. Rev. B.* 35(11):5913-5916.

Hoffmann et al. (Jan. 1995) "Environmental Applications of Semiconductor Photocatalysis," *Chem. Rev.* 95(1):69-96.

Hollister, A.G. (2010) "New Mechanisms for Defect Engineering in Titanium Dioxide," PhD Dissertation, University of Illinois, Urbana, Illinois.

Hori et al. (1986) "Rapid Oxidation of No to $NO_2$ at ppm Concentration Level in a Heterogeneous Photocatalytic Reaction on Metal Oxide Powders," *Chem. Lett.* 15:(11):1845-1848.

Hoshino et al. (1985) "Diffusion and Point Defects in $TiO_{2-x}$," *J. Phys. Chem. Solids* 46(12):1397-1411.

Houssain et al. (2007) "Reactivity of Ideal and Defected Rutile $TiO_2$ (110) Surface with Oxygen," *Adv. Appl. Ceramics* 106:95-100.

Hu, S.M. (1994) "Nonequilibrium Point Defects and Diffusion in Silicon," *Mater. Sci. Eng. R* 13:105-192.

Huang (2007) "Chemical Sensors Based on Nanostructures Materials," *Sens. Actuators B* 122:659-671.

Huang et al. (2009) "First-Principles Study of Diffusion of Oxygen Vacancies and Interstitials in ZnO," *J. Phys. Condens. Matter* 21:195403.

Huang et al. (Oct. 3, 1994) "Influence of Fluorine Preamorphization on the Diffusion and Activation of Low-Energy Implanted Boron During Rapid Thermal Annealing," *Appl. Phys. Lett.* 65(14):1829-1831.

Huang et al. (Web Release Oct. 19, 2005) "Germanium $n+/p$ Junction Formation by Laser Thermal Process," *Appl. Phys. Lett.* 87(17):173507.

Huber et al. (Jun. 3, 2005) "Production of Liquid Alkanes by Aqueous-Phase Processing of Biomass-Derived Carbohydrates," *Science* 308:1446-1450.

Ibusuki et al. (Feb. 22, 1994) "Removal of Low Concentration Nitrogen Oxides Through Photoassisted Heterogeneous Catalysis," *J. Mol. Catal.* 88(1):93-102.

Iguchi et al. (1972) "Diffusion of Oxygen Vacancies in Reduced Rutile (TiO2)", *J. Phy. Soc. Jpn.* 32 (1972) 1415-1422.

Ihara et al. (2001) "Preparation of a Visible-Light-Active $TiO_2$ Photocatalyst by RF Plasma Treatment," *J. Mater. Sci.* 36:4201-4207.

Ikeda et al. (1993) "Space Charge Segregation at Grain Boundaries in Titanium Dioxide: I, Relationship Between Lattice Defect Chamistry and Space Charge Potential," *J. Am. Ceram. Soc.* 76(10):2437-2446.

Impellizzeri et al. (Mar. 15, 2004) "Role of Fluorine in Suppressinf Boron Transient Enhanced Diffusion in Preamorphized Si," *Appl. Phys. Lett.* 84(11):1862-1864.

Impellizzeri et al. (Web Release Mar. 1, 2009) "B Activation and Clustering in Ion-Implanted Ge," *J. Appl. Phys.* 105:063533.

Irie et al. (Wed Release May 17, 2003) "Nitrogen-Concentration Dependence on Photocatalytic Activity of $TiO_{2-x}N_x$ Powders," *J. Phys. Chem. B* 107(23):5483-5486.

Ishikawa et al. (Dec. 1997) "Diffusion of Phosphorus and Boron into Silicon at Low Temperatures by Heating with Light Irradiation," *Jpn. J. Appl. Phys.* 36:7433-7436.

Ito et al. (2002) "10-15nm Ultrashallow Junction Formation by Flash-Lamp Annealing," *Jpn. J. Appl. Phys.* 41:2394-2398.

Jacques et al. (2003) "Fluorine-Enhanced Boron Diffusion in Amorphous Silicon," *Appl. Phys. Lett.* 82(20):3469-3471.

Jain et al. (Jun. 1, 2002) "Transient Enhanced Diffusion of Boron in Si," *J. Appl. Phys.* 91(11):8919-8941.

Jana et al. (2002) "Low Temperature Silicon Oxide and Nitride for Surface Passivation of Silicon Solar Cells," *Solar Energy Mater. Solar Cells* 71:197-211.

Jie et al. (2008) "Surface-Dominated Transport Properties of Silicon Nanowires," *Adv. Funct. Mater.* 18:3251-3257.

Johnson et al. (2000) "Static Dynamic Electron Holography of Electrically ActiveGrain Boundaries in $SrTiO_3$," *Interface Sci.* 8:189-198.

Jones et al. (1998) "Shallow Junction Doping Technologies for ULSI," *Mater. Sci. Eng.* R24:1-80.

Jung et al. (2002) "Measurement of Nonthermal Illumination-Enhanced Diffusion in Silicon," In; *Rapid Thermal and Other Short-Time Processing Technologies III*, Electrochemical Society.

Jung et al. (2002) "Measurement of Nonthermal Illumination-Enhanced Diffusion in Silicon," *Proceedings of the $10^{th}$ IEEE International Conference on Advanced Thermal Processing of Semiconductors* 133-135.

Jung et al. (2004) "Measurement of Nonthermal Illumination-Enhanced Self-Diffusion in Silicon," Proc. Fourth International Workshop on Junction Technology, (Fudan Univ Press, Shanghai) 87-89.

Jung et al. (2004) "Pair Diffusion and Kick-Out: Quantifying Relative Contributions to Diffusion of Boron in Silicon," *AIChE J.* 50(12):3248-3256.

Jung et al. (2005) "Interstitial Charge States in Boron-Implanted Silicon," *J. Appl. Phys.* 97(6):063520.

Jung et al. (Feb. 1, 2004) "Effect of Near-Surface Band Bending on Dopant Profiles in Ion-Implanted Silicon," *J. Appl. Phys* 95(3):1134-1140.

Jung et al. (Web Release Nov. 18, 2003) "A Simplified Picture for Transient Enhanced Diffusion of Boron in Silicon," *J. Electrochem. Soc.* 151(1):G1-G7.

Jung et al. (Web Release Nov. 3, 2003) "Ramp-Rate Effects on Transient Enhanced Diffusion and Dopant Activation: A Simple Explanation," *J. Electrochem. Soc.* 150(12):G838-G842.

Jung. M.Y.L. (2003) "New surface and optically stimulated physics for modeling diffusion in si," Ph.D. thesis, University of Illinois at Urbana-Champaign.

Kanata et al. (Nov. 15, 1990) "Photoreflectance Characterization of Surface Fermi Level in as-Grown GaAs(100)," *J. Appl. Phys.* 68(10):5309-5313.

Kansal et al. (2007) "Studies on Photoderadation of Two Commercial Dyes in Aqueous Phase Using Different Photocatalysts," *J. Hazard. Mater.* 141:581-590.

Kapoor et al. (Feb. 1997) "Measurement of Solid State Diffusion Coefficients by a Temperature-Programmed Method," *J. Mater. Res.* 12(2):467-473.

Karakasidis et al. (1994) "A Comment on a Rigid-Ion Potential for $UO_2$," *J Phys. Condens. Matter* 6(15):2965-2969.

Kase et al. (Sep. 1995) "Photoassisted Chemisorption of No on ZnO," *J. Phys. Chem.* 99(36):13307-13309.

Kato et al. (1996) "Adsorbed State and Thermal Reactions of $_{N2O}$ on Si(100) Below Room Temperature: Desorption Induced by Dissociations," *Surf. Sci.* 351:43-52.

Kawasaki et al. (Aug. 2, 2005) "Ultra-shallow junction formation by B18H22 ion implantation" *Nucl. Instrum. Methods Phys. Res. B* 237(1):25-29.

Keem et al. (2007) "Enhanced Performance of ZnO Nanowire Field Effect Transistors by $H_2$ Annealing," *Jpn. J. Appl. Phys.* 46:6230-6232.

Keier et al. (1956) *Doklady Akad. Nauk. S.S.S.R.* 106(5):859-861.

(56) References Cited

OTHER PUBLICATIONS

Keith et al. (2008) "Ab initio Free Energy of Vacancy Formation and Mass-Action Kinetics in Vis-Active $TiO_2$," *Journal of Physics Condensed Matter* 20(2):022202.
Khan et al. (2002) "Efficient Photochemical Water Splitting by a Chemically Modified n—$TiO_2$," *Science* 297:2243-2245.
Khatiri et al. (2004) "Atomic Hydrogen Cleaning of GaAs(0 0 1): A Scanning Tunnelling Microscopy Study," *Surf. Sci.* L1-L6.
Kim et al. (2000) "Annealing of $CH_3I$ Films on $TiO_2$(110) Studied with TPD and UV-Induced Esorption," *Surf. Sci.* 445:177-185.
King et al. (Web Release May 4, 2007) "40% Efficient Metamorphic GaInP/GaInAs/Ge Multijunction Solar Cells," *Appl. Phys. Lett.* 90(18):183516.
Kirichenko et al. (Jul. 7, 2004) "Interactions of Neutral Vacancies and Interstitials with the Si(001) Surface," *Phys. Rev. B* 70:045321:1-7.
Kirichenko et al. (Web Release Jul. 28, 2004) "Surface Chemistry Effects on Vacancy and Interstitial Annihilation on Si(001)," *Physica Status Solidi B* 241(10):2303-2312.
Kisliuk (1957) "The Sticking Probabilities of Gases Chemisorbed on the Surfaces of Solids," *J. Phys. Chem. Solids* 3:95-101.
Kisliuk (1958) "The Sticking Probabilities of Gases Chemisorbed on the Surfaces of Solids-II," *J. Phys. Chem. Solids* 5:78-84.
Kofstad (1967) "Note on the Defect Structure of Rutile ($TiO_2$)," *J. Less Common Metals* 13:635-638.
Kofstad, P. (1962) "Thermogravimetric Studies of the Defect Structure of Rutile ($TiO_2$)," *J. Phys. Chem. Solids* 23:1579-1586.
Kolmakov et al. (2004) "Chemical Sensing and Catalysis by One-Dimensional Metal-Oxide Nanostructures," *Annu. Rev. Mater. Res.* 34:151-180.
Kondo et al. (Aug. 15, 1976) "Symmetry Analysis and Uniaxial-Stress Effect on the Low Field Electroreflectance of Si from 3.0 to 4.0 eV," *Phys. Rev. B* 14(4):1577-1592.
Kondratenko et al. (Dec. 2010) "Directed Self-Assembly by Photostimulation of an Amorphous Semiconductor Surface," *AIChE J.* 56(12):3206-3211.
Kowal et al. (Apr. 2009) "Ternary $Pt/Rh/SnO_2$ Electrocatalysts for Oxidizing Ethanol to $Co_2$," *Nat. Mater.* 8:325-330.
Ku et al. (Web Release Sep. 11, 2006) "Effects of Germanium and Carbon Coimplants on Phosphorus Diffusion in Silicon," *Appl. Phys. Lett.* 89(11):112104.
Kucheyev et al. (2004) "Ion-Beam-Defect Process in Group-III Nitrides and ZnO," *Vacuum* 73:93-104.
Kulak et al. (Aug. 2001) "Electrolyte Electroreflectance Study of $TiO_2$ Films Modified with Metal Nanoparticles," *J. Mater. Res.* 16(8):2357-2361.
Kulkarni (2005) "A Selevctive Review of the Quantification of Deect Dynamics in Growing Czochralski Silicon Crystals," *Ind. Eng. Chem. Res.* 44:6246-6263.
Kulkarni (Jan. 15, 2008) "Defect dynamics in the presence of nitrogen in growing Czochralski silicon crystals" *J. Cryst. Growth* 310(2):324-335.
Kulkarni (May 15, 2007) "Defect dynamics in the presence of oxygen in growing Czochralski silicon crystals" *J. Cryst. Growth* 303(2):438-448.
Kunkes et al. (Oct. 17, 2008) "Catalytic Conversion of Biomass to Monofunctional Hydrocarbons and Targeted Liquid-Fuel Classes," *Science* 322:417-421.
Kunkes et al. (2009) "Vapour-phase C-C Coupling reactions of biomass derived Oxygenates over Pd/CeZrOx catalysts" *J. Catal.* 266(2):236-249.
Kuronen et al. (1999) "Defect Creation by Low-Energy Ion Bombardment as GaAs (0 0 1) and Ge (0 0 1) Surfaces," *Nucl. Instrum. Methods Phys. Res. B* 153:209-212.
Kurtz et al. (1999) "InGaAsN Solar Cells with 1.0 eV Band Gap, Lattice Matched to GaAs," *Appl. Phys. Lett.* 74(5):729-731.
Kwok et al. (Web Release Jul. 8, 2005) "A Method for Quantifying Annihilation Rates of Bulk Point Defects at Surfaces," *J. Appl. Phys.* 98(1):013524.

Kwok et al. (Web Release Mar. 19, 2009) "Mechanistic Benefits of Millisecond Annealing for Diffusion and Activation or Boron in Silicon," *J. Appl. Phys.* 105(6):063514.
Kwok, Tsz Mei (2007) "Advanced Methods for Defect Engineering in Silicon," PhD Thesis, University of Illinois, 233 pages.
Kwon et al. (Web Release Jan. 17, 2010) "Atomic Structure of Conducting Nanofilaments in $TiO_2$ Resistive Switching Memory," *Nat. Nanotechnol.* 5:148-153.
Lambrecht et al. (1983) "Electronic Structure of Bulk and Surface Vanadyl Oxygen Vacancies in the Layer Compound $V_2O_5$," *Surf. Sci.* 126:558-564.
Lang (1982) *Ann. Rev. Mat. Sci* 12.
Lao et al. (Web Release Mar. 1, 2007) Enhancing the Electrical and Optoelectronic Performance of Nanobelt Devices by Molecular Surface Functionalization, *Nano Lett.* 7(5):1323-1328.
Larsen et al. (2005) "Unexpected Activity of Palladium on Vanadia Catalysts for Fromic Acid Electro-Oxidation," *Electrochem. Solid-State Lett.* 8:A291-A293.
Lautenschlager et al. (Sep. 15, 1987) "Temperature Dependence of the Dielectric Function and Interband Critical Points in Silicon," *Phys. Rev. B* 36(9):4821-4830.
Lee et al. (1992) "Analysis of Nonlinear Mott-Schottky Plots Obtained from Anodically Passivating Amorphous and Polycrystalline $TiO_2$ Films," *J. Appl. Electrochem.* 22:156-160.
Lee et al. (1998) "First-Principles Study of the Self-Interstitial Diffusion Mechanism in Silicon," *J. Phys Condens. Matter* 10:995-1002.
Lee et al. (Aug. 15, 1998) "First-Principles Study of the Dissociative Adsorption of $NH_3$ on the Si(100) Surface," *Phys. Rev. B* 58(8):4903-4908.
Lee et al. (Jan. 16, 2006) "Unusual Oxygen Re-Equilibration Kinetics of $TiO_{2-\delta}$," *Solid State Ionics* 177:1-9.
Lee et al. (May 15, 1998) "Synergetic Effects in Annealing and Low Energy Ion Bombardment of Si(100) Surfaces," *J. Appl. Phys.* 83(10):5217-5223.
Lei et al. (Web Release Mar. 23, 2004) "Tuning Electronic Properties of $In_2O_3$ Nanowires by doping Control," *Appl. Phys. A* 79:439-442.
Lento et al. (2002) "Charged Point Defects in Semiconductors and the Supercell Approximation," *J. Phys.: Condens. Matter.* 14:2637-2645.
Lerch et al. (1999) "Boron Ultrashadow Junction Formation in Silicon by Low Energy Implantation and Rapid Thermal Annealing in Inert and Oxidizing Ambient," *J. Electrochem. Soc.* 146(7):2670-2678.
Lerch et al. (2005) "Advanced Activation of Ultra-Shallow Junctions Using Flash-Assisted RTP," *Mater. Sci. Eng. B* 124-125:24-31.
Lettieri et al. (2008) "On the Mechanism of Photoluminescence Quenching in Tin Dioxide Nanowires by $NO_2$ Adsorption," *New J. Phys.* 10:043013.
Li et al. (1998) "Oxygen-induced Restructuring of the Rutile TiO2(110)(1 1) Surface," *Surface Sci.* 414:L951-L956.
Li et al. (2000) "The Influence of the Bulk Reduction State on the Surface Structure and Morphology of Rutile TiO2(110) Single Crystals", *Journal of Physical Chemistry B* 104:4944-4950.
Li et al. (2002) "Gas Sensing Properties of p-Type Semiconducting Cr-Doped $TiO_2$ Thin Films," *Sens. Actuators B* 83:160-163.
Li et al. (2002) "The Enhanceent of Photodegratation Efficiency Using Pt-$TiO_2$ Catalyst," *Chemosphere* 48(10):1103-1111.
Li et al. (2003) "Strong Metal-Support Interaction and Catalytic Properties of Anatase and Rutile Supported Palladium Catalyst Pd/$TiO_2$," *Chem. Phys. Lett.* 372(1-2):160-165.
Li et al. (2003) "Synthesis of Nitrogen-Containing ZnO Powders by Spray Pyrolysis and Their Visible-Light Photocatalysis in Gas-Phase Acetaldehyde Decomposition," *J. Photochem. Photobiol. A* 155:171-178.
Li et al. (2009) "Energetics of Charges Point Defects in Rutile TiO2 by Density Functional Theory," *Acta Materialia* 57(19):5882-5891.
Li et al. (Feb. 15, 2007) "Morphology Change of Oxygen-restructured TiO2(110) Surfaces by UHV Annealing: Formation of a Low-temperature (1 2) Structure," *Phys. Rev. B* 61(7):4926-4933.

(56) References Cited

OTHER PUBLICATIONS

Liao et al. (2009) "Calculation of Electronic Structure of Anatase $TiO_2$ Doped with Transition Metal V, Cr, FE and Cu Atoms by the Linearized Augmented Planr Wave Method," *Chinese J. Struct. Chem.* 28(7):869-873.

Liao et al. (Web Release Oct. 23, 2007) "The Sensitivity of Gas Sensor Based on Single ZnO Nanowire Modulated by Helium Ion Radiation," *Appl. Phys. Lett.* 91(17):173110.

Lin et al. (Dec. 10, 2001) "Enhanced Dopant Activation and Elimination of End-of-Range Defects in $BF^+_2$-Implanted Silicon-on-Insulator by High-Density Current," *Appl. Phys. Lett.* 79(24):3971-3973.

Linsebigler et al. (May 1, 1995) "Photocatalysis on $TiO_2$ Surfaces: Principles, Mechanisms, and Selected Results," *Chem. Rev.* 95(3):735-758.

Liu et al. (1996) "Higher Performance 0.2 μm CMOS with Å Gate Ocide Grown on Nitrogen Implanted Si Substrates," Technical Digest—International Electron Devices Meeting, IEEE, pp. 499-502.

Liu et al. (2004) "Sonoelectrical Methods of Preparing Silver-Coated $TiO_2$ Nanoparticles with Extremely High Coverage," *J. Electroanal. Chem.* 574:71-75.

Loh et al. (1995) "The Interaction of Azomethane with Si(100)," 341:92-105.

Lojek et al. (2001) "Athermal Annealing of Ion-Implanted Silicon," *9th Int. Conference on Advnaced Thermal Processing of Semiconductors—RTP'* 2001 :125-131.

Lundy et al. (1973) "CAtion Self Diffusion in Rutile (*)," *Journal de Physique Colloques* 34:C9-299-C299-302.

Luo et al. (Web Release Jan. 30, 2004) "Photocatalytic Activity Enhancing for Titanium Dioxide by Co-Doping with Bromine and Chlorine," *Chem. Mater.* 16(5)846-849.

Ma et al. (Web Release Mar. 15, 2003) "Robust Identification and Control of Batch Processes," *Comp. Chem. Eng.* 27:1175-1184.

Mackrodt et al. (1979) "Defect Properties of Ionic Solids: III. The Calculation of the Point-Defect Structure of the Alkaline-Earth Oxides dn CdO," *J. Phys.* C12(23):5015-5036.

Maeng et al. (Web Release Mar. 28, 2006) "Thermal and Plasma-Enhanced ALD of Ta and Ti Oxide Thin Films from Alkylamide Precursors," *Electrochem. Solid-State Lett.* 9(6):G191-G194.

Makeev et al. (Sep. 7, 1998) "Effect of Surface Roughness on the Secondary Ion Yield in Sputtering," *Appl. Phys. Lett.* 73(10):1445-1447.

Makov et al. (Feb. 15, 1995) "Peridic Boundary Conditions in ab initio Calculations," *Phys. Rev. B* 51(7)4014-4022.

Mariz et al. (Jan. 1, 1987) "Influence of the Interaction Anisotropy on the Appearance of Surface Magnetism," *Europhysics Lett.* 3(1):27-31.

Marqués et al. (2006) "Characterization of Octedecaborane Implantation into Si Using Molecular Dynamics," *Phys. Rev. B* 74(20):201201.

Marton et al. (May/Jun. 1998) "Synergetic Effects in Ion Beam Energy and Substrate Temperature During Hyperthermal Particle Film Deposition," *J. Vac. Sci. Technol. A* 16(3):1321-1326.

Marucco et al. (1981) "Thermogravimetric and Electrical Study of Nonstoichiometric Titanium-Dioxide TiO2-X between 800 and 1100 Degrees-C," *J. Phys. Chem. Solids* 42:363-367.

Mascher et al. (Dec. 15, 1989) "Positron Trapping Rates and Their Temperature Dependencies in Electron-Irradiated Silicon," *Phys. Rev. B* 40(17):11764-11771.

Masters et al. (Jun. 1, 1966) "Silicon Self-Diffusion," *Appl. Phys. Lett.* 8(11):280-281.

Mata et al. (Oct. 1, 1982) "Thin Ferromagnetic Films on Nonmagnetic Metallic Substrates: A Model Calculation," *Phys. Rev. B* 26(7):3841-3845.

Matsui et al. (Web Release Jun. 20, 2005) "Epitaxial Growth and Characteristics of N-Doped Anatase $TiO_2$ Films Grown Using a Free-Radical Nitrogen Oxide Source," *J. Appl. Phys.* 97(12):123511.

Mattsson et al. (Web Release Feb. 9, 2009) "Oxygen Diffusion and Photon-Induced Decmposition of Acetone on Zr- and Nb-Doped $TiO_2$ Nanoparticles," *J. Phys. Chem. C* 113(9):3810-3818.

McCarty et al. (Aug. 9, 2001) "Vacancies in Solids and the Stability of Surface Morphology," *Nature* 412:622-625.

McCarty et al. (Jan. 2003) "Role of Bulk Thermal Defects in the Reconstruction Dynamics of the TiO2(110) Surface," *Phys. Rev. Lett.* 90(4):046104.

McEllistren et al. (Apr. 19, 1993) "Electrostatic Sample-Tip Interactions in the Scanning Tunneling Microscope," *Phys. Rev. Lett.* 70(16): 2471-2474.

Mendicino et al. (1993) "Detailed In-Situ Monitoring of Film Growth: Application to $TiSi_2$ CVD," *J. Cryst. Growth* 134:377-385.

Millot et al. (1988) "Oxygen Self-Diffusion in Non-Stoichiometric Rutile $TiO_{2-x}$ at High Temperature," *Solid State Ionics* 28-30:1344-1348.

Miotto et al. (2003) "Adsorption of $NH_3$ on Ge(001)," *Phys. Rev. B* 68(11):115436.

Mitra et al. (1998) "ZnO Thin Film Sensor," *Materials Letters* 35:33-38.

Miyagi et al. (2001) "Deep Level Transient Spectroscopy Analysis of an Anatase Epitaxial Film Grown by Metal Organic Vapor Deposition," *Jpn. J. Appl. Phys.*, Part 2, 40:L404-L406.

Miyagi et al. (Feb. 10, 2004) "Photocatalytic Property and Deep Levels of Nb-Doped Anatase $TiO_2$ Film Grown by Metalorganic Chemical Vapor Deposition," *Jpn. J. Appl. Phys.*43(2):775-776.

Miyauchi et al. (May 2002) "Photocatalysis and Photoinduced hydrophilicity of various metal oxide thin films" *Chem. Mater.* 14(6):2812-2816.

Mizukoshi et al. (Web Release May 20, 2009) "Visible Light Responses of SUlfor-Doped Rutile Titanium Dioxide Photocatalysts Fabricated by Anodic Oxidation," *Appl. Catal., B* 91:152-156.

Mizuno et al. (2008) "Plasma Doping (PD) for Ultra-Shallow Junction," Extended Abstracts of the 8th International Workshop on Junction Technology, IEEE, Shanghai, pp. 20-24.

Mizuno et al. (2008) "Production-Worthy Approach of Plasma Doping (PD)," In: Proceedings of the 9th International Conference on Solid-State and Integrated Circuits Technology, IEEE, Beijing, pp. 1288-1291.

Mizushima et al. (1979) "Impurity Levels of Iron-Group Ions in $TiO_2(II)$," *J. Phys. Chem. Solids* 40:1129-1140.

Mizushima et al. (Jun. 1972) "Energy Levels of Iron Group Impurities in $TiO_2$," *J. Phys. Soc. Jpn.* 32(6):1519-1524.

Mochizuki et al. (2007) "Photo0Induced Defects of Metal Oxides: MgO and Rutile $TiO_2$," *Physica B* 401-402:426-429.

Monakhov et al. (Wed Release Nov. 3, 2005) "The Effect of Excimer Laser Pretratment on Diffusion and Activation of Boron Implanted in Silicon," *Appl. Phys. Lett.* 87(19):192109.

Monch (Jan. 1994) "Metal-semiconductor contacts:electronic properties" *Surf. Sci.* 299-300:928-44.

Morelon et al.(2003) "A New Empirical Potential for Simulating the Formation of Defects and their Mobility in Uranium Dioxide," *Philosophical Magazine* 83(13):1533-1555.

Moroz et al. (Web Release Jul 26, 2005) "Optimizing Boron Junctions Through Point Defect and Stress Engineering Using Carbon and Germanium Co-Implants," *Appl. Phys. Lett.* 87(5):051908.

Moslehi et al. (Feb. 1985) "Thermal Nitridation of Si and $SiO_2$ for VLSI," *IEEE Trans. Electron. Dev.* 32(2):106-123.

Müller (2007) "Fundamentals of Melt Growth," Perspectives on Inorganic, Organic and Biological Crystal Growth: From Fundamentals to Applications: Based on the lectures presented at the 13th International Summer School on Crystal Growth, Park City, UT, USA, pp. 3-33.

Müller (2007) "Review: The Czochralski Method—Where we are 90 Years after Jan Czochralski's Invention," *Cryst. Res. Technol.* 42(12):1150-1161.

Mulmi, et al. (Web Release Mar. 16, 2004) "Optical and Electric Properties of Nb-Doped Anatase $TiO_2$ Single Crystal," *J. Phys. Chem. Solids* 65:1181-1185.

Musket et al. (1982) "Preparation of Atomically Clean Surfaces of Selected Elements: A Review," *Applications Surface Sci.* 10:143-207.

Nakabayashi et al. (Jun. 2003) "Self-Diffusion in Intrinsic and Extrinsic Silicon Using Isotopically Pure [30]Silicon/Natural Silicon Heterostructures," *Jpn. J. Appl. Phys.* 42:3304-3310.

(56) References Cited

OTHER PUBLICATIONS

Nakamura et al. (2000) "Role of Oxygen Vacancy in the Plasma-Treated $TiO_2$ Photocatalyst with Visible Light Activity for NO Removal," *J. Mol. Catal. A: Chem.* 161:205-212.
Nakos et al. (2008) "The Expanding Role of Rapid Thermal Processng in CMOS Manufacturing," *Mater. Sci. Forum* 573-574:3-19.
Na-Phattalung et al. (Mar. 31, 2006) "First-Princciples Study of Native Defects in Anatase $TiO_2$," *Physical Review B* 73(12):125205-125210.
Napolitani et al. (Dec. 17, 2001) "Complete Suppression of the Transient Enhanced Diffusion of B Implanted in Preamorphized Si by Interstitial Trapping in a Spatially Separated C-Rich Layer," *Appl. Phys. Lett.* 79(25):4145-4147.
Navale et al. (Web Release Mar. 23, 2007) "Low Temperature Synthesis and NOx Sensing Properties of Nanostructured Al-doped ZnO," *Sensors and Actuators B: Chemical* 126:382-386.
Neff et al. (May 15, 1996) "Structural, Optical, and Electronic Properties of Magnetron-Sputtered Platinum Oxide Films," *J. Appl. Phys.* 79(10):7672-7675.
Newman et al. (Web Release Oct. 8, 2004) "Tellurium Surfactant Effects in the Growth of Lattice Mismatched $InAs_xP_{1-x}$ by Metal Organic Vapor-Phase Epitaxy," *J. Cryst. Growth* 272:650-657.
Nguyen et al. (Web Release May 2003) "Epiaxial directional growth of indium-doped tin oxide nanowire arrays" *Nano Lett.* 3(7):925-928.
Ni et al. (2007) "A Review and Recent Developments in Photocatalytic Water-Splitting Using $TiO_2$ for Hydrogen Production," *Renew. Sust. Energ. Rev.* 11:401-425.
Niimi et al. (Nov./Dec. 1999) "Monolayer-Level Controlled Incorporation of Nitrogen at $Si—SiO_2$ Interfaces Using Remote Plasma Processing," *J. Vac. Sci. Technol.* 17(6):3185-3196.
Nitta et al. (2002) "Formation of Anomalous Defect Structure on GaSb Surface by Low Temperature Sn Ion-Implantation," *Mater. Trans.* 43(4):674-680.
Noel et al. (1998) "Optical Effects During Rapid Thermal Diffusion," *J. Electron. Mat.* 27(12):1315-1322.
Noel et al. (May 18, 1998) "Impact of Ultraviolet Light During Rapid Thermal Diffusion," *Appl. Phys. Lett.* 72(20):2583-2585.
Noh (2010) "Defect Engineering of Metal Oxide Semiconductors," Masters of Science Thesis, Chemical & Biomolecular Engineering, University of Illinois.
Nowotny (Web Release Aug. 25, 2006) "TiO2 Surface Active Sites for Water Splitting" *Journal of Phyical Chemistry B* 110(37):18492-18495.
Nowotny et al. (Web Release Aug. 1, 2006) "Electrical Properties and defect chemistry of TiO2 single crystal IV. Prolonged oxidation kinetics and chemical diffusion" *The Journal of Physical Chemistry B* 110(33):16302-16308.
Nowotny et al. (Web Release Aug. 1, 2006) "Electrical properties and Defect Chemistry of TiO2 Single Crystal III. Equilibration Kinetics and chemical diffusion" *J. Phys. Chem. B.* 110(33):16292-16301.
Nowotny et al. (Web Release Jun. 9, 2007) "Effect of Grain Boundaries on Semiconducting Properties of $TiO_2$ at Elevated Temperatures," *J. Phys. Chem. C* 111(27):9769-9778.
Nowotny et al. (Web Release Mar. 18, 2008) "Defect Chemistry of titanium dioxide application of defect engineering in processing of TiO2 Based Photocatalysts"*J. Phys. Chem. C* 112(14): 5275-5300.
Office Action and Response, Corresponding to U.S. Appl. No. 11/192,339, Mailed between May 10, 2010 and Aug. 27, 2010.
Office Actions and Responses, Corresponding to U.S. Appl. No. 11/192,339, Mailed Between Jun. 29, 2007 and Oct. 26, 2009.
Ohno et al. (2003) "Photocatalytic Activity of S-Doped TiO2 Photocatalyst under Visible Light," *Chem. Lett.* 32(4):364-365.
Ohyu et al. (Mar. 1990) "Advantages of FLuoring Introduction in Boron Implanted Shallow $P^+$/n-Junction Formation," *Jpn. J. Appl. Phys.* 29(3):457-462.
Okino et al. (Nov. 1997) "Self-Interstitials in Silicon," *Jpn. J. Appl. Phys.* 36:6591-6594.

Osorio-Guillen et al. (Jan. 25, 2008) "Atomic Control of Conductivity Versus Ferromagnetism in Wide-Gap Oxides Via Selective Doping: V, Nb, Ta in Anatase $TiO_2$," *Phys. Rev. Lett.* 100:036601.
Osterwalder et al. (Web Release May 5, 2005) "Growth of Cr-Doped $TiO_2$ Films in the Rutile and Anatase Structures by Oxygen Plasma Assisted Molecular Beam Epitaxy," *Thin Solid Films* 484:289-298.
Ozgur et al. (Web Release Aug. 30, 2005) "A Comprehensive Review of ZnO Materials and Devices", *Journal of Applied Physics* 98:041301.
Paloura et al. (Jul. 14, 1986) "Silicon nitride films grown on silicon below 300° C. in low power nitrogen plasma," *Appl. Phys. Lett.* 45(2):97-99.
Papaefthimiou et al. (1998) "Performance of Doped $Pt/TiO_2$ ($W^{6+}$) Catalysts for Combustion of Volatile Organic Compounds," (VOCs), *Appl. Catal., B* 15:75-92.
Park et al. (Web Dec. 10, 2005) "Novel carbon doped TiO2 Nanotube Arrays with High Aspect Ratios for Efficient Solar Water Splitting" *Nano Lett.* 6(1):24-28.
Paul et al. (2008) "Implant Annealing—an Evolution from Soak Over Spike to Millisecond Annealing," *Mater. Sci. Forum* 573-574:207-228.
Pawlak et al. (Mar. 22, 2004) "Evidence on the Mechanism of Boron Deactivation in Ge-Preamorphized Ultrashallow Junctions," *Appl. Phys. Lett.* 84(12):2055-2057.
Pawlak et al. (Web Release Aug. 11, 2006) "Effect of Amorphization and Carbon Co-Doping on Activation and Diffusion or Boron in Silicon," *Appl. Phys. Lett.* 89(6):062110.
Pawlak et al. (Web Release Aug. 7, 2006) "Suppression of Phosphorus Diffusion by Carbon Co-Implantation," *Appl. Phys. Lett.* 89(6):062102.
Pelaz et al. (2005) "Atomistic Modeling of Dopant Implantation and Annealing in Si: Damage Evolution, Dopant Diffusion and Activation," *Comput. Mater. Sci.* 33:92-105.
Pelletier et al. (Dec. 2005) "Plasma-Based Ino Implantation and Deposition: A Review of Physics, Technology, and Applications," *IEEE Trans. Plasma Sci.* 33(6):1944-1959.
Peng (Web Release Oct. 9, 2007) "First-Principles Study of Native Defects in Rutile $TiO_2$," *Phys. Lett. A* 372(9):1527-1530.
Pichat et al. (Feb. 1982) "Photocatalytic Oxidation of Various Compounds over $TiO_2$ and Other Semiconductor Oxides: Mechanistic Considerations," *Can. J. Chem. Eng.* 60(1):27-32.
Poniewierski et al. (Mar. 1996) "Anchoring of Nematic Liquid Crystals at a Solid Substrate," *Phys. Rev. E* 53(3):2436-2443.
Poon et al. (2004) "Boron Profile Narrowing in Laser-Processed Silicon after Rapid Thermal Anneal," *J. Electrochem. Soc.* 151(1):G80-G83.
Puska et al. (May 15, 1990) "Positron Trapping in Semiconductors," *Phys. Rev. B* 41(14):9980-9993.
Quirk et al. (2001) "Ion Implant," In; *Semiconductor Manufacturing Technology*, Ch. 17, Prentice Hall, Upper Saddle River, N.J. pp. 475-510.
Rabelais et al. (Apr. 15, 1996) "Ion-Enerrgy Effects in Silicon Ion-Beam Epitaxy," *Phys. Rev. B* 53(16):10781-10792.
Radecka et al. (1999) "Ambipolar diffusion in TiO2," *Solid State Ionics* 119:55.
Rafferty, C.S. (2000) "Front-End Process Simulation," *Solid-State Electronics* 44:863-868.
Raineri et al. (1991) "Reduction of Boron Diffusion in Silicon by 1 $MeV^{29}Si^+$ Irradiation," *Appl. Phys. Lett.* 58(9):922-924.
Ramirex et al. (1990) "Oxygen Reactivity in Vanadium Pantoxide. Electronic Structure and Infrared Spectroscopy Studies," *J. Phys. Chem.* 94(26):8960-8965.
Rangan et al. (Mar./Apr. 2003) "Influence of Hydrogen Plasma Treatment on Boron Implanted Junctions in Silicon," *J. Vac. Sci. Technol. B* 21(2):781-784.
Renau (2007) "A Better Approach to Molecular Implantation," Extended Abstracts of the 7th International Workshop on Junction Technology, IEEE, Kyoto, pp. 107-112.
Reyes-Gil et al. (Web Sep. 12, 2007) "Nitrogen-doped In2O3 thin film electrodes for photocatalytic water splitting" *J. Phys. Chem. C* 111(39):14579-14588.

(56) References Cited

OTHER PUBLICATIONS

Riehl-Chudoba et al. (1994) "Nitric Oxide Adsorption on the Si(111) 7x7 Surface: Effect of Potassium Overlayers," *Surf. Sci.* 243:313-326.
Roberts et al. (1990) "Total Energy Calculations of Dimer Reconstructions on the Silicon (001) Surface," *Surf. Sci.* 236:112-121.
Roberts et al. (2008) "Defect-Mediated Ferromagnetism in Insulating Co-Doped Anatase $TiO_2$ Thin Films," *Phys. Rev. B* 78(1):014409.
Robin et al. (Aug. 1973) "Application of a Nondestructive Single-Spectrum Proton Activation Technique to Study Oxygen Diffusion in Zinc Oxide," *J. Appl. Phys.* 44(8):3770-3777.
Robinson et al. (1999) "A Surface Chemistry Investigation of the Low Pressure Nitridation of Si(100) Using 1,1-Dimerhylhydrazine," *Appl. Surf. Sci.* 152:85-98.
Rodriguez et al. (2002) "Activation of Gold on Titania: Adsorption and Reaction of $SO_2$ on $Au/TiO_2(110)$," *J. Am. Chem. Soc.* 124:5242-5250.
Rodriguez et al. (Web Release Sep. 7, 2001) "Chemistry of $NO_2$ on Oxide Surfaces: Formation of $NO_3$ on $TiO_2(110)$ and $NO_2$—O Vacancy Interactions," *J. Am. Chem. Soc.* 123:9597-9605.
Roman-Leshkov et al. (Jun. 30, 2006) "Phase Modifiers Promote Efficient Production of Hydroxymethylfurfural from Fructose," *Science* 312:1933-1937.
Ronning et al. (2001) *Phys. Rep.* 351:349-385.
Roth et al. (1997) "Methods of Defect-Engineering Shallow Junctions Formed by $B^+$-Implantation in Si," *J. Electron. Mater.* 26(11):1349-1354.
Rudawski et al. (Apr. 27, 2009 web) "Stressed Multidirectional solid-phase epitaxial growth of Si" *J. Appl. Phys.* 105 (8):081101-081120.
Rudawski et al. (Web Release Apr. 14, 2008) "Stressed Solid-Phase Epitaxial Growth of Ion-Implanted Amorphous Silicon," *Mater. Sci. Eng. R* 61:40-58.
Rühle et al. (Web Release Oct. 22, 2004) "Electron Tunneling at the $TiO_2$/Substrate Interface Can Determine Dye-Sensitized Solar Cell Performance," *J. Phys. Chem. B* 108(46):17946-17951.
Ruiz et al. (2003) "Cr-Doped $TiO_2$ Gas Sensor for Exhaust NO2 Monitoring," *Sensor Actuat B-Chem B* 93:509-518.
Rusi et al. (1997) "Defect Sites on $TiO_2(110)$. Detection by $O_2$ Photodesorption," *Langmuir* 13(16):4311-4316.
Rusli et al. (Web Release Sep. 4, 2007) "Effects of Additives on Shape Evolution During Electrodeposition. II. Parameter Estimation from Roughness Evolution Experiments," *Journal of the Electrochemical Society* 154(11):D584-D597.
Sabioni et al. (2003) "Oxygen Diffusion in Pure and Doped ZnO", *Materials Research* 6(2):173-178.
Sabioni, A.C.S. (2004) "About the Oxygen Diffusion Mechanism in ZnO," *Solid State Ionics* 170:145-148.
Saito et al. (1993) "Defect Reduction by MeV Ion Implantation for Shallow Junction Formation," *Appl. Phys. Lett.* 63(2):197-199.
Saito et al. (Feb. 2005) "Influence of Surface Defect Charge at AlGaN—GaN—HEMT Upon Schottly Gate Leakage Current and Breakdown Voltage," *IEEE Trans. Electron Devices* 52(2):159-164.
Sakai et al. Jul. 27, 1998 "TranSmission Electron Microscopy of Defects in GaN Films Formed by Epitaxial Lateral Overgrowth," *Appl. Phys. Lett.* 73(4):481-483.
Sakthivel et al. (2003) "Solar Photocatalytic Degradation of Azo Dy: Comparison of Photocatalytic Efficiency of ZnO and $TiO_2$," *Sol. Energy Mater. Sol. Cells* 77:65-82.
Salvador et al. (1992) "Catalytic Role of Lattive Defects in the Photoassisted Oxidation of Water at )001) N-$TiO_2$ Rutile," *J. Phys. Chem.* 96:10349-10353.
Salvador, P. (1992) "Dynamic Electrolyte Electroreflectance Measurements for the in Situ Detection of Flatband Potential Shifts," *Electrochimica Acta* 37(5):957-971.
Satta et al. (Apr. 2, 2007) "Formation of germanium shallow junction by flash annealing" *Nucl. Instrum. Methods Phys. Res. B* 257(1):157-160.
Satta et al. (Jan./Feb. 2006) "P Implantation Doping of Ge: Diffusion, Activation, and Recrystallization," *J. Vac. Sci. Technol. B* 24(1):494-498.

Satta et al. (Web Release Oct. 21, 2005) "Diffusion, Activation, and Recrystallization of Boron Implanted in Preamorphized and Crystalline Germanium," *Appl. Phys. Lett.* 87(17):172109.
Sawatari et al. (1982) "Formation Energies of Point Defects in Rutile ($TiO_2$)," *J. Phys. Chem. Solids* 43(12):1147-1155.
Schultz et al. (Mar. 1993) "Microscopy of Adsorbates by Surface Second-Harmonic Generation," *J. Opt. Soc. Am. B* 10(3):546-550.
Schultz et al. (Nov. 1, 1992) "Surface Diffusion of Sb on Ge(111) Monitored Quantitatively with Optical Second Harmonic Microscopy," *J. Chem. Phys.* 97(9):6958.
Schwab et al. (1959) "Kontaktkatakytische Verstärkung durch dotierte Träger," *Angew. Chem.* 71(3):101-104.
Schwab et al. (1959) *Naturwissenschaften* 46:13.
Schwab et al. (1968) "Combined action of Metal and Semiconductor catalysts" *J. Am. Chem. Soc.* 90(12):3078-3080.
Schwab et al. (1968) "Elektronenübergänge in Mischkatalysatoren," *Naturwissenschaften* 55:228.
Schwab et al. (Jan. 1969) "Catalytic efforts on the surface of semiconductors supported by metals" *Surf. Sci.* 13(1):198-200.
Schwab, G.-M. (1955) "Neuere Gedanken zur Natur der Heterogenen Katalyse," *Angew. Chem.* 67:433-438.
Schwab, G.M. (1963) "Dotierung and Oberflächenchemie an halbleitenden Katalysatoren," *Z. Physik. Chem.* 37:99-108.
Schwab, G.M. (1978) "Electronics of Supported Catalysts," *Adv. Catal.* 27:1-22.
Seager et al. (1979) "Passivation of Grain BOundaries in Polycrystalline Silicon," *Appl. Phys. Lett.* 34(5):337-340.
Seebauer (2004) "Whistleblowing: Is It Always Obligatory?" Chemical Engineering Progress, 100:23-27.
Seebauer et al. (2010) "Trends in Semiconductor Defect Engineering at the Nanoscale," *Mater. Sci. Eng.* 70:151-168.
Seebauer et al. (Aug. 4, 2006) "Control of Defect Concentrations within a Semiconductor Through Adsorption," *Phys. Rev. Lett.* 97(5):055503.
Seebauer et al. (Dec. 15, 2006) "Charged Point Defects in Semiconductors," Materials Science & Engineering Reviews, 55(3-6):57-149.
Seebauer, E.G (2004) "New Mechanisms Governing Diffusion in Silicon for Transistor Manufacture," In: Proceedings of the 7th International Conference on Solid-State and Integrated Circuits Technology, IEEE, Beijing, 2004, pp. 1032-1037.
Seebauer, E.G. (1994) "Quantitative Extraction of Continuous Distributions of Energy States and Pre-Exponential Factors from Thermal Desorption Spectra," *Surf. Sci.* 316:391-405.
Seebauer, E.G. (2006) "Defect Engineering in Semiconductors Through Adsorption and Photoexcitation," In: Proceedings of the 8th International Conference on Solid-State and Integrated Circuits Technology, IEEE, Shanghai, pp. 450-453.
Seebauer, E.G. (Mar. 15-16, 2004) "Surface Control of Interstitial Behavior for Improved Ultrashallow Junction Formation," *IEEE 4th Int. Workshop on Junction Technology* IWJY'04, pp. 81-86.
Seebauer, E.G. (Nov. 15, 1989) "Oxidation and Annealing of GaAs (100) Studies by Photoreflectance," *J. Appl. Phys.* 66(10):4963-4972.
Seebaur et al. (Jan. 6, 2010) "Defect Engineering in Semiconductors for Nanoelectronic Devices," Presentation at the International Nanoelectronics Conference, Hong Kong.
Sekiya et al. (2000) "Absorption Spectra of Anatase TiO2 Single Crystal Heat-Treated Under Oxygen Atmosphere," *J. Phys. Chem. Solids* 61:1237-1242.
Shao et al. (2003) "Boron Diffusion in Silicon: The Anomalies and Control by Point Defect Engineering," *Mat. Sci. Eng.* R42:65-114.
Shao et al. (Apr. 26, 2004) "Enhancement of Boron Solid Solubility in Si by Point-Defect Engineering," *Appl. Phys. Lett.* 84(17):3325-3327.
Sharp et al. (2002) "Self- and Dopant Diffusion in Extrinsic Boron Doped Isotopically Controlled Silicon Multilayer Structures," *Mat. Res. Soc. Symp. Proc.* 719:433-438.
Sharp et al. (Web Release Nov. 6, 2006) "Deactivation of Ultrashallow Boron Implants in Preamorphized Silicon after Nonmelt Laser Annealing with Multiple Scans," *Appl. Phys. Lett.* 89(19):192105.
Shen et al. (1988) "Photoreflectance of GaAs and $Ga_{0.82}Al_{0.18}As$ at Elevated Temperatures up to 600° C.," *Appl. Phys. Lett* 53(12):1080-1082.

(56) References Cited

OTHER PUBLICATIONS

Shen et al. (Web Release No. 20, 2008) "Devices and Chemical Sensing Applications of Metal Oxide Nanowires," *J. Mater. Chem.* 19:828-839.
Shewmon, P. (1989) *Diffusion in Solids*, Warrendale, PA, Metals and Materials Soc., pp. 98-122.
Shimpi et al. (2009) "Low Temperature Synthesis and Characterization of MgO/ZnO Composite Nanowire Arrays," *Nanotechnology* 20:125608.
Shockley et al. (Sep. 11, 1952) "Statistics of the Recombinations of Holes and Electrons," *Phys. Rev.* 87(5):835-842.
Shoji et al. (1992) "Improved Crystalline Quality of $Si_{1-z}Ge_x$ Formation by Low-Temperature Germanium Ion Implantation," *Appl. Phys. Lett.* 60(4):451-453.
Shultz et al. (1995) "Comparative Second Harmonic Generation and X-Ray Photoelectron Spectroscopy Studies of the UV Creation and $O_2$ Healing of $Ti^{3+}$ Defects on (110) Rutile $TiO_2$ Surfaces," *Surf. Sci.* 339:114-124.
Silvestry et al. (2002) "Dopant and Self-Diffusion in Extrinsic n-Type Silicon Isotopically Controlled Hetterostructures," *Mat. Res. Soc. Symp. Proc.* 719:427-432.
Simmons et al. (Jul. 15, 1971) "Nonequilibrium Steady-State Statistics and Associated Effects for Insulators and Semiconductors Containing an Arbitrary Distribution of Traps," *Phys. Rev. B* 4:502-511.
Simoen et al. (Web Release Oct. 4, 2006) "Ion-Implantation Issues in the Formation of Shallow Junctions n Germanium," *Mater. Sci. Semicond. Process.* 9:634-639.
Simonetti et al. (2008) "Catalytic Strategies for Changin the Energy Content and Achieving C-C Coupling in Biomass-Derived Oxygenated Hydrocarbons," *ChemSusChem* 1:725-733.
Sinno et al. (2000) "Defect Engineering of Czochralski SINgle-Crystal Silicon," *Mater. Sci. Eng. R* 28:149-198.
Skorupa et al. (2005) "Advanced Thermal Processing of Semiconductor Materials in the Msec-Range," RTP 2005—13th IEEE International Conference on Advanced Thermal Processing of Semiconductors, IEEE, Santa Barbara, CA, pp. 53-71.
Skorupa et al. (Web Release Apr. 22, 2005) "Advanced Thermal Processing of Ultrashallow Implanted Junctions Using Flash Lamp Annealing," *J. Electrochem. Soc.* 152(6):G436-G440.
Smith et al. (Jan. 1998) "Ultrashallow Junctions in Si Using Decaborane a Molecular Dynamics Simulation Study" *J. Appl. Phys.* 83 (6): 3148-3152.
Smith et al. (Jun. 1982) "Reaction of Oxygen with Si(111) and (100): Critical Conditions for the Growth of $SiO2$," *J. Electrochem. Soc.* 129(6):1300-1306.
Smith et al. (Web Release Feb. 24, 2006) "Vacancy-Engineering Implants for High Boron Activation in Silicon on Insulator," *Appl. Phys. Lett.* 88(8)082112.
Strukov et al. (May 1, 2008) "The Missing Memristor Found," *Nature* 453:80-83.
Subramanian et al. (Jan. 2007) "$TiO_2$—$Al_2O_3$ as a Support for Propane Partial Oxidaion over Rh," *Catal. Lett.* 113:13-18.
Subramanian et al.(Web Apr. 21, 2006) "Synthesis of high-temperature titania—alumina supports" *Ind. Eng. Chem. Res.* 45(11):3815-3820.
Sun et al. (Web Release Sep. 14, 2008) "Carbon-Doped $In_2O_3$ Films for Photoelectrochemical Hydrogen Production," *Int. J. Hydrogen Energy* 33:5967-5974.
Szczepankiewics et al. (Web Release Oct. 4, 2000) "Infrared Spectra of Photoinduced Species on Hydroxylated Titania Surfaces," *J. Phys. Chem. B* 104:9842-9850.
Taguchi et al. ( Web Release Feb. 14, 2005) "First Principles Investigations of Nitrogen-doping effects on defect aggregation processes in Czochralski Si" *J. Appl. Phys.* 97(5):053514-19.
Takami et al. (Mar. 20, 1995) "Monolayer Nitridation of Silicon Surfaces by a Dry Chemical Process Using Dimethylhydrazine of Ammonia," *Appl. Phys. Lett.* 66(12):1527-1529.
Takamura et al. (Jul. 1, 2002) "Thermal Stability of Dopants in Laser Annealed Silicon" *J. Appl. Phys.* 92(1): 230-236.

Takeda et al. (2001) "Photocatalytic $TiO_2$ Thins Film Deposited onto Glass by DC Magnetron Sputtering," *Thin Solid Films* 392:338-344.
Takeuchi et al. (1997) "Shallow Junction Formation by Polyatomic Cluster Ion Implantation," *Nucl. Instrum. Methods Phys. Res. B* 121:345-348.
Takeuchi et al. (2000) "Preparation of Visible-Light-Responsive Titanium Oxide Photocatalysts by Plasma Treatment," *Chem. Lett.* :1354-1355.
Tan et al. (2008) "Performance Characteristics of 65nm PFETd Using Moleculat Implant Species for Source and Drain Extensions," *Mater. Res. Soc. Symp. Proc.* 1070:99-104.
Tasker et al. (1977) "Quenching of Luminescence in Semiconductors by Charged Defects," *J. Phys. C: Solid State Phys.* 10:5131-5140.
Tauster et al. (Mar. 13, 1981) "Strong Interactions in Supported-Metal Catalysts," *Science* 211(4487):1122-1125.
Tersoff, J. (Aug. 13, 1990) "Forces on Charged Defects in Semiconductor Heterostructures," *Phys. Rev. Lett.* 65(7):887-890.
Toda et al. (1999) "Enhancement of the ELectroreduction of Oxygen on Pt Alloys with Fe, Ni and CO," *J. Electrochem. Soc.* 146(10):3750-3756.
Tomlins et al. (1998) "Oxygen Diffusion in Single-Crystal Zinc Oxide," *Journal of the American Ceramic Society* 81(4):869-876.
Tomlins et al. (Jan. 1, 2000) "Zinc Self-Diffusion, Electrical Properties, and Defect Structure of Undoped, Single Crystal Zinc Oxide," *J. Appl. Phys.* 87(1):117-123.
Torregrosa et al. (Web Release Jul. 11, 2005) "Ultra Shallow P+/N Junctions Using Plasma Immersion Ion Implantation and Laser Annealing for Sub 0.1 μm CMOS Devices," *Nucl. Instrum. Methods Phys. Res. B* 237:18-24.
Tsujimoto et al. (Dec. 1991) "Low-Temperature Microwave Plasma Etching of Crystalline Silicon," *Jpn. J. Appl. Phys.* 30(12A):3319-3326.
Turkot et al. (Mar. 1995) "Ion Implantation damage in Al 0.6 Ga 0.4AS/GaAs heterostructures" *J. Appl. Phys.* 78 (1): 97-103.
Uppal et al. (Jul. 2001) "Diffusion of ion-implanted boron in germanium" *J. Appl. Phys.* 90(8): 4293-4295.
Ural et al. (1999) "Nonequilibrium Experiments on Self-Diffusion in Silicon at Low Temperatures Using Isotopically Enriched Structures," *Physica B* 273-274:512-515.
Ural et al. (May 1, 1999) "Fractional Contributions of Microscopic Diffusion Mechanisms for Common Dopants and Self-Diffusion in Silicon," *J. Appl. Phys.* 85(9):6440-6446.
Ural et al. (Oct. 25, 1999) "Self-Diffusion in Silicon: Similarity Between the Properties of Native Point Defects," *Phys. Rev. Lett.* 83(17):3454-3457.
Ural et al. (Sep. 21, 1998) "Experimental Evidence for a Dual Vacancy-Interstitial Mechanism of Self-Diffusion in Silicon," *Appl. Phys. Lett.* 73(12):1706-1708.
Vaidyanathan et al. (2006) "Measurement of Defect-Mediated Diffusion: The Case of Silicon Self Diffusion," *AIChE J.* 52(1):366-370.
Vaidyanathan et al. (2007) "Mechanism and Energetics of Self-Interstitial Formation and Diffusion in Silicon," *Phys. Rev. B* 75:195209.
Vaidyanathan et al. (Web Release Oct. 11, 2006) "Influence of Surface Adsorption in Improving Ultrashallow Junction Formation," *Appl. Phys. Lett.* 89:152114.
Vaidyanathan, Ramakrishnan (2007) "New Forms of Defect Engineering in Silicon and Metal Oxides Semiconductors," PhD Thesis, University of Illinois, 187 pages.
Van de Walle (2001) "Defect Analysis and Engineering in ZnO," *Physica B* 308:899-903.
Van de Walle (Apr. 15, 2004) "First-principles calculations for defects and impurities: Applications of III-nitrides" *J. Appl. Phys.* 95(8):3851-3879.
Van Vechten (Nov. 15, 1988) "Activation Enthalpy of Recombination Vacancy Migration in Si," *Phys. Rev. B* 38(14):9913-9919.
Van Vechten, J.A. (Feb. 15, 1988) "Divacancy Binding Enthalpy and Contribution of Divacancies to Self-Diffusion in Si," *Phys. Rev. B* 33(4):2674-2689.
Vanderpool (Aug. 2, 2005) "Reducing ultra-shallow boron diffusion using carbon and fluorine co-implantation" *Nucl. Instrum. Methods Phys. Res. B* 237(1):142-147.

(56) References Cited

OTHER PUBLICATIONS

Vanhellemont et al. (2009) "On Intrinsic Point Defect Cluster Formation During Czochralski Crystal Growth," *Phys. Status Solidi C* 6(8):1906-1911.
Vanhellemont et al. (Web Release Feb. 5, 2008) "On the Characterisation of Grown-In Defects in Czochralski-Grown Si and Ge," *J. Mater. Sci.: Mater. Electron.* 19:S24-S31.
Vanheusden (Feb. 1996) "Mechanisms behind green photoluminescence in ZnO phosphor powders" *J. Appl. Phys.* 79(10):7983-7990.
Vannice et al. (Sep. 1981) "The effect of SMSI (strong mental-support interaction) Behavior on CO adsorption and hydrogenation on PD catalysts:I. IR Spectra of Adsorbed CO prior to and during reaction conditions" *J. Catal.* 71(1):152-166.
Venezia et al. (Mar. 1, 1999) "Mechanism for the Reduction of Interstitial Supersaturations in MeV-Implanted Silicon," *Appl. Phys. Lett.* 74(9):1299-1301.
Venkatu et al. (1970) "Diffusion of Titanium in Single Crystal Rutile," *Mater. Sci. Eng.* 5:258-262.
Venturini et al. (2004) "Excimer Laser Thermal Processing of Ultra-Shallow Junction: Laser Pulse Duration," *Thin Solid Films* 453-454:145-149.
Verzellesi et al. (Aug. 2003) "Experimental and Numerical Assessment of Gate-Lag Phenomena in AlGaAs Heterostructure Field-Effect Transistors (FETs)," *IEEE Trans. Electron Devices* 50(8):1733-1740.
Vitomirov et al. (Aug. 15, 1989) "Reversible Temperature-Dependent Fermi-Level Movement for Metal-GaAs(110) Interfaces," *Phys. Rev. B* 40(5):3483-3486.
Voronkov et al. (2000) "The Sensitivity of Thermal Donor Generation in Silicon to Self-Interstitial Sinks," *J. Electrochem. Soc.* 147:3899-3906.
Wachs et al. (1997) "Structure and Reactivity of Surface Vanadium Oxide Species on Oxide Supports," *Appl. Catalysis A* 157:67-90.
Walther et al. (Jan./Feb. 2006) "Development of Plasma-Based Implant for Silicon Devices," *J. Vac. Sci. Technol. B* 24(1):482-488.
Wang et al. (1999) "Photoelectrochemical Properties of Metal-Ion-Doped TiO2 Nanocrystalline Electrodes," *Thin Solid Films* 349:120-125.
Wang et al. (2002) "Extraordanary Temperature Amplification in Ion-Stimulated Surface Processes at Low Energies," *Phys. Rev. B* 66(20):205409.
Wang et al. (2003) "A Comparitive Study of Nanometer Sized Fe(III)-Doped $TiO_2$ Phtotcatalysts: Synthesis, Characterization and Activity," *J. Mater. Chem.* 13:2322-2329.
Wang et al. (2005) "Temperature-Dependent Energy Thresholds for Ion-Stimulated Defect Formation in Solids," *Phys. Rev. Lett.* 95(1):015501.
Wang et al. (2006) "Second-Generation Photocatalytic Materials: Anion-Doped $TiO_2$," *J. Phys.: Condens. Matter.* 18:421-434.
Wang et al. (Apr. 15, 1993) Dimer Vacancies and Dimer-Vacancy Complexes on the Si(100) Surface, *Phys. Rev. B* 47(16):10497-10508.
Wang et al. (Jun. 2007) "Temperature Dependent energy threshholds for ion-stimulated defect formation on solids: Effects of ion mass and adsorbate-substrate paring" *Surf. Sci.* 601(12): 2453-2458.
Wang et al. (Sep. 1, 2002) "Thermodynamic and Kinetic Studies of Lasrer Thermal Processing of Heavy Boron-Doped Amorphous Silicon Using Moleculat Dynamics," *J. Appl. Phys.* 92(5):2412-2419.
Wang et al. (Sep. 1981) "T The effect of SSMI (strong mental-support interaction) Behavior on CO adsorption and hydrogenation on PD catalysts II. Kinetic behavior in the Methanation reaction" *J. Catal.* 71(1):167-174.
Wang et al. (Web Release Jan. 22, 2004) "Large-Scale Hexagonal-Patterned Growth of Aligned ZnO Nanorods for Nano-Optoelectronics and Nanosensor Arrays," *Nano Lett.* 4(3):423-426.
Wang et al. (Web Release Jul. 8, 2009) "A Passivated Codoping Approach to Tailor the Band Edges of TiO2 for Efficient Photocatalytic Degradation of Organic Pollutants," *Appl. Phys. Lett.* 95(1):012106.
Wang et al. (Web Release Mar. 5, 2008) "Growth of Nanowires," *Mater. Sci. Eng. R* 60:1-51.
Wantanabe et al. (Web Release May 23, 2004) "Direct-Bandgap Properties and Evidence for Ultraviolet Lasing of Hexagonal Boron Nitride Single Crystal," *Nature Mat.* 3:404-409.
Watkins (Dec. 15, 1975) "Defects in Irradiated Silicon: EPR and Electron-nuclear Double Resonance of Interstitial Boron," *Phys. Rev. B* 12(12):5824-5839.
Wesch (1992) "Ion Implantation in III-V Compounds," *Nucl. Instrum. Methods Phys. Res. B* 68:342-354.
Wieser et al. (1984) "Influence of Flash-Lamp Annealing on the Diffusion Behavior of Ion Implanted Boron Profiles," *Phys. Stat. Sol. A* 81:247-252.
Wilks, S.P. (Apr. 16, 2002) "Engineering and Investigating the Control of Semiconductor Surfaces and Interfaces," *J. Phys. D: Appl. Phys.* 35:R77-R90.
Williams et al. (2008) "How We Found the Missing Memristor," *IEEE Spec.* 45:28-35.
Windl et al. (Nov. 22, 1999) "First-Principles Study of Boron Diffusion in Silicon," *Phys. Rev. Lett.* 83(21):4345-4348.
Wolkenstein, T. (1960) "The Electron Theory of Catalysis on Semiconductors," *Adv. Catal.* 12:189-264.
Wong-Leung (Mar. 1, 2001) "Effect of implant temperature on secondary defects created by MeV Sn implantation in silicon" *J. Appl. Phys.* 89(5):2556-2559.
Wood et al. (1981) "The Formation Energy of Crystallographic Shear Planes in $TiO_2$," *Proc. Royal Soc. London. Series A* 375(1760):105-125.
Wuensch et al. (1994) "Lattice Diffusion, Grain Boundary Diffusion and Defect Structure of ZnO," *J. Phys. Chem. Solids* 55(10):975-984.
Xu et al. (Web Release Oct. 31, 2007) "Built-In Electric Field Enhancement/Retardation on Intermixing," *Appl. Phys. Lett.* 91:181111.
Yahia, J. (Jun. 1, 1963) "Dependence of the Electrical Conductivity and Thermoelectric Power or Pure and Aluminum-Doped Rutile on Equilibrium Oxygen Pressure and Temperature," *Physical Review* 130(5):1711-1719.
Yamada et al. (Web Release Oct. 14, 2008) "Structural, Electrical and Optical Properties of Sputter-Deposited Nb-Doped $TiO_2$ (TNO) Polycrystalline Films," *Thin Solid Films* 516:5754-5757.
Yamazoe (1991) "New Approaches for Improving Semiconductor Gas Sensors," *Sens. Actuators B* 5:7-19.
Yang et al. (Jul. 1, 2006) "Micro-defects in Ge doped Czochralski grown Si crystals" *J. Cryst. Growth* 292(2):266-271.
Yang et al. (Mar. 2006) "Germanium effect on oxygen-related defects in Czochralski silicon" *Phys. Status Solidi A* 203(4):685-695.
Yang et al. (Web Oct. 4, 2008) "The role of photoinduced defects in TiO2 and its effects on Hydrogen Evolution for Aqueous Methanol soloution" *Journal of Phyical Chemistry A* 112(43):10784-10789.
Yeats et al. (1988) "Gate Slow Transients in GaAs MESFETs—Causes, Cures, and Impact on Circuits," *Technical Digest—International Electron Devices Meeting, IEEE*, pp. 842-845.
Yeong et al. (2008) "The Impact of Nitrogen Co-Implantation on Boron Ultra-Shallow Junction Formation and Underlying Physical Understanding," *Mater. Sci. Eng. B* 154-155:43-48.
Yeong et al. (Web Release Sep. 6, 2007) "Defect Engineering by Surface Chemical State in Boron-Doped Pre-amorphized Silicon," *Appl. Phys. Lett.* 91:102112.
Yeung et al. (2003) "Vacancy Charging on Si(100)-(2x1): Consequences for Surface Diffusion and STM Imaging," *Phys. Rev. B* 67:035311(1-7).
Yokoyama et al. (Oct. 15, 1997) "Dimer Buckling Induced by Single-Dimer Vacancies on the Si(100) Surface Near $T_c$," *Phys. Rev. B* 56(16):10483-10487.
Yoo et al. (Aug. 2, 2005) "Electrical Activation of ultra-shallow B and BF2 implanted silicon by flash anneal" *Nucl. Instrum. Methods Phys. Res. B* 237(1):12-17.
Yoon et al. (Jan. 2003) "Effect of dopant (Nb) Concentration on the grain boundary electrical properties of Nb-doped barium titanate" *J. Mater. Res.* 18: 88-96.
Yu (Jul. 1, 2002) "Grown-in defects in nitrogen-doped Czochralski silion" *J. Appl. Phys.* 92(1):188-195.

(56) References Cited

OTHER PUBLICATIONS

Yu et al. (Feb. 15, 1995) "Electronic Structure of Point Defects in Rutile $TiO_2$," *Physical Review B* 51(8):4768-4776.

Yu et al. (Web Release Jan. 19, 2005) "Efficient Visable-light-induced Photocatalytic Disinfection on Sulfur-doped Nanocrystalline Titania" *Environ. Sci. Technol.* 39(4): 1175-1179.

Zanella et al. (Web Jul. 13, 2002) "Alternative methods for the preparation of gold nanoparticles supported in $TiO2$" *J. Phys. Chem. B* 106(31):7634-7642.

Zerbino (Sep. 10, 1993) "Ellipsometry of hydrous platinum oxide layers and electrodispersed platinum surfaces resulting from their electroduction" *Thin Solid Films*, 232(1):63-67.

Zhang et al. (2004) "Control of Catalytic Reactions at the Surface of a Metal Oxide Nanowire by Manipulating Electron Density Inside it," *Nano Lett.* 4(3):403-407.

Zhang et al. (Sep. 1998) "Characterization of Ca Impurity Segregation on the TiO2(110) Surface," *Surface Sci.* 412-413:242-251.

Zhang,et al. (2006) "Precursor Mechanism for Interaction of Bulk Interstitial Atoms with Si(100)," *Phys. Rev. B* 74:235301.

Zhanpeisov et al. (1996) "Quantum Chemical SINDO1 Study of Vanadium Pentoxide," *Catal. Lett.* 39:111-118.

Zheng et al. (Mar. 15, 2009) "One-step synthesis of nitrogen-doped ZnO nanocrystallites and their properties" *Appl. Surf. Sci.* 255(11):5656-5661.

Zhou et al. (2009) "$Pt/TiO_2$ Nano-Catalyst Synthesized by Atomic Layer Deposition," Abstract 610a, In AIChE 2009 Annual Meeting. 2009: Nashville, TN.

Boreskov et al. (1960) *Prob. Kinet. Kataliza*, 10:67.

Boreskov, G.K. (1967) *Kinet. Katal.*, 8:1020-1033.

Chen et al. (2010) "General Expression for Effective Diffusivity of Foreign Atoms Migrating via a Fast Intermediate," *J. Appl. Phys.* 107:026101.

Colombeau et al. (2008) "Ultra-Shallow Junction Formation—Physics and Advanced Technology," In: Proceedings of the 17th International Conference on Ion Implantation Technology, AIP, Monterey, CA, (2008), pp. 11-18.

Haneda et al. (1999) "Oxygen Diffusion in Zinc Oxide Single Crystals," Key Engineering Materials 157-158:221-226.

Hollister et al. (2013), "Surface-based manipulation of point defects in rutile TiO2" Appl. Phys. Lett. 102, 231601.

Kondratenko, Y.V. (2009) "Optical and Interface-Based Methods of Defect Engineering in Silicon," Ph.D. thesis, University of Illinois at Urbana—Champaign.

Kondratenko et al. (2008) "Optically Stimulated Diffusion in Ultrashallow Junction Formation," Proc. 17th Int'l Conference on Ion Implantation Technology (AIP, NY, 2008) 228.

Kratzer, M.C. (2008) "Growth and Characterization of TiO2 for Band Engineered Catalysis," MS Thesis, University of Illinois at Urbana—Champaign.

Lung, Michael YL (2003 Thesis), "Chapter 1 Transient Enhanced Diffusion" pp. 1-170.

Quirk et al. (2001) "Silicon and Wafer Preparation," In; *Semiconductor Manufacturing Technology*, Ch. 4, Prentice Hall, Upper Saddle River, NJ, pp. 67-90.

Seebauer (Apr. 2001) "When do you Blow the Whistle" *Chemical Engineering*, 108:123-126.

Sharma, B.L. (1990) "Diffusion in Silicon and Germanium," Defect and Diffusion Forum, 70 & 71:1.

Timans et al. (2006) "Millisecond Annealing: Past, Present and Future," *Materials Research Society Symposium Proceedings* pp. 3-14.

Vol'kenshtein et al. (1948) *J. Phys. Chem.* (U.S.S.R.) 22:311-30.

Vol'kenshtein, F.F. (1950) *Zhur. Fiz. Khim* 24:1068-1082.

\* cited by examiner

Mobility of
mobile species
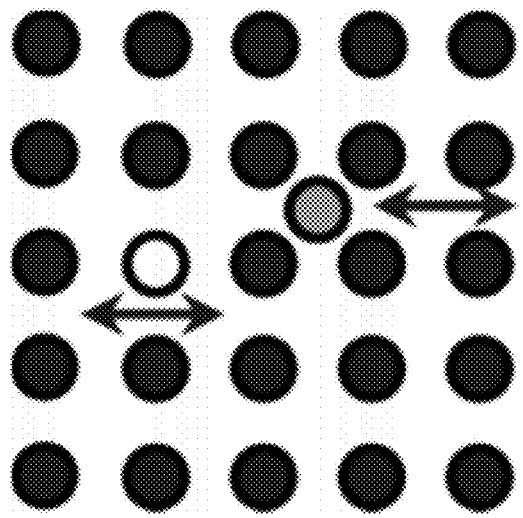
Number of
mobile species
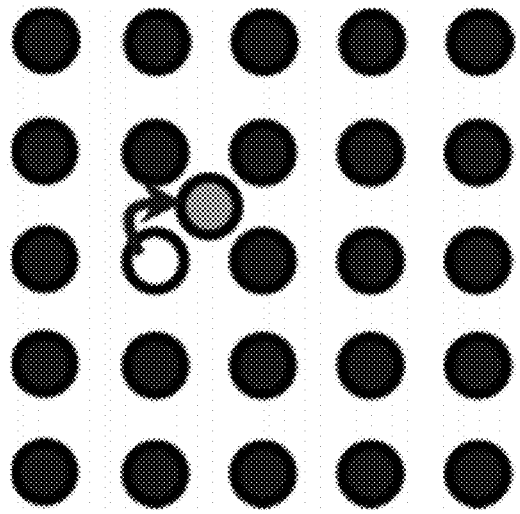
Figure 62

Figure 116

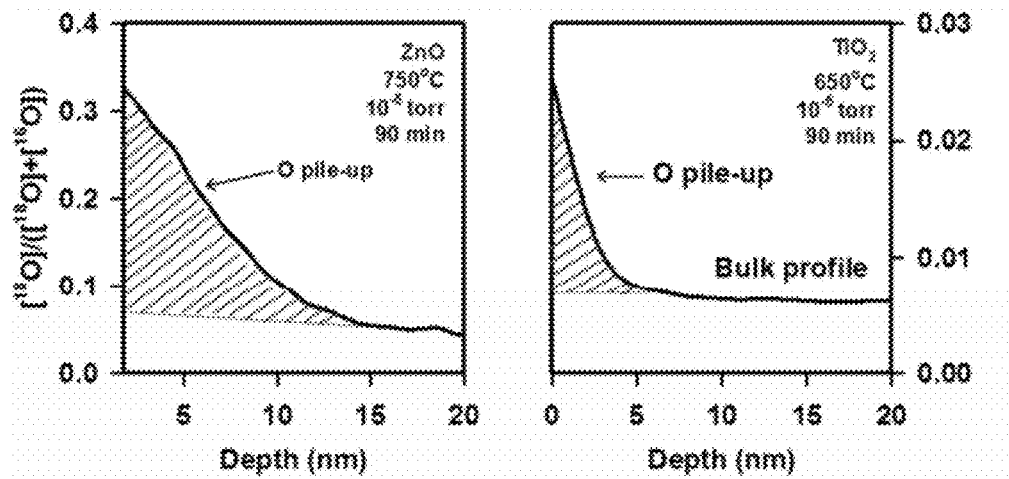
(a)  Figure 135  (b)
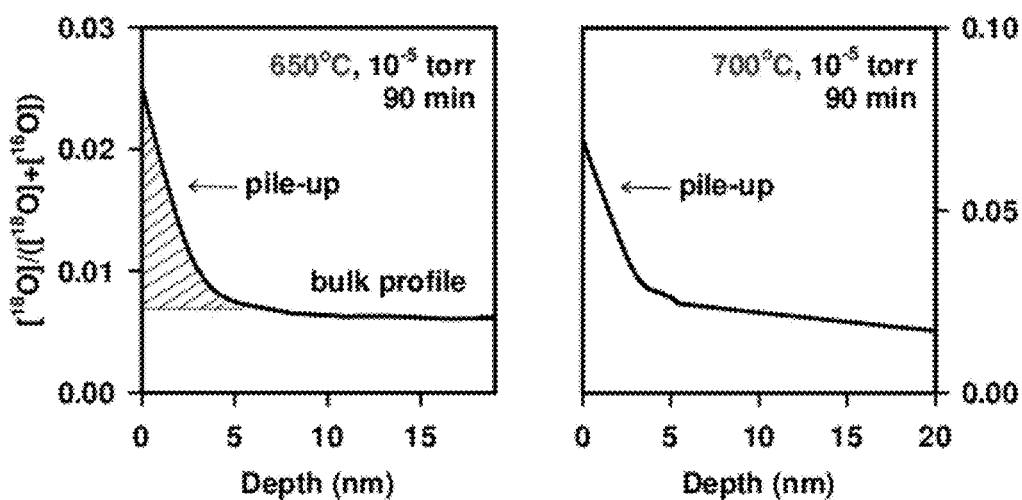
(a)  Figure 136  (b)

_US 8,871,670 B2_

DEFECT ENGINEERING IN METAL OXIDES VIA SURFACES

CROSS-REFERENCE TO RELATED APPLICATIONS

This application claims the benefit of priority under 35 U.S.C. 119(e) to U.S. provisional Patent Application 61/429,885 filed Jan. 5, 2011, which is hereby incorporated by reference in its entirety to the extent not inconsistent with the disclosure herein.

STATEMENT REGARDING FEDERALLY SPONSORED RESEARCH OR DEVELOPMENT

This invention was made, at least in part, with United States governmental support awarded by National Science Foundation DMR 07-04354 and 10-05720. The United States Government has certain rights in this invention.

BACKGROUND

The importance of defects in semiconductor materials, such as single crystalline silicon, is generally recognized with respect to the physical, optical and electronic properties of these materials. Diffusion rates of dopants during annealing processing, for example, have been demonstrated to depend significantly on the type and abundance of defects, such as interstitials and vacancies, in implanted silicon. In addition, the presence of defects in bulk semiconductor materials has been shown to impact other important physical properties such as current flow in integrated circuits and the performance of photoactive devices and gas sensors. Defects provide sites where electrons and holes recombine with enhanced efficiency, for example, which is understood to significantly degrade the performance of host materials in diverse applications ranging from optoelectronics to photocatalysis.

Given the role of defects in semiconductor device performance, substantial research is currently directed at developing methods of engineering various kinds of defects in the bulk phase of semiconductor substrates so as to enhance dopant activation and limit dopant diffusion and loss during annealing. These methods include the use of implanted foreign atoms, such as carbon or halogens, dislocation loops, and co-implantation with high energy ions. Such defect engineering approaches have played a significant role in advanced processes for ion implantation in ultra-shallow junctions.

U.S. Pat. No. 7,846,822, issued on Dec. 7, 2010, discloses a different approach for defect engineering wherein modification of the composition of semiconductor surfaces allows for control of the concentrations and depth profiles of defects, such as interstitials and vacancies, in supersaturated and undersaturated semiconductor materials. The '822 patent demonstrates that such chemical modification of semiconductor surfaces allows for fabrication of doped semiconductor structures having a selected dopant concentration depth profile, for example to provide ultrashallow junctions in microelectronic and nanoelectronic devices.

While substantial research has been directed to controlling defects in single crystalline silicon, much less attention has been focused on engineering defects in other materials, including other semiconductors and dielectric materials. It will, therefore, be appreciated from the foregoing that there is currently a need in the art for methods for controlling the type and abundance of defects generally applicable to a range of useful crystalline semiconductor materials. Particularly, defect engineering methods are needed that are capable of selectively adjusting the physical, optical and electronic properties of materials used in semiconductor devices.

SUMMARY

The present invention provides methods for controlling defects in materials, including point defects, such as interstitials and vacancies, and extended defects, including dislocations and clusters. Defect control provided by the present invention allows for fabrication and processing of materials and/or structures having a selected abundance, spatial distribution and/or concentration depth profile of one or more types of defects in a material, such as vacancies and/or interstitials in a crystalline material, such as a single crystalline material. Methods of the invention are useful for processing materials by controlling defects to access beneficial physical, optical, chemical and/or electronic properties. The invention provides methods for engineering defects in materials so as to provide net attributes beneficial for a diverse class of applications including device fabrication, microelectronics, catalyst support, photocatalysis and sensing. In an embodiment, for example, methods of the invention allow for control of the abundance and spatial distribution of defects in a crystalline material so as to selectively adjust the rates of solid state diffusion, the current flow, and the mobility of dopants in the bulk of a material. In an embodiment, for example, methods of the invention allow for control of the abundance and spatial distribution of O interstitials, or complexes thereof, in an oxygen-containing crystalline material, such as a metal oxide nanomaterial. In an embodiment, for example, methods of the invention allow for accurate control of defects in a doped semiconductor material to access enhanced dopant activation, reduced dopant losses and/or a selected dopant concentration profile in the bulk semiconductor.

Methods of the invention provide a versatile fabrication platform capable of effective integration with advanced processing and micro-/nano-fabrication techniques. The present methods are compatible, for example, with materials and structures having a range of physical dimensions including nanomaterials, such as nanoparticles, nanowires, nanofilms, nanobelts, and nanodisks, and devices integrating nanomaterials such as micro- and nano-electromechanical devices. The present methods are also compatible with a range of materials useful for device fabrication and catalysis applications, including metal oxides, dielectrics and semiconductor materials such as single crystalline and polycrystalline semiconductor materials and doped semiconductor materials. The present methods are also compatible with controlling defects in undersaturated crystalline materials or structures such as, for example, metal oxides undersaturated in native defects. Methods of the invention provide a fabrication pathway for making a diverse range of devices and functional materials, including photoactive devices, microelectronic and nanoelectronic devices, such as transistors in high density integrated circuits, sensors and photocatalysis materials.

Methods of some embodiments of the invention utilize selective modification of the physical properties, chemical composition and/or electrical charge of an exposed surface of a material to impact the type, abundance and/or spatial distribution of defects in the bulk material. In an embodiment, for example, the exposed surface of a material is treated with one or more surface modification agent(s) that chemically reacts and/or physically interacts with the surface so as to selectively adjust the rate that defects are injected into, or otherwise generated, in the bulk phase of the material or so as to selectively adjust the rate at which defects are lost to the surface. As used herein an "exposed surface" refers to the surface of a material or structure undergoing processing that can be accessed via treatment with gas phase and/or liquid phase reagents including surface modifying agents. Accordingly, some methods of the invention utilize processes that couple surface and bulk phases to provide control of defects in a material or structure, including defects within the bulk of the material proximate to the exposed surface (e.g., within 100 microns of the exposed surface, or optionally for some applications within 10 microns of the exposed surface, or optionally for some applications within 1000 nanometers of the exposed surface). In an embodiment, for example, the surface modifying agent of the present invention reacts with, or otherwise interacts, with the exposed surface to control and/or reduce the amount of dangling bonds or other features of the surface that provide a source of defects to the bulk. Alternatively, the invention provides methods wherein treatment of the exposed surface selectively increases the rate of generation or loss of defects in a region of the materials proximate to the exposed surface (e.g., within 100 microns of the exposed surface, or optionally for some applications within 10 microns of the exposed surface, or optionally for some applications within 1000 nanometers of the exposed surface). In these aspects of the invention, coupling between the chemically or physically modified surface and the bulk provides an effective means of controlling generation, loss and/or migration of defects in the material.

In an embodiment, the invention provides a method for controlling the concentration of O interstitials, or complexes thereof, in a metal oxide structure, comprising the steps of: (1) providing the metal oxide structure having an exposed surface, wherein the exposed surface is an atomically clean surface; (2) treating the exposed surface of the metal oxide structure with a surface modifying agent, wherein interaction between the surface modifying agent and the metal oxide structure forms molecules or atoms on the exposed surface providing defect control groups on the exposed surface; and (3) generating a selected surface abundance of the molecules or atoms on the exposed surface; thereby controlling the concentration of the O interstitials or complexes thereof in the metal oxide structure. In an embodiment, the metal oxide is $TiO_2$ or ZnO. In an embodiment, $TiO_2$ may be in an anatase phase or a rutile phase, and ZnO may be in a hexagonal wurtzite phase or a cubic zincblende structure. In an embodiment, the atomically clean surface provides a source of the O interstitials, or complexes thereof, to the $TiO_2$ or ZnO structure, and the selected surface abundance of the molecules or atoms on the exposed surface controls the rate that the O interstitials or complexes thereof are injected into, or otherwise generated in, the $TiO_2$ or ZnO structure.

In an embodiment, for example, the invention provides a method for controlling the concentration of defects in a material, the method comprising the steps of: (1) providing the material having an exposed surface; (2) treating the exposed surface of the material with a surface modifying agent, wherein interaction between the surface modifying agent and the material forms molecules or atoms on the exposed surface selected from the group consisting of C, N, P, Bi, S, Se, Te, F, Cl, Br, and I and molecules containing C, N, P, Bi, S, Se, Te, F, Cl, Br, or I providing defect control groups on the exposed surface; and (3) generating a selected surface abundance of the molecules or atoms on the exposed surface; thereby controlling the concentration of defects in the material. In an embodiment, for example, the exposed surface of the material is an atomically clean surface, optionally having dangling bonds providing a source of defects to the bulk phase of the material.

In an embodiment, the invention provides a method for processing a semiconductor structure in an semiconductor device, comprising the steps of: (1) providing the semiconductor structure having an exposed surface, wherein the exposed surface is an atomically clean surface; (2) treating the exposed surface of the semiconductor structure with a surface modifying agent, wherein interaction between the surface modifying agent and the semiconductor structure forms molecules or atoms on the exposed surface providing defect control groups on the exposed surface; and (3) generating a selected surface abundance of the molecules or atoms on the exposed surface; thereby controlling the concentration of O interstitials or complexes thereof in the semiconductor structure. In an embodiment, the semiconductor structure is semiconductor nanoparticles and/or microparticles. In an embodiment, the semiconductor structure is ZnO nanowires and the exposed surface is treated with $NO_2$.

As used herein, "atomically clean" refers to a surface that is substantially free of species bound to, or otherwise physically associated with, the surface, such as a surface that is substantially free of chemisorbed atoms or molecules. In an embodiment, an atomically clean surface has chemisorbed atoms or molecules on less than 20% of the surface binding sites, optionally for some applications less than 5% of the surface binding sites, and optionally for some applications less than 1% of the surface binding sites and optionally for some applications less than 0.1% of the surface binding sites.

Selection of the composition and surface abundance of molecules and/or atoms on the exposed surface is important for providing defect control groups effective for generating a desired abundance and/or spatial distribution of defects in a material or structure. In an embodiment, for example, the treatment step provides a surface abundance of the molecules or atoms on the exposed surface selected from the range of 0.01 monolayer to 3 monolayers. In an embodiment, for example, the treatment step provides a surface abundance of the molecules or atoms on the exposed surface selected from the range of $5\times10^{12}$ molecules or atoms $cm^{-2}$ to $2\times10^{15}$ molecules or atoms $cm^{-2}$, optionally $1\times10^{13}$ molecules or atoms $cm^{-2}$ to $1\times10^{15}$ molecules or atoms $cm^{-2}$, and optionally $5\times10^{13}$ molecules or atoms $cm^{-2}$ to $5\times10^{14}$ molecules or atoms $cm^{-2}$. In an embodiment, the surface abundance of the molecules or atoms on the exposed surface providing defect control groups is selected so as to control the spatial distribution of O interstitials or complexes thereof in the material. In an embodiment, the surface abundance of the molecules or atoms on the exposed surface providing defect control groups is selected so as to control the rate that O interstitials, vacancies or complexes thereof are injected into, or otherwise generated in, the material. In an embodiment, the surface abundance of the molecules or atoms on the exposed surface providing defect control groups is selected so as to control the loss rate of O interstitials, vacancies or complexes thereof, to the exposed surface. In an embodiment, the surface abundance of the molecules or atoms on the exposed surface providing defect control groups is selected so as to control the spatial distribution of the defects in the material or structure, for example, by eliminating between 0.1% and 80% of dangling bonds on an exposed surface of a material or structure undergoing processing or by selectively adjusting the amount of "fixed" electrical charge on the surface.

As used herein, "defect control group" refers to atoms or molecules on an exposed surface that selectively adjust the chemical properties, electrical charge and/or physical properties of the surface in a manner affecting the type, composition, abundance and/or spatial distribution of defects in the material or structure, for example in a region of the material or structure proximate to the exposed surface (e.g., within 100 microns of the exposed surface, or optionally for some applications within 10 microns of the exposed surface, or optionally for some applications within 1000 nanometers of the exposed surface). For example, some defect control groups of the invention affect the composition, chemical reactivity, the number and/or surface abundance of free, dangling bonds and/or surface electrical charge of the exposed surface. Defect control groups preferred for some applications are stable on an exposed surface, for example groups that are bound to the surface by covalent bonds, such as single and double bonds, and/or groups that are bound to the surface by associative electrostatic forces such as intermolecular forces, hydrogen bonds, dipole—dipole interactions, van der Waals forces or any combination of these. Defect control groups may be present on an exposed surface in less than monolayer amounts or may be present in monolayer or multilayer amounts. The present invention provides methods wherein the surface abundance of defect control groups may be selectively and continuously adjusted, preselected or "tuned" over a range useful for a selected device fabrication and/or catalysis application. The present invention provides methods wherein defect control groups are provided on an exposed surface of a material to control the type, abundance and spatial distribution of defects in the material. The present invention provides methods wherein defect control groups are provided on an exposed surface of a material to control chemical or physical attributes and/or processes of the bulk, such as bulk diffusion rates and/or electrical activation of dopants during annealing of implanted materials. The present invention also provides methods wherein defect control groups are provided on an exposed surface to control bulk diffusion, emission and annihilation of defects, such as interstitials and vacancies, in materials supersaturated or undersaturated with those defects, such as supersaturated or undersaturated metal oxide materials.

In another embodiment of this aspect of the present invention, the composition and selected surface abundance of defect control groups formed on the exposed surface establishes the electrical charge of the exposed surface, which in turn establishes a corresponding electric field in the space charge region of the underlying material or structure. Selective adjustment of the surface electrical charge and, therefore, the electric field may also be used for controlling the abundance and/or spatial distribution of defects in the bulk. Importantly, the degree of electrical charge at the exposed surface may be continuously varied (or "tuned") over a wide, useful range, providing a correspondingly tunable electric field, by selection of the composition and surface abundance of defect control groups provided on the exposed surface. Since the defect control groups affect not only the concentration of dangling bonds, but also the amount of "fixed" electrical charge on the surface that gives rise to the electrostatic effect, this electrostatic mechanism provides an alternate means by which the defect control groups can be exploited for defect engineering. In an embodiment, for example, the defect control groups change the electrostatic potential at the surface by a value up to ±0.5V, or optionally a value up to ±1.0V in some cases, for example, on a $TiO_2$ (or a similar oxide) structure. Selective adjustment of the electrical charge of the exposed surface is particularly effective in some embodiments for controlling defects within 10-40 nm of the exposed surface, for example for a typical oxide material.

A wide range of molecules and atoms are useful for providing defect control groups effective in the present methods. In an embodiment, for example, the defect control groups are species chemisorbed on the exposed surface of the material or structure undergoing processing. Atomic species and/or molecules chemisorbed on the exposed surface provide defect control groups effective in methods of the invention. In an embodiment, a surface modifying agent of the present methods generates elements from Groups VA, VIA, or VIIA of the Periodic Table or molecules containing elements from Groups VA, VIA, or VIIA of the Periodic Table on the exposed surface, thereby providing defect control groups on the exposed surface. In an embodiment, for example, the molecules or atoms on the exposed surface providing defect control groups are selected from the group consisting of P, As, Sb, Bi, S, Se, Te, F, Cl, Br, and I and molecules containing P, As, Sb, Bi, S, Se, Te, F, Cl, Br, or I. In an embodiment, for example, the molecules or atoms provided on the exposed surface of the material impact the type, abundance and/or spatial distribution of defects in the bulk, but are not themselves incorporated into the bulk of the material.

Selection of the composition of the atoms and molecules providing defect control groups is, at least in part, based on the type of defect for which the abundance and/or spatial distribution is being selected and/or controlled. Use of surface modifying agents capable of providing sulfur and/or sulfur-containing molecules on an exposed surface, for example, are particularly useful for controlling the abundance and/or spatial distribution of O interstitials, vacancies and/or complexes thereof in materials and structures undergoing processing. The invention includes methods wherein the surface modifying agent is a sulfur-containing gas or a sulfur-containing liquid. In an embodiment, for example, the surface modifying agent is elemental sulfur, $CS_2$, $H_2S$, $SO_2$, $SO_3$, $SCl_2$, $S_2Cl_2$, $SOCl_2$, $SO_2Cl_2$, $HSO_3Cl$, a thiol, a sulfoxide, a sulfone, $SF_6$ or any combination of these, wherein the surface modifying agent is applied to the exposed surface as a gas. In an embodiment, for example, the surface modifying agent is $H_2SO_4$, $SOCl_2$, $SO_2Cl_2$, $HSO_3Cl$, a thiol, a sulfoxide, or a sulfone, wherein the surface modifying agent is applied to the exposed surface as a liquid in a purified state or dissolved in a solvent. In an embodiment, for example, the surface modifying agent is dimethyl sulfoxide, sulfolane or methanethiol provided as a gas or liquid.

In addition to composition, the surface modifying agent exposure times and temperature for treatment of a material or structure undergoing processing are important process parameters for achieving a desired abundance and/or spatial distribution of defects. The invention includes processes wherein the step of treating the exposed surface of the material with the surface modifying agent comprises: (1) determining the selected surface abundance of the molecules or atoms on the exposed surface selected from the range of $5 \times 10^{12}$ molecules or atoms $cm^{-2}$ to $2 \times 10^{15}$ molecules or atoms $cm^{-2}$ or from the range of 0.01 monolayer to 3 monolayers, wherein the selected surface abundance of the molecules or atoms on the exposed surface is selected so as to control the concentration of defects in the material so as to achieve a selected spatial distribution of the defects in the material; (2) treating the exposed surface of the material with the surface modifying agent, wherein interaction between the surface modifying agent and the material generates the molecules or atoms on the exposed surface; and (3) terminating the treating of the exposed surface of the material with the surface modifying agent when the selected surface abundance of the molecules or atoms on the exposed surface is reached. Treatment conditions encompass a wide range of exposure times and temperatures depending on the composition, phase, partial pressure and/or concentration of the surface modifying agent. In an embodiment, for example, the treatment step comprises exposure of the exposed surface to the surface modifying agent for a period of time selected over the range of 0.1 second to 2 hours, or 1 second to 30 minutes, or 10 seconds to 10 minutes. In an embodiment, the treatment step is carried out below room temperature, e.g., during cooled wafer processing performed in the microelectronics industry, between room temperature (20° C.) and 400° C., or at an elevated temperature (e.g., greater than or equal to 100° C.) in a pre-annealing step. In an embodiment, for example, the treatment step is carried out at a temperature selected over the range of −70° C. to 500° C., or over the range of 20° C. to 400° C., or over the range of 20° C. to 200° C. Selection of the temperature of the material or structure during treatment with surface modifying agents in some embodiments depends on the binding energy of defect control groups bound to the exposed surface. In an embodiment, the steps of treating the exposed surface of the material with the surface modifying agent and/or generating the selected surface abundance of the molecules or atoms on the exposed surface are carried out at a partial pressure of gaseous surface modifying agent selected over the range of $10^{-6}$ Torr to 1500 Torr, or $10^{-3}$ Torr to 1000 Torr, or 0.1 Torr to 760 Torr. The mole fraction of gaseous surface modifying agent in an inert carrier gas, such as Ar or He, may be selected from the range of $10^{-9}$ to 0.9, or $10^{-6}$ to 0.1, or $10^{-3}$ to 0.1

In an embodiment, post-treatment annealing may include one or more "soak" or "spike" annealing components. The temperature vs time profile of a soak annealing component resembles a rectangle, i.e., the temperature is raised and held for a period of time before cooling, whereas for a spike annealing component the profile resembles a triangle with a rise to a peak temperature followed by a long cooling tail. In an embodiment, post-treatment annealing may be carried out for a period of time selected from the range of 1 second to 3 days, or 10 seconds to 1 day, or 10 seconds to 6 hours. In an embodiment, post-treatment annealing may be carried out at a temperature selected from the range of 500° C. to 1050° C., or 600° C. to 950° C., or 600° C. to 850° C. In some embodiments, the post-treatment annealing temperature depends on the melting or decomposition point of the material or structure. Typically, the post-treatment annealing temperature will scale loosely with the melting or decomposition point of the material or structure. For example, annealing temperatures for vanadia ($V_2O_5$, melting point 690° C.) will be lower than for $TiO_2$ (melting/decomposition point 1843° C.) or ZnO (1975° C.). The annealing temperature should scale with the melting point of the material or structure (on an absolute temperature scale like Kelvin). For example, the post-treatment annealing temperature may be selected within a range of 35% to 60% of the material's melting point, or 40% to 55% of the material's melting point, or 40% to 50% of the material's melting point. In an embodiment, post-treatment annealing may be carried out in the presence of a gas having a partial pressure selected from the range of $10^{-6}$ Torr to 1500 Torr, or $10^{-3}$ Torr to 1000 Torr, or 0.1 Torr to 760 Torr. Typically, the annealing gas will be $O_2$, although injecting interstitials of other elements, such as carbon, for defect engineering purposes is possible. The mole fraction of annealing gas in an inert carrier gas, such as Ar or He, is selected over the range of $10^{-9}$-0.9, or $10^{-6}$-0.1, or $10^{-3}$-0.1. The ranges for treatment and pos-treatment annealing include consideration of material properties as well as various aspects of practical manufacturing, e.g., the lowest temperature practical for a high processing volume, ease of heating, and the need for adequate throughput.

The present methods are useful for controlling defects in a wide range of materials. The present methods are particularly useful for processing materials and structures having a large surface-to-volume ratio, as surface and bulk coupling in materials having such dimensions may occur via efficient processes. In an embodiment, for example, the material or structure undergoing processing is a particle or a thin film structure having a cross sectional dimension (e.g., diameter, radius, thickness, etc.) selected from the range of 1 nanometer to 10 microns, and optionally a cross sectional dimension selected from the range of 1 nanometer to 1000 nanometers. The present methods are particularly useful for processing nanomaterials and/or nanostructures, such as a nanofilm, a nanorod, a nanoparticle, or a nanobelt, wherein the nanofilm has an average thickness selected over the range of 1 to 500 nanometers, the nanoparticle has an average diameter selected over the range of 2 to 1000 nanometers, the nanorod has an average thickness selected over the range of 2 to 1000 nanometers or the nanobelt has an average thickness selected over the range of 2 to 1000 nanometers.

Processing methods of the invention are compatible with materials and structures having a wide range of compositions. In an embodiment, the material undergoing processing is a single crystalline material or a polycrystalline material including crystalline materials that are understaturated in native defects (i.e., defects involving atoms of the host material) and supersaturated crystalline materials. In an embodiment, the material undergoing processing is a semiconductor or a dielectric material. In an embodiment, the material undergoing processing is a material containing one or more dopants. Dopants in the present materials may be provided by conventional implantation methods or in some applications (e.g., catalysis and sensors), the host material already contains dopants from the time of initial synthesis, for example, by coprecipitation from a liquid, codeposition from a gas, etc. In an embodiment, the material undergoing processing is a material that has been annealed. In an embodiment, for example, the material undergoing processing has an exposed surface that is an atomically clean surface.

The present methods are particularly useful for controlling defects in oxygen containing materials such as oxides. In an embodiment, the material undergoing processing is a metal oxide, for example, a metal oxide having a slight excess or deficiency of oxygen atom. As used herein, a "slight excess or deficiency of oxygen atom" refers to an oxygen-containing material wherein the amount of oxygen atom is less than or greater than that of the theoretical stoichiometric amount, for example, as defined by the crystal lattice arrangement of the material. In an embodiment, for example, a slight deficiency of oxygen atom refers to an oxygen-containing material wherein the amount of oxygen atom is less than or equal to 99% of the theoretical stoichiometric amount as defined by the crystal lattice arrangement of the material, and optionally for some applications less than or equal to 95% of the stoichiometric amount as defined by the crystal lattice arrangement of the material. In an embodiment, for example, a slight excess of oxygen atom refers to an oxygen-containing material wherein the amount of oxygen atom is greater than or equal to 101% of the theoretical stoichiometric amount as defined by the crystal lattice arrangement of the material, and optionally for some applications greater than or equal to 105% of the stoichiometric amount as defined by the crystal lattice arrangement of the material. In an embodiment, for example, the material undergoing processing is a metal oxide having the formula $TiO_2$, $ZrO_2$, ZnO, $CO_3O_4$, or cobalt spinels having the formula $CoX_2O_4$, wherein X is Al, Ga, or In, wherein optionally the metal oxide has a slight excess or deficiency of oxygen atom. In an embodiment, for example, the material undergoing processing is $TiO_2$, optionally having a slight deficiency of oxygen atom (e.g., having the formula $TiO_{2-x}$, wherein x is less than 0.05). In an embodiment, for example, the material undergoing processing is a perovskite, optionally having a slight excess or deficiency of oxygen atom. In an embodiment, for example, the material undergoing processing is a multiferroic thin film, a ferroelectric thin film, a piezoelectric thin film, or a pyroelectric thin film. In an embodiment, for example, the material undergoing processing is a superconducting thin film.

Some oxides, including $TiO_2$ and ZnO, are photocatalytic. In an embodiment, the surface modifying agent may be photochemically activated by exposure to electromagnetic energy, e.g., in the ultraviolet or visible range. For example, the material or structure may be treated with a surface modifying agent that remains inactive until the exposed surface is exposed to electromagnetic energy and the surface modifying agent is photochemically activated to produce a photo-assisted adsorption process. The photoactive surface modifying agent may be converted into the active form by exposure to pulsed, continuous wave, or modulated electromagnetic energy. Nominally, the photon energy should be greater than the band gap of the semiconductor (e.g., about 3.1 eV for $TiO_2$, in the ultraviolet range), but photoadsorption at lower energies, e.g., 2 eV (in the visible range), is possible. The photo-exposure step exhibits high temporal and spatial resolution when the light source is shuttered and a photomask is used. The treatment and post-treatment annealing times, temperatures, partial pressures and mole fractions described above are also applicable when photoactive surface modifying agents are used for defect control. The photoexposure step may be carried out during or after the step of treating the exposed surface with the surface modifying agent. In an embodiment, the photoexposure step utilizes photon energy in the range of 1.5 eV to 7 eV, or 2.5 eV to 5.5 eV, or 3 eV to 3.5 eV. For example, the photon energy may be selected as 50% of the band gap to the edge of vacuum UV, or 80% of the band gap to the edge of absorption for fused silica optics, or 100% of the band gap to the edge of adsorption for BK-7 optics. In an embodiment, the continuous-wave source intensity on the exposed surface may be selected from the range of 0.1 mW/cm$^2$ to 1000 mW/cm$^2$, or 1 mW/cm$^2$ to 100 mW/cm$^2$, or 1 mW/cm$^2$ to 10 mW/cm$^2$. In an embodiment, the continuous-wave source exposure time may be selected from the range of 1 millisecond to 2 hours, or 0.1 second to 10 minutes, or 1 second to 10 minutes. In an embodiment, a pulsed-source peak intensity may be selected from the range of 0.1 W/cm$^2$ to $10^{10}$ W/cm$^2$, or 0.5 W/cm$^2$ to $2\times10^8$ W/cm$^2$, or 1 W/cm$^2$ to $7\times10^8$ W/cm$^2$. In an embodiment, the pulsed source peak width may be selected from the range of 1 ns to 10 ms, or 50 ns to 2 ms, or 130 ns to 1 ms. These peak widths may be achieved, for example, by using a Q-switched laser through stretched pulse flashlamp or an excimer laser through flashlamp. In an embodiment, the number of pulses may be selected from the range of 1 to $10^5$, or 1 to $10^4$, or 1 to $10^3$.

The methods of the invention may include a number of additional processing steps and/or process conditions. In an embodiment, for example, the steps of providing the material having the exposed surface and treating the exposed surface of the material with the surface modifying agent are carried out in a vacuum or under a pressure of an inert gas. In an embodiment, for example, a method of the invention further comprises the steps of: (1) implanting the material with a dopant, thereby generating a material having implanted dopant; and (2) annealing the material having implanted dopant. Alternatively for some embodiments, the host material is provided with dopants resulting from initial synthesis, e.g., by coprecipitation from a liquid, codeposition from a gas, etc. In an embodiment, for example, the step of annealing the material having implanted dopant comprises raising the temperature of the material to a temperature selected over the range of 400° C. to 1000° C. In an embodiment, for example, the step of implanting the material with the dopant is carried out before, during or after the step of treating the exposed surface of the material with the surface modifying agent.

In some embodiments, the step of treating the exposed surface of the material with a surface modifying agent is carried out while the material is exposed to electromagnetic radiation. In an embodiment, for example, the material is characterized by an average bandgap energy, and the electromagnetic radiation has a photon energy greater than the average bandgap energy. In an embodiment, for example, the electromagnetic radiation is provided to the material by the sun, a broadband arc, an incandescent lamp, a photodiode, a laser or any combination of these.

In an embodiment, the invention provides a method of processing a catalyst support material, for example to activate or otherwise adjust the effectiveness of the catalyst support materials. In a specific embodiment, for example, a method of the invention comprises the steps of: (1) providing a catalyst support material having an exposed surface; (2) treating said exposed surface of said catalyst support material with a surface modifying agent, wherein interaction between said surface modifying agent and said catalyst support material forms molecules or atoms on the exposed surface selected from the group consisting of C, N, P, Bi, S, Se, Te, F, Cl, Br, and I and molecules containing C, N, P, Bi, S, Se, Te, F, Cl, Br, or I providing defect control groups on said exposed surface; and (3) generating a selected surface abundance of said molecules or atoms on said exposed surface, so as to control the concentration of defects in said catalyst support material, thereby processing said catalyst support material. In an embodiment, for example, the catalyst support material comprises $TiO_2$, ZnO or MgO. In an embodiment, for example, a method of this aspect further comprises the step of providing a catalyst on said catalyst support material, thereby producing a supported catalyst, such as a Lewis base catalyst, a noble metal, or a noble metal alloy.

In an embodiment, for example, the method comprises the steps of: (1) providing a support material having an exposed surface; (2) treating the exposed surface of the support material with a surface modifying agent, wherein interaction between the surface modifying agent and the support material forms molecules or atoms on the exposed surface selected from the group consisting of C, N, P, Bi, S, Se, Te, F, Cl, Br, and I and molecules containing C, N, P, Bi, S, Se, Te, F, Cl, Br or I providing defect control groups on the exposed surface; (3) generating a selected surface abundance of the molecules or atoms on the exposed surface, thereby controlling the concentration of defects in the support material, resulting in the processing of the support material. In some embodiments, for example, the method of this aspect further comprises providing a catalyst on the support material, thereby producing a supported catalyst, and optionally contacting said supported catalyst with one or more chemical reactant species, thereby catalyzing a chemical reaction.

A range of catalyst materials are compatible with the methods described herein. In an aspect, for example, the catalyst is a Lewis base catalyst. In another embodiment, the catalyst comprises a noble metal. In another embodiment, the catalyst comprises a noble metal alloy. In another embodiment, the catalyst comprises MgO, CaO, or $La_2O_3$.

A range of catalyst support materials are compatible with the methods described herein. In an embodiment, for example, the support material comprises $TiO_2$, ZnO, $CeO_2$, or CoO. In an embodiment, for example, the support material further comprises a dopant. In an aspect, the dopant comprises Nb, Cr, Fe, Cu, V or Mn, or any of these elements used with a co-dopant, such as C.

Processing steps and properties of the support material are important to the methods as described herein. In an embodiment, the exposed surface of the support material is an atomically clean surface. In an aspect, the molecules or atoms on the exposed surface of the support material are not incorporated into the bulk of the material. In an aspect, the support material is a single crystalline material or a polycrystalline material. In another aspect, the support material is a semiconductor or a dielectric material. In a further aspect, the support material is a particle or a thin film having a cross sectional dimension selected from the range of 1 nanometer to 10 microns. In an aspect, the support material is a nanofilm, a nanorod, a nanoparticle, or a nanobelt. In a related aspect, the nanofilm has an average thickness selected over the range of 1 to 500 nanometers, the nanoparticle has an average diameter selected over the range of 2 to 1000 nanometers, the nanorod has an average thickness selected over the range of 2 to 1000 nanometers or the nanobelt has an average thickness selected over the range of 2 to 1000 nanometers.

In an embodiment, the support material is a metal oxide. In an aspect, the metal oxide has a slight excess or deficiency of oxygen atom. In another aspect, the support material is a metal oxide comprising $TiO_2$, $ZrO_2$, $ZnO$, $CO_3O_4$, or cobalt spinels having the formula $CoX_2O_4$, wherein X is Al, Ga, or In, wherein optionally the metal oxide has a slight excess or deficiency of oxygen atom. In a further aspect, the support material has the formula $TiO_{2-x}$ wherein x is less than 0.05. In a further aspect, the support material is a perovskite. In a related aspect, the support material is a perovskite having a slight excess or deficiency of oxygen atom. In an aspect, the support material is a multiferroic thin film, a ferroelectric thin film, a piezoelectric thin film, or a pyroelectric thin film. In another aspect, the support material is a superconducting thin film.

The surface properties and processing thereof are important to the methods as described herein. In an embodiment, the exposed surface provides a source of O interstitials or complexes thereof to the support material. In an aspect, the selected surface abundance of the molecules or atoms on the exposed surface controls the rate that O interstitials or complexes thereof are injected into, or otherwise generated in, the support material. In an aspect the selected surface abundance of the molecules or atoms on the exposed surface eliminates between 0.1% and 80% of dangling bonds on the exposed surface. In another aspect, the selected surface abundance of the molecules or atoms on the exposed surface controls the spatial distribution of O interstitials or complexes thereof in the support material. In a related aspect, the selected surface abundance of the molecules or atoms on the exposed surface is selected from the range of 0.01 monolayer to 3 monolayers. In an aspect, the selected surface abundance of the molecules or atoms on the exposed surface is selected from the range of $5\times10^{12}$ molecules or atoms $cm^{-2}$ to $2\times10^{15}$ molecules or atoms $cm^{-2}$. In an aspect, the step of treating the exposed surface of the support material with the surface modifying agent generates a selected surface abundance of chemisorbed atoms or molecules on the exposed surface. In another aspect, the step of treating the exposed surface of the support material with the surface modifying agent generates sulfur atoms or sulfur-containing molecules on the exposed surface.

The methods described herein are compatible with a wide range of surface modifying agents. In an embodiment, for example, the surface modifying agent is a sulfur-containing gas or a sulfur-containing liquid. In an aspect, the surface modifying agent is elemental sulfur, $CS_2$, $H_2S$, $SO_2$, $SO_3$, $SCl_2$, $S_2Cl_2$, $SOCl_2$, $SO_2Cl_2$, $HSO_3Cl$, a thiol, a sulfoxide, a sulfone, $SF_6$ or any combination of these, wherein the surface modifying agent is applied to the exposed surface as a gas. In another aspect, the surface modifying agent is $H_2SO_4$, $SOCl_2$, $SO_2Cl_2$, $HSO_3Cl$, a thiol, a sulfoxide, or a sulfone, wherein the surface modifying agent is applied to the exposed surface as a liquid in a purified state or dissolved in a solvent. In a related aspect, the surface modifying agent is dimethyl sulfoxide, sulfolane or methanethiol provided as a gas or liquid.

Certain processing parameters methods are important to the methods described herein. In an embodiment, for example, the steps of providing the support material having the exposed surface and treating the exposed surface of the support material with the surface modifying agent are carried out in a vacuum or under a pressure of an inert gas. In an aspect, the steps of treating the exposed surface of the support material with the surface modifying agent and generating the selected surface abundance of the molecules or atoms on the exposed surface are carried out at a temperature selected over the range of 20° Celsius to 850° Celsius.

In a related embodiment, the step of treating the exposed surface of the support material with the surface modifying agent comprises: determining the selected surface abundance of the molecules or atoms on the exposed surface selected from the range of $5\times10^{12}$ molecules or atoms $cm^{-2}$ to $2\times10^{15}$ molecules or atoms $cm^{-2}$ or from the range of 0.01 monolayer to 3 monolayers, wherein the selected surface abundance of the molecules or atoms on the exposed surface is selected so as to control the concentration of defects in the support material so as to achieve a selected spatial distribution of the defects in the support material; treating the exposed surface of the support material with the surface modifying agent, wherein interaction between the surface modifying agent and the support material generates the molecules or atoms on the exposed surface; and terminating the treating of the exposed surface of the support material with the surface modifying agent when the selected surface abundance of the molecules or atoms on the exposed surface is reached.

In another embodiment, the method further comprises the steps of: implanting the support material with a dopant, thereby generating a material having implanted dopant; and annealing the support material having implanted dopant. In an aspect, the step of annealing the support material having implanted dopant comprises raising the temperature of the support material to a temperature selected over the range of 400° C. to 1000° C. In another aspect, the step of implanting the support material with the dopant is carried out before, during or after the step of treating the exposed surface of the support material with the surface modifying agent.

For certain applications, exposure to electromagnetic radiation can be advantageous. In an embodiment, for example, the step of treating the exposed surface of the support material with a surface modifying agent is carried out while the material is exposed to electromagnetic radiation. In an aspect, the support material is characterized by an average bandgap energy, and wherein the electromagnetic radiation has a photon energy greater than the average bandgap energy. In a related aspect, the electromagnetic radiation is provided to the support material by the sun, a broadband arc, an incandescent lamp, a photodiode, a laser or any combination of these.

For other applications, the surface abundance of molecules or atoms on the exposed surface is an important parameter. In an embodiment, for example, the molecules or atoms on the exposed surface are provided at a selected surface abundance that establishes the electrical charge of the exposed surface, thereby controlling the abundance or spatial distribution of defects in the support material. In another embodiment, the molecules or atoms on the exposed surface are provided at selected surface abundance that changes the electrostatic potential at the exposed surface by a value up to ±1.0V.

In another embodiment, a method of catalyzing a chemical reaction is provided, the method comprising: providing a support material having an exposed surface; treating the exposed surface of the support material with a surface modifying agent, wherein interaction between the surface modifying agent and the support material forms molecules or atoms on the exposed surface selected from the group consisting of C, N, P, Bi, S, Se, Te, F, Cl, Br, and I and molecules containing C, N, P, Bi, S, Se, Te, F, Cl, Br, or I providing defect control groups on the exposed surface; generating a selected surface abundance of the molecules or atoms on the exposed surface; thereby controlling the concentration of defects in the support material; providing a catalyst on the support material, thereby producing a catalysis material; and contacting the catalysis material with one or more chemical reactant species, thereby catalyzing a chemical reaction.

In an embodiment, the invention provides a method for producing a supported catalyst, the method comprising: (1) providing a $TiO_2$ or ZnO support material having an exposed surface, wherein said exposed surface is an atomically clean surface; (2) treating said exposed surface of said $TiO_2$ or ZnO support material with a surface modifying agent, wherein interaction between said surface modifying agent and said $TiO_2$ or ZnO support material forms molecules or atoms on the exposed surface providing defect control groups on said exposed surface; (3) generating a selected surface abundance of said molecules or atoms on said exposed surface; thereby controlling the concentration of O interstitials or complexes thereof in said $TiO_2$ or ZnO support material; and (4) providing a catalyst on said $TiO_2$ or ZnO support material, thereby producing said supported catalyst.

In an embodiment, the invention provides a method for catalyzing a chemical reaction, said method comprising: (1) providing a $TiO_2$ or ZnO support material having an exposed surface, wherein said exposed surface is an atomically clean surface; (2) treating said exposed surface of said $TiO_2$ or ZnO support material with a surface modifying agent, wherein interaction between said surface modifying agent and said $TiO_2$ or ZnO support material forms molecules or atoms on the exposed surface providing defect control groups on said exposed surface; (3) generating a selected surface abundance of said molecules or atoms on said exposed surface; thereby controlling the concentration of O interstitials or complexes thereof in said $TiO_2$ or ZnO support material; (4) providing a catalyst on said $TiO_2$ or ZnO support material, thereby producing a catalysis material; and (5) contacting said catalysis material with one or more chemical reactant species, thereby catalyzing a chemical reaction.

In an embodiment, the invention provides a method for decreasing the concentration of vacancies in a metal oxide structure, said method comprising the steps of: (1) providing said metal oxide structure having an exposed surface and a bulk; (2) cleaning said exposed surface to produce an atomically clean surface, and (3) providing a source of O atoms from said exposed source to the bulk of the metal oxide structure, wherein at least a portion of said O atoms combine with said vacancies, thereby decreasing said concentration of vacancies in said metal oxide structure. In some embodiments, the method optionally includes one or more further steps of (1) treating said exposed surface of said metal oxide structure with a surface modifying agent, wherein interaction between said surface modifying agent and said metal oxide structure forms molecules or atoms on the exposed surface providing defect control groups on said exposed surface; (2) generating a selected surface abundance of said molecules or atoms on said exposed surface; (3) equilibrating a first defect concentration within a bulk of said metal oxide structure with a second defect concentration on said atomically clean surface of said metal oxide structure; and (4) monitoring the second defect concentration on said atomically clean surface of said metal oxide structure. For example, the monitoring step may be performed using photoreflectance. In an embodiment, the metal oxide is $TiO_2$ or ZnO. In an embodiment, said metal oxide structure is a particle or thin film, which may have a cross sectional dimension selected from the range of 1 nanometer to 10 microns, or 1 nanometer to 1000 nanometers, or 1 nanometer to 500 nanometers. In an embodiment, the metal oxide structure has a ratio of surface area to volume greater than or equal to 0.2 $nm^{-1}$, or selected over the range of 0.2 $nm^{-1}$ to 0.002 $nm^{-1}$. In an embodiment, a space charge region at said exposed surface has a thickness selected from the range of 1 nm to 100 nm provided that the thickness of the space charge region is 80% or less of a characteristic dimension of said metal oxide structure. A "characteristic dimension" is a defining dimension of an object. In the present context, a sphere's characteristic dimension is its radius, a rod's or wire's characteristic dimension is its circular cross-sectional radius, a slab's characteristic dimension is its thickness.

The methods described herein are compatible with a wide range of applications, including, but not limited to memory resistors, dye-sensitized solar cells, light-emitting diodes, optical gas sensors, photocatalytic water splitting, photocatalytic water remediation, and solid-state sensing applications. In an embodiment, for example, the $TiO_2$ or ZnO structure is a component of a memory resistor. In a related embodiment, the material is a component of a memory resistor. In another embodiment, the $TiO_2$ or ZnO structure is a component of a dye-sensitized solar cell. In an aspect, the material is a component of a dye-sensitized solar cell. In an aspect, the $TiO_2$ or ZnO structure is a component of a light-emitting diode. In a related aspect, the material is a component of a light-emitting diode. In an embodiment, the $TiO_2$ or ZnO structure is a component of an optical gas sensor. In an aspect, the material is a component of an optical gas sensor. In another embodiment, the $TiO_2$ or ZnO structure is a component of a photocatalytic water splitting assembly. In an aspect, the material is a component of a photocatalytic water splitting assembly. In an embodiment, the $TiO_2$ or ZnO structure is a component of a photocatalytic water remediation assembly. In an aspect, the material is a component of a photocatalytic water remediation assembly. In an embodiment, the $TiO_2$ or ZnO structure is a component of a solid-state sensor. In an aspect, the material is a component of a solid-state sensor.

Without wishing to be bound by any particular theory, there can be discussion herein of beliefs or understandings of underlying principles or mechanisms relating to the invention. It is recognized that regardless of the ultimate correctness of any explanation or hypothesis, an embodiment of the invention can nonetheless be operative and useful.

BRIEF DESCRIPTION OF THE FIGURES

FIG. 4 provides a schematic of high vacuum apparatus of Example 1.a.

FIG. 5 provides a schematic of electrochemical sulfur cell of Example 1.a.

FIG. 62 provides a schematic illustration of a semiconductor lattice showing the mobility and number of mobile species.

FIG. 116 provides a schematic representation comparing how dopants are chosen for Si in integrated circuit applications vs. for $TiO_2$ in applications of an oxide semiconductor.

Figure 120:
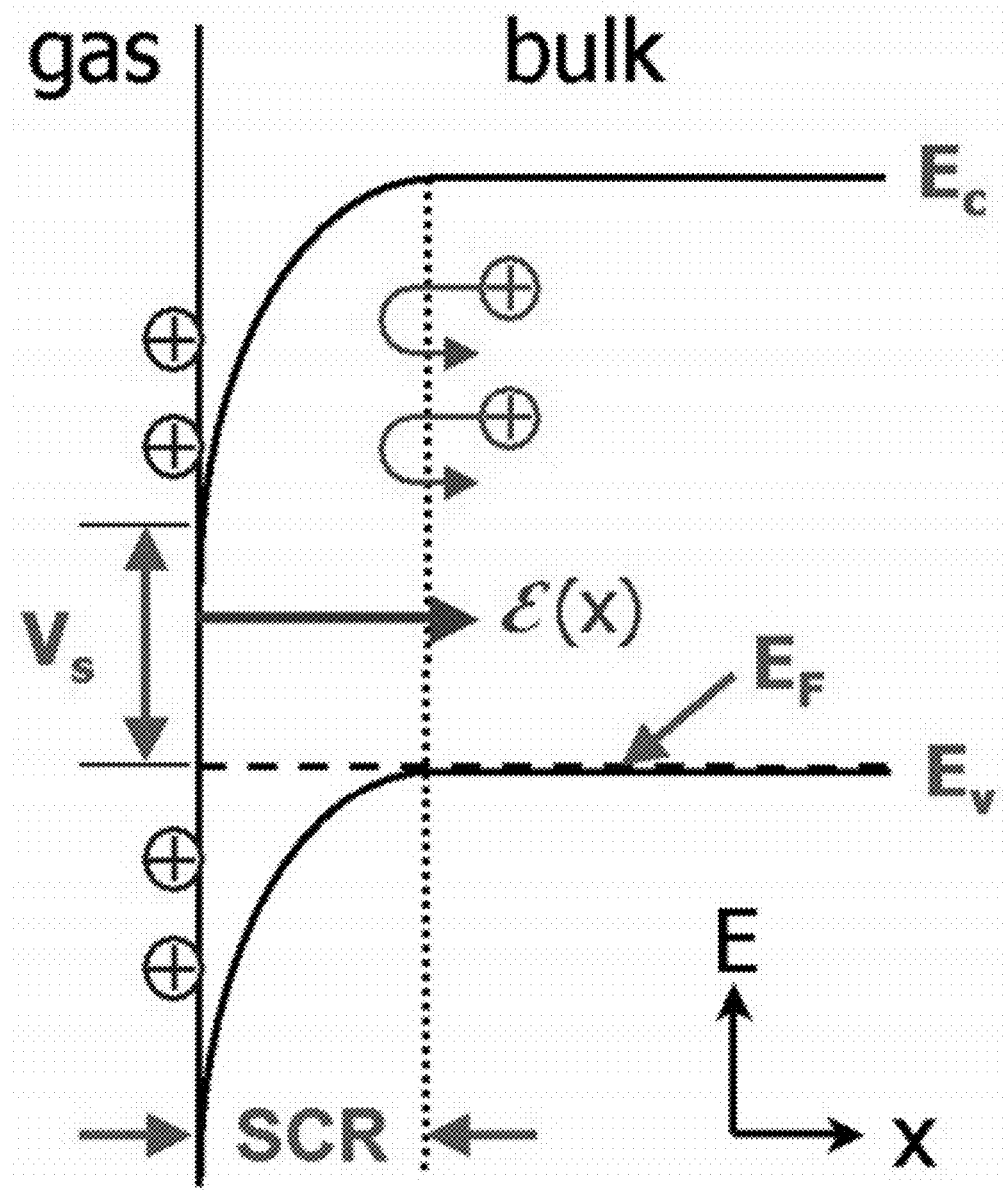

FIG. 120 provides a schematic band diagram of the effects of band bending with magnitude $V_s$ on the motion of defects that approach the electric field c within the surface space charge region (SCR) of p-type material.

Figure 121:
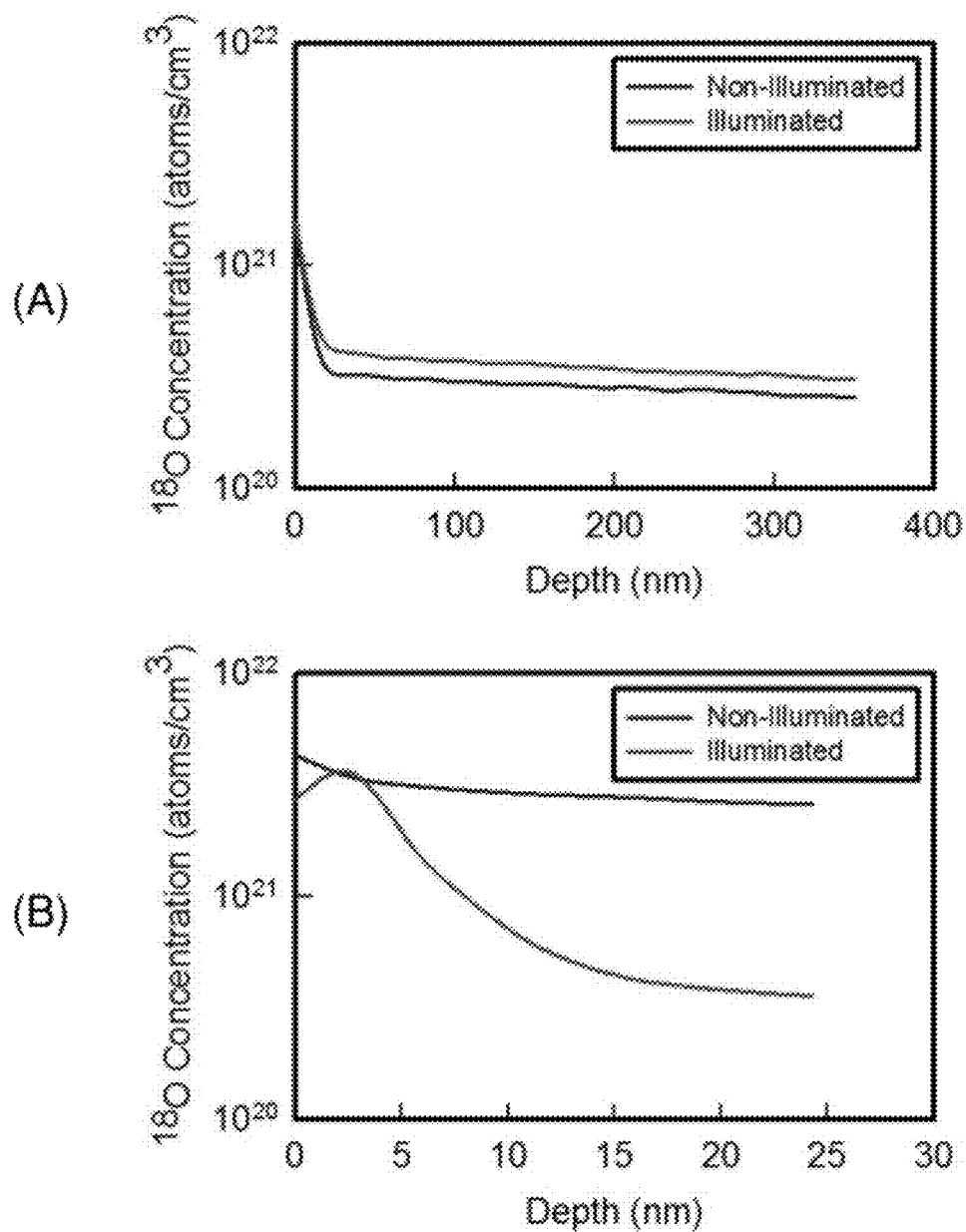

FIG. 121 provides plots showing $^{18}O$ diffusion profiles after annealing 90 min, with UV light at ~0.2 W/cm² showing both enhancement and inhibition behavior. Panel (A) provides a plot of deep profiles showing enhancement (775° C., $P_{O2}$=5×$10^{-5}$ Torr). Panel (B) provides a plot of shallow profiles showing inhibition (800° C., $P_{O2}$=5×$10^{-5}$ Torr).

Figure 122:
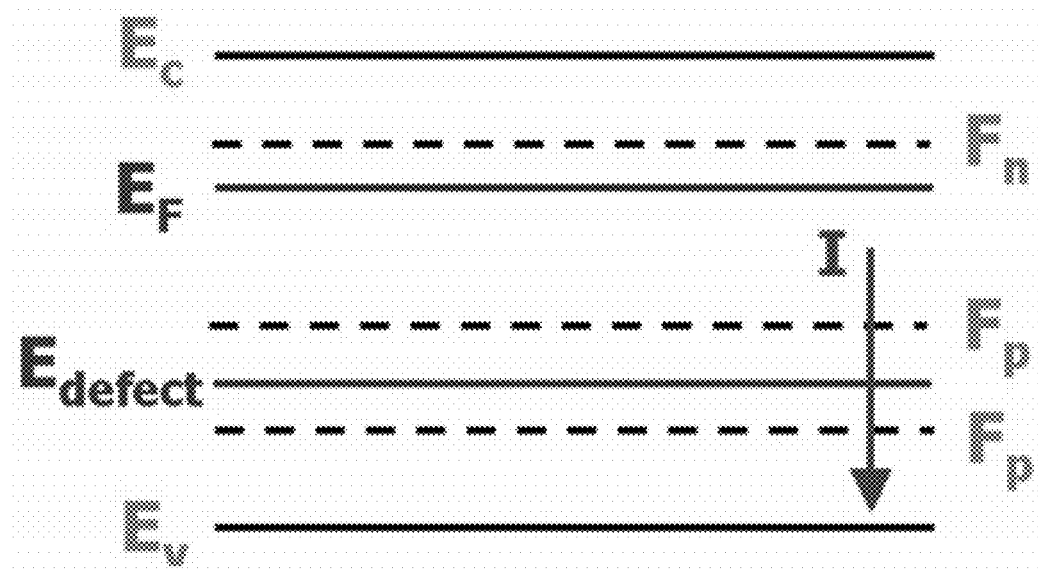

FIG. 122 provides a schematic showing that, under illumination, movement of a quasi-Fermi level past an ionization level of a mobile defect causes its charge state to change. In FIG. 122, n-type material is illuminated progressively more until the $F_P$ moves past a defect level.

Figure 123:
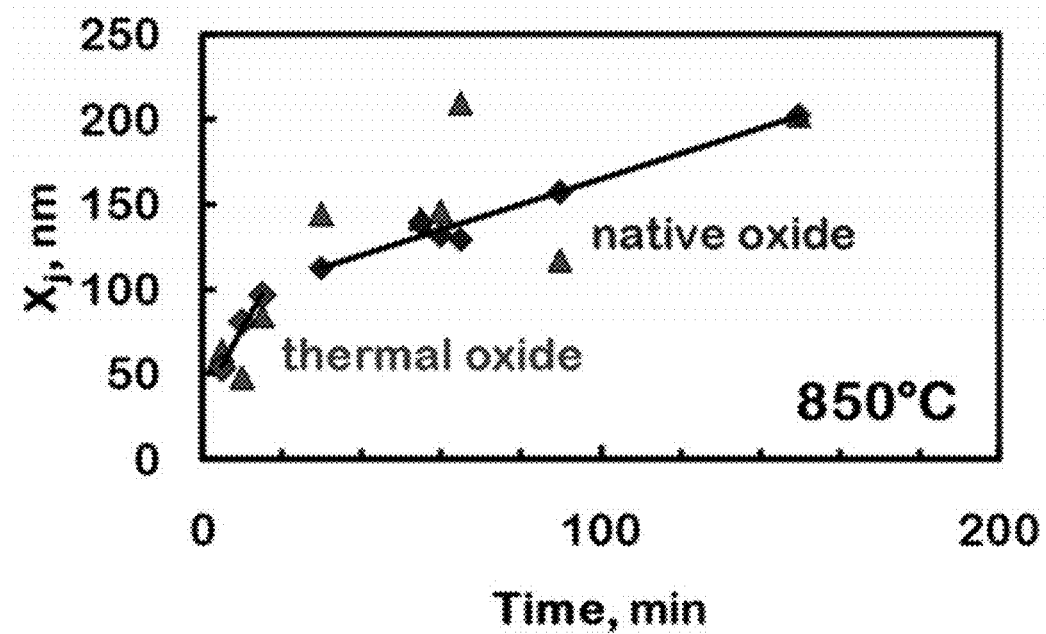

FIG. 123 provides a plot showing junction depth $X_j$ for implanted boron diffusing in Si vs. time during steady state annealing in the presence of native or thermally grown $SiO_2$. $X_j$ is directly proportional to the degree of boron spreading. Blue diamonds are done in the dark; red triangles are done under about 1.5 W/cm² of super-bandgap illumination. The spreading is under illumination much more variable for the native oxide, whose interface supports varying concentrations of interfacial defects whose charge states can be affected by photostimulation. Note that illumination can either enhance or inhibit the boron diffusion.

Figure 124:
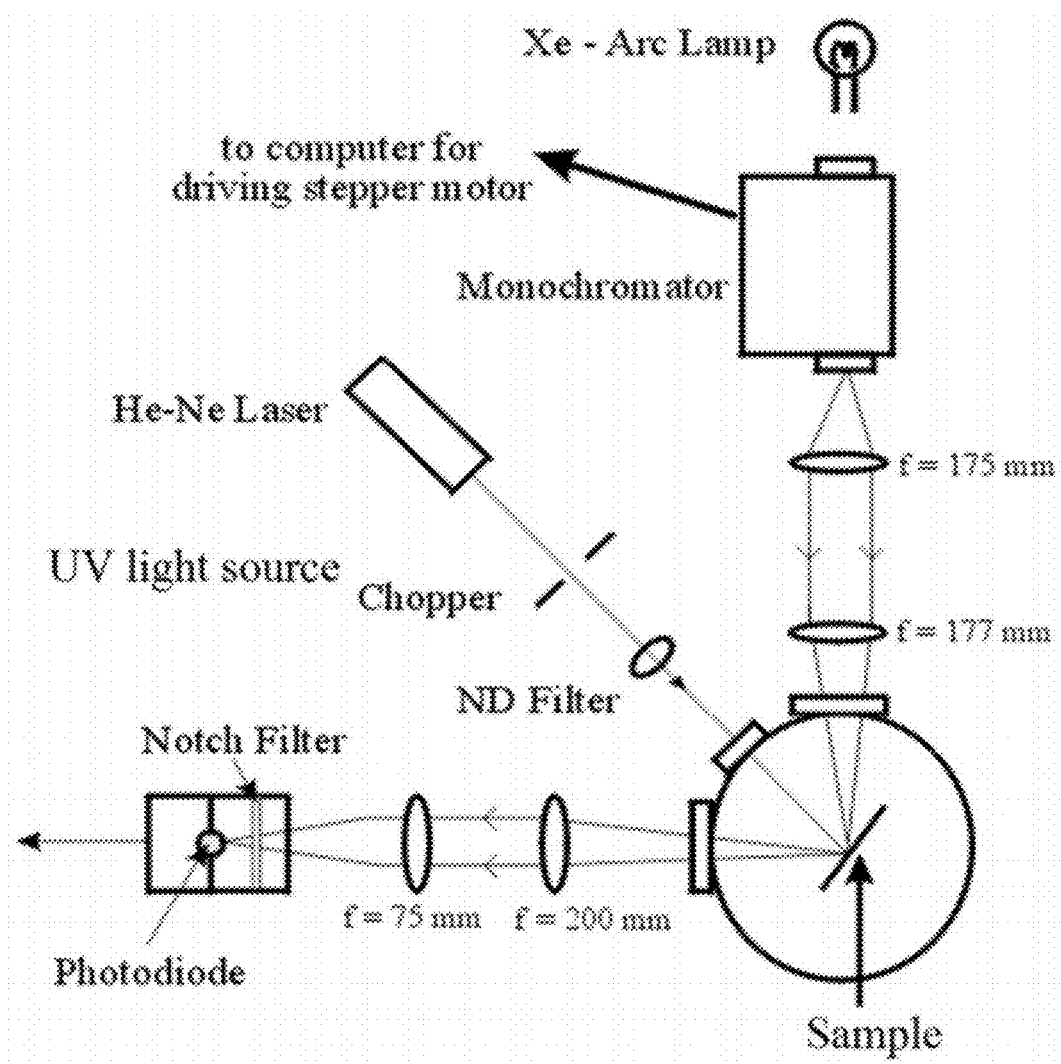

FIG. 124 provides a schematic of an experimental setup for photoreflectance as described herein.

Figure 125:
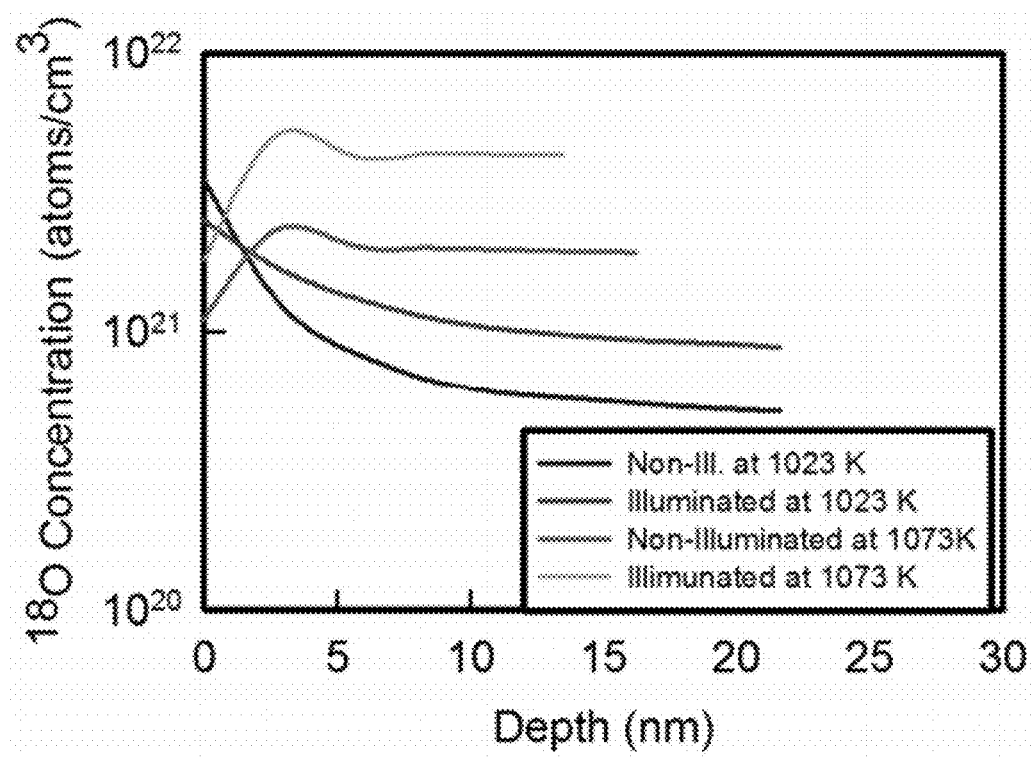

FIG. 125 provides a plot showing near-surface $^{18}O$ profiles showing monotonic behavior as well as non-monotonic. 90 min, 5×10⁻⁵ Torr. Behavior does not correlate with photostimulation behavior, which enhances diffusion in both cases.

Figure 126:
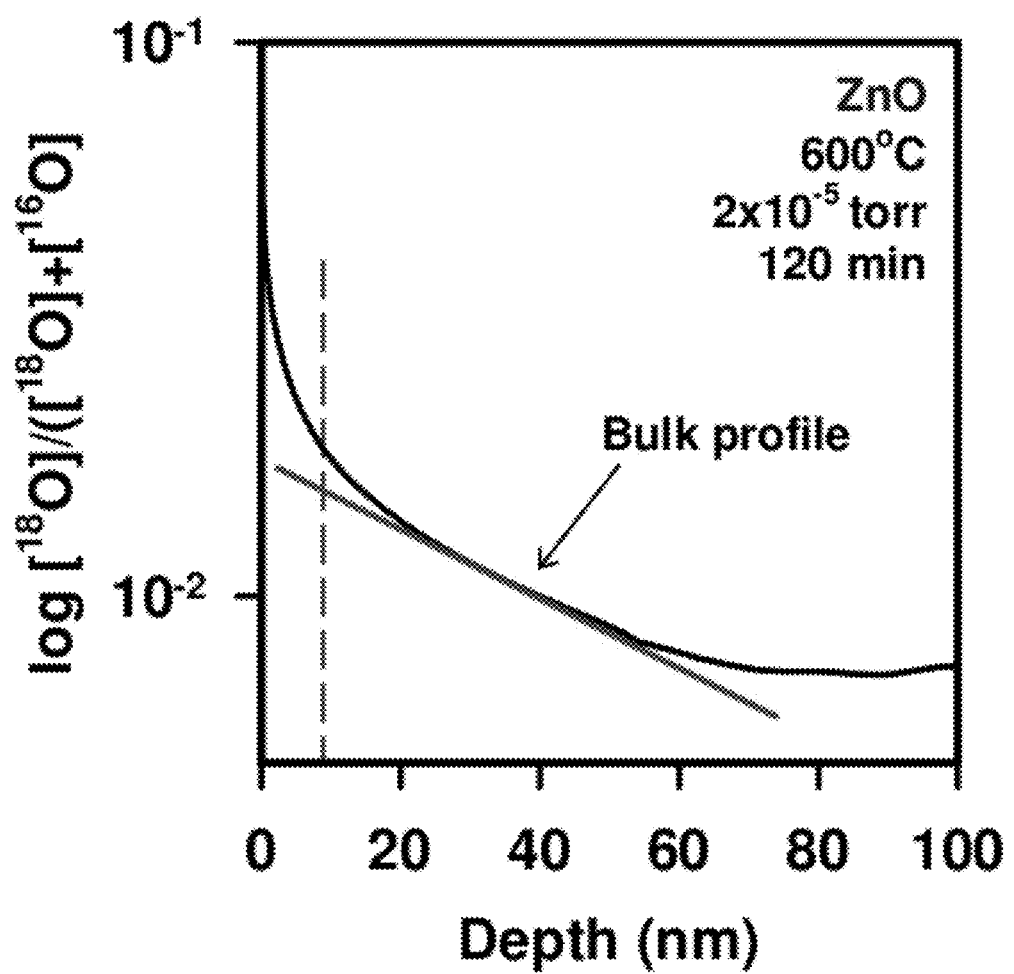

FIG. 126 provides a plot showing an $^{18}O$ diffusion profile in single crystal ZnO obtained using SIMS. The linear region on the semilog plot (highlighted with a red line) is strong evidence that a highly mobile intermediate species carries the diffusional flux.

Figure 127:
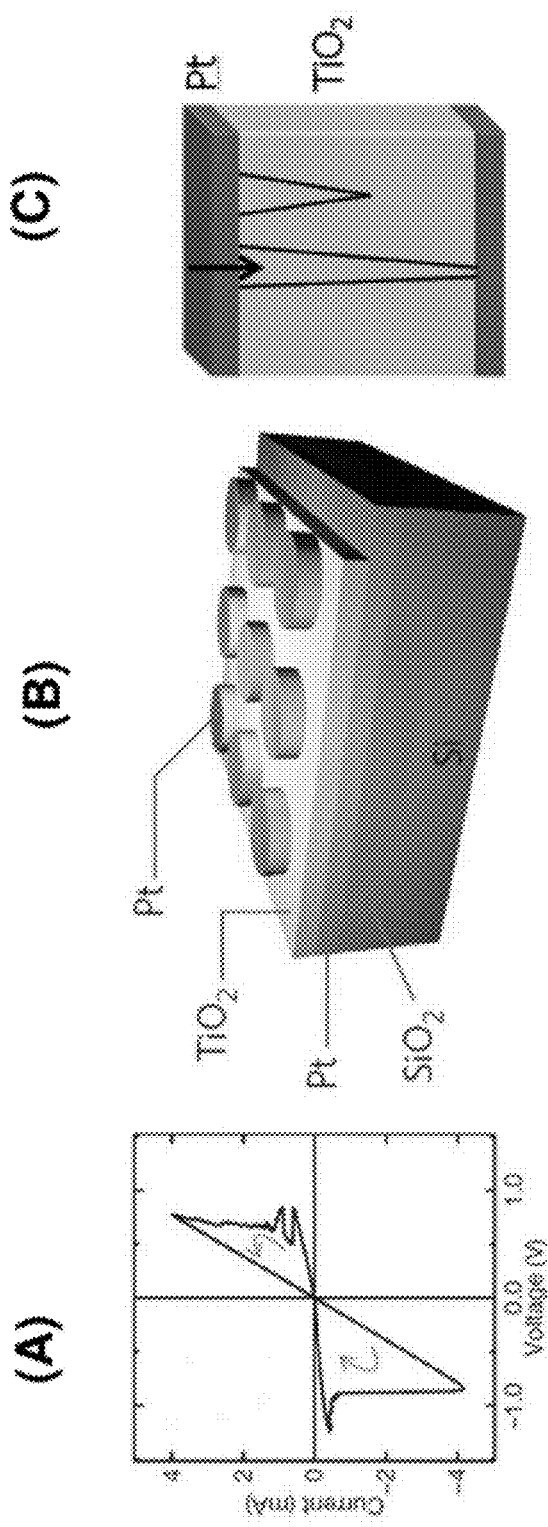

FIG. 127 provides a schematic representation of memory resistor devices made of $TiO_2$: (A) a typical current-voltage plot for a memory resistor, (B) a typical configuration in an electronic device, and (C) a proposal for how filaments of non-stoichiometric $TiO_2$ develop in the thin film in response to applied electric fields, and thereby change the resistance of the device.

Figure 128:
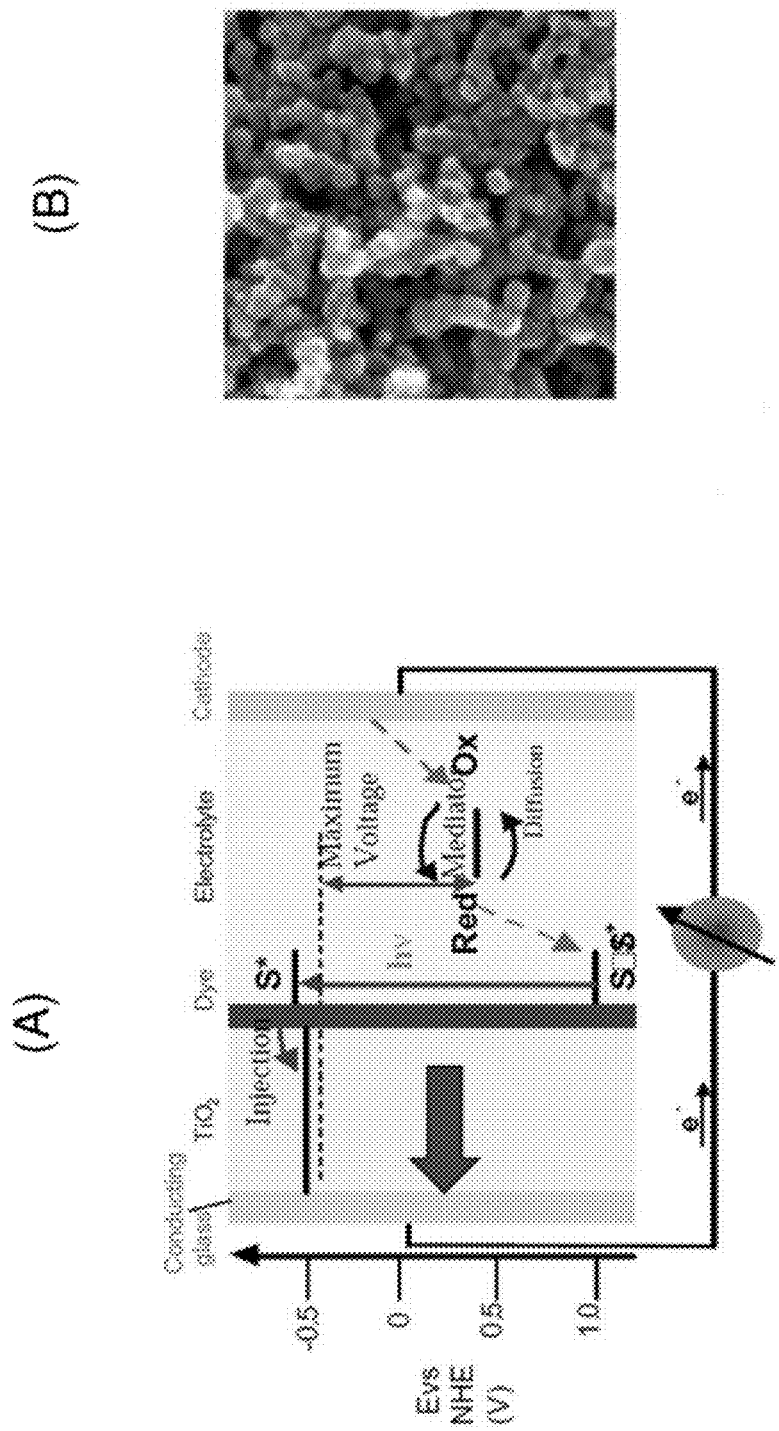

FIG. 128 provides (A) a schematic representation of the energy levels leading to current flow in a dye-sensitized solar cell, and (B) an electron micrograph of $TiO_2$ in a dye-sensitized solar cell.

Figure 129:
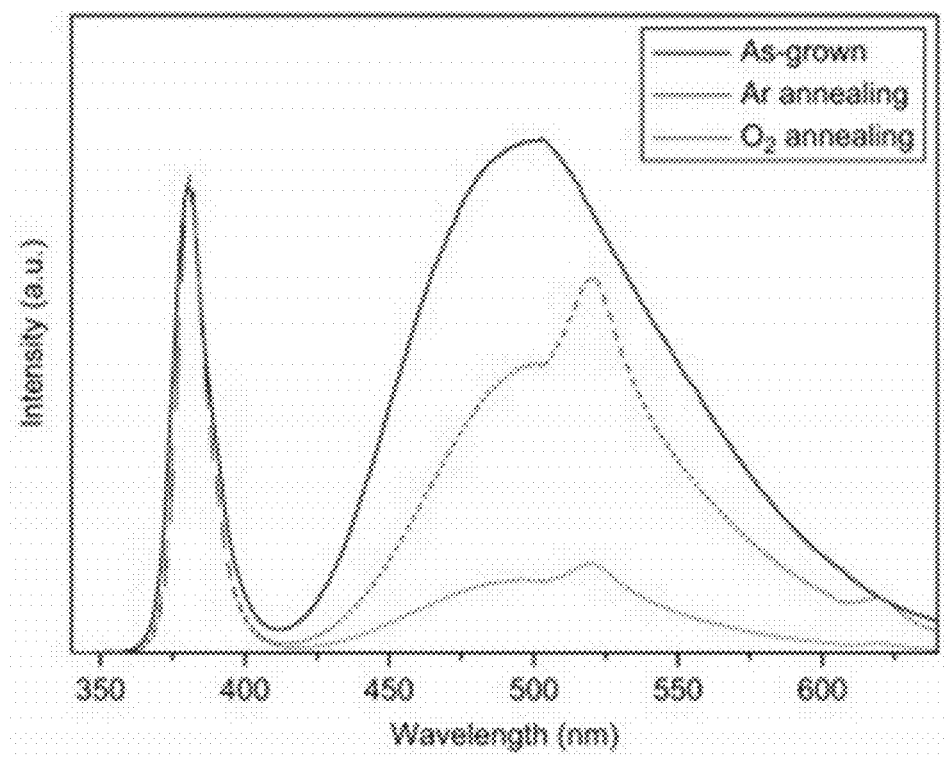

FIG. 129 provides a plot showing intensity as a function of wavelength for optical emission from ZnO nanowires (Ha et al., *J Phys. Chem. Sol.* 69 (2008) 2453.)

Figure 130:
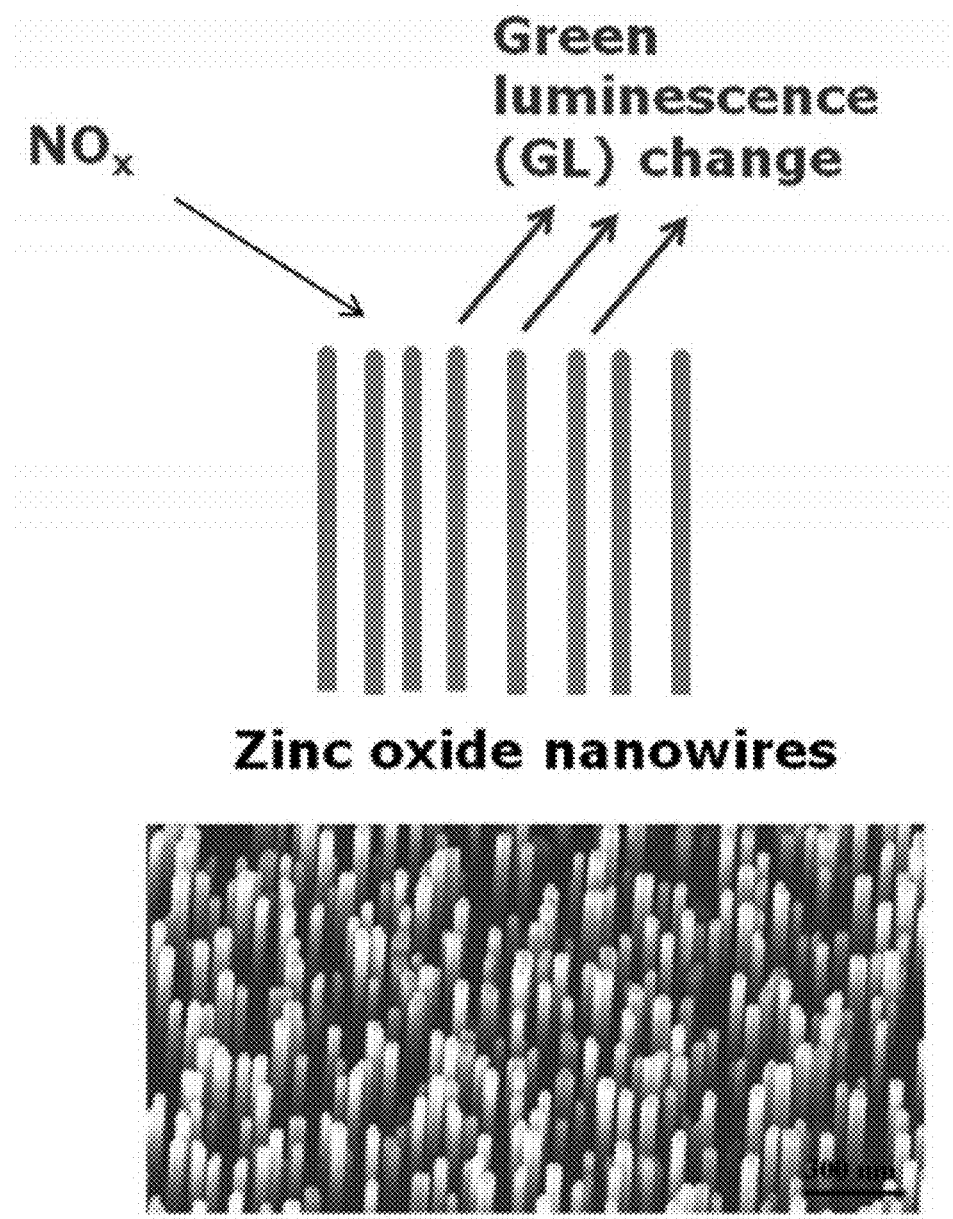

FIG. 130 provides (upper panel) a schematic representation of how $NO_x$ adsorption on ZnO nanowires can change the emission intensity of luminescence in the green region of the spectrum, and (lower panel) an optical micrograph of such emission from ZnO nanowires.

Figure 131:
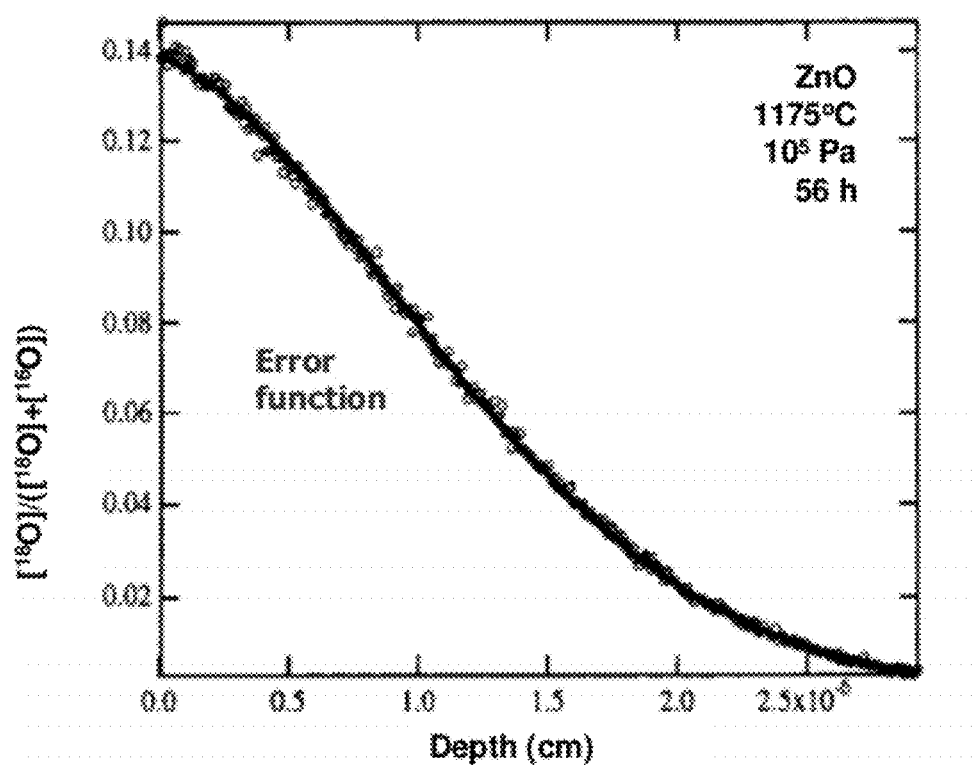

FIG. 131 provides a plot showing data from the literature (Tomlines, *J. Am. Ceram. Soc.* 81, (1998) 869) in which isotopically labeled oxygen was diffused into ZnO. The shape of the isotope profile obeys a complementary error function form characteristic of vacancy-mediated diffusion.

Figure 132:
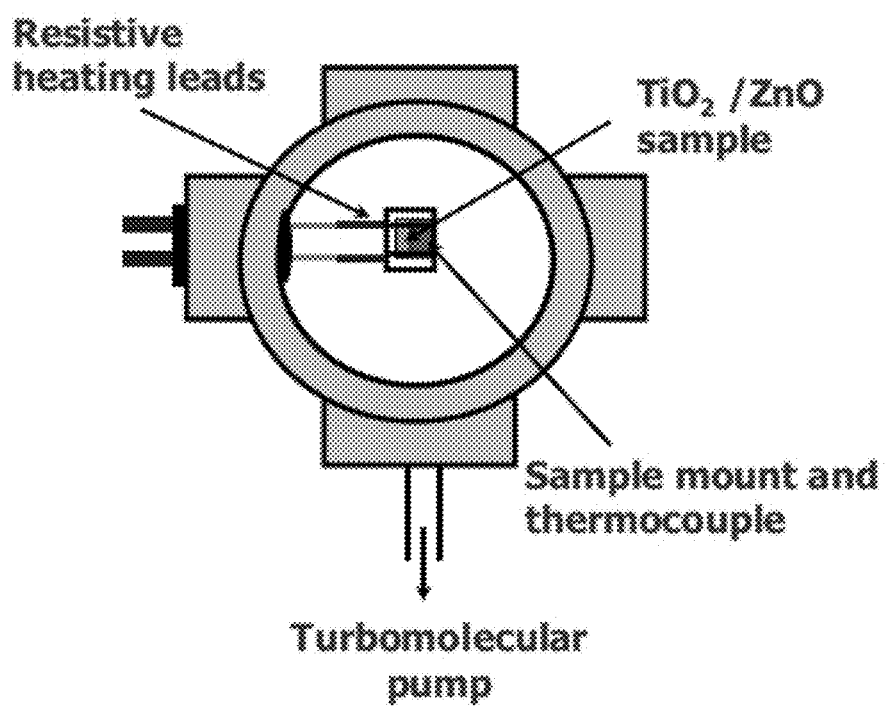

FIG. 132 provides a schematic of an apparatus for studying isotopic self-diffusion of oxygen.

Figure 133:
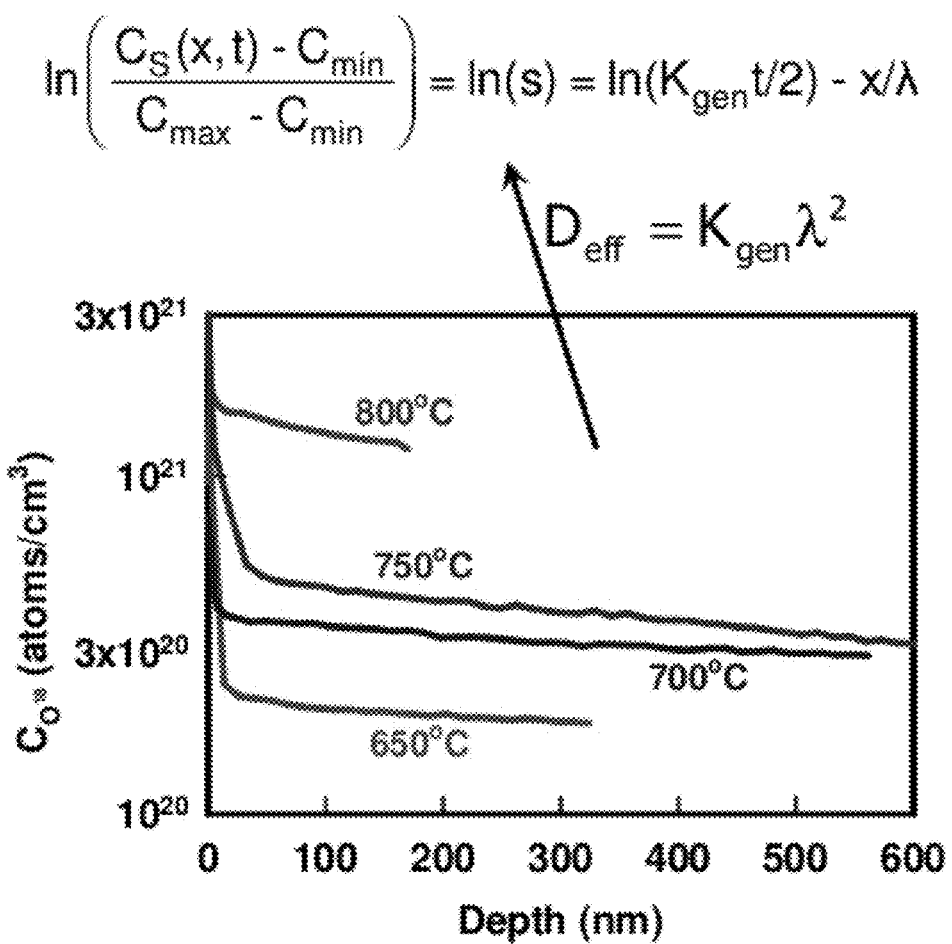

FIG. 133 provides plots of the concentration of $^{18}O$ as a function of depth in rutile $TiO_2$ for various annealing temperatures. The diffusion time was 90 minutes and the $^{18}O_2$ pressure was 1×10⁻⁵ Torr.

Figure 134:
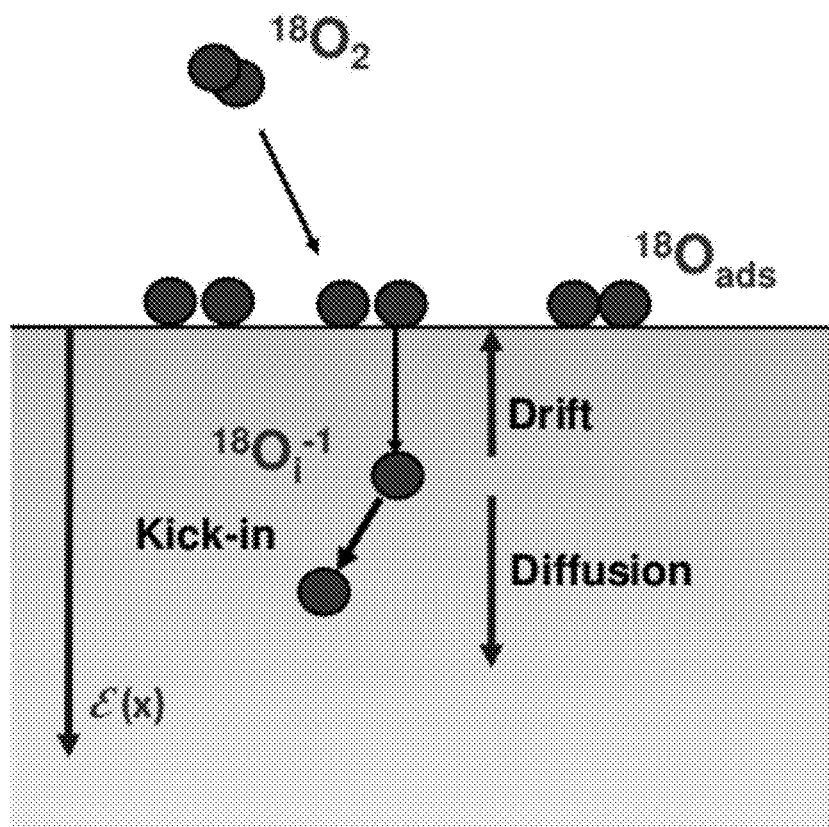

FIG. 134 provides a schematic representation of isotopic adsorption, diffusion, drift and kick-in.

FIG. 135 provides $^{18}O$ concentration profiles for ZnO (a) and $TiO_2$ (b).

FIG. 136 provides $^{18}O$ concentration profiles for $TiO_2$ annealed at 650° C. (a) and 700° C. (b).

Figure 137:
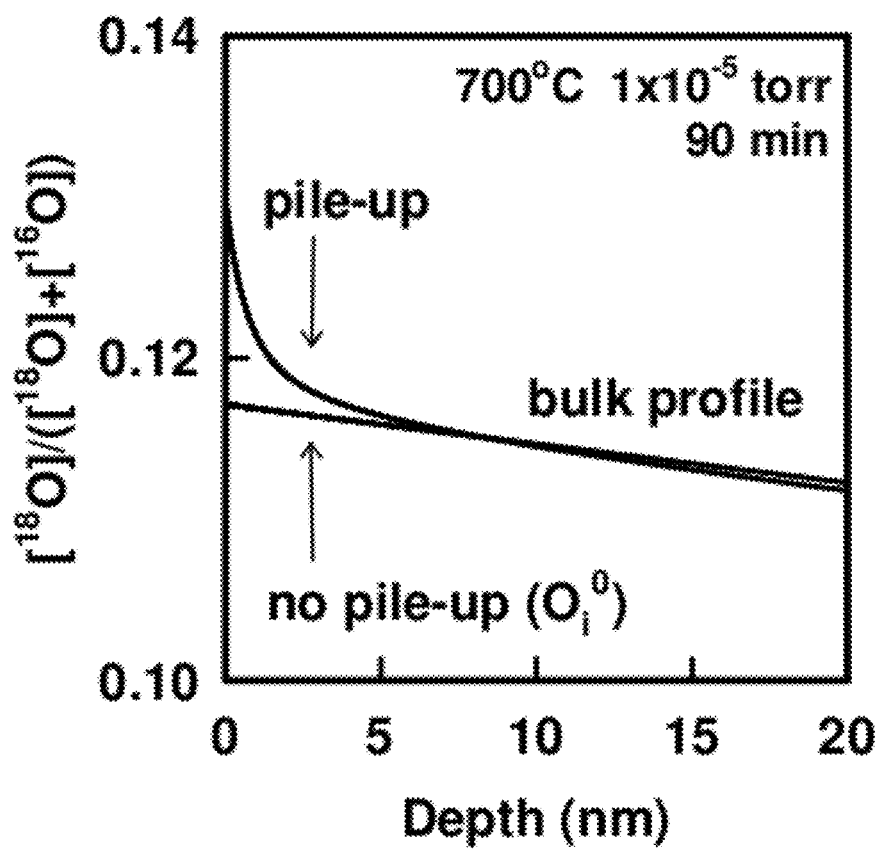

FIG. 137 provides simulated profiles of $^{18}O$ to show that the pile-up present within the first 3-4 nm of the surface is due to the presence of charged O interstitials. The simulations show pile-up when O interstitials are assigned a charge of −1, but no pile-up when the O interstitials are assigned a (neutral) charge of 0.

Figure 138:
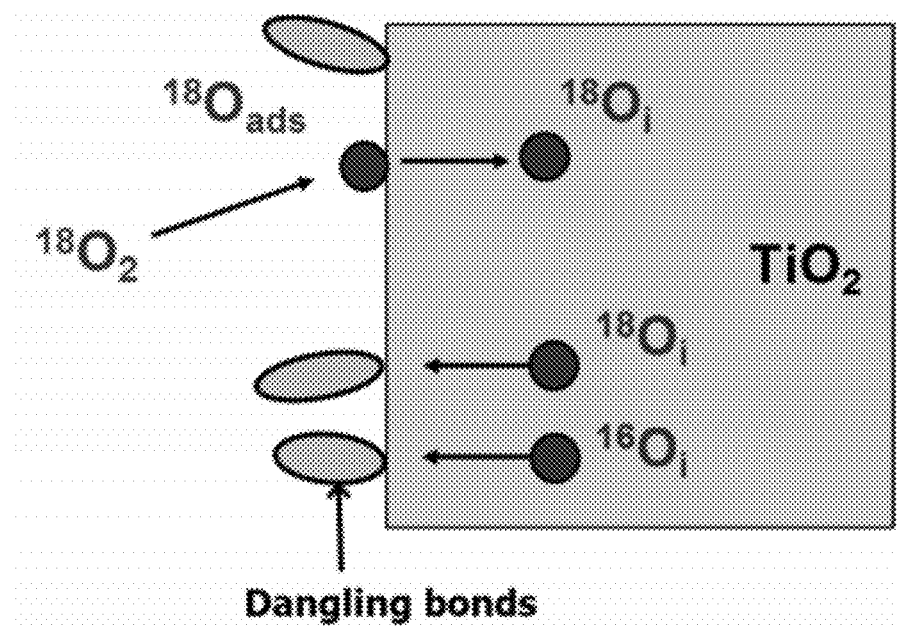

FIG. 138 provides a schematic representation of $^{18}O$ injection and annihilation.

Figure 139:
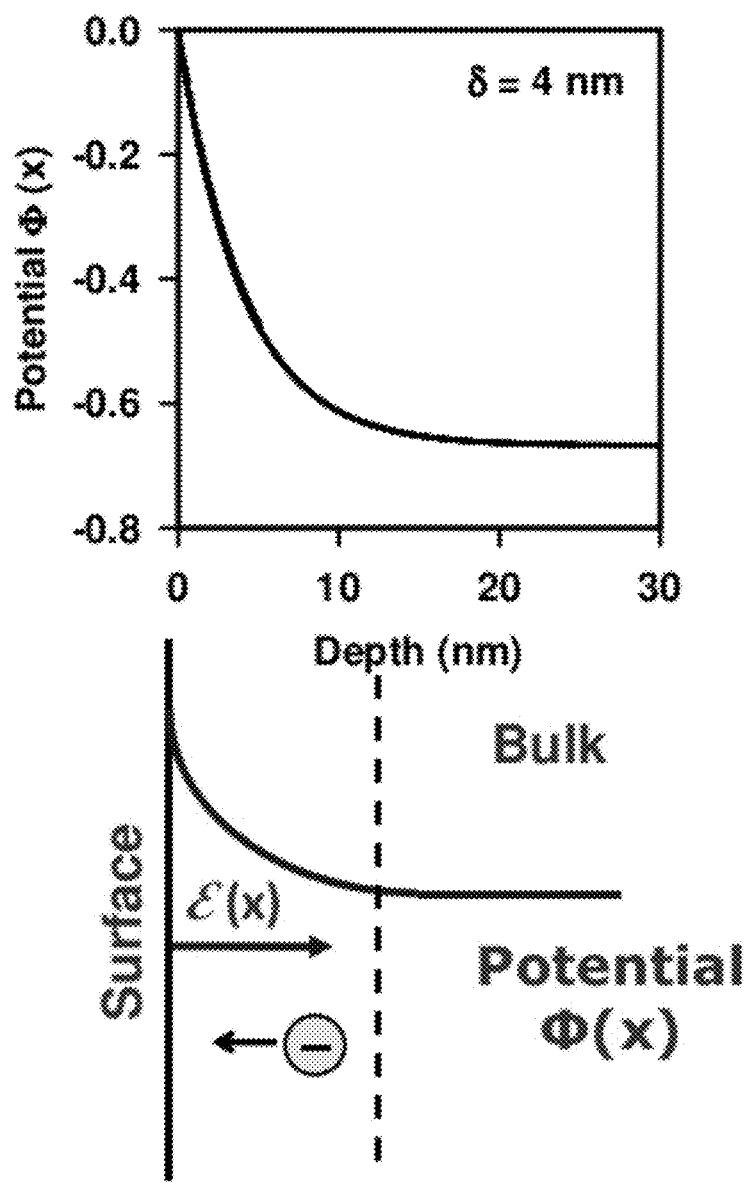

FIG. 139 provides a plot of surface potential as a function of depth and a schematic illustration of the results.

DETAILED DESCRIPTION

The following definitions and methods are provided to better define the invention and to guide those of ordinary skill in the art in the practice of the invention.

"Semiconductor" includes materials that are insulators at a very low temperature, but which have an appreciable electrical conductivity at a temperature of about 300 Kelvin. In the present description, use of the term semiconductor is intended to be consistent with use of this term in the art of electronic device fabrication and processing. Semiconductors useful in the present invention include intrinsic semiconductors and extrinsic semiconductors. Semiconductors useful in the present invention may comprise elemental semiconductors, such as silicon, germanium and diamond, and compound semiconductors, such as group IV compound semiconductors such as SiC and SiGe, group III-V semiconductors such as AlSb, AlAs, Aln, AlP, BN, GaSb, GaAs, GaN, GaP, InSb, InAs, InN, and InP, group III-V ternary semiconductors such as $Al_xGa_{1-x}As$, group II-VI semiconductors such as CsSe, CdS, CdTe, ZnO, ZnSe, ZnS, and ZnTe, group I-VII semiconductors such as CuCl, group IV-VI semiconductors such as PbS, PbTe and SnS, layer semiconductors such as $PbI_2$, $MoS_2$ and GaSe, and oxide semiconductors such as $TiO_2$, ZnO, CuO and $Cu_2O$. The term semiconductor includes intrinsic semiconductors and extrinsic semiconductors that are doped with one or more selected materials, including semiconductors having p-type doping materials and n-type doping materials. The term semiconductor includes composite materials comprising a mixture of semiconductors.

"Dopant" refers to ions, atoms, compounds, or any aggregates or combinations of these that are introduced into a material, usually in small quantities, to affect the material's chemical, electrical or physical properties. As used herein dopants include, atoms, compounds, or any aggregates or combinations of these that are introduced in a semiconductor to affect the semiconductor's electrical characteristics, such as the semiconductor's electrical conductivity and resistance. Dopants useful in the present invention include p-type dopants such as boron, n-type dopants such as phosphorous, antimony and arsenic, and combinations of n-type dopants and p-type dopants.

"Interstitial" refers to an atom, ion and/or molecule that does not reside in the lattice sites or substituted lattice sites of a material, such as a single crystalline or polycrystalline material. Interstitial also may refer to a cluster of atoms, ions, molecules or any combination of these that does not reside in the lattice sites or substituted lattice sites of a material. Interstitials may comprise atoms or clusters of semiconductor atoms which are not located in the lattice sites of a semiconductor and/or dopant atoms or clusters of dopant atoms that are not located in the substituted lattice sites of a semiconductor.

"Surface abundance" refers to the abundance of a material or combination of materials on a surface, such as an exposed surface of a semiconductor. Surface abundance may be characterized in terms of number of atoms, ions or molecules located on a surface per square centimeter. Alternatively, surface abundance may be characterized in terms of the number of monolayers or multilayers or the fraction of monolayers or multilayers on a surface. In the present invention, defect control groups may be present on semiconductor surfaces in less than monolayer amounts or may be present in monolayer or multilayer amounts. In an embodiment of the present invention, the surface abundance of defect control groups is selected over the range of $5×10^{12}$ molecules cm⁻² to about $2×10^{15}$ molecules cm⁻², more preferably for some applications $4×10^{14}$ molecules cm⁻² to about $9×10^{14}$ molecules cm⁻². In another embodiment, the surface abundance of defect control groups is selected from the range of about 0.01 to about 3 monolayers, preferably for some applications 0.7 monolayers to about 1.3 monolayers.

"Defect concentration depth profile" is a characteristic related to the spatial distribution of defects in a semiconductor structure, such as a semiconductor layer. Defect concentration depth profile may refer to a one-dimensional distribution of the concentrations of defects as a function of distance from a surface. Defect concentration depth profile may also refer to a two-dimensional or three-dimensional distribution of the concentrations of defects corresponding to a two-dimensional area or three-dimensional volume as a function of distance from a defined patch on the surface. The present invention provides methods of making structures wherein the functional form, average depth and other characteristics of a defect concentration depth profile may be accurately selected. In an embodiment, the defect concentration decreases exponentially from the surface to a distance, X, from the surface, where X is less than or equal to 1000 nm, less than or equal to 750 nm, less than or equal to 500 nm, less than or equal to 250 nm, less than or equal to 100 nm, less than or equal to 10 nm, less than or equal to 5 nm, or less than or equal to 1 nm.

"Surface modification agent" refers to compounds, atoms, ions or any aggregates or mixtures of these that are capable of interacting with a material, such as a metal oxide, in a manner generating defect control groups on an exposed surface. Surface modification agents may be from ambient surroundings, thereby yielding "native" defect control groups, or introduced to the exposed surface as chemical reagents, thereby yielding "non-native" defect control groups. In some embodiments, a particular concentration of surface modification agent produces a selected surface abundance of defect control groups on the exposed surface.

An "atomically clean surface" is one free of all or all but a few percent of a single monolayer of foreign atoms, either adsorbed on, or substitutionally replacing, surface atoms of the parent lattice. (R. W. Roberts, British Journal of Applied Physics, 14(9) (1963) 53.) Thus, an "atomically clean surface" refers to a surface comprising surface modification agents or contaminants either adsorbed on, or substitutionally replacing, surface atoms of the parent lattice at a concentration less than or equal to about 0.09 monolayers, less than or equal to about 0.05 monolayers, less than or equal to about 0.03 monolayers, less than or equal to about 0.01 monolayers, less than or equal to about 0.005 monolayers, or less than or equal to about 0.001 monolayers. Several techniques may be used separately or in combination to create atomically clean surfaces. Exemplary techniques include evaporating a material onto a surface, high temperature heating, chemical reaction, cleaving or crushing a crystal, ion bombarding a substrate with inert gas ions, and field desorbing part of the substrate.

"Proximate to the surface" refers to a position within a material or structure that is close to a surface, such as an exposed surface that is treated with a surface modification agent(s). In an embodiment, proximate to the surface refers to a position in the bulk material or structure within 100 microns of the surface, or optionally for some applications within 10 microns of the surface, or optionally for some applications within 1000 nanometers of the surface. In an embodiment, proximate to the surface refers to a position in the bulk material ranging from 1 nanometer to 100 microns from the surface.

Referring to the drawings, like numerals indicate like elements and the same number appearing in more than one drawing refers to the same element. Unless otherwise noted, the terms and phrases used herein have their art-recognized meaning, which can be found by reference to standard texts, journal references and contexts known to those skilled in the relevant art.

Example 1

Defect Engineering in $TiO_2$ Via Surfaces 1.a. Effect of Surface Chemistry on Oxygen Defects in Titanium Dioxide Introduction.

Figure 1:
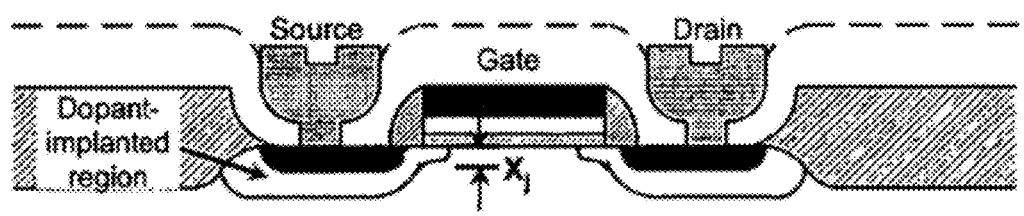
FIG. 1 provides a schematic illustration of a CMOS transistor showing the junction depth ($X_j$).
Figure 2:
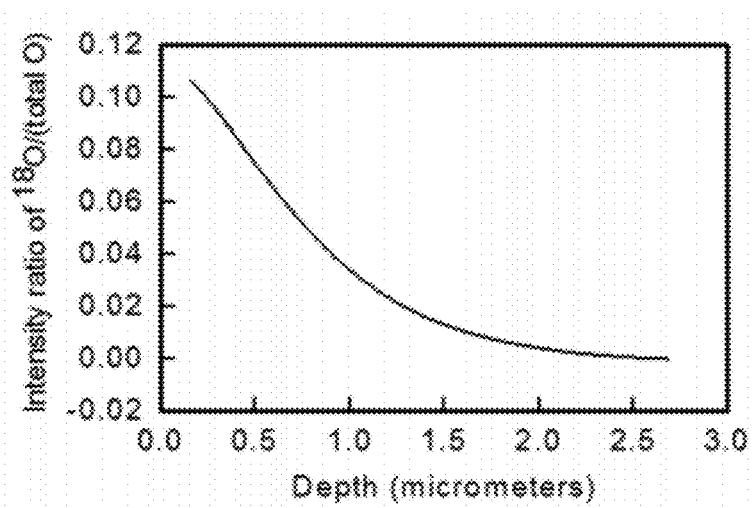
FIG. 2 provides a plot showing oxygen diffusion in titanium dioxide observed by Arita et al.

Past studies appear to suggest that oxygen diffuses in titanium dioxide via a vacancy mechanism. Oxygen vacancies are widely accepted to be the majority oxygen-related native defect in rutile (and under many conditions the majority defect overall), so it would not be illogical for the O vacancy to mediate most of the diffusive flux of oxygen atoms. Furthermore, an experimental SIMS study by Arita et al. of oxygen isotope diffusion in rutile has given further evidence for the vacancy mechanism. [See Reference 1]. The rutile crystal (110) was annealed in 52 Torr oxygen, at 1180° C., for 5.2 hours. In addition, the samples were pre-annealed in air prior to the anneal, which implies that contaminants from the air could have deposited on the surface. An example profile is shown in FIG. 2. The shape is consistent with the complementary error function that is expected from a vacancy driven diffusion mechanism. Importantly, the shape is closer to a complementary error function than a simple exponential, which would indicate diffusion via a fast intermediate. In particular, the Arita profile at shallow depths (0.2-0.4 μm) is approximately linear and even exhibits a bit of convexity on this linear vertical scale. Profile convexity is much more evident on a logarithmic scale, as is characteristic of the complementary error function.

It appears little attention has been paid to how the free surface or its chemical state contributes to the formation of oxygen interstitials. In particular, it appears there has been no measurement of oxygen diffusion under high vacuum conditions, while monitoring that the surface was clean and free from adsorbates.

Past work on the semiconductor silicon has shown that changing the concentration of a tightly bonded adsorbate (nitrogen) on the surface offers control over the spreading of a profile of isotopically labeled Si. [See Reference 2]. Effects of surface adsorption condition were observed for both the implanted profile of $^{30}Si$ into $^{28}Si$, creating an interstitial super-saturated substrate, and for a deposited heterojunction of $^{30}Si$ on $^{28}Si$ which was heated to be undersaturated in interstitials. It is believed the adsorbate on the surface controlled the defect concentration by controlling the rate of defect annihilation at the surface from a defect-abundant substrate or the rate of defect generation at the surface from a defect-deficient substrate.

Most relevant for the present example was the case of undersaturation. In this case, a layer of $^{28}Si$-rich silicon was grown on top of natural silicon which has a higher concentration of $^{30}Si$. This configuration yielded a step change in the concentration of $^{30}Si$. The silicon was grown at a lower temperature than the annealing temperature, so that when it was annealed, it was undersaturated in interstitials. The surface was covered with the desired amount of nitrogen, and then the sample was annealed. During the annealing process the surface served as a source of interstitials. The resultant profiling spreading [see Reference 3] proved to be less when the surface coverage was higher, showing that adsorption reduces the degree to which the surface generates interstitials. In addition, prior to this work, there was debate in the literature as to whether silicon diffusion was mediated by vacancies or interstitials. As vacancy diffusion is a single step process, the exponential tail shaped depth profiles proved that with the clean surface, diffusion had to be mediated by interstitials. For the bulk, both mechanisms might still operate. [See Reference 3].

Based on the research done in silicon, this work set out to determine whether analogous effects operate for oxygen defects in rutile titanium dioxide. Initial studies done by Ramakrishnan Vaidyanathan, suggested that such an effect might exist. [See Reference 3]. In order to confirm and better characterize the surface pathway, it was necessary to find an adsorbate that could controllably adsorb onto the surface to saturate dangling bonds and thereby block the formation of oxygen defects from the surface.

Figure 3:
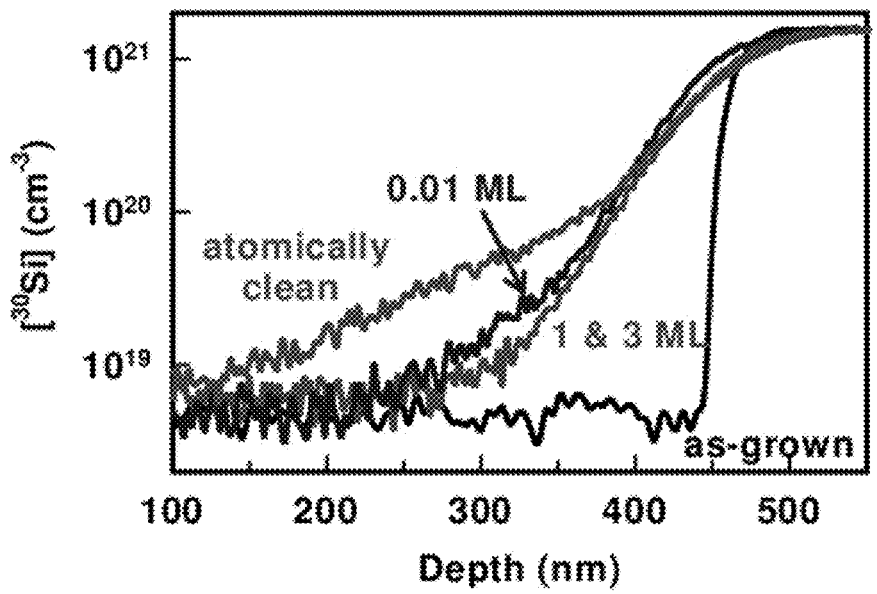
FIG. 3 provides a plot showing silicon 30 profile spreading due to surface generation of interstitials for various adsorbate coverages observed by Kapil Dev.

Elemental sulfur was chosen due to its ability to replace surface oxygen atoms on rutile $TiO_2$ [see Reference 5] and to remain on the surface without desorbing or sinking into the bulk at the temperatures of interest. Even at high temperatures of 800° C., the sulfur coverage should be about 0.1 ML. [See Reference 6]. Hebenstreit et al. [Reference 6] found that sulfur adsorbs on titanium, and then fills in-plane surface oxygen atoms at high temperatures. At lower temperatures it binds to bridging vacancies. They also found that from 600 to 800° C. the concentration of sulfur at the surface is constant at about 0.1 ML. While numbers are small, the previous silicon work showed that even coverages of 0.01 ML made a large difference in the profile spreading as shown in FIG. 3. One concern with sulfur is that it could diffuse into the bulk, however most literature agrees that if sulfur diffuses into the bulk at all, the penetration is only a couple atomic layers because it is not energetically favorable for the sulfur to exchange with the oxygen within the bulk. [See Reference 7]. Although diffusion of sulfur in titanium dioxide has been observed, it was only observed in cases where the sulfur was actually implanted in the titania.

Experimental.

Figure 4:
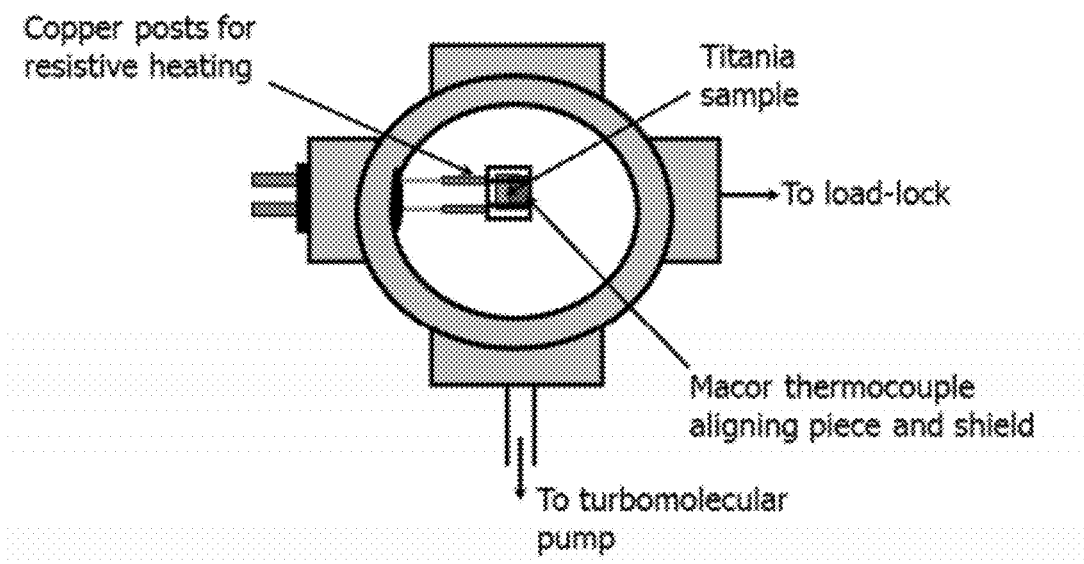

Samples were annealed in a high vacuum chamber (base pressure $5\times10^{-8}$ Torr) under a background pressure ($2\times10^{-4}$ to $1\times10^{-7}$ Torr) of isotopically labeled oxygen 18 (97% isotopically pure, 99.99% chemically pure). A leak valve allowed for precise control of the oxygen pressure. Also, a mass spectrometer was present to ensure that the measured pressure was indeed mostly oxygen 18. Due to the high electrical resistivity of titanium dioxide, the sample was heated resistively by passing current through a silicon backing sample. After the sample was annealed, the profile was measured ex situ with Secondary Ion Mass Spectrometry (SIMS). FIG. 4 shows an illustration of the apparatus.

A second vacuum chamber with the same base pressure was also equipped with an Auger Electron Spectrometer and an electrochemical sulfur gun for studying the effects of sulfur. During the experiments, the samples were first annealed in a background of $^{16}O_2$ having the same pressure as the desired pressure of isotopic oxygen, and the same temperature. An equilibration time of 6 hours was chosen for each sample. At this time, all of the defects except for titanium vacancies reached a full equilibrium. The titanium vacancies diffuse so slowly, they remain bystanders during both equilibration and subsequent isotopic annealing. [See Reference 8]. Using the effective diffusivity found in these experiments, oxygen should diffuse into the sample deep enough for the present profiles within 3 hours at a temperature of 750 degrees C. The calculations were done using the equation $t=x^2/4 D_{eff}$ where x was estimated at 400 nm. Following the pre-annealing step the sample was cooled down while the oxygen gas lines were pumped down, and then the sample was annealed in $^{18}O_2$ for 30 to 120 minutes, most commonly 90 minutes.

Secondary ion mass spectrometry (SIMS) showed that silicon was present in concentrations as high as the titanium concentrations in some of the titania samples, and diffused in for up to 20 nanometers. Most likely this occurred because the silicon backing plate formed gaseous SiO when it was exposed to oxygen during equilibration and annealing. The SiO then reacted with the surface of the titania to form a titanium/silicon oxide mixture. To suppress the reaction between the silicon and oxygen, silicon backing plates were oxidized in an oxidation furnace at 950° C. for 60 minutes. This allowed about 30 nm $SiO_2$ to form. $SiO_2$ is inert when exposed to oxygen, and this procedure successfully eliminated Si from the annealed $TiO_2$.

Initially, conditions were chosen based on which conditions would lead to the formation of enough defects to contribute to the diffusion. Next, it was necessary to work within the constraints of experimental limitations. With the resistive heating setup, it was difficult to heat the titania above 825° C. Above this temperature the silicon backing sample melted. Below 600° C. there was too little diffusion observed with SIMS. Oxygen pressure was kept small to reduce the amount of expensive $^{18}O_2$ that was consumed. The minimum value for the pressure of oxygen was constrained to about $1\times10^{-6}$ Torr because at lower pressures, the sample mount out gassed too much to effectively control the oxygen pressure. In addition the base pressure was typically around $5\times10^{-8}$ Torr, and it was desirable to keep the operating pressure much higher than the base pressure. Finally, too high of oxygen pressures caused corrosion within the chamber and could cause the leak valve to have bursts large enough to burn out the ion gauge filament.

Figure 5:
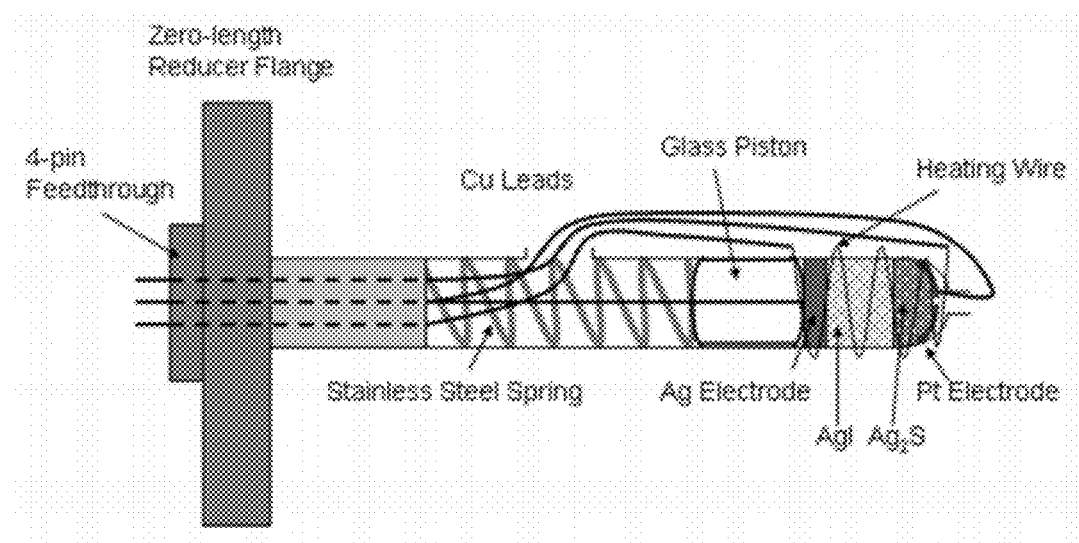
Figure 6:
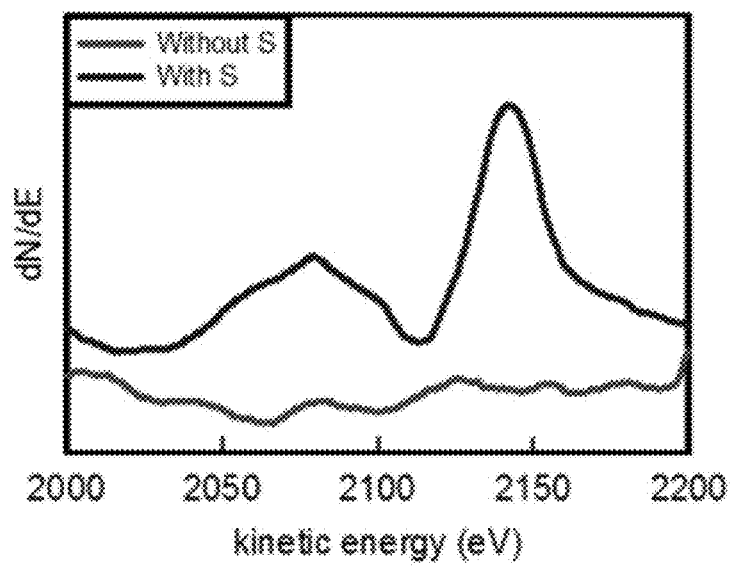
FIG. 6 provides an Auger Electron Spectroscopy plot showing a $TiO_2$ sample covered by sulfur and one that is clean.

An electrochemical sulfur cell was built by Kyong Noh [see Reference 9] based on a design by Heegeman et al. [see Reference 10] to deposit elemental sulfur on the surface of titanium dioxide. A diagram of the sulfur cell used in this work is shown in FIG. 5. The sulfur cell was heated to approximately 100° C. with a voltage of 200 mV for 20 minutes. The deposition of sulfur was verified via Auger Electron Spectroscopy (with retarding field optics) and X-ray Photoelectron Spectroscopy. The resultant Auger plot is shown in FIG. 6 with the KLL peak for sulfur. The peak is shifted slightly, but that was most likely due to error in the instrument. In addition, SIMS profiles of sulfur in the samples showed a rise in the sulfur concentration only in the first 5 nanometers in a portion of the samples, after which it was the same for a sample that had not been covered in sulfur.

Rutile (110) samples were obtained from MTI Crystals Corp. The samples were 0.5×1 cm and 1 mm thick. They were yellow when received from the company and became blue grey after annealing. The blue color indicates that the sample is reduced and titanium interstitials are present in higher proportions than oxygen vacancies. The yellow samples have more oxygen vacancies. [See Reference 11]. To facilitate reuse of expensive titania single-crystal samples multiple times, and to mitigate possible subsurface defects left over from mechanical polishing from the supplier, a combined mechanical-chemical polishing procedure was developed. Samples were polished on a conventional polishing wheel for 60 minutes between each use. This polishing time was chosen to remove sufficient material to eliminate all traces of isotopic oxygen left over from prior diffusion runs. The elimination was directly verified in control experiments that monitored the $^{18}O$ SIMS concentration profiles before and after polishing. A Vel-Cloth polishing pad was used based on its compatibility with the alumina powder used in the experiments. Lumina powder from Allied Corp. was used for the polishing. 1 micrometer alumina powder was used for an initial, 60 min rough polish. A 0.02 micrometer colloidal alumina was then used for a final polish. The resultant rms surface roughness was 3-5 nm, which was comparable to the samples obtained from the titania supplier. A ring stand was used to hold the sample in place during the polishing, and a weight was in place to hold the sample to the polishing wheel. Every 10 minutes the sample holder was rotated. Putting multiple samples in the acrylic holder led to uneven polishing from sample to sample.

The crystals were then chemically etched in concentrated $H_2SO_4$ at 150° C. for 20 minutes to remove any extended defects induced during the polishing step. The time and temperature were optimized by trial and error, to ensure that the process etched off a layer of $TiO_2$ at the surface, but was at a low enough temperature to avoid sulfur diffusing into the $TiO_2$. The change in the concentration of $^{18}O$ in the near-surface region before and after allowed gauging of the depth of etching. In addition, $TiO_2$ powder dissolved completely in sulfuric acid under these conditions. The etching was estimated to be approximately 50 nanometers which was twice the particle size of the finest polish, and hence large enough to go past any damage due to the polishing procedure. Under these conditions, no sulfur was observed within the bulk in the SIMS profiles. Etching also removed any contaminants on the surface. Next the samples were rinsed in deionized water, and then dried using nitrogen.

For final cleaning, the samples were placed in an ultrasonic bath for 2 minutes in electronics-grade methanol. Etching was done days before the samples were annealed, but a secondary methanol cleaning was done immediately before introducing the samples into the vacuum chamber. They were then dried by slowly pulling the sample out of the liquid so that the surface tension pulled off most of the methanol. Finally, they were dried with nitrogen flowing parallel to the surface to avoid leaving drying spots from surface tension on the surface, together with the associated residue.

Figure 7:
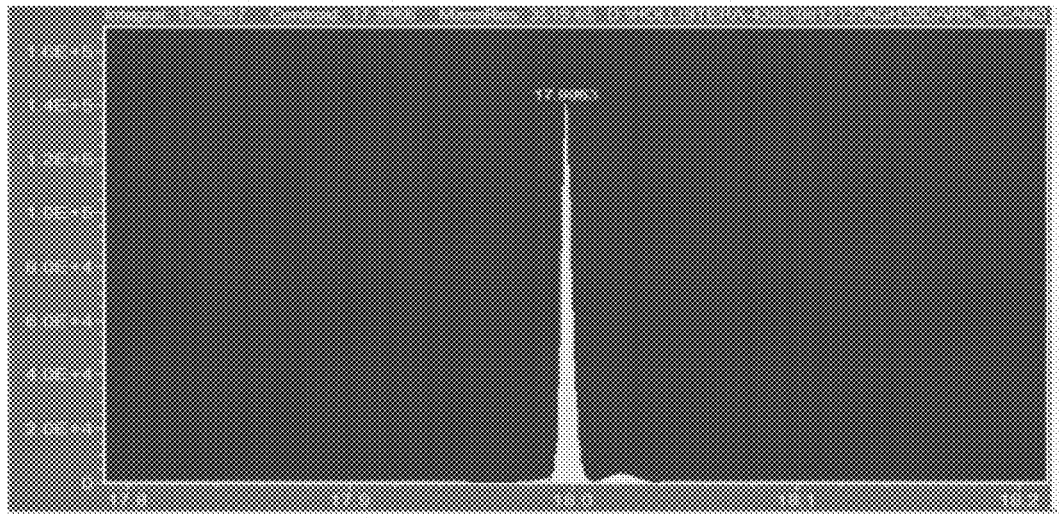
FIG. 7 provides a plot showing an example of $^{18}O/H_2O$ mass spectral resolution. The more intense peak is $^{18}O$ and the less intense peak to higher mass is $H_2O$.

Depth profiles of oxygen 18 were taken using a Phi Trift-III time-of-flight secondary ion mass spectrometer (TOF SIMS) with a negative Cs source. Initially, dynamic SIMS was utilized due to its increased mass resolution, but this was soon abandoned due to issues with sample charging. Electron flooding was used, however on the Cameca SIMS it overcharged the sample due to the nature of dynamic SIMS. The TOF SIMS is better equipped to deal with sample charging as it did not lead to a buildup of negative charge. 10 seconds of charge compensation was used. The Cs sputtering beam's ion energies were 100 nA and Au primary beam had ion energies of 600 pA. One problem with profiling isotopic 18 oxygen is that it has almost the same mass as water, which is naturally present in the vacuum chamber. Using long analyzing times, it was possible to mostly resolve the difference between water and oxygen as shown in FIG. 7.

Even so, raw SIMS signals exhibited a great deal of run-to-run and sample-to-sample variability, even for un-annealed samples that should have yielded identical results. Thus, extra precautions were taken to eliminate water in the chamber, and to reduce residual effects of it. First, the sample was pumped down to $2\times10^{-7}$ Torr or less in the sample introduction chamber before being introduced to the main chamber, to minimize the water the main chamber was exposed to. Next, the 18 oxygen depth profiles were monitored from a series of un-annealed samples, where the $^{18}O$ concentration should be the same as the natural abundance of 0.204 percent. Un-annealed samples were monitored every time SIMS were done. There was a lot of day-to-day variation in the resultant SIMS profiles, even from the same sample. These experiments revealed a correlation between OH and $^{18}O$ signals. The OH signal seemed to scale in proportion with the amount of background water in the chamber, as did the $^{18}O$ signal. Over a range of nearly an order of magnitude the two signals appeared to vary in proportion to each other. Presumably the OH resulted from a direct reaction of water with the rutile surface, whereas the variation in $^{18}O$ signal was due to a water- or H-induced change in the ion yield. $^{16}O$ signals were also scaled with OH, but with a slightly different correlation factor. Collection of a family of data for OH and $^{18}O$ signals over several samples enabled the development of a phenomenological scaling factor that made all of the un-annealed profiles have a $^{18}O$ concentration within a factor of 2 of each other. This correlation was then used to adjust all of the $^{18}O$ profiles in the annealed profiles, assuming the error was the same in the annealed and un-annealed samples.

Despite these protocols, it proved difficult to further eliminate the factor-of-two variation among profiles from run-to-run and sample-to-sample. The underlying reasons for this variation are unknown. To further reduce this apparently random variability, depth profiles were taken on each sample equally distributed across the sample, and their results were averaged together.

Results.

Figure 8:
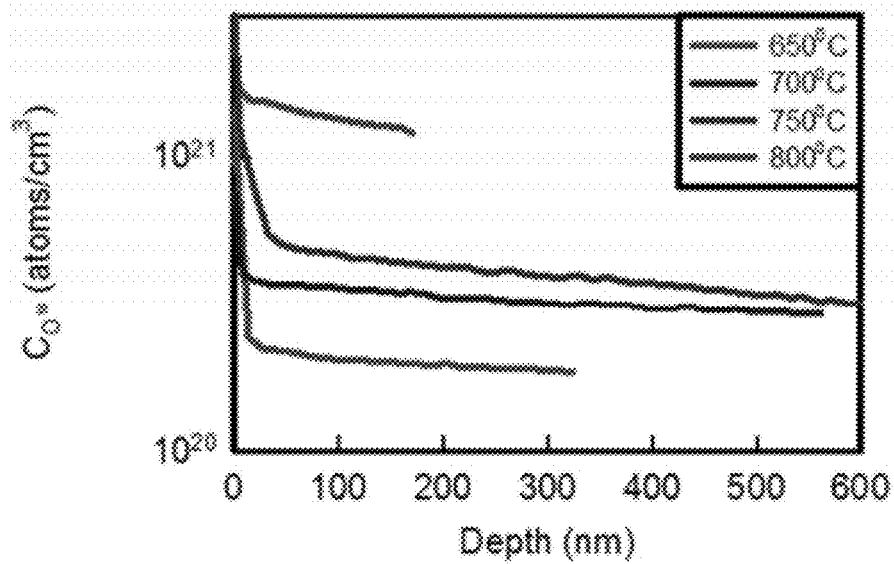
FIG. 8 provides a plot showing oxygen (18) concentration depth profiles for samples annealed in a background of $1\times10^{-5}$ Torr $^{18}O_2$ for 90 minutes. The slight change in slope is an indicator of the change in λ. The change in intercepts indicates a change in $K_{gen}$ with temperature.
Figure 9:
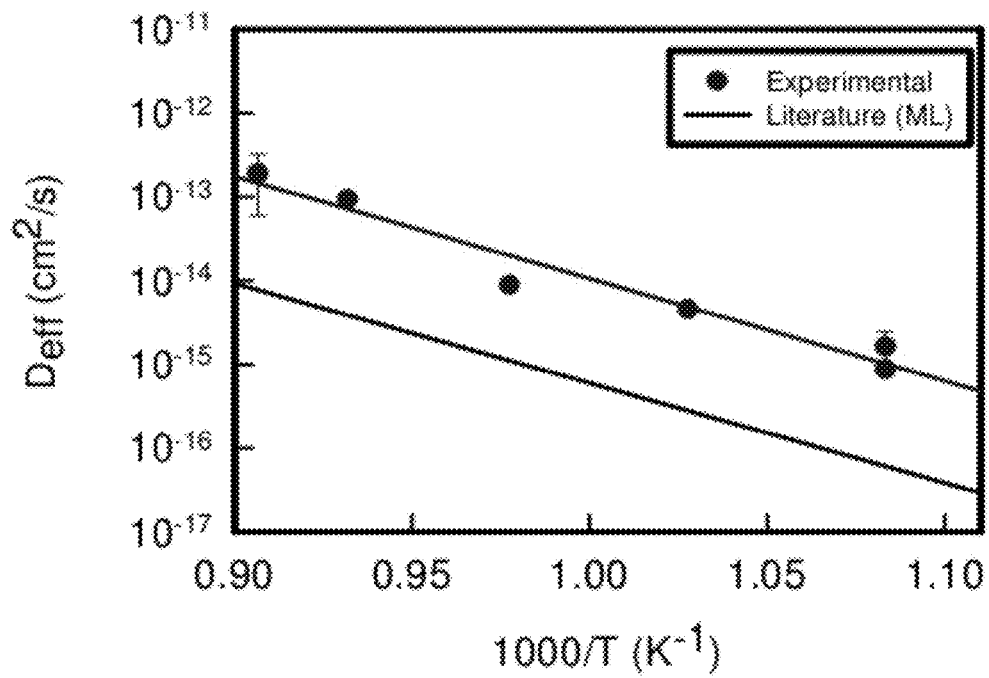
FIG. 9 provides a plot showing effective diffusivity for isotopic oxygen in titanium dioxide. The upper points and line represent the data from Example 1.a, while the lower line represents literature values.

Under the annealing conditions employed here, depth profiles of isotopic oxygen in rutile typically showed an exponential shape beyond the first few nanometers, as shown in FIG. 8. The exponential shape manifests as a straight line in the semi-logarithmic vertical scale. This behavior was in contrast to the complementary error function shape seen previously by Arita et al. [See Reference 1]. The maximum length of anneals done in this data set was two hours and the profiles were still exponential in shape, however at longer times the profiles would presumably have resembled a complementary shaped error function. FIG. 9 shows the resultant diffusivities.

From FIG. 9, it is clear that not only does the diffusion profile of oxygen in the experiments with a clean surface look different; the effective diffusivity is about 20 times that of the literature. The clean surface has opened up a new mechanism for oxygen diffusion, with an increased diffusion rate. The effect is mainly on the pre-exponential factor; the activation energy does not appear to be substantially changed.

Figure 10:
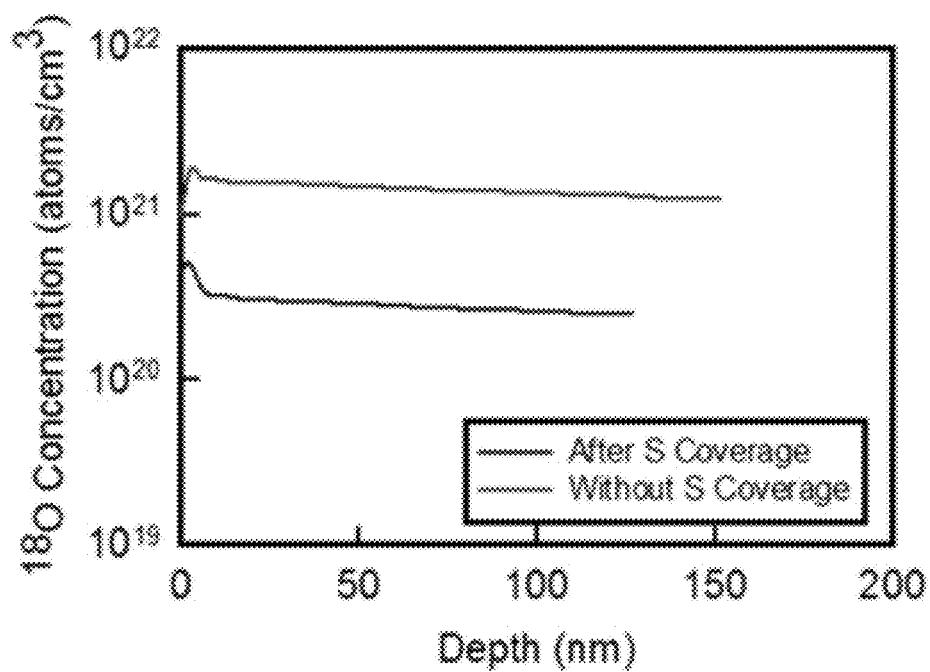
FIG. 10 provides a plot comparing the depth profiles for a sample that was covered with sulfur (upper trace) and one that was not (lower trace). Both are at 800° C., $1\times10^{-5}$ Torr oxygen.

In addition to investigating the clean surface, surfaces with about a 0.1 ML coverage of sulfur were studied at $1\times10^{-5}$ Torr of isotopic oxygen. These profiles were still exponential in shape. FIG. 10 shows an example of the difference between a sample with and without sulfur annealed at 800° C., $1\times10^{-5}$ Torr oxygen. The effective diffusivity, the generation rate constant, and the average path the atoms travel in the lattice were calculated. The values for the activation energies of each of these parameters, as well as the standard error are shown in Table 1.a.1. The values for the activation energies are similar. There is a slight decrease in the activation energy for diffusion, but it is within the uncertainty limits of the activation energy for the diffusivity on the clean surface.

TABLE 1.a.1

Values for activation energy of $K_{gen}$, $D_{eff}$, and $\lambda$ for surfaces covered and not covered by sulfur.

| | $K_{gen}$ | $D_{eff}$ | $\lambda$ |
|---|---|---|---|
| With Sulfur | 0.56 ± 0.22 | 2.12 ± 0.29 | 0.78 ± 0.17 |
| Without Sulfur | 0.43 ± 0.34 | 2.38 ± 0.24 | 0.98 ± 0.14 |

Figure 11:
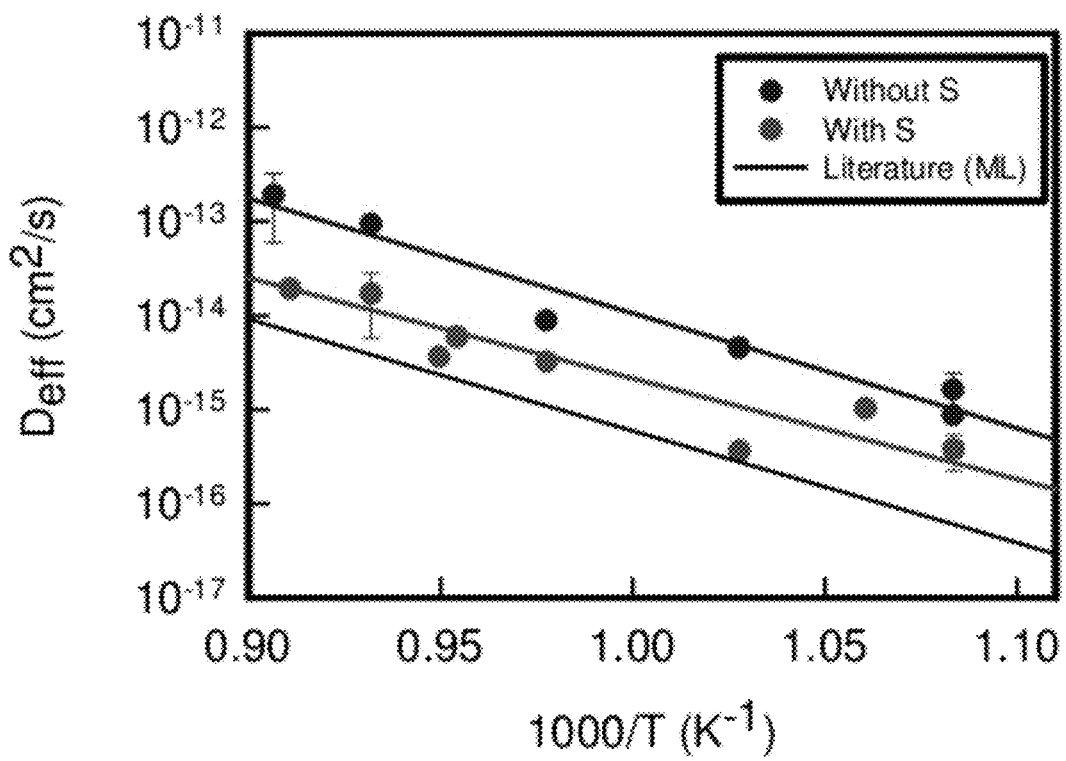
FIG. 11 provides a plot showing effective diffusivity as a function of temperature for a titanium dioxide annealed at $1\times10^{-5}$ Torr isotopic oxygen for 90 minutes. The upper trace is titanium dioxide without sulfur, the middle trace is titanium dioxide with sulfur, and the lower trace is the literature value.

Results for the effective diffusivities are shown in FIG. 11. From this plot, it is clear that sulfur has reduced the amount of oxygen diffusion. While the adsorption has not brought the value back down to that of the literature, 0.1 ML coverage of sulfur has been enough to saturate enough of the dangling bonds on the surface of titania to significantly reduce the amount of diffusion.

Figure 12:
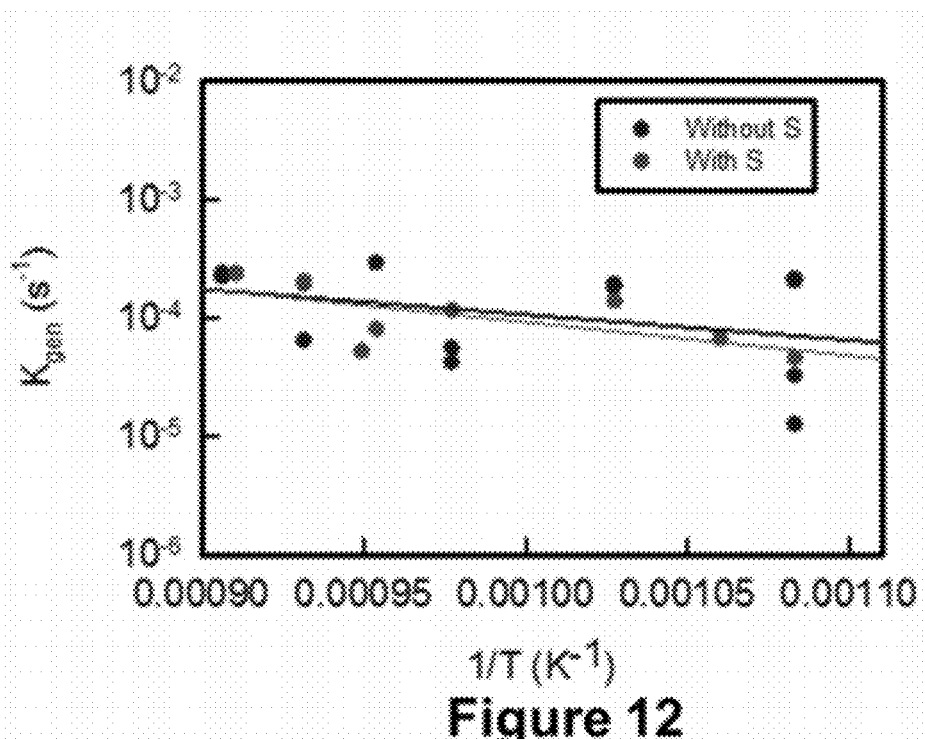
FIG. 12 provides a plot showing the rate constant for generation of the mobile species $K_{gen}$ as a function of temperature for a titanium dioxide annealed at $1\times10^{-5}$ Torr isotopic oxygen for 90 minutes. The upper trace is without sulfur and the lower trace is with sulfur.
Figure 13:
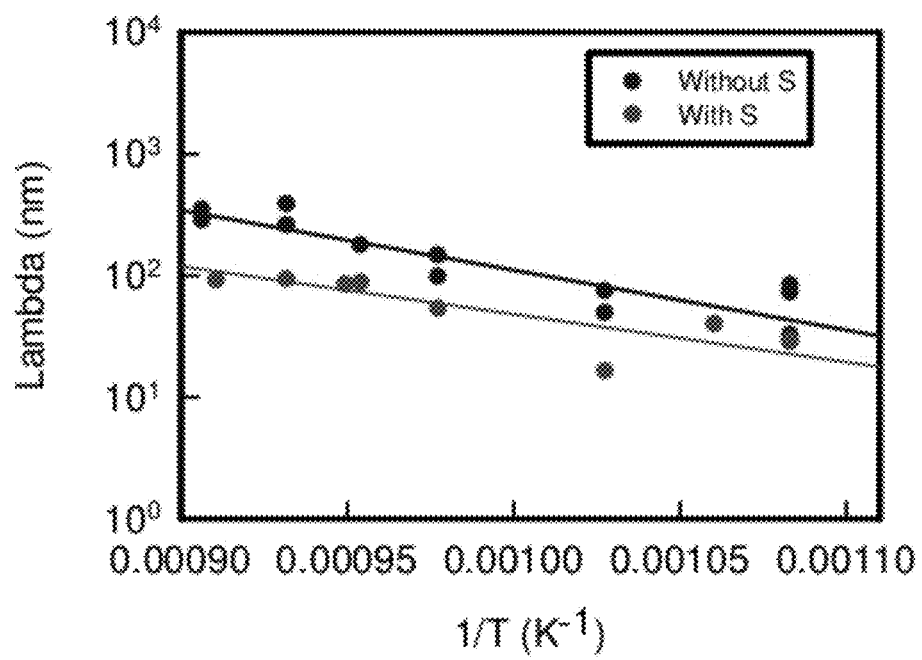
FIG. 13 provides a plot showing the mean path length λ as a function of temperature for oxygen in titanium dioxide annealed at $1\times10^{-5}$ Torr isotopic oxygen for 90 minutes. Shown for both the clean and sulfur-covered surfaces. The upper trace is without sulfur and the lower trace is with sulfur.
Figure 14:
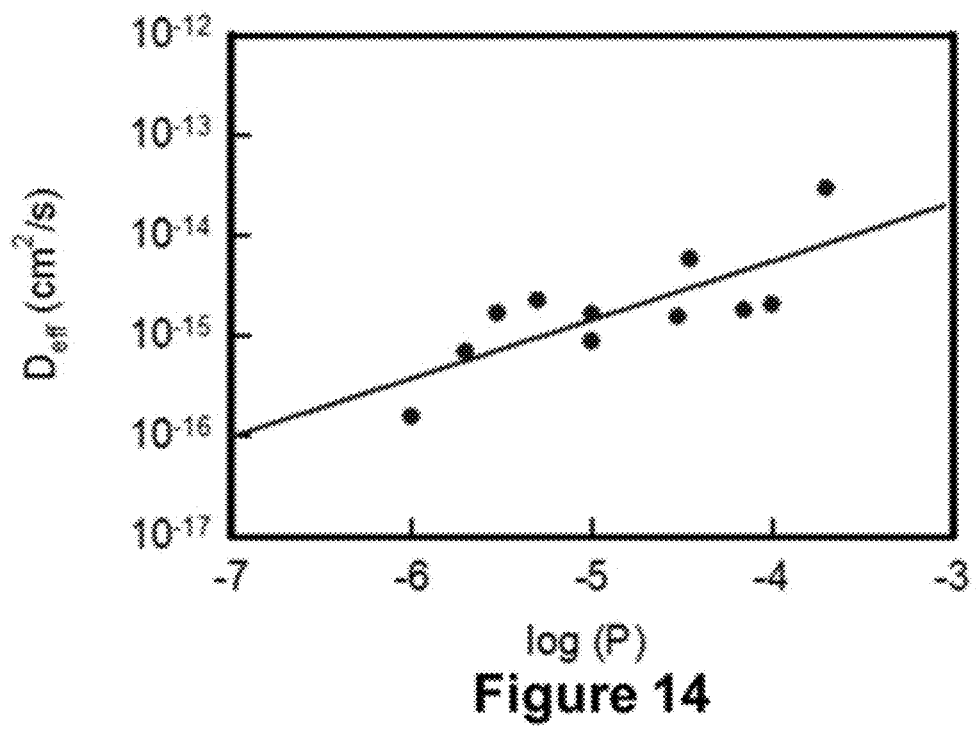
FIG. 14 provides a plot showing the dependence of diffusivity on oxygen pressure at 650° C.
Figure 15:
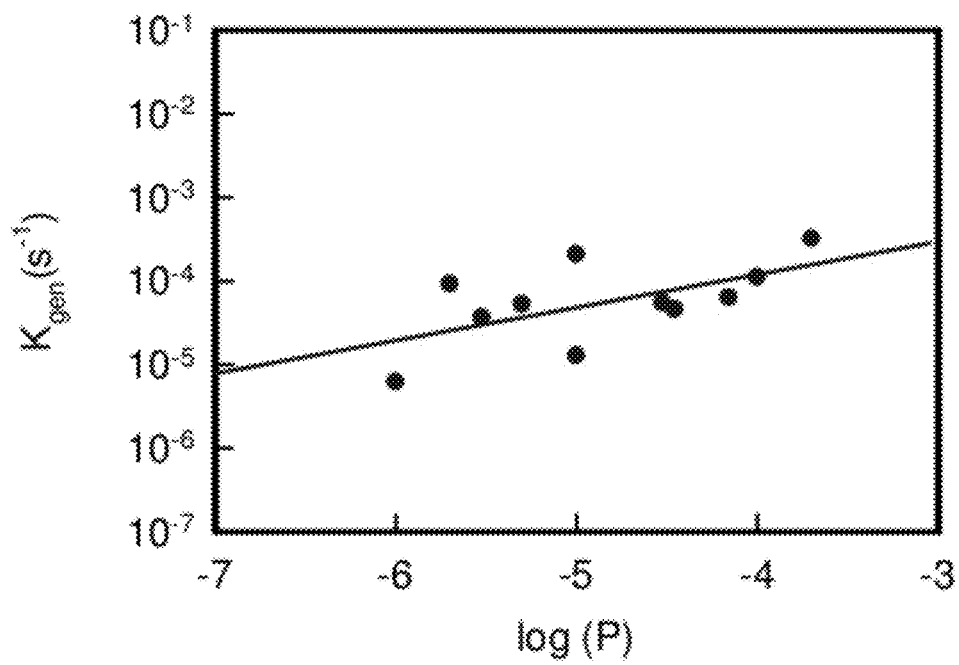
FIG. 15 provides a plot showing the dependence of $K_{gen}$ on oxygen pressure at 650° C.
Figure 16:
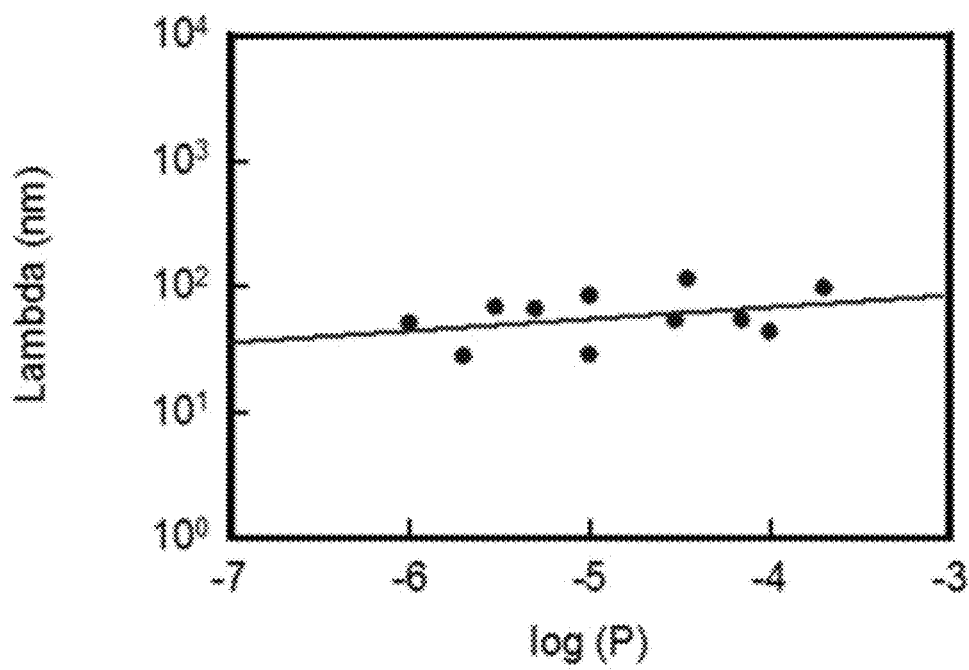
FIG. 16 provides a plot showing the dependence of lambda on oxygen pressure at 650° C.
Figure 17:
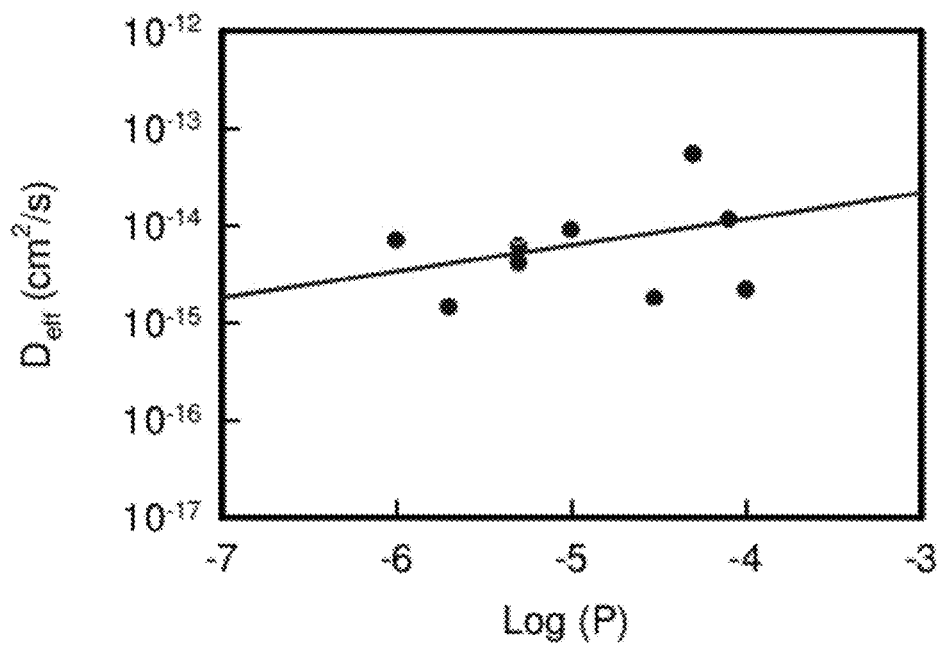
FIG. 17 provides a plot showing the dependence of diffusivity on oxygen pressure at 750° C.
Figure 18:
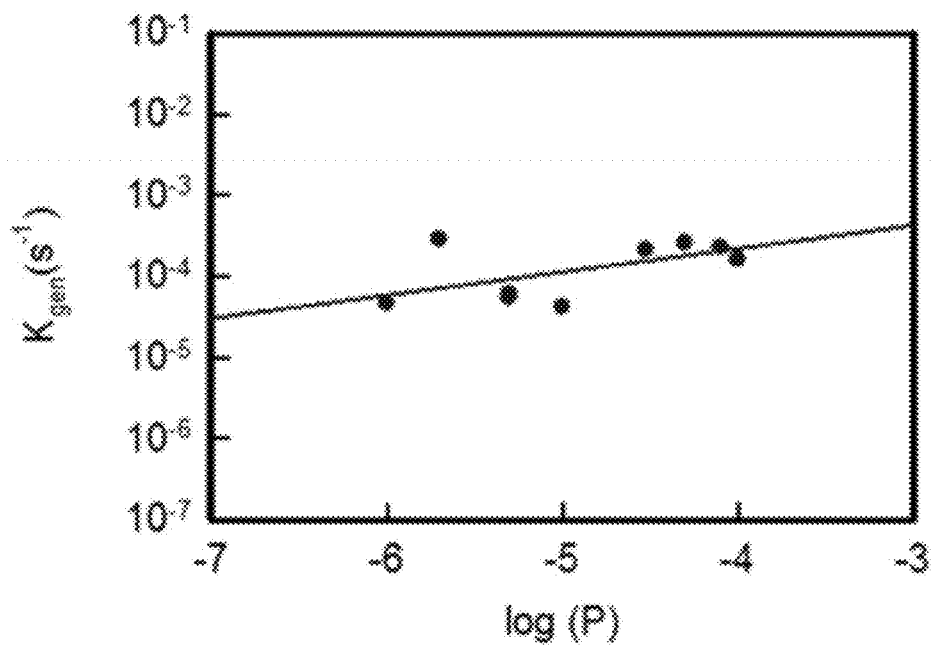
FIG. 18 provides a plot showing the dependence of $K_{gen}$ on oxygen pressure at 750° C.
Figure 19:
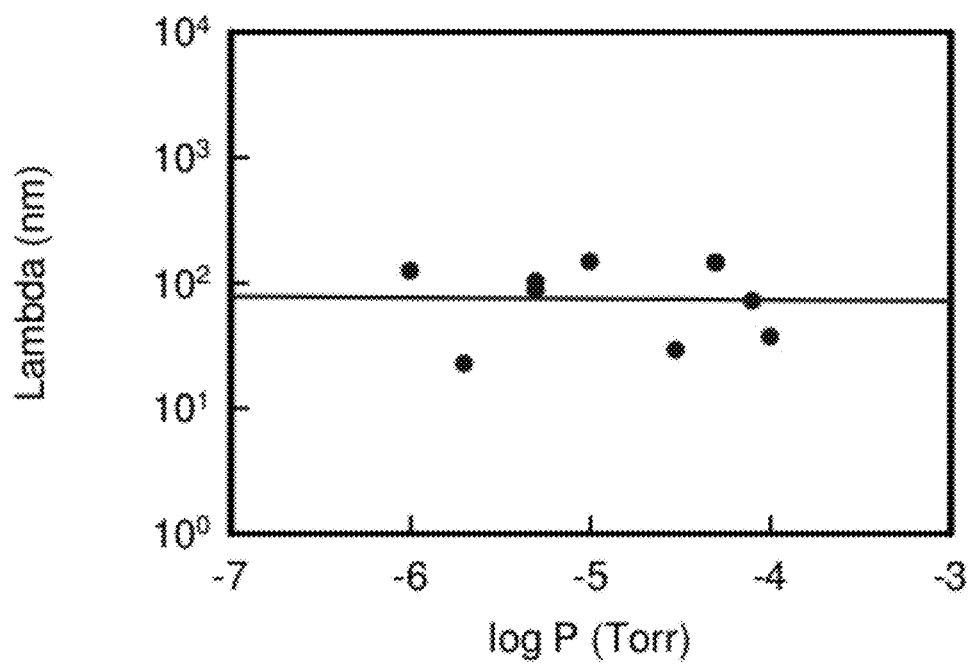
FIG. 19 provides a plot showing the dependence of lambda on oxygen pressure at 750° C.
Figure 20:
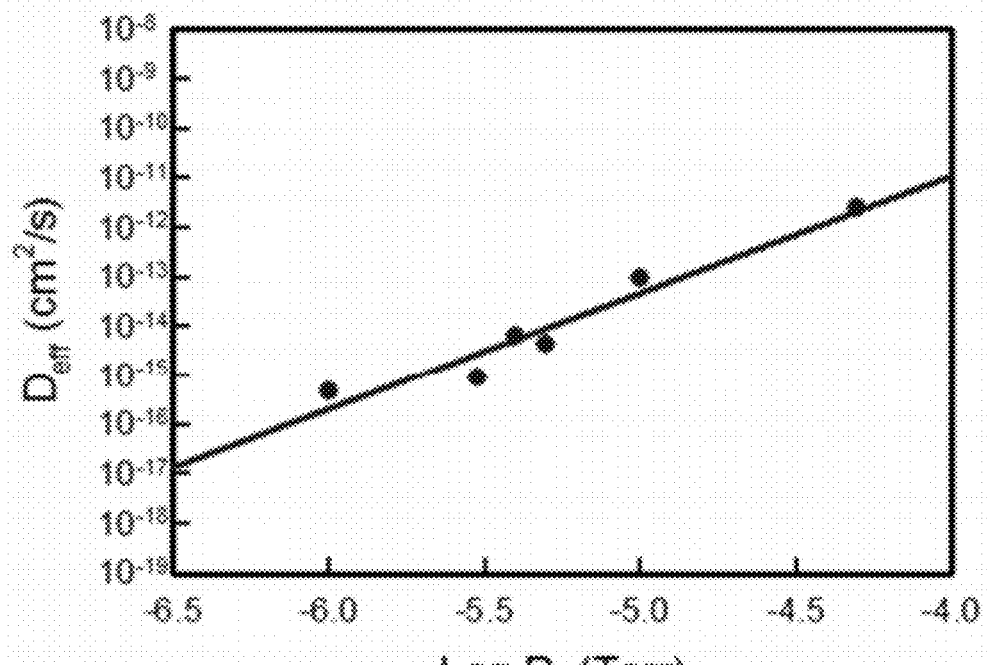
FIG. 20 provides a plot showing the dependence of diffusivity on oxygen pressure at 800° C.
Figure 21:
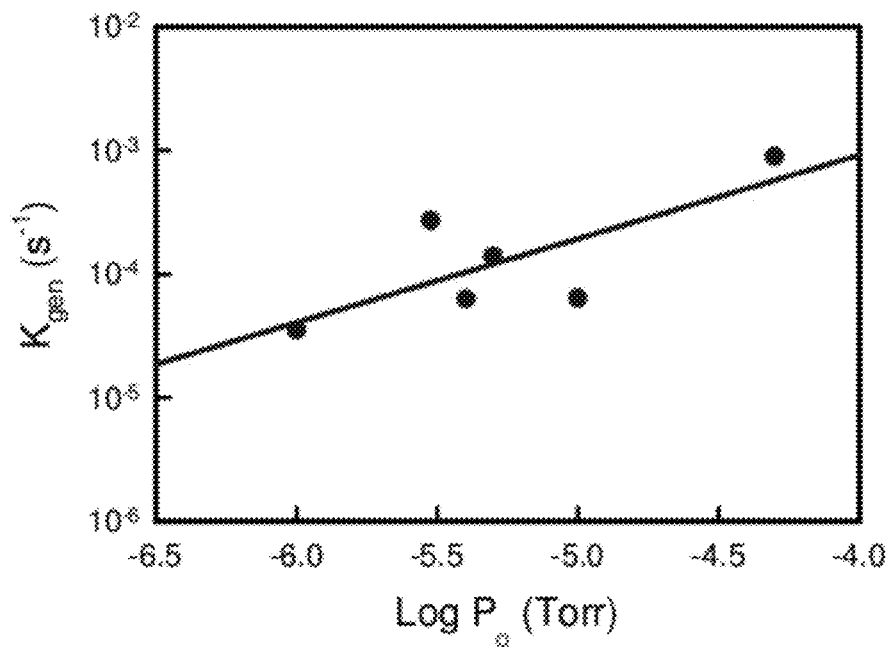
FIG. 21 provides a plot showing the dependence of $K_{gen}$ on oxygen pressure at 800° C.
Figure 22:
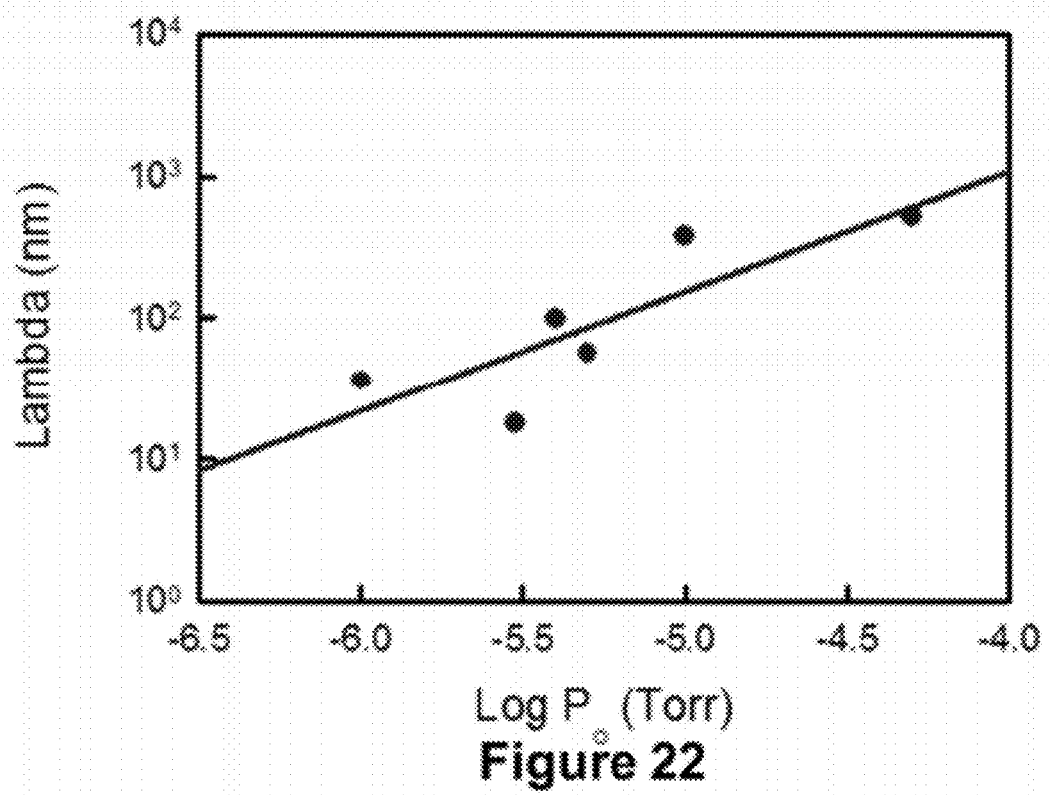
FIG. 22 provides a plot showing the dependence of lambda on oxygen pressure at 800° C.

Plots of $K_{gen}$ and $\lambda$ are shown in FIGS. 12 and 13, respectively. Interestingly, the sulfur coverage seems to make a larger difference in $\lambda$ than in $K_{gen}$. By definition, $K_{gen}$ is the rate of formation of the mobile species in the bulk. For the case of oxygen entering the bulk from the surface, the bulk of the mobile isotopic oxygen is already in the form of the mobile species once it enters the bulk, making this case different from the inventors' earlier studies with isotopic heterostructures of silicon. Also, as the change in lambda is primarily in the prefactor, it is unlikely to be due to a change in the activation energy for hopping rate or for $K_{ann}$. The change in the value of lambda might be explained by a shift in mechanism. The diffusion seen under the clean surface is most likely caused by a kick in/kick out mechanism. Shifting towards a dissociative mechanism for defect generation and annihilation would change the rate constant for $K_{ann}$, and hence could change lambda. An increase in $K_{ann}$ would appear as a decrease in λ. The surface with sulfur coverage must be in a regime where a higher annihilation rate is present. This could be an intermediate mechanism between the clean surface and the typical vacancy-mediated diffusion described in the literature.

Parameter estimation was done for the samples that had been exposed to sulfur, following a FLOOPS-based procedure. Values for the resultant parameters are shown in Table 1.a.2. The models were fit to a variety of temperatures. One of the most notable differences when compared with the clean surface is the much larger value prefactor for adsorption when sulfur is present, and the smaller activation energy for an atom on the surface to become an interstitial. This is most likely due to the sulfur on the surface. This could also reflect a change on the preferred sites for interstitial formation. Another interesting effect was the much smaller activation energy for diffusion of oxygen interstitials.

TABLE 1.a.2

Resultant values for parameters in model with covered surface.

| Parameter | Sulfur Covered Value | Clean Surface Values |
|---|---|---|
| $k_{Oi, diff}$ | $3.16 \times 10^{-10 \pm 6.3}$ atoms/cm² | $6.13 \times 10^{-4 \pm 0.77}$ atoms/cm² |
| $E_{Oi, diff}$ | $1.9 \pm 0.52$ eV | $0.8 \pm 0.16$ eV |
| $k_{surf}$ | $1 \times 10^{18 \pm 2.2}$ | $1 \times 10^{14 \pm 1.6}$ |
| $E_{surf}$ | $1.05 \pm 0.13$ eV | $2.25 \pm 0.13$ eV |
| $E_{ads}$ | $0.3 \pm 0.23$ eV | $0.4 \pm 0.18$ eV |

Conclusion.

An active surface or one free from dangling bonds, has opened up a new mechanism for oxygen diffusion in titanium dioxide. Covering a surface of a clean titanium dioxide sample with a 0.1 ML of sulfur prior to annealing in the oxygen ambient has been proven to reduce the diffusivity of the oxygen, proving that the effect was truly caused by cleaning the surface. The sulfur acts as a model for contaminants that might naturally be on the surface of a sample at atmospheric pressure. This Example shows the potential for quicker injection of oxygen into titanium dioxide.

References for Example 1.a
1. M. Arita, M. Hosoya, M. Kobayashi and M. Someno, Journal of the American Ceramic Society 62 (9-10), 443-446 (1979).
2. K. Dev, University of Illinois, 2005.
3. R. Vaidyanathan, M. Y. L. Jung and E. G. Seebauer, Physical Review B 75 (2007).
4. E. G. Seebauer, K. Dev, M. Y. L. Jung, R. Vaidyanathan, C. T. M. Kwok, J. W. Ager, E. E. Haller and R. D. Braatz, Physical Review Letters 97 (5), 055503 (2006).
5. U. Diebold, Surface Science Reviews 48, 53 (2003).
6. E. L. D. Hebenstreit, W. Hebenstreit and U. Diebold, Surface Science 470 (3), 347-360 (2001).
7. E. L. D. Hebenstreit, W. Hebenstreit, H. Geisler, S. N. Thornburg, C. A. Ventrice, D. A. Hite, P. T. Sprunger and U. Diebold, Physical Review B 64 (11), 115418 (2001).
8. M. K. Nowotny, T. Bak and J. Nowotny, The Journal of Physical Chemistry B 110 (33), 16302-16308 (2006).
9. K. Noh, University of Illinois, 2010.
10. W. Heegemann, K. H. Meister, E. Bechtold and K. Hayek, Surface Science 49 (1), 161-180 (1975).
11. T. Sekiya, K. Ichimura, M. Igarashi and S. Kurita, Journal of Physics and Chemistry of Solids 61, 1237-1242 (2000).

1.b: Oxygen Diffusion Dependence on Pressure

Introduction.

At temperatures where sufficient atomic mobility exists, metal oxide semiconductors such as titanium dioxide will equilibrate with the oxygen in the gas phase around them. The oxygen partial pressure therefore appears in the thermal equilibrium equations for both the overall stoichiometry and the concentrations of the native defects. The concentrations of the native defects in turn govern the rates of oxygen exchange between the gas and the bulk through the free surface. The effective diffusivity of oxygen within a metal oxide depends upon the concentration of oxygen defects responsible for the diffusion of the oxygen. Utilizing these equations, it is possible to determine the dependence of a given defect concentration on the oxygen pressure. As the diffusivity is proportional to the defect concentration, the diffusivity depends upon oxygen pressure as well according to the EQ. 1.b.1:

$$D_0 K P_O^{-1/n} \exp\left(\frac{-E_a}{kT}\right) \tag{EQ. 1.b.1}$$

Therefore, if n or the dependence of the diffusivity on pressure is measured, one can know exactly which defects are responsible for the oxygen diffusion. For oxygen in titanium dioxide, if vacancies are the primary mediators of diffusion, then the diffusivity would decrease with increasing pressure. Millot et al. measured their n to be 8.11. [See Reference 1]. In contrast, interstitial diffusion would cause an increase in diffusivity with increasing oxygen pressure. In order to understand the mechanism for oxygen diffusion in titanium dioxide the effects of oxygen pressure on diffusivity were studied.

Kroeger-Vink Model for Titanium Dioxide.

Undoped titanium dioxide is n-type due to the electron donating properties of the Ti interstitials and/or O vacancies that constitute the majority of native defects. [See Reference 2]. Nevertheless, apart from regions of net space charge near surfaces or grain boundaries, the semiconductor bulk remains electrically neutral, and the stoichiometric expressions describing individual equilibrium reactions must obey rules for charge balance. This neutrality establishes useful constraints on the expressions describing the equilibrium of native defects. The equilibrium equations for the defects in titanium dioxide are:

$$O_O \leftrightarrow V_O^{2+} + 2e' + \tfrac{1}{2}O_2 \tag{EQ 1.b.2}$$

$$2O_O + Ti_{Ti} \leftrightarrow Ti_i^{3+} + 3e' + O_2 \tag{EQ 1.b.3}$$

$$2O_O + Ti_{Ti} \leftrightarrow Ti_i^{4+} + 4e' + O_2 \tag{EQ 1.b.4}$$

$$O_2 \leftrightarrow V_{Ti}'''' + 4h^+ + 2O_O \tag{EQ 1.b.5}$$

$$nil \leftrightarrow e' + h^+ \tag{EQ 1.b.6}$$

From these relations, the concentrations of each defect can be calculated through the equations:

$$[V_O^{2+}] = K_1 n^{-2} p(O_2)^{-1/2} \tag{EQ 1.b.7}$$

$$[Ti_i^{3+}] = K_2 n^{-3} p(O_2)^{-1} \tag{EQ 1.b.8}$$

$$[Ti_i^{4+}] = K_3 n^{-4} p(O_2)^{-1} \tag{EQ 1.b.9}$$

$$[V_{Ti}''''] = K_5 K_1^{-2} n^4 p(O_2) = K_F K_3^{-1} n^4 p(O_2) = K_4 n^4 p(O_2) \tag{EQ 1.b.10}$$

$$[O_i^x] = K_4 n^x p(O_2) \tag{EQ 1.b.11}$$

One can typically assume that the majority of the conduction electrons in the semiconductor originate a single type of one electron donor. However, the identity of the majority donor depends upon temperature and oxygen partial pressure. There are three types of primary electron donors that are discussed in literature for titanium dioxide. These are titanium (3+) interstitials, titanium (4+) interstitials, and oxygen (2+) vacancies. The general consensus is that at temperatures above 1700K and pressures between $7.6 \times 10^{-9}$ and 760 Torr, the dominant defect donors are titanium (4+) interstitials. [See Reference 3]. At lower temperatures, there is considerable debate about the dominant defects. Nowotny et al. did conductivity experiments from 800-1050° C., for oxygen pressures between 1 to $10^{-6}$ Torr, where they found that oxygen vacancies dominated. At pressures less than $10^{-6}$ Torr, oxygen vacancies dominated, but were partially compensated by titanium vacancies. [See Reference 3]. He et al. did DFT calculations, where they found that at temperatures between about 700 and 1000° C., and pressures between $7.6 \times 10^{-3}$ and $7.6 \times 10^{-13}$ Torr, oxygen vacancies dominate. [See Reference 4]. At lower temperatures they found titanium vacancies dominated. Kofstad found through thermogravimetric studies that at temperatures between 927 and 1200° C., and pressures of $7.6 \times 10^{-8}$ and $7.6 \times 10^{-15}$ Torr, oxygen vacancies were the dominant defects. [See Reference 5]. Blumenthal found through conductivity experiments that at temperatures between 900 and 1070° C., and pressures from $7.6 \times 10^{-12}$ to $7.6 \times 10^{-16}$ Torr, titanium (3+) interstitials dominate. [See Reference 6]. Lee et al. found that at pressures between $7.6 \times 10^{-3}$ and $7.6 \times 10^{-12}$ Torr and temperatures between 900-1100° C., titanium (3+) interstitials dominate. [See Reference 7]. As the majority of the literature indicates that oxygen vacancies are the dominant defects at the conditions in this Example (650-830° C., $10^{-6}$ to $10^{-4}$ Torr) the vacancies were assumed to dominate.

Based on the assumption that oxygen vacancies are the primary electron donors, the concentration of electrons can be expressed as:

$$n = 2[V_O^{2+}]$$ (EQ 1.b.12)

Combining equations 1.b.7 and 1.b.12 we have:

$$n = (2K_1)^{1/3} p(O_2)^{-1/6}$$ (EQ 1.b.13)

Also the dependence of oxygen defects on oxygen pressure is shown in Table 1.b.1. As the charge state of oxygen interstitials are currently unknown, pressure dependences were calculated for multiple scenarios for the charge states.

TABLE 1.b.1

Pressure dependences for various dominant defects

| Defect (or charge carrier) concentration | Pressure dependence |
| --- | --- |
| Conduction electrons | $P(O_2)^{-1/6}$ |
| Oxygen vacancies | $P(O_2)^{-1/6}$ |
| Oxygen interstitials (−1) | $P(O_2)^{1/3}$ |
| Oxygen interstitials (−2) | $P(O_2)^{1/6}$ |
| Oxygen interstitials (0) | $P(O_2)^{1/2}$ |

Possible Pressure Dependences.

Earlier work derived expressions for the effective first-order rate constant $K_{gen}$ and $K_{ann}$ in terms of the fundamental rate constants and defect concentrations for the various types of defect creation and annihilation mechanisms discussed in Example 1.g. Here, the pressure dependence of $D_{eff}$, $K_{gen}$, and $\lambda$ were calculated for each mechanism in $TiO_2$.

Each of the expressions depends upon the concentrations of defects within the bulk. Based upon how these equilibrium constants depend upon the defect concentrations, it was possible to find values for the pressure dependence of $K_{gen}$, $\lambda$, and $D_{eff}$ for each mechanism as shown in Table 1.b.2 by utilizing the fact that:

$$D_{eff} = K_{gen} \lambda^2$$ (EQ 1.b.14)

$$\lambda = \sqrt{\frac{D_M}{K_{ann}}}$$ (EQ 1.b.15)

x in the table refers to the magnitude of the charge state for the oxygen interstitial (assuming the charge state is negative or zero.) Note that for all mechanisms, there is a very specific prediction that either $K_{gen}$ or $\lambda$ exhibits a pressure dependence, but not both parameters simultaneously. $D_{eff}$, on the other hand, always exhibits a dependence on oxygen pressure.

TABLE 1.b.2

Oxygen pressure dependence of $D_{eff}$, $K_{gen}$, and $\lambda$ for possible diffusion mechanisms.

| Mechanism | $D_{eff}$ P dep. | $K_{gen}$ P dep. | Lambda P dep. |
| --- | --- | --- | --- |
| Kick in/Kick out interstitial mechanism | $P(O_2)^{(3-x)/6}$ | $P(O_2)^{(3-x)/6}$ | None |
| Dissociation interstitial mechanism | $P(O_2)^{1/6}$ | None | $P(O_2)^{1/12}$ |
| Vacancy pair combination mechanism | $P(O_2)^{1/3}$ | $P(O_2)^{1/3}$ | None |
| Interstitial pair combination mechanism | $P(O_2)^{-1/3}$ or $P(O_2)^{-1/2}$ | $P(O_2)^{-1/3}$ or $P(O_2)^{-1/2}$ | None |
| Vacancy pair dissociation mechanism | $P(O_2)^{1/2 \text{ or } 2/3}$ | None | $P(O_2)^{1/4 \text{ or } 1/3}$ |
| Interstitial pair dissociation mechanism | $P(O_2)^{-(3-x)/6}$ | None | $P(O_2)^{-(3-x)/12}$ |

Results.

Samples were annealed at constant temperatures of 650° C., 750° C., and 800° C., with partial pressures of oxygen selected between $10^{-6}$ and $10^{-4}$ Torr. For each data set, the parameters $K_{gen}$, $\lambda$, and $D_{eff}$ were calculated and plotted on FIGS. 14-22 as a function of the natural logarithm of oxygen pressure. Each data point represents the average of three separate SIMS profiles on one sample taken across the sample (one near each heating plate, and one at the center near the thermocouple.) In addition, Table 1.b.3 shows the resultant values for n (in conventional format of −1/n for each plot.) Based upon the plots, both $K_{gen}$ and $D_{eff}$ increase with increasing oxygen partial pressure. Importantly, however, $\lambda$ stays essentially constant. Only two mechanisms are consistent with this pattern: the kick in/kick out interstitial mechanism and the vacancy pair combination mechanism.

In the kick in/kick out mechanism, an interstitial atom trades places with an atom in a lattice site. In the vacancy pair combination mechanism, a titanium interstitial binds to an oxygen atom, and the two diffuse throughout the bulk as a pair. This mechanism seems less likely for several reasons. First, the experimental conditions are in a region where the concentration of titanium vacancies should not be large. Second, there is no obvious mechanism for attraction between titanium (−4) vacancies and a negative oxygen interstitials. Also titanium vacancies diffuse very slowly, so it is unlikely they will diffuse much faster when in a complex.

The present findings for $TiO_2$ may be analogous to O diffusion in ZnO. Kick in/kick out mechanisms have been observed for oxygen interstitials in ZnO. [See Reference 8]. Values for the dependence of diffusivity on oxygen pressure show that at all temperatures the diffusivity is proportional to $P(O_2)^{1/n}$ where n can be anywhere between about 1.5 to 3. In the case of an oxygen interstitial, this would correspond to a charge state of 0 or −1. In experiments, with increasing temperatures, the value for the pressure dependence of $K_{gen}$ decreases, which could correspond to a changing of the average charge state of oxygen interstitials from 0 to −1. At 800 degrees Celsius the mechanism seems to change. The pressure dependence gets much stronger on $D_{eff}$ and lambda develops a pressure dependence. This indicates that the mechanism is shifting at these higher temperatures.

TABLE 1.b.3

Dependence of $D_{eff}$, $K_{gen}$, and λ on oxygen pressure for different temperatures

| Temperature (° C.) | 1/n for $K_{gen}$ | 1/n for λ | 1/n for $D_{eff}$ |
|---|---|---|---|
| 650 | 0.40 ± 0.18 | 0.094 ± 0.10 | 0.58 ± 0.16 |
| 750 | 0.29 ± 0.14 | −0.0089 ± 0.15 | 0.46 ± 0.26 |
| 800 | 0.68 ± 0.30 | 0.85 ± 0.28 | 2.36 ± 0.3 |

Figure 23:
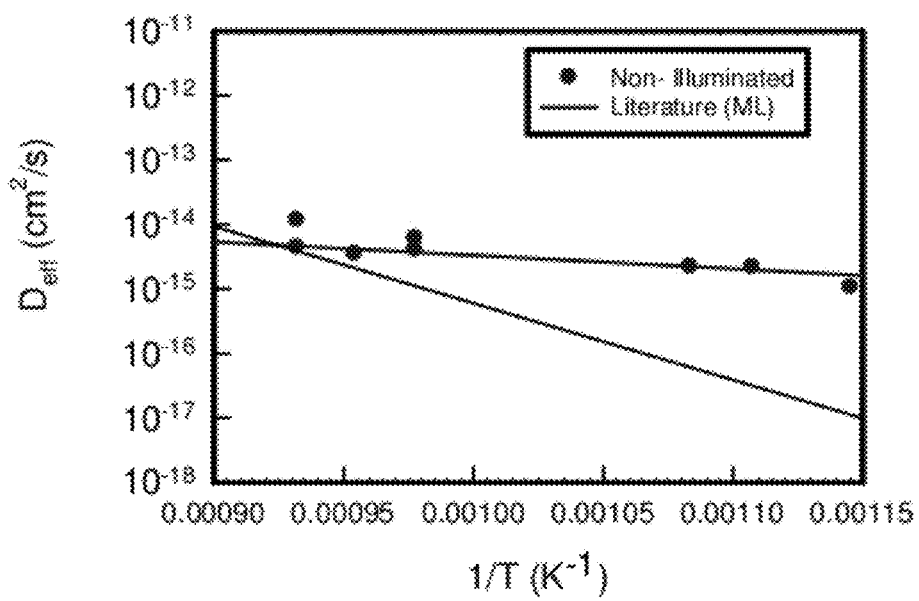
FIG. 23 provides an Arrhenius plot for the effective diffusivity at $5\times10^{-6}$ Torr. The upper trace and data points were recorded under conditions of non-illumination, while the bottom trace is the literature value.
Figure 24:
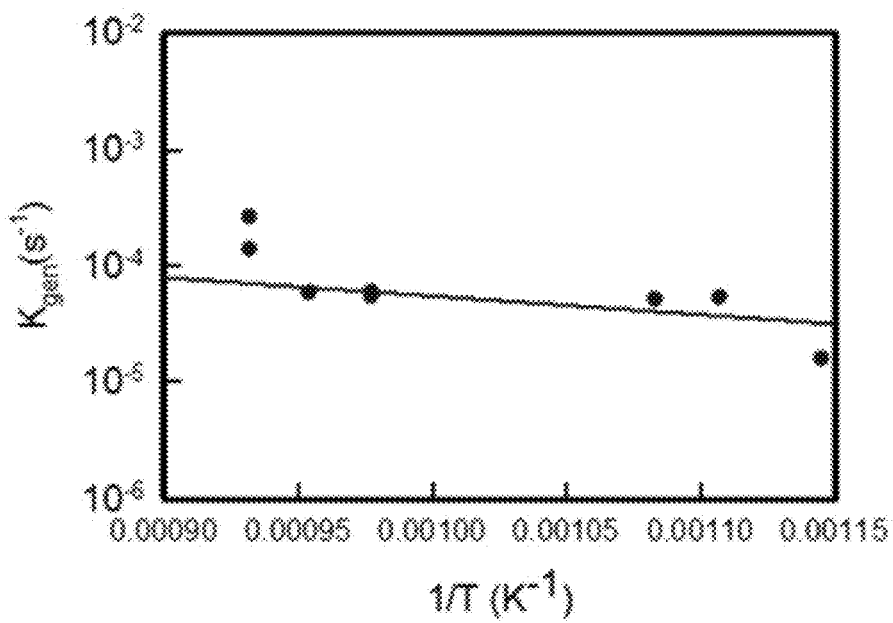
FIG. 24 provides an Arrhenius plot for the $K_{gen}$ at $5\times10^{-6}$ Torr.
Figure 25:
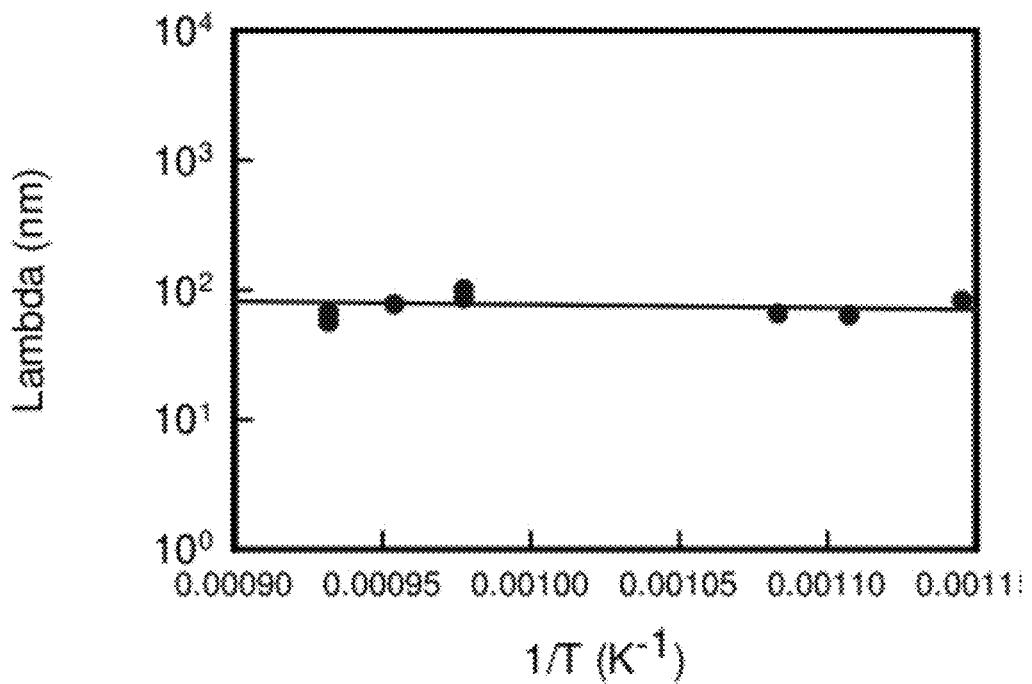
FIG. 25 provides an Arrhenius plot for lambda at $5\times10^{-6}$ Torr.
Figure 26:
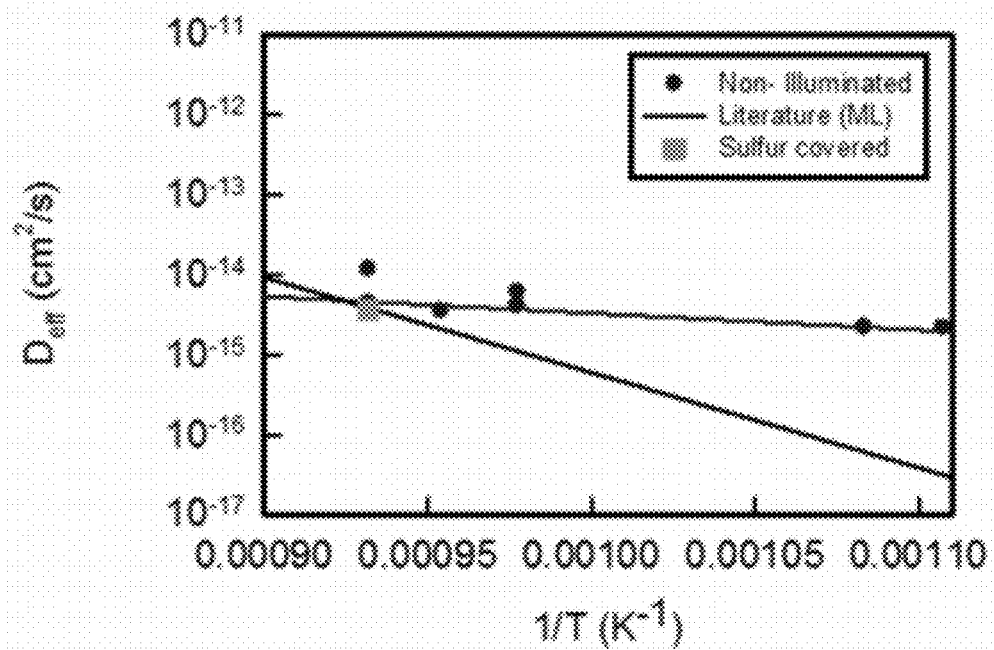
FIG. 26 provides an Arrhenius plot for $D_{eff}$ at $5\times10^{-6}$ Torr. The upper trace is the literature value, the filled circles are data points recorded under conditions of non-illumination, and the filled square shows the results of a sulfur coverage experiment.

A series of experiments was performed at $5\times10^{-6}$ Torr constant pressure while varying the temperature. The resultant data are shown in FIG. 23, and the values for the activation energies and pre-exponential factors of $D_{eff}$, $K_{gen}$, and λ are shown in Table 1.b.4. At high temperatures, the diffusivities largely match those of the aggregated literature. At low temperatures, however, the data more closely resembles the type of enhancements seen for the data at $1\times10^{-5}$ Torr. An experiment with a sulfur covered sample as per the procedure from Example 1.a also resulted in a diffusivity close to the MLE diffusivity at 800° C. This data point is shown in FIG. 26. This change is as would be predicted by the high pressure dependence at 800 degrees C. It could be an indicator of either charge state or dominant defect for diffusion at high temperatures. Also, while it appears to be a shift in the activation energy, it's more likely that at higher temperatures and lower pressures, a different mechanism for defect annihilation dominates. Perhaps the dissociative mechanism begins to dominate over the $K_{gen}$. This would correlate to change in the effective diffusivity, as the diffusivity depends on the annihilation rate.

TABLE 1.b.4

$K_{gen}$, λ, and $D_{eff}$ at $5\times10^{-6}$ Torr

| | $K_{gen}$ | λ | $D_{eff}$ |
|---|---|---|---|
| $E_a$ (eV) | 0.32 ± 0.33 | 0.050 ± 0.081 | 0.42 ± 0.33 |
| Pre-exponential factor | 0.0022 $s^{-1}$ | 138 nm | $4.1 \times 10^{-13}$ $cm^2/s$ |

Conclusion.

An increase in $K_{gen}$ and $D_{eff}$ is observed as oxygen partial pressure increases for rutile annealed under vacuum with clean surfaces. This pressure dependence most likely corresponds to an oxygen interstitial kick in/kick out mechanism for defect generation. The oxygen interstitial has a charge state of either 0 or −1. This is further evidence that a clean surface under the present conditions has opened up a new mechanism for oxygen incorporation into titanium dioxide. It appears that this mechanism has not been observed for titanium dioxide before. Also, at higher temperatures the mechanism appears to change.

References for Example 1.b
1. F. Millot and C. Picard, Solid State Ionics 28-20, 1344-1348 (1988).
2. U. Diebold, Surface Science Reviews 48, 53 (2003).
3. M. K. Nowotny, T. Bak and J. Nowotny, The Journal of Physical Chemistry B 110 (33), 16292-16301 (2006).
4. J. He, R. K. Behera, M. W. Finnis, X. Li, E. C. Dickey, S. R. Phillpot and S. B. Sinnott, Acta Materialia 55 (13), 4325-4337 (2007).
5. P. Kofstad, Journal of Less Common Metals 13, 635-638 (1967).
6. R. N. Blumenthal, Coburn, J. Baukus and W. M. Hirthe, Journal of Physical Chemistry Solids 27, 643-654 (1966).
7. D.-K. Lee and H.-I. Yoo, Solid State Ionics 177, 1-9 (2006).
8. G.-Y. Huang, C.-Y. Wang and J.-T. Wang, Journal of Physics: Condensed Matter 21, 195403-194509 (2009).

1.c: Non-Thermal Photo-Stimulation Effects on $TiO_2$

Introduction.

Photostimulated diffusion within semiconductors has been examined for many years, especially in connection with "athermal" diffusion below room temperature [1] due to energy liberated from recombination of photocarriers. However, the existence of photostimulated diffusion above cryogenic temperatures has proven difficult to confirm. Despite careful experimental searching [2-7] spurious effects due to heating by the probe light or to intensity-dependent variations in sample geometry could never be ruled out. By contrast, measurements of surface diffusion that fully decoupled heating from illumination have shown that photoexposure can either enhance or inhibit the micron-scale diffusion rates of certain adsorbates on Si(111) by nearly an order of magnitude [8-9] depending upon substrate doping type. Illumination acts by changing the average charge state of surface point defects, which propagates into the defect-mediated diffusion rate [10]. Analogous effects have been observed in silicon [11-12], and successfully modeled for Si self-diffusion. The present Example employs similar methodology to measure similar effects for self-diffusion of oxygen within rutile, and provides significant evidence that photostimulated diffusion should generalize to semiconductors other than silicon.

One can envision several ways in which the diffusion of oxygen into titanium dioxide can be affected nonthermally by illumination. For example (drawn from photocatalysis), illumination could increase rate of adsorption. Indeed, photo-increased adsorption rates have been observed on surfaces such as $Fe_2O_3$, ZnO and $TiO_2$ [13-18]. It would also be possible in principle for super band-gap illumination to stimulate the formation of a mobile oxygen defect (such as an interstitial) from surface oxygen.

Within the bulk, illumination at wavelengths below 350 nm can create quasi-equilibrium states by creating trapping sites for electrons and holes that allow catalytic reactions to occur with lower energy. These trapping sites are typically defects within titanium dioxide. Yang et al. and Mochizuki et al. both found evidence that this does occur in titanium dioxide [19-20]. Yang et al. provided evidence that these states might be meta-stable at room temperatures [21]. Therefore one can irradiate the titanium dioxide with UV light, and it will retain the quasi-Fermi levels after irradiation. Super band-gap illumination can also change the average charge state of defects responsible for oxygen diffusion. Optical photostimulation excites the formation of extra charge carriers. The additional carriers in turn can alter the average charge state of defects that are present. Since charge state affects both the formation energy and diffusion constants of point defects [22-23] effects can propagate through into phenomena such as defect diffusion.

This chain of events was first postulated in the early 1990s [24] but has been unambiguously demonstrated for bulk diffusion only recently in the case of silicon. For self-diffusion in n-type Si, illumination increases the diffusivity by a factor of up to 25 in response to optical fluxes near 1.5 W/cm². The degree of illumination enhancement varies with both temperature and intensity.

In order to explore photo-illumination and understand which steps in the mechanism of oxygen incorporation were affected by it, several methods were used for studying the photo-illumination effects on oxygen in titanium dioxide. FLOOPS-based simulations such as those described in Example 1.h, were analyzed to see which if any of the steps were altered by illumination. Also, the temperature-dependent Arrhenius plots as well as pressure-dependent diffusivity plots were explored to look for any effects due to changes in the defect charge states.

Experimental.

Figure 27:
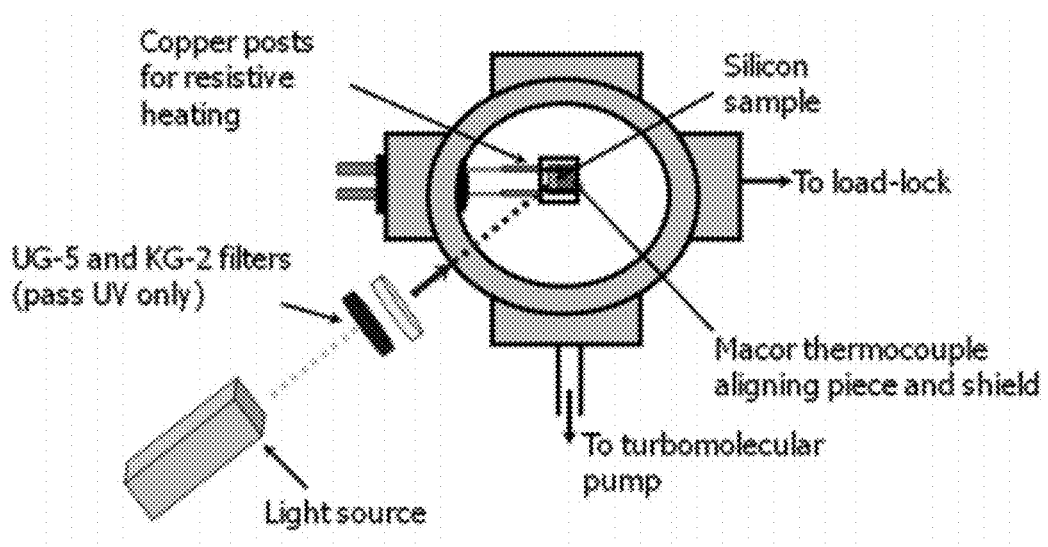
FIG. 27 provides a schematic showing the experimental setup for illumination studies.
Figure 28:
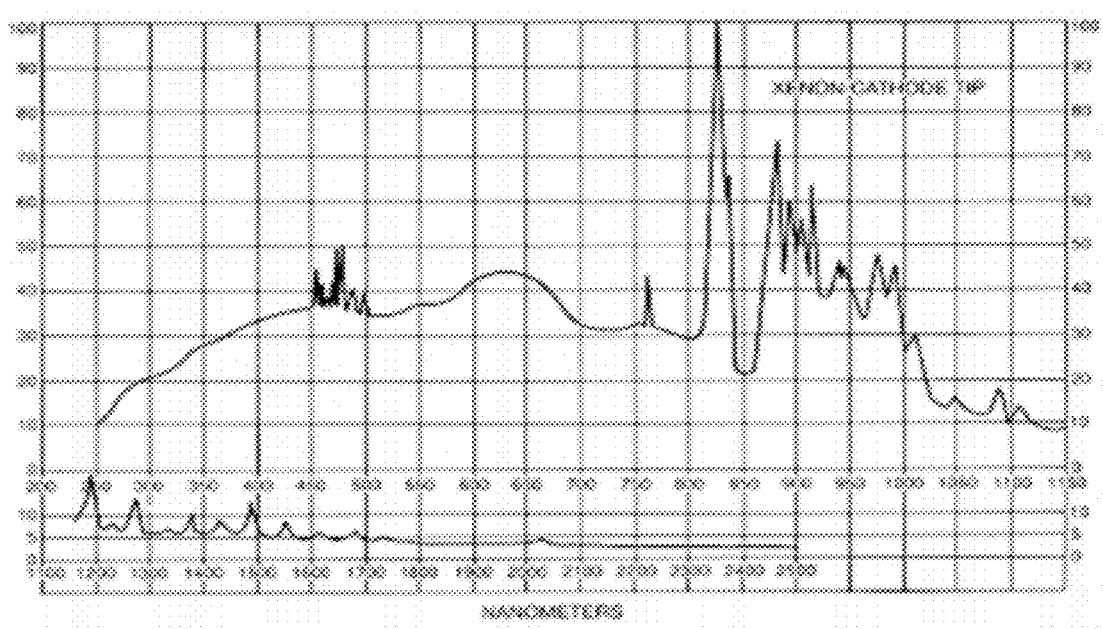
FIG. 28 provides the emission spectrum for a Xe arc lamp used for illumination studies.
Figure 29:
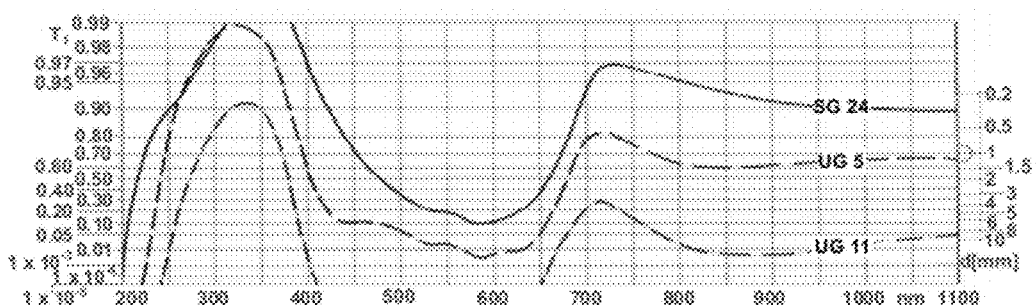
FIG. 29 provides the emission spectrum for the UG 5 bandpass filter used for illumination studies.
Figure 30:
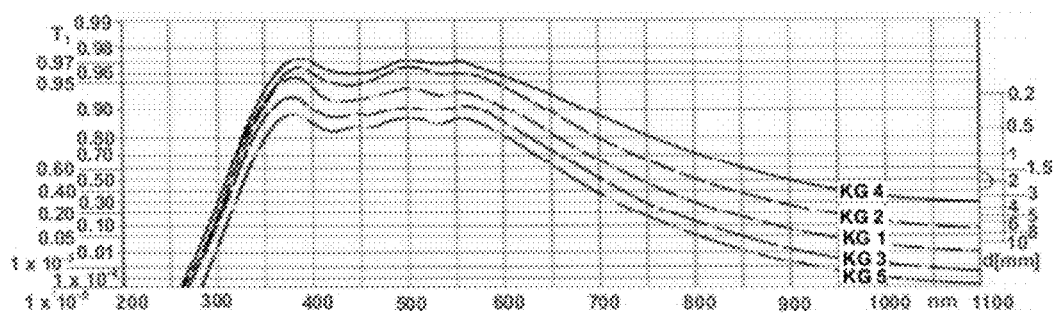
FIG. 30 provides the emission spectrum for the KG2 bandpass filter used for illumination studies.
Figure 31:
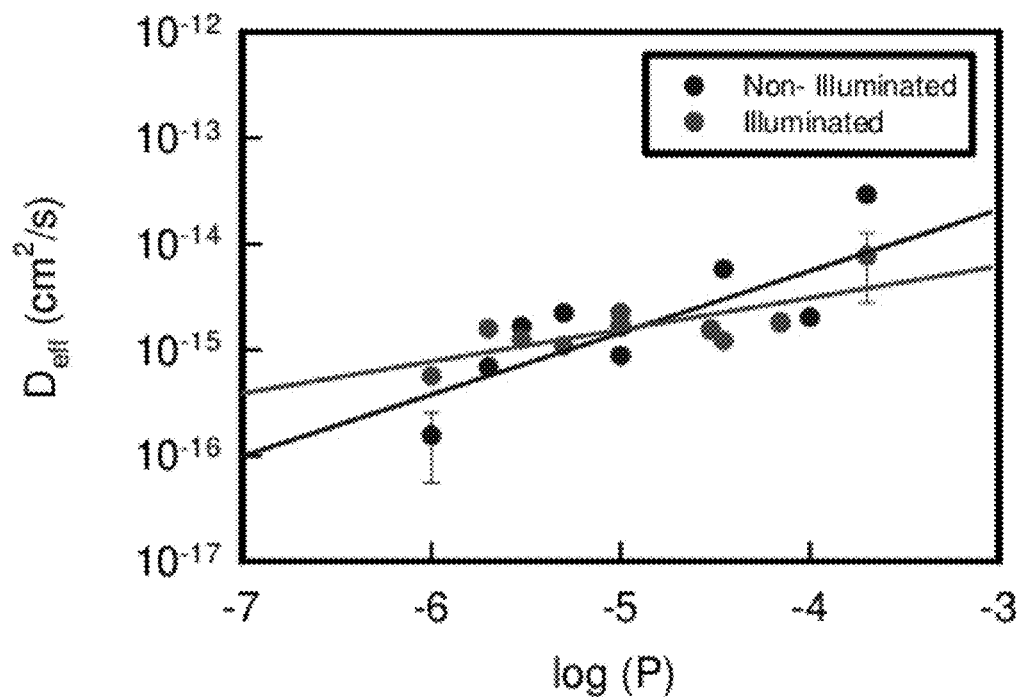
FIG. 31 provides a plot showing the pressure dependence of diffusivity at 650° C. for both illuminated and dark samples.
Figure 32:
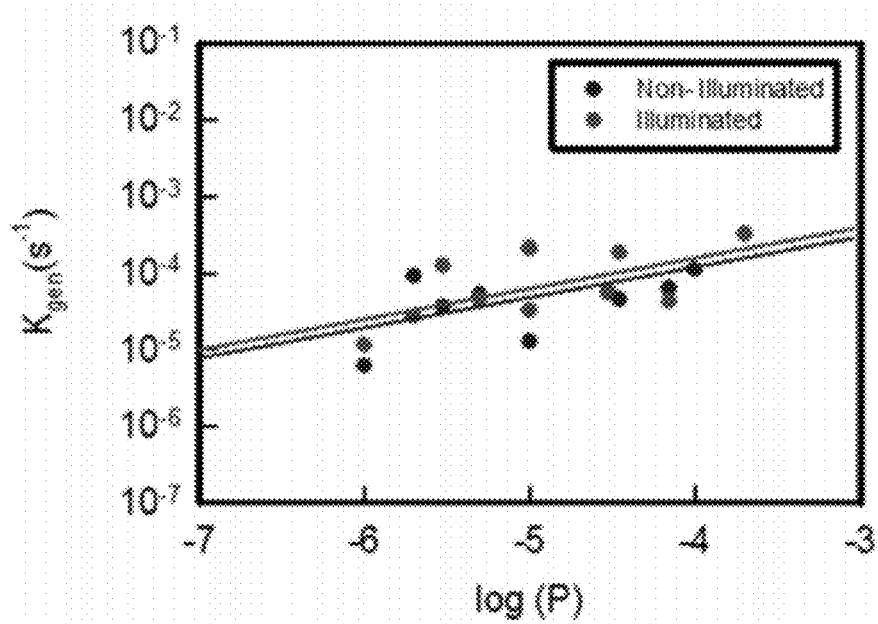
FIG. 32 provides a plot showing the pressure dependence of $K_{gen}$ at 650° C., for both illuminated (upper trace) and dark (lower trace) samples.
Figure 33:
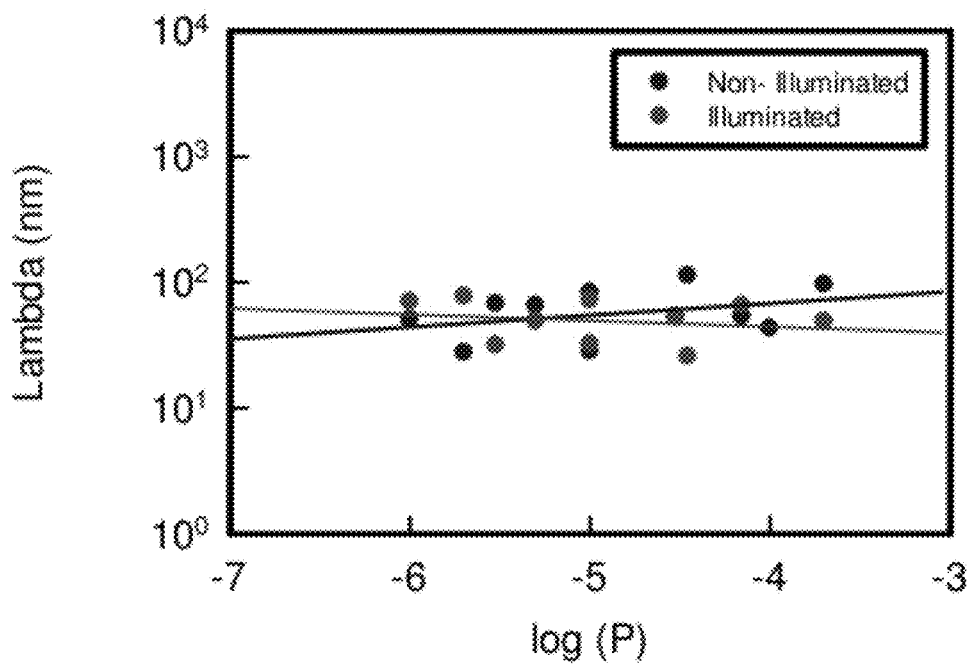
FIG. 33 provides a plot showing the pressure dependence of lambda at 650° C., for both illuminated and dark samples.
Figure 34:
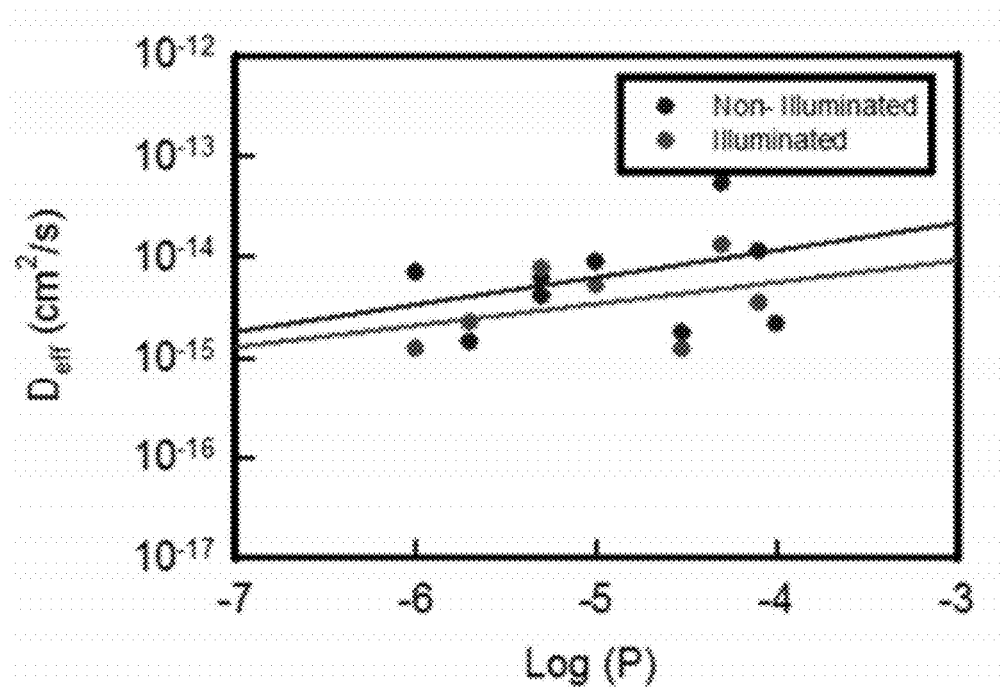
FIG. 34 provides a plot showing the pressure dependence of diffusivity at 750° C., for both illuminated (lower trace) and dark (upper trace) samples.
Figure 35:
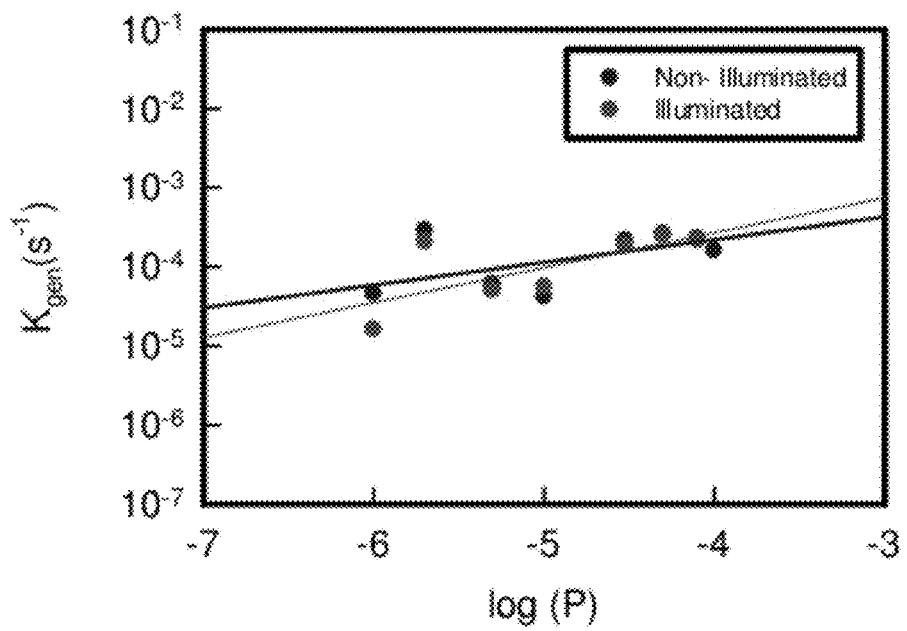
FIG. 35 provides a plot showing the pressure dependence of $K_{gen}$ at 750° C., for both illuminated and dark samples.
Figure 36:
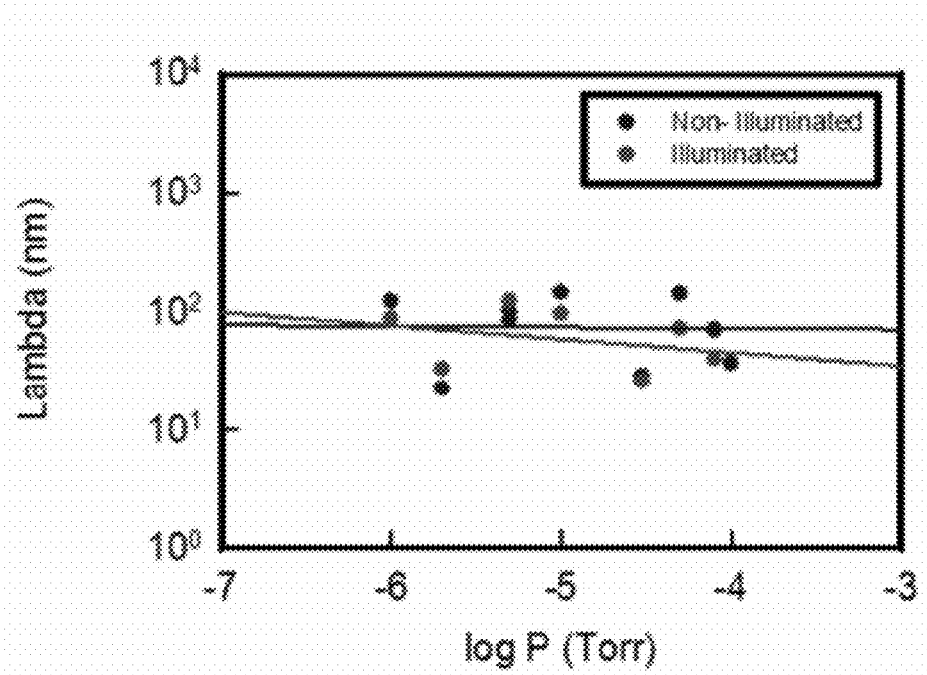
FIG. 36 provides a plot showing the pressure dependence of lambda at 750° C., for both illuminated and dark samples.

Rutile (110) samples were pre-annealed in an oxygen ambient ($1 \times 10^{-6}$ to $1 \times 10^{-4}$ Torr) at temperatures between 600 and 830° C. for 6 hours as described in Example 1.a, and then annealed in an ambient of isotopic (18) oxygen for 90 minutes. The setup (FIG. 27) was similar to that described in Example 1.a, with the exception of the addition of a light source and masking arrangement. The light source was a 75 W Xe arc lamp. FIG. 28 shows the emission curve for the lamp. The illuminated area was approximately 1 cm squared. Two filters UG-5 and KG-2 were used to limit the wavelength of light to 300-400 nm (3.09-4.1 eV). The absorption spectra of the filters are shown in FIGS. 29 and 30. The intensity of light was measured with a Scientech power and energy meter to be 0.1 W/cm². This was the maximum intensity permitted by the optical setup. The intensity is on the low end of the range employed in prior work with Si, where intensities ranged up to 1-2 W/cm². Effects of photostimulation on diffusion could be observed at 0.1 W/cm² for Si, but barely. Measurements with a thermocouple verified that over a period of an hour, illumination alone heated the sample by no more than 2° C. Masking was accomplished with a piece of macor placed above the sample to block out illumination to half of the area. The macor was placed approximately 5 mm from the sample surface.

Results.

Computations identical to those described in Example 1.h were compared to experimental illuminated data to output least squares values for the parameters the system is most sensitive to. These parameters were $E_{surf}$ (the energy for the formation of an interstitial), $E_{ads}$ (the dissociative Langmuir adsorption/desorption energy), $k_{surf+ads}$ (the pre-exponential factor that incorporates both the pre-exponential factor for Langmuir kinetics as well as the formation of an interstitial at the surface), $k_{Odiff}$ (the pre-exponential factor for oxygen interstitial diffusivity) and $E_{Odiff}$ (the activation energy for the diffusive constant of oxygen interstitials). Values for both the illuminated and non-illuminated data with error are shown in Table 1.c.1.

TABLE 1.c.1

Model values for parameters

| Parameter | Illuminated Value | Non-Illuminated Value |
|---|---|---|
| $E_{surf}$ | $1.05 \pm 0.03$ eV | $2.25 \pm 0.13$ eV |
| $k_{surf+ads}$ | $1.58 \times 10^{10 \pm 0.59}$ | $1 \times 10^{14 \pm 1.6}$ |
| $E_{ads}$ | $0.4 \pm 0.05$ eV | $0.4 \pm 0.18$ eV |
| $E_{Odiff}$ | $1.9 \pm 0.66$ eV | $0.8 \pm 0.16$ eV |
| $k_{Odiff}$ | $3.16 \times 10^{-8 \pm 3.2}$ atoms/cm³ | $6.13 \times 10^{-4 \pm 0.77}$ atoms/cm² |

From the results shown in Table 1.c.1, illumination showed a large effect on the surface conditions (both prefactors and activation energies). This indicates that the illumination may be enhancing the diffusion by lowering the energy required to create a defect from the surface. Not much change was seen in the diffusivity, indicating that if the oxygen interstitials are switching charge states, the diffusivities of these charge states do not vary by a lot.

In some cases, the effects of illumination were examined in concert with the effects of the partial pressure of oxygen as described in detail in Example 1.b. The dependence of diffusivity on pressure was studied by plotting diffusivity as a function of the natural logarithm of pressure at the temperatures of 650 and 750° C. The slope of this plot on logarithmic scale corresponds to $1/n$ in the equation:

$$D_O = P(O_2)^{1/n} \exp\left(\frac{-E}{kT}\right) \quad \text{(EQ 1.c.1)}$$

From the value of n, the charge state of the oxygen can be calculated as discussed in Example 1.b. A change in the value of n due to illumination would be evidence that the average charge state changes due to illumination. As discussed in Example 1.b, the most likely mobile species for the non-illuminated rutile at these temperatures is the oxygen interstitial diffusing via a kick in/kick out mechanism with a charge state of 0 or −1.

Results for the effective diffusivity, rate of defect generation, and lambda at 650 and 750° C. are shown in FIGS. 31 through 37. The values for the resultant dependencies are shown in Table 1.c.2. At both temperatures, illumination decreases the pressure dependence, indicating a change in charge state. At 650° C. the diffusivity of the material in the dark goes from having a pressure dependence $1/n$ of 0.583 to 0.301, corresponding to an n value changing from 1.72 to 3.33. This corresponds to a possible change in charge state from about 0 to −1 with illumination. The error bars for $D_{eff}$ do not overlap. For $\lambda$, they overlap, however A shows little dependence on pressure in both cases. The same is true for $K_{gen}$. From the error bars of $K_{gen}$, it is difficult to determine whether the change in $D_{eff}$ is driven by a change in $K_{gen}$ or in $\lambda$. At 750° C., 1/n changes from 0.459 to 0.215, corresponding to a possible charge state change from 0 to −1 or −2 with illumination, however the error bars are such that it cannot be determined for certain. Experiments with a higher intensity of illumination may help pick out the difference better. The data at 750° C. suggests that the difference in effective diffusivity is due primarily to $K_{gen}$, as there is not much overlap in the error bars for $K_{gen}$. It is important to note these values depend on the average charge state, and most likely there are defects present in multiple charge states.

The low temperature data shows more distinct illumination effects than the data at 750° C. This is as would be expected, because photostimulated minority carriers will exceed the background concentration by a larger amount at low temperatures. (The background concentration will be lower.)

TABLE 1.c.2

Dependence of $D_{eff}$, $K_{gen}$, and $\lambda$ on oxygen pressure for different temperatures showing the difference between illuminated and dark samples.

| Temperature | 1/n for $K_{gen}$ | | 1/n for $\lambda$ | | 1/n for $D_{eff}$ | |
|---|---|---|---|---|---|---|
| (° C.) | Dark | Illuminated | Dark | Illuminated | Dark | Illuminated |
| 650 | 0.39 ± 0.18 | 0.40 ± 0.17 | 0.094 ± 0.10 | −0.049 ± 0.080 | 0.58 ± 0.16 | 0.30 ± 0.092 |
| 750 | 0.29 ± 0.14 | 0.44 ± 0.20 | −0.089 ± 0.15 | −0.11 ± 0.15 | 0.459 ± 0.257 | 0.22 ± 0.16 |

Figure 37:
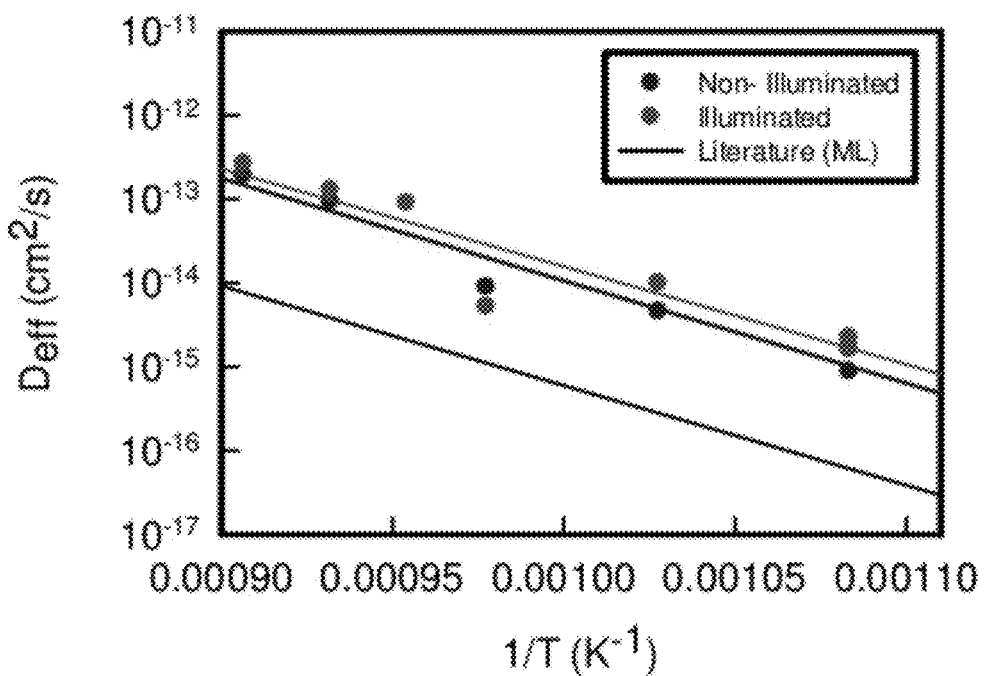
FIG. 37 provides an Arrhenius plot for $D_{eff}$ at $10^{-5}$ Torr of oxygen, for both illuminated (upper trace) and dark (middle trace) samples, and for the literature value (bottom trace).
Figure 38:
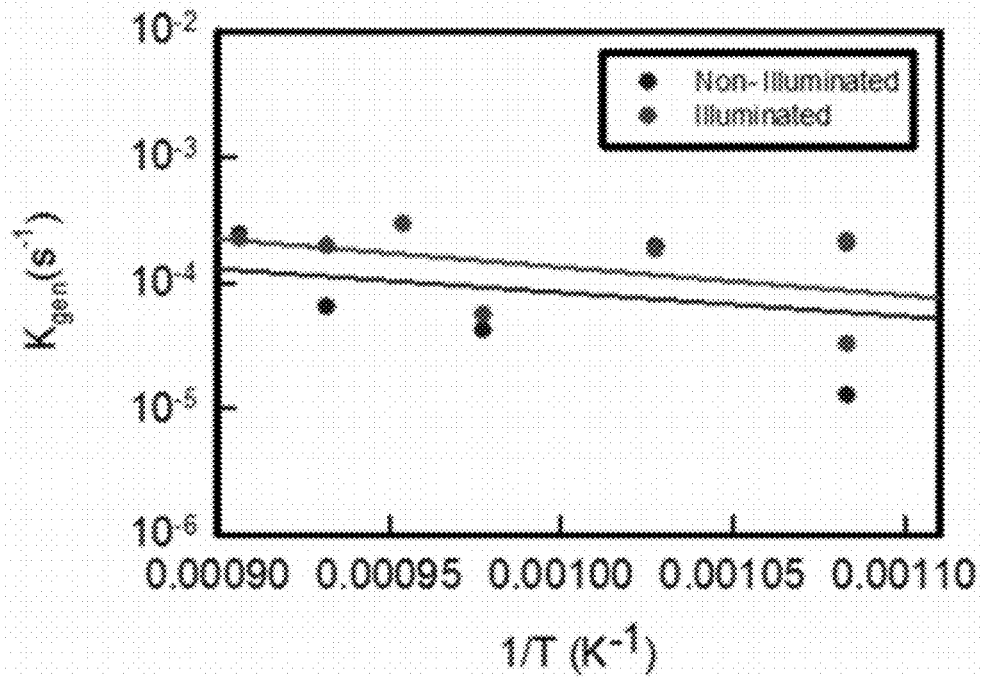
FIG. 38 provides an Arrhenius plot for $K_{gen}$ at $10^{-5}$ Torr of oxygen, for both illuminated (upper trace) and dark (lower trace) samples.
Figure 39:
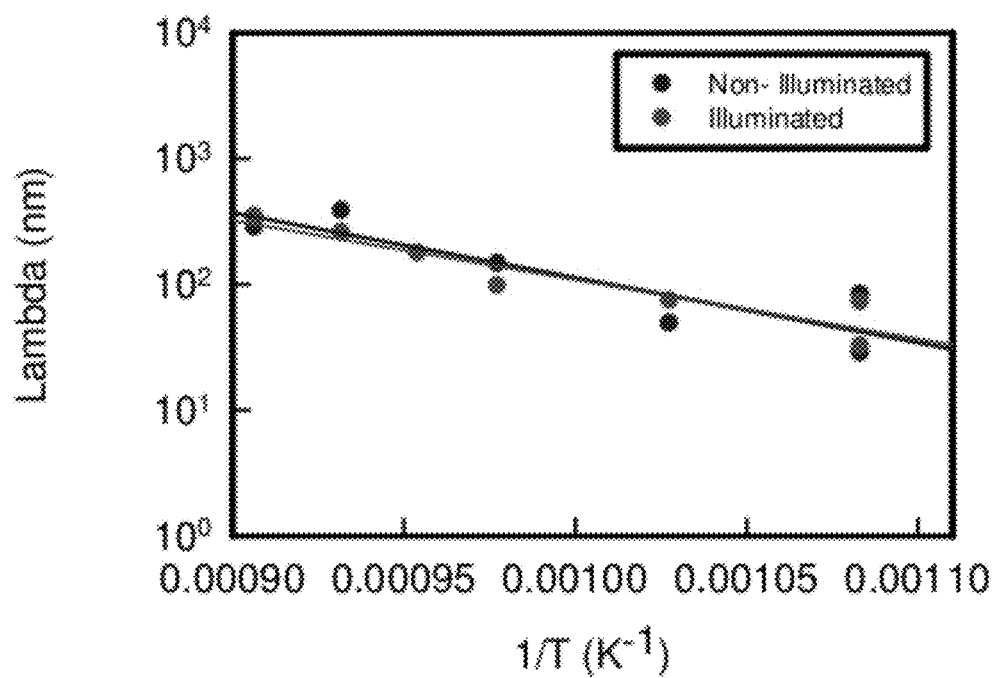
FIG. 39 provides an Arrhenius plot for lambda at $10^{-5}$ Torr of oxygen, for both illuminated and dark samples.

Illumination effects on diffusion as a function of temperature were also examined at an oxygen pressure of 1×10$^{-5}$ Torr. Results are shown in FIGS. 37 to 39 and are summarized in Table 1.c.3. Illumination has a small effect on the pre-exponential factors for $K_{gen}$ which propagate through into an increase in the pre-exponential factor for effective diffusivity as shown in FIGS. 37 to 39. These increases do not show up in the values shown in Table 1.c.3, due to these pre-exponential factors being calculated for the given activation energies. A small error in the activation energies will cause a larger error in the pre-exponential factor. No change is seen for lambda. The change in $K_{gen}$ indicates that illumination allows more defects to be generated. With the error in this data, however, these results are not conclusive, and a higher intensity light source would be needed for further analysis. In addition, the pressure that these results are taken at is a pressure where the diffusivities should be similar to each other according to the diffusivity vs. logarithm of pressure plots.

TABLE 1.c.3

Dependence of $D_{eff}$, $K_{gen}$, and $\lambda$ on temperature at 1 × 10$^{-5}$ Torr showing the difference between illuminated and dark samples

| | $K_{gen}$ | | $\lambda$ | | $D_{eff}$ | |
|---|---|---|---|---|---|---|
| | Dark | Illuminated | Dark | Illuminated | Dark | Illuminated |
| $E_a$ (eV) | 0.38 ± 0.63 | 0.45 ± 0.40 | 1.02 ± 0.27 | 0.94 ± 0.16 | 2.42 ± 0.26 | 2.32 ± 0.42 |
| Pre-exponential factor | 0.024 s$^{-1}$ | 0.0064 s$^{-1}$ | 1.63 × 10$^7$ nm | 5.65 × 10$^6$ nm | 1.72 × 10$^{-2}$ cm$^2$/s | 7.52 × 10$^{-3}$ cm$^2$/s |

Conclusions.

Low intensity UV light has been shown to change the average charge state of oxygen interstitials within titanium dioxide as indicated by the change in the pressure dependence at 650° C. The results are statistically significant for $D_{eff}$ at 650° C., but not at higher temperatures. Yet the data do exhibit statistically significant effects exactly where the photostimulation effects should be most pronounced: at the lowest temperatures.

References for Example 1.c:
1. D. V. Lang, Ann. Rev. Mat. Sci 12 (1982).
2. E. Wieser, H. Syhre, F. G. Rudenauer and W. Steiger, Phys. Stat. Sol. A. 81 (1984).
3. J. Gyulai, H. Ryssel, L. P. Biro, L. Frey, A. Kuki., T. Kormany, G. Serfozo and N. Q. Khanh, Radiative Effects and Defects in Solids 127 (1994).
4. Y. Ishikawa and M. Maruyama, Jpn. J. Appl. Phys. 36, 7433 (1997).
5. S. Noel, L. Ventura, A. Slaoui, J. C. Muller, B. Groh, R. Schindler, B. Froeschle and T. Theiler, J. Electron. Mat. 27 (1998).
6. B. Lojek, R. Whiteman and R. Ahrenkiel, Proc. RTP 2001, 125 (2001).
7. R. B. Fair and S. Li, Journal of Applied Physics 83, 1315 (1998).
8. R. Ditchfield, D. Llera-Rodriguez and E. G. Seebauer, Physical Review Letters 81, 1259 (1998).
9. R. Ditchfield, D. Llera-Rodriguez and E. G. Seebauer, Phys. Rev. B 61, 13710 (2000).
10. K. Dev and E. G. Seebauer, Surface Science 572, 483 (2004).
11. Y. Kondratenko, University of Illinois, 2009.
12. C. Kwok, University of Illinois, 2008.
13. E. R. Blomiley and E. G. Seebauer, Langmuir 15, 5970-5976 (1999).
14. M. R. Hoffman, S. T. Martin, W. Choi and D. W. Bahnemann, Chemical Reviews 95, 69 (1995).
15. K. Kasi, M. Yamaguchi, T. Suzuki and K. Kaneko, Journal of Physical Chemistry 99 (1995).
16. P. Pichat, J. M. Herrmann, H. Courbon, J. Disdier and M. N. Mozzanega, The Canadian Journal of Chemical Engineering 60 (1982).
17. T. Ibusuki and K. Takeuchi, Journal of Molecular Catalysis 88 (1994).
18. Y. Hori, K. Fujimoto and S. Suzuki, Chemistry Letters 11 (1986).
19. S. Mochizuki, F. Fujishiro, A. Iino, K. Shibata and H. Yamamoto, Physica B 401-402, 426-429 (2007).
20. X. Yang, C. Salzmann, H. Shi, H. Wang, M. L. H. Green and T. Xiao, Journal of Physical Chemistry A 112, 10784-10789 (2008).
21. Y. Xiaoyi, S. Christoph, S. Huahong, W. Hongzhi, L. H. G. Malcolm and X. Tiancun, Journal of Physical Chemistry A 112 (43), 10784-10789 (2008).
22. E. G. Seebauer and M. C. Kratzer, Mater. Sci. Eng. R 55 (3-6), 57-149 (2006).
23. E. G. Seebauer and M. C. Kratzer, Charged semiconductor defects: structure, thermodynamics and diffusion. (Springer, N.Y., 2008).
24. K. A. Schultz and E. G. Seebauer, Journal of Chem. Phys. 97, 6958-6967 (1992).

1.d: Oxygen Diffusion Within the Space Charge Region

Introduction.

Surface control groups can affect diffusion in the underlying bulk via a dangling bond mechanism and (secondarily) an electrostatic mechanism. The electrostatic effect operates when the surface is injecting defects and there are effects on diffusion profiles—especially within the first 10-40 nm of the surface for a typical oxide. Since the diffusion control groups affect not only the concentration of dangling bonds, but also the amount of "fixed" electrical charge on the surface that gives rise to the electrostatic effect, this electrostatic mechanism provides an alternate means by which the diffusion control groups can be exploited for defect engineering.

For many semiconductors, an exchange of electrical charge often takes place between the free surface and the underlying bulk. This exchange leads to the creation of a space charge region within the near-surface of the semiconductor, with spatial variations in the electron potential as well as an electric field. The position of the Fermi level with respect to the conduction and valence band edges varies throughout the space charge region. Research into Si [1-2], as well as metal oxide semiconductors [3] has found that these phenomena can also sometimes lead during annealing to the near-surface buildup of isotopes of the host or dopants.

Figure 40:
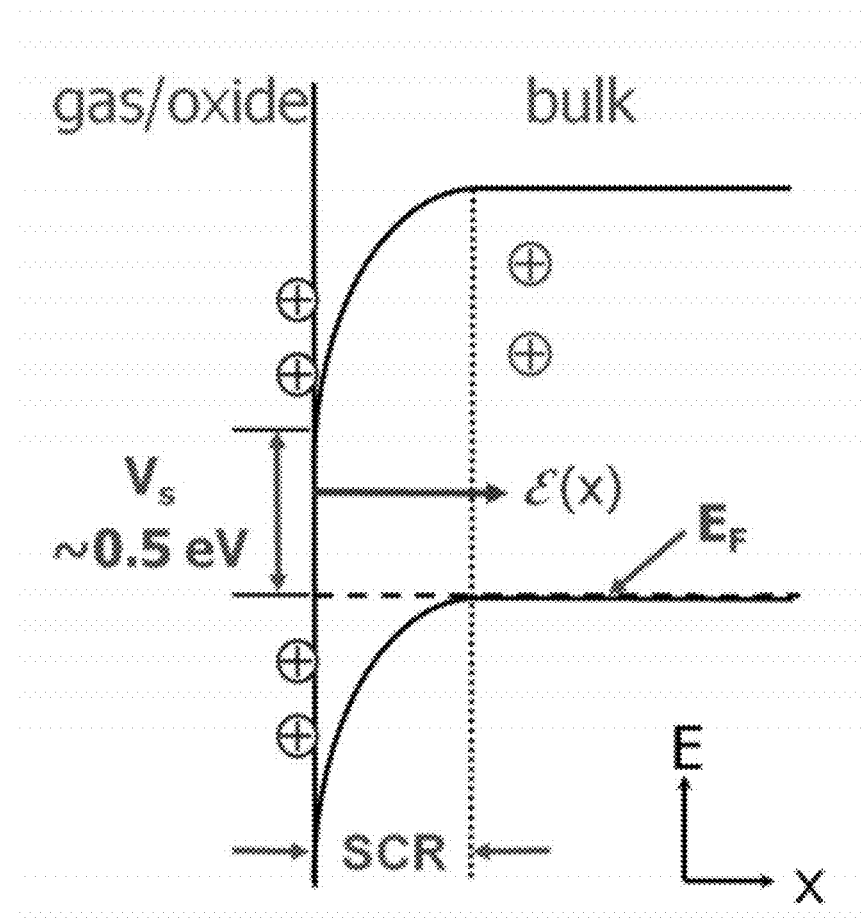
FIG. 40 provides an illustration of the space charge effect for dopant pile up in p-type silicon showing the repulsion of positive defects within the space charge region (SCR).

For example, the case of silicon implanted with boron (and thereby oversaturated in defects), is depicted schematically in FIG. 40. The primary mobile defects during annealing after implantation are interstitials of boron and silicon, which are created by the dissociation of interstitial clusters that form during implantation. In this p-type material, the Fermi level lies close to the valence band deep in the bulk. However, the Fermi level pins near mid-gap at the surface, resulting in the formation of a space charge region such that the electric field points into the semiconductor. Interstitials of Si and B are positively charged deep in the bulk, so that when such interstitials diffuse toward the surface, they are repelled by the electric field. A different effect occurs for interstitials that are created near the surface, however. Near the surface, the Fermi level lies deeper within the band gap, and changes the charge state of both the B and Si interstitials to become either neutral or negative. The interstitials in these charge states diffuse unimpeded to the surface (neutrals), or are actually drawn toward it (negative). The surface annihilates both kinds of interstitials. But the effective rates at which the silicon and boron move toward the surface differs because of exchange with the lattice. Si interstitials exchanging with lattice atoms in kick-in reactions typically produce other Si interstitials, whereas boron interstitials that kick in also produce Si interstitials (as Si is the majority species in the lattice). The boron atoms that kick in must wait for Si interstitials to kick them back out. Thus, the lattice serves as a reservoir for boron in a way that the lattice does not for Si, and the Si interstitials "feel" the annihilation at the surface more strongly. The Si interstitial concentration near the surface is thereby depleted, which prolongs the residence time of boron in the lattice and leads to boron pileup in the near-surface region. This phenomenon was predicted by simulations [4] and subsequently observed in experiments [5]. The dopant pileup occurs within the first 1-3 nm of the surface.

A related surface pileup phenomenon has been described for isotopically labeled oxygen diffusing in metal oxides, but the mechanism differs. De Souza et al. [3] found that for $SrTiO_3$, a positively charged surface led to a depletion in oxygen vacancies in the near surface region. In $SrTiO_3$, oxygen diffuses via a vacancy mediated mechanism. The effective diffusivity for oxygen therefore is proportional to the concentration of oxygen vacancies. In experiments that expose the semiconductor to gaseous oxygen that was isotopically labeled, the depletion of O vacancies near the surface decreased the value of the effective O diffusivity there, and led to pileup of isotope within a few tens of nanometers of the surface.

For this Example, the mechanism observed by De Souza cannot be the same. De Souza's mechanism is based on vacancy diffusion, whereas this Example relates to a highly mobile intermediate. In the case of oxygen interstitials diffusing in titanium dioxide, the mobile intermediate could be confined temporarily towards the surface, or an electric potential could affect the kick in rate constants.

Experimental Results.

Figure 41:
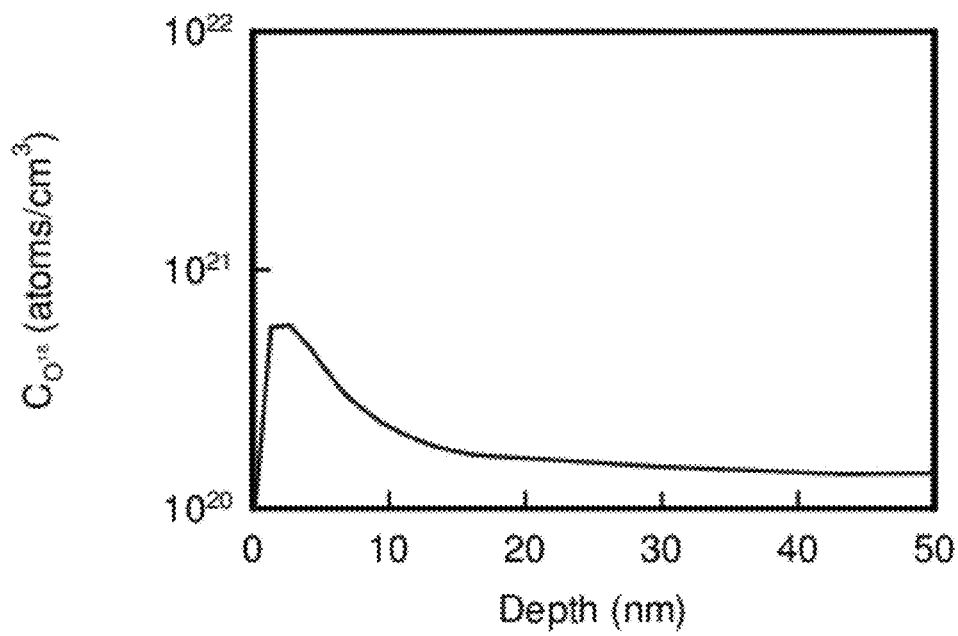
FIG. 41 provides a plot of the $^{18}O$ SIMS depth profile showing the pile up of isotopic oxygen in the near surface region. A data point was taken each 1.35 nm.
Figure 42:
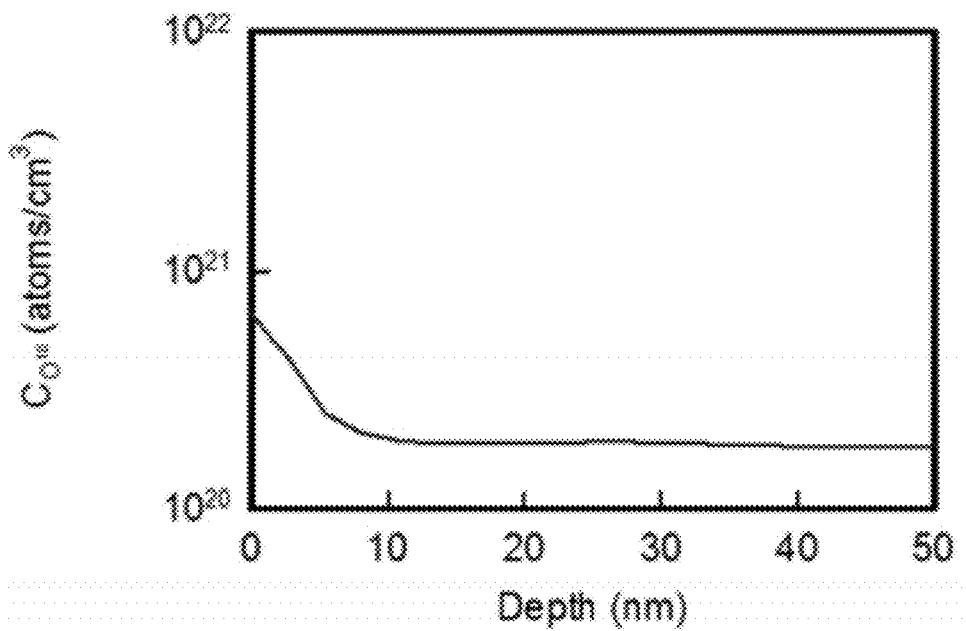
FIG. 42 provides a plot of the $^{18}O$ SIMS depth profile showing the pile up of isotopic oxygen in the near surface region without a depletion immediately at the surface.

Rutile (110) titania was annealed in the presence of oxygen (mass 18) for 90 minutes at a range of pressures ($10^{-6}$ to $10^{-4}$ Torr) and temperatures (650 to 830° C.). Pile up of the isotope occurred consistently in the first 5 to 10 nanometers. In most cases such as FIG. 41, the $^{18}O$ profile seemed to reach a minimum directly at the surface. In other cases such as FIG. 42, it showed a steady increase in concentration in the direction of the surface.

Due to the unreliability of the data point nearest to the surface, magnitude of the pileup was quantified as the ratio of $^{18}O$ to $^{16}O$ at the second data point (1.35 nm.) This was also normalized with respect to the ratio at 20 nm (past the pileup). Normalization sought to separate out the magnitude that might be present due to deep bulk effects. In the cases where the pileup resembled a bump this was also the maximum amount of pileup. The ratio at the pileup was typically between 0.02 and 0.1. (This represents the overall ratio of $^{18}O:^{16}O$ at the surface.) The normalized ratio was around 1 to 6 times the ratio in the bulk, with about 1.3 being the most frequent value.

Figure 43:
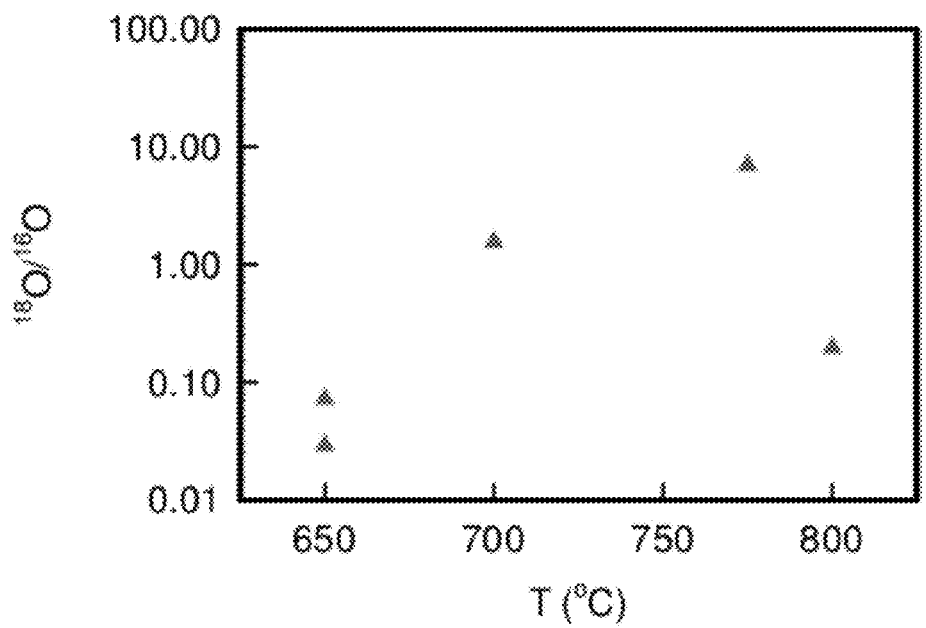
FIG. 43 provides a plot of the $^{18}O:^{16}O$ ratios at the pile-up as a function of temperature.

In addition, the degree of the pile-up with respect to the concentration of $^{18}O$ deeper in the bulk seems to scale slightly with temperature as shown in FIG. 43, however there was a lot of scatter in the data. The temperature dependence was only present for the actual ratio. There was no significant temperature dependence for the normalized data, indicating that this is probably a function of the overall ratio shifting.

Experiments were done with illumination, which had an effect on the size at lower temperatures. In addition experiments were conducted with sulfur on the surface. In these experiments, no difference was seen in the normalized ratio at the pile up.

Elimination of Other Possibilities.

The pileup effects described above were in a near-surface region where SIMS artifacts can creep in, and where physical phenomena other than electrostatic effects could conceivably lead to the observed results. The following sections outline several of these possibilities and argue that they are probably not the dominant causes.

Surface roughness can cause SIMS depth profiles of dopants to exhibit a pileup in secondary ion yields near the surface [6]. Makeev et al, explored this phenomena computationally [6]. A rough surface has an increased surface area, which increases the probability of an ion hitting it, and hence translates into larger ion yields. The magnitude of the pile up can be twice the number of counts on a flat surface. In addition the breadth can be up to twice the rms value. The $^{18}O$ concentration data presented in this Example, however, are calculated by first measuring the ratio of the ion counts for $^{18}O$ to $^{16}O$, multiplied by the total amount of oxygen in the system based on the density and stoichiometry of titanium dioxide. Due to the fact that $^{18}O$ and $^{16}O$ are the same chemical element, any effects due to surface roughness should be present to the same degree for both isotopes. Taking the ratio of the ion counts of the two isotopes insures that the effects seen are not due to roughness on the surface.

Figure 44:
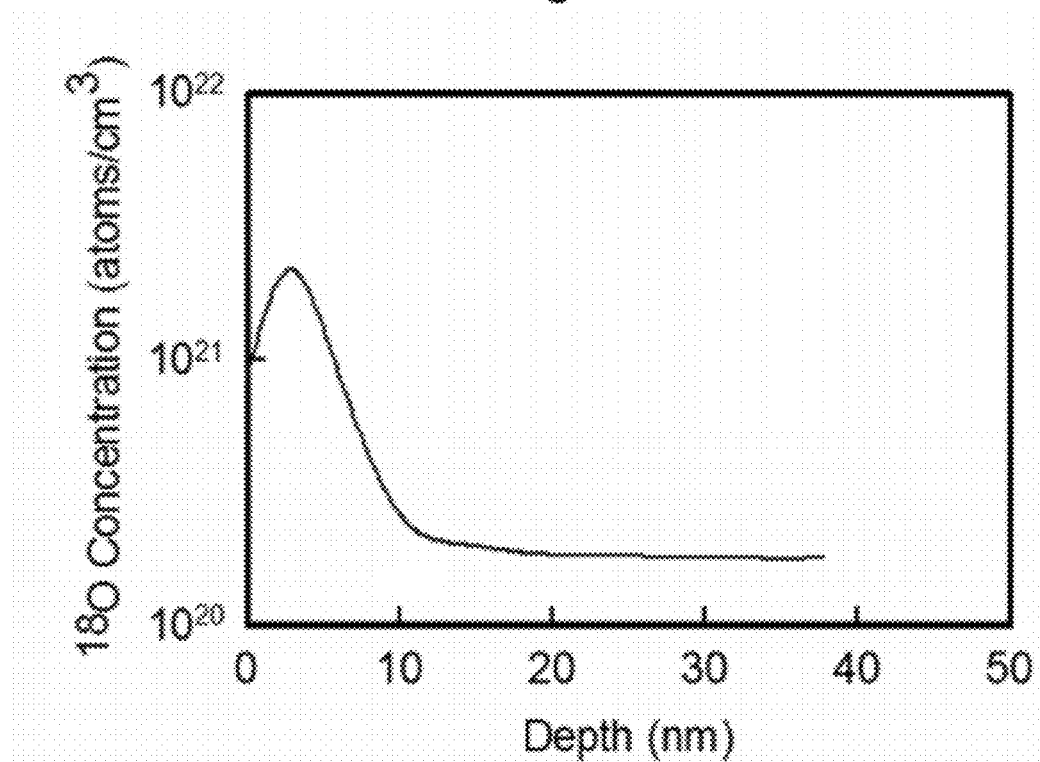
FIG. 44 provides a plot of O pile-up prior to etching with sulfuric acid (i.e., mechanical polishing only).

Another plausible explanation for near surface pile up could be gettering of the oxygen isotope at near-surface defects induced by the polishing procedure. Either or both of the in-house and crystal manufacturer procedures could lead to such effects. Indeed, initial experiments (wherein the polishing was only mechanical and did not include the subsequent chemical etch) showed large levels of pileup at the surface as exemplified in FIG. 44. The magnitude of this pileup varied from sample to sample, especially as the mechanical polishing procedure evolved.

In order to eliminate this possibility, a procedure was developed to etch titanium dioxide samples for 20 minutes at 150° C. in sulfuric acid. The etch time was chosen because visually detectable dissolution of small $TiO_2$ particles took place, and the temperature was the highest for which no sulfur could be detected in the samples post-etch during SIMS analysis. Previously annealed samples were used to gauge the depth of etching. An annealed sample was etched in sulfuric acid without mechanical etching. Under these conditions, it was possible to see a significant reduction in the amount of $^{18}O$ in the profiles compared to before the wet etch. This observation served as an indicator that the surface had been etched away into a region where the level of $^{18}O$ was lower. After etching, pile-up was still observed in the annealed samples, but to the same degree (about half of the pre-etched height) as samples which were annealed immediately after mechanical polishing without the etching step. Samples that had never been annealed in isotopic oxygen did not show pile up. This observation indicated that polishing was causing damage to the surface, resulting in an increased amount of pileup. Through etching the pileup due to surface damage was eliminated, and the remaining pile up is believed to be an effect of interactions with the space charge region.

In order to assess statistically whether the pile up of oxygen at the surface is truly a physical effect, formal statistical analysis of the profiles was performed. As three profiles were collected for a given sample, this analysis was straightforward to perform. The error bars on the ratio between mass 16 and 18 isotopes was calculated at a profile depth sufficiently large to be unperturbed by pileup effects. This number represents the error in the SIMS profiles. It was calculated using the equation:

$$S = \frac{C_{O^{18}}}{C_{O^{16}}} \sqrt{\frac{1}{C_{O^{18}}} + \frac{1}{C_{O^{16}}}} \quad (EQ\ 1.d.1)$$

The concentrations above are the averages of the values for all three SIMS runs within the bulk. In all cases, the $^{18}O/^{16}O$ ratio at the pile-up position was larger than the error in the profiles calculated through counting statistics, verifying that the results represent a genuine physical phenomenon as distinct from a measurement artifact. The error in the bulk is used as an indicator of how much error would be present at the surface. As long as the normalized ratio was larger than the value of S, the pile up was statistically significant. In most cases the error, S, was between 0.1 and 0.8 percent of the normalized $^{18}O/^{16}O$ ratio at the maximum of the bump.

The point closest to the surface on a SIMS depth profile is generally not reliable for a couple reasons. First of all, in an isotopic oxygen study, oxygen 18 at or very near the surface might exchange with $^{16}O$ in the gas phase even at room temperature. In addition, 16 oxygen might deposit on the surface after annealing, and show up as a depletion of isotopic (18) oxygen in a SIMS depth profile. For these reasons, the first point on the surface can be ignored. In addition, it is difficult to imagine a scenario where atmospheric conditions would lead to an enhancement of $^{18}O$, as its natural abundance is only 0.2%. Therefore, the second data points where the ratio has clearly increased are believable.

Discussion. Ikeda et al [7] found through computations that for slightly reduced titanium dioxide that is deficient in oxygen (and therefore n-type), the surface should have a positive charge. They did not, however, state the level of the Fermi level at the surface with respect to the valence and conduction bands. They also calculated the Fermi level within the bulk, and did not account for the fact that the Fermi level will most likely be pinned at the surface.

Figure 45:
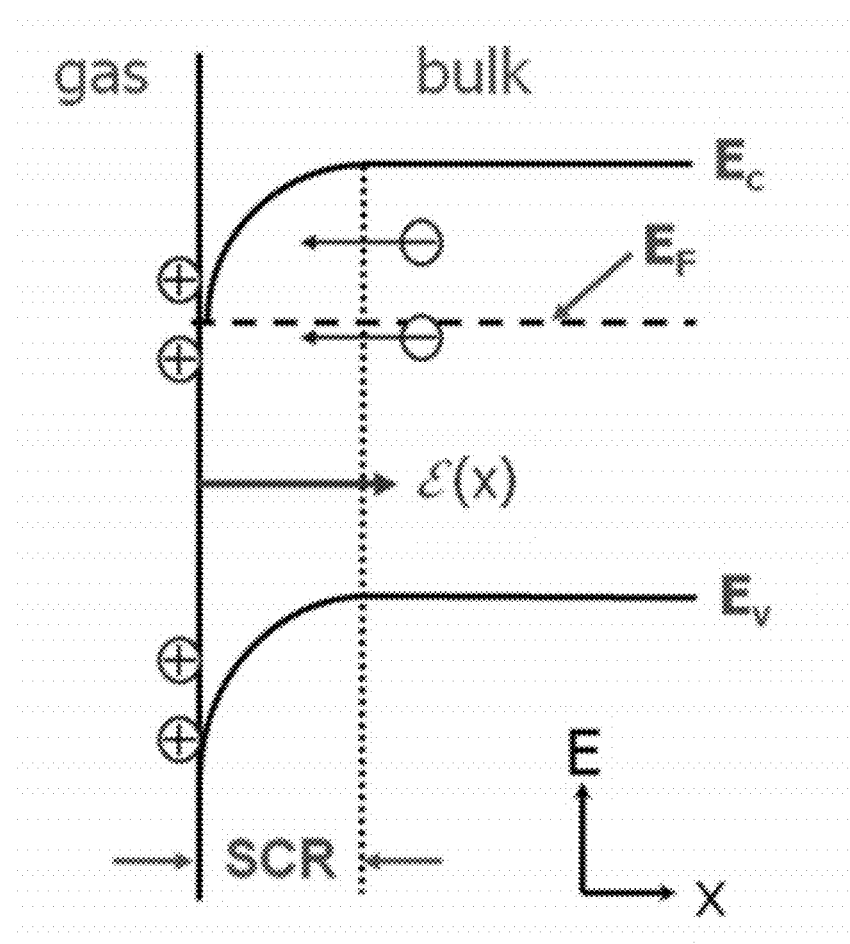
FIG. 45 provides an illustration of the space charge effect for oxygen interstitials in titanium dioxide showing the attraction of negative defects within the space charge region (SCR).

The (110) rutile surface is known to have a high concentration of surface defects, the most common of which are oxygen vacancies and titanium interstitials [8]. Diebold et al [8] also reports that slightly reduced rutile 110 should exhibit downward band bending. The electric field should then point from the surface into the bulk. This effect is illustrated in FIG. 45. In reduced rutile, an electric field pointing into the sample would attract negatively charged defects towards the surface. In particular, oxygen interstitials in a −1 charge state (which the pressure data of Example 1.b indicates is likely) should be attracted to the surface, reducing the value for lambda, or the average distance the interstitial travels before being incorporated into the lattice.

Temperature increased the magnitude of the oxygen pileup. This could be due to an increase in the total concentration of oxygen interstitials as it scales up with temperature. Interestingly, illumination showed an increase in the magnitude of the pile up at low temperatures of up to 90%, and an inhibition at higher temperatures of up to 10% in the magnitude of the pileup. There was a lot of scatter in the data, however this could be a result of illumination changing oxygen interstitials from a neutral to a negative charge state at the lower temperatures. (Charge state depends both on illumination and temperature.) In addition, samples with sulfur on the surface showed less pile up on the surface, which was most likely due to a smaller number of oxygen interstitials within the samples.

No differences were seen in the width of the pile up, however due to error in the SIMS spatial depth resolution, this would probably not be observable with the instrument used. In theory a wider pile up region could either indicate a weaker electric field, or a less negative charge state of the oxygen interstitials. If the oxygen interstitials had a weaker charge state, the attraction to the surface would be less, and they would be less likely to get sequestered near the surface.

Conclusions.

Oxygen pile up due to an attraction of negatively charged oxygen interstitials in titanium dioxide has been observed at the surface of titanium dioxide. This appears to be the first evidence of such an effect in rutile titanium dioxide.

References for Example 1.d:
1. M. Y. L. Jung, R. Gunawan, R. D. Braatz and E. G. Seebauer, J. Appl. Phys. 95 1134-1140 (2004).
2. K. Dev, M. Y. L. Jung, R. Gunawan, R. D. Braatz and E. G. Seebauer, Phys. Rev. B 68 (19), 195311 (2003).
3. R. A. De Souza and M. Martin, Physical Chemistry Chemical Physics 10 (17), 2356-2367 (2008).
4. M. Y. L. Jung, R. Gunawan, R. D. Braatz and E. G. Seebauer, AIChE Journal 50 (12), 3248-3256 (2004).
5. Y. Kondratenko, University of Illinois, 2009.
6. M. A. Makeev and A.-L. Barabasi, Applied Physics Letters 73, 1445-1447 (1998).

7. J. A. S. Ikeda and Y.-M. Chiang, Journal of the American Ceramic Society 76 (10), 2437-2446 (1993).
8. U. Diebold, Surface Science Reviews 48, 53 (2003).

1.e: Model for Diffusion of Titanium into Titanium Dioxide

Introduction.

As a supplement to the model for self-diffusion of oxygen in titanium dioxide, a model was also created to investigate the self-diffusion of titanium. Titanium interstitials can serve as electron donors, altering the electronic properties of the bulk material. Currently, most literature suggests that titanium diffuses via an interstitial mechanism [1-5].

A FLOOPS-based continuum model was devised for the diffusion of titanium in titanium dioxide similar to the model for oxygen diffusion. The model allows the user to simulate the profile spreading of isotopic titanium by inputting the pre-annealed profile and the experimental temperature and pressure. The model contains the creation and diffusion of both titanium vacancies and interstitials. Ti vacancies were included partly because they can in principle interact with oxygen interstitials, and also because a surface creation mechanism could exist for titanium vacancies that would speed Ti diffusion by that mechanism. That mechanism is presently believed to be very slow, diffusing over measurable length scales on a time scale of months [6]. Other parameters are based on ML estimation. Parameter sensitivity analysis was used for the titanium case, similarly to the oxygen case.

Model.

The model uses continuum equations to describe the reaction and diffusion of various defects. These equations have the general form for species i, $$\frac{\partial C_i}{\partial t} = -\frac{\partial J_i}{\partial x} + G_i \qquad (EQ\ 1.e.1)$$

where $C_i$, $J_i$, and $G_i$ denote concentration, flux, and net generation rate of species i, respectively. The diffusing species are titanium interstitials (+3 and +4 charge states) and titanium vacancies (−4 charge). The flux $J_i$ comprises terms due to both Fickian diffusion and electric drift motion, $$J_i = -D_i \frac{\partial C_i}{\partial x} + \gamma_i \mu_i C_i \xi(x) \qquad (EQ\ 1.e.2)$$

where $\mu$ is the mobility of diffusing species calculated by the Einstein equation, and $\gamma_i$ is the net charge of species i, which is the sum of all possible charge states, $z_j$ weighted by the corresponding fraction, $\gamma_{zj}$:

$$\gamma_i = \sum_j z_j \gamma_{z_j} \qquad (EQ\ 1.e.3)$$

The electric field ($\xi$) is obtained by the solution of Poisson's equation, with the charge density ($\rho$) incorporating terms due to the concentrations of electrons, holes, charged defects and background doping:

$$\frac{dE(x)}{dx} = \frac{\rho(x)}{\varepsilon} \qquad (EQ\ 1.e.4)$$

Charge states of +3 and +4 were employed for titanium interstitials, with the population of various charge states determined by Fermi-Dirac statistics:

$$f(E) = \frac{1}{1 + \frac{g_0}{g_1}\exp\frac{E - E_i}{kT}} \qquad (EQ\ 1.e.5)$$

$$E_i = E_{i,bulk} - \text{Potential} \qquad (EQ\ 1.e.6)$$

where f(E) is the probability that an available energy state at E will be occupied by an electron, $E_i$ is the ionization level, $g_0$ and $g_1$ are the degeneracy of the unoccupied and occupied centers, respectively. For the titanium interstitial with a charge state of +3, $g_0=1$, $g_1=2$.

$E_i$ was calculated by knowing that:

$$E_{i,bulk} = E_f - kT\ln\left(\frac{n_0}{n_i}\right) \qquad (EQ\ 1.e.7)$$

$$n_i = 2\left(\frac{2\pi kT}{h^2}\right)^{\frac{3}{2}} (m_n^* m_p^*)^{\frac{3}{4}} e^{\frac{-E_g}{2kT}} \qquad (EQ\ 1.e.8)$$

$n_0$ was calculated using the concentration of oxygen vacancies, and the fact that:

$$p - n_0 + 2C_{O_{vac}} = 0 \qquad (EQ\ 1.e.9)$$

$$p = \frac{n_i^2}{n_0}$$

so, $$n_0 = 2C_{O_{vac}} + (4C_{O_{vac}}^2 + n_i^2)^{\frac{1}{2}}$$

The model included the formation of titanium interstitials both through a kick in/kick out mechanism and through a dissociation mechanism shown below:

(EQ 1.e.10)

(EQ 1.e.11)

(EQ 1.e.12)

In the above reaction $k_3$ and $k_1$ were assumed to obey Arrhenius relationships, while $k_2$ was assumed to be diffusion limited. Values for $k_1$ were taken from the equilibrium constant for this reaction calculated in Example 1.i. Starting values for $k_3$ were based on the value for the kick in/kick out reaction constant for silicon interstitials. The diffusion limited equation used for $k_2$ was calculated using the relation:

$$k_S = 4\pi D_{Ti} a_o \qquad (EQ\ 1.e.13)$$

In the above relationship, $a_o$ is the capture radius. The nearest neighbor distance between Ti atoms was used as an estimate for this parameter.

Results.

Figure 46:
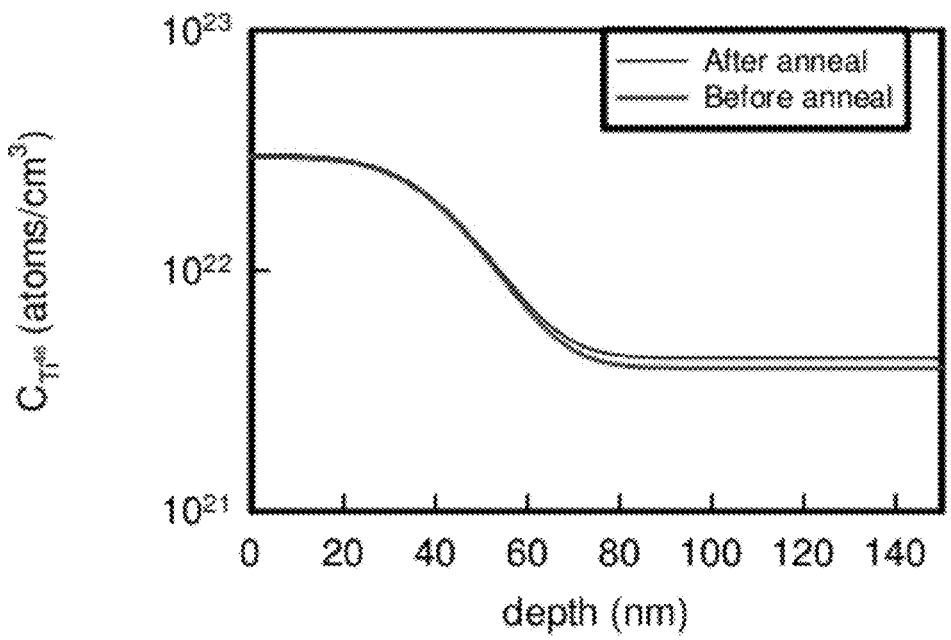
FIG. 46 provides a simulation of the diffusion of $^{46}Ti$ annealed at 800° C. for 90 minutes. The initial profile of $^{46}Ti$ is shown in the top trace, and the resultant spreading is shown in the bottom trace.

An example of a simulated depth profile of the $^{46}$Ti is shown in FIG. 46. Results showed diffusion spreading at high temperatures from what was essentially a step profile of $^{46}$Ti. The step profile was made a bit more gradual to reflect what a real step profile would most likely show. The spreading shows most of the change in concentration to be in the depleted region as isotopic titanium travels via interstitial to this region.

Parameter Sensitivity Analysis.

Parameter sensitivity analysis was used to find which prefactors and activation energies affected the resultant titanium depth profile the most. The sensitivity coefficients were found for activation energy in a normalized form as shown in the equation below:

$$PS = \sum \text{abs}\left(\frac{(C_{+10\%} - C_{-10\%})x_i}{2(0.1x_i)C_i}\right) \quad \text{(EQ 1.e.14)}$$

For pre-exponential factors, the 10% of the log of the parameter was varied instead of 10% of the actual value. This was done in order to compare sensitivity coefficients from activation energies with ones from prefactors. The resultant sensitivity coefficients are shown in Table 1.e.1. Overall the profiles were most sensitive to the activation energy for diffusion of titanium interstitials, followed by the pre-exponential factor for Ti interstitial diffusion. This was as expected.

TABLE 1.e.1

Sensitivity coefficients for parameters in Ti diffusion.

| Parameter | Sensitivity Coefficient |
|---|---|
| $k_{diff,\,Ti}$ | 6.44E+00 |
| $k_{diff,\,Tivac}$ | 6.87E−02 |
| $E_{diff,\,Ti}$ | 2.62E+01 |
| $E_{diff,\,Tivac}$ | 3.25E−02 |
| $E_1$ | 1.23E−02 |

Experimental.

Figure 47:
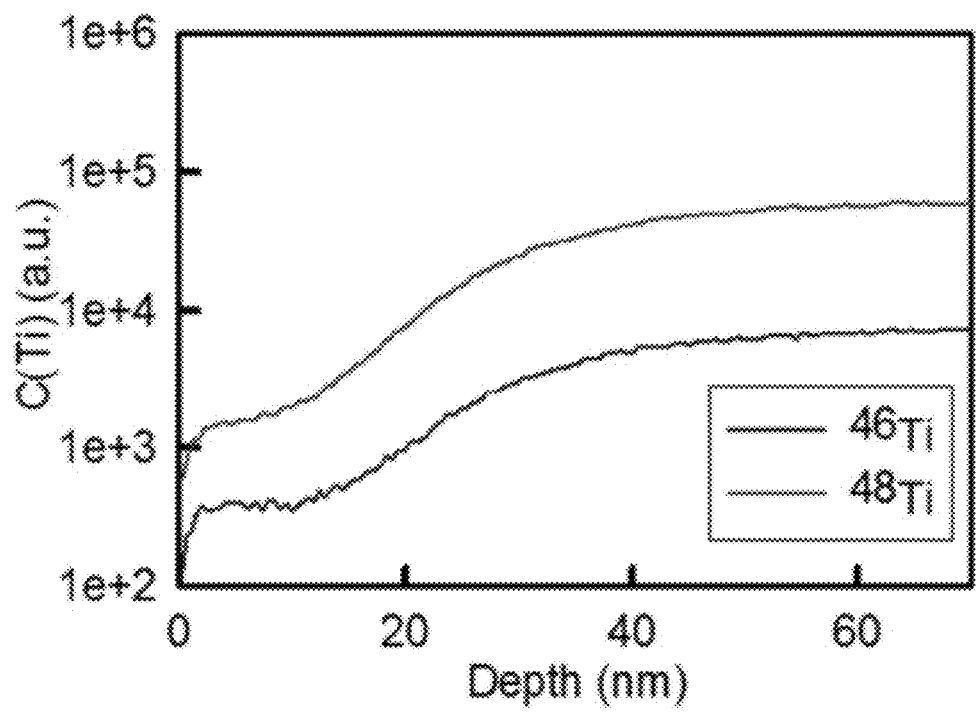
FIG. 47 provides a plot of initial deposition of $^{46}Ti$, showing a slight increase in the ratio of isotopic titanium in the near surface region. The top trace is $^{46}Ti$ and the bottom trace is $^{48}Ti$.

In addition to simulating titanium diffusion in titanium dioxide, depositing a step profile of isotopic titanium was explored. In these experiments, isotopically labeled titanium dioxide from a powder was deposited onto rutile titanium dioxide epitaxially by means of metal evaporation. A platinum heating boat heated resistively until it glows red from a current supply, by two leads has been developed in order to deposit the isotopic layer. The boat was within line of sight of the sample, so that $^{46}$Ti that evaporates out of the boat will adsorb directly on the titanium dioxide surface. An initial SIMS profile was taken ex situ prior to sample annealing to insure that a step profile of isotopic titanium dioxide was indeed grown on the sample. Initial experiments showed small amounts of isotopic titanium dioxide deposited as shown in FIG. 47 where the ratio of $^{46}$Ti to $^{48}$Ti was slightly larger, but more work was needed to improve the purity of the deposited layer.

Heating the sample up to the temperature necessary for annealing, should crystallize the surface layer into the rutile phase. This can be checked by means of X-ray Diffraction (XRD). Once the surface has been deposited on and heated enough that the film is transformed into rutile titanium dioxide, a controlled amount of sulfur can be deposited on the surface. This will provide information on how surface coverage effects defect creation in titanium dioxide. The sample can then be annealed.

Conclusions.

This Example presents the FLOOPS-based model for the diffusion of titanium in titanium dioxide. In addition, initial results on isotopic Ti deposition are presented. Further work was needed to significantly improve the deposition method and to optimize the simulator to model generation of interstitials at the surface. Further work on this topic can be found in Kyong Noh's MS thesis [7] which is hereby incorporated by reference in its entirety.

References for Example 1.e:

1. T. Bak, J. Nowotny and M. K. Nowotny, The Journal of Physical Chemistry B 110 (43), 21560-21567 (2006).
2. T. S. Lundy and W. A. Coghlan, Journal de Physique Colloques 34, C9-299-C299-302 (1973).
3. D. A. Venkatu and L. E. Poteat, Material Science and Engineering 8, 258-262 (1970).
4. J. R. Akse and H. B. Whitehurst, Journal Physical Chemistry in Solids 39, 457-465 (1978).
5. K. Hoshino, N. L. Peterson and C. L. Wiley, Journal of Physical Chemistry Solids 44 (12), 1397-1411 (1985).
6. T. Bak, M. K. Nowotny, L. R. Sheppard and J. Nowotny, The Journal of Physical Chemistry C 112 (34), 13248-13257 (2008).
7. K. Noh, Masters of Science Thesis, Chemical & Biomolecular Engineering, University of Illinois, 2010.

1.f: Introduction to Defect Engineering in $TiO_2$ Via Surfaces

Motivation.

Defect engineering is being used in the microelectronic industry to improve semiconductor devices. Outside of silicon, few materials have been studied with defect engineering, however. Titanium dioxide ($TiO_2$) has many applications in which the performance is affected by its various defects, and hence defect engineering may open up more opportunities in fields such as catalysis. The effects of surface adsorbate coverage and optical illumination on the concentration and diffusion of silicon defects, including the use of a continuum-based software for mechanism studies, is described above. This Example discusses the application of these principles learned from silicon microelectronic processing for titanium dioxide in order to show how defects can be manipulated to improve the performance of metal oxide semiconductors. Point defects typically affect electronic properties such as carrier type, concentration or mobility [1-2]. Extended defects also affect physical properties, such as strength or toughness [3]. At elevated temperatures, extended defects frequently serve as sources or sinks of point defects. Surfaces do the same, interacting through both bond-exchange [4-5] and electrostatic [4] mechanisms. Most defects can act as sites where electrons and holes recombine with special efficiency [6-8], typically degrading the performance of the host material in applications ranging from optoelectronics to photocatalysis. Defect engineering seeks to reduce such effects.

The study of defects in metal oxide semiconductors is emerging as an important field in the scientific community with a large array of applications not limited to nitric oxide reduction [9], photovoltaic cells [10], sensors [11], anti-fouling coatings [10], strong metal support interaction (SMSI) catalysts [12-14] and water splitting [15]. In particular, titanium dioxide ($TiO_2$) is one of the most intensely studied semiconducting metal oxides due to its vast number of applications such SMSI catalysts [12-14], self-cleaning coatings [19], and water splitting for hydrogen production [15]. Although it is becoming apparent that the defects in semiconducting metal oxides play an important role in these applications, little research is being done to engineer the defects in them.

Bulk Defects in Titanium Dioxide.

Defects in titanium dioxide can be thought of as consisting of two interacting systems: oxygen defects and titanium defects. While it is convenient to think of each element as a separate system, the two are not truly acting independently, as they can interact with each other forming clusters of multiple defects.

Oxygen defects can exist in two forms within titanium dioxide. The most commonly accepted oxygen defect is an oxygen vacancy [20-28], which is believed to have a +2 charge [20-25, 28]. There is a small amount of literature that suggests oxygen vacancies may exist in +1 charge states [25-26]. In addition to oxygen vacancies, recent literature suggests that oxygen defects may also take the form of oxygen interstitials [24]. The charge state of an oxygen interstitial is currently unknown. Some literature suggests that oxygen interstitials may travel as a pair [24].

Titanium atoms are believed to travel primarily as interstitials [20, 23-24, 27, 29-32] with a charge state of +3 or +4 [20, 24, 26, 28-31]. Some literature suggests a +2 charge state as well [23]. Recent literature suggests that titanium vacancies with a charge state of −4 also exist in titanium dioxide [24, 26, 32], but may diffuse too slowly to be noticeable in past studies.

In addition to single point defects, two or more point defects may combine to form a cluster. It is known that at high temperatures, severely reduced titanium dioxide can form extended defects known as crystalline shear planes [33]. It is possible that at lower temperatures, the precursor to crystalline shear planes, which may be clusters of vacancies, might form.

Defect Engineering in Titanium Dioxide.

Currently, most defect engineering done on titanium dioxide involves exposing titanium dioxide to an oxygen ambient at high temperatures. In its natural state, titanium dioxide is actually stoichiometrically reduced in oxygen represented by $TiO_{2-x}$, where x represents the degree of reduction. Past work on understanding defects in titanium dioxide has focused on how the material changes as x changes. While surface defects have been studied in relation to how they help the applications of titanium dioxide, little attention has been paid to what effects the surface may have on the bulk defects.

References for Example 1.f:
1. E. G. Seebauer, K. Dev, M. Y. L. Jung, R. Vaidyanathan, C. T. M. Kwok, J. W. Ager, E. E. Haller and R. D. Braatz, Physical Review Letters 97 (5), 055503 (2006).
2. E. G. Seebauer and M. C. Kratzer, Charged semiconductor defects: structure, thermodynamics and diffusion, 1st ed. (Springer, New York, 2008).
3. D. Hull and D. J. Bacon, Introduction to dislocations, 4th ed. (Butterworth-Heinemann, Oxford, 2001).
4. K. Dev, M. Y. L. Jung, R. Gunawan, R. D. Braatz and E. G. Seebauer, Phys. Rev. B 68 (19), 195311 (2003).
5. E. G. Seebauer and M. C. Kratzer, Mater. Sci. Eng. R 55 (3-6), 57-149 (2006).
6. W. Shockley and W. T. Read, Phys. Rev. 87 (5), 835 (1952).
7. S. M. Sze, Semiconductor devices, physics and technology, 2nd ed. (Wiley, New York, 2002).
8. K. Vanheusden, W. L. Warren, C. H. Seager, D. R. Tallant, J. A. Voigt and B. E. Gnade, J. Appl. Phys. 79 (10), 7983-7990 (1996).
9. I. Nakamura, N. Negishi, S. Kutsuna, T. Ihara, S. Sugihara and K. Takeuchi, Journal of Molecular Catalysis A: Chemical 161, 205-212 (2000).
10. A. Fujishima, T. N. Rao and D. A. Tryk, Journal of Photochemistry and Photobiology 1, 1 (2000).
11. S. A. Akbar and L. B. Younkman, Journal of the Electrochemical Society 144, 1750 (1997).
12. F. B. Li and X. Z. Li, Chemosphere 48 (10), 1103-1111 (2002).
13. Y. Li, Y. Fan, H. Yang, B. Xu, L. Feng, M. Yang and Y. Chen, Chemical Physics Letters 372 (1-2), 160-165 (2003).
14. S. J. Tauster, S. C. Fung, R. T. K. Baker and J. A. Horsley, Science 211, 1122 (1981).
15. J. Nowotny, T. Bak, M. K. Nowotny and L. R. Sheppard, Journal of Physical Chemistry B 110, 18492 (2006).
16. R. Gunawan, M. Y. L. Jung, R. D. Braatz and E. G. Seebauer, Journal of the Electrochemical Society 150, G758 (2003).
17. C. T. M. Kwok, K. Dev, R. D. Braatz and E. G. Seebauer, Journal of Applied Physics 98, 013524 (2005).
18. R. Vaidyanathan, University of Illinois, 2007.
19. A. Bozzi, T. Yuranova and J. Kiwi, Journal of Photochemistry and Photobiology A: Chemistry 172 (1), 27-34 (2005).
20. H. Sawatari, E. Iguchi and R. J. D. Tilley, Journal of Physical Chemistry Solids 43 (12), 1147-1155 (1982).
21. Forland, Acta Chemica Scandinavica 18 (5), 16-20 (1964).
22. P. Kofstad, Journal of Less Common Metals 13, 635-638 (1967).
23. E. Cho, S. Han, H.-S. Ahn, K.-R. Lee, S. K. Kim and C. S. Hwang, Physical Review B 73, 193202-193205 (2006).
24. S. Na-Phattalung, M. F. Smith, K. Kim, M.-H. Du, S.-H. Wei, S. B. Zhang and S. Limpijumnong, Physical Review B 73, 125205-125210 (2006).
25. P. Kofstad, Journal of Physical Chemistry Solids 23, 1579-1586 (1962).
26. T. Bak, J. Nowotny, M. Rekas and C. C. Sorrell, Journal of Physics and Chemistry of Solids 64 (7), 1057-1067 (2003).
27. N. Yu and J. W. Halley, Physical Review B 51 (8), 4768-4776 (1995).
28. U. Diebold, Surface Science Reviews 48, 53 (2003).
29. R. N. Blumenthal, Coburn, J. Baukus and W. M. Hirthe, Journal of Physical Chemistry Solids 27, 643-654 (1966).
30. J. R. Akse and H. B. Whitehurst, Journal Physical Chemistry in Solids 39, 457-465 (1978).
31. M. A. Henderson, Surface Science 419, 174-187 (1999).
32. J. He and S. B. Sinnott, Journal of American Ceramics Society 88 (3), 737-741 (2005).
33. G. J. Wood and L. A. Bursill, Proceedings of the Royal Society of London. Series A, Mathmatical and Physical Sciences 375 (1760), 105-125 (1980).

1.g: Diffusivity Relations for Oxygen Diffusing from the Surface of Titanium Dioxide Background.

A series of papers by Cowern et al [1-2] discuss the mechanisms by which defect-mediated diffusion can lead to an exponential shape as opposed to the complementary error-function shape that would be expected for classical Fickian diffusion. They explain that pure Fickian diffusion along a concentration gradient would only be seen for an atom diffusing in a semiconductor if the diffusion consisted of single atomic step movements, such as in the case of vacancy diffusion. In the case of a fast moving intermediate, which has a path length between the time in which it is created and the time that it recombines into the lattice greater than that of one atomic jump, the diffusion pattern will appear more exponential in the limit of short diffusion times. (For long diffusion times over large distances, the expected complementary error function shape would still be expected.)

They look at the specific case of boron impurities in silicon, but explain that theoretically, the mechanisms proposed should apply to any species diffusing in a semiconductor via a fast intermediate. Examples of possible diffusing species are described by the equations below, where X is the foreign species being tracking, Y is a species already present in the bulk crystal (i.e., a naturally present host atom), S indicates the atom is a lattice site, i indicates it is in an interstitial, and v that it is a vacancy.

$$X_S + Y_i \Leftrightarrow X_i \quad \text{(EQ 1.g.1)}$$

$$X_S \Leftrightarrow X_i + X_v \quad \text{(EQ 1.g.2)}$$

$$X_S + Y_v \Leftrightarrow (X_i \cdot Y_v) \quad \text{(EQ 1.g.3)}$$

$$X_S + Y_i \Leftrightarrow (X_i \cdot Y_i) \quad \text{(EQ 1.g.4)}$$

$$X_S \Leftrightarrow (X_i \cdot Y_v) + Y_i + X_v \quad \text{(EQ 1.g.5)}$$

$$X_S \Leftrightarrow (X_i \cdot Y_i) + Y_v + X_v \quad \text{(EQ 1.g.6)}$$

Cowern derived his relations for an initial delta function in concentration; however subsequent work by the inventors has extended this approach to apply to a step function in the concentration of the isotope [3]. In the case of oxygen diffusion in titanium dioxide, the possible reactions that could lead to a fast moving intermediate are:

$$^{18}O_S + {}^{16}O_i \Leftrightarrow {}^{18}O_i \quad \text{(EQ 1.g.7)}$$

$$^{18}O_S \Leftrightarrow {}^{18}O_i + {}^{18}O_v \quad \text{(EQ 1.g.8)}$$

$$^{18}O_S + Ti_v \Leftrightarrow ({}^{18}O_i \cdot Ti_v) \quad \text{(EQ 1.g.9)}$$

$$^{18}O_S + Ti_i \Leftrightarrow ({}^{18}O_i \cdot Ti_i) \quad \text{(EQ 1.g.10)}$$

$$^{18}O_S \Leftrightarrow ({}^{18}O_i \cdot Ti_v) + O_v + Ti_i \quad \text{(EQ 1.g.11)}$$

$$^{18}O_S \Leftrightarrow ({}^{18}O_i \cdot Ti_v) + O_v + Ti_v \quad \text{(EQ 1.g.12)}$$

EQ 1.g.7 and EQ 1.g.8 both involve an interstitial mediating the diffusion, whereas in EQ 1.g.9 and EQ 1.g.11, an oxygen interstitial forms a dimer with a titanium vacancy and the two diffuse as a bound pair. In EQ 1.g.10 and EQ 1.g.12, an oxygen interstitial forms a dimer with a titanium interstitial, and the two can then diffuse as a bound pair. These equations yield the values for $k_{gen}$ (the bulk generation rate of defects) and $k_{ann}$ (the annihilation rate for mobile defects in the bulk) shown in Table 1.g.1.

TABLE 1.g.1

Expressions for rate constants for diffusive mechanisms*

| Reaction Mechanism | Equation | $K_{gen}$ | $K_{ann}$ |
|---|---|---|---|
| Kick in/Kick out interstitial mechanism | 1.g.7 | $k_{gen}C_{I,O}$ | $k_{ann}C_H$ |
| Dissociation interstitial mechanism | 1.g.8 | $k_{gen}$ | $k_{ann}C_{V,O}$ |
| Vacancy pair combination mechanism | 1.g.9 | $k_{gen}C_{V,Ti}$ | $k_{ann}$ |
| Interstitial pair combination mechanism | 1.g.10 | $k_{gen}C_{I,Ti}$ | $k_{ann}$ |
| Vacancy pair dissociation mechanism | 1.g.11 | $K_{gen}$ | $k_{ann}C_{V,O}C_{I,Ti}$ |
| Interstitial pair dissociation mechanism | 1.g.12 | $K_{gen}$ | $k_{ann}C_{V,O}C_{V,Ti}$ |

*$C_v$ is the concentration of O or Ti vacancies. $C_I$ is the concentration of O or Ti interstitials. $C_H$ is the concentration of $^{16}O$ atoms in lattice sites.

Derivation for a Step Function in Silicon.

Past researchers [3-4] have been able to derive equations for an initial step profile of mobile atoms buried as an isotopic heterostructure, so that boundary conditions can be written at infinity in both the positive and negative X directions. In the case of isotopic oxygen self-diffusion in titanium dioxide, the situation differs because the surface itself is the locus of a step profile in 18 oxygen when that surface is exposed to oxygen gas. In this case, one boundary condition can be written at $x=+\infty$, but the other boundary condition depends upon the flux of isotopic atoms at the surface ($x=0$).

The solution was derived from the equations [3]:

$$\frac{\partial C_M}{\partial t} = D_M \nabla^2 C_M - K_{ann}C_M + K_{gen}C_S \quad \text{(EQ 1.g.13)}$$

$$\frac{\partial (C_M + C_S)}{\partial t} = D_M \nabla^2 C_M \quad \text{(EQ 1.g.14)}$$

In the above relations, M represents the mobile species, while S represents the substitutional atoms. The final solution in the limit of short diffusion times results in equation (1.g.15). Short diffusion times can be conceptualized as times for which the mobile species takes an average of one "step" or less before exchanging with the lattice or disappearing by some other mechanism. From a plot of the normalized concentration described by equation (1.g.15) below, one can extract $K_{gen}$ and $\lambda$ from the intercept and slope of the diffusion profile, respectively.

$$\ln\left(\frac{C_S(x,t) - C_{min}}{C_{max} - C_{min}}\right) = \ln\left(\frac{K_{gen}t}{2}\right) + x/\lambda \quad \text{(EQ 1.g.15)}$$

$K_{gen}$ represents the effective first-order rate constant for generation of mobile defects, whereas $\lambda$ represents the average distance a mobile species travels in the lattice before it disappears (for example, by exchanging into the host lattice). $\lambda$ is a function of the $K_{ann}$, which represents the effective first-order annihilation rate constant of mobile species through the relation:

$$\lambda = \sqrt{\frac{D_M}{K_{ann}}} \quad \text{(EQ 1.g.16)}$$

From $K_{gen}$ and $\lambda$ one can calculate the effective diffusivity from the relation:

$$D_{eff} = K_{gen}\lambda^2 \quad \text{(EQ 1.g.17)}$$

This last expression is valid in the limit that $K_{gen} \ll K_{ann}$ (equivalent to the quasi-steady state approximation for the reactive intermediate M), and that the experiment proceed for a time of at least $\sim 20/K_{ann}$ [4]. (Typical values for $K_{gen}t$ in these experiments are around $5 \times 10^{-3}$ to $2 \times 10^{-2}$. Based on the values calculated for lambda and the very fast diffusivity of oxygen interstitials calculated through FLOOPS-based simulations, $K_{ann}$ should be very large, insuring that these criteria are met.)

The present case of diffusion of oxygen entering the bulk from the gas phase through the surface is a little bit different. Although a step function in isotopic oxygen concentration does exist, the step is at the surface of the sample. In the case of isotopic oxygen self-diffusion in titanium dioxide, the situation differs because the surface itself is the locus of a step profile in 18 oxygen when that surface is exposed to oxygen gas. In this case, one boundary condition can be written at $x=+\infty$, but the other boundary condition depends upon the flux of isotopic atoms at the surface ($x=0$). In addition, at the surface there is a constant flux of atoms entering the bulk. For this reason, it was necessary re-derive the solution.

Derivation for Titanium Dioxide.

The following description entails the derivation of the value $C_s(x,t)$ for a step profile with an incoming constant flux, A, at the surface. The value of A can be determined from the Langmuir isotherm and the formation energy of an interstitial at the surface, and is a function of both temperature and pressure. To derive the formula for concentration of mobile species the equations below were solved:

$$\frac{\partial C_M}{\partial t} = D_M \nabla^2 C_M - K_{ann} C_M + K_{gen} C_S \qquad (EQ\ 1.g.18)$$

$$\frac{\partial (C_M + C_S)}{\partial t} = D_M \nabla^2 C_M \qquad (EQ\ 1.g.19)$$

These equations are non-dimensionalized by including $\theta = K_{gen} t$ and $\xi = x/\lambda$. Also, as the concentration of mobile species should be much smaller than the concentration in substitutional sites, the assumption $\partial C_M/\partial t \approx 0$ is valid.

$$0 = \frac{D_M}{\lambda^2} \frac{\partial^2 C_M}{\partial \xi^2} - K_{ann} C_M + K_{gen} C_S \qquad (EQ\ 1.g.18)$$

$$K_{gen} \frac{\partial C_S}{\partial \theta} = \frac{D_M}{\lambda^2} \frac{\partial^2 C_M}{\partial \xi^2} \qquad (EQ\ 1.g.19)$$

In addition the following boundary conditions are present:

$$C_S(x,0) = H(x) \qquad (EQ\ 1.g.20)$$

$$-D_{surf} \frac{\partial C_M}{\partial x(0,t)} = -B/D_{surf} \qquad (EQ\ 1.g.21)$$

In the above, B is equal to the coverage per area of atoms times the ksurf (units of $s^{-1}$) divided by the total atoms on the surface. In order to non-dimensionalize, A is introduced, where A is equal to $-B/D_{surf}$. Combining these and taking the Laplace transform of equations 1.g.18 and 1.g.19 with respect to x the following equations are developed:

$$\hat{C}_M * (p^2 - 1) - \hat{C}_M + \frac{K_{gen}}{K_{ann}} * \hat{C}_S = 0 \qquad (EQ\ 1.g.22)$$

$$\frac{\partial \hat{C}_S}{\partial \theta} - \frac{K_{ann}}{K_{gen}} p^2 \hat{C}_M + A = 0 \qquad (EQ\ 1.g.23)$$

Combining these yields:

$$\frac{\partial \hat{C}_S}{\partial \theta} + \frac{p^2}{p^2 - 1} \hat{C}_S - \frac{K_{ann}}{K_{gen}} A \left( \frac{p^2}{p^2 - 1} \right) + A = 0 \qquad (EQ\ 1.g.24)$$

This is a linear ODE, the solution to which is:

$$\hat{C}_S(p,\theta) = \frac{K_{ann}}{K_{gen}} A - A \left( \frac{p^2 - 1}{p^2} \right) + A \left[ \frac{-K_{ann}}{K_{gen}} + \frac{p^2 - 1}{p^2} \right] e^{-\left(\frac{p^2}{p^2-1}\right)\theta} + \hat{C}_S(p, 0) e^{-\left(\frac{p^2}{p^2-1}\right)\theta} \qquad (EQ\ 1.g.25)$$

The first two terms are easy to take the inverse Laplace transform of. One can solve the middle term, $$\left( A \left[ \frac{-K_{ann}}{K_{gen}} + \frac{p^2 - 1}{p^2} \right] e^{-\left(\frac{p^2}{p^2-1}\right)\theta} \right),$$

by using the convolution theory and then separation of variables, since $$e^{-\left(\frac{p^2}{p^2-1}\right)\theta}$$

is the Laplace transform of the expression in Cowern's expression [1]. Let's call this middle term Q. The inverse Laplace transform becomes:

$$C_S(\xi, \theta) = \left( \frac{K_{ann}}{K_{gen}} - 1 \right) A\delta(\xi) + A\xi - \sum_{n=0}^{\infty} P_n(\theta) f_n(\xi) + Q(\xi, \theta) \qquad (EQ\ 1.g.26)$$

The inverse Laplace transform of Q is:

$$\hat{Q}(\xi) = -\left( \frac{K_{ann}}{K_{gen}} A + A \right) \left[ \sum_{n=0}^{\infty} P_n(\theta) h_n(\xi) \right] + A \int_0^{\xi} \sum_{n=0}^{\infty} P_n(\theta) f_n(t) dt + \xi A \sum_{n=0}^{\infty} P_n(\theta) f_n(\xi) \qquad (EQ\ 1.g.27)$$

$P_n(\theta)$ is defined as:

$$P_n(\theta) = \theta^n \exp(-\theta)/n! \qquad (EQ\ 1.g.28)$$

$h_n(\xi)$ is the series solution from Cowern et al [1]:

$$s(\xi, \theta) = \sum_{n=0}^{\infty} P_n(\theta) h_n(\xi) \qquad (EQ\ 1.g.29)$$

$$h_{n=0}(\xi) = \delta(\xi) \qquad (EQ\ 1.g.30)$$

$$h_{n>0}(\xi > 0) = \frac{e^{-\xi}}{2^{2n-1}} \sum_{k=0}^{n-1} \frac{2^k}{k!} \binom{2n-2-k}{n-1} \xi^k \qquad (EQ\ 1.g.31)$$

$f_n(\xi)$ is the series solution from Vaidyanathan [5]:

$$s(\xi, \theta) = \sum_{n=0}^{\infty} P_n(\theta) f_n(\xi) \qquad (EQ\ 1.g.32)$$

$$f_{n=0}(\xi) = H(\xi) \qquad (EQ\ 1.g.33)$$

$$f_{n>0}(\xi > 0) = 1/2^{2n-1} \sum_{k=0}^{n-1} 2^k C_{n-1}^{2n-2-k} \left( 2 - \exp(-\xi) \sum_{l=0}^{k} \xi^l / l! \right) \qquad (EQ\ 1.g.34)$$

One need only account for the first two terms of the series expansion. These are shown below where $g_n$ is the integral of $f_n$.

$$P_0 = 0 \qquad (EQ\ 1.g.35)$$

$$P_1 = \theta e^{-\theta} \qquad (EQ\ 1.g.36)$$

$$f_0 = H(\xi) \qquad (EQ\ 1.g.37)$$

$$f_1 = 0.5 e^{\xi} \qquad (EQ\ 1.g.38)$$

$$g_0 = \xi H(\xi) \tag{EQ 1.g.39}$$

$$g_1 = 0.5 e^{\xi} \tag{EQ 1.g.40}$$

$$h_0 = \delta(\xi) \tag{EQ 1.g.41}$$

$$h_1 = 0.5 e^{-\xi} \tag{EQ 1.g.42}$$

As $\theta \ll 1$, $P_1$ becomes equal to $\theta$. Plugging in for these values, the solution becomes:

$$s(\xi, \theta) = \tag{EQ 1.g.43}$$
$$A\xi\left(1 + \frac{\theta}{2}\right) + e^{\xi}\left(\frac{\theta}{2} - A\frac{\theta}{2}\right) + e^{-\xi}\left(A\frac{\theta}{2} - A\frac{K_{ann}}{K_{gen}}\frac{\theta}{2}\right) + A\frac{\theta}{2}$$

Since $A\theta$ is very small, this equation is approximately:

$$s(\xi, \theta) = A\xi + e^{\xi}\left(\frac{\theta}{2}\right) \tag{EQ 1.g.44}$$

As long as $K_{gen}$ is larger than $A\xi$ the term can be dropped from the equation. At the surface, A is equal to the rate of formation of interstitials at the surface. At 800° C., the value for A, should be smaller than $K_{gen}*t$. This assumption, however, does still lead to a small amount of error in the values of both $K_{gen}$ and A. The solution to $C_s(x,t)$ becomes:

$$\ln\left(\frac{C_S(x, t) - C_{min}}{C_{max} - C_{min}}\right) = \ln(s(x, t)) = \ln(K_{gen}t/2) + x/\lambda \tag{EQ 1.g.45}$$

The slope of a semi-logarithmic plot of normalized concentration, s, versus depth, x, will have a slope of $1/\lambda$ and an intercept of $\ln(K_{gen}t/2)$.

References for Example 1.g:
1. N. E. B. Cowern, K. T. F. Janssen, G. F. A. v. d. Walle and D. J. Gravestijin, Physical Review Letters 65, 2434 (1990).
2. N. E. B. Cowern, G. F. A. v. d. Walle, D. J. Gravestijin and C. J. Vriezema, Physical Review Letters 67 (1991).
3. E. G. Seebauer, K. Dev, M. Y. L. Jung, R. Vaidyanathan, C. T. M. Kwok, J. W. Ager, E. E. Haller and R. D. Braatz, Physical Review Letters 97 (5), 055503 (2006).
4. K. Chen, R. Vaidyanathan, E. G. Seebauer and R. Braatz, J. Appl. Phys. (in press Jan. 19, 2010).
5. R. Vaidyanathan, University of Illinois, 2007.

1.h: Systems-Based Modeling of Oxygen Diffusion in Titanium Dioxide

Introduction.

Isotopic oxygen diffusion involves a complex reaction network with multiple types of defects and a variety of elementary kinetic steps. Defects are created and destroyed within the lattice as well as at the surface. The rate constants for many of the elementary steps are difficult to measure directly, so that some have no reported values at all while others have reported values that differ widely. Modeling in a systems-based framework allows for the estimation of individual diffusion coefficients and reaction rate constants in a non-arbitrary way. The modeling can also be used to optimize experimental design. The particular model chosen here was a continuum model. This model allows for a more involved mechanism than the model discussed in Example 1.g, however due to the number of rate steps used, some parameters need to be estimated.

Simulations were implemented with the software package FLOOPS (Florida Object Oriented Process Simulator, by Al Tasch of the University of Texas and Mark Law of the University of Florida). The simulator was adapted from previous versions developed to model boron in silicon. FLOOPS permits the input of boundary conditions, type and concentration of species, electrical properties of the material, diffusion equations for species in the model, and reaction mechanisms [1]. The program then takes the conditions of the experiment and outputs a simulated profile. The model involves a variety of parameters including reaction and diffusion activation energies. Due to the scatter in the parameter values from literature, the values were chosen through Maximum Likelihood estimation [2] as discussed in Example 1.i. Also, there were some parameters which had not been reported in literature. By modeling experimental profiles, the parameters generated through the experiment were adjusted to calculate more exact parameters for the most sensitive values.

Model.

The model uses continuum equations to describe the reaction and diffusion of various defects. These equations have the general form for species i, $$\frac{\partial C_i}{\partial t} = -\frac{\partial J_i}{\partial x} + G_i \tag{EQ 1.h.1}$$

where $C_i$, $J_i$, and $G_i$ denote concentration, flux, and net generation rate of species i, respectively.

The diffusing species are oxygen interstitials and oxygen vacancies (+2 charge). As the charge state of oxygen interstitials was unknown, oxygen interstitials were assumed to be neutral. The flux $J_i$ comprises terms due to both Fickian diffusion and electric drift motion, $$J_i = -D_i \frac{\partial C_i}{\partial x} + \gamma_i \mu_i C_i \xi(x) \tag{EQ 1.h.2}$$

where $\mu$ was the mobility of diffusing species calculated by the Einstein equation, and $\gamma_i$ is the net charge of species i, which was the sum of all possible charge states, $z_j$ weighted by the corresponding fraction, $\gamma_{z_j}$:

$$\gamma_i = \sum_j z_j \gamma_{z_j} \tag{EQ 1.h.3}$$

In the case of oxygen vacancies, however $\gamma_{z_j}$ is simply one for oxygen vacancies. The electric field ($\xi$) was obtained by the solution of Poisson's equation, with a charge density ($\rho$) incorporating terms due to the concentrations of electrons, holes, charged defects and background doping:

$$\frac{dE(x)}{dx} = \frac{\rho(x)}{\varepsilon} \tag{EQ 1.h.4}$$

Fermi level pinning as not applied in this case, in an attempt to keep the number of unknowns to a minimum.

The net generation term $G_i$ incorporated terms due to reactions of the defects. The reactions included are shown below:

$$O_{lattice} \underset{k_8}{\overset{k_7}{\rightleftharpoons}} O_{int} + O_{vac} \tag{EQ 1.h.5}$$

$$O_{int} + O_{lattice} \underset{k_{ex}}{\overset{k_{ex}}{\rightleftharpoons}} O_{int} + O_{lattice} \tag{EQ 1.h.6}$$

Rate constants dominated by diffusion are:

$$k_8 = 4\pi D_{O_{vac}} a_O \tag{EQ 1.h.7}$$

where a is the capture radius ($a_{Ti}$=2.95 $e^{-8}$ m, $a_O$=2.78 $e^{-8}$ m.)
The rate constants defined by kinetics are:

$$k_7 = A\exp\left(\frac{-E_7}{kT}\right) \tag{EQ 1.h.8}$$

$$k_{ex} = A\exp\left(\frac{-E_{ex}}{kT}\right) \tag{EQ 1.h.9}$$

The total reaction rates for each species are then:

$$G_{O_{lattice}} = -k_7 C_{O_{lattice}} + k_8 C_{O_{int}} C_{O_{vac}} - /+k_{ex} C_{O_{int}^{18}} C_{O_{lattice}} + /-k_{ex} C_{O_{lattice}^{18}} C_{O_{int}} \tag{EQ 1.h.10}$$

$$G_{O_{int}} = k_7 C_{O_{lattice}} - k_8 C_{O_{int}} C_{O_{vac}} - /+k_{ex} C_{O_{int}^{18}} C_{O_{lattice}} + /-k_{ex} C_{O_{lattice}^{18}} C_{O_{int}} \tag{EQ 1.h.11}$$

$$G_{O_{vac}} = k_7 C_{O_{lattice}} - k_8 C_{O_{vac}} \tag{EQ 1.h.12}$$

$E_{ex}$ is unknown but was estimated from the value for ZnO. $E_7$ was estimated from equilibrium energy determined in Example 1.i. The diffusing species are oxygen interstitials and oxygen vacancies. The determination of their diffusivities is discussed in Example 1.i.

Oxygen is adsorbed on the surface in a Langmuir dissociative adsorption/desorption isotherm as assumed in the literature [3].

$$\theta = \left(\frac{\sqrt{bP_O}}{1+bP_O}\right) \tag{EQ 1.h.12}$$

$$b = k_{ads}\exp\left(\frac{E_{ads}}{kT}\right) \tag{EQ 1.h.13}$$

The starting value for $E_{ads}$, the difference between the desorption and adsorption energy, was taken from the literature [3]. Oxygen from the surface enters the bulk as an interstitial through the reaction:

$$O_{ads} \underset{k_{ko}}{\overset{k_{ki}}{\rightleftharpoons}} O_{int} \tag{EQ 1.h.14}$$

The values for the $E_{Ki}$ and $E_{ko}$ are unknown. Due to the difficulties involved in separating out $k_{ki}$ and $k_{ko}$ the equilibrium value $K_{surf}$ was calculated instead. To the inventors' knowledge this is the first time this rate has been measured in this manner for any semiconductor.

Parameter Sensitivity Analysis.

Parameter sensitivity analysis [4] is a method in which the user varies each of the parameters independently by a constant percent, and monitors how the variation affects the output of the model. The effects for each output variable are calculated, and then the effects for the whole profile are summed up to find an overall difference. The method allows one to determine systematically which parameters influence the model outputs the most, and hence which elementary steps influence the overall diffusion behavior the most. In fast-intermediate dominated diffusion, the defining characteristics of the resultant normalized concentration profiles are the slope and intercept of the plot on a semilog graph as discussed in Example 1.g. Parameter sensitivity coefficients were calculated for the sensitivity of activation energies on the slope using the equation:

$$PS_{slope} = \sum \text{abs}\left(\frac{(m_{C,+10\%} - m_{C,-10\%})x_i}{2(0.1x_i)m_{Ci}}\right) \tag{EQ 1.h.15}$$

In the above equation, $m_{C,+10\%}$ and $m_{C,-10\%}$ represent the slope of the normalized concentration profile for a data set where a parameter has been increased and decreased (respectively) by 10 percent. For pre-exponential factors, the parameter sensitivity was calculated as a function of how the slope on a semilog plot responded to a 10% change in the base 10 log of the parameter, according to the relationship:

$$PS_{slope} = \sum \text{abs}\left(\frac{(m_{C,+10\%} - m_{C,-10\%})\log(x_i)}{2(0.1\log(x_i))m_{Ci}}\right) \tag{EQ 1.h.16}$$

For the intercept, the sensitivity coefficient for the activation energies was calculated using the equation:

$$PS_{slope} = \sum \text{abs}\left(\frac{(b_{C,+10\%} - b_{C,-10\%})x_i}{2(0.1x_i)b_{Ci}}\right) \tag{EQ 1.h.17}$$

Where $b_{C,+10\%}$ and $m_{C,+10\%}$ represent the slope of the normalized concentration profile on a semilog plot for a data set where a parameter has been increased and decreased (respectively) by 10 percent. The sensitivity coefficient for the pre-exponential factors was calculated using equation 1.h.18:

$$PS_{slope} = \sum \text{abs}\left(\frac{(b_{C,+10\%} - b_{C,-10\%})\log(x_i)}{2(0.1\log(x_i))b_{Ci}}\right) \tag{EQ 1.h.18}$$

MATLAB was used for calculating the sensitivity coefficients. Sensitivity coefficients were calculated at four combinations of pressure and temperature (high and low values for each) and are shown for each parameter under different conditions in Tables 1.h.1 and 1.h.2. $k_{ads}$ was not varied in the experiment, because an effect in $k_{ads}$ should show up in $k_{surf}$, making it difficult to separate the two numbers.

TABLE 1.h.1

Sensitivity coefficients for sensitivity of the slope (on a semilog plot) to each parameter in the system at different temperatures and oxygen pressures.

| Parameter | Sensitivity Coefficients for 1 × 10⁻⁴ Torr | | Sensitivity Coefficients for 1 × 10⁻⁶ Torr | |
| --- | --- | --- | --- | --- |
| | 650° C. | 750° C. | 650° C. | 750° C. |
| $E_7$ | 1.98 × 10⁻³ | 3.01 × 10⁻³ | 2.42 × 10⁻³ | 2.45 × 10⁻³ |
| $E_{ads}$ | 1.16 | 0.525 | 1.48 | 0.812 |
| $E_{diff, Oi}$ | 1.80 | 4.12 | 1.80 | 2.66 |
| $E_{diff, Ovac}$ | 8.16 × 10⁻⁴ | 2.14 × 10⁻⁴ | 1.23 × 10⁻³ | 9.85 × 10⁻⁵ |
| $E_{ex}$ | 8.81 × 10⁻⁵ | 2.70 × 10⁻⁸ | 5.11 × 10⁻⁵ | 4.12 × 10⁻⁵ |
| $E_{surf}$ | 1.51 | 0.691 | 1.92 | 1.06 |
| $K_{diff, Oi}$ | 1.31 | 2.57 | 0.329 | 2.29 |
| $k_{diff, Ovac}$ | 1.62 × 10⁻³ | 2.11 × 10⁻³ | 2.52 × 10⁻⁴ | 6.35 × 10⁻⁴ |
| $k_{surf}$ | 16.6 | 2.66 | 19.8 | 3.37 |

The prefactors and activation energies for adsorption at the surface and then formation of interstitials at the surface, as well as the prefactors and activation energies for the diffusivity of oxygen interstitial diffusion are the most influential on the resultant lambda (or inverse of the slope). This indicates that lambda is related to the concentration of total species within the bulk as created at the surface. An interesting phenomenon occurs at lower temperatures. At these temperatures, the pre-factors become more influential than the activation energies on the value of lambda. In addition, at low temperatures the surface parameters become more influential than the diffusivity of oxygen interstitials. The sensitivity coefficients do not change appreciably with oxygen pressure.

TABLE 1.h.2

Sensitivity coefficients for sensitivity of the intercept (on a semilog plot) to each parameter in the system at different temperatures and oxygen pressures.

| Parameter | Sensitivity Coefficients for $1 \times 10^{-4}$ Torr | | Sensitivity Coefficients for $1 \times 10^{-6}$ Torr | |
|---|---|---|---|---|
| | 650° C. | 750° C. | 650° C. | 750° C. |
| $E_7$ | $2.58 \times 10^{-2}$ | $4.34 \times 10^{-3}$ | $1.72 \times 10^{-2}$ | $1.23 \times 10^{-2}$ |
| $E_{ads}$ | 12.7 | 2.02 | 9.53 | 3.67 |
| $E_{diff, Oi}$ | 27.1 | 1.38 | 13.5 | 2.80 |
| $E_{diff, Ovac}$ | $1.06 \times 10^{-2}$ | $1.88 \times 10^{-4}$ | $8.73 \times 10^{-3}$ | $5.61 \times 10^{-4}$ |
| $E_{ex}$ | $1.16 \times 10^{-3}$ | $2.49 \times 10^{-8}$ | $3.70 \times 10^{-4}$ | $1.82 \times 10^{-4}$ |
| $E_{surf}$ | 16.6 | 2.65 | 12.4 | 4.77 |
| $K_{diff, Oi}$ | 45.0 | 5.63 | 27.8 | 7.77 |
| $k_{diff, Ovac}$ | $1.88 \times 10^{-2}$ | $1.77 \times 10^{-3}$ | $1.78 \times 10^{-3}$ | $3.29 \times 10^{-3}$ |
| $k_{surf}$ | 196 | 29.9 | 138 | 48.8 |

The intercept (which is related to $K_{gen}$) was influenced most heavily by the pre-exponential factor of the interstitial creation step at the surface. In addition, the value for $K_{gen}$ was also influenced by the values for the pre-exponential factor and activation energy of oxygen interstitial diffusion as well as the activation energies of adsorption at the surface and injection into the bulk from the surface. Similarly to the slope, the intercept was affected more by pre-exponential factors at lower temperatures, and equally by pre-exponential factors and activation energies at higher temperatures. Not much difference was seen due to pressure.

Other Models.

In addition to the model for oxygen interstitial diffusion, two other mechanisms were explored for the diffusion of titanium dioxide. These mechanisms were developed from studying the possibilities for fast diffusion discussed in Example 1.g. The first mechanism involved oxygen interstitials combining with titanium vacancies and diffusing through the crystal as a single unit. The second mechanism involved titanium interstitials binding to oxygen interstitials and diffusing throughout the bulk as a dimer cluster.

The model for diffusion of oxygen interstitials/titanium vacancy pairs diffusing as a cluster was similar in many respects to the model for oxygen interstitials, with a few key differences. First of all, titanium defects needed to be included in the model. It became necessary to include the formation reactions for titanium interstitials and vacancies, as well as their diffusivities. In addition, a reaction for the formation of the complex was added to the model. Finally, the diffusion of this complex needed to be incorporated into the model. All of the reactions included in the model are shown below:

  (EQ 1.h.21)

  (EQ 1.h.22)

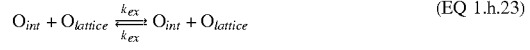  (EQ 1.h.23)

  (EQ 1.h.24)

Rate constants dominated by diffusion are:

$$k_{15} = 4\pi D_{O_{int}} a_O \quad \text{(EQ 1.h.25)}$$

$$k_8 = 4\pi D_{O_{vac}} a_O \quad \text{(EQ 1.h.26)}$$

$$k_2 = 4\pi D_{Ti_{vac}} a_{Ti} \quad \text{(EQ 1.h.27)}$$

where a is the capture radius ($a_{Ti}$=2.95 e$^{-8}$ m, $a_O$=2.78e$^{-8}$ m.)
The rate constants defined by kinetics are $$k_1 = A\exp\left(\frac{-E_1}{kT}\right) \quad \text{(EQ 1.h.28)}$$

$$k_7 = A\exp\left(\frac{-E_7}{kT}\right) \quad \text{(EQ 1.h.29)}$$

$$k_{ex} = A\exp\left(\frac{-E_{ex}}{kT}\right) \quad \text{(EQ 1.h.30)}$$

The total reaction rates for each species are then:

$$G_{O_{lattice}} = -k_7 C_{O_{lattice}} + \quad \text{(EQ 1.h.31)}$$
$$k_8 C_{O_{int}} C_{O_{vac}} - / + k_{ex} C_{O_{int}^{18}} C_{O_{lattice}} + / - k_{ex} C_{O_{lattice}^{18}} C_{O_{lint}}$$

$$G_{O_{int}} = k_7 C_{O_{lattice}} - k_8 C_{O_{int}} C_{O_{vac}} - / + k_{ex} C_{O_{int}^{18}} \quad \text{(EQ 1.h.32)}$$
$$C_{O_{lattice}} + / - k_{ex} C_{O_{lattice}^{18}} C_{O_{int}} - k_{15} C_{O_{int}} C_{Ti_{vac}}$$

$$G_{O_{vac}} = k_7 C_{O_{lattice}} - k_8 C_{O_{int}} C_{O_{vac}} \quad \text{(EQ 1.h.33)}$$

$$G_{Ti_{vac}} = k_1 C_{Ti_{lattice}} - k_2 C_{Ti_{int}} C_{Ti_{vac}} - k_{15} C_{O_{int}} C_{Ti_{vac}} \quad \text{(EQ 1.h.34)}$$

$$G_{Ti_{vac}O_i} = k_{15} C_{O_{int}} C_{Ti_{vac}} \quad \text{(EQ 1.h.35)}$$

$$G_{Ti_{int}} = k_1 C_{Ti_{lattice}} - k_2 C_{Ti_{int}} C_{Ti_{vac}} \quad \text{(EQ 1.h.36)}$$

$$G_{Ti_{lattice}} = -k_1 C_{Ti_{lattice}} - k_2 C_{Ti_{int}} C_{Ti_{vac}} \quad \text{(EQ 1.h.37)}$$

The value used for the diffusion coefficient of the mobile species was the experimentally determined effective diffusivity, as it was the best estimate available.

Similarly to the titanium vacancy/oxygen interstitial model, the oxygen interstitial/titanium interstitial model required the incorporation of titanium atoms into the model. It also required a diffusivity for the dimer cluster and a formation rate for this cluster. The included reactions are:

  (EQ 1.h.38)

  (EQ 1.h.39)

-continued $$O_{int} + O_{lattice} \underset{k_{ex}}{\overset{k_{ex}}{\rightleftharpoons}} O_{int} + O_{lattice} \quad (EQ\ 1.h.40)$$

$$O_{lattice} \underset{k_8}{\overset{k_7}{\rightleftharpoons}} O_{int} + O_{vac} \quad (EQ\ 1.h.41)$$

Rate constants dominated by diffusion are:

$$k_{16} = 4\pi D_{O_{int}} a_O \quad (EQ\ 1.h.42)$$

$$k_8 = 4\pi D_{O_{vac}} a_O \quad (EQ\ 1.h.43)$$

$$k_2 = 4\pi D_{Ti_{vac}} a_{Ti} \quad (EQ\ 1.h.44)$$

The rate constants defined by kinetics are the same as in the titanium vacancy/oxygen interstitial model. The total reaction rates for each species become:

$$G_{O_{lattice}} = -k_7 C_{O_{lattice}} + \quad (EQ\ 1.h.45)$$
$$k_8 C_{O_{int}} C_{O_{vac}} - /+k_{ex} C_{O_{int}^{18}} C_{O_{lattice}} + /-k_{ex} C_{O_{lattice}^{18}} C_{O_{int}}$$

$$G_{Ti_{vac}} = k_1 C_{Ti_{lattice}} - k_2 C_{Ti_{int}} C_{Ti_{vac}} \quad (EQ\ 1.h.46)$$

$$G_{O_{vac}} = k_7 C_{O_{lattice}} - k_8 C_{O_{int}} C_{O_{vac}} \quad (EQ\ 1.h.47)$$

$$G_{Ti_{int}O_{int}} = k_{16} C_{O_{int}} C_{Ti_{int}} \quad (EQ\ 1.h.48)$$

$$G_{Ti_{lattice}} = -k_1 C_{Ti_{lattice}} + k_2 C_{Ti_{int}} C_{Ti_{vac}} \quad (EQ\ 1.h.49)$$

$$G_{Ti_{int}} = k_1 C_{Ti_{lattice}} - k_2 C_{Ti_{int}} C_{Ti_{vac}} - k_{16} C_{O_{int}} C_{Ti_{int}} \quad (EQ\ 1.h.50)$$

Once again the diffusivity from experiments was used as a starting point for the diffusivity of the mobile species.

Parameter sensitivity analysis on the two dimer models was conducted. In all cases, the models were sensitive to the same parameters (the surface adsorption energy, formation energy of an interstitial at the surface, and the diffusivity of oxygen interstitials.) In addition, the resultant $^{18}O$ profiles from the dimer models were compared to the interstitial model. In all of the models, the resultant profiles were the same. Upon closer analysis of the defect concentrations, it was observed that there was not a significant concentration of the dimer clusters being formed, because the formation activation energies for titanium defects were larger than for the oxygen defects. Based on these computations, there is no reason to believe that oxygen would prefer to diffuse throughout the bulk with a titanium defect. The preferred mechanism appears to be oxygen interstitial diffusion.

Parameter Estimation Method.

In order to estimate the parameters, a rigorous mathematical method similar to the one used by Rusli et al. [5] was employed. First, the model outputs were optimized based on the activation energies for adsorption, defect creation at the surface, and diffusivity of oxygen interstitials. Initial guesses for the most sensitive parameters were determined. These parameters were varied up and down. Model outputs were generated for each set of conditions at each combination of these three parameters for every temperature and pressure that an experiment was performed at. The error was then found between the model output and each experiment. A contour plot allowed the minimum sum of square errors to be easily identified. The minimum parameters were selected as the next set of parameters, which were varied up and down again. Cycles were continued until the error did not vary significantly. After the computations converged on a parameter for each of these iterations, the iterations were repeated again to find the optimum values for $k_{surf}$ and $k_{O,diff}$. Finally, these parameters were used to insure that the best values for the activation energies were still valid.

In order to calculate the computational error, the amount of experimental error was factored into the estimate. For each sample, three different SIMS depth profiles at different locations on the surface were employed. The normalized error between these profiles was first calculated using the relationship:

$$\sigma^2 = \frac{1}{N-1} \frac{\sum_{K=1}^{N}(C_K - C_{mean})^2}{\sum_{K=1}^{N}(C_{mean})^2} \quad (EQ\ 1.h.51)$$

The error for each data point K was plotted versus depth x. From the plot, experiments with similar error were grouped together. $C_k$ is the concentration of data point k, n is the number of experiments, and $C_{mean}$ is the average concentration. The error ($\sigma^2$) for these experiments as a group was then calculated using the equation:

$$\sigma^2 = \frac{1}{K-1} \frac{\sum_{k=1}^{K}(C_k - C_{mean})^2}{\sum_{k=1}^{K}(C_{mean})^2} \quad (EQ\ 1.h.52)$$

The error for each group was calculated as a function of x.

Computations were conducted for each set of temperature and pressure conditions using parameters for $E_{surf}$ and $E_{O,diff}$ that were previously optimized. In addition, computations were done for parameters that were 10% more, 5% more, 5% less and 10% less than the previously optimized parameters. Next, the error for the total system was calculated for each of the parameters. This was done using the equation shown below, where the standard deviation is a function of x that is different for different sets of experiments.

$$WSSE = \sum_{K=1}^{N_k^{npm}} \sum_{x}^{N_k^x} \frac{1}{\sigma_{expt}^2}(C_{expt,K} - C_{model})^2 \quad (EQ\ 1.h.53)$$

Figure 48:
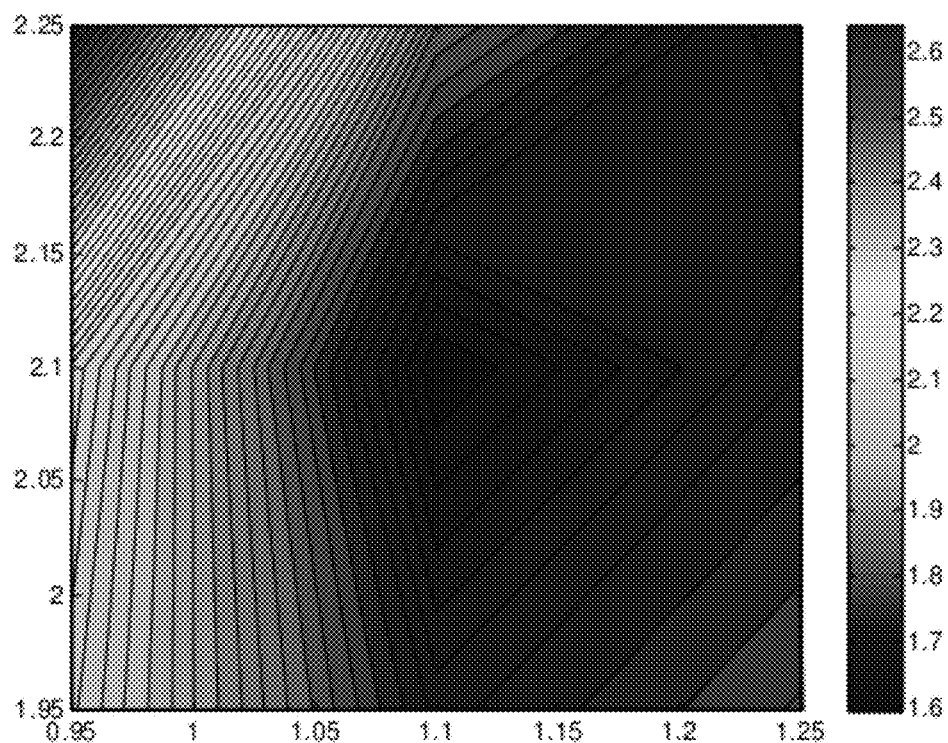
FIG. 48 provides an example contour plot for error fitting of Example 1.h.

The errors for each combination of parameters were plotted on a contour plot. FIG. 48 shows a sample contour plot. From the plot, one was able to find where the least amount of error was present. The combination of values with the least amount of total error was then chosen, and a cycle was repeated with a change in the parameters of +/−0.1 eV around this area to confirm the most accurate parameters, to make sure the point was not just a local minimum.

Uncertainty values were calculated using a method described in the literature [5]. This method involved linearizing the model with respect to the varied parameters. The value for uncertainty ends up being:

$$\Delta x = t_{1-x/2}(n_d - N_x)\sqrt{V_{x,ii}} \quad (EQ\ 1.h.54)$$

Where $\Delta x$ is the uncertainty in parameter x, $t_{1-x/2}(n_d-N_x)$ is the t-statistic value for the $n_d$ data points, and $N_x$ parameters.

$V_{x,ii}$ is the value for the covariance of the i,ith element in the covariance matrix. A Matlab code was used to calculate the uncertainty.

Results.

Figure 49:
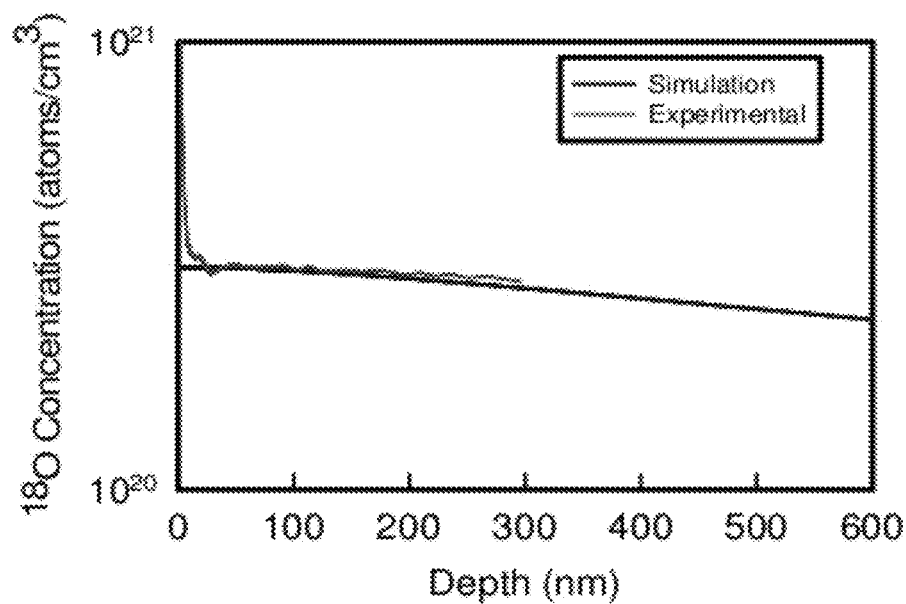
FIG. 49 provides a plot showing a comparison of sample experimental profile (top trace) to computational profile (bottom trace). This is a sample at $5\times10^{-6}$ Torr of oxygen, annealed for 90 minutes at 750° C.

FIG. 49 shows an example of the resultant fit for profiles using the optimized parameters. Results of the values for each parameter are shown in Table 1.h.3.

TABLE 1.h.3

Resultant values for parameters in model with clean surface.

| Parameter | Value |
|---|---|
| $k_{Oi,\,diff}$ | $6.13 \times 10^{-4\pm 0.77}$ atoms/cm² |
| $E_{Oi,\,diff}$ | $0.8 \pm 0.16$ eV |
| $k_{surf}$ | $1 \times 10^{14\pm 1.6}$ |
| $E_{surf}$ | $2.25 \pm 0.13$ eV |
| $E_{ads}$ | $0.4 \pm 0.18$ eV |

The diffusivity values for the diffusion of an oxygen interstitial were indeed very low as was predicted by the fast moving intermediate model. Hossain et al. reported a dissociative adsorption enthalpy (Eads) for diatomic oxygen of 1.3 eV on rutile (110) [3]. The value here was much lower, but could be a result of the high-coverage conditions of the study. Enthalpies of adsorption often decrease with increasing coverage.

Conclusion.

A model has been developed that fits the experiments well. Modeling has allowed the estimation of values for oxygen interstitial diffusivity, which has never before been reported for these conditions. In addition, a value for the adsorption energy has been determined. A kinetic rate constant for the formation of an interstitial from an atom on the surface has been measured for the first time. The activation energy for this step of 2.25 eV is on the low side of the range of formation energies typically reported for bulk defect formation (Example 1.i). However, a relatively low value is consistent with defect formation bring easier at a surface than within the bulk because fewer bonds typically require disruption for the surface formation mechanism.

References for Example 1.h:
1. M. Law and A. Taasch.
2. J. V. Beck and K. J. Arnold, Parameter estimation in engineering and science. (Wiley, New York, 1977).
3. F. M. Houssain, G. E. Murch, L. Sheppard and J. Nowotny, Advances in Applied Ceramics 106, 95-100 (2007).
4. R. Gunawan, M. Y. L. Jung, R. D. Braatz and E. G. Seebauer, Journal of the Electrochemical Society 150, G758 (2003).
5. E. Rusli, F. Xue, T. Drews, P. Vereecken, P. Andricacos, H. Deligianni, R. D. Braatz and R. Alkire, Journal of the Electrochemical Society 154, D584-D597 (2007).

1.i: Defect Parameter Estimation

Introduction.

In order to understand how defect concentrations have been modified, it is necessary to understand what the concentration of each defect should be at equilibrium. Equilibrium concentrations of defects were derived from a variety of literature sources. In addition to determining values for the equilibrium concentrations of defects, it is necessary to determine values for the diffusivities of each defect. Due to the scatter in the parameter values from the literature, the values were chosen by employing Maximum Likelihood estimation. Also, there were some parameters which had not been reported in the literature, and estimates for these values required estimation through educated approximations.

Maximum Likelihood (ML) Estimation Overview.

The ML estimation method [1-2] weights each value from the literature according to its uncertainty, forming a new "average" value that is based more heavily on the values that have less reported error. Maximum likelihood estimation allows one to estimate the most likely value for a parameter, $\bar{y}$, by minimizing the objective function, $\phi$, in the equation [1]:

$$\Phi = \sum_i w_i(y_i - \bar{y})^2 \quad \text{(EQ 1.i.1)}$$

In the above equation, $y_i$ represents the parameter from a given paper i. $w_i$ is the weight of the paper's value, based on the standard deviation, $\sigma_i^1$:

$$w_i = \frac{1}{\sigma_i^2} \quad \text{(EQ 1.i.2)}$$

The analytical solution to solve for the most likely parameter is:

$$\bar{y} = \frac{\sum_i w_i y_i}{\sum_i w_i} \quad \text{(EQ 1.i.3)}$$

The error on the maximum likelihood parameter is estimated from:

$$\sigma_{ML}^2 = \frac{1}{\sum_i w_i} \quad \text{(EQ 1.i.4)}$$

Equilibrium Concentrations.

The defect concentrations for the defects at thermal equilibrium were estimated based on their equilibrium values for defect disorder. Literature frequently cites [3] the following reactions as being responsible for the equilibrium concentrations of defects shown below in Kroeger-Vink notation, where n and p represent the concentrations of electrons and holes, respectively:

(EQ 1.i.5)

(EQ 1.i.6)

(EQ 1.i.7)

(EQ 1.i.8)

(EQ 1.i.9)

Frenkel and Schottky equations shown below, 1.i.10 and 1.i.11 respectively, for the formation of titanium vacancies are also frequently cited.

(EQ 1.i.10)

(EQ 1.i.11)

In addition to the aforementioned equilibrium relations, this Example adds a relationship to explain the equilibrium concentration of oxygen interstitials. This relation is similar the relation proposed for oxygen interstitial formation at the surface in $ZnO_4$. x represents the unknown charge state for oxygen interstitials.

$$\tfrac{1}{2}O_2 \leftrightarrow O_i^{x'} + xh^+ \quad \text{(EQ 1.i.12)}$$

The above equilibrium equations can be described by the following equilibrium constants:

$$K_1 = [V_O^{2+}]n^2 P(O_2)^{1/2} \quad \text{(EQ 1.i.13)}$$

$$K_2 = [Ti_i^{3+}]n^3 P(O_2) \quad \text{(EQ 1.i.14)}$$

$$K_3 = [Ti_i^{4+}]n^4 P(O_2) \quad \text{(EQ 1.i.15)}$$

$$K_i = np \quad \text{(EQ 1.i.16)}$$

$$K_S = [V_O^{2+}]^2 [V_{Ti}''''] \quad \text{(EQ 1.i.17)}$$

$$K_P = [Ti_i^{4+}][V_{Ti}''''] \quad \text{(EQ 1.i.18)}$$

$$K_4 = [V_{Ti}'''']n^{-4} P(O_2)^{-1} \quad \text{(EQ 1.i.19)}$$

$$K_5 = [O_i^{x'}]n^{-x} p(O_2)^{-1/2} \quad \text{(EQ 1.i.20)}$$

If these equilibrium equations are known, one can solve for the concentration of each defect using the equations:

$$[V_O^{2+}] = K_1 n^{-2} p(O_2)^{-1/2} \quad \text{(EQ 1.i.21)}$$

$$[Ti_i^{3+}] = K_1 n^{-3} p(O_2)^{-3} \quad \text{(EQ 1.i.22)}$$

$$[Ti_i^{4+}] = K_3 n^{-4} p(O_2)^{-3} \quad \text{(EQ 1.i.23)}$$

$$[V_{Ti}''''] = K_3 K_1^{-2} n^4 p(O_2) = K_4 K_3^{-1} n^4 p(O_2) = K_4 n^4 p(O_2) \quad \text{(EQ 1.i.24)}$$

$$[O_i^{x'}] = K_4 n^x p(O_2) \quad \text{(EQ 1.i.25)}$$

In order to solve for equilibrium conditions at a given temperature and oxygen partial pressure, the values for the equilibrium constants as well as for the concentration of electrons must be known. Values for the equilibrium constants are discussed later in this Example. As the concentration of electrons is unknown, another relationship is needed to solve the problem. In order to satisfy the overall charge neutrality requirement the following relationship is used:

$$2[V_O^{2+}] + 3[Ti_i^{3+}] + 4[Ti_i^{4+}] + p = n + 4[V_{Ti}''''] + x[O_i^{x'}] \quad \text{(EQ 1.i.26)}$$

If all of the values for the equilibrium constants were known, it would be possible to use equations 1.i.20-1.i.26 to solve for n. As the value for x is unknown, and oxygen interstitials are believed to be present in smaller quantities than the other defects, the oxygen interstitial term was dropped from the charge balance for the purposes of calculating equilibrium concentrations. There was some debate in the literature [5-6] as to whether Schottky or Frenkel defects dominate, however each of these would be a combination of equations from 1.i.20-1.i.26.

Equilibrium constants are used to compare equations 1.i.20-1.i.26 to solve for the concentrations of electrons, oxygen vacancies, and titanium interstitials at each temperature and oxygen pressure.

Values for the activation energy and pre-exponential factors of $K_i$ were reported by Bak et al., Yahia et al., and Baumard et al. [7-9] and are reported in Table 1.i.1. All three of these papers used a conductivity-based method to find the values for $K_i$. No error was reported by either Yahia or Baumard. In order to come up with a logical uncertainty estimate for these papers, it was assumed that the error was the same percent of the total value as in Bak et al., as similar experimental methods were used. Using the literature values, a maximum likelihood estimation for the values was calculated to be:

$$K_i = \exp\left(\frac{\Delta S}{k}\right)\exp\left(\frac{-\Delta H}{kT}\right) = 4.74 \times 10^7 \exp\left(\frac{-2.80}{kT}\right) \quad \text{(EQ 1.i.27)}$$

TABLE 1.i.1

Entropies and enthalpies for equilibrium constant, $K_i$

| Paper | Entropy (eV/K) | Enthalpy (eV) |
|---|---|---|
| Bak. et al.[7] | 0.00374 | 3.039 ± 0.053 |
| Yahia et al.[8] | 0.00051 | 2.401 ± 0.042 |
| Baumard et al.[9] | 0.000319 | 3.253 ± 0.057 |
| MLE Value | 0.0015 | 2.799 ± 0.028 |

Values for the activation energy and prefactors of $K_1$ were reported by Kofstad, Marucco et al., Sawatari et al., and Forland [10-13], and are reported in Table 1.i.2. Kofstad, Marucco, and Forland all used thermogravimetric measurements to calculate their equilibrium constants. Forland did not calculate a pre-exponential factor, so none is included in the resultant average value. Sawatari et al. used a computational model and also did not include a pre-exponential factor. In addition to these references, papers by Cho et al., Li et al., He et al., Kieth et al., and Peng et al. [14-18], calculated formation energies for oxygen vacancies, which can be converted into equilibrium enthalpies of formation. All of these papers were DFT computational papers, whose error was stated in the paper. Li et al. calculated the formation energies for a variety of temperatures, oxygen pressures and Fermi energies [17]. Li's value for 300 K, $10^{-8}$ atm $O_2$ and at the maximum Fermi energy allowed by the charge neutrality condition was closest to the experimental conditions in this Example. He et al. and Peng et al. both did the experiments in oxygen rich and titanium rich titanium dioxide [14, 16]. Their values for the titanium rich titanium dioxide, at the conduction band minima were utilized. Cho et al. [18] did not cite an uncertainty value so this was estimated based on the error from Li et al. Using these values, a maximum likelihood estimation for the values was calculated to be:

$$K_1 = 526.73 \exp\left(\frac{-4.39}{kT}\right) \quad \text{(EQ 1.i.28)}$$

TABLE 1.i.2

Entropies and enthalpies for equilibrium constant, $K_1$

| Paper | Entropy (eV/K) | Enthalpy (eV) |
|---|---|---|
| Kofstad[13] | 0.0000517 | 4.56 ± 0.77 |
| Marucco et al.[19] | 0.0000491 | 4.58 ± 0.15 |
| Sawatari et al[11] | n/a | 10.1 ± 1.22 |
| Forland[10] | n/a | 4.79 ± 0.22 |
| Cho et al.[18] | n/a | 4.44 ± 0.28 |
| Li et al.[17] | n/a | 2.7 ± 0.8 |
| He et al.[14] | n/a | 4.1 ± 2.1 |
| Keith et al.[15] | n/a | 4.25 ± 0.15 |
| Peng et al.[16] | n/a | 2.5 ± 0.4 |
| MLE Value | 0.00054 | 4.39 ± 0.087 |

Values for the activation energy and prefactors of $K_2$ were reported by Kofstad and Blumenthal et al. [13,20] and are reported in Table 1.i.3. Kofstad used thermogravimetric methods to calculate the value [13]. Blumenthal used a method based on conductivity of the material [20]. Blumenthal did not report error, but it was possible to calculate the error from the plots. Also, Blumenthal did not give a value for the pre-exponential factor, so Kofstad's value was used in the final value. He et al. used DFT calculations to arrive at an estimate for the formation energy of titanium interstitials with the 3+ charge state [14]. He's data are included, with an error based on other DFT papers for other titanium dioxide defects. Using these values, a maximum likelihood estimation for the values was calculated to be:

$$K_2 = 9.30 \times 10^9 \exp\left(\frac{-8.77}{kT}\right) \tag{EQ 1.i.29}$$

TABLE 1.i.3

Entropies and enthalpies for equilibrium constant, $K_2$

| Paper | Entropy (eV/K) | Enthalpy (eV) |
|---|---|---|
| Kofstad[14] | 0.001978 | 9.12 ± 1.24 |
| Blumenthal et al.[20] | n/a | 9.24 ± 0.32 |
| He et al.[14] | n/a | 5.64 ± 0.8 |
| MLE Value | 0.001978 | 8.77 ± 0.29 |

Values for the activation energy and pre-factors of $K_3$ were reported by Kofstad, Marucco et al., Blumenthal et al., and Sawatari et al. [13,20] and are reported in Table 1.i.4. Kofstad and Marucco et al. used thermogravimetric methods to calculate the equilibrium constants, while Blumenthal used conductivity measurements [11, 13, 19-20]. Sawatari et al. used a computational model, and calculated the equilibrium constant using multiple cell sizes [11]. The error was computed using the standard deviation between these different models. Li et al. and Peng et al. also reported formation energies for titanium interstitials in the 4+ charge state using DFT calculations [16-17]. The methods were the same as for earlier discussed defects. Using these values, a maximum likelihood estimation for the values was calculated to be:

$$K_3 = 9.71 \times 10^{11} \exp\left(\frac{-7.30}{kT}\right) \tag{EQ 1.i.30}$$

TABLE 1.i.4

Entropies and enthalpies for equilibrium constant, $K_3$

| Paper | Entropy (eV/K) | Enthalpy (eV) |
|---|---|---|
| Kofstad[13] | 0.00247 | 10.64 ± 1.44 |
| Marucco et al.[19] | 0.00229 | 10.13 ± 0.39 |
| Blumenthal et al.[20] | n/a | 10.67 ± 0.45 |
| Sawatari et al[11] | n/a | 12.1 ± 1.46 |
| Li et al.[17] | n/a | 3.5 ± 0.8 |
| Peng et al.[18] | n/a | 4.8 ± 0.4 |
| MLE Value | 0.00238 | 7.30 ± 0.27 |

Literature does not cite the equilibrium constant, $K_5$, however two reports of the formation energy for oxygen interstitials calculated through DFT calculations exist [14, 16] and are shown, with the MLE value, in Table 1.i.5. Peng et al. and He et al. both calculated the formation of oxygen interstitials both in reduced $TiO_{2-x}$ and oxygen rich $TiO_2$. Their reduced values were used, as these were the closest to the experimental conditions in this Example. Neither of these reports gave a pre-exponential factor. Because of this, a guess was needed, and the number of available sites was used as a prefactor. The resultant equilibrium concentration for $K_5$ is:

$$K_5 = 6.00 \times 10^{-4} \exp\left(\frac{-2.55}{kT}\right) \tag{EQ 1.i.31}$$

TABLE 1.i.5

Entropies and enthalpies for equilibrium constant, $K_5$

| Paper | Entropy (eV/K) | Enthalpy (eV) |
|---|---|---|
| He et al.[14] | n/a | 4.10 ± 2.17 |
| Peng et al.[16] | n/a | 2.5 ± 0.4 |
| MLE Value | n/a | 2.55 ± 0.39 |

Until recently, titanium vacancies were not studied much in the literature. Recent work by Bak et al. [3] has shown that titanium vacancies play an important role in titanium dioxide, however they diffuse so slowly that they do not truly reach an equilibrium in the bulk until the sample has been annealed at high temperatures over a period of ~2000 hours. This equilibrium was not reached in these experiments, however they reached quasi-equilibrium. $K_4$ was reported by Bak et al. using conductivity experiments [3] for the quasi-equilibrium regime. In addition, three papers conducted DFT calculations to compute the equilibrium constant for titanium vacancies [14, 16-17]. These papers do not look at the individual regimes, however their uncertainty is also very large compared to Bak et al's, so they do not affect the resultant equilibrium constant significantly. The MLE value for the equilibrium constant and the individual values are shown below and in Table 1.i.6.

$$K_4 = 2.75 \times 10^{-11} \exp\left(\frac{-3.57}{kT}\right) \tag{EQ 1.i.32}$$

TABLE 1.i.6

Entropies and enthalpies for equilibrium constant, $K_4$

| Paper | Entropy (eV/K) | Enthalpy (eV) |
|---|---|---|
| Bak et al.[3] | -0.0021 | 3.67 ± 0.053 |
| Li et al.[17] | n/a | 0 ± 0.8 |
| He et al.[14] | n/a | 2.66 ± 2.03 |
| Peng et al.[16] | n/a | -1.5 ± 0.4 |
| MLE Value | n/a | 3.57 ± 0.05 |

In its natural state, titanium dioxide is reduced in oxygen. The reduction level in oxygen is normally designated by x in the formula $TiO_{2-x}$. Using the equilibrium concentrations of defects it was possible to calculate x for various temperatures and oxygen pressures using the relation:

$$x = \frac{[V_O^{2+}] - [O_i^x] + 2([Ti_i^{3+}] + [Ti_i^{4+}] - [V_{Ti}'''])}{1 + [Ti_i^{3+}] + [Ti_i^{4+}] - [V_{Ti}''']} \tag{EQ 1.i.33}$$

Figure 50:
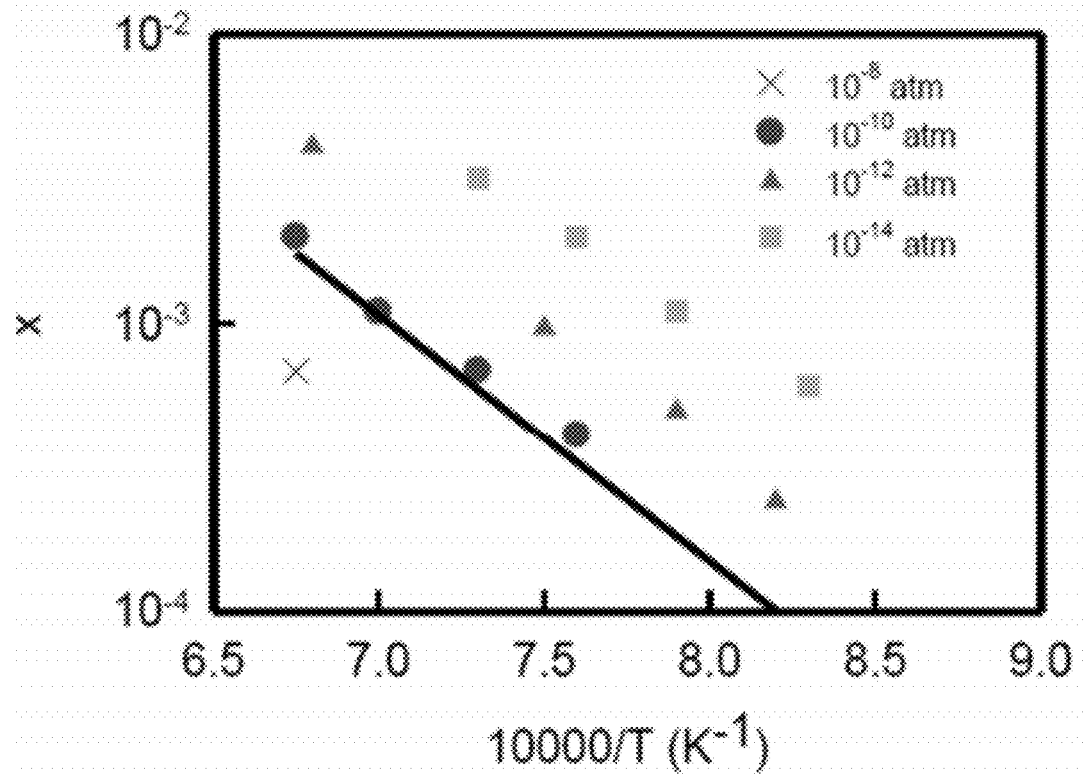
FIG. 50 provides a plot of x as a function of temperature. Symbols are all from the literature, and the solid line is from this data set. X's are $10^{-8}$ atm data, filled circles are $10^{-10}$ atm data, filled triangles are $10^{-12}$ atm data, and filled squares are $10^{-14}$ atm data.

The results are shown with a comparison to literature values in FIG. 50.

Diffusivities of Defects.

Figure 51:
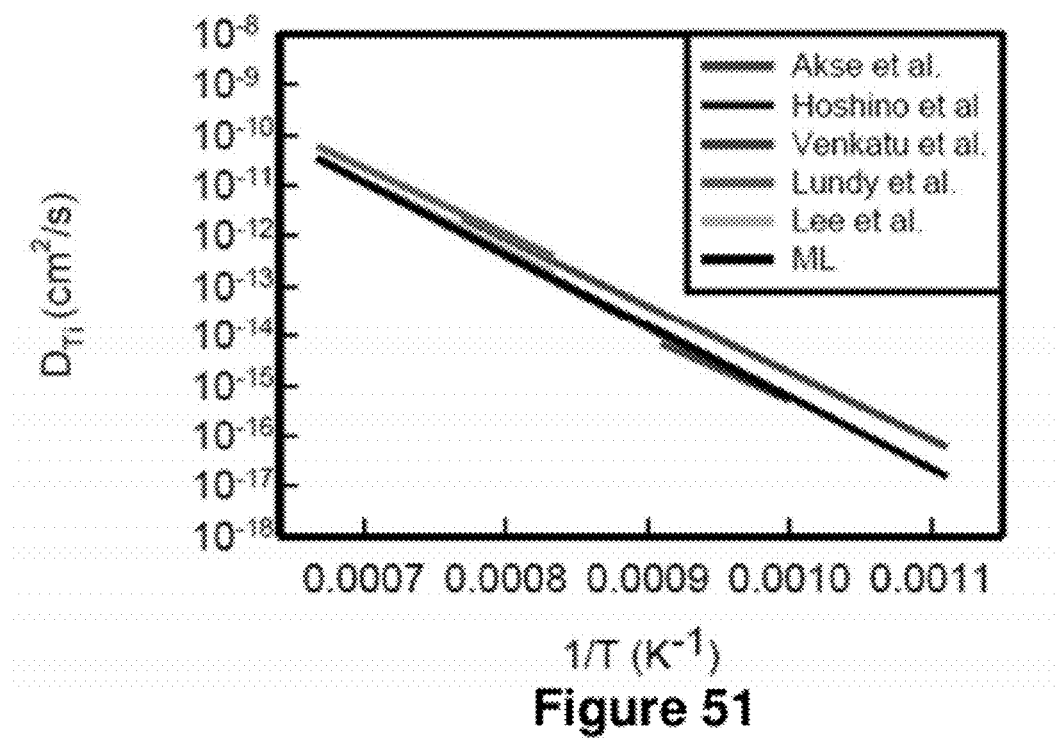
FIG. 51 provides a plot of literature values for the diffusivity of titanium in $TiO_2$. Black line indicates the calculated maximum likelihood value.

In order to understand how titanium diffuses in titanium dioxide, it was necessary to create an estimate for the diffusivity of titanium interstitials and for the diffusivity of titanium vacancies. Literature agrees that the primary means of titanium diffusion in titanium dioxide is via interstitial, but there is some debate in the literature as to which charge state(s) primarily contribute to this diffusion under which conditions. The charge state factors into the pressure dependence of overall Ti diffusion. Values for the diffusivity of titanium in $TiO_2$ are shown in Table 1.i.7 and in FIG. 51. Akse et al., Hoshino et al., Venkatu et al., and Lundy et al. all used the radioactive isotope (44) Ti as a tracer for their experiments [21-24]. Akse et al. did their diffusion experiments along two directions [21], but only the value for the c direction was used, as that was the direction of diffusion occurring in these experiments. Also, Akse's pre-exponential factor was determined from the plots, not reported directly. Lee et al. and Ait-Younes et al. used conductivity measurements to arrive at their values for the diffusion of titanium in titanium dioxide [25-26].

The dependence on oxygen partial pressure is designated by the n in $P_o^{-1/n}$. Maximum Likelihood estimations were derived for the diffusivity to be:

$$D_{Ti} = 10^{0.58 \pm 0.078} P_O^{-1/4.77 \pm 0.055} \exp\left(\frac{-2.84 \pm 0.022}{kT}\right) \quad (EQ\ 1.i.34)$$

TABLE 1.i.7

Titanium tracer diffusivities

| Paper | Pre-exponential Factor | n | Activation Energy (eV) |
|---|---|---|---|
| Akse et al.[21] | 0.0021 | 4.87 ± 0.058 | 2.48 ± 0.12 |
| Venkatu et al.[22] | 0.064 | n/a | 2.66 ± 0.16 |
| Lundy et al.[24] | 0.046 | n/a | 2.6 ± 0.13 |
| Lee et al.[25] | 0.0625 | n/a | 2.72 ± 0.18 |
| Hoshino et al.[23] | 6.50 | 4.16 ± 0.41 | 2.87 ± 0.024 |
| Ait-Younes et al.[26] | n/a | 3.7 ± 0.2 | n/a |
| MLE Value | 3.76 | 4.77 ± 0.055 | 2.84 ± 0.022 |

Titanium vacancies are not discussed much in the literature, and there are no data on their diffusivity. For the purposes of this study, Ti vacancies were modeled as essentially non-mobile, and hence a diffusivity value for them was not derived. This seemed logical, due to the fact that Ti vacancies take around 2000 hours at 1323K to reach equilibrium in a sample 1 mm thick [27]. (For reference, it takes about one half hour to reach an equilibrium for the other defects at the same temperature for the same sample [27].)

Figure 52:
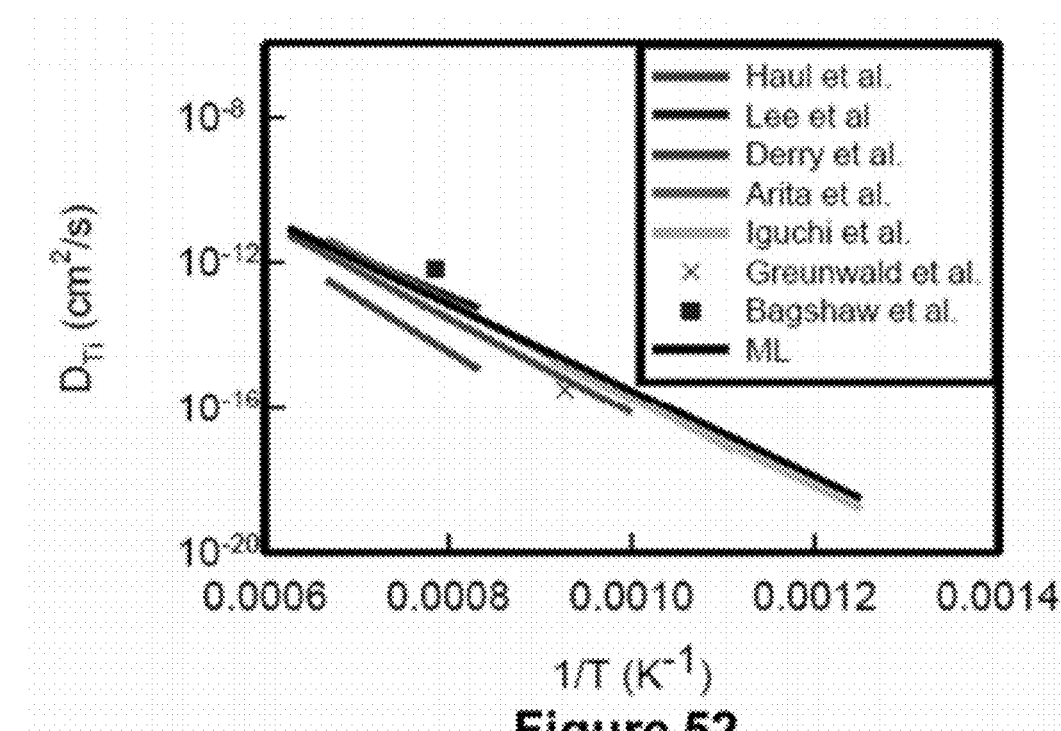
FIG. 52 provides a plot of additional literature values for the diffusivity of oxygen in $TiO_2$. Black line indicates the calculated maximum likelihood value.

In past literature reports at these conditions, all oxygen diffusion was mediated via vacancy diffusion. For this reason, the oxygen tracer diffusivity acts as an estimate for the oxygen vacancy diffusivity. When oxygen vacancy diffusion is mediated by vacancy diffusion, it has a negative pressure dependence described by n in $P_o^{-1/n}$. Oxygen diffusion was studied by using an (18) O tracer by Millot et al., Haul et al., Derry et al., Arita et al., Bagshaw et al., and Greunwald et al. [28-33]. Greunwald et al. and Bagshaw et al. only found the diffusivity at one point, and not as a function of temperature or pressure. Their data is not included in the ML estimation for this reason; however their data is shown in FIG. 52. Millot et al. used a polycrystalline sample, for which only 4% of the diffusion was occurring in the c direction [28]. Millot's research was used to calculate n, however, as no other papers were able to determine n over their data range. All of the other papers listed above were in the c direction. In addition to the tracer studies, Lee et al. and Iguchi et al. did experiments using conductivity to measure the diffusivity [25, 34]. Lee et al's paper, measured their diffusivity perpendicular to the c axis, which could account for their activation energy being lower than the other papers. The literature values are shown in Table 1.i.8 and FIG. 52. The MLE value for oxygen diffusivity is:

$$D_O = 10^{-3.33 \pm 0.37} P_O^{-1/8.11 \pm 0.36} \exp\left(\frac{-2.37 \pm 0.092}{kT}\right) \quad (EQ\ 1.i.35)$$

TABLE 1.i.8

Oxygen diffusivities

| Paper | Pre-exponential Factor | n | Activation Energy (eV) |
|---|---|---|---|
| Haul et al.[31] | 0.002 | n/a | 2.6 ± 0.65 |
| Derry et al.[29] | 0.0024 | n/a | 2.93 ± 0.52 |
| Arita et al.[32] | 0.034 | n/a | 2.6 ± 0.142 |
| Lee et al.[25] | 4.28 × 10⁻⁵ | n/a | 2.09 ± 0.14 |
| Iguchi et al.[34] | 0.006 | n/a | 2.4 ± 0.3 |
| Millot et al.[28] | n/a | 8.11 ± 0.36 | n/a |
| MLE Value | 4.73 × 10⁻⁴ | 8.11 ± 0.36 | 2.37 ± 0.092 |

Figure 53:
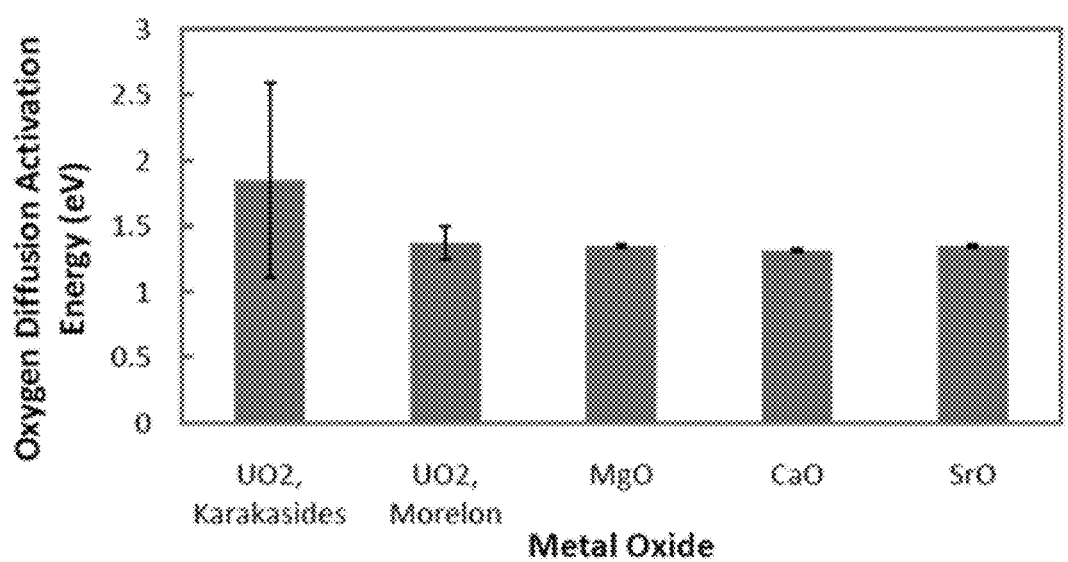
FIG. 53 provides a graph of literature values for the activation energy of diffusivity of oxygen interstitials in metal oxide semiconductors.

The value for the diffusivity of oxygen interstitials in $TiO_2$ was unknown prior to this study. In order to do initial studies a rough estimate for this value was used. For a starting value, the values for diffusion of oxygen interstitials in other metal oxides were compiled. The values for the activation energy of an O interstitial diffusing in $UO_2$ were studied in two papers. Morelon et al. uses a modification of the Moldy Code to do molecular dynamic simulations [35]. The 9.4% error reported for formation energies was used, due to a lack of a better error value. Karakasides et al. [36] used the Harwall CASCADE program to help calculate the values for diffusion activation energy. Karakasides found two values using this method based on the number of ions modeled, and so the deviation from these values was used as the uncertainty. Mackrodt et al. reported the oxygen interstitial diffusion activation energies for MgO, CaO, and SrO, using a HADES method [37]. Two values were given for CaO, so a deviation was calculated with the two values. Oxygen diffusion in MgO was only examined with one calculation, so the error from CaO was used. Diffusion in SrO was looked at with both methods, but the resultant value was the same, so instead the deviation calculated from CaO was used. FIG. 53 shows the reported oxygen interstitial diffusivities. Based on the above reports, the ML value for the diffusivity of an oxygen interstitial diffusing in a metal oxide values is 1.33 eV. An error of about 0.5 eV should be sufficient to cover most of the range.

Conclusion.

Maximum likelihood estimation has been used to derive most likely parameters for the diffusion of each defect type in titanium dioxide, by combining a vast number of values from the literature. In addition, this technique has been employed to derive values for the equilibrium constants for defect formation in titanium dioxide. Using these equilibrium constants, equilibrium concentrations have been found. These values prove useful when developing a model to describe overall oxygen diffusion in titanium dioxide, and are discussed in Examples herein.

References for Example 1.i:
1. J. V. Beck and K. J. Arnold, Parameter estimation in engineering and science. (Wiley, New York, 1977).
2. M. Y. L. Jung, R. Gunawan, R. D. Braatz and E. G. Seebauer, AlChE Journal 50 (12), 3248-3256 (2004).
3. T. Bak, J. Nowotny and M. K. Nowotny, The Journal of Physical Chemistry B 110 (43), 21560-21567 (2006).
4. A. C. S. Sabioni, Solid State Ionics 170, 145-148 (2004).
5. E. G. Seebauer and M. C. Kratzer, Mater. Sci. Eng. R 55 (3-6), 57-149 (2006).
6. S. Na-Phattalung, M. F. Smith, K. Kim, M.-H. Du, S.-H. Wei, S. B. Zhang and S. Limpijumnong, Physical Review B 73, 125205-125210 (2006).
7. T. Bak, J. Nowotny, M. Rekas and C. C. Sorrell, Journal of Physics and Chemistry of Solids 64 (7), 1057-1067 (2003).
8. J. Yahia, Physical Review 130 (5), 1711-1719 (1963).
9. J. F. Baumard and E. Tani, The Journal of Chemical Physics 67 (3), 857-860 (1977).
10. Forland, Acta Chemica Scandinavica 18 (5), 16-20 (1964).
11. H. Sawatari, E. Iguchi and R. J. D. Tilley, Journal of Physical Chemistry Solids 43, 1147 (1982).
12. J. G. Jean-Francis Marucco, Philippe Lemasson, Journal of Physical Chemistry Solids 42, 363-367 (1981).
13. P. Kofstad, Journal of Less-Common Metals 13, 635 (1967).
14. J. He, R. K. Behera, M. W. Finnis, X. Li, E. C. Dickey, S. R. Phillpot and S. B. Sinnott, Acta Materialia 55 (13), 4325-4337 (2007).
15. J. B. Keith, H. Wang, B. Fultz and J. P. Lewis, Journal of Physics Condensed Matter 20 (2) (2008).
16. H. Peng, Physics Letters, Section A: General, Atomic and Solid State Physics 372 (9), 1527-1530 (2008).
17. X. Li, M. W. Finnis, J. He, R. K. Behera, S. R. Phillpot, S. B. Sinnott and E. C. Dickey, Acta Materialia 57 (19), 5882-5891 (2009).
18. E. Cho, S. Han, H.-S. Ahn, K.-R. Lee, S. K. Kim and C. S. Hwang, Physical Review B 73, 193202-193205 (2006).
19. J.-F. Marucco, J. Gautron and P. Lemasson, Journal of Physical Chemistry Solids 42, 363-367 (1981).
20. R. N. Blumenthal, Coburn, J. Baukus and W. M. Hirthe, Journal of Physical Chemistry Solids 27, 643-654 (1966).
21. J. R. Akse and H. B. Whitehurst, Journal Physical Chemistry in Solids 39, 457-465 (1978).
22. D. A. Venkatu and L. E. Poteat, Material Science and Engineering 8, 258-262 (1970).
23. K. Hoshino, N. L. Peterson and C. L. Wiley, Journal of Physical Chemistry Solids 44 (12), 1397-1411 (1985).
24. T. S. Lundy and W. A. Coghlan, Journal de Physique Colloques 34, C9-299-C299-302 (1973).
25. D.-K. Lee and H.-I. Yoo, Solid State Ionics 177, 1-9 (2006).
26. N. Ait-Younes, F. Millot and P. Gerdanian, Solid State Ionics 12, 437-442 (1984).
27. T. Bak, M. K. Nowotny, L. R. Sheppard and J. Nowotny, The Journal of Physical Chemistry C 112 (34), 13248-13257 (2008).
28. F. Millot and C. Picard, Solid State Ionics 28-20, 1344-1348 (1988).
29. D. J. Derry, D. G. Lees and J. M. Calvert, Journal of Physics and Chemistry of Solids 42 (1), 57-64 (1981).
30. A. N. Bagshaw and B. G. Hyde, Journal of Physical Chemistry Solids 37, 835-838 (1976).
31. R. Haul and G. Dümbgen, Journal of Physics and Chemistry of Solids 26 (1), 1-10 (1965).
32. M. Arita, M. Hosoya, M. Kobayashi and M. Someno, Journal of the American Ceramic Society 62 (9-10), 443-446 (1979).
33. T. B. Gruenwald and G. Gordan, Journal of Inorganic Nuclear Chemistry 33, 1151-1155 (1971).
34. E. Iguchi and K. Yajima, Journal of the Physical Society of Japan 32 (5), 1415-1422 (1972).
35. N. D. Morelon, D. Ghaleb, J. M. Delaye and L. Van Brutzel, Philosophical Magazine 83 (13), 1533-1555 (2003).
36. T. Karakasidis and P. J. D. Lindan, Journal of Physics: Condensed Matter 6 (15), 2965-2969 (1994).
37. W. C. Mackrodt and R. F. Stewart, Journal of Physics C: Solid State Physics 12 (23), 5015-5036 (1979).

Example 2

Defect Engineering in Semiconductors for Nanoscale Devices

Figure 54A:
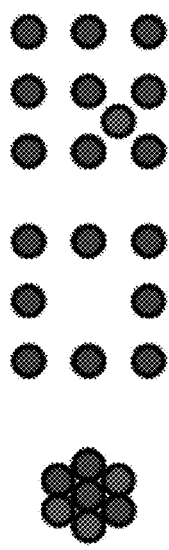
FIG. 54A provides schematic diagrams of several defect types in a semiconductor structure.

Defects present in semiconductor structures can have a strong influence on the behavior of a semiconductor. For example, defects can influence solid-state diffusion during device fabrication. Defects can also affect the flow of current in integrated circuits and the performance of photoactive devices and gas sensors. FIG. 54A shows schematic diagrams of several defect types in a semiconductor structure. Typical point defects include interstitials and vacancies; extended defects include dislocations and clusters.

Figure 54B:
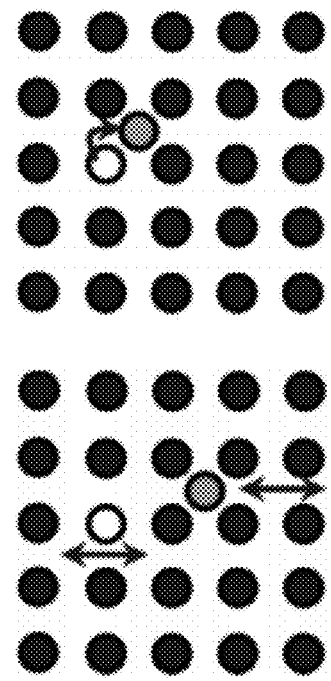
FIG. 54B provides schematic diagrams of a semiconductor structure illustrating control over defect concentration, spatial distribution and mobility.

Defect engineering seeks to control behavioral aspects of defects and is influenced by the type and concentration of defects as well as the spatial distribution and mobility of defects. FIG. 54B shows schematic diagrams of a semiconductor structure illustrating control over defect concentration, spatial distribution and mobility. Example methods of controlling defects include adjustment of heating/annealing protocols such as time, temperature, and temperature ramp rates. Other example methods for controlling defects include intentional introduction of foreign atoms, for example N, C or F in a Si semiconductor structure. Additional methods for controlling defects include photostimulation as well as manipulation of the chemical state of the semiconductor surface, such as by manipulating the presence/concentration of dangling bonds and adsorbed species as well as the surface charge distribution.

Figure 55A:
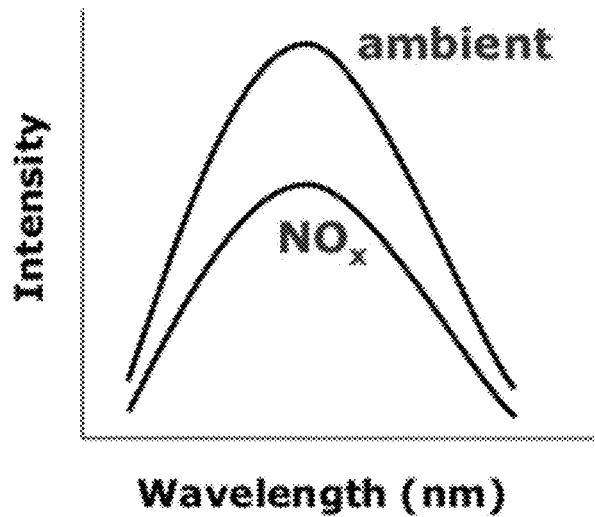
FIG. 55A provides a plot of the intensity of light emitted from a ZnO nanowire as a function of wavelength under ambient conditions and under exposure to $NO_x$ species.

An example of defect engineering in practice is the control of optical emission by ZnO nanowires. ZnO nanowires are employed by gas sensors and ultraviolet light emitting diodes. Oxygen vacancies in ZnO nanowires are responsible for emission of green light and more effective methods are needed to control these vacancies to improve device performance. Oxygen vacancies and other native defects such as interstitials can have multiple charge states, such as oxygen vacancies of +2, +1 or 0 charge states ($V_O^{+2}$, $V_O^{+1}$ or $V_O^0$) or oxygen interstitials having ±2, ±1, or 0 charge states ($O_i^{+2}$, $O_i^{+1}$, $O_i^0$, $O_i^{-1}$ or $O_{i-2}$). Such defects are susceptible to control by photostimulation. Further, nanowires exhibit large surface areas and control over the surface chemical state can therefore be used as an effective means of controlling underlying defects. FIG. 55A provides a plot of the intensity of light emitted from a ZnO nanowire as a function of wavelength under ambient conditions and under exposure to $NO_x$ species (e.g. NO, $NO_2$, $NO_3$, $NO_5$, etc.), showing a reduction in the emitted intensity when the nanowire is exposed to $NO_x$.

Figure 55B:
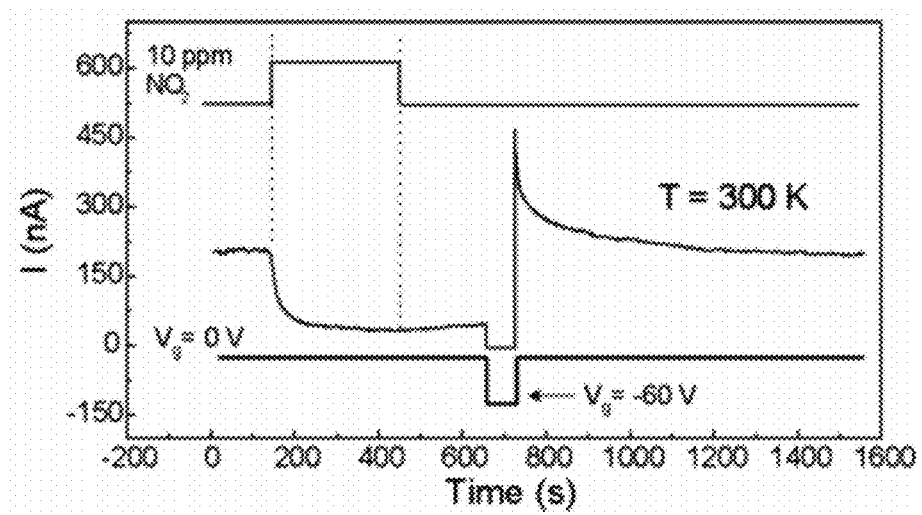
FIG. 55B provides a plot showing current through ZnO nanowires as a function of time, showing a current response to exposure to $NO_2$.

ZnO nanowires are employed as thin-film conductors and field effect transistors (FETs) for conductance-based gas sensing applications. FIG. 55B provides a plot showing current through ZnO nanowires as a function of time, showing a current response to exposure to $NO_2$. Specific details of the response depend upon the native defect concentration, but generally the current through a ZnO nanowire field effect transistor varies with $NO_2$ adsorption. FIG. 55B also shows the current through the FET can be reset by providing a voltage pulse to the FET gate.

Figure 56A:
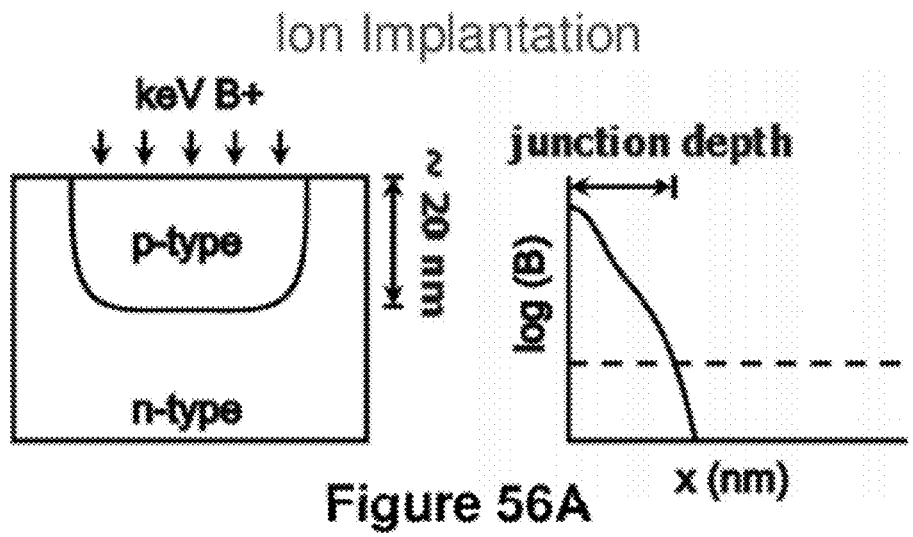
FIG. 56A provides a schematic diagram illustrating boron ion implantation into a semiconductor structure and shows a plot of the implanted boron concentration as a function of distance.
Figure 56B:
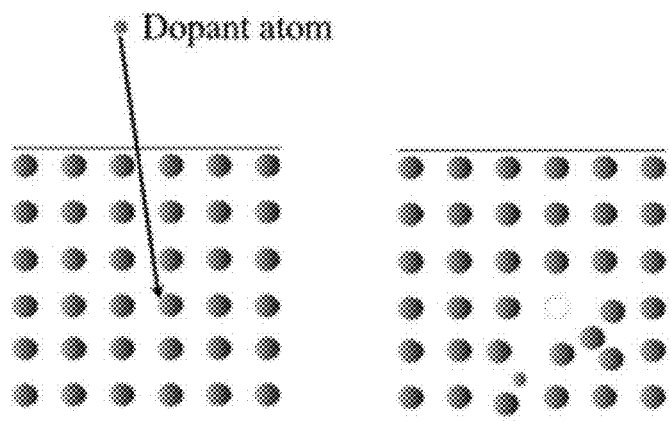
FIG. 56B provides a schematic illustration of dopant implantation into a semiconductor resulting in damage to the semiconductor lattice.
Figure 56C:
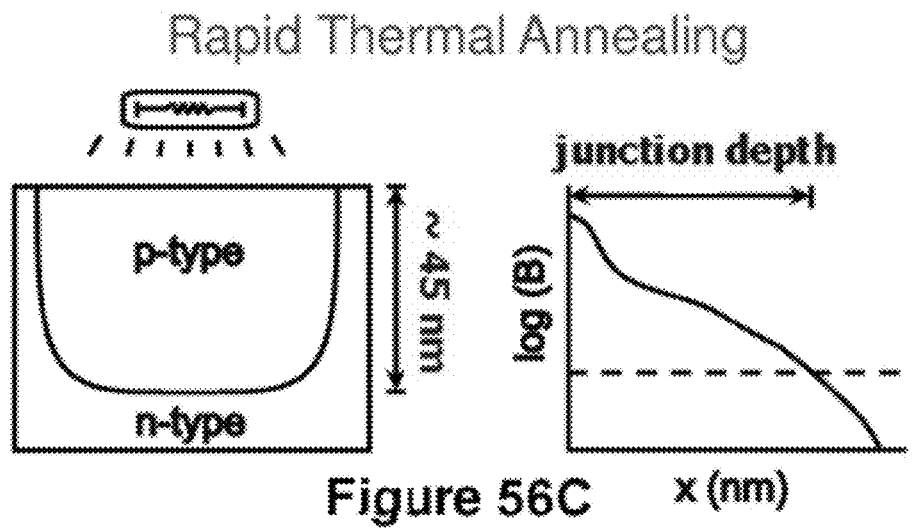
FIG. 56C provides a schematic diagram illustrating rapid thermal annealing of a boron implanted semiconductor structure and shows a plot of the implanted boron concentration as a function of distance.

Fabrication of ultrashallow pn junctions is another example where defect engineering is useful. FIG. 56A provides a schematic diagram illustrating boron ion implantation into a semiconductor structure and shows a plot of the implanted boron concentration as a function of distance. Dopant implantation into a semiconductor typically results in damage to the semiconductor lattice, as illustrated in FIG. 56B. For formation of the junction, the dopant must be activated to place the dopant atoms into the crystal lattice. This is typically achieved by rapid thermal annealing, which is schematically illustrated in FIG. 56C. High powered lamps and lasers are utilized to rapidly heat and cool the semiconductor structure. Defects in the crystal structure, however, promote unwanted diffusion and deactivation of the dopant, resulting in larger junction depths and longer required annealing times.

Figure 57:
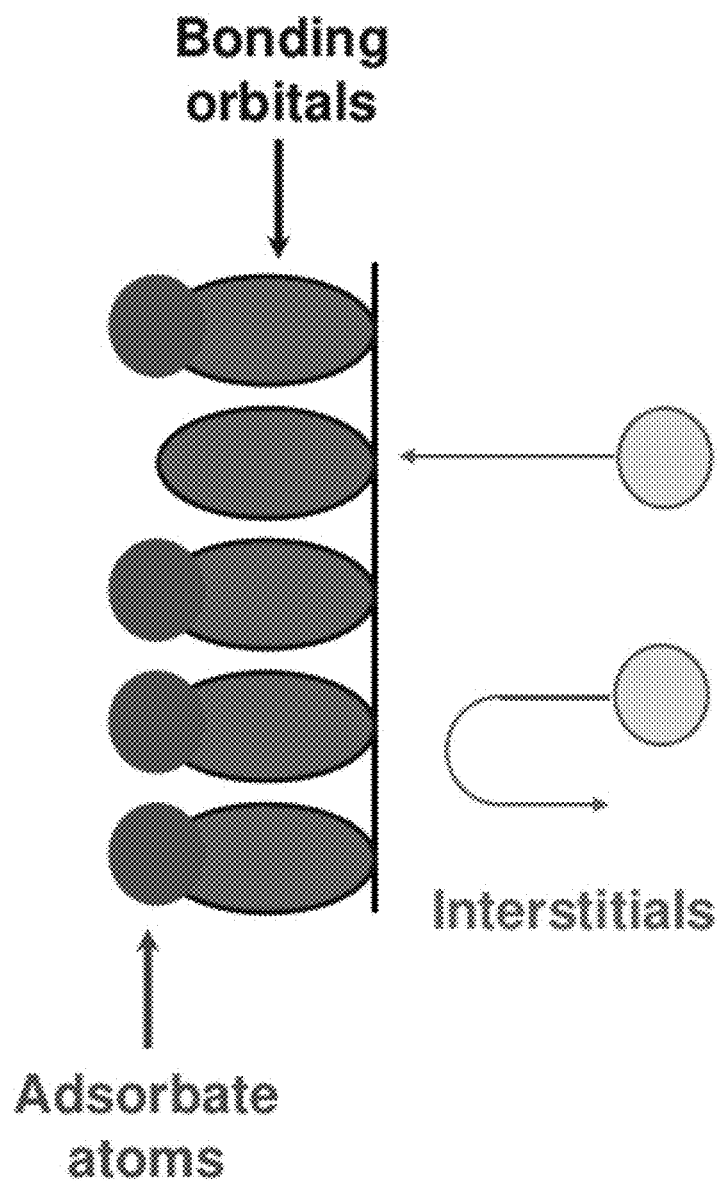
FIG. 57 provides a schematic illustration of dangling bonds at a semiconductor surface.

One method for removing unwanted defects involves enhancing the surface annihilation rate. In particular, this method is useful for reducing defects after ion implantation because the bulk semiconductor structure is typically supersaturated with defects. As illustrated in FIG. 57, which provides a schematic illustration of dangling bonds at a semiconductor surface, the surface annihilation rate depends upon the saturation of dangling bonds. The removal of point defects to the surface is difficult/slower at saturated bonds and is facile/quicker at unsaturated bonds. The chemical state of dangling bonds on the semiconductor surface is typically uncontrolled or primarily saturated. Explicit control over the saturation state of dangling bonds at the surface can thus provide an avenue for control over the surface annihilation rate.

Figure 58A:
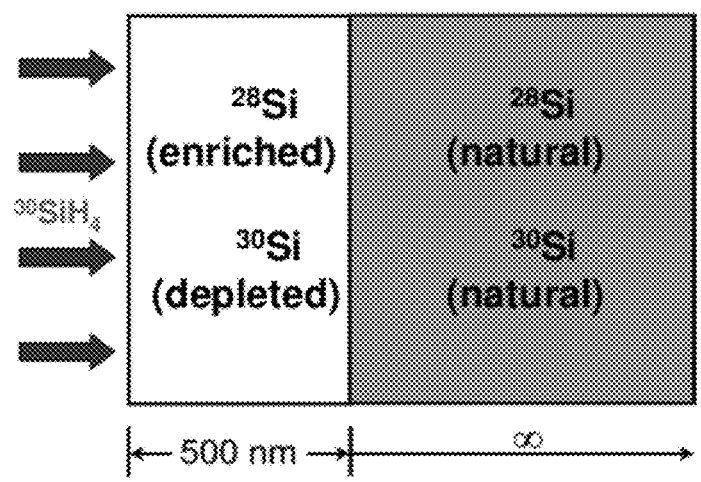
FIG. 58A provides a schematic overview of an experiment to measure surface annihilation rates.
Figure 58B:
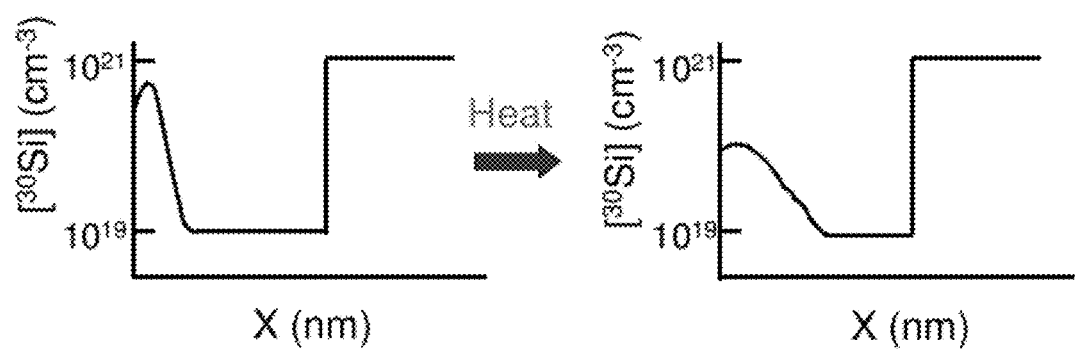
FIG. 58B provides a schematic illustration of $^{30}Si$ concentration profiles before and after annealing.

Experiments measuring surface annihilation rates are performed as illustrated in FIG. 58A. A 500 nm thick Si layer depleted in $^{30}Si$ is formed over a bulk layer of natural Si. Subsequently, $^{30}Si$ is implanted into the depleted layer. Concentration profiles are determined before and after annealing, for example by secondary ion mass spectrometry (SIMS), as shown in FIG. 58B, with an optional step for exposure to a test gas before annealing. The concentration profiles are then simulated with the only adjustable parameter being the surface annihilation rate.

Figure 59A:
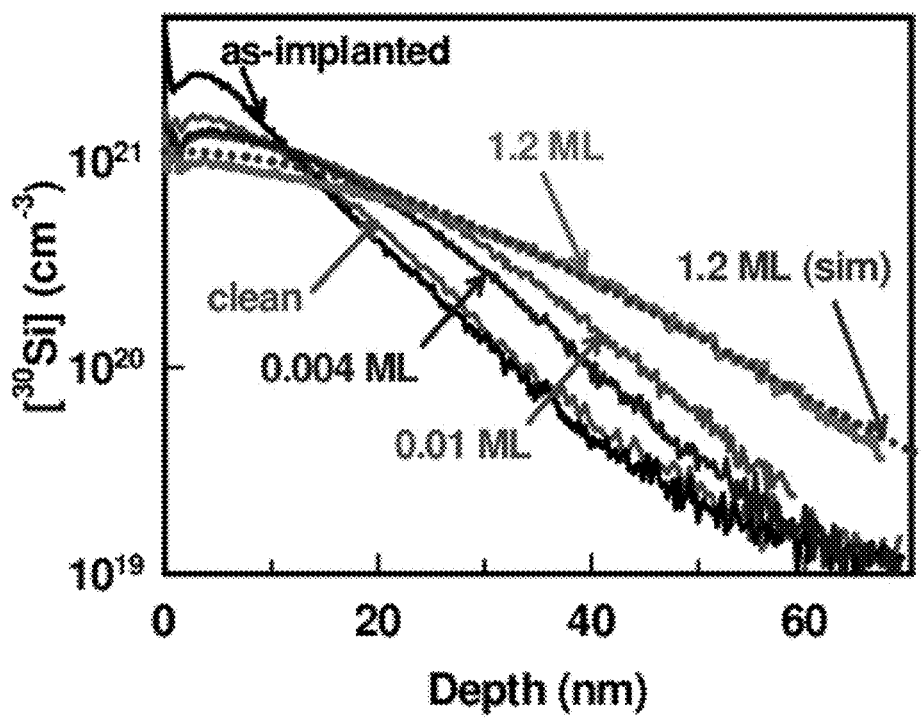
FIGS. 59A and 59B provide concentration profiles of implanted silicon structures before and after annealing with and without surface treatment.
Figure 59B:
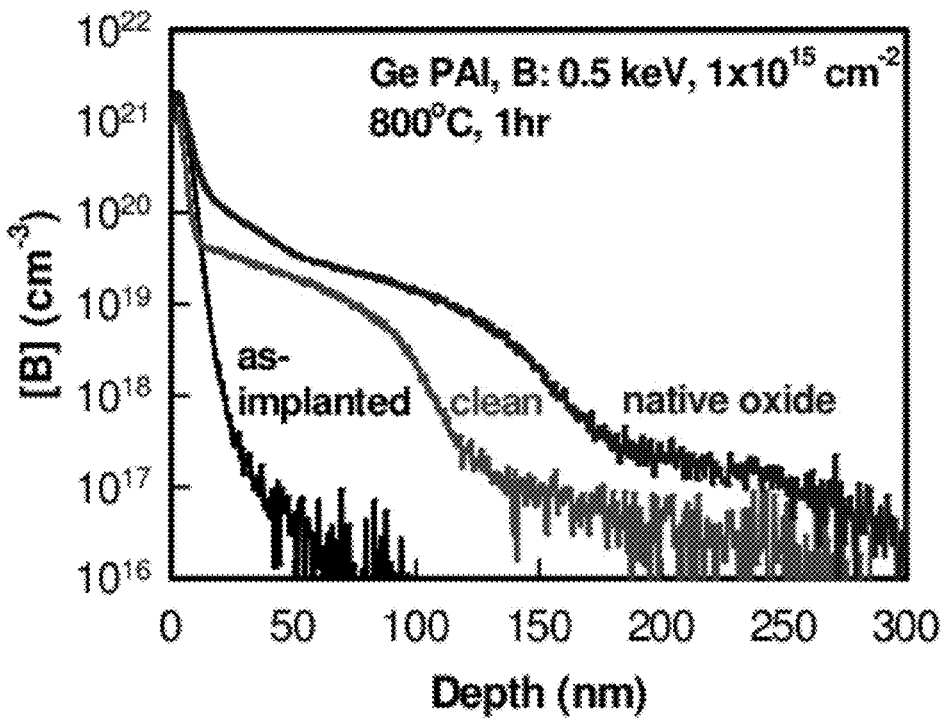

The results of experiments showing control over the surface annihilation rate are illustrated in FIGS. 59A and 59B. FIG. 59A shows the measured concentration profile of a Si layer depleted in $^{30}Si$ after implantation by $^{30}Si$, showing the as-implanted concentration profile as well as concentration profiles after annealing at 980° C. for 90 minutes at a variety of surface conditions (clean, 0.004 monolayer (ML) of nitrogen, 0.01 ML of nitrogen and 1.2 ML of nitrogen) and a simulated concentration profile at a coverage of 1.2 ML nitrogen. The nitrogen surface groups are provided by exposing the surface to $NH_3$. Unlike silicon oxide, nitrogen does not desorb from the surface during annealing. With the clean surface, little spreading of the implanted $^{30}Si$ is observed after annealing. With a very small surface coverage of 0.004 ML the effects of control of the surface annihilation rate are observed. As the nitrogen coverage is increased, the implanted $^{30}Si$ spreads more during annealing, indicating that the surface is becoming less effective at removing interstitial Si atoms. Similar experiments for implantation of a semiconductor with an impurity followed by annealing at 800° C. for 1 hour show similar results. FIG. 59B illustrates differences in the boron concentration profile between the as-implanted semiconductor, the annealed semiconductor with a clean surface, and the annealed semiconductor with a native oxide surface, showing that the surface having more dangling bonds yields less diffusion and greater activation of dopants.

Figure 60A:
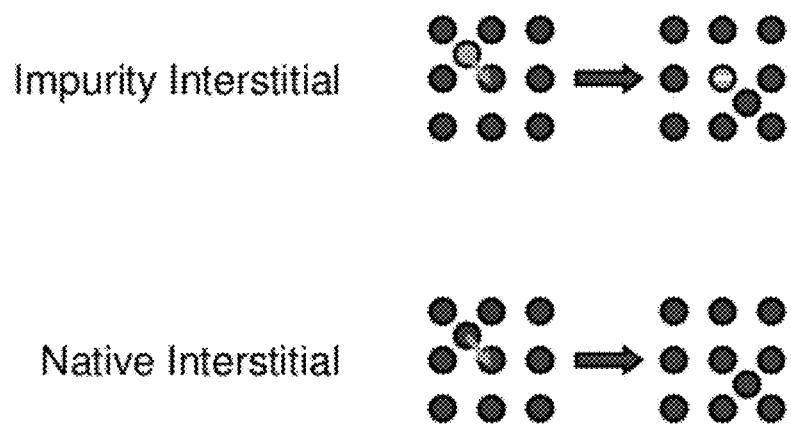
FIG. 60A provides a schematic illustration of a mechanism for control over the surface annihilation rate.
Figure 60B:
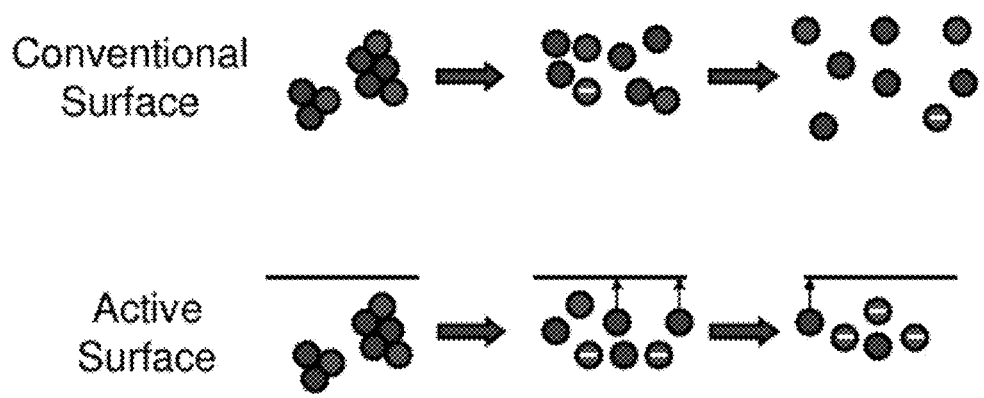
FIG. 60B provides a schematic illustration of a mechanism for cluster annihilation.

FIG. 60A schematically illustrates the mechanism responsible for control over the surface annihilation rate. While interstitial impurity motion is slowed by kick-in to the lattice, there is no equivalent for native interstitials, thus the surface sink is felt more strongly by native interstitials than by interstitial impurities and the surface preferentially removes native interstitials. FIG. 60B schematically illustrates a similar mechanism for clusters. As a cluster is dissociated during annealing, the cluster components occupy interstitial and lattice sites. With a conventional surface (zero annihilation rate) few interstitials are lost to the surface. However, with an active surface (non-zero annihilation rate) more native interstitials are lost to the surface resulting in reduced diffusion and increased activation of implanted dopants.

Figure 61:
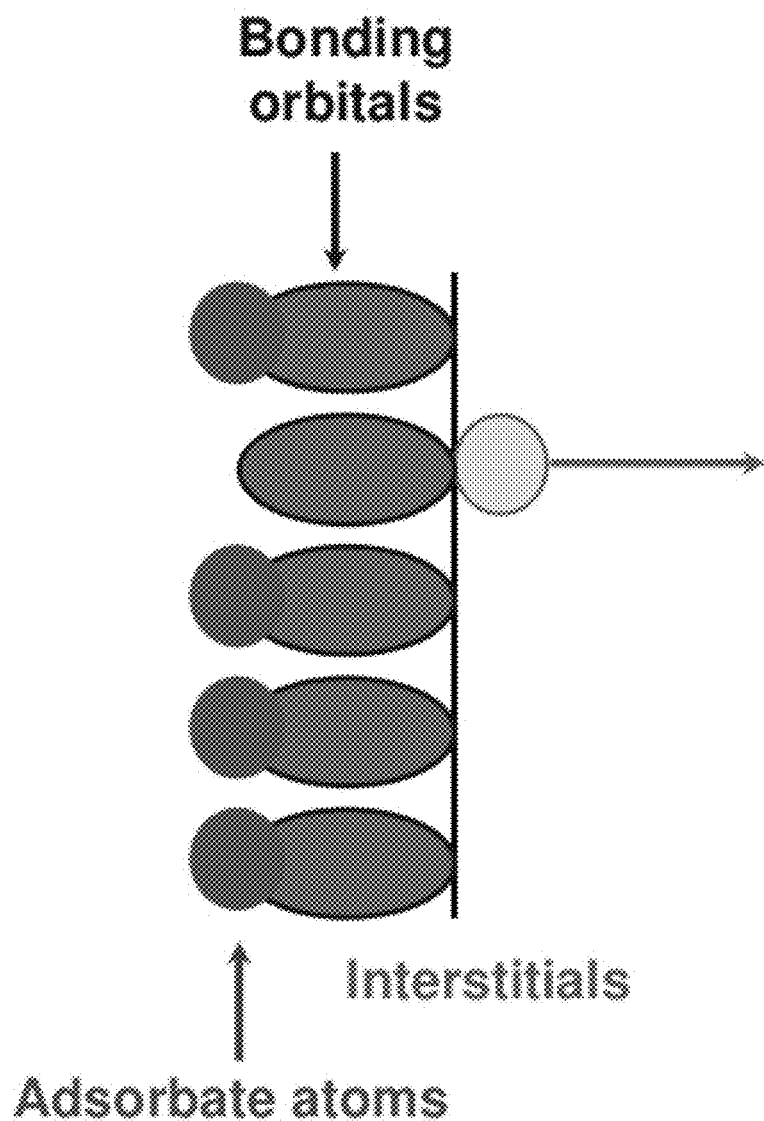
FIG. 61 provides a schematic illustration of a surface control method of injection of defects into a semiconductor structure.

A complementary form of surface control can be achieved by heating an unimplanted solid positioned at the semiconductor surface. With undersaturated conditions, defects can be injected into the semiconductor; with saturated conditions, however, defect formation is hindered. FIG. 61 provides a schematic illustration of this surface control method. The rate of diffusion at the mesoscale depends upon the mobility of mobile species (interstitials, vacancies) as well as the number of mobile species. These effects are schematically illustrated in FIG. 62. In an undersaturated solid, the number of mobile species depends upon the defect formation rate, both at the surface and in the bulk.

Figure 63A:
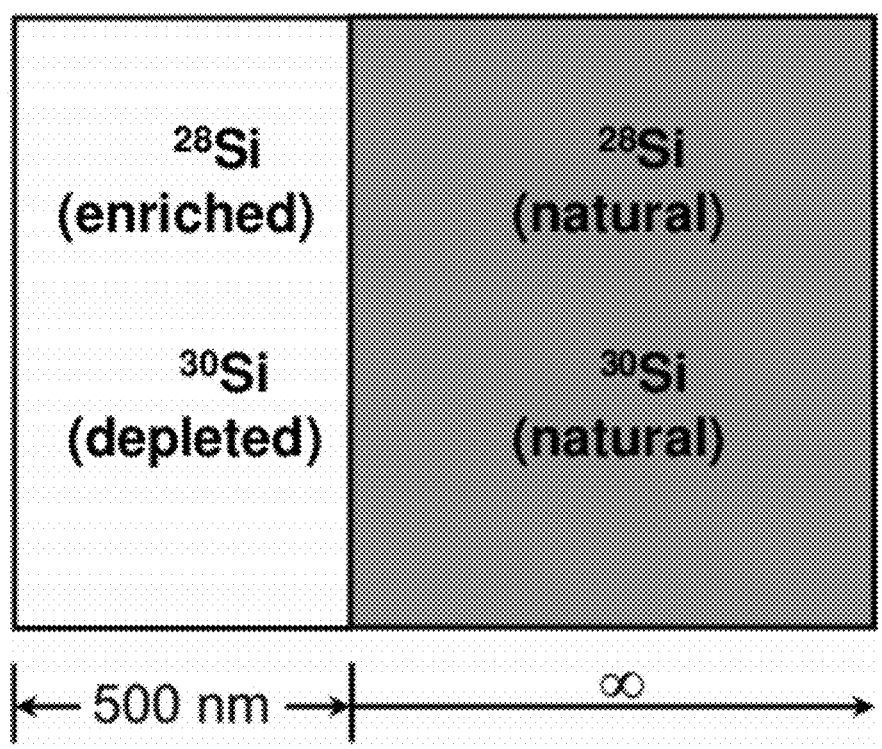
FIG. 63A provides a schematic illustration of an epitaxially grown $^{30}Si$ layer over a natural silicon structure.
Figure 63B:
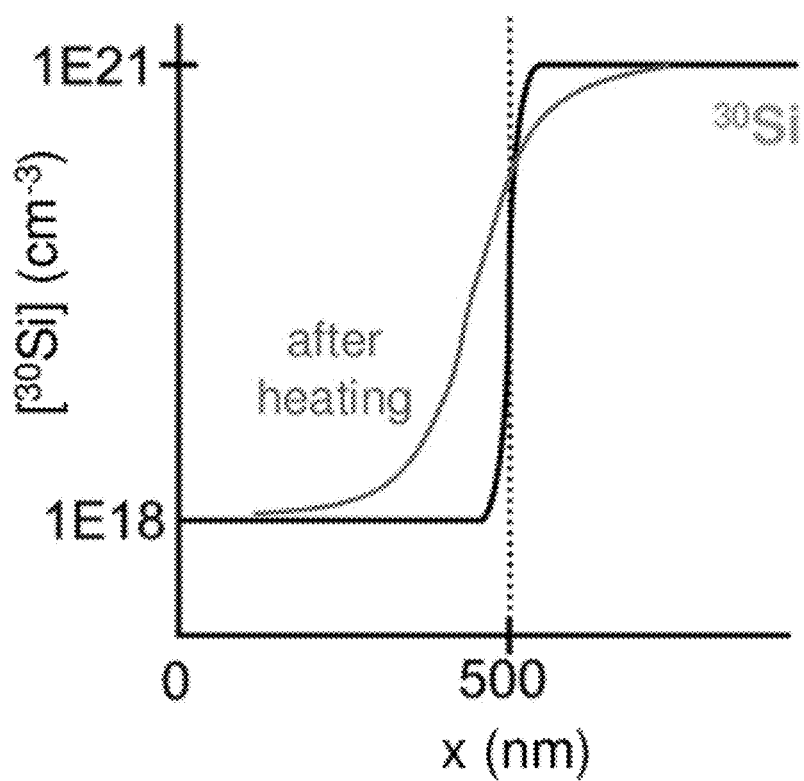
FIG. 63B provides a schematic illustration of the concentration profile of the structure in FIG. 63A before and after annealing.

An experiment showing the complementary form of surface control is achieved by epitaxially growing a Si layer depleted in $^{30}Si$ over a natural silicon structure, thus creating a $^{30}Si$ step profile, as shown in FIG. 63A. The surface concentration profiles are measured before and after annealing using SIMS, with the results schematically illustrated in FIG. 63B.

Figure 64A:
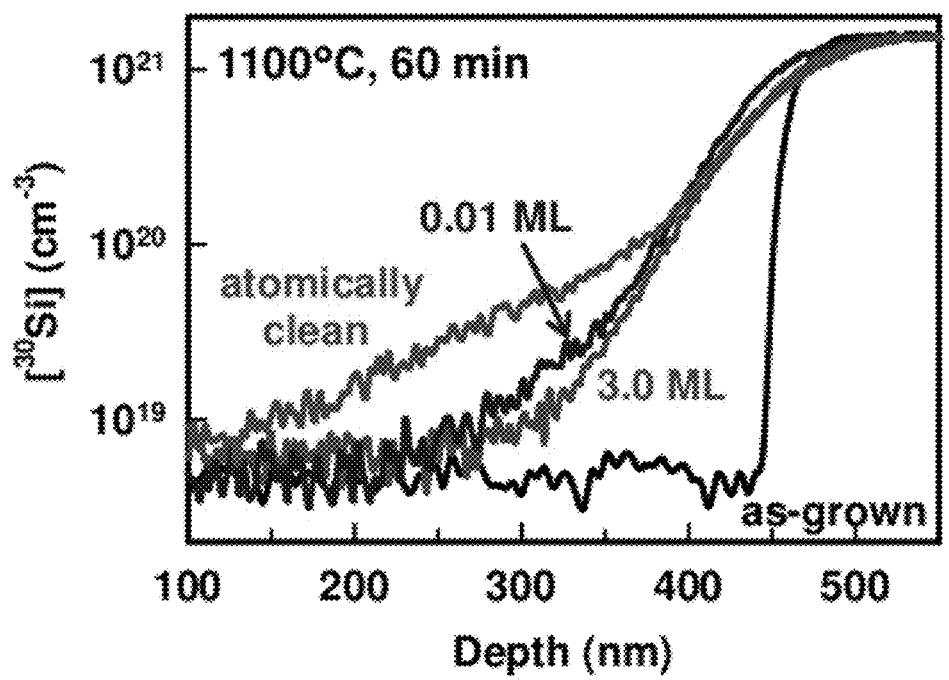
FIG. 64A provides data showing experimental concentration profiles before and after annealing a natural silicon structure with an epitaxially grown $^{30}Si$ layer.
Figure 64B:
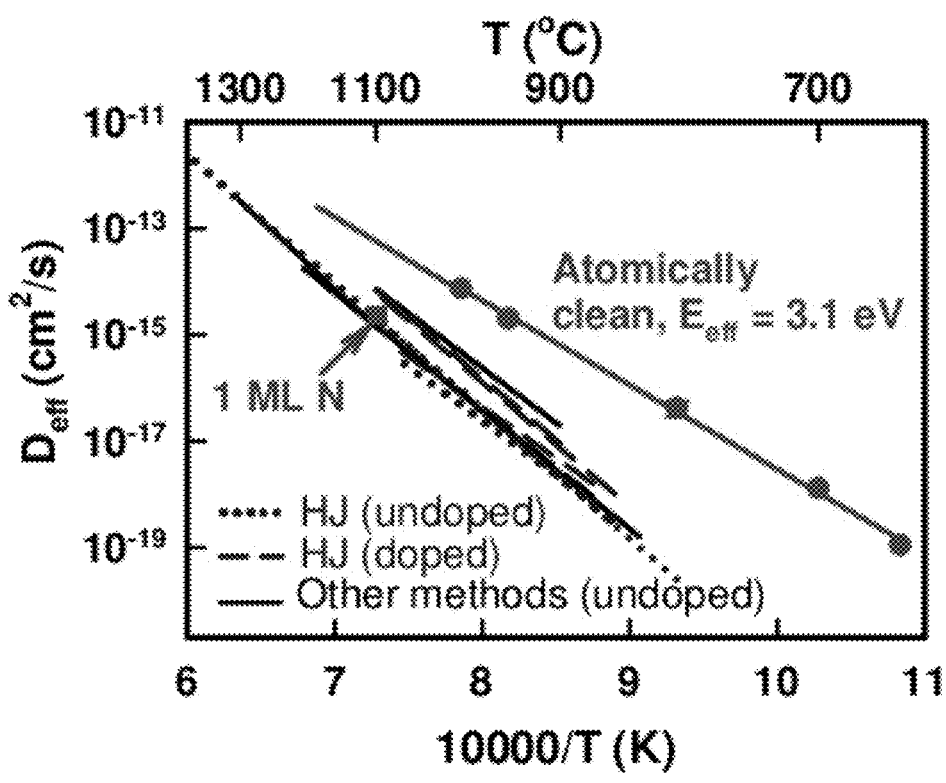
FIG. 64B provides data showing the effective diffusion coefficient for silicon self-diffusion as a function of temperature for both atomically clean and 1 ML (monolayer) nitrogen surfaces.

FIG. 64A shows experimental concentration profiles of similar experiments with and without nitrogen saturation (formed by exposure to $NH_3$) at the surface of the $^{30}Si$/natural Si interface for annealing at 1100° C. for 60 minutes. The results indicate that self-diffusion is mediated by Si interstitials and that the clean surface promotes faster diffusion compared with nitrogen saturation, with effects observable even at surface coverage as low as 0.01 ML. The atomically clean, chemically active surface promotes slower diffusion with interstitial oversaturation and faster diffusion with interstitial undersaturation. FIG. 64B further provides data showing the effective diffusion coefficient for silicon self-diffusion as a function of temperature for both atomically clean and 1 ML nitrogen surfaces, which reproduces results observed in the literature. The observed effective diffusion coefficient is proportional to the mesoscale diffusivity of interstitial $^{28}Si$. For an atomically clean surface, it is observed that diffusion is faster by orders of magnitude with an effective activation energy ($E_{eff}$) approximately ⅓ less than that previously observed.

Figure 65A:
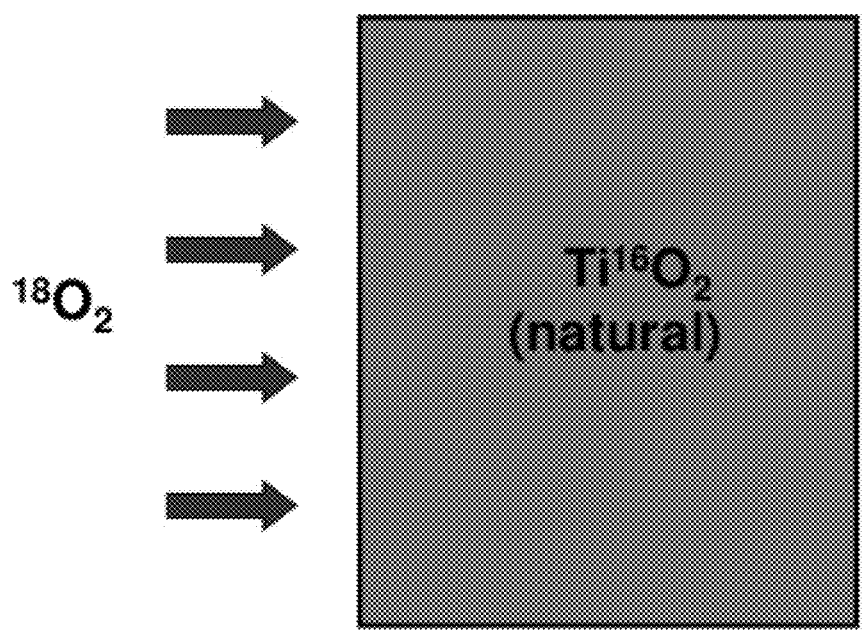
FIG. 65A provides a schematic illustration of exposure of a $TiO_2$ crystal to $^{18}O_2$ gas.
Figure 65B:
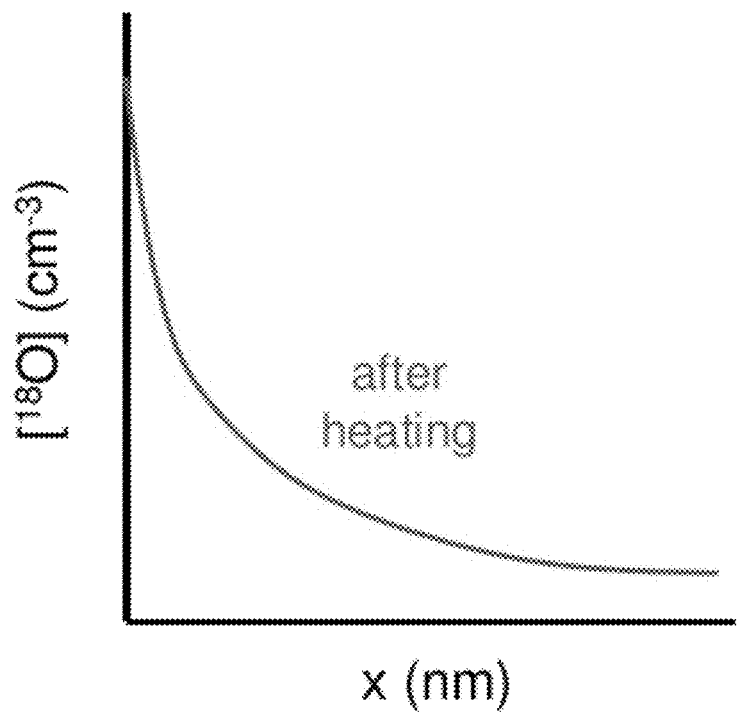
FIG. 65B provides a schematic illustration of a concentration profile of a $TiO_2$ crystal exposed to $^{18}O_2$ gas.

Oxygen self-diffusion rates in $TiO_2$ have also been measured. A rutile $TiO_2$ crystal is first equilibrated in natural abundance $O_2$ followed by exposure to isotopically labeled $^{18}O_2$ gas, as schematically depicted in FIG. 65A. The $^{18}O$ concentration profile is then obtained using SIMS, with the results schematically depicted in FIG. 65B.

Figure 66A:
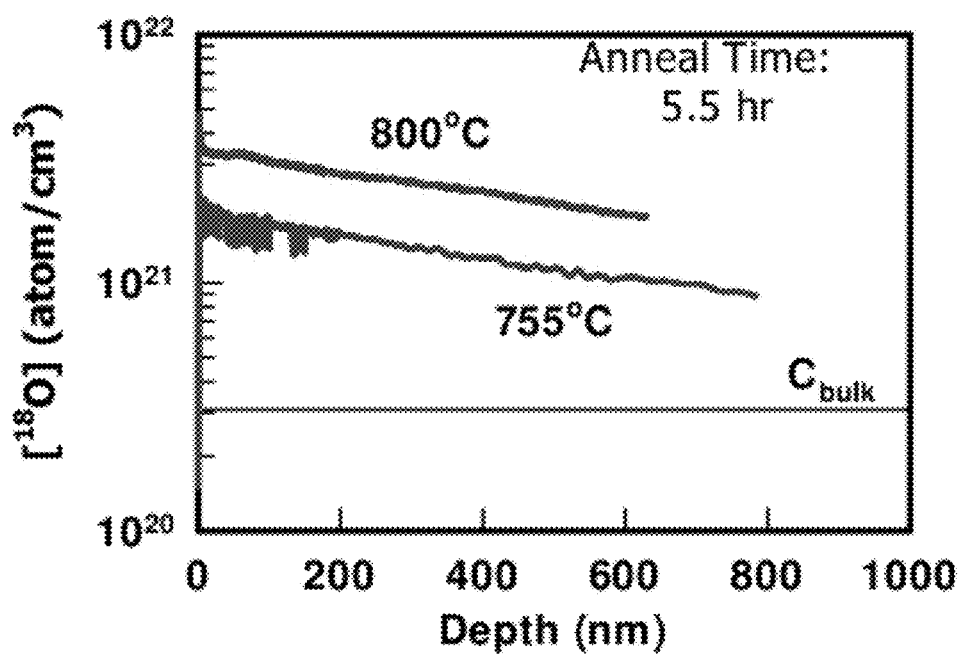
FIG. 66A provides experimental $^{18}O$ concentration profiles for $TiO_2$ samples annealed in an $^{18}O_2$ environment.
Figure 66B:
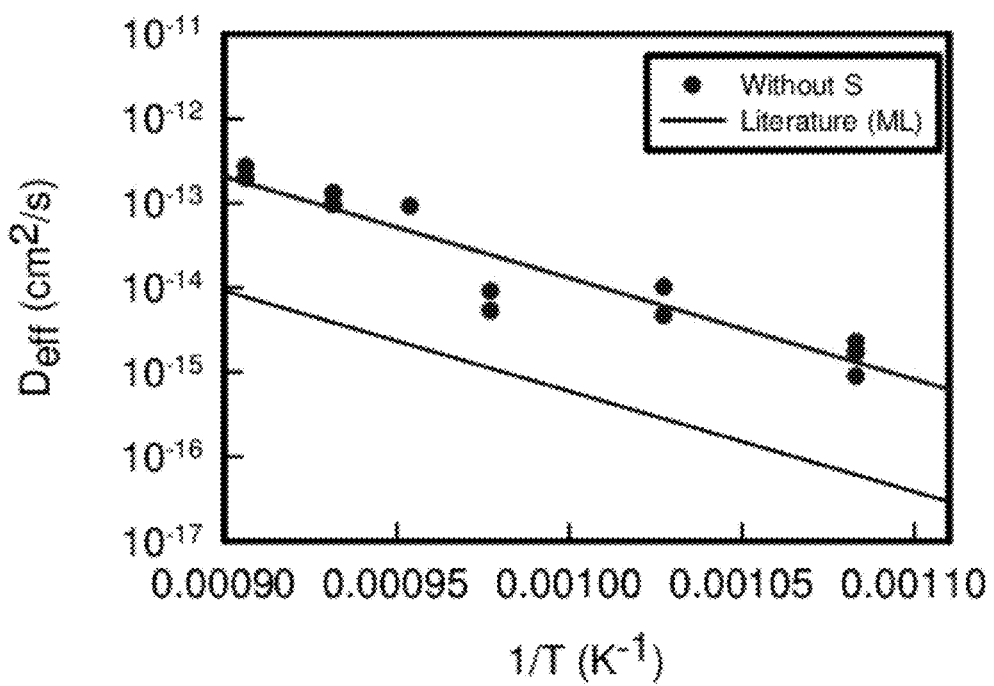
FIG. 66B provides data comparing the effective diffusion coefficient as a function of temperature for an atomically clean $TiO_2$ surface with that previously observed.

FIG. 66A provides experimental $^{18}O$ concentration profiles for $TiO_2$ samples annealed in an $^{18}O_2$ environment at 755 and 800° C. for 5.5 hours. FIG. 66B provides data comparing the effective diffusion coefficient as a function of temperature for an atomically clean $TiO_2$ surface with that previously observed for ML coverage. Diffusion is observed to be 20 times faster than that previously observed with ML coverage. The concentration profiles are observed to have an exponential tail shape, indicating that fast moving intermediates mediate diffusion. Supporting evidence from pressure dependence experiments showing the effective diffusion coefficient increases with increasing pressure, indicates that oxygen interstitials are the likely responsible fast moving intermediate.

Figure 66C:
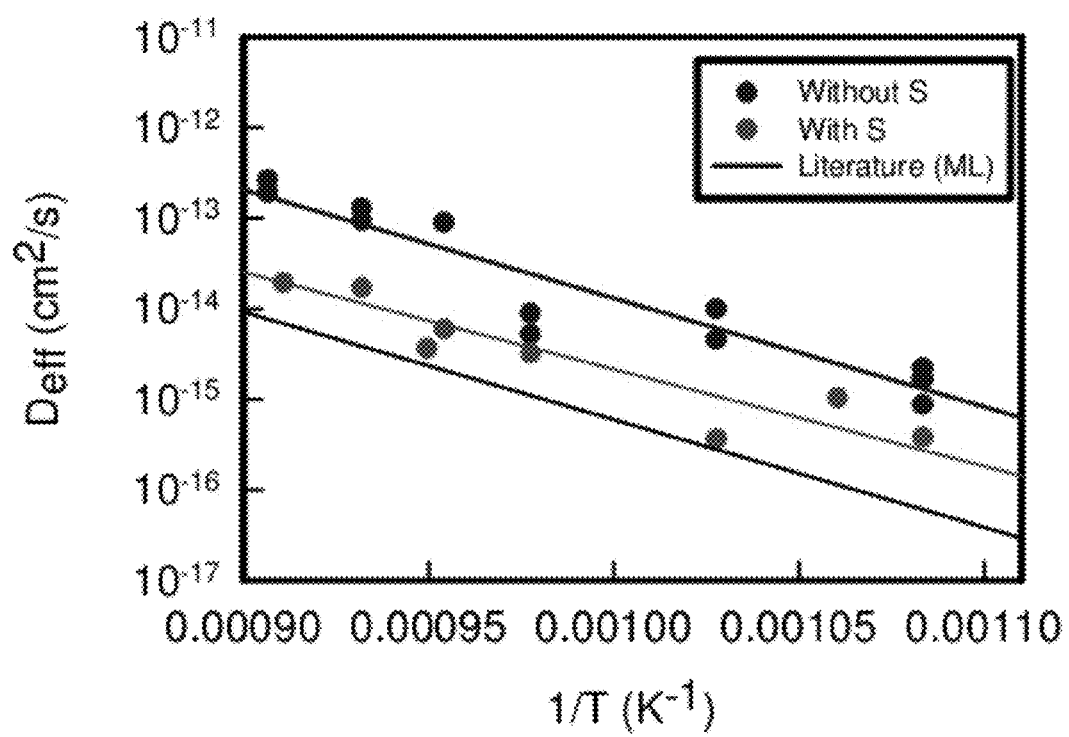
FIG. 66C provides data comparing the effective diffusion coefficient as a function of temperature for an atomically clean $TiO_2$ surface and for a $TiO_2$ surface with adsorbed sulfur with that previously observed.

FIG. 66C provides additional data comparing the effective diffusion coefficient as a function of temperature for an atomically clean $TiO_2$ surface (without S) and for a $TiO_2$ surface with adsorbed sulfur with that previously observed for ML coverage. Sulfur is adsorbed onto the rutile $TiO_2(110)$ surface from a solid-state electrochemical cell. During heating in the $^{18}O_2$ environment, the coverage by sulfur is approximately 0.25 ML, showing a decrease in the effective diffusion coefficient back towards that previously observed.

Figure 67:
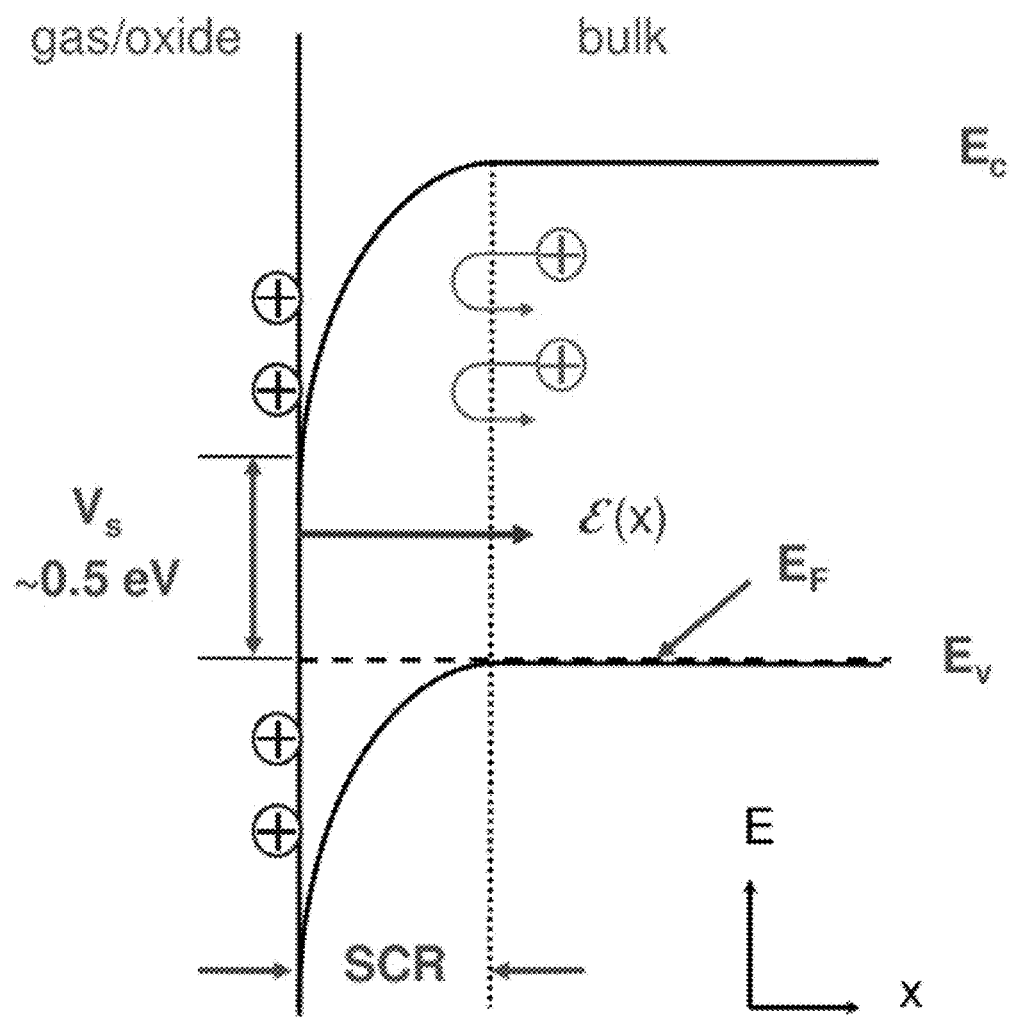
FIG. 67 provides a schematic illustration of an electrostatic mechanism for surface-bulk coupling.
Figure 68A:
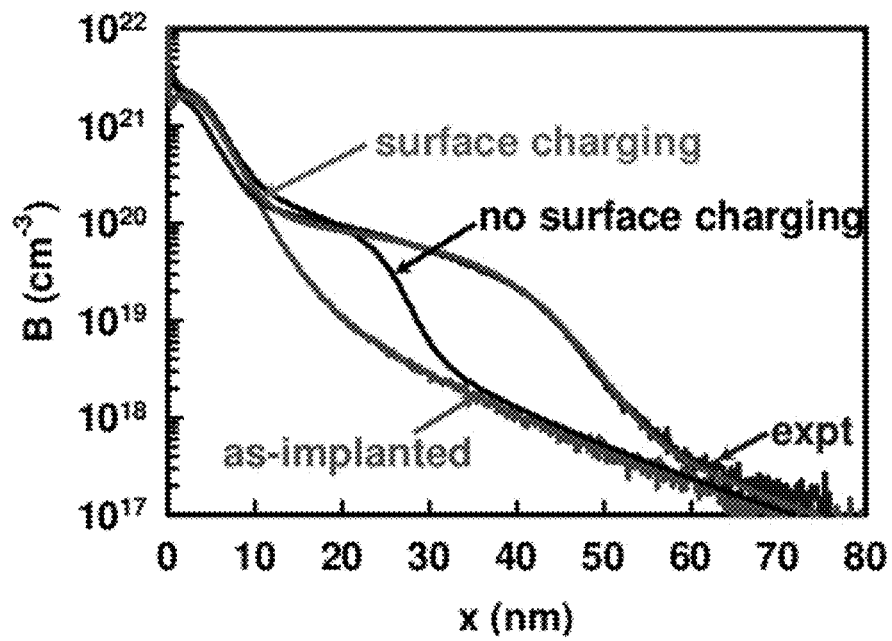
FIG. 68A provides data showing boron concentration profiles in Si illustrating the effects of surface charging on junction formation.
Figure 68B:
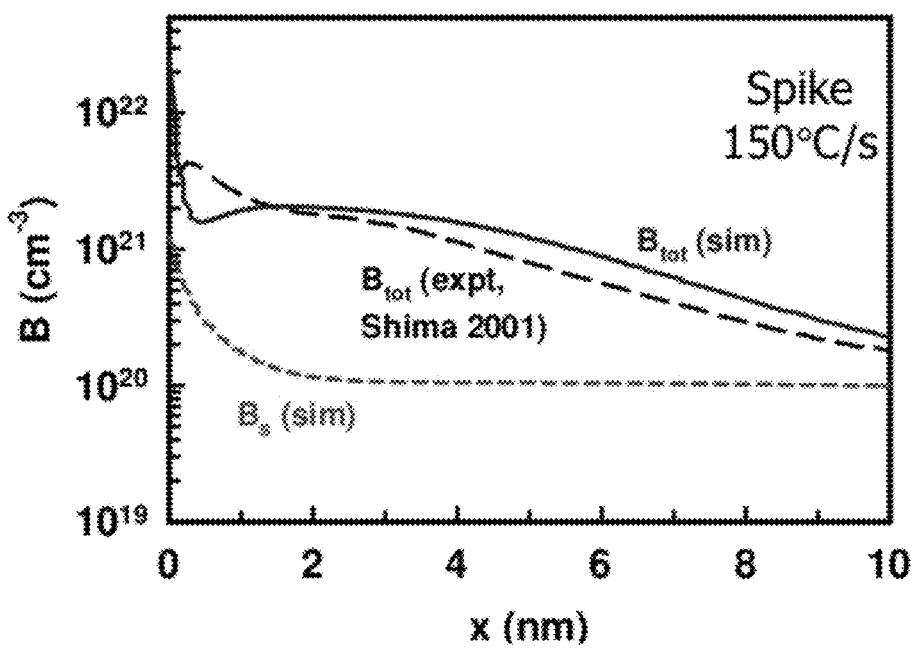
FIG. 68B provides data showing boron concentration profiles in Si at depths less than 10 nm.

An electrostatic mechanism for surface-bulk coupling is schematically illustrated in FIG. 67. Some dangling bonds can exchange charge with the bulk resulting in surface charging. At high doping, a strong electric field points into the bulk. This strong electric field opposes motion of charged interstitials towards the surface, transforming the surface from a sink to a reflector. FIG. 68A shows boron concentration profiles in Si showing the effects of surface charging on junction formation. The simulated surface charging profile includes approximately 0.5 eV surface charge. The difference between the profiles with and without surface charging shows that a charged surface leads to deeper junctions because the Si interstitials cannot escape. FIG. 68B shows boron concentration profiles in Si at depths less than 10 nm. For B in Si, a fixed charge on the surface leads to dopant pileup near the Si—$SiO_2$ interface. The $B^+$ charge state can change near the interface because the Fermi level near the interface lies near mid-gap, thus B interstitials can become neutral or negative and are no longer reflected by the surface. Observation of near-interface dopant pile-up can be a marker for electrostatic coupling.

Figure 69A:
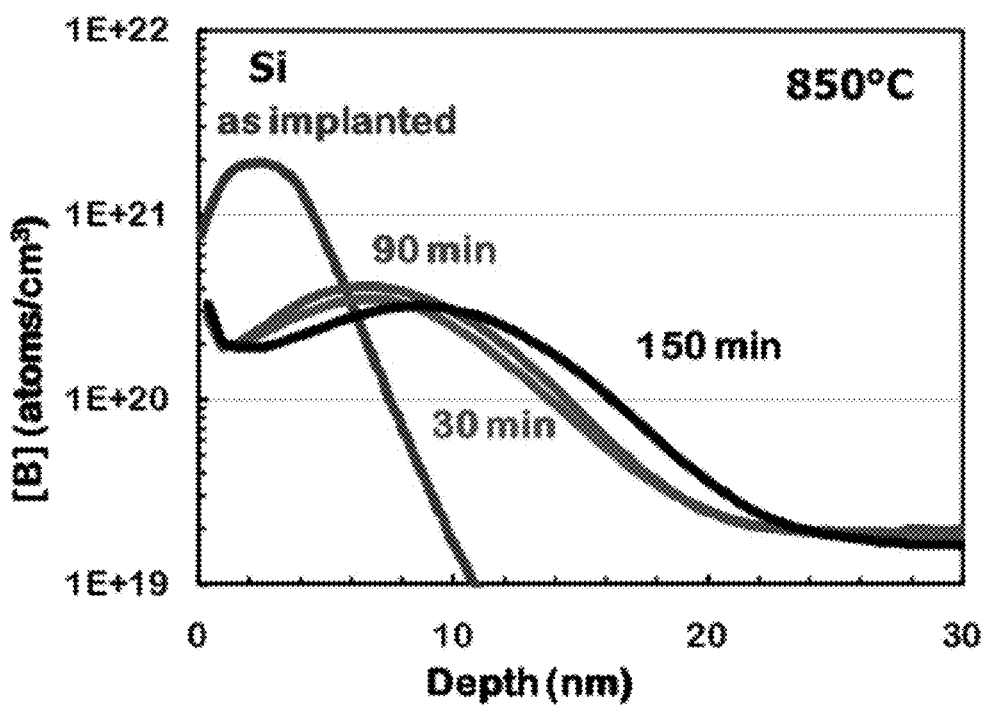
FIG. 69A provides data showing boron concentration profiles in Si.
Figure 69B:
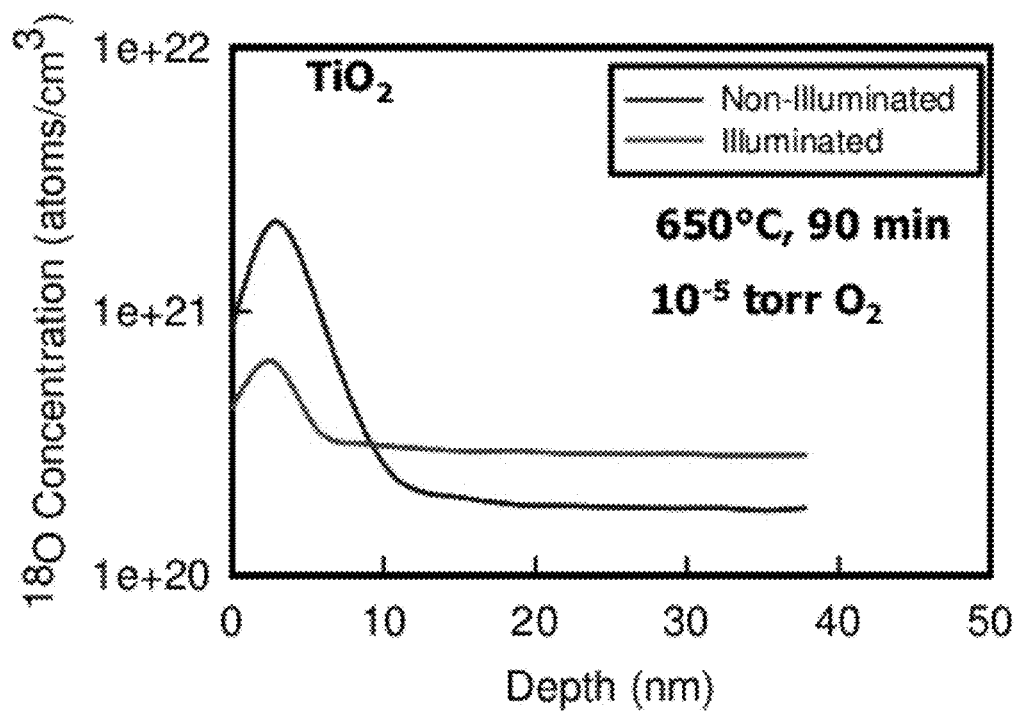
FIG. 69B provides data showing $^{18}O$ concentration profiles in $TiO_2$.

FIG. 69A provides boron concentration profiles in Si. B is implanted through native oxide at 500 eV and $10^{15}$ atoms/$cm^2$. The oxide remains on the surface during annealing at 850° C. for periods of 30, 90 and 150 minutes. The marker for electrostatic coupling is observed at shallow depths for the annealed profiles in FIG. 69A. FIG. 69B provides $^{18}O$ concentration profiles in $TiO_2$, showing similar electrostatic effects for $^{18}O$ diffusing into rutile $TiO_2$; however, the details depend upon low-level optical illumination (e.g., at approximately 1 $W/cm^2$).

Figure 70A:
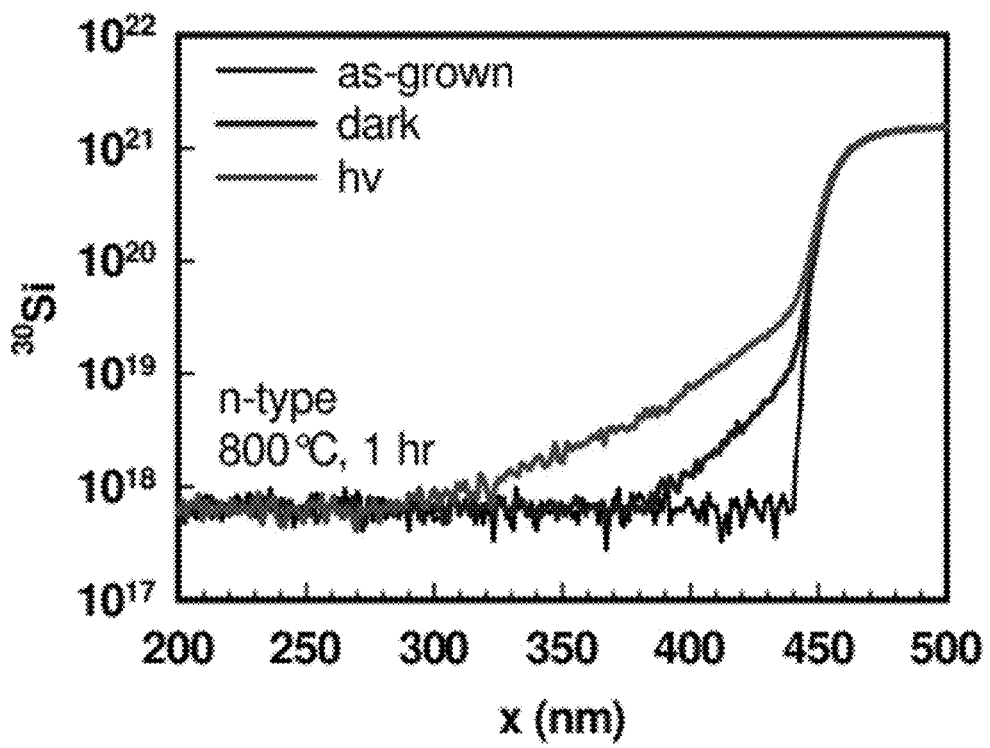
FIG. 70A provides $^{30}Si$ concentration profiles for n-type silicon annealed at 800° C. for 1 hour with and without illumination by a 632 nm He—Ne laser.
Figure 70B:
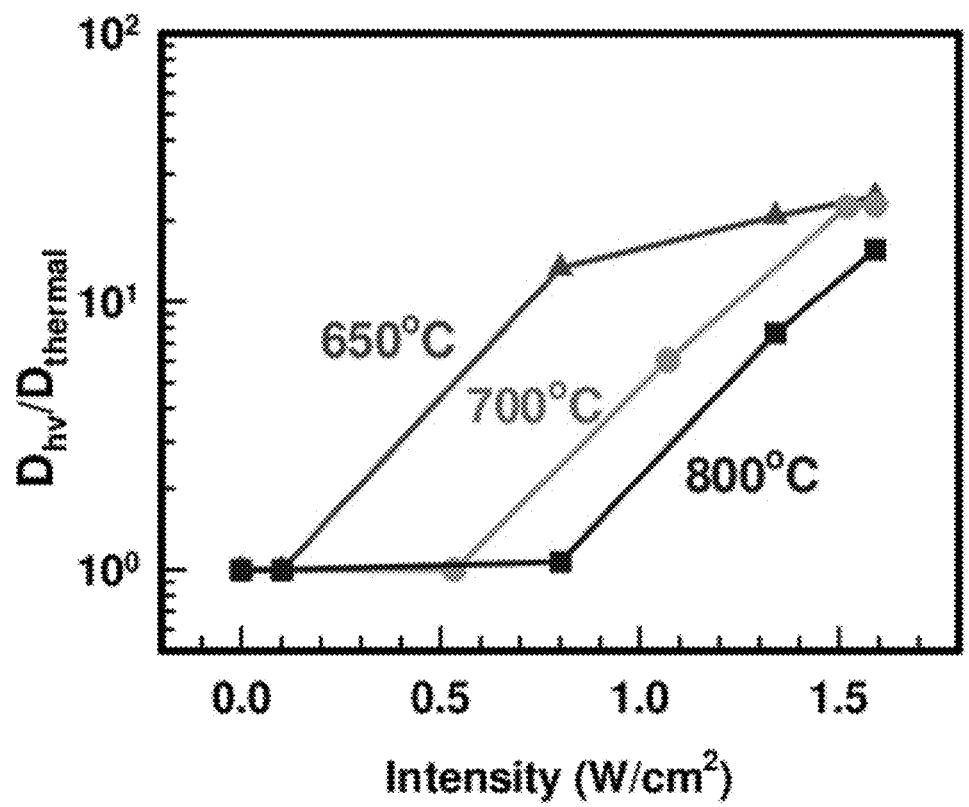
FIG. 70B provides data showing the relative rate of diffusion under illuminated and non-illuminated conditions as a function of intensity for three different temperature conditions.

Photoexcitation can be used as another method of control over defects. Point defects can have different charge states depending upon the dominant carrier type (i.e., n or p) and concentration. For example, interstitials can be charged or uncharged and positively or negatively charged (e.g., $Si_i^0$, $Si_i^{+2}$, $B_i^{+1}$, $B_i^{-1}$). The defect formation energy and diffusion rate is dependent upon the charge state. Photoexcitation can change the carrier concentration, which propagates through into diffusion parameters, thus affecting the observed rates of diffusion. Non-thermal illumination effects are observed for silicon self-diffusion. FIG. 70A provides $^{30}Si$ concentration profiles for n-type silicon annealed at 800° C. for 1 hour with and without illumination by a 632 nm He—Ne laser. Under the illuminated conditions, diffusion is enhanced for n-type silicon, but no effects are observed for p-type silicon. Furthermore, an intensity threshold exists which varies with temperature. FIG. 70B provides data showing the relative rate of diffusion under illuminated and non-illuminated conditions as a function of intensity for three different temperature conditions.

Figure 71:
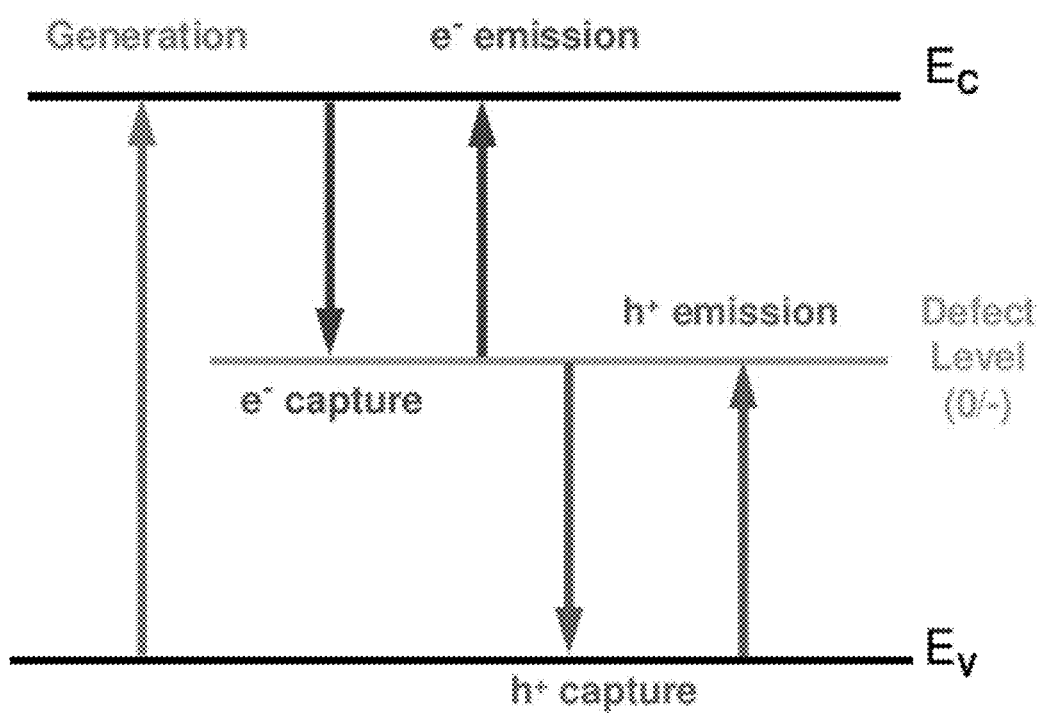
FIG. 71 provides a schematic overview of a mechanism used to model the effects of illumination on interstitial diffusion.

Shockley-Read statistics are used to model the effects of illumination on interstitial diffusion. A schematic overview of the mechanism is provided in FIG. 71. Illumination results in generation of excess charge carriers while defects assist in the recombination of charge carriers, such as I or AsV complex. Under steady-state, non-equilibrium conditions:

$$dn/dt = r_G - r_{e-capture} + r_{e-emission}$$

$$dp/dt = r_G - r_{h+capture} + r_{h+emission}$$

The probability of $e^-$ occupation is determined by balancing $e^-$ capture and emission or $h^+$ capture and emission.

Figure 72A:
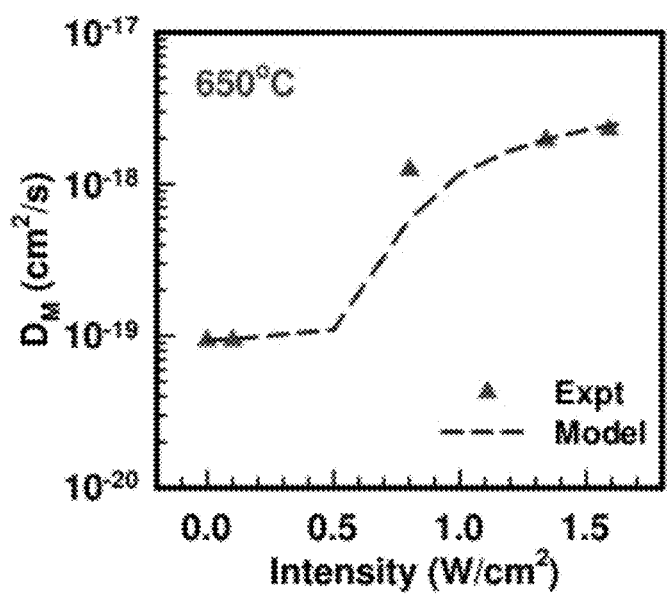
FIGS. 72A, 72B and 72C provide data showing the best fit of a model to the data shown in FIG. 70B.
Figure 72B:
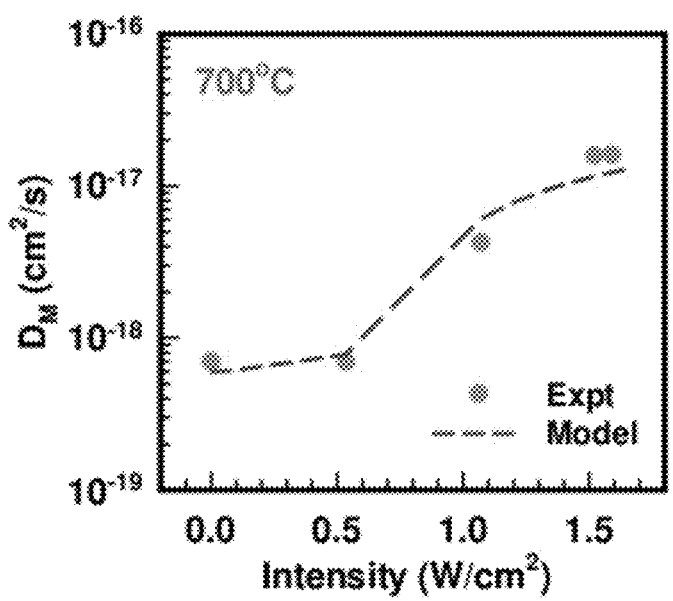
Figure 72C:
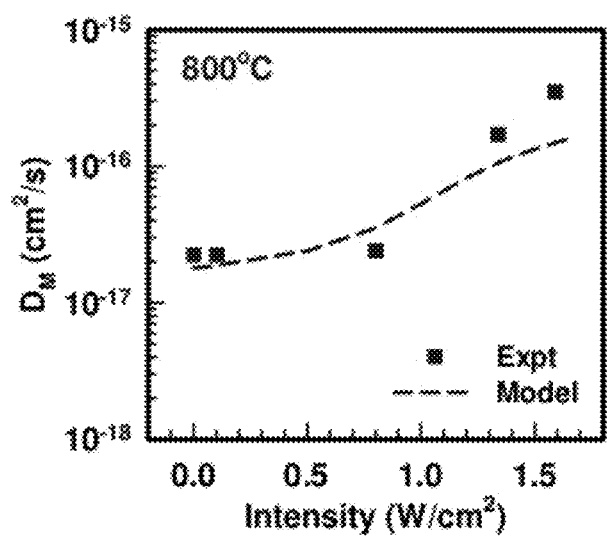

Silicon diffusivity under illumination can be modeled to interpret the experimental results shown in FIG. 70B. The model unknowns are $S_n$, $S_p$, $E_t$, $D_0$ and $D_-$, with the mesoscale diffusivity $D_M = [I_0] D_0 + [I^-] D_-$. The intensity threshold can be explained by the presence of another defect that preferentially saturates, similar to the As—V complex. In general, diffusivity saturates at high intensity resulting in most defect levels occupied by h+; thus $D_M \approx [I^0] D_0$. FIGS. 72A, 72B and 72C show the best fit of the model to the experimental data from FIG. 70B.

Figure 73:
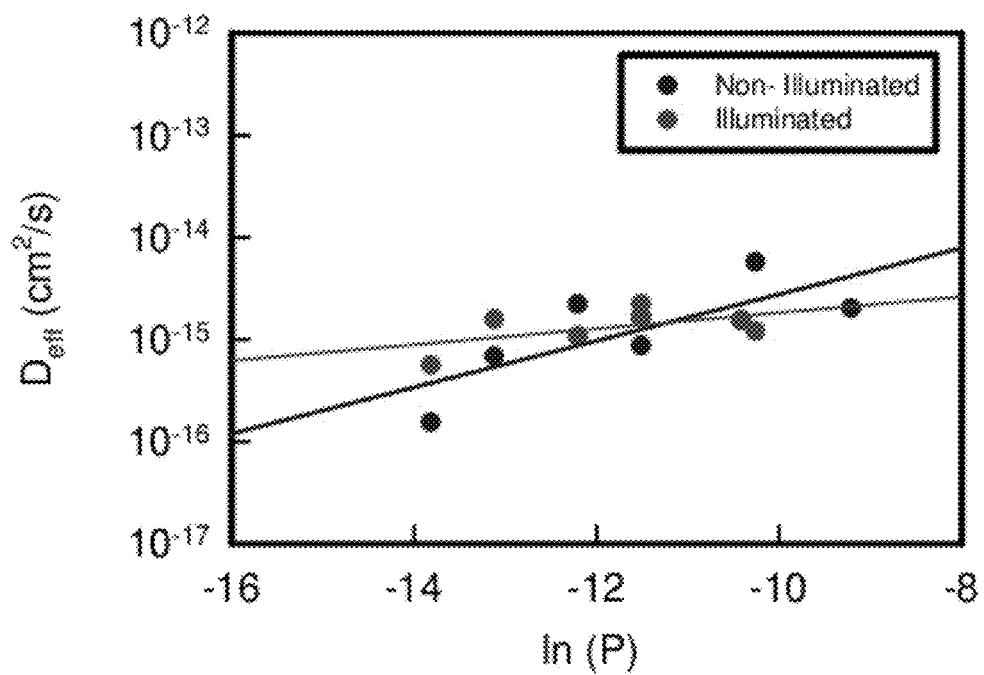
FIG. 73 provides data showing the effective diffusion coefficient in $TiO_2$ as a function of the oxygen pressure for illuminated and non-illuminated conditions.

Analogous photostimulation effects also occur for O diffusion in $TiO_2$. FIG. 73 provides data showing the effective diffusion coefficient as a function of the oxygen pressure for illuminated (0.1 $W/cm^2$ UV) and non-illuminated conditions. The observed effects are small; however, the UV intensity is also small.

Example 3

Trends in Semiconductor Defect Engineering at the Nanoscale

Abstract

Defect engineering involves manipulating the type, concentration, spatial distribution, or mobility of defects within a crystalline solid. Defect engineering in semiconductors has become much more sophisticated in recent years, driven by the need to control material properties at small length scales. This Example describes recent trends in defect engineering across several nano-oriented applications, beginning with Si-based integrated circuits and extending into non-Si microelectronics and especially into oxide semiconductors for sensors and photocatalysis. Special focus fixes upon physical mechanisms that show significant promise as new means for controlling defect behavior, including low-energy ion bombardment, surface chemistry, and photostimulation. Systems-based methods for parameter estimation offer considerable promise for helping to understand the complex diffusion and reaction networks that characterize defect behavior in most prospective applications.

3.1. Introduction

The technologically useful properties of a semiconductor often depend upon the types and concentrations of the defects it contains. For example, defects mediate dopant diffusion in semiconductors used for microelectronic devices [1-5] in ways that are vital for device fabrication. Defects also affect the performance of semiconductor-based sensors [6], catalysts [7,8], photoactive devices [9-11], and photovoltaic (PV) cells [12].

Defect engineering involves manipulating the type, concentration, spatial distribution, or mobility of defects within the solid. Example methods for achieving such control include specially designed heating protocols (time, maximum temperature, heating and cooling rates), introduction of foreign atoms, specially designed ion bombardment protocols, and amorphization/recrystallization. More recent methods include photostimulation and controlling the chemical state of the surface. Defect engineering has found the most widespread and sophisticated usage for fabrication of microelectronic devices, whose critical dimensions are now typically in the nanoscale range. This usage has been driven by the need for exquisite control of charge carrier type and concentration, as well as electrical current flow. This literature for Si-based devices has been reviewed extensively [13-16] and some of those reviews incorporate recent trends [17,18]. Several treatments exist for individual defect engineering methods, which constellate around the applications of large-area Si wafer fabrication from the melt, and the subsequent formation of pn junctions in field-effect transistors. Large-area Si wafers are fabricated via Czochralski growth, which is capable of producing near-perfect, high-purity substrates. Nevertheless, harmful defects can form during growth, and vigorous efforts have been made to control them [19-21]. Defect engineering methods for pn junctions focus upon either ion implantation or the subsequent annealing steps. In addition to general treatments of ion implantation [22-24], there exist extensive discussions of the related methods of co-implantation [25], plasma doping [26-28], and vacancy engineering [29,30]. On the annealing side, most discussions of defect engineering focus upon rapid thermal processing [31-33], or its more recent variant millisecond annealing [33-35].

The use of defect engineering outside of Si-based microelectronics is less extensive, but has still drawn attention in the review literature. For example, several articles exist that treat ion implantation in III-V compound semiconductors for device applications [36-38] or metal oxide nanoparticles for photocatalysts [39,40]. For metal oxides, the broader notion of defect engineering apart from ion implantation is relatively new, and only a few reviews can be found [41,42].

This Example presents an integrated treatment of recent trends in defect engineering across these applications with a focus on the nanoscale, beginning with Si-based microelectronics and extending into non-Si microelectronics and especially into oxide semiconductors in sensors and photocatalysis. Special focus fixes upon physical mechanisms that show significant promise as new means for controlling defect behavior.

TABLE 3.1

Correspondence in defect structure and behavior for the bulk and surface.

| Bulk | Surface |
|---|---|
| Interstitial atom | Adatom or surface interstitial |
| Vacancy | Vacancy |
| Interstitial cluster | Adatom island |
| Vacancy cluster | Vacancy island |
| Kick-in/kick-out | Exchange diffusion |
| Vacancy-interstitial formation | Vacancy-adatom formation |

3.2. Defect Characteristics

Figure 74:
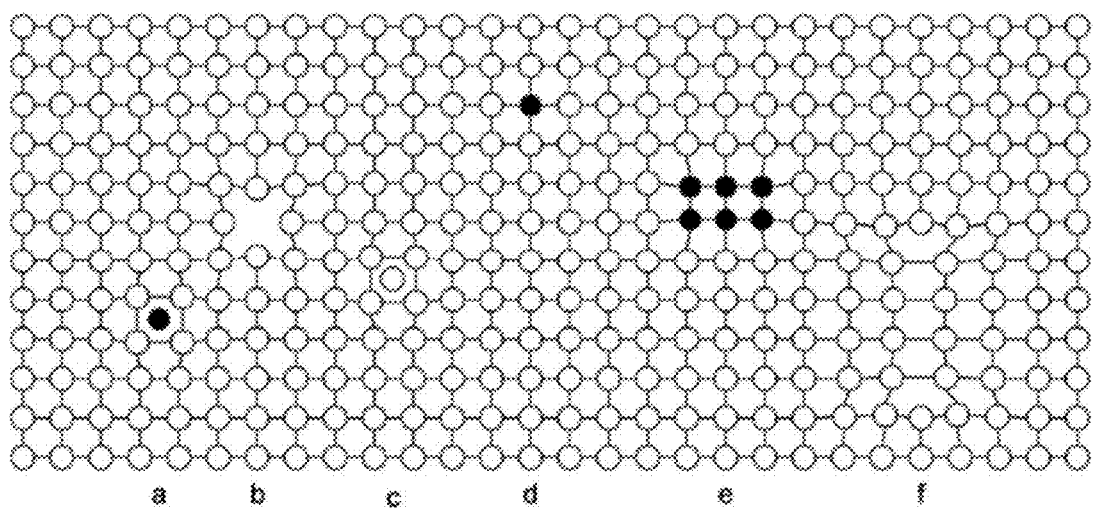
FIG. 74 provides examples of common defects in semiconductors including (a) interstitial impurity atom, (b) vacancy, (c) self-interstitial atom, (d) substitutional impurity atom (dopant), (e) precipitate of impurity atoms (cluster), and (f) vacancy cluster.

As a prelude to the discussion of defect engineering, a brief review of the salient defect characteristics will prove useful. FIG. 74 shows how crystalline semiconductors may contain a variety of imperfections involving single atoms (point defects) or multiple atoms (extended defects). Examples of point defects include missing atoms (vacancies), extra atoms wedged between lattice atoms (interstitials), and impurity atoms on lattice sites (substitutionals or dopants). Examples of extended defects include linear or planar mismatches in the lattice (dislocations or stacking faults), clusters of point defects, and grain boundaries. Extended defects are especially prone to form at the interface between two dissimilar semiconductors with different lattice constants. In epitaxial growth applications, the drive to relieve strain induced by the mismatch sometimes leads to threading dislocations that propagate throughout the growing layer.

A free surface (or an interface with a dissimilar material) can be conceptualized as a very large extended defect in the bulk structure. Yet the surface or interface also exhibits two-dimensional regularity in its structure, with defect forms analogous to those found in the bulk [43]. The terminology often differs, however. For example, the surface science community refers to "surface interstitials" as "adatoms." A large agglomeration of vacancy defects in the bulk is a "vacancy cluster"; the analogous feature on the surface is often called a "vacancy island." Table 3.1 summarizes the correspondences in defect structure and behavior for the bulk and surface. Understanding surface defects is becoming increasingly important in applications—for example, as electronic devices shrink closer to the atomic scale (with the attendant increase in surface-to-volume ratios), and as molecular-level control of catalytic reactions becomes increasingly feasible. This Example treats surfaces mainly in connection with bulk defects, however.

Defect formation affects semiconductor properties in a variety of ways. Point defects typically affect electronic properties such as carrier type, concentration or mobility [44, 45]. Extended defects also affect physical properties, such as strength or toughness [46]. At elevated temperatures, extended defects frequently serve as sources or sinks of point defects. Surfaces do the same, interacting through both bond-exchange [47,48] and electrostatic [47] mechanisms. Most defects can act as sites where electrons and holes recombine with special efficiency [49-51], typically degrading the performance of the host material in applications ranging from optoelectronics to photocatalysis. Defect engineering seeks to reduce such effects.

It has long been known that bulk defects in semiconductors can be electrically charged. Charging of surface defects has been identified and studied more recently. In either case, this charging can affect defect structure [52,53], thermal diffusion rates [54-56], trapping rates of electrons and holes [57,58], and luminescence quenching rates [59]. More interestingly, defect charging also introduces new phenomena such as non-thermally photostimulated diffusion [60-62]. Such phenomena offer completely new mechanisms for defect engineering, as well as new means to study the charging phenomenon itself.

3.3. Si-Based Microelectronics

Critical dimensions in Si-based integrated circuits have scaled down well into the range of a few tens of nanometers. Defect engineering in these applications focuses upon the initial creation of Si wafers by Czochralski growth, or upon the later fabrication of pn junctions in field-effect transistors (FETs) by ion implantation and annealing.

3.3.1. Czochralski Growth

Highly scaled microelectronic devices require Si wafer substrates that are exceptionally free of defects and impurities. Czochralski growth from the semiconductor melt is the most common manufacturing technique for producing such Si, and extensive efforts have been made to minimize defect formation or incorporation during the growth process. The most common defects that bedevil the grown material are microdefects such as aggregates of vacancies, self-interstitials and oxygen impurities. The resulting defects are often large enough to observe directly via light scattering or transmission electron microscopy (TEM) [20,21]. Yet these defects form by accretion of smaller point defects, which remain largely invisible yet still require control.

Early attempts at defect control were empirical methods involving specialized protocols for heat removal and crystal pulling from the melt to maintain spatial uniformity in temperature [20,63]. Oxygen dissolution within the Si was mitigated through crucible design. Such empiricism led to significant improvements. In recent years, however, detailed mathematical modeling of defect behavior within the high-temperature solid has augmented the experiments. The modeling of defect diffusion, reactions and equilibrium provides useful insights, reduces the number of experiments required to understand defect behavior, and has found direct connection to optimizing commercial processes [19,20,64,65].

For example, modeling coupled with experiments has shown that the majority defect that forms during growth depends upon the ratio of the pull rate v and the temperature gradient G [20,64,65]. At higher v:G ratios, vacancies dominate. Self-interstitials dominate at lower ratios. Recent models incorporate the effects of oxygen on the behaviors of intrinsic defects [66,67], and have extended to more complicated systems where intentional dopants such as nitrogen [67-69] and germanium [70,71] are introduced. The same basic approach has also been applied to growth of germanium and metal oxide crystals [19,21,72].

3.3.2. Ion Implantation for Doping

Ion implantation has long been employed to introduce dopants as substitutional defects within the Si lattice [22-24]. As the feature size of devices has shrunk, pn junctions in field-effect transistors have become shallower—20 nm or less from the surface in the source-drain extension regions. The simplest approach to obtaining such shallow junctions has been to reduce the ion energy of the irradiating beam. This approach has notable limits, however. The relative degree of energy spread around the mean ion energy becomes more pronounced at lower energies. Space charge effects within the irradiating beam cause the beam to expand and the ion flux to decrease. Furthermore, channeling of dopant atoms parallel to certain crystal planes becomes more problematic, leading to placement of unwanted dopants deeper than the junction, as well as undesired lattice damage effects. The problems are most pronounced for the p-type dopant boron. Plasma based implantation helps to avoid some of these problems as it enables ultra-low energy implantation at a high beam current, which greatly improves production throughput while keeping the ion penetration depth low [26-28]. In addition, the plasma sheath drives implantation perpendicular to the surface, which is especially useful in three-dimensional structures with large aspect ratios that are difficult to dope using conventional beams [73,74]. For planar structures, however, beamline implantation has retained its ascendancy, and defect engineering techniques have focused on that mode of dopant introduction.

Figure 75:
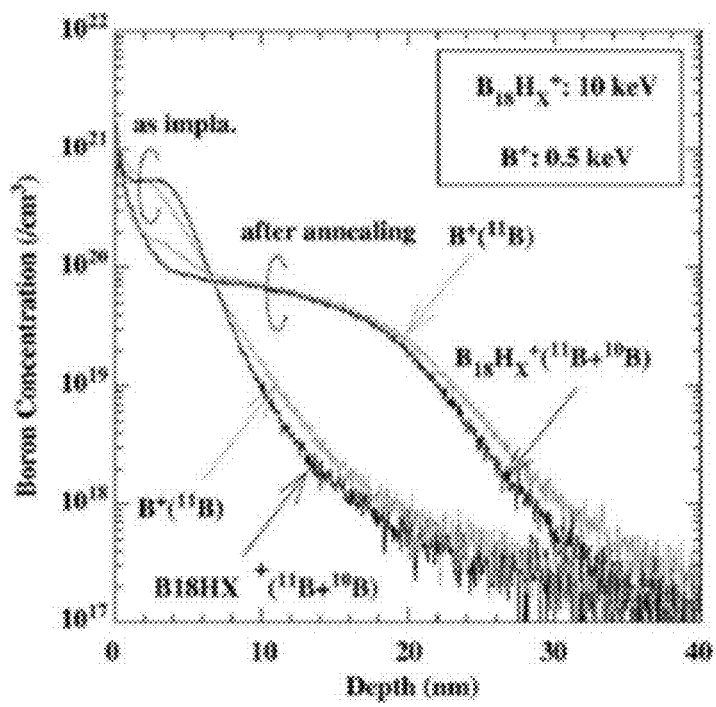
FIG. 75 provides a plot of secondary ion mass spectroscopy (SIMS) profiles of boron in silicon, before and after annealing of $B_{18}H_x^+$ at 10 keV and $B^+$ at 0.5 keV. Reproduced from reference [81] of Example 3.

Molecular (or cluster) doping [17,75] represents a method to reduce such implant-related problems. This approach employs molecules or clusters that contain the dopant atoms instead of single ions or small molecular fragments. The large size of the molecule or cluster permits the use of high acceleration voltages, yet the energy per dopant atom remains small. One important consequence is higher fluxes and therefore higher throughput. Also, upon impact with the solid, defect formation is confined to the near-surface region, and channeling is reduced compared to single atoms or small fragments. Early attempts at molecular doping used decaborane ($B_{10}H_{14}$) [76-79], but limitations in source stability and delivery systems retarded development of the technology. Improvements in the source and the use of other molecules such as octadecaborane ($B_{18}H_{22}$) [80-82] and carborane ($C_2B_{10}H_{12}$) [83,84] have reignited interest, however. Junctions with depths less than 10 nm have been successfully fabricated with favorable device characteristics (FIG. 75).

Figure 76:
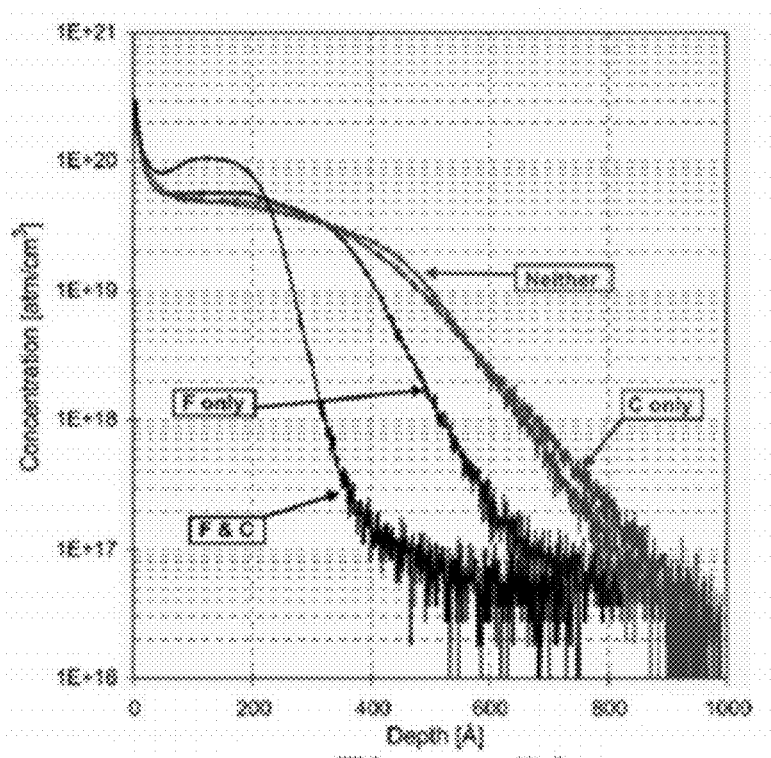
FIG. 76 provides a plot of annealed boron secondary ion mass spectroscopy (SIMS) profiles of B in Si after annealing with the co-implant conditions labeled. Note the dramatic boron diffusion reduction in the case where F and C co-implants are present. Reproduced from reference [96] of Example 3.

Co-implantation of species in addition to the desired dopant represents another promising method for achieving shallow junctions, although in this case, the focus is on enhancing the dopant's electrical activation and reducing its unwanted diffusion during the annealing step. Again, these issues are most pronounced when boron is the dopant. Early co-implantation work examined the effects of F resulting from the implantation of $BF_2$. Ohyu et al. [85] examined the efforts of implanting F subsequent to B, and discovered that the diffusion of B upon annealing decreased, and the degree of electrical activation increased. After further demonstration of salutary effects [86], much effort has been expended to determine the mechanism by which F operates [87-92]. The consensus is that F decreases unwanted boron diffusion by reducing the concentration of excess Si interstitials [89,90] that appear during annealing and mediate B diffusion. This effect generally enhances electrical activation as well, although the results are complicated; F occasionally acts to reduce B activation [87, 89, 92]. Co-implantation of species other than F has also yielded good results. For example, carbon works well for reducing diffusion [93, 94] and increasing activation [95,96] (FIG. 76), either alone or in tandem with F. The operational mechanism again results from a reduction in the concentration of Si interstitials during annealing. Related improvements have been found for the n-type dopant phosphorous [97, 98]. Nitrogen co-implantation offers benefits similar to C or F in the case of boron doping [99-101]. Indeed, some work is now employing "cocktails" of various co-implantation species [96].

Figure 77:
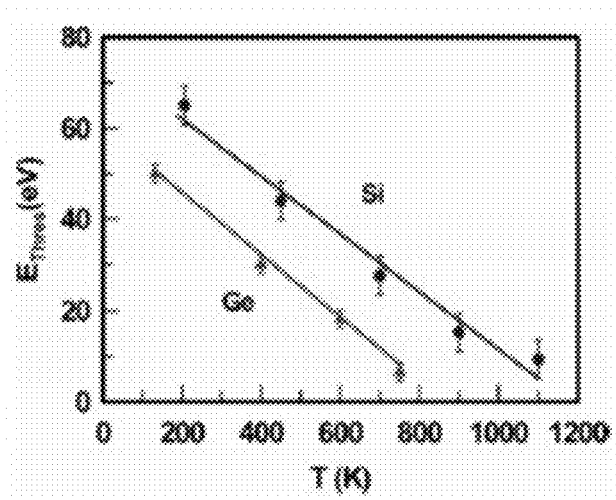
FIG. 77 provides a plot showing dependence of threshold energy upon temperature for Si and Ge adatom formation bombarded with Ar ions, derived from molecular dynamics simulations. Dependence is strong (0.06 eV/K) and obeys the relation $E_{Thres}+\sigma kT=E_{Tot}$ where $\sigma$ and $E_{Tot}$ are constants.

A more subtle and less-investigated mechanism for defect engineering via implantation involves the adjustment of the semiconductor temperature during ion exposure. Such phenomena have been well studied in the context of plasma etching [102-104], ion implantation [105-107], and beam-assisted deposition [108]. Higher temperatures during implantation are known to enhance self-healing and other thermally stimulated processes, rather than the ion-solid interactions themselves. However, measurements of beam-assisted deposition [109-113] and surface diffusion [114, 115] have hinted that temperature may directly affect the dynamics of defect formation when ion energies fall below about 100 eV. None of the experiments yielded a conclusive explanation. However, recent molecular dynamics simulations [116,117] and experiments [117, 118] show that the threshold energies $E_{Thres}$ at which ions begin to induce sputtering, surface adatom formation, surface atom knock-in, and bulk vacancy formation decrease strongly (>0.1 eV/K) as temperature increases. The threshold energies for these four processes differ from one another, but all obey the following phenomenological relation:

$$E_{Thres} = E_{Tot} - \sigma kT,$$

where $E_{Tot}$ and $\sigma$ denote constants and k is Boltzmann's constant. FIG. 77 shows an example for surface adatom formation. Most relevant to defect engineering in the bulk, however, is bulk vacancy formation in the vicinity of the surface. In this case, the constants determined by simulation for Si are $\sigma=700$ and $E_{Tot}=92$ eV, with the effects being essentially independent of the bombarding ion's mass. For Ge, σ remains the same as for Si, but $E_{Tot}$ decreases in the ratio $E_{Tot,Si}/E_{Tot,Ge}$=1.37. This ratio falls close to the ratio of cohesive energies $E_{coh,Si}/E_{coh,Ge}$=1.20 and the ratio of melting temperatures $T_{melt,Si}/T_{melt,Ge}$=1.40. Such effects are notable because in ion implantation, the final stages of ion deceleration determine the dynamics of defect formation near the pn junction [119,120]. Changing the temperature during implantation could controllably modulate such effects. Moreover, the mechanism outlined here is not specific to Group IV semiconductors, and may characterize low-energy ion interactions with crystalline materials quite generally. It may therefore be possible to exploit the threshold effects described here by judicious tuning of temperature and ion energy to select for specific defect formation processes.

3.3.3. Vacancy Engineering

Figure 78:
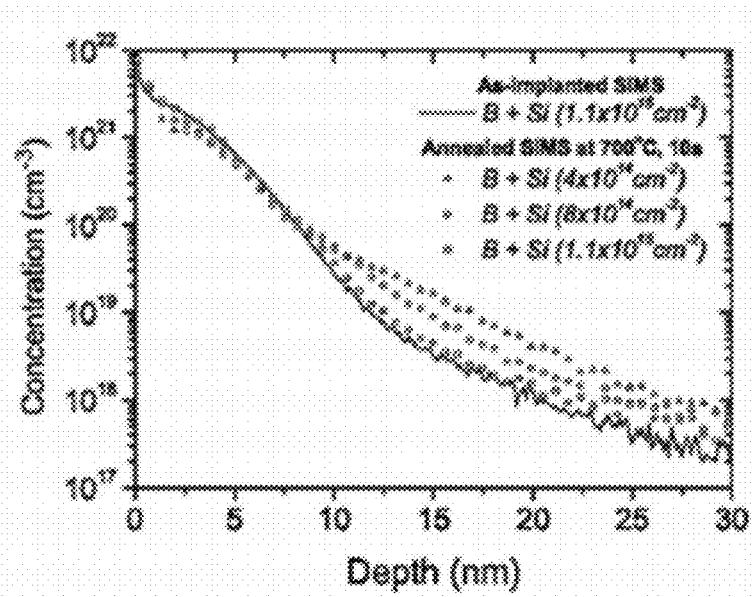
FIG. 78 provides a plot of secondary ion mass spectroscopy (SIMS) analysis of 500 eV B implants after silicon co-implantation, before and after annealing. Symbols show data for three compliant doses: $4\times10^{14}$ cm$^{-2}$ ($\Delta$), $8\times10^{14}$ cm$^{-2}$ (O), and $1.1\times10^{15}$ cm$^{-2}$ ($\square$), after annealing at 700° C. for 10 s. The solid line shows the as-implanted profile (taken from the sample implanted with $1.1\times10^{15}$ cm$^{-2}$ silicon). Reprinted from reference [126] of Example 3.

Vacancy engineering is an implantation-based method that in certain respects resembles co-implantation. Vacancy engineering involves the creation of excess vacancies in the doping region via high-energy co-implantation [121]. The core idea is that doping normally creates a supersaturation of Si interstitials that induce unwanted diffusion [120,122] and electrical deactivation [123, 124] of the dopant. Creating excess vacancies can annihilate these interstitials, thus mitigating these problems. The vacancies are generated by a high-energy (MeV) co-implantation of silicon prior to dopant implantation. The high-energy step knocks Si lattice atoms deep into the bulk, leaving excess vacancies in the near-surface region to be implanted. This method eliminates complications resulting from the co-implantation of distinct elements such as N, C or F. The high-energy ions also damage the gate electrode and dielectric. Nevertheless, recent work (FIG. 78) has demonstrated results for boron diffusion and activation that exceed those for conventional implantation in silicon-on-insulator structures [125,126]. There have been promising results for standard bulk silicon substrates as well [127].

3.3.4. Heating Protocols

Annealing is performed after ion implantation in order to heal residual damage and to place dopant atoms substitutionally on lattice sites, thereby making the dopants electrically active. However, heating that provides sufficient atomic mobility to move atoms into substitutional sites can also promote unwanted spreading of the implanted dopant profile. This spreading deepens the pn junction undesirably. Over the years, empirical studies demonstrated the significant advantages of heating to increasingly high temperatures for increasingly brief periods. Such protocols tend to reduce diffusional profile spreading and improve electrical activation, and have been termed "rapid thermal annealing" [75]. In practice, such protocols were initially implemented with incandescent lamps to achieve ramp rates up to several hundred K/s, with the time at maximum temperature being on the order of 1 s.

Figure 79:
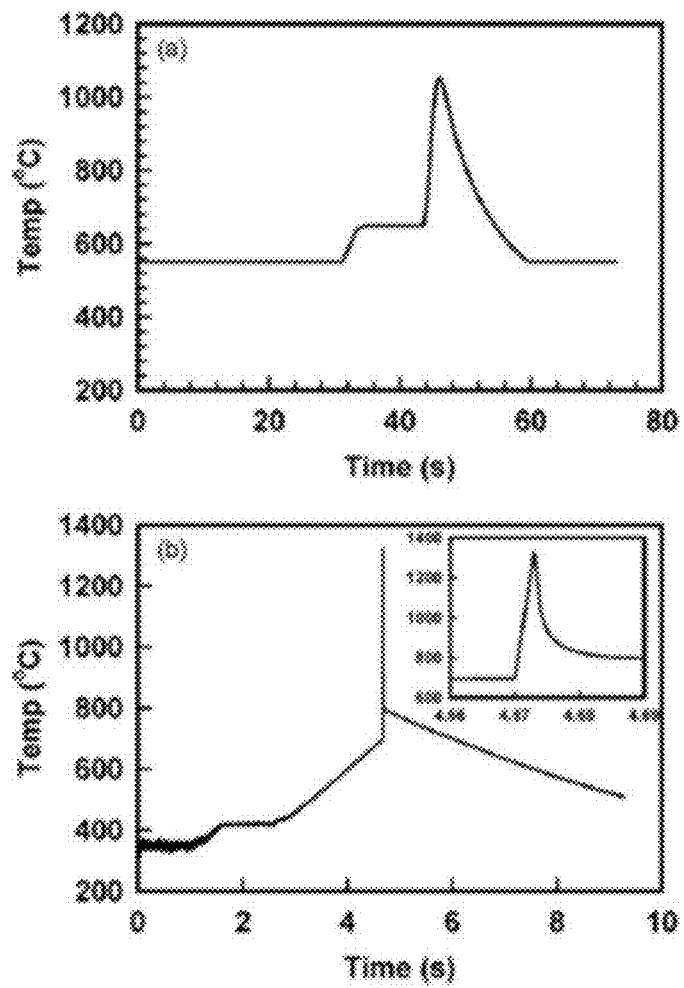
FIG. 79 provides plots of (a) temperature trajectory for rapid thermal annealing with a peak temperature of 1050° C. and (b) annealing program for millisecond anneal experiment with a peak temperature of 1322° C. Inset shows the detailed temperature trajectory. After reference [134] of Example 3.
Figure 80:
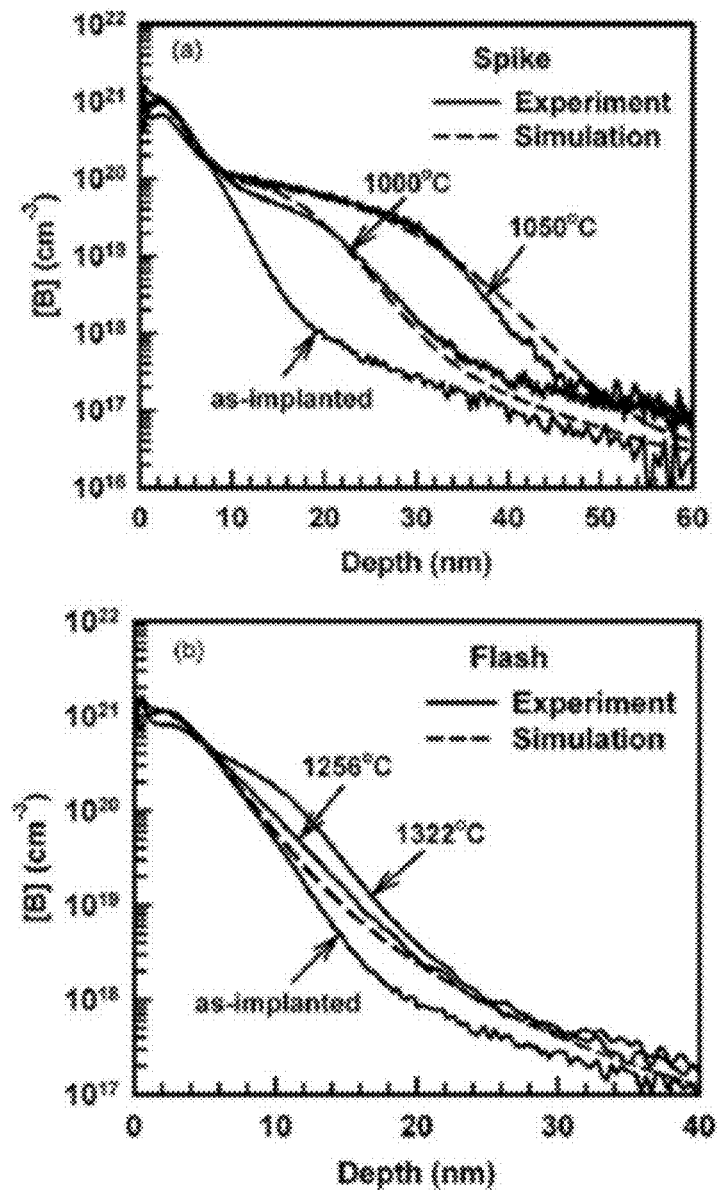
FIG. 80 provides plots of experimental and simulated boron profiles in silicon using a priori parameter estimates for (a) conventional rapid thermal annealing at 1000° C. and 1050° C. and (b) millisecond annealing to 1256° C. and 1322° C. The millisecond annealing simulations essentially overlay each other and are indistinguishable from each other, in contrast to the experimental profiles. After reference [134] of Example 3.

As device sizes scaled downward and junction depths became shallower (20 nm and below in present technology), the trend toward higher temperatures and shorter times continued—to within roughly 100° C. of the melting point of Si for millisecond durations (FIG. 79) [128]. Optical sources have progressed to excimer lasers [129-131], xenon flash lamps [35,129,132,133], and others. Computational modeling has shown [134,135] that short-time annealing constitutes a form of defect engineering. Short times reduce unwanted dopant spreading by greatly reducing the time for diffusion, which more than compensates for an increased concentration of Si interstitials that promote dopant spreading. In moving from conventional rapid thermal annealing to millisecond annealing of boron in Si, for example, the rate of interstitial-mediated dopant diffusion increases by almost 2 orders of magnitude due to the higher temperature, but the time scale is reduced by almost 3 orders of magnitude [136]. The net consequence is reduced profile spreading, as shown in FIG. 80. Millisecond techniques also favorably alter the relative balance of dopant interstitial sequestration by the crystal lattice vs. interstitial clusters, which leads to improved electrical activation at depths just short of the junction. Again, the key factor is the reduction in time scale, which significantly reduces the amount of re-accretion of dopant interstitials into interstitial clusters.

Proper device functioning requires the management of several kinds of defects during processing, ranging from native and dopant point defects to native and dopant defect clusters to extended structures such as end-of-range defects. Consequently, various combinations of millisecond annealing with more conventional thermal annealing have been developed [137,138]. With respect to interstitial clusters, for example, the rate of dissociation depends upon both peak temperature and ramp-rate. A higher ramp-rate reduces cluster dissociation, which keeps dopant atoms locked in an inactive state [132,139,140]. Annealing to higher temperatures can mitigate this problem to some extent. However, differential thermal expansion among the various materials present in the device can lead to wafer warpage or breakage. The melting point of the underlying Si also imposes an obvious constraint. Thus, elevating the annealing temperature suffers limits in terms of dopant activation; removal of end-of-range defects suffers similarly [139,141,142]. Multiple exposures to the optical source (laser beam [142] or flashlamp [143,144]) are sometimes employed to circumvent these problems. Combination of millisecond processing with furnace annealing [137] or conventional rapid thermal annealing [145,146] seeks to accomplish similar goals. However, the optimal combination of laser (or flashlamp) pulse duration, number of pulses, and incorporation of standard annealing methods remains a subject of active research [147].

3.3.5. Solid Phase Epitaxial Regrowth

Solid phase epitaxial regrowth (SPER) represents a strategy to avoid the strong variations of dopant concentration with depth that ion implantation entails, and to obtain concentrations of active dopant that are larger than the solid solubility limit. In SPER, a surface layer is intentionally amorphized by high-dose ion implantation. Upon heating, recrystallization commences with the underlying crystalline substrate serving as the seed. Dopant atoms diffuse quickly within the amorphous layer, and therefore redistribute themselves fairly uniformly before being frozen in place by recrystallization. Problems with defects remain, however. Large numbers of "end of range" extended defects persist at the original boundary between the amorphous layer and the underlying crystalline seed. These defects promote unwanted current leakage in the finished devices, and also serve as a major source of self-interstitials during subsequent processing steps. The self-interstitials interact with active dopant on lattice sites and deactivate much of it [17,92]. However, extensive modeling of SPER continues by molecular dynamics and atomistic studies to determine the extent to which such problems can be avoided [148-152].

3.3.6. Surface Effects

As junctions move progressively closer to nearby surfaces and interfaces, the possibility arises for using these boundaries themselves for defect engineering. Such engineering could also prove useful in the formation of three-dimensional devices such as FinFETs, as well as a much wider variety of nanostructures having high surface-to-volume ratios. For example, Jie et al. [153] have recently found that the surface chemical state of Si nanowires affects their electrical properties during operation. Carrier mobility was higher when nanowire field-effect transistors operated in vacuum environments as opposed to air. The performance was further improved when the nanowires were embedded in $SiO_2$, which passivates the surface defects. Cui et al. [154] used 4-nitrophenyl octadecanoate to passivate the surface defects on the $SiO_x$ coating around Si nanowires, leading to increases in the average transconductance and mobility.

Figure 81:
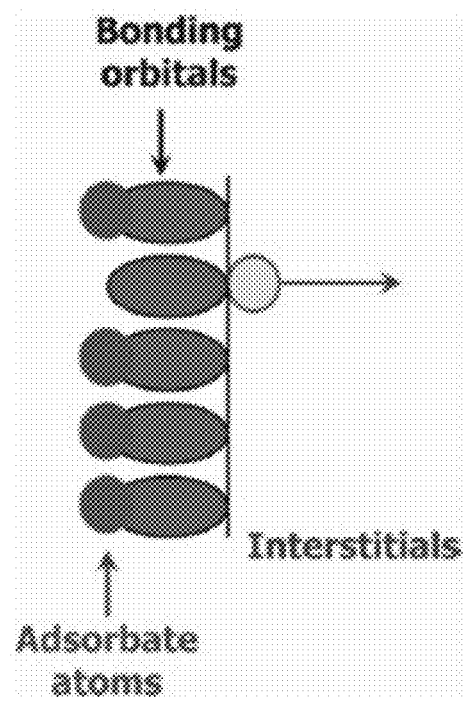
FIG. 81 provides a schematic diagram indicating how formation of bulk defects (interstitials in this example) is more facile at dangling bond locations at a surface or interface than at locations where the surface or interface bonds are chemically saturated.

Related effects are being exploited during device processing. For example, it has been shown [17,48,155] that the behavior of point defects within silicon can be engineered by controlling the chemical state at the surface. One mechanism involves exchange of bulk defects into and out of dangling bonds at a surface or interface. An atomically clean surface is chemically active and can annihilate interstitial atoms (when the bulk is supersaturated with them) by simple addition of the interstitials to dangling bonds. However, if the same surface becomes saturated with a strongly bonded adsorbate, annihilation requires the insertion of interstitials into existing bonds. Such insertion should have a higher activation barrier, and the surface becomes less chemically active toward defects. By principles of microscopic reversibility and detailed balance, dangling bond sites should be especially effective at releasing vacancies or interstitials into the bulk if the bulk is undersaturated in those defects. FIG. 81 depicts this phenomenon.

In the specific application of annealing after ion implantation, excess Si interstitials promote the expulsion of dopant atoms from the desired substitutional atomic sites and the unwanted diffusion of those atoms. Annealing protocols that avoid these problems also leave most of the dopant locked within clusters, rendering it useless. The presence of a large nearby surface "sink" solves this problem by removing Si interstitials selectively over dopant interstitials. Dopant interstitials are impeded in their motion to the surface by exchange with the bulk lattice atoms in a way that Si interstitials are not. The reason is statistical. A dopant interstitial diffusing toward the surface periodically kicks into the lattice, and becomes immobile and electrically active. The kick-in process almost always releases an interstitial of the majority species in the lattice (Si), and the immobilized dopant atom must wait for another Si interstitial to come along in order to become mobile again. Silicon interstitials also exchange with the lattice, but at typical doping levels a lattice exchange event simply yields another Si interstitial atom. Thus, the lattice does not impede the net motion of Si interstitials nearly as much as for the dopant.

Figure 82:
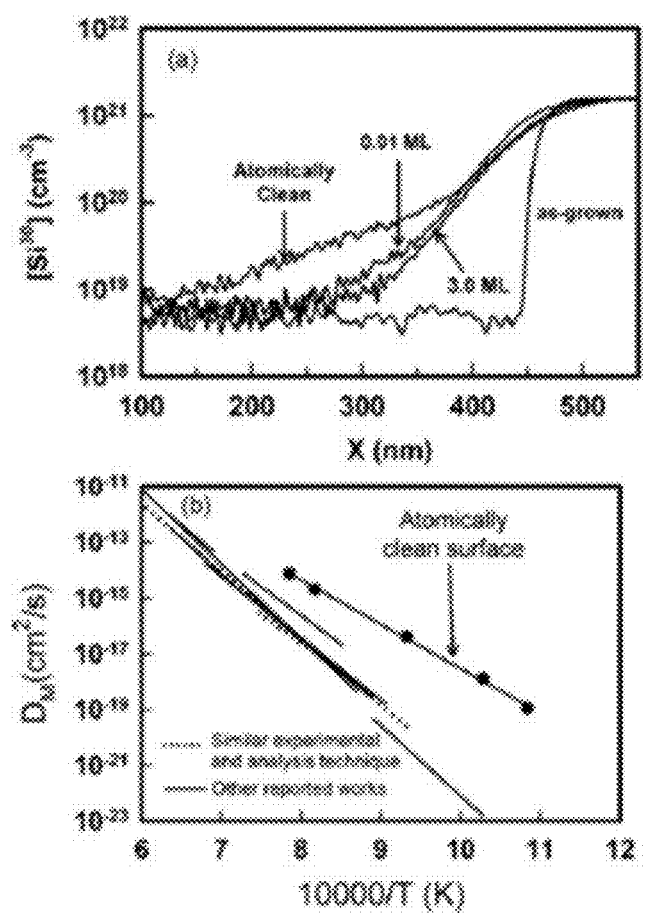
FIG. 82 provides plots of (a) profiles of $^{30}Si$ in isotopic heterostructures. Depth is measured with respect to the surface. Specimens (other than as-grown) supported various coverages of N, and were heated at 1100° C. for 60 min. and (b) self-diffusion coefficients in n-doped Si for the atomically clean (100) surface compared with literature reports with various methods and doping levels. After reference [48] of Example 3.
Figure 83:
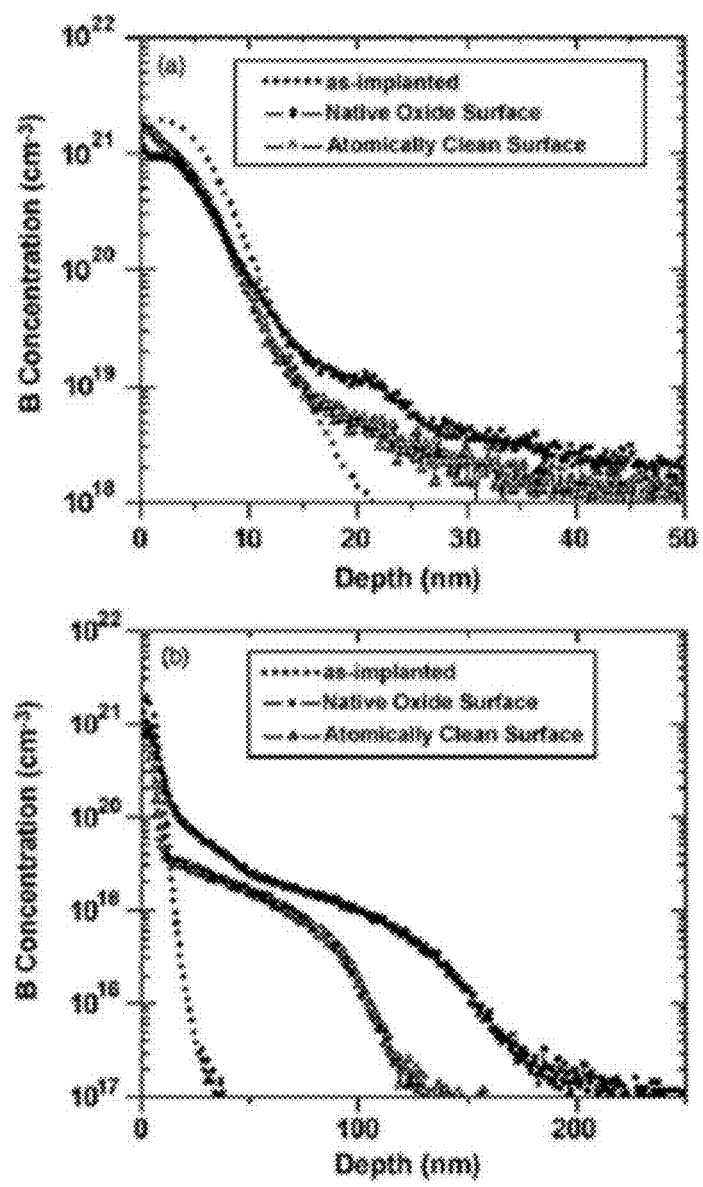
FIG. 83 provides plots of secondary ion mass spectroscopy (SIMS) profiles of 500 eV B implant in silicon with prior 15 keV Ge preamorphizing implant. Annealing was performed at (a) 700° C. and (b) 800° C. for 60 min. The atomically clean surface leads to reduced diffusion in both cases. After reference [156] of Example 3.

Recent experiments have demonstrated these effects [48, 155-157] via bulk diffusion measurements. For example, a nearby surface that is atomically clean greatly inhibits the self-diffusion of implanted isotopically labeled Si [48]. Controlled adsorption of atomic nitrogen on Si(1 0 0) to saturate dangling bonds has proven capable of controlling the annihilation probability of self-interstitials over two orders of magnitude (FIG. 82), with effects evident even at coverages as small as 0.01 monolayers. Related effects have also been measured for dopants such as arsenic [155] and boron [156]. In the boron case (FIG. 83), the atomically clean, chemically active surface yielded reduced diffusion and increased dopant activation, as well as a substantial reduction of end-of-range defects due to annihilation of excess interstitials emitted from those defects.

Figure 84:
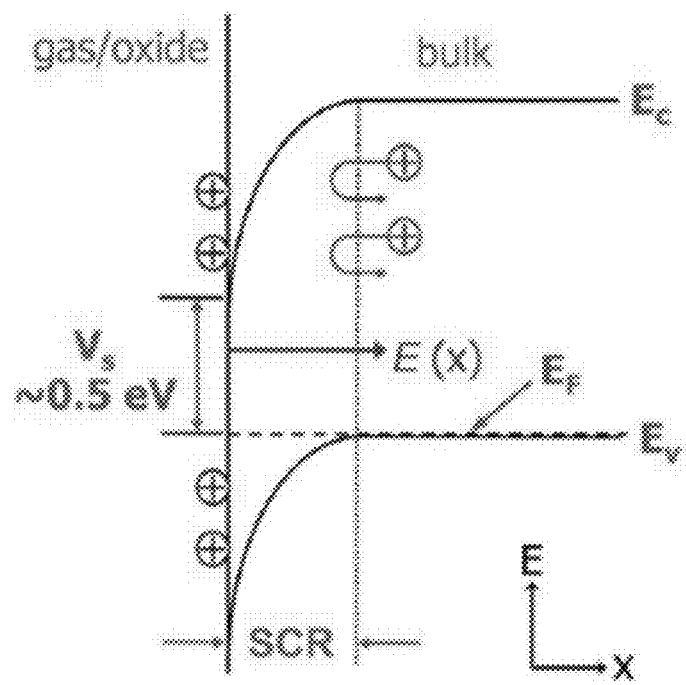
FIG. 84 provides a schematic diagram showing how electric fields that build up at surfaces or interfaces due to band bending can interact with charged defects. In typical cases, the defects are repelled from the surface.

A second mechanism exists for a surface or interface to control bulk defects: through electrostatics [47,158,159]. Atomically clean semiconductor surfaces often support electrically charged defects that become electrically charged by withdrawing or injecting electrons into the underlying bulk. The exchange of charge takes place between the surface and layer of the underlying bulk—the "space charge region." The charge exchange, together with the variation of electric potential within the space charge region, creates an electric field as shown in FIG. 84 in the case of p-type bulk doping. When the background carrier concentration is large, the space charge region becomes very narrow and leads to large gradients in electric potential and therefore a high local electric field. This field can attract or repel charged bulk defects from the surface, depending upon their charge state. The change in electric potential can also induce dopant pileup within the first 4-10 nm of the surface [159]. If the diffusing point defects are capable of assuming multiple charge states and the change in near-surface electric potential is large enough, the defects near the surface change their charge state from the values they would have in the deep bulk. In this way, near-surface defects that would otherwise be repelled from the surface might experience a neutral interaction or even an attraction, leading to pileup.

3.3.7. Photostimulation Effects

The need for precise defect control when fabricating devices of nanoscale dimensions, coupled with the optical methods commonly employed for making pn junctions, raises the question of whether illumination acts merely to create heat or also to affect other aspects of defect behavior. Indeed, optical photostimulation excites the formation of extra charge carriers. The additional carriers in turn can alter the average charge state of defects that are present. Since charge state affects both the formation energy and diffusion constants of point defects [44,45], effects can propagate through into phenomena such as defect diffusion.

Figure 85:
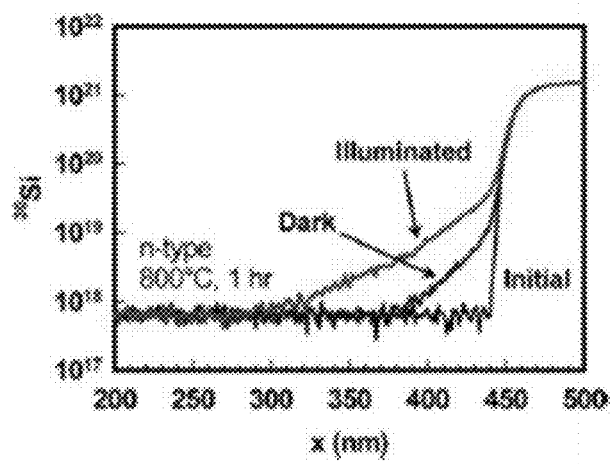
FIG. 85 provides a plot of secondary ion mass spectroscopy (SIMS) profile of $^{30}Si$ in isotopic heterostructures showing illumination enhancement at 800° C. for 1 h (n-type). After reference [165] of Example 3.
Figure 86:
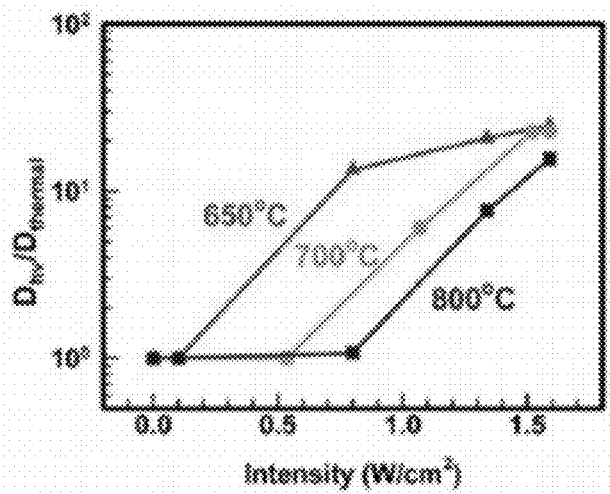
FIG. 86 provides a plot showing illumination enhancement factor versus illumination intensity for n-type Si.

This chain of events was first postulated in the early 1990s [160], but has been unambiguously demonstrated for bulk diffusion only recently through experimental techniques that decouple heating and illumination [161-165]. For self-diffusion in n-type Si, illumination increases the diffusivity by a factor of up to 25 in response to optical fluxes near 1.5 $W/cm^2$ (FIG. 85). FIG. 86 shows the dependence of photostimulated diffusivity versus intensity. The degree of illumination enhancement varies with both temperature and intensity. Importantly, no photostimulation effects are observed for p-type material under similar experimental conditions. The difference in behavior between n- and p-type material gives strong evidence that the observed enhancement in n-Si is genuine, and not an artifact of a spurious heating effect.

The exponential profile shapes in FIG. 85 represent the signature of mass transport via a fast-moving intermediate species. That species turns out to be the Si interstitial under the conditions of these experiments [166]. Through the use of Shockley-Read statistics [167] as extended by Simmons and Taylor [168], a non-equilibrium steady-state model can be formulated [136] to describe the charge state of the interstitials. Such analysis shows that both the site-to-site hopping rate and the concentration of mobile interstitials are affected by illumination.

Figure 87:
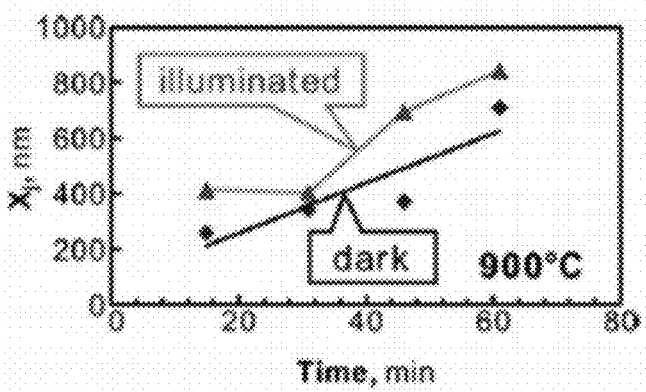
FIG. 87 provides a plot of junction depth $X_j$ for B implanted into Si (500 eV, $1\times10^{15}$ atom/cm$^2$) through thermally grown oxide and annealed. Photostimulation intensity of 2 W/cm$^2$ stimulates more diffusion, leading to a deeper junction. However, details of the results change if the oxide is grown natively rather than thermally.

There is similar experimental evidence for photostimulated diffusion of boron and arsenic implanted into silicon [162,169], with example data for boron shown in FIG. 87. Both the diffusion and activation of these dopants vary significantly with illumination at the 1-2 $W/cm^2$ level. In the case of boron, some of the behavior appears to originate from mechanisms distinct from photostimulated changes in charge state of the mobile species. Instead, photostimulation changes the charge state of defects residing at a nearby surface or interface. Those defects can interact electrostatically with charged bulk defects as described in the previous section. Thus, changes in the amount of charge at the surface propagate through into changes in the ability of the surface to absorb bulk defects or to induce near-surface dopant pileup.

3.4. Non-Si Microelectronics

Semiconductors apart from Si also find important uses in microelectronics. Some of the earliest devices were based on germanium, and this element is enjoying a resurgence of interest. Ge possesses many beneficial electrical properties, including a higher carrier mobility compared to Si. From a processing perspective, Ge permits the use of lower temperatures for dopant activation and defect reduction [171] (although ion implantation produces comparatively more damage [172]). Until recently, the main drawback to Ge compared to Si has been the absence of a stable native oxide for Ge. However, mainstream Si technology is shifting away from its reliance on the native oxide, and is moving toward other high-dielectric constant materials such as hafnium-based oxides. The absence of a good native oxide is therefore no longer so problematic for Ge.

Due to the many similarities of Ge and Si, the defect engineering techniques already developed for Si can be employed readily for Ge. Examples include the use in Ge of flash annealing [173], laser annealing [174,175], plasma doping [174], and vacancy engineering [176]. Specific details do differ from the Si case, however. For example, boron diffuses rather slowly in Ge, and has low solid solubility [172,177-179]. Yet common n-type dopants such as P, As and Sb diffuse rapidly even at relatively low temperatures near 500° C. [180, 181]. Hence, diffusion and activation problems tend to be worse for n-type dopants in Ge than for p-type—opposite to the case of Si.

Figure 88:
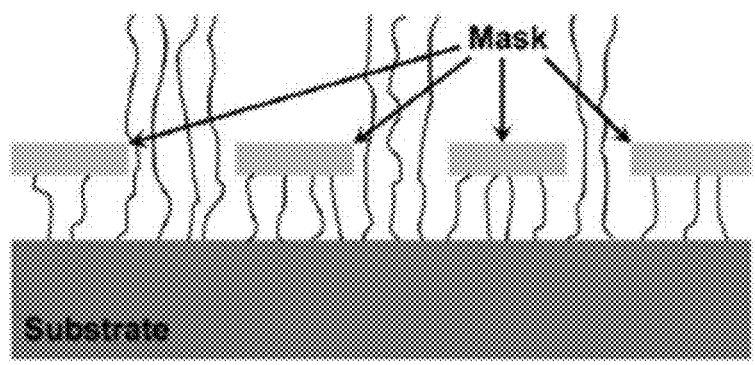
FIG. 88 provides a schematic of epitaxial lateral overgrowth. Black lines depict dislocations.

Compound semiconductors such as III-V and II-VI materials comprise another class of constituents for microelectronics. By mixing different cationic and anionic elements (e.g., Ga and In in $Ga_xIn_{1-x}As$), the band gap of the alloy material can be tuned. This property enables the fabrication of heterojunctions and high electron mobility transistors (HEMTs). Compound semiconductors find widespread use in optoelectronic devices such as light emitting diodes and laser diodes, as well as PV cells. In fact, PV cells with the highest efficiencies have been fabricated using multiple layers of compound semiconductors [182,183]. The main challenge of fabricating such devices originates from the need for multiple layers of different composition with few defects. The varying composition of the layers to achieve the required band gaps alters the lattice constants, which complicates the creation of perfect epitaxial layers. Lattice mismatch between layers fosters the formation of threading dislocations that degrade device performance. Two primary methods have been employed to overcome these problems: step grade growth and epitaxial lateral overgrowth. Step grade growth [182,184] exploits the fact that the lattice constant of compound semiconductors is proportional to the ratio of the constituting elements. By growing multiple layers with a gradually changing ratio of the components, it is possible to vary the lattice constant gradually through the layers. This gradation reduces the stress between layers and inhibits the formation of dislocations. In epitaxial lateral overgrowth (FIG. 88) [185,186], the base material grows on the substrate through a mask and eventually spreads laterally on top of the mask. The presence of the mask reduces the formation of dislocations, and any stress that was formed by the mask is reduced by the lateral overgrowth. The concentration of threading dislocations decreases significantly.

In addition to these extended defects, other defects that form deep states within the band gap and trap charge also degrade the performance of devices. For example, gate-lag effects, current collapse, and gate leakage currents in HEMTs have been associated with the surface states of the material [187-191]. More recently, these phenomena have been attributed to surface charge states, surface defects and also nitrogen vacancies (for nitride semiconductors) [188,192,193]. By the use of surface treatment or surface passivation, e.g., $H_2$, $N_2$, or $NH_3$ plasma treatment, the leakage current has been found to decrease significantly [187,188,191].

Figure 89:
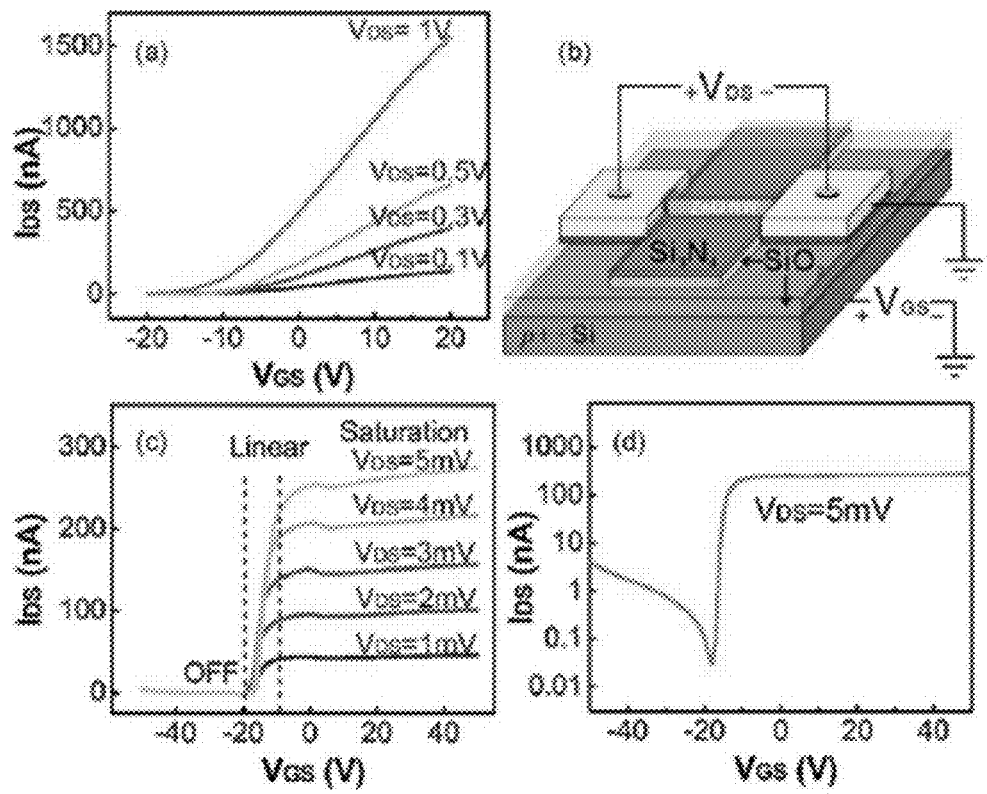
FIG. 89 provides plots and a schematic showing transport measurements present (a) $I_{DS}$—$V_{GS}$ curves of a ZnO nanowire FET without surface treatments showing typical n-type semiconducting behavior; (b) schematic of surface passivated ZnO nanowire FET with SiO$_2$/Si$_3$N$_4$ bilayer covering the nanowire channel; (c) $I_{DS}$—$V_{GS}$ of a surface treated nanowire FET exhibits significantly enhanced on/off ratio and transconductance; and (d) semilog plot demonstrates a tenfold reduction in the subthreshold swing. At large negative gate voltages, band bending gives rise to hole conduction. Reprinted from reference [195] of Example 3.
Figure 90:
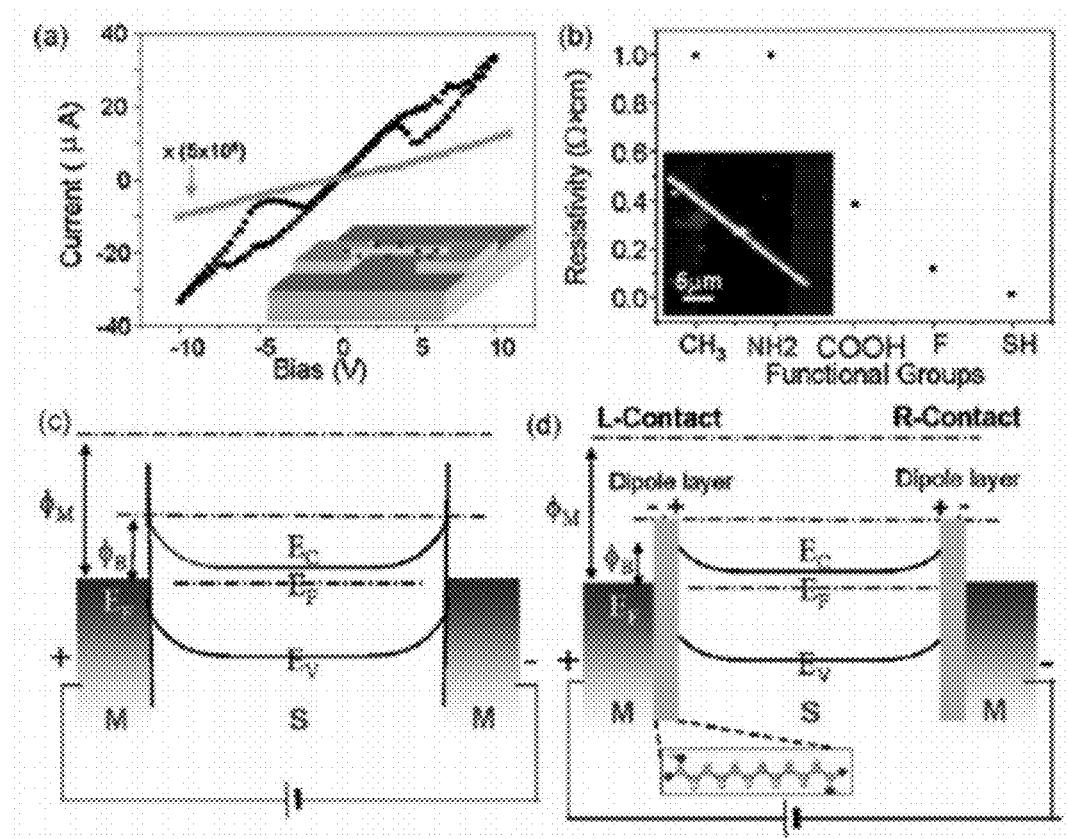
FIG. 90 provides plots showing: (a) I-V characteristics of a ZnO nanobelt (NB) functionalized with the self-assembled thin molecule layer, HOOC(CH$_2$)$_{10}$COOH (black line), and an untreated ZnO NB sample. The current of the untreated NB is magnified by $5\times10^5$ times for comparison purpose. Note: no Pt was deposited at the contacts so that the measured current for the untreated NB is low. Inset is a schematic view of the nanobelt device. (b) Resistivity of the NBs coated with different molecules. The lower inset image is an AFM image of a coated NB lying across two electrodes. (c) Energy-level diagram of metal/semiconductor/metal interfaces; øM is the work function of the metal. There is an energy barrier øB between the metal contact and the untreated NB. (d) Energy-level diagram of the Au electrode and a ZnO NB with a thin molecular layer between. The molecules form an interface dipole layer, which helps to decrease the energy barrier between the NB and Au. Reprinted from reference [196] of Example 3.

Field-effect transistors (FETs) are three-terminal devices that use a voltage applied to a controlling gate terminal to control the conductivity of a nearby channel connecting the source terminal to the drain terminal. Recently, nanowires (NWs) have found use as the channels in FETs. Several materials have been employed, including Si, GaAs, ZnO, $SnO_2$, and others. The performance of these devices depends upon the doping state, NW size, and presence of surface states and bulk defect states. As mentioned previously, various surface treatments alter the electronic properties of the NWs. Bulk-oriented defect engineering methods may damage the NWs, and the large surface-to-volume ratio points to surface-based methods as the most effective route for defect engineering. For example, Keem et al. [194] observed an increase in the transconductance (the ratio of the current change at the output port to the voltage change at the input port) and mobility in ZnO NW FETs after the devices were annealed in a $H_2/Ar$ environment. This step reduced the trap charges and contaminants on the surfaces of the NWs. Chang and coworkers [195] found that passivating the surfaces of ZnO NWs with a $SiO_2/Si_3N_4$ bilayer increases the device performance (FIG. 89) in terms of subthreshold swing (which quantifies how sharply the transistor is turned off by the gate voltage), on/off current ratio, and carrier mobility. Lao and coworkers [196] used various types of carboxylic acid self-assembled monolayers with different terminal groups (e.g., stearic acid, lysine, dodecanedioic acid, mercapto-acetic acid, and perfluorotetradecanoic acid) to treat ZnO nanobelts—ribbon-like nanostructures with a rectangular cross section. After treatment, the nanobelts exhibited an increase in conductance by a factor of 106, a change from a Schottky contact to an ohmic contact, and greatly improved photoconductivity and gas sensing response. FIG. 90 shows a schematic of the mechanism.

3.5. Metal Oxides

The science base for accomplishing defect engineering in metal oxide semiconductors is less well developed than for the semiconductors used for electronic devices. Metal oxides always contain at least two primary elements (as distinct from the elemental semiconductors Si and Ge), and the oxides often lose oxygen to the gas phase upon heating. Defect chemistry is therefore more complicated. Electrical characterization of the defects (a primary tool in electronic devices) is more difficult to accomplish in metal oxides, especially those with large band gaps. Determination of carrier type and concentration is problematic because the contacts employed for four-point-probe or Hall-effect measurements need to obey Ohm's Law but actually behave as diodes. Alternative approaches by capacitance-voltage measurements should work in principle for thin film configurations. For a typical oxide such as $TiO_2$, however, the resulting values of carrier concentration vary widely, and the data are often misinterpreted [197-200]. For polycrystalline material, electrically active states at grain boundaries can contribute to the carrier concentration at magnitudes that dominate the bulk crystallites (in some cases). Additionally, the bulk and/or grain boundary states whose energies lie deep within the band gap contribute to the carrier concentration in a way that depends upon applied voltage [201]. Despite these problems, attempts to engineer the defects in metal oxides continue to grow, especially in applications involving gas sensors and photocatalysis.

3.5.1. Gas Sensors

Figure 91:
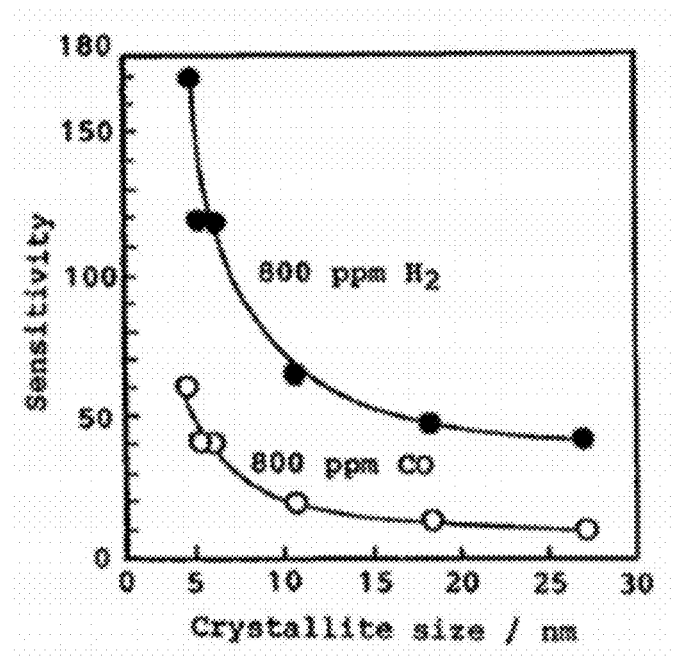
FIG. 91 provides a plot showing influence of SnO$_2$ crystallite size on gas sensitivity to 800 ppm H$_2$ and 800 ppm CO in air at 300° C. (elements sintered at 400° C.). Reproduced from reference [207] of Example 3.
Figure 92:
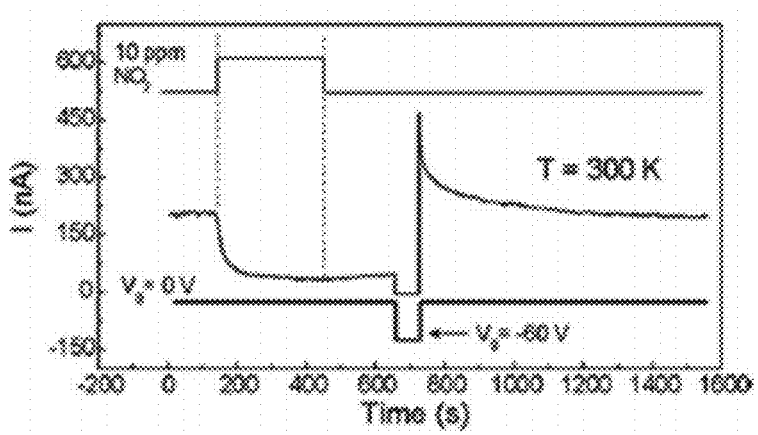
FIG. 92 provides a plot of ZnO nanowire FET sensing response to 10 ppm NO$_2$ and the conductance recovery process caused by a −60 V gate voltage pulse. Reprinted from reference [208] of Example 3.

Gas sensors often employ nanoscale structures composed of semiconducting metal oxides to detect gases such as CO, $NO_x$, $O_2$, and others [202-205]. The gases stimulate a change in electrical properties of the sensor material upon adsorption. As gas molecules adsorb, electrons may be drawn to the surface or injected into the bulk, leading to a change in the width of the near-surface space charge region. When the semiconductor is a thin wire or film, this change induces a change in the overall resistivity, which can be detected in turn via current flowing in the wire or film. Defects play an important role in two respects. Surface vacancies frequently serve as the adsorption sites for gas molecules. Bulk defects (either native or substitutional dopants) are often charged and thereby determine the behavior of the space charge region in response to charge injection or withdrawal at the surface. Early gas sensors were fabricated in the form of films, but the trend in recent years has been toward smaller crystallite size and larger surface areas (FIG. 91) [206,207]. Indeed, nanocrystals, nanowires and nanobelts have found increasing use in gas sensors because of high surface-to-volume ratios. Moreover, nanowires are gaining additional interest as NW FETs became available [202,204,206,208]. These NW FETs exhibit enhanced sensitivity, as their electronic response can be optimized through control of the applied gate voltage. In addition, the application of an appropriate gate potential can also prompt electron driven desorption of the gas molecules, effectively "resetting" the sensor to the initial state in a simple manner (FIG. 92) [208]. This feature is especially useful for operation at room temperature, where thermal desorption is impractical.

In the absence of such an FET configuration, however, optimization of electrical response must be accomplished through doping and defect control. Oxygen vacancies tend to be the dominant electrically active (i.e., charged) defect in metal oxides. Oxygen vacancy control has been achieved by controlling gas-phase oxygen concentration during deposition or by post-treatment in either oxygen or reducing atmospheres [209,210]. Foreign-atom dopants are typically introduced concurrently during growth of the sensor material [211,212]. This approach obviates the need for a separate doping step and yields spatially uniform doping. However, the method provides little direct control over native defects, which are often present in large concentrations. As an alternative to in situ doping, ion implantation has also been used as a post-deposition doping method [213-215]. In addition to introducing dopants, this method also induces point defects on the surface, which increases the concentration of reactive sites, thus enhancing the sensitivity of the sensor. One problem is that ion implantation creates many additional native defects. Also, the ion beam is directional, and it can be difficult to obtain uniform doping for configurations such as nanowires, where the structure is non-planar. A possible way to overcome this difficulty is by employing plasma based doping techniques. With this method, dopants may be implanted perpendicular to the surface regardless of orientation and can ensure uniform doping of non-planar structures.

Figure 93:
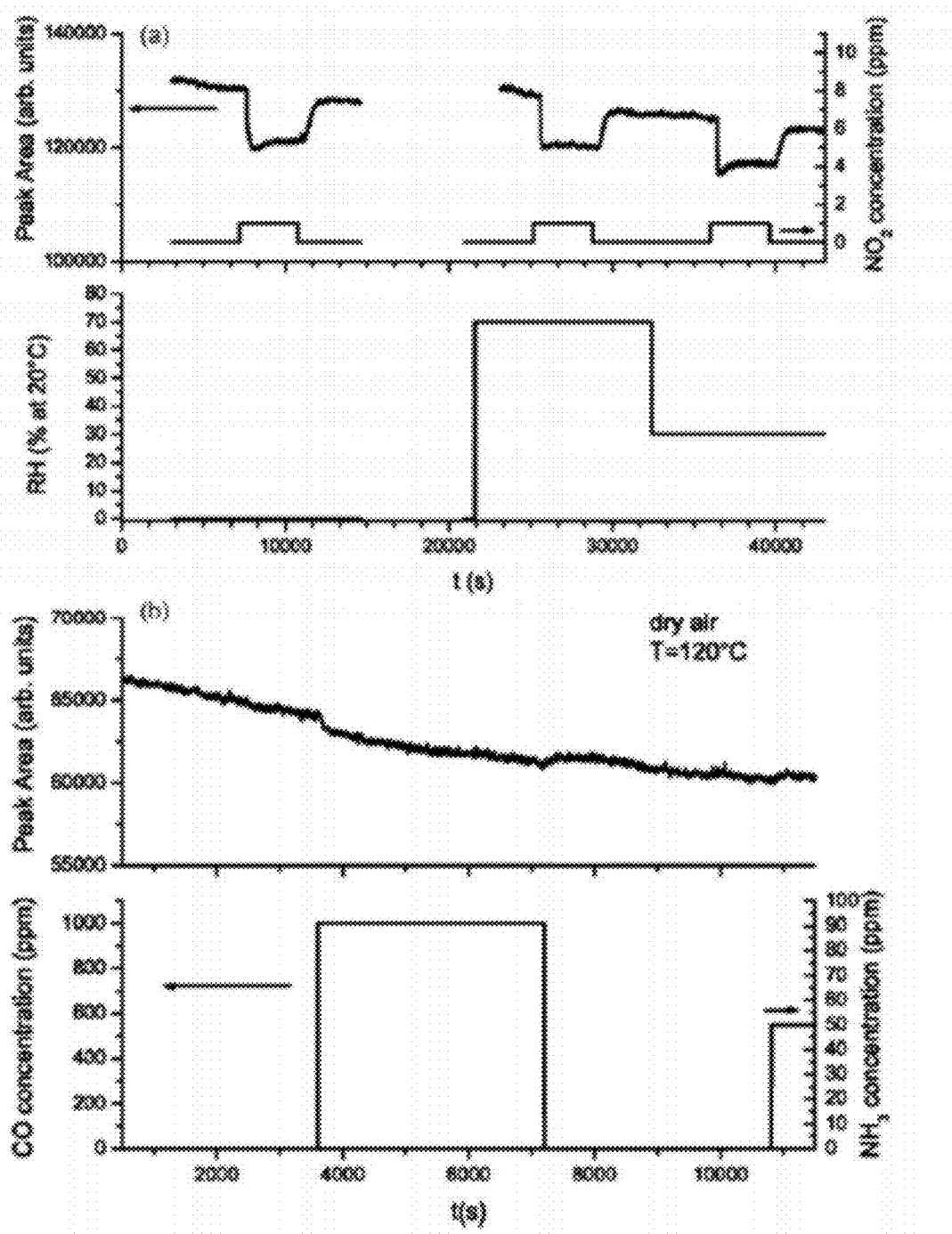
FIG. 93 provides plots showing kinetic response (peak area intensity) of SnO$_2$ nanobelts toward: (a) 1 ppm of NO$_2$ at 120° C. in dry air, in relative humidity (RH)=70% and at 20° C. in RH=30% and (b) 1000 ppm of CO and 50 ppm of NH$_3$ at 120° C. in dry air. Dynamic is fast, reversible, and unaffected by humidity changes. Reprinted from reference [218] of Example 3.
Figure 94:
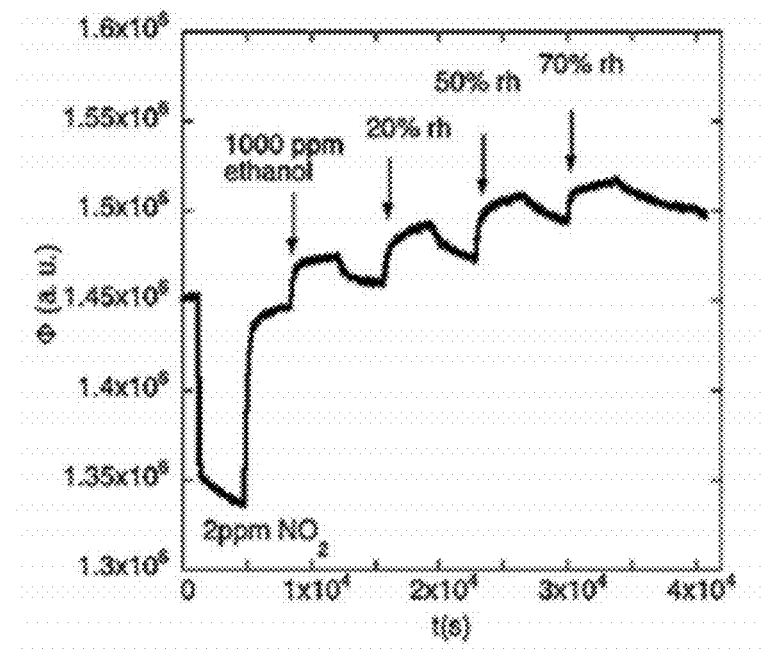
FIG. 94 provides a plot of dynamic photoluminescence quenching of ZnO nanowires versus time as NO$_2$, ethanol and relative humidity (RH) are introduced into the test chamber. The sensor was kept at room temperature. The relative response to ethanol concentration (1000 ppm) is 1.5% while the PL increase with RH gives relative response of 2.8%, 3.9% and 4.6% respectively to 20%, 50% and 70% RH. Reproduced from reference [217] of Example 3.

While the conductance method has been used extensively for gas sensing applications, it also suffers many difficulties in creating good contacts due to the possible formation of Schottky barriers between the sensor material and the metal contacts, as well as difficulties in fabricating accurate contacts due to the small size of the wires. In an attempt to overcome these difficulties, a completely different method of detection based upon photoluminescence (PL) has been developed. Several metal oxides with wide band gaps (equivalent to ultraviolet band-to-band optical absorption) exhibit PL emission in the visible-light range. The defects responsible for this emission remain unclear. Most literature reports agree that oxygen vacancies play an important role, whether directly or indirectly [216]. PL intensity tends to rise as feature sizes shrink, suggesting that surface defects may also play a role [202,217]. For example, Faglia et al. [218] have observed that $NO_2$ adsorption quenches the visible PL emission in $SnO_2$ nanobelts. Furthermore, very low concentrations (in the ppm range) yield noticeable effects, pointing to the possibility of applications in gas sensing (FIG. 93). Similar effects have been found for $NO_2$ on ZnO nanowires [217,219]. In this latter case, selectivity with respect to other important gases is good; the response was unaffected by the presence of CO and perturbed only slightly by gas-phase water or ethanol. FIG. 94 shows that the response changes by less than 5% difference for either 70% relative humidity or 1000 ppm of ethanol [217].

The mechanism of gas detection with PL resembles the conductance method in some respects. Gas molecules adsorb on the surface, which induces a change in a particular defect type within the material, which in turn alters the PL. It is thought that $NO_2$ adsorption creates non-radiative recombination paths for electrons and holes, which reduces PL emission [202,216]. This mechanism permits the construction of relatively simple devices. Since the quenching does not lead to spectral shifts in the PL peak, a combination of an LED for excitation and a photodiode for detection suffices for sensing. Combination of conductive and PL mechanisms within the same device could lead to improved sensitivity and especially gas selectivity.

3.5.2. Photocatalysis

In photocatalysis, illumination creates charge carriers within the semiconductor that migrate to the surface where they drive chemical reactions. Although the form of the material can be thin films (as in self-cleaning windows) or pellets, the constituents of the macroscopic catalyst are typically small crystalline particles a few tens of nanometers in diameter that are pressed or sintered together. Photocatalysis applications include air pollutant mitigation, degeneration of biological wastes, water purification, and direct splitting of water into hydrogen and oxygen for fuel. Many oxide semiconductors exhibit photocatalytic behavior, such as $TiO_2$ [220-222], ZnO[223,224], $SnO_2$ [225,226] and $In_2O_3$ [227,228]. Some of these materials have been commercialized for photocatalysis [220-222]. $TiO_2$ has shown the greatest potential due to its low cost and high stability against degradation by chemical attack or prolonged illumination [41,229].

Most photocatalysis applications seek to employ photons originating from the sun. The most attractive metal oxides, however, have large band gaps (e.g., 3.2 eV for anatase $TiO_2$) that confine photoadsorption to the ultraviolet or blue end of the visible spectrum. The vast majority of solar irradiation lies at longer wavelengths. To increase per-photon efficiency of photocatalysis, the band gaps need to be reduced. Many methods have been tried.

Figure 95:
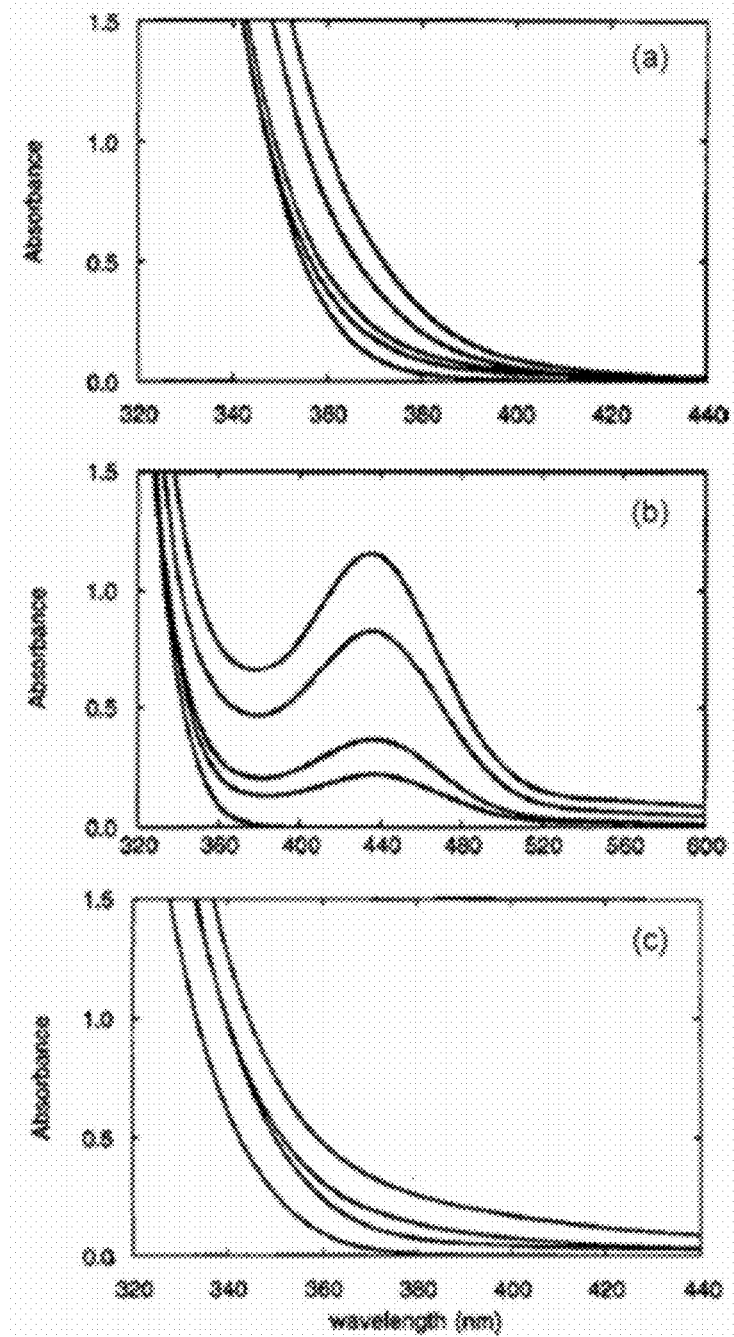
FIG. 95 provides plots of absorption spectra of (a) Fe$^{3+}$ doped quantum (Q)-sized TiO$_2$ (1.34 g/L) at 0.0, 1.0, 2.0, 5.0, and 10.0% Fe$^{3+}$ concentrations (from left to right), (b) Ru$^{3+}$-doped Q-sized TiO$_2$ (0.5 g/L) at 0.0, 0.5, 1.0, 2.0 and 3.0% Ru$^{3+}$ concentrations (from bottom to up), and (c) undoped, Rh$^{3+}$ (3.0%), V$^{4+}$ (3.0%), and Mn$^{3+}$ (3.0%) Q-sized TiO$_2$ at 0.5 g/L (from left to right). Reprinted from reference [230] of Example 3.

One method employs transition metal doping. Elements such as Fe, V, Cr, and Co have been introduced into $TiO_2$ to extend the light absorbance to the visible region (FIG. 95) [230,231]. However, results for photocatalytic activity have been mixed. High levels of metal doping do indeed reduce the band gap, but they also create non-radiative recombination centers that destroy photogenerated carriers and reduce the overall photocatalytic activity [231], although some co-doping strategies have been proposed to mitigate this problem

[232]. Metal doping $TiO_2$ also reduces stability under heat treatment and promotes conversion to the rutile form [231], which is less active than anatase [233]. Metal dopants can exist as cations in the solid solution or form segregated clusters of metal oxides within the photocatalyst. The mechanisms by which such structures influence the photocatalytic activity are complex and vary depending upon the material. Thus, the photoreactivity of doped $TiO_2$ appears to be a complex function of the dopant concentration, the energy levels of dopants within the $TiO_2$ lattice, their electronic configuration, the spatial distribution of dopants, and the light intensity [230]. Part of the complexity arises from the fact that native defect concentrations (and their associated charge states) are rarely monitored in typical photocatalysis studies, let alone controlled [41].

Figure 96:
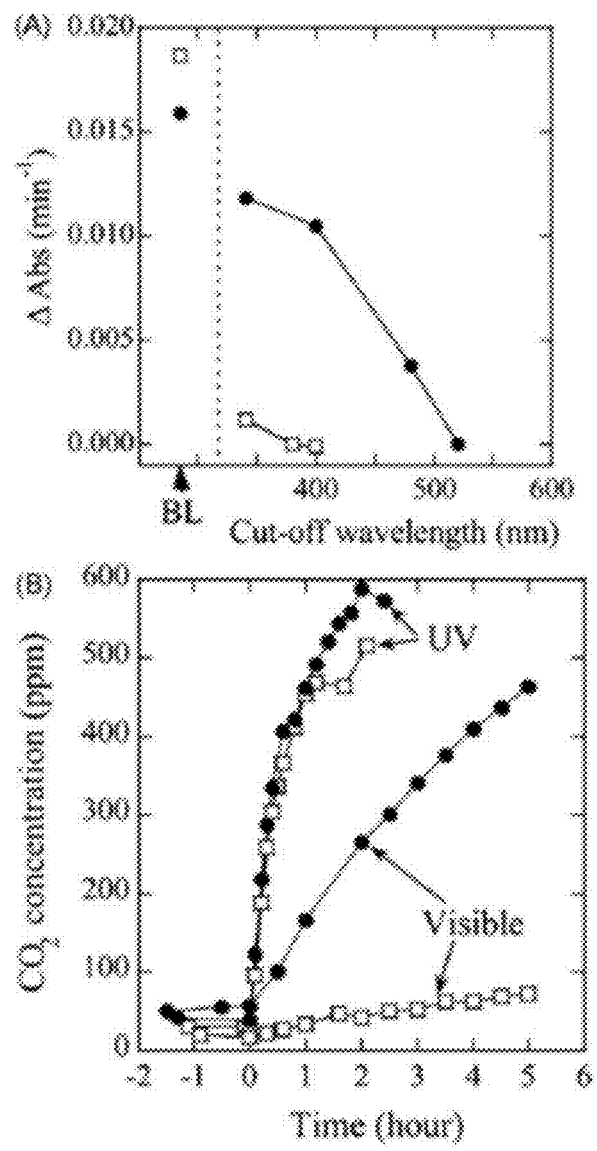
FIG. 96 provides plots of photocatalytic properties of TiO$_{2-x}$N$_x$ samples (solid circles) compared with TiO$_2$ samples (open squares). (A) Decomposition rates [measuring the change in absorption of the reference light (Dabs)] of methylene blue as a function of the cutoff wavelength of the optical high-path filters under fluorescent light with the integrated photon flux of $2.45\times10^{-9}$ einstein (E) s$^{-1}$ cm$^{-2}$ between 350 and 520 nm, compared with the results under black light (BL) illumination with the integrated photon flux of $3.51\times10^{-9}$ E s$^{-1}$ cm$^{-2}$ in the UV range. (B) CO$_2$ evolution as a function of irradiation time (light on at zero) during the photodegradation of acetaldehyde gas [with an initial concentration of 485 parts per million (ppm)] under UV irradiation (BL with a peak at 351 nm and the light power of 5.4 mWcm$^{-2}$) and visible irradiation [fluorescent light cut by the optical highpath filter (SC42, Fuji Photo Film), with a peak intensity at 436 nm and a light power of 0.9 mWcm$^{-2}$]. Reprinted from reference [234] of Example 3.
Figure 97:
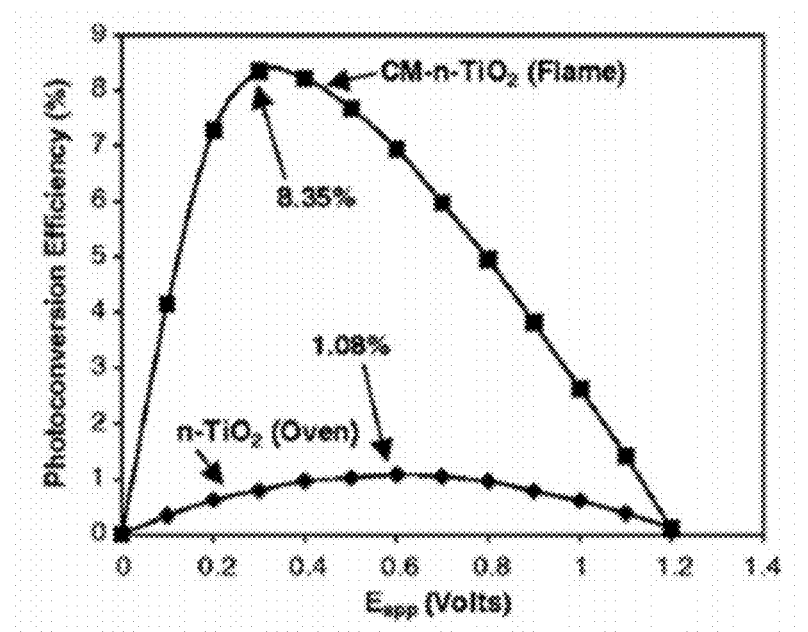
FIG. 97 provides a plot of photoconversion efficiency as a function of applied potential E$_{app}$ at chemically modified n-TiO$_2$ (flame-made) and the reference n-TiO$_2$ (electric tube furnace or oven-made) photoelectrodes under xenon lamp illumination at an intensity of 40 mWcm$^{-2}$. Reprinted from reference [241] of Example 3.

Non-metal anion doping has also been investigated in depth. For example, nitrogen doped $TiO_2$ is capable of visible-light photodegradation of methylene blue and gaseous acetaldehyde (FIG. 96) [234]. Nitrogen atoms substitute into lattice oxygen sites and narrow the band gap by mixing N2p and O2p states. Introduction of nitrogen has been accomplished by methods ranging from amination and nitration to ion implantation and sputtering [229,234-238]. In most cases, the photocatalytic activity increases, but as with metal dopants, there exists evidence that nitrogen incorporation also creates recombination centers [238]. Carbon has also been examined as an anionic dopant in $TiO_2$ due to a significant overlap between the O2p state and the carbon states near the valence band edge [239], even though C can substitute on both Ti and O sites [240]. Such doping has reduced the band gap energy to 2.32 eV, and produced a photoconversion efficiency of up to 8% (FIG. 97) [241]. Park et al. [242] synthesized nanotube arrays of carbon doped $TiO_2$ with photocurrent and water splitting efficiency under visible-light illumination (>420 nm) far exceeding that of corresponding undoped $TiO_2$ arrays. Other non-metals such as S, Br, and Cl have also been used as dopants to decrease the $TiO_2$ band gap and thereby increase photoactive reactivity [243-245]. Anionic doping has been carried out in other metal oxides as well to reduce the band gap. Nitrogen has been doped into ZnO for photocatalytic degradation applications [246], while C and N have found use in water splitting by $In_2O_3$ [227,228].

Figure 98:
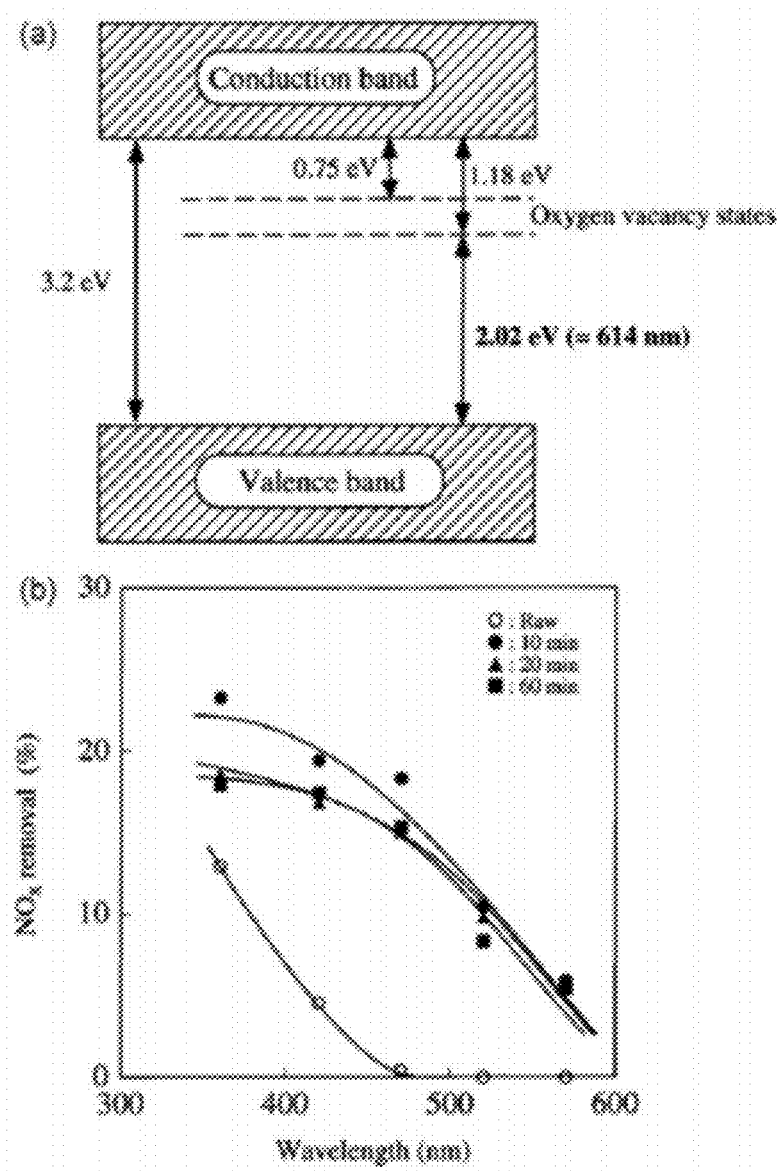
FIG. 98 provides a schematic and plot of (a) a proposed band structure model for anatase TiO$_2$ with oxygen vacancies, and (b) NO$_x$ removal percentage as a function of irradiation wavelength over the raw TiO$_2$ and the plasma-treated TiO$_2$ photocatalysts. Reproduced from reference [250] of Example 3.

Some defect engineering for photocatalysis has avoided doping entirely and attempted simply to control the intrinsic defect concentration. For example, strong chemical reduction of $TiO_2$ promotes optical absorbance in the visible region [247-250], and $Ti^{3+}$—$V_O$—$Ti^{3+}$ centers may serve as catalytically active centers in photoassisted oxidation of water (where $V_O$ represents the oxygen vacancy) [251]. However, high-temperature heating in reducing atmospheres leads to the formation of the rutile phase, which is not favorable for photocatalytic reactions [233]. Thus, low temperature methods must be employed. Ihara and coworkers [249,250,252] used a radio-frequency $H_2$ plasma to reduce $TiO_2$ at lower temperatures and found an increase in the photocatalytic activity of benzoic acid, propanol, and $NO_x$ oxidation. The effect on $NO_x$ oxidation is shown in FIG. 98. Oxygen vacancies also appear to promote photocatalysis by ZnO [253].

3.6. Prospects for Defect Engineering

Considerable progress has been made over the past decade or so in controlling the behavior of defects in semiconductors, driven in large measure by the need to manipulate material properties at the nanoscale. Some methods have become mainstream commercial techniques, especially in electronic devices. Yet many challenges remain, as unambiguous experiments are difficult and computational tools are often unreliable. Furthermore, it is difficult to predict the charged defect behavior of a given semiconductor by comparing it to a similar material [44,45]. For example, vacancies and self-interstitials in silicon and germanium do not display the same set of stable charge states.

Regarding experimental methods, certain defect properties can sometimes be derived from direct methods such as electron paramagnetic resonance, positron annihilation spectroscopy, and deep level transient spectroscopy [44,45]. Yet not all these techniques are well suited to every semiconductor. Experiments are often hampered because most point and extended defects exist at low concentrations and are therefore difficult to observe. As a result, easier-to-implement indirect methods have found common use for inferring information about the type and concentration of bulk point defects. For example, self-diffusion measurements can be made with an isotopic tracer together with secondary ion mass spectroscopy [48,254,255]. Yet such experimental results have often proven conflicting. For example, experimental results have been used to justify diffusion coefficients for the Si self-interstitial that vary by more than ten orders of magnitude at typical processing temperatures [256].

In consequence, ab initio quantum calculations have become commonly used atomic scale tools for investigating defect structure, thermodynamics, charging and diffusion. Yet most quantum calculations are valid only at 0 K, and mechanisms can change at higher temperatures. For example, diffusion in Si at processing temperatures appears to be governed by collective atomic motions that do not operate at lower temperatures [256]. Moreover, quantum calculations typically ignore entropic effects, some of which can change pre-exponential factors by many orders of magnitude [256]. Correction schemes to improve these errors have been proposed by numerous authors, many of which have been reviewed and assessed [257]. Unfortunately, for charged and neutral defects, electrostatic errors arising from multiple interactions affect the accuracy of the formation energy [258, 259]. Various correction schemes have appeared in the computational literature, but they still introduce large errors in the calculated total energies [260,261].

In light of these problems and the complexity of defect reaction and diffusion in many semiconductors, other rationally defensible procedures for estimating ionization levels, formation energies and diffusion coefficients must be accepted in place of certain truth about their values. One approach that deals directly with this problem is the statistical technique of maximum likelihood parameter estimation [262]. This method uses Bayesian statistics to estimate the most likely value for each parameter based on the available literature, and also estimates the corresponding uncertainty. The maximum likelihood approach has proven useful in predicting ionization levels for interstitial atoms in Si [5], as well as their diffusion coefficients [263] and rate constants for their exchange with the lattice [263] and the surface [48,264]. The approach can be extended by a combination of parameter sensitivity analysis [265] and the method of maximum a posteriori estimation [266] to yield further refinements of these quantities for use in predictive models [117].

3.7. Summary

Defect engineering in semiconductors has become much more sophisticated in recent years, driven by the need to control material properties at small length scales. Some methods for defect manipulation have proven quite successful, although efforts in metal oxide semiconductors lag those for the materials used in electronic devices. Promising new mechanisms have been discovered for controlling defects through low-energy ions, surface chemistry, and photostimulation. Yet for many materials no consensus exists about important properties such as which defect charge states are stable, or the values of the Fermi energies at which charge state transitions occur. Experimental determination of this information is often difficult, as defects exist in low concentrations in solids. Quantum methods are improving but remain unreliable for predicting charged defect behavior. Systems based methods for parameter estimation may help fill the gap for the complex diffusion and reaction networks that characterize defect behavior in most key applications.

References for Example 3

[1] H. Bracht, M R S Bull. 25 (2000) 22-27.
[2] N. Dasgupta, A. Dasgupta, Semiconductor Devices: Modeling and Technology, Prentice-Hall, New Delhi, 2004.
[3] P. M. Fahey, P. B. Griffin, J. D. Plummer, Rev. Mod. Phys. 61 (1989) 289-384.
[4] S. M. Hu, Mater. Sci. Eng. R 13 (1994) 105-192.
[5] M. Y. L. Jung, C. T. M. Kwok, R. D. Braatz, E. G. Seebauer, J. Appl. Phys. 97 (2005) 063520.
[6] J. W. Fergus, J. Mater. Sci. 38 (2003) 4259-4270.
[7] W. Baiqi, J. Liqiang, Q. Yichun, L. Shudan, J. Baojiang, Y. Libin, X. Baifu, F. Honggang, Appl. Surf. Sci. 252 (2006) 2817-2825.
[8] Y. Zhang, A. Kolmakov, S. Chretien, H. Metiu, M. Moskovits, Nano Lett. 4 (2004) 403-407.
[9] W. W. Chow, S. W. Koch, Semiconductor-Laser Fundamentals: Physics of the Gain Materials, Springer, Berlin, 1999.
[10] S. Guha, J. M. Depuydt, M. A. Haase, J. Qiu, H. Cheng, Appl. Phys. Lett. 63 (1993) 3107-3109.
[11] G. Lutz, Semiconductor Radiation Detectors: Device Physics, Springer, Berlin, 1999.
[12] S. R. Kurtz, A. A. Allerman, E. D. Jones, J. M. Gee, J. J. Banas, B. E. Hammons, Appl. Phys. Lett. 74 (1999) 729-731.
[13] S. A. Campbell, The Science and Engineering of Microelectronic Fabrication, Oxford University Press, New York, 2001.
[14] R. Doering, Y. Nishi, Handbook of Semiconductor Manufacturing Technology, CRC Press, Boca Raton, 2008.
[15] P. Siffert, E. F. Krimmel, Silicon: Evolution and Future of a Technology, Springer, Berlin, 2004.
[16] E. C. Jones, E. Ishida, Mater. Sci. Eng. R 24 (1998) 1-80.
[17] B. Colombeau, S. H. Yeong, D. X. M. Tan, A. J. Smith, R. M. Gwilliam, C. N. Ng, K. R. C. Mok, F. Benistant, L. Chan, in: Proceedings of the 17th International Conference on Ion Implantation Technology, AIP, Monterey, Calif., (2008), pp. 11-18.
[18] H. J. L. Gossmann, J. Vac. Sci. Technol. B 26 (2008) 267-272.
[19] G. Müller, Cryst. Res. Technol. 42 (2007) 1150-1161.
[20] T. Sinno, E. Dornberger, W. von Ammon, R. A. Brown, F. Dupret, Mater. Sci. Eng. R 28 (2000) 149-198.
[21] J. Vanhellemont, J. Van Steenbergen, F. Holsteyns, P. Roussel, M. Meuris, K. Mlynarczyk, P. S' piewak, W. Geens, I. Romandic, J. Mater. Sci.: Mater. Electron. 19 (2008) 24-31.
[22] E. Chason, S. T. Picraux, J. M. Poate, J. O. Borland, M. I. Current, T. D. delaRubia, D. J. Eaglesham, O. W. Holland, M. E. Law, C. W. Magee, J. W. Mayer, J. Melngailis, A. F. Tasch, J. Appl. Phys. 81 (1997) 6513-6561.
[23] A. Clayerie, B. Colombeau, B. De Mauduit, C. Bonafos, X. Hebras, G. Ben Assayag, F. Cristiano, Appl. Phys. A 76 (2003) 1025-1033.
[24] L. Pelaz, L. A. Marques, M. Aboy, P. Lopez, J. Barbolla, Comput. Mater. Sci. 33 (2005) 92-105.
[25] L. Shao, J. R. Liu, Q. Y. Chen, W. K. Chu, Mater. Sci. Eng. R 42 (2003) 65-114.
[26] P. K. Chu, Plasma Phys. Control. Fusion 45 (2003) 555-570.
[27] J. Pelletier, A. Anders, IEEE Trans. Plasma Sci. 33 (2005) 1944-1959.
[28] S. Walther, R. Liebert, J. Vac. Sci. Technol. B 24 (2006) 482-488.
[29] N. E. B. Cowern, A. J. Smith, N. Bennett, B. J. Sealy, R. Gwilliam, R. P. Webb, B. Colombeau, S. Paul, W. Lerch, A. Pakfar, Mater. Sci. Forum 573-574 (2008) 295-304.
[30] R. M. Gwilliam, N. E. B. Cowern, B. Colombeau, B. Sealy, A. J. Smith, AIP Conf. Proc. 876 (2006) 181-190.
[31] A. Bratschun, J. Electron. Mater. 28 (1999) 1328-1332.
[32] J. Nakos, J. Shepard, Mater. Sci. Forum 573-574 (2008) 3-19.
[33] S. Paul, W. Lerch, Mater. Sci. Forum 573-574 (2008) 207-228.
[34] J. Foggiato, W. S. Yoo, Mater. Sci. Eng. B 124 (2005) 219-222.
[35] W. Skorupa, R. A. Yankov, M. Voelskow, W. Anwand, D. Panknin, R. A. McMahon, M. Smith, T. Gebel, L. Rebohle, R. Fendler, W. Hentsch, RTP 2005-13th IEEE International Conference on Advanced Thermal Processing of Semiconductors, IEEE, Santa Barbara, Calif., (2005), pp. 53-71.
[36] S. O. Kucheyev, J. S. Williams, C. Jagadish, Vacuum 73 (2004) 93-104.
[37] C. Ronning, E. P. Carlson, R. F. Davis, Phys. Rep. 351 (2001) 349-385.
[38] W. Wesch, Nucl. Instrum. Methods Phys. Res. B 68 (1992) 342-354.
[39] M. Anpo, S. Dohshi, M. Kitano, Y. Hu, M. Takeuchi, M. Matsuoka, Annu. Rev. Mater. Res. 35 (2005) 1-27.
[40] M. Ni, M. K. H. Leung, D. Y. C. Leung, K. Sumathy, Renew. Sust. Energ. Rev. 11 (2007) 401-425.
[41] M. K. Nowotny, L. R. Sheppard, T. Bak, J. Nowotny, J. Phys. Chem. C 112 (2008) 5275-5300.
[42] C. G. Van de Walle, Physica B 308 (2001) 899-903.
[43] S. P. Wilks, J. Phys. D: Appl. Phys. 35 (2002) R77-R90.
[44] E. G. Seebauer, M. C. Kratzer, Mater. Sci. Eng. R 55 (2006) 57-149.
[45] E. G. Seebauer, M. C. Kratzer, Charged Semiconductor Defects: Structure, Thermodynamics and Diffusion, Springer, New York, 2008.
[46] D. Hull, D. J. Bacon, Introduction to Dislocations, Butterworth-Heinemann, Oxford, 2001.
[47] K. Dev, M. Y. L. Jung, R. Gunawan, R. D. Braatz, E. G. Seebauer, Phys. Rev. B 68 (2003) 195311.
[48] E. G. Seebauer, K. Dev, M. Y. L. Jung, R. Vaidyanathan, C. T. M. Kwok, J. W. Ager, E. E. Haller, R. D. Braatz, Phys. Rev. Lett. 97 (2006) 055503.
[49] W. Shockley, W. T. Read, Phys. Rev. 87 (1952) 835.
[50] S. M. Sze, Semiconductor Devices, Physics and Technology, Wiley, New York, 2002.
[51] K. Vanheusden, W. L. Warren, C. H. Seager, D. R. Tallant, J. A. Voigt, B. E. Gnade, J. Appl. Phys. 79 (1996) 7983-7990.
[52] S. A. Centoni, B. Sadigh, G. H. Gilmer, T. J. Lenosky, T. D. de la Rubia, C. B. Musgrave, Phys. Rev. B 72 (2005) 195206.
[53] H. Y. H. Chan, K. Dev, E. G. Seebauer, Phys. Rev. B 67 (2003) 035311.
[54] C. E. Allen, R. Ditchfield, E. G. Seebauer, J. Vac. Sci. Technol. A 14 (1996) 22-29.
[55] W. C. Lee, S. G. Lee, K. J. Chang, J. Phys.: Condens. Matter 10 (1998) 995-1002.
[56] J. Tersoff, Phys. Rev. Lett. 65 (1990) 887-890.

[57] P. Mascher, S. Dannefaer, D. Kerr, Phys. Rev. B 40 (1989) 11764-11771.
[58] M. J. Puska, C. Corbel, R. M. Nieminen, Phys. Rev. B 41 (1990) 9980-9993.
[59] P. W. Tasker, A. M. Stoneham, J. Phys. C: Solid State Phys. 10 (1977) 5131-5140.
[60] R. Ditchfield, D. Llera-Rodriguez, E. G. Seebauer, Phys. Rev. Lett. 81 (1998) 1259-1262.
[61] R. Ditchfield, D. Llera-Rodriguez, E. G. Seebauer, Phys. Rev. B 61 (2000) 13710-13720.
[62] E. G. Seebauer, in: Proceedings of the 7th International Conference on Solid-State and Integrated Circuits Technology, IEEE, Beijing, 2004, pp. 1032-1037.
[63] G. Müller, Perspectives on Inorganic, Organic and Biological Crystal Growth: From Fundamentals to Applications: Based on the lectures presented at the 13th International Summer School on Crystal Growth, Park City, Utah, USA, 2007, pp. 3-33.
[64] E. Dornberger, W. von Ammon, J. Virbulis, B. Hanna, T. Sinno, J. Cryst. Growth 230 (2001) 291-299.
[65] M. S. Kulkarni, Ind. Eng. Chem. Res. 44 (2005) 6246-6263.
[66] M. S. Kulkarni, J. Cryst. Growth 303 (2007) 438-448.
[67] M. S. Kulkarni, J. Cryst. Growth 310 (2008) 324-335.
[68] A. Taguchi, H. Kageshima, K. Wada, J. Appl. Phys. 97 (2005) 053514.
[69] X. Yu, D. Yang, X. Ma, J. Yang, L. Li, D. Que, J. Appl. Phys. 92 (2002) 188-194.
[70] D. Yang, J. Chen, H. Li, X. Ma, D. Tian, L. Li, D. Que, J. Cryst. Growth 292 (2006) 266-271.
[71] D. Yang, J. Chen, H. Li, X. Ma, D. Tian, L. Li, D. Que, Phys. Status Solidi A 203 (2006) 685-695.
[72] J. Vanhellemont, P. Spiewak, K. Sueoka, I. Romandic, Phys. Status Solidi C 6 (2009) 1906-1911.
[73] B. Mizuno, K. Okashita, K. Nakamoto, C. G. Jin, Y. Sasaki, K. Tsutsui, H. A. Sauddin, H. Iwai, Extended Abstracts of the 8th International Workshop on Junction Technology, IEEE, Shanghai, 2008, pp. 20-24.
[74] B. Mizuno, Y. Sasaki, C. G. Jin, K. Okashita, K. Nakamoto, T. Kitaoka, K. Tsutsui, H. A. Sauddin, H. Iwai, in: Proceedings of the 9th International Conference on Solid-State and Integrated Circuits Technology, IEEE, Beijing, 2008, pp. 1288-1291.
[75] J. Gelpey, S. McCoy, A. Kontos, L. Godet, C. Hatem, D. Camm, J. Chan, G. Papasouliotis, J. Scheuer, Extended Abstracts of the 8th International Workshop on Junction Technology, IEEE, Shanghai, 2008, pp. 82-86.
[76] A. Agarwal, H. J. Gossmann, D. C. Jacobson, D. J. Eaglesham, M. Sosnowski, J. M. Poate, I. Yamada, J. Matsuo, T. E. Haynes, Appl. Phys. Lett. 73 (1998) 2015-2017.
[77] K. Goto, J. Matsuo, T. Sugii, H. Minakata, I. Yamada, T. Hisatsugu, Technical Digest International Electron Devices Meeting, IEEE, 1996, pp. 435-438.
[78] D. Takeuchi, N. Shimada, J. Matsuo, I. Yamada, Nucl. Instrum. Methods Phys. Res. B 121 (1997) 345-348.
[79] R. Smith, M. Shaw, R. P. Webb, M. A. Foad, J. Appl. Phys. 83 (1998) 3148-3152.
[80] S. Heo, H. Hwang, H. T. Cho, W. A. Krull, Appl. Phys. Lett. 89 (2006) 243516.
[81] Y. Kawasaki, T. Kuroi, T. Yamashita, K. Horita, T. Hayashi, M. Ishibashi, M. Togawa, Y. Ohno, M. Yoneda, T. Horsky, D. Jacobson, W. Krull, Nucl. Instrum. Methods Phys. Res. B 237 (2005) 25-29.
[82] L. A. Marques, L. Pelaz, I. Santos, V. C. Venezia, Phys. Rev. B 74 (2006) 201201.
[83] A. Renau, Extended Abstracts of the 7th International Workshop on Junction Technology, IEEE, Kyoto, 2007, pp. 107-112.
[84] C. F. Tan, L. W. Teo, C. S. Yin, J. G. Lee, J. Liu, A. See, M. S. Zhou, E. Quek, S. Chu, C. Hatem, N. Variam, E. Arevalo, A. Gupta, S. Mehta, Mater. Res. Soc. Symp. Proc. 1070 (2008) 99-104.
[85] K. Ohyu, T. Itoga, N. Natsuaki, Jpn. J. Appl. Phys. 29 (1990) 457-462.
[86] T. H. Huang, H. Kinoshita, D. L. Kwong, Appl. Phys. Lett. 65 (1994) 1829-1831.
[87] N. E. B. Cowern, B. Colombeau, J. Benson, A. J. Smith, W. Lerch, S. Paul, T. Graf, F. Cristiano, X. Hebras, D. Bolze, Appl. Phys. Lett. 86 (2005) 101905.
[88] R. Duffy, V. C. Venezia, A. Hering a, B. J. Pawlak, M. J. P. Hopstaken, G. C. J. Maas, Y. Tamming a, T. Dao, F. Roozeboom, L. Pelaz, Appl. Phys. Lett. 84 (2004) 4283-4285.
[89] D. Girginoudi, C. Tsiarapas, Nucl. Instrum. Methods Phys. Res. B 266 (2008) 3565-3576.
[90] G. Impellizzeri, J. H. R. Dos Santos, S. Mirabella, F. Priolo, E. Napolitani, A. Camera, Appl. Phys. Lett. 84 (2004) 1862-1864.
[91] J. M. Jacques, L. S. Robertson, K. S. Jones, M. E. Law, M. Rendon, J. Bennett, Appl. Phys. Lett. 82 (2003) 3469-3471.
[92] B. J. Pawlak, R. Surdeanu, B. Colombeau, A. J. Smith, N. E. B. Cowern, R. Lindsay, W. Vandervorst, B. Brijs, O. Richard, F. Cristiano, Appl. Phys. Lett. 84 (2004) 2055-2057.
[93] E. Napolitani, A. Coati, D. De Salvador, A. Carnera, S. Mirabella, S. Scalese, F. Priolo, Appl. Phys. Lett. 79 (2001) 4145-4147.
[94] V. Moroz, Y. S. Oh, D. Pramanik, H. Graoui, M. A. Foad, Appl. Phys. Lett. 87 (2005) 051908.
[95] B. J. Pawlak, T. Janssens, B. Brijs, W. Vandervorst, E. J. H. Collart, S. B. Felch, N. E. B. Cowern, Appl. Phys. Lett. 89 (2006) 062110.
[96] A. Vanderpool, M. Taylor, Nucl. Instrum. Methods Phys. Res. B 237 (2005) 142-147.
[97] K. C. Ku, C. F. Nieh, J. Gong, L. P. Huang, Y. M. Sheu, C. C. Wang, C. H. Chen, H. Chang, L. T. Wang, T. L. Lee, S. C. Chen, M. S. Liang, Appl. Phys. Lett. 89 (2006) 112104.
[98] B. J. Pawlak, R. Duffy, T. Janssens, W. Vandervorst, S. B. Felch, E. J. H. Collart, N. E. B. Cowern, Appl. Phys. Lett. 89 (2006) 062102.
[99] N. Auriac, C. Laviron, N. Cagnat, J. Singer, B. Duriez, R. Gwoziecki, G. Chabanne, C. Rando, Extended Abstracts of the 7th International Workshop on Junction Technology, IEEE, Kyoto, 2007, pp. 13-16.
[100] C. T. Liu, E. J. Lloyd, Y. Ma, M. Du, R. L. Opila, S. J. Hillenius, Technical Digest—International Electron Devices Meeting, IEEE, 1996, pp. 499-502.
[101] S. H. Yeong, B. Colombeau, K. R. C. Mok, F. Benistant, C. J. Liu, A. T. S. Wee, G. Dong, L. Chan, M. P. Srinivasan, Mater. Sci. Eng. B 154-155 (2008) 43-48.
[102] J. A. Gregus, M. F. Vernon, R. A. Gottscho, G. R. Scheller, W. S. Hobson, R. L. Opila, E. Yoon, Plasma Chem. Plasma Process. 13 (1993) 521-537.
[103] K. Tsujimoto, S. Okudaira, S. Tachi, Jpn. J. Appl. Phys. 30 (1991) 3319.
[104] J. Wong-Leung, C. Jagadish, M. J. Conway, J. D. F. Gerald, J. Appl. Phys. 89 (2001) 2556-2559.
[105] N. Nitta, M. Taniwaki, T. Suzuki, Y. Hayashi, Y. Satoh, T. Yoshiie, Mater. Trans. 43 (2002) 674-680.

[106] K. Shoji, A. Fukami, T. Nagano, T. Tokuyama, C. Y. Yang, Appl. Phys. Lett. 60 (1992) 451-453.

[107] B. A. Turkot, D. V. Forbes, I. M. Robertson, J. J. Coleman, L. E. Rehn, M. A. Kirk, P. M. Baldo, J. Appl. Phys. 78 (1995) 97-103.

[108] M. A. Nastasi, J. W. Mayer, J. K. Hirvonen, Ion-Solid Interactions: Fundamentals and Applications, Cambridge University Press, New York, 1996.

[109] B. W. Dodson, Nucl. Instrum. Methods Phys. Res. B 59-60 (1991) 481-486.

[110] A. Kuronen, J. Tarus, K. Nordlund, Nucl. Instrum. Methods Phys. Res. B 153 (1999) 209-212.

[111] S. M. Lee, C. J. Fell, D. Marton, J. W. Rabalais, J. Appl. Phys. 83 (1998) 5217-5223.

[112] D. Marton, K. J. Boyd, J. W. Rabalais, J. Vac. Sci. Technol. A 16 (1998) 1321-1326.

[113] J. W. Rabalais, A. H. Al-Bayati, K. J. Boyd, D. Marton, J. Kulik, Z. Zhang, W. K. Chu, Phys. Rev. B 53 (1996) 10781.

[114] R. Ditchfield, E. G. Seebauer, Phys. Rev. Lett. 82 (1999) 1185.

[115] R. Ditchfield, E. G. Seebauer, Phys. Rev. B 63 (2001) 125317.

[116] Z. Wang, E. G. Seebauer, Phys. Rev. B 66 (2002) 205409.

[117] Z. Wang, E. G. Seebauer, Phys. Rev. Lett. 95 (2005) 015501.

[118] Z. Wang, E. G. Seebauer, Surf. Sci. 601 (2007) 2453-2458.

[119] H. H. Lin, S. L. Cheng, L. J. Chen, C. Chen, K. N. Tu, Appl. Phys. Lett. 79 (2001) 3971-3973.

[120] E. G. Roth, O. W. Holland, V. C. Venezia, B. Nielsen, J. Electron. Mater. 26 (1997) 1349-1354.

[121] V. Raineri, R. J. Schreutelkamp, F. W. Saris, K. T. F. Janssen, R. E. Kaim, Appl. Phys. Lett. 58 (1991) 922-924.

[122] V. C. Venezia, T. E. Haynes, A. Agarwal, L. Pelaz, H. J. Gossmann, D. C. Jacobson, D. J. Eaglesham, Appl. Phys. Lett. 74 (1999) 1299-1301.

[123] S. Saito, M. Kumagai, T. Kondo, Appl. Phys. Lett. 63 (1993) 197-199.

[124] L. Shao, J. M. Zhang, J. Chen, D. Tang, P. E. Thompson, S. Patel, X. M. Wang, H. Chen, J. K. Liu, W. K. Chu, Appl. Phys. Lett. 84 (2004) 3325-3327.

[125] N. E. B. Cowern, A. J. Smith, B. Colombeau, R. Gwilliam, B. J. Sealy, E. J. H. Collart, Technical Digest—International Electron Devices Meeting, IEEE, Washington, D.C., 2005, pp. 968-971.

[126] A. J. Smith, N. E. B. Cowern, R. Gwilliam, B. J. Sealy, B. Colombeau, E. J. H. Collart, S. Gennaro, D. Giubertoni, M. Bersani, M. Barozzi, Appl. Phys. Lett. 88 (2006) 082112.

[127] N. S. Bennett, N. E. B. Cowern, H. Kheyrandish, S. Paul, W. Lerch, A. J. Smith, R. Gwilliam, B. J. Sealy, in: Proceedings of the 38th European Solid-State Device Research Conference, IEEE, Edinburgh, 2008, pp. 290-293.

[128] P. Timans, J. Gelpey, S. McCoy, W. Lerch, S. Paul, Materials Research Society Symposium Proceedings, 2006, pp. 3-14.

[129] K. Adachi, K. Ohuchi, N. Aoki, H. Tsujii, T. Ito, H. Itokawa, K. Matsuo, K. Suguro, Y. Honguh, N. Tamaoki, K. Ishimaru, H. Ishiuchi, Digest of Technical Papers—Symposium on VLSI Technology, IEEE, Kyoto, 2005, pp. 142-143.

[130] Y. F. Chong, K. L. Pey, A. T. S. Wee, A. See, L. Chan, Y. F. Lu, W. D. Song, L. H. Chua, Appl. Phys. Lett. 76 (2000) 3197-3199.

[131] Y. Takamura, S. H. Jain, P. B. Griffin, J. D. Plummer, J. Appl. Phys. 92 (2002) 230.

[132] T. Ito, T. Iinuma, A. Murakoshi, H. Akutsu, K. Suguro, T. Arikado, K. Okumura, M. Yoshioka, T. Owada, Y. Imaoka, H. Murayama, T. Kusuda, Jpn. J. Appl. Phys. 41 (2002) 2394-2398.

[133] W. Skorupa, T. Gebel, R. A. Yankov, S. Paul, W. Lerch, D. F. Downey, E. A. Arevalo, J. Electrochem. Soc. 152 (2005) G436-G440.

[134] C. T. M. Kwok, R. D. Braatz, S. Paul, W. Lerch, E. G. Seebauer, J. Appl. Phys. 105 (2009) 063514.

[135] L. Wang, P. Clancy, M. O. Thompson, C. S. Murthy, J. Appl. Phys. 92 (2002) 2412.

[136] T. M. Kwok, Advanced methods for defect engineering in silicon, Ph.D. Thesis, University of Illinois at Urbana-Champaign, 2007.

[137] S. Baek, S. Heo, H. Choi, H. Hwang, J. Vac. Sci. Technol. B 23 (2005) 257-261.

[138] W. Lerch, S. Paul, J. Niess, S. McCoy, T. Selinger, J. Gelpey, F. Cristiano, F. Severac, M. Gavelle, S. Boninelli, P. Pichler, D. Bolze, Mater. Sci. Eng. B 124-125 (2005) 24-31.

[139] J. Borland, A. Mineji, W. Krull, M. Tanjyo, R. Hillard, T. Walker, Solid State Technol. 49-5 (2006) 47-54.

[140] W. S. Yoo, K. Kang, Nucl. Instrum. Methods Phys. Res. B 237 (2005) 12-17.

[141] C. H. Poon, L. S. Tan, B. J. Cho, A. See, M. Bhat, J. Electrochem. Soc. 151 (2004) G80-G83.

[142] J. A. Sharp, N. E. B. Cowern, R. P. Webb, K. J. Kirkby, D. Giubertoni, S. Gennaro, M. Bersani, M. A. Foad, F. Cristiano, P. F. Fazzini, Appl. Phys. Lett. 89 (2006) 192105.

[143] A. Florakis, D. Tsoukalas, I. Zergioti, K. Giannakopoulos, P. Dimitrakis, D. G. Papazoglou, G. Bennassayag, H. Bourdon, A. Halimaoui, Nucl. Instrum. Methods Phys. Res. B 253 (2006) 13-17.

[144] F. Torregrosa, C. Laviron, F. Milesi, M. Hernandez, H. Fal"k, J. Venturini, Nucl. Instrum. Methods Phys. Res. B 237 (2005) 18-24.

[145] S. Earles, M. Law, R. Brindos, K. Jones, S. Talwar, S. Corcoran, IEEE Trans. Electron Devices 49 (2002) 1118-1123.

[146] E. V. Monakhov, B. G. Svensson, M. K. Linnarsson, A. La Magna, M. Italia, V. Privitera, G. Fortunato, M. Cuscuna, L. Mariucci, Appl. Phys. Lett. 87 (2005) 192109.

[147] J. Venturini, M. Hernandez, G. Kerrien, C. Laviron, D. Camel, J. L. Santailler, T. Sarnet, J. Boulmer, Thin Solid Films 453-454 (2004) 145-149.

[148] N. Bernstein, M. J. Aziz, E. Kaxiras, Phys. Rev. B 61 (2000) 6696.

[149] K. Gärtner, B. Weber, Nucl. Instrum. Methods Phys. Res. B 202 (2003) 255-260.

[150] B. A. Gillespie, H. N. G. Wadley, J. Cryst. Growth 311 (2009) 3195-3203.

[151] N. G. Rudawski, K. S. Jones, R. Gwilliam, Mater. Sci. Eng. R 61 (2008) 40-58.

[152] N. G. Rudawski, K. S. Jones, S. Morarka, M. E. Law, R. G. Elliman, J. Appl. Phys. 105 (2009) 081101-081120.

[153] J. Jie, W. Zhang, K. Peng, G. Yuan, C. S. Lee, S. T. Lee, Adv. Funct. Mater. 18 (2008) 3251-3257.

[154] Y. Cui, Z. Zhong, D. Wang, W. U. Wang, C. M. Lieber, Nano Lett. 3 (2003) 149-152.

[155] R. Vaidyanathan, E. G. Seebauer, H. Graoui, M. A. Foad, Appl. Phys. Lett. 89 (2006) 152114.

[156] S. H. Yeong, M. P. Srinivasan, B. Colombeau, L. Chan, R. Akkipeddi, C. T. M. Kwok, R. Vaidyanathan, E. G. Seebauer, Appl. Phys. Lett. 91 (2007) 102112.

[157] X. Zhang, M. Yu, C. T. M. Kwok, R. Vaidyanathan, R. D. Braatz, E. G. Seebauer, Phys. Rev. B 74 (2006) 235301.
[158] K. Dev, E. G. Seebauer, Surf. Sci. 550 (2004) 185-191.
[159] M. Y. L. Jung, R. Gunawan, R. D. Braatz, E. G. Seebauer, J. Appl. Phys. 95 (2004) 1134-1140.
[160] K. A. Schultz, E. G. Seebauer, J. Chem. Phys. 97 (1992) 6958-6967.
[161] M. Y. L. Jung, R. Vaidyanathan, C. T. M. Kwok, E. G. Seebauer (in preparation).
[162] R. Vaidyanathan, New forms of defect engineering in silicon and metal oxide semiconductors, Ph.D. thesis, University of Illinois at Urbana-Champaign, 2007.
[163] M. Y. L. Jung, New surface and optically stimulated physics for modeling diffusion in silicon, Ph.D. thesis, University of Illinois at Urbana-Champaign, 2003.
[164] M. Y. L. Jung, E. G. Seebauer, Extended Abstracts of the 4th International Workshop on Junction Technology, IEEE, Shanghai, 2004, pp. 87-89.
[165] E. G. Seebauer, in: Proceedings of the 8th International Conference on Solid-State and Integrated Circuits Technology, IEEE, Shanghai, 2007, pp. 450-453.
[166] R. Vaidyanathan, M. Y. L. Jung, R. D. Braatz, E. G. Seebauer, AIChE J. 52 (2006) 366-370.
[167] W. Shockley, J. W. T. Read, Phys. Rev. 87 (1952) 823-842.
[168] J. G. Simmons, G. W. Taylor, Phys. Rev. B (Solid State) 4 (1971) 502-511.
[169] R. Vaidyanathan, S. Felch, H. Graoui, M. A. Foad, E. G. Seebauer (in preparation).
[170] Y. Kondratenko, Ph.D. thesis, University of Illinois at Urbana-Champaign, 2009.
[171] C. Claeys, E. Simoen, K. Opsomer, D. P. Brunco, M. Meuris, Mater. Sci. Eng. B 154-155 (2008) 49-55.
[172] G. Impellizzeri, S. Mirabella, E. Bruno, A. M. Piro, M. G. Grimaldi, J. Appl. Phys. 105 (2009) 063533.
[173] A. Satta, A. D'Amore, E. Simoen, W. Anwand, W. Skorupa, T. Clarysse, B. Van Daele, T. Janssens, Nucl. Instrum. Methods Phys. Res. B 257 (2007) 157-160.
[174] S. Heo, S. Baek, D. Lee, M. Hasan, H. Jung, J. Lee, H. Hwang, Electrochem. Solid-State Lett. 9 (2006) 136-137.
[175] J. Huang, N. Wu, Q. Zhang, C. Zhu, A. A. O. Tay, G. Chen, M. Hong, Appl. Phys. Lett. 87 (2005) 173507.
[176] E. Simoen, A. Satta, A. D'Amore, T. Janssens, T. Clarysse, K. Martens, B. De Jaeger, A. Benedetti, I. Hoflijk, B. Brijs, M. Meuris, W. Vandervorst, Mater. Sci. Semicond. Process. 9 (2006) 634-639.
[177] W. C. Dunlap Jr., Phys. Rev. 94 (1954) 1531-1540.
[178] S. Uppal, A. F. W. Willoughby, J. M. Bonar, A. G. R. Evans, N. E. B. Cowern, R. Morris, M. G. Dowsett, J. Appl. Phys. 90 (2001) 4293-4295.
[179] A. Satta, E. Simoen, T. Clarysse, T. Janssens, A. Benedetti, B. De Jaeger, M. Meuris, W. Vandervorst, Appl. Phys. Lett. 87 (2005) 172109.
[180] A. Axmann, M. Schulz, C. R. Fritzsche, Appl. Phys. 12 (1977) 173-178.
[181] A. Satta, T. Janssens, T. Clarysse, E. Simoen, M. Meuris, A. Benedetti, I. Hoflijk, B. De Jaeger, C. Demeurisse, W. Vandervorst, J. Vac. Sci. Technol. B 24 (2006) 494-498.
[182] J. F. Geisz, S. Kurtz, M. W. Wanlass, J. S. Ward, A. Duda, D. J. Friedman, J. M. Olson, W. E. McMahon, T. E. Moriarty, J. T. Kiehl, Appl. Phys. Lett. 91 (2007) 023502.
[183] R. R. King, D. C. Law, K. M. Edmondson, C. M. Fetzer, G. S. Kinsey, H. Yoon, R. A. Sherif, N. H. Karam, Appl. Phys. Lett. 90 (2007) 183516.
[184] F. D. Newman, M. A. Stan, S. L. Murray, C. S. Murray, J. Cryst. Growth 272 (2004) 650-657.
[185] B. Beaumont, P. Venne'gues, P. Gibart, Phys. Status Solidi B 227 (2001) 1-43.
[186] A. Sakai, H. Sunakawa, A. Usui, Appl. Phys. Lett. 73 (1998) 481-483.
[187] A. P. Edwards, J. A. Mittereder, S. C. Binari, D. S. Katzer, D. F. Storm, J. A. Roussos, IEEE Electron Device Lett. 26 (2005) 225-227.
[188] H. Hasegawa, T. Inagaki, S. Ootomo, T. Hashizume, J. Vac. Sci. Technol. B 21 (2003) 1844-1855.
[189] G. Verzellesi, A. Mazzanti, A. F. Basile, A. Boni, E. Zanoni, C. Canali, IEEE Trans. Electron Devices 50 (2003) 1733-1740.
[190] R. Yeats, D. C. D'Avanzo, K. Chan, N. Fernandez, T. W. Taylor, C. Vogel, Technical Digest—International Electron Devices Meeting, IEEE, 1988, pp. 842-845.
[191] S. C. Binari, P. B. Klein, T. E. Kazior, Proc. IEEE 90 (2002) 1048-1058.
[192] T. Hashizume, J. Kotani, H. Hasegawa, Appl. Phys. Lett. 84 (2004) 4884-4886.
[193] W. Saito, M. Kuraguchi, Y. Takada, K. Tsuda, I. Omura, T. Ogura, IEEE Trans. Electron Devices 52 (2005) 159-164.
[194] K. Keem, J. Kang, C. Yoon, D. Y. Jeong, B. M. Moon, S. Kim, Jpn. J. Appl. Phys. 46 (2007) 6230-6232.
[195] P. C. Chang, Z. Fan, C. J. Chien, D. Stichtenoth, C. Ronning, J. G. Lu, Appl. Phys. Lett. 89 (2006) 133113.
[196] C. Lao, Y. Li, C. P. Wong, Z. L. Wang, Nano Lett. 7 (2007) 1323-1328.
[197] C. S. Enache, J. Schoonman, R. Van De Krol, J. Electroceram. 13 (2004) 177-182.
[198] H. Matsui, H. Tabata, N. Hasuike, H. Harima, B. Mizobuchi, J. Appl. Phys. 97 (2005) 1-8.
[199] C. S. Enache, J. Schoonman, R. V. Krol, J. Electroceram. 13 (2004) 177-182.
[200] H. Matsui, H. Tabata, N. Hasuike, H. Harima, B. Mizobuchi, J. Appl. Phys. 97 (2005) 123511.
[201] E.-J. Lee, S.-I. Pyun, J. Appl. Electrochem. 22 (1992) 156-160.
[202] E. Comini, C. Baratto, G. Faglia, M. Ferroni, A. Vomiero, G. Sberveglieri, Prog. Mater. Sci. 54 (2009) 1-67.
[203] X. J. Huang, Y. K. Choi, Sens. Actuators B 122 (2007) 659-671.
[204] A. Kolmakov, M. Moskovits, Annu. Rev. Mater. Res. 34 (2004) 151-180.
[205] G. Shen, P. C. Chen, K. Ryu, C. Zhou, J. Mater. Chem. 19 (2009) 828-839.
[206] E. Comini, Anal. Chim. Acta 568 (2006) 28-40.
[207] N. Yamazoe, Sens. Actuators B 5 (1991) 7-19.
[208] Z. Fan, J. G. Lu, Appl. Phys. Lett. 86 (2005) 123510.
[209] M. W. Ahn, K. S. Park, J. H. Heo, J. G. Park, D. W. Kim, K. J. Choi, J. H. Lee, S. H. Hong, Appl. Phys. Lett. 93 (2008) 263103.
[210] B. Lei, C. Li, D. Zhang, T. Tang, C. Zhou, Appl. Phys. A 79 (2004) 439-442.
[211] P. Nguyen, H. T. Ng, J. Kong, A. M. Cassell, R. Quinn, J. Li, J. Han, M. McNeil, M. Meyyappan, Nano Lett. 3 (2003) 925-928.
[212] N. Wang, Y. Cai, R. Q. Zhang, Mater. Sci. Eng. R 60 (2008) 1-51.
[213] S. Geburt, D. Stichtenoth, S. Muller, W. Dewald, C. Ronning, J. Wang, Y. Jiao, Y. Y. Rao, S. K. Hark, Q. Li, J. Nanosci. Nanotechnol. 8 (2008) 244-251.
[214] B. Guo, A. Bermak, P. C. H. Chan, G. Z. Yan, IEEE Sens. J. 8 (2008) 1397-1398.
[215] L. Liao, H. B. Lu, J. C. Li, C. Liu, D. J. Fu, Y. L. Liu, Appl. Phys. Lett. 91 (2007) 173110.

[216] S. Lettieri, A. Setaro, C. Baratto, E. Comini, G. Faglia, G. Sberveglieri, P. Maddalena, New J. Phys. 10 (2008) 043013.
[217] C. Baratto, S. Todros, G. Faglia, E. Comini, G. Sberveglieri, S. Lettieri, L. Santamaria, P. Maddalena, Sens. Actuators B 140 (2009) 461-466.
[218] G. Faglia, C. Baratto, G. Sberveglieri, M. Zha, A. Zappettini, Appl. Phys. Lett. 86 (2005) 011923.
[219] E. Comini, C. Baratto, G. Faglia, M. Ferroni, G. Sberveglieri, J. Phys. D: Appl. Phys. 40 (2007) 7255-7259.
[220] A. Fujishima, K. Hashimoto, T. Watanabe, TiO2 Photocatalysis: Fundamentals and Applications, Bkc, Tokyo, 1999.
[221] A. Fujishima, K. Honda, Nature 238 (1972) 37-38.
[222] A. Fujishima, T. N. Rao, D. A. Tryk, J. Photochem. Photobiol. C 1 (2000) 1-21.
[223] D. Li, H. Haneda, J. Photochem. Photobiol. A 155 (2003) 171-178.
[224] S. Sakthivel, B. Neppolian, M. V. Shankar, B. Arabindoo, M. Palanichamy, V. Murugesan, Sol. Energy Mater. Sol. Cells 77 (2003) 65-82.
[225] S. K. Kansal, M. Singh, D. Sud, J. Hazard. Mater. 141 (2007) 581-590.
[226] M. Miyauchi, A. Nakajima, T. Watanabe, K. Hashimoto, Chem. Mater. 14 (2002) 2812-2816.
[227] K. R. Reyes-Gil, E. A. Reyes-Garci'a, D. Raftery, J. Phys. Chem. C 111 (2007) 14579-14588.
[228] Y. Sun, C. J. Murphy, K. R. Reyes-Gil, E. A. Reyes-Garcia, J. P. Lilly, D. Raftery, Int. J. Hydrogen Energy 33 (2008) 5967-5974.
[229] C. Burda, Y. Lou, X. Chen, A. C. S. Samia, J. Stout, J. L. Gole, Nano Lett. 3 (2003) 1049-1051.
[230] W. Choi, A. Termin, M. R. Hoffmann, J. Phys. Chem. 98 (1994) 13669-13679.
[231] F. Gracia, J. P. Holgado, A. Caballero, A. R. Gonzalez-Elipe, J. Phys. Chem. B 108 (2004) 17466-17476.
[232] D. Wang, Y. Zou, S. Wen, D. Fan, Appl. Phys. Lett. 95 (2009), 012106-012108.
[233] J. Augustynski, Electrochim. Acta 38 (1993) 43-46.
[234] R. Asahi, T. Morikawa, T. Ohwaki, K. Aoki, Y. Taga, Science 293 (2001) 269-271.
[235] O. Diwald, T. L. Thompson, E. G. Goralski, S. D. Walck, J. T. Yates Jr., J. Phys. Chem. B 108 (2004) 52-57.
[236] A. Ghicov, J. M. Macak, H. Tsuchiya, J. Kunze, V. Haeublein, L. Frey, P. Schmuki, Nano Lett. 6 (2006) 1080-1082.
[237] J. L. Gole, J. D. Stout, C. Burda, Y. Lou, X. Chen, J. Phys. Chem. B 108 (2004) 1230-1240.
[238] H. Irie, Y. Watanabe, K. Hashimoto, J. Phys. Chem. B 107 (2003) 5483-5486.
[239] H. Wang, J. P. Lewis, J. Phys.: Condens. Matter. 18 (2006) 421-434.
[240] C. Di Valentin, G. Pacchioni, A. Selloni, Chem. Mater. 17 (2005) 6656-6665.
[241] S. U. M. Khan, M. Al-Shahry, W. B. Ingler Jr., Science 297 (2002) 2243-2245.
[242] J. H. Park, S. Kim, A. J. Bard, Nano Lett. 6 (2006) 24-28.
[243] H. Luo, T. Takata, Y. Lee, J. Zhao, K. Domen, Y. Yan, Chem. Mater. 16 (2004) 846-849.
[244] T. Ohno, T. Mitsui, M. Matsumura, Chem. Lett. 32 (2003) 364-365.
[245] J. C. Yu, W. Ho, J. Yu, H. Yip, K. W. Po, J. Zhao, Environ. Sci. Technol. 39 (2005) 1175-1179.
[246] M. Zheng, J. Wu, Appl. Surf. Sci. 255 (2009) 5656-5661.
[247] R. G. Breckenridge, W. R. Hosler, Phys. Rev. 91 (1953) 793-802.
[248] D. C. Cronemeyer, Phys. Rev. 113 (1959) 1222-1226.
[249] T. Ihara, M. Miyoshi, M. Ando, S. Sugihara, Y. Iriyama, J. Mater. Sci. 36 (2001) 4201-4207.
[250] I. Nakamura, N. Negishi, S. Kutsuna, T. Ihara, S. Sugihara, K. Takeuchi, J. Mol. Catal. A: Chem. 161 (2000) 205-212.
[251] P. Salvador, M. L. G. Lonza'lez, F. Munoz, J. Phys. Chem. 96 (1992) 10349-10353.
[252] K. Takeuchi, I. Nakamura, O. Matsumoto, S. Sugihara, M. Ando, T. Ihara, Chem. Lett. (2000) 1354-1355.
[253] S. Baruah, S. S. Sinha, B. Ghosh, S. K. Pal, A. K. Raychaudhuri, J. Dutta, J. Appl. Phys. 105 (2009) 074308.
[254] H. Bracht, E. E. Haller, R. Clark-Phelps, Phys. Rev. Lett. 81 (1998) 393.
[255] A. Ural, P. B. Griffin, J. D. Plummer, Phys. Rev. Lett. 83 (1999) 3454.
[256] D. Eaglesham, Phys. World 8 (1995) 41-46.
[257] C. W. M. Castleton, A. Hoglund, S. Mirbt, Phys. Rev. B 73 (2006) 035215.
[258] C. W. M. Castleton, S. Mirbt, Phys. Rev. B 70 (2004) 195202.
[259] G. Makov, M. C. Payne, Phys. Rev. B 51 (1995) 4014.
[260] J. Lento, J. L. Mozos, R. M. Nieminen, J. Phys.: Condens. Matter. 14 (2002) 2637-2645.
[261] C. G. Van de Walle, J. Neugebauer, J. Appl. Phys. 95 (2004) 3851-3879.
[262] J. V. Beck, K. J. Arnold, Parameter Estimation in Engineering and Science, Wiley, New York, 1977.
[263] M. Y. L. Jung, R. Gunawan, R. D. Braatz, E. G. Seebauer, AIChE J. 50 (2004) 3248-3256.
[264] C. T. M. Kwok, K. Dev, R. D. Braatz, E. G. Seebauer, J. Appl. Phys. 98 (2005) 013524.
[265] M. Y. L. Jung, R. Gunawan, R. D. Braatz, E. G. Seebauer, J. Electrochem. Soc. 150 (2003) G838-G842.
[266] R. Gunawan, M. Y. L. Jung, E. G. Seebauer, R. D. Braatz, AIChE J. 49 (2003) 2114-2123.

Example 4

Synthesis of Alkanes from Biomass-Derived Sugar with Catalysts Designed by Semiconductor Defect Engineering The technical literature has demonstrated that sugars derived from lignocellulose decomposition can be converted into alkanes for fuel via inorganic catalysts. This approach provides a complementary way to avoid problems with the efficiency and cost of fermentation-based processes. However, the catalytic rates and selectivities have not proven adequate for economic viability. To make the inorganic approach a true contender, better catalysts must be developed. The invention provides catalysts with improved rates and selectivities for the key reaction steps through principles of "semiconductor defect engineering."

The basic steps for converting sugars to alkanes include initial dehydration of the sugars over acid catalysts to remove oxygen, carbon-chain lengthening via aldol condensation over Lewis base catalysts, hydrogenation over supported noble metals, and final dehydration/hydrogenation into alkanes over catalysts with both acid and noble metal sites. Utilization of defect engineering seeks to improve the electronic properties of the semiconducting oxides that serve as catalyst supports in the aldol condensation and hydrogenation steps.

The controllable manipulation of electronic richness within semiconducting oxide supports for Lewis base and noble metal catalysts offers a largely unexploited avenue for obtaining transportation fuels from sugars. Semiconductor-supported Lewis bases and metals have been studied for many years, and considerable evidence exists that the n- or p-type character of supports such as $TiO_2$ influences the reactivity. However, a crucial variable has remained unavailable: the ability to control the concentration of electrically active dopants in the support. We have developed protocols for defect engineering oxide semiconductors that mitigate charged native defects and thereby permit unprecedented manipulation of doping type and level. Considerable evidence exists that this control should propagate into the behavior of the supported catalysts for biofuel production.

Material synthesis can utilize MgO and noble-metal catalysts supported on defect-engineered anatase $TiO_2$. In the process flow for making alkanes, MgO is already very effective at inducing base-catalyzed aldol condensation, while a variety of noble metals are leading candidates to hydrogenate the condensation products. The synthesis involves two closely related material forms: thin films that permit direct evaluation of electron richness in the support, and particulates that resemble more directly the materials to be used in large-scale biofuel production. Defect engineering protocols can be optimized to mitigate charged native defects in the $TiO_2$ (mainly oxygen vacancies) and to introduce electrically active metal cation dopants. Optical photoreflectance and specialized capacitance-voltage measurements can be utilized to verify directly whether controllable doping has been achieved and if it propagates into the supported catalysts in aqueous environments. The crossed reaction of acetone with 5-hydroxymethylfurfural (HMF) is a useful test case for aldol condensation. The condensation products can be hydrogenated and dehydrated/hydrogenated to yield alkane products centered at the $C_9$ chain length.

4.1. Background

The U.S. Department of Energy has defined a target in which the U.S. would satisfy 30% of its transportation fuel needs from biofuels by 2030. One approach to produce biofuels at such large scales is to start with second-generation sources such as switchgrass or Miscanthus, and to break down the lignocellulose to extract $C_5$ and $C_6$ sugars. It has been demonstrated that the sugars can be converted into alkanes [1-3] via inorganic catalysts. Thermodynamic analyses show that the overall process for alkane production from sugars yields more energy than it consumes [5]. The relevant literature has aimed mainly at demonstrating the basic concept of sugars-to-alkanes via inorganic catalysts. The catalytic rates and selectivities have not proven adequate for economic viability [6]. To make this approach a true contender, better catalysts must be developed. Indeed, the problems in designing such catalysts specifically for biofuels present a novel set of challenges [5]. Described herein are improved catalysts for key reaction steps employing principles of "semiconductor defect engineering."

Our approach differs distinctly from fermentation-based processes to ethanol, butanol, or biodiesel. The EBI already maintains a significant research portfolio based upon such methods [7]. Our strategy provides a complementary way to avoid difficult problems with rate, energy efficiency, cost effectiveness, and other aspects of fuel synthesis via biological metabolism.

Figure 99:
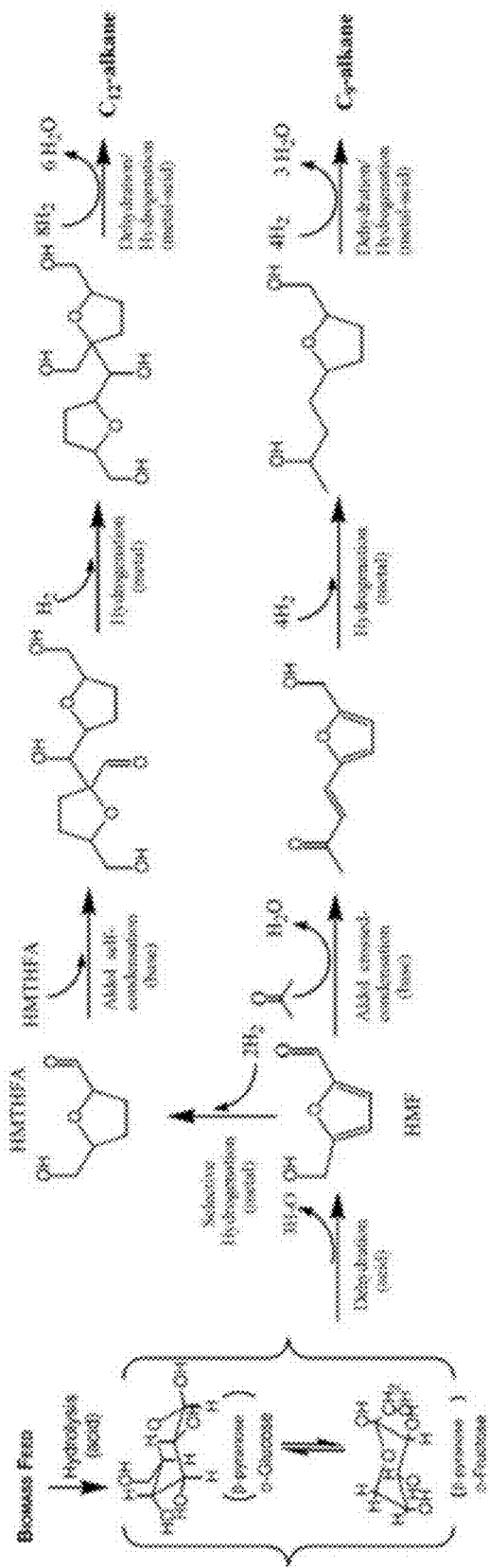
FIG. 99 provides a schematic showing reaction pathways for conversion of sugars to alkanes. Analogous chemistry using furfural as an intermediate (instead of HMF) from $C_5$ sugars would yield $C_{10}$, $C_8$, and $C_{13}$ alkanes instead.

FIG. 99 shows a schematic diagram of catalytic conversion of sugars into alkanes. Early steps require dehydration to remove oxygen (as sugars have a C/O ratio of unity), followed by the formation of C—C bonds via aldol condensation to increase the molecular weight. The resulting products are then hydrogenated and further dehydrated into usable fuels such as $C_5$-$C_{12}$ for gasoline, $C_9$-$C_{16}$ for jet fuel, and $C_{10}$-$C_{20}$ for diesel. The steps where semiconductor defect engineering can be used most effectively are aldol condensation and hydrogenation. Catalysts for dehydration are not the focus of this Example, as dehydration can be accomplished fairly well by various solid-acid catalysts such as zeolites or acidic ion exchange resins. In contrast, the aldol condensation requires a catalyst having Lewis base character (meaning a good electron donor to reactive intermediates). MgO is a typical catalyst, but empirical data show that it works best if supported on a metal oxide such as $TiO_2$ [8, 9]. Hydrogenation steps occur over a noble metal such as Pd or Pt, but the metal is typically supported on an oxide or oxide mixture such as $NbOPO_4$ [2] or MgO—$TiO_2$ [6]. It has been demonstrated [1] that aldol condensation and some of the hydrogenation steps can take place within the same reactor to save costs, but the rates over the respective Lewis base and metal catalyst sites must be carefully tuned.

4.2. Tunable "Defect-Engineered" Catalysts

The controllable manipulation of electron richness within semiconducting oxide supports for Lewis base and noble metal catalysts offers a largely unexploited avenue for improving rate and selectivity. Semiconductor-supported Lewis bases and metals have been studied as catalysts for many years. But a crucial control variable has remained unavailable up to now: the ability to manipulate the concentration of electrically active dopants in the oxide semiconductor support. "Electrically active" dopants are those that contribute electrons to the conduction band (or holes to the valence band), and thereby change the degree of n- or p-type character of the support. Semiconductors range from very electron-rich for strongly n-type material to very electron-poor for strongly p-type material. Effects of such n- or p-dopants on chemical reactivity have been described in the literature as outlined below, but have never been controlled to catalytic advantage. The reason is that metal oxides typically contain large numbers of uncompensated, electrically active native defects (vacancies, interstitials, etc) that have precluded controllable doping [10, 11]. Methods to control the concentration of electrically active native defects in both elemental and oxide semiconductors by described [12, 13] mechanisms have been developed. These methods promote exceptionally fast exchange of bulk defects with surfaces, and involve treating the semiconductor surface by chemical means during synthesis. With native defects mitigated, controlled doping of the semiconductor becomes possible.

Here is an example of the potential benefits of controlled electrical doping. MgO exhibits Lewis base behavior, meaning it is especially capable of donating electrons to reactive intermediates (as required for C—C bond formation in aldol condensation to lengthen the carbon chain). When MgO is present as small particles on a semiconducting support such as $TiO_2$, the basicity rises [8, 9]. MgO and $TiO_2$ are partially miscible (and can form the mineral geikielite, $MgTiO_3$). It is not known whether $TiO_2$ induces the formation of new active sites (e.g., at the surface boundaries between the two materials), modifies existing sites, or both. So there are several conceivable mechanisms by which doping the $TiO_2$ can change the Lewis basicity of the active sites. One possibility derives from the fact that the Lewis basicity of surface oxygen atoms can be modified by point defects of various kinds [14]; the charge states of such defects typically vary and depend upon the electron richness of the semiconductor [10, 11, 14]. In this mechanism, an electron-rich support such as n-$TiO_2$ would promote formation of defects that are charged more negatively that would, in turn, enhance the Lewis base character of nearby oxygen atoms. Yet, if the $TiO_2$ were doped p-type (i.e., electron-poor), the defects would become more positive and exert the opposite effect on Lewis basicity. Varying the degree of n- or p-type character in the support (i.e., the type and concentration of charge carriers) would permit the precise selection of Lewis base character over a continuous range.

In hydrogenation reactions by noble metals, doping of the support can function differently. In fact, three distinct mechanisms have been identified over the years by which doping a semiconductor support can change the activity of a supported metal: direct electron exchange between the semiconductor and metal (Schwab effect), the diffusion of oxide moieties from the semiconductor onto the metal ("strong metal support interaction" or "SMSI"), and inhibition of the formation of noble metal oxides. For all these mechanisms, there is good evidence that controllably varying the degree of n- or p-type character in the support would improve noble metal behavior. For example, Schwab [15] investigated the consequences of semiconductor-metal exchange on catalyst reactivity [16-22], using Ni/ZnO to catalyze the hydration of ethylene. He doped the semiconductor with lithium and gallium (in the form of $LiNO_3$ and $Ga(NO_3)_3$), and showed that the rate changed in response. Examples of related effects have been described in other literature [23, 24]. The SMSI is a different mechanism that affects catalytic rate [25-29] via migration of oxide moieties onto the metal surface. For example, $TiO_2$-supported Pt exhibits activity that varies with doping in combustion applications [30], apparently via an SMSI effect. With regard to noble metal oxide formation, the fuel cell literature suggests that a semiconductor may inhibit this formation and thereby improve reactivity [31-35]. Vol'kenshtein [36-39], Boreskov [34, 40-42], and others [43-45] have gone further to show that semiconductor doping can inhibit metal oxide formation. For example, Boreskov [40] observed doping-induced shifts in oxygen pressure needed for the oxidation of an overlayer of nickel.

4.3.1 Overview

The synthesis utilized MgO and noble-metal catalysts supported on defect-engineered anatase $TiO_2$. In the process flow for making alkanes, MgO is already very effective at inducing base-catalyzed aldol condensation, while a variety of noble metals are leading candidates to hydrogenate the condensation products. The synthesis involves two closely related material forms: thin films that will permit direct evaluation of electron richness in the support, and particulates that resemble more directly the materials to be used in large-scale biofuel production. Defect engineering protocols can be optimized to mitigate charged native defects in the $TiO_2$ (mainly oxygen vacancies) and to introduce electrically active metal cation dopants. Optical photoreflectance and specialized capacitance-voltage measurements can be used to verify directly whether controllable doping has been achieved and propagates into the supported catalysts in aqueous environments. For reactions, the crossed reaction of acetone with 5-hydroxymethylfurfural (HMF) is a good test case for the aldol condensation. The condensation products can be hydrogenated and dehydrated/hydrogenated to yield alkane products centered at the $C_9$ chain length.

Figure 100:
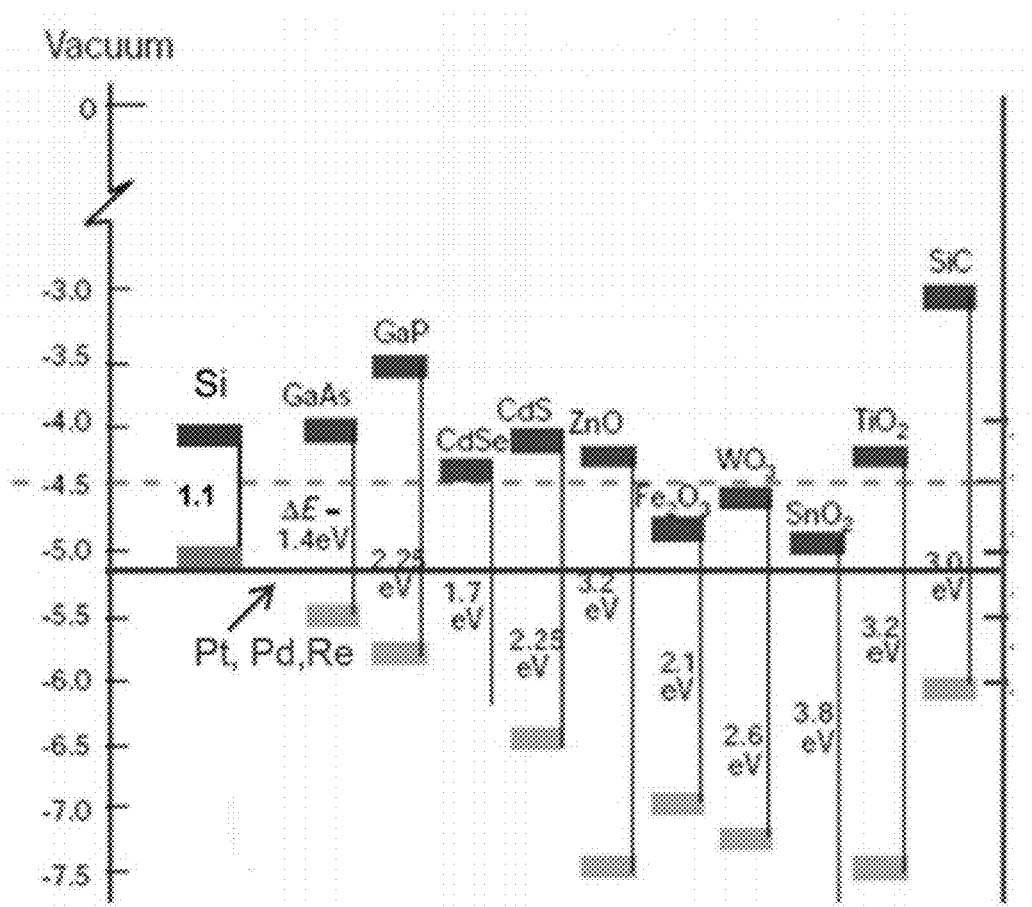
FIG. 100 provides a schematic showing band energies of common semiconductors. The dashed line shows potential for $H_2O/H_2$ at pH 1. Pt work function is also shown; values for Pd and Re are roughly similar. The $TiO_2$ band gap straddles the work function of these metals, permitting electron injection or withdrawal as desired.

Use of anatase $TiO_2$ (anatase) as the support is preferred because $TiO_2$ is widely used in this way and enjoys a large literature base for its properties in terms of both defect behavior and catalytic behavior. MgO exhibits exceptionally strong base properties if activated by a suitable support such as $TiO_2$ [8, 9] and can be especially suitable for aldol condensation. For hydrogenation, noble metals such as Pt, Pd, and alloys such as Pt—Ru have long been employed. $TiO_2$ offers exceptional possibilities for improvement by defect engineering because its band gap brackets the work function of these noble metals, as shown in FIG. 100. Thus, intentional n-doping of $TiO_2$ can move the Fermi level toward the top of the band gap, causing electrons to be injected into the supported metal. Weak n- or p-type doping (e.g., with Cr) can move the Fermi level toward the bottom of the band gap with reverse effect: withdrawal of electrons from the supported metal.

Figure 101:
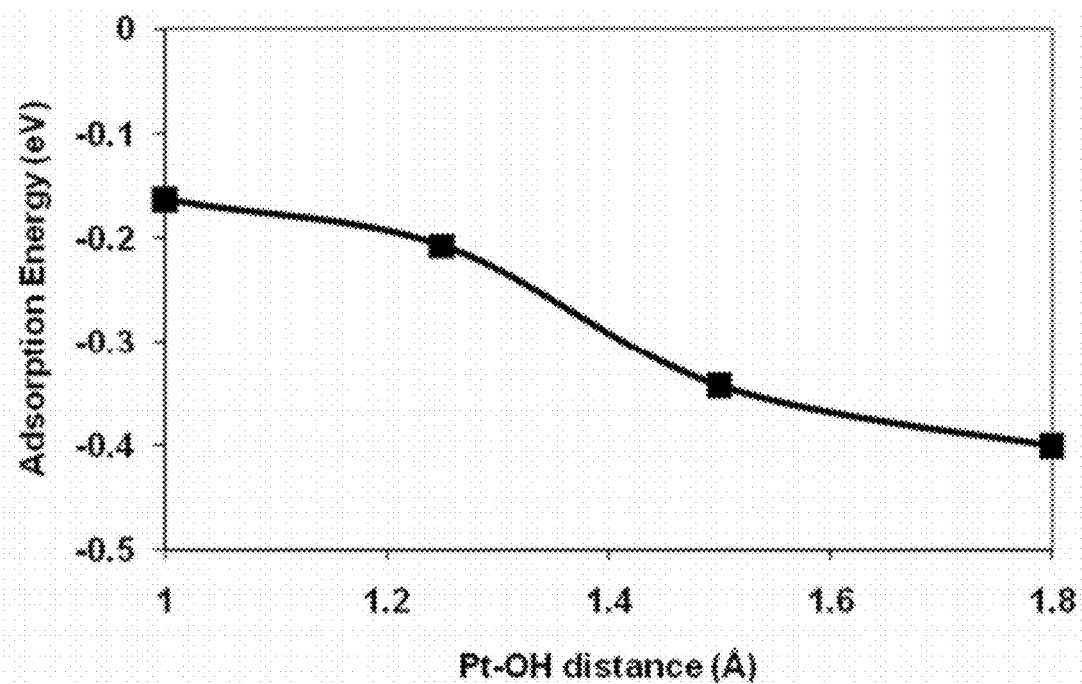
FIG. 101 provides a plot showing variation of CO adsorption energy on Pt calculated by density functional theory as a function of Pt—OH distance on the back side of a two-atom-thick Pt layer. This variation in Pt—O distance serves to change the total electron richness within the Pt. The variation propagates into the top Pt layer and changes the adsorption energy by a factor of nearly 3.

Electron injection or withdrawal may be best, depending on the application, with numerous elementary steps in combination with the effects of the aqueous solvent. The effects of doping are likely to be big, however. For example, quantum calculations to examine the effects of Pt electron richness on CO adsorption are shown in FIG. 101. The CO adsorption energy changes enormously.

The thin film configuration permits measurement of dopant electrical activity, and therefore direct correlation of doping level to catalyst reactivity. In actual large-scale practice, biofuel catalysts may not be thin films but rather pellets, monoliths, or some other particulate-based structure. Thus, $TiO_2$ particles can be synthesized to support MgO or noble metals. Such $TiO_2$ particles can be synthesized by well-known sol-gel methods as described previously [46, 47]. Protocols for removal of native defects can be translated and adapted from those developed for thin films. Dopants can either be added to the aqueous reaction mixture or diffused in after the semiconductor solid is formed. MgO is normally deposited on nanoparticles (frequently ZnO) using CVD or ALD [48] or solution-based methods [49]. $TiO_2$ particulates can be coated with noble metals via atomic layer deposition [50], sonoelectrochemical methods [51], room-temperature vapor deposition [52], or calcination treatment [53].

4.3.2 Defect Engineering

Controllable doping of $TiO_2$ requires resolution of two main issues: removing electrically active native defects in as-grown material and choosing n- and p-type dopants.

4.3.2.1. Removing Native Defects

For undoped $TiO_2$, oxygen vacancies are the primary electrically active native defects [10, 11]. The vacancies introduce large, but variable, concentrations of shallow donor levels. These levels result in n-type behavior that can be difficult to control and often swamps the effects of intentional doping. Heating in gaseous oxygen removes some of these defects, but requires high temperature (850° C.) [54] that transforms the material from the more catalytically active anatase phase to the less active rutile phase. These high temperatures are required partly because the relevant defects do not diffuse through the oxide very quickly.

Figure 102:
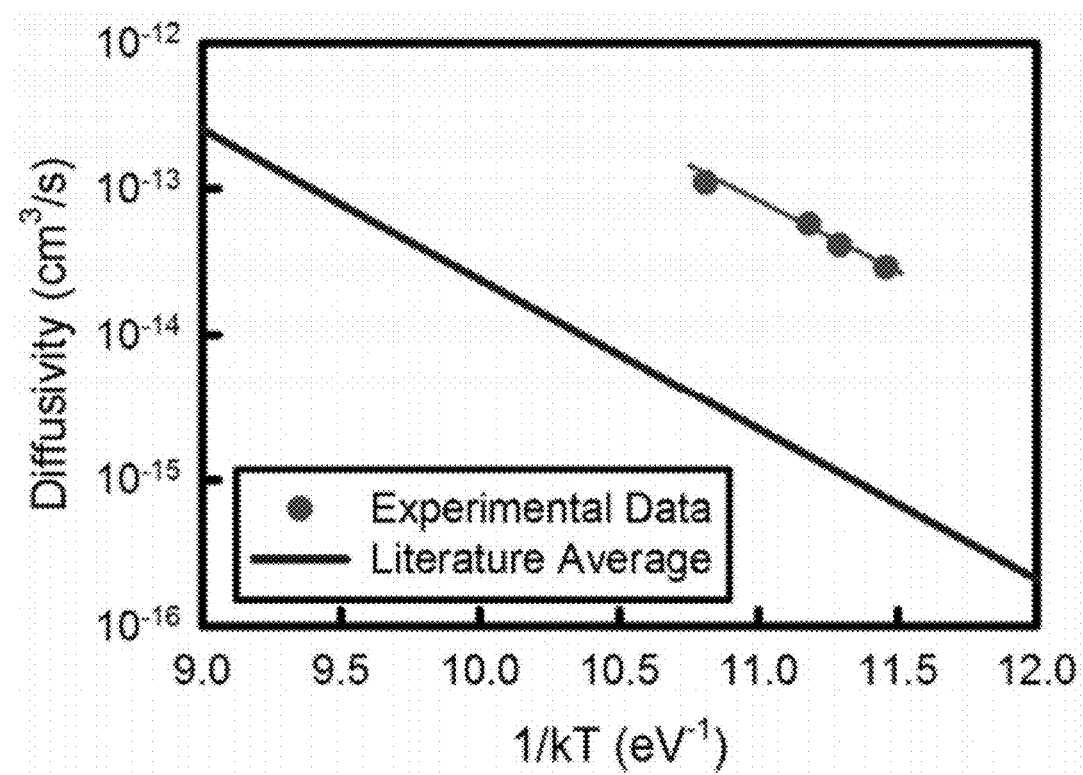
FIG. 102 provides a plot showing self-diffusion rates of oxygen (measured by O isotopes) in rutile $TiO_2$ having its surface well cleaned of various contaminants. Diffusivity is a direct measure of the concentration of mobile species that destroy electrically active oxygen vacancies. These rates are a factor of 50 higher than the average of literature reports.

Appropriate cleaning of semiconductor surfaces to produce dangling bonds can open new pathways for defect annihilation by those surfaces when the material is heated [13]. The work was done for silicon, but an analogous effect for $TiO_2$ has been demonstrated as well. FIG. 102 shows example results for the diffusion of isotopically labeled oxygen in rutile $TiO_2$. The diffusivity is directly proportional to the number of mobile oxygen interstitial atoms that annihilate the problematic vacancies. When the $TiO_2$ surface is cleaned according to fairly simple protocols, the surface becomes much more active in creating the helpful interstitials. FIG. 102 implies that the protocols developed so far increase this vacancy annihilation rate by a factor of at least 50.

Protocols can accomplish similar effects in polycrystalline anatase $TiO_2$ in both thin film and particulate form. These protocols include annealing the surface-cleansed $TiO_2$ in the presence of especially active oxygen from ozone or a remote oxygen plasma [55] and compensating oxygen vacancies by doping with a transition metal such as cobalt, which binds oxygen vacancies and electrically neutralizes them [56]. If grain boundary defects present a problem in the polycrystalline thin-film material, these may be amenable to neutralization by diffusion of gases (monoatomic hydrogen, oxygen, nitrogen, sulfur hexafluoride) down the grain boundaries [57] or introduction of compensating dopants that segregate to the boundaries [58, 59].

4.3.2.2. Choice of Bulk Dopants

The literature reports $TiO_2$ doping with both metal cations and non-metal anions. Non-metals such as N, C, and S are not of interest here for bulk doping because they narrow the band gap rather than alter the carrier concentration [60-62]. Metal doping will be the focus. The literature reports high n-type carrier concentrations following incorporation of Nb [63, 64]. P-type carriers have been reported with Cr [65, 66] and Fe [67, 68] doping. In all these cases, however, controllability and reproducibility have been poor for two reasons.

Figure 103:
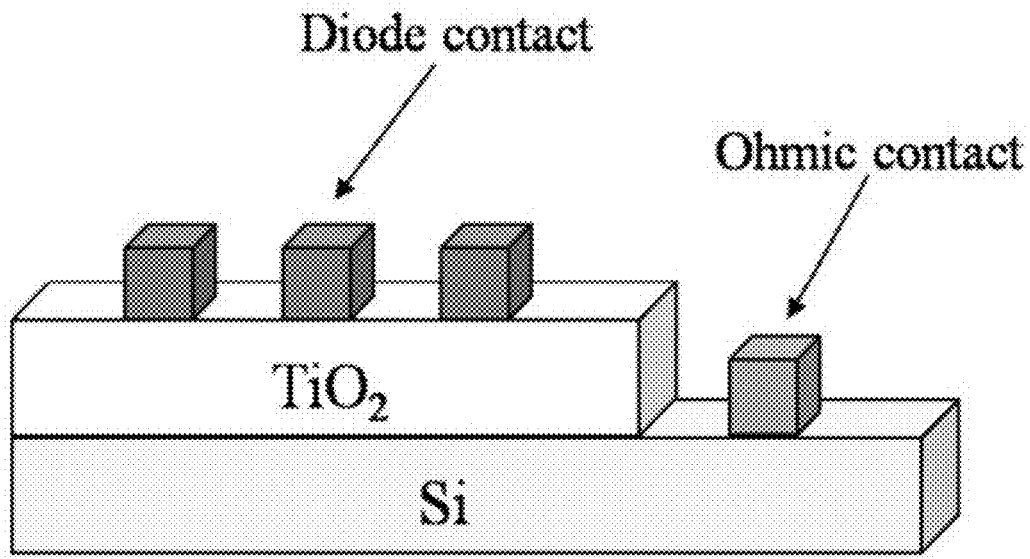
FIG. 103 provides a schematic of a diode setup for measuring carrier type and concentration in thin-film as described herein.

First, the measurements from the relevant capacitance-voltage (C-V) measurements are often misinterpreted [69, 70]. A special thin-film diode test structure is needed. Most reports fail to fully characterize, optimize, or qualify the diode structures [71, 72]. A special, fully qualified test structure for $TiO_2$ ($Al/TiO_2/Si/InGa$) [73] that avoids these problems has been developed (FIG. 103).

A second problem is that some dopants have energy levels deep within the band gap, leading to temperature-dependent doping behavior. It is already difficult to make a priori predictions of donor or acceptor behavior in metal oxides such as $TiO_2$ at room temperature, as the positions of the energy levels induced by various dopants are incompletely documented. Dopant energy levels reported in the literature for some relevant species are summarized in Table 4.1.

TABLE 4.1

Literature-reported shallow energy levels (referenced to CBM) of relevant dopants in $TiO_2$.

| Element | Structure | Donor or Acceptor Energy Level (eV) | Experimental or Computational? | Method | Reference |
|---|---|---|---|---|---|
| Nb | Anatase | $E_c + 0.05$ | Computational | DFT-LDA | [74] |
|  | Anatase | Shallow (below CBM) | Experimental | Resistivity | [75] |
|  | Anatase | 0.01 | Computational | GGA-PBE | [76] |
| Cr | Rutile | 2.7 (3+) | Experimental | ESR | [77] |
|  | Rutile | 2.7 (3+) | Experimental | ESR | [78] |
|  | Rutile | 2.6 | Experimental | XPS | [79] |
| Fe | Anatase | Just above VBM (3+) | Experimental | PL | [69] |
| Cu | Anatase | Close to VBM | Computational | LAPW | [80] |

The inventor's laboratory has have developed the capability to synthesize thin-film $TiO_2$ doped with Nb (for n-type) and Cr (for p-type). Low-pressure chemical vapor deposition (CVD) or atomic layer deposition (ALD) is employed using titanium tetrakis-isopropoxide (TTIP) as the metal precursor and water as the oxygenating species. For n-type doping, liquid $Nb(OCH_2CH_3)_5$ is placed in a small glass vial immediately adjacent to the heated sample platform. For p-type doping, a quartz crucible of solid $Cr(C_5H_7O_2)_3$ positioned adjacent to the heated sample platform is employed. However, p-doping is difficult and alternate dopants or dopant introduction methods are available. Other metal dopants are Fe [69] and Cu [80].

4.3.2.3. Interface Effects

Formation of interface states at the metal-semiconductor boundary can vitiate the effects of support doping to some degree, especially for supported metals. There is a large literature dealing with semiconductor-metal and semiconductor-semiconductor contacts [81, 82], and only in the worst cases are the effects of doping completely eliminated. A useful way to ensure that such effects are not too large is to measure the electric fields present in the semiconductor at the interface. The absence of fields (or fields that are small) strongly suggests that the semiconductor bands do not bend near the interface, meaning the effects of doping will be felt within the supported oxide or metal. Such measurements can be made for MgO and noble metals supported on $TiO_2$, particularly in the presence of relevant aqueous environments characteristic of reactions of interest. One method is photoreflectance (PR), an optical modulation spectroscopy that detects and quantifies the presence of electric fields near free surfaces or interfaces of semiconductors [83, 84]. PR has recently been adapted specifically to study $TiO_2$ (FIG. 104), which had previously been examined only with related modulation spectroscopies [85, 86]. PR detects the surface reflectance change induced by a low-power light source and is contactless—meaning it can be used in aqueous reactive environments. A thin film configuration is required, however; the method cannot be used with particles. The line shape can be analyzed by methods developed to quantify electric fields [83].

4.3.3 Reaction Rates

It is possible to defect-engineer catalyst structures for three different, key reactions in the sugars to alkanes conversion process: aldol condensation, hydrogenation of condensation products, and dehydration/hydrogenation. The first two reaction steps can be carried out in a batch Parr reactor, while the final step can occur in a custom-designed stainless steel tubular reactor. Different catalyst structures can be employed depending on the reaction step—the Lewis base MgO on $TiO_2$ for aldol condensation, and a noble metal on $TiO_2$ for both hydrogenation steps. For dehydration/hydrogenation, the dehydration function takes place simultaneously over a distinct catalyst with acid character.

For the aldol condensation, a suitable test system is the crossed-condensation of HMF with acetone in the presence of a base catalyst to form $C_9$ species. Both reagents can be purchased commercially. MgO supported on $TiO_2$ shows exceptional Lewis base character compared to many alternatives [8, 9]. The process can be carried out at moderate temperature (100° C.) and high pressure (55 bar) in a two-phase batch Parr reactor system containing a reactive aqueous layer and an extracting organic layer [87]. Samples can be collected as a function of time and examined with GC and/or GC-MS (as needed) to evaluate the consumption of HMF and appearance of the condensed product. Presently, aldol condensation of HMF using 5 wt % $Pd/MgO—ZrO_2$ takes approximately 1 day and results in a distribution of $C_6$, $C_9$, and $C_{15}$ species of varying relative percentages and yields [87]; a defect engineering approach can allow for enhanced control of this process. Reaction rate, selectivity, and overall carbon yield can all be examined as a function of doping level of the support, and interpreted in light of the defect engineering principles described above. Although $MgO—TiO_2$ shows better stability over time compared to alternative materials, degradation is still a problem [6].

The subsequent hydrogenation step can be carried out on $TiO_2$-supported Pt, wherein $TiO_2$ doping type and level can be modified to affect Pt behavior in light of defect engineering principles. The relative performance of other noble metals (i.e. Pd) and noble metal alloys can also be examined. In the literature, this step is typically accomplished in a batch reactor, where independent variables include catalyst weight percent, catalyst to feed ratio, and reaction time [1]. Common catalyst-to-feed ratios are ~0.5, and reaction times are typically on the order of 1 day. Clearly the rates are very slow. Thus, there exists great potential for improving the rate in this step of the sugar to alkanes conversion.

The final dehydration/hydrogenation step requires a catalyst with acid sites for dehydration, and a catalyst with metal sites for hydrogenation. In the past, these functions were rolled into one using $Pt/SiO_2$—$Al_2O_3$ [6]. The functions can be separated by employing both $SiO_2$—$Al_2O_3$ for the acid sites and $Pt/TiO_2$ for the defect-engineered metal sites. This approach permits separate modification of the hydrogenation rate, as well as independent tuning of various reaction selectivity aspects, which others accomplish by varying metal loading and/or proximity between metal and support [88]. A special four-phase reactor system can be constructed in order to prevent fouling of the catalyst surface with unwanted carbon deposits. The system includes an aqueous inlet stream containing the large water-soluble organic reactant, a hexadecane alkane inlet stream, and a $H_2$ inlet gas stream, in addition to the solid catalyst [1]. This reaction can be performed in a tubular stainless steel reactor equipped with thermocouples for controlling reaction temperature, mass-flow controllers, pumps for introducing feed solution, and heat-exchanger. The reaction conversion can be monitored via the liquid and gaseous effluent with GC and/or GC-MS (as necessary).

References for Example 4
1. Huber, G. W., et al., Science, 308 (2005) 1446-1450.
2. Kunkes, E. L., et al., Science, 322 (2008) 417-21.
3. Roman-Leshkov, Y., J. N. Chheda, and J. A. Dumesic, Science, 312 (2006) 1933-1937.
4. Gratzel, M., Nature, 414 (2001) 338-344.
5. Simonetti, Dante A. and James A. Dumesic, ChemSusChem, 1 (2008) 725-733.
6. Chheda, J. N. and J. A. Dumesic, Catal. Today, 123 (2007) 59-70.
7. Biofuels Production. 2009 [cited 2009 September 28]; Available from: http://www.energybiosciencesinstitute. org/index.php?option=com_content&task=blogcate gory&id=20&Itemid=17.
8. Aramendia, M. A., et al., Colloids Surf., A, 234 (2004) 17-25.
9. Aramendia, M. A., et al., J. Mol. Catal. A: Chem., 218 (2004) 81-90.
10. Seebauer, E. G. and M. C. Kratzer, Mater. Sci. Eng.: R, 55 (2006) 57-149.
11. Seebauer, E. G. and M. C. Kratzer, Charged Semiconductor Defects: Structure, Thermodynamics, and Diffusion. Engineering Materials and Processes. 2009, London: Springer-Verlag.
12. Dev, K. and E. G. Seebauer, Phys. Rev. B, 67 (2003) 035312.
13. Seebauer, E. G., et al., Phys. Rev. Lett., 97 (2006) 055503.
14. Henrich, V. E. and P. A. Cox, The Surface Science of Metal Oxides. 1996, London: Cambridge University Press.
15. Schwab, G.-M., Angew. Chem., 67 (1955) 433-438.
16. Schwab, G. M., Surf. Sci., 13 (1969) 198-200.
17. Schwab, G. M., B. C. Dadlhuber, and E. Z. Wall, Z. Physik. Chem., 37 (1963) 99.
18. Schwab, G. M. and K. Koller, J. Am. Chem. Soc., 90 (1968) 3078-3080.
19. Schwab, G. M. and A. Kritikos, Naturwissenschaften, 55 (1968) 228.
20. Schwab, G.-M., J. Block, and D. Schultze, Angew. Chem., 71 (1959) 101-104.
21. Schwab, G. M., Adv. Catal., 27 (1978) 1.
22. Schwab, G. M. and G. Mutzbauer, Naturwissenschaften, 46 (1959) 13.
23. Boudart, M. and G. Djega-Mariadassou, Kinetics of heterogeneous catalytic reactions. 1984, Princeton, N.J.: Princeton University Press.
24. Kowal, A., et al., Nat. Mater., 8 (2009) 325-330.
25. Baker, R. T. K., E. B. Prestridge, and R. L. Garten, J. Catal., 59 (1979) 293-302.
26. Baker, R. T. K., E. B. Prestridge, and L. L. Murrell, J. Catal., 79 (1983) 348-358.
27. Bunluesin, T., E. S. Putna, and R. J. Gorte, Catal. Lett., 41 (1996) 1-5.
28. Vannice, M. A., S. Y. Wang, and S. H. Moon, J. Catal., 71 (1981) 152-166.
29. Wang, S. Y., S. H. Moon, and M. A. Vannice, J. Catal., 71 (1981) 167-174.
30. Papaefthimiou, P., T. Ioannides, and X. E. Verykios, Appl. Catal., B, 15 (1998) 75-92.
31. Arico, A. S., et al., Appl. Surf. Sci., 172 (2001) 33-40.
32. Burke, L. D. and D. T. Buckley, J. Appl. Electrochem., 25 (1995) 913-922.
33. Neff, H., et al., J. Appl. Phys., 79 (1996) 7672-5.
34. Toda, T., et al., J. Electrochem. Soc., 146 (1999) 3750-3756.
35. Zerbino, J. O., C. Perdriel, and A. J. Arvia, Thin Solid Films, 232 (1993) 63-7.
36. Vol'kenshtein, F. F., J. Phys. Chem. (U.S.S.R.), 22 (1948) 311-30.
37. Vol'kenshtein, F. F., Zhur. Fiz. Khim, 24 (1950) 1068-82.
38. Wolkenstein, T., Adv. Catal., 12 (1960) 189.
39. Wolkenstein, T., Electronic Processes on Semiconductor Surfaces During Chemisorption 1987, New York: Plenum.
40. Boreskov, G. K., Kinet. Katal., 8 (1967) 1020-33.
41. Boreskov, G. K. and K. I. Matveev, Probl. Kinet. Kataliza, 8 (1955) 165.
42. Boreskov, G. K. and V. V. Popovskii, Prob. Kinet. Kataliza, 10 (1960) 67.
43. Chen, Y., et al., J. Mol. Catal., 21 (1983) 275-289.
44. Keier, N. P., S. Z. Roginskii, and I. S. Sazanova, Doklady Akad. Nauk. S.S.S.R., 106 (1956) 859.
45. Krylov, O. V., Catalysis by Non-Metals. 1970, New York: Academic Press.
46. Subramanian, V., et al., Catal. Lett., 113 (2007) 13-18.
47. Subramanian, V., et al., Ind. Eng. Chem. Res., 45 (2006) 3815-3820.
48. Burton, B. B., D. N. Goldstein, and S. M. George, J. Phys. Chem. C, 113 (2009) 1939-46.
49. Shimpi, P., et al., Nanotechnology, 20 (2009) 125608.
50. Zhou, Y., et al., Pt/TiO2 Nano-Catalyst Synthesized by Atomic Layer Deposition, in AIChE 2009 Annual Meeting. 2009: Nashville, Tenn.
51. Liu, Y.-C., C.-C. Wang, and L.-C. Juang, J. Electroanal. Chem., 574 (2004) 71-75.
52. Rodriguez, J. A., et al., J. Am. Chem. Soc., 124 (2002) 5242-5250.
53. Zanella, R., et al., J. Phys. Chem. B, 106 (2002) 7634-7642.
54. Borkar, S. A. and S. R. Dharwadkar, J. Therm. Anal. Calorim., 78 (2004) 761-767.
55. Maeng, W. J. and H. Kim, Electrochem. Solid-State Lett., 9 (2006) 191-4.
56. Griffin Roberts, K., et al., Phys. Rev. B, 78 (2008) 014409 (6 pp.).

57. Seager, C. H. and D. S. Ginley, Appl. Phys. Lett., 34 (1979) 337-40.
58. Johnson, K. D. and V. P. Dravid, Interface Sci., 8 (2000) 189-198.
59. Yoon, S.-H. and H. Kim, J. Mater. Res., 18 (2003) 88-96.
60. Asahi, R., et al., Science, 293 (2001) 269-271.
61. Mizukoshi, Y., et al., Appl. Catal., B, 91 (2009) 152-156.
62. Wang, D., et al., Appl. Phys. Lett., 95 (2009)
63. Hitosugi, T., et al., Appl. Phys. Express, 1 (2008) 111203 (3 pp.).
64. Yamada, N., et al., Thin Solid Films, 516 (2008) 5754-7.
65. Li, Y., et al., Sensor Actuat B-Chem, B83 (2002) 160-3.
66. Ruiz, A. M., et al., Sensor Actuat B-Chem, B93 (2003) 509-18.
67. Bally, A. R., et al., J. Phys. D: Appl. Phys., 31 (1998) 1149-54.
68. Wang, Y., et al., Thin Solid Films, 349 (1999) 120-5.
69. Enache, C. S., J. Schoonman, and R. Van De Krol, J. Electroceram., 13 (2004) 177-182.
70. Matsui, H., et al., J. Appl. Phys., 97 (2005) 1-8.
71. Miyagi, T., et al., Jpn. J. Appl. Phys., Part 1, 43 (2004) 775-6.
72. Miyagi, T., et al., Jpn. J. Appl. Phys., Part 2, 40 (2001) 404-6.
73. Kratzer, M. C., Growth and Characterization of TiO2 for Band Engineered Catalysis, MS Thesis (2008) University of Illinois at Urbana-Champaign.
74. Gai, Y., et al., Phys. Rev. Lett., 102 (2009) 036402 (4 pp.).
75. Mulmi, D. D., et al., Journal of the Physics and Chemistry of Solids, 65 (2004) 1181-5.
76. Osorio-Guillen, J., S. Lany, and A. Zunger, Phys. Rev. Lett., 100 (2008) 036601-1.
77. Mizushima, K., M. Tanaka, and S. Iida, J. Phys. Soc. Jpn., 32 (1972) 1519-1524.
78. Mizushima, K., et al., J. Phys. Chem. Solids, 40 (1979) 1129-1140.
79. Osterwalder, J., et al., Thin Solid Films, 484 (2005) 289-298.
80. Liao, B., et al., Chinese J. Struct. Chem., 28 (2009) 869-873.
81. Shaw, M. P., Properties of junctions and barriers, in Handbook on Semiconductors, T. S. Moss, Editor. 1981, North Holland: New York.
82. Monch, W., Surf. Sci., 299-300 (1994) 928-44.
83. Dev, K. and E. G. Seebauer, Surf. Sci., 583 (2005) 80-87.
84. Seebauer, E. G., J. Appl. Phys., 66 (1989) 4963-72.
85. Boschloo, G. K., A. Goossens, and J. Schoonman, J. Electroanal. Chem., 428 (1997) 25-32.
86. Kulak, A. I., A. I. Kokorin, and D. V. Sviridov, J. Mater. Res., 16 (2001) 2357-61.
87. Barrett, C. J., et al., Appl. Catal., B, 66 (2006) 111-118.
88. Kunkes, E. L., E. I. Gurbuz, and J. A. Dumesic, J. Catal., 266 (2009) 236-249.

Example 5

Semiconductor Defect Engineering for Improved Heterogeneous Catalysts

Metal Oxide-Based "Devices" for Catalysis

Figure 105:
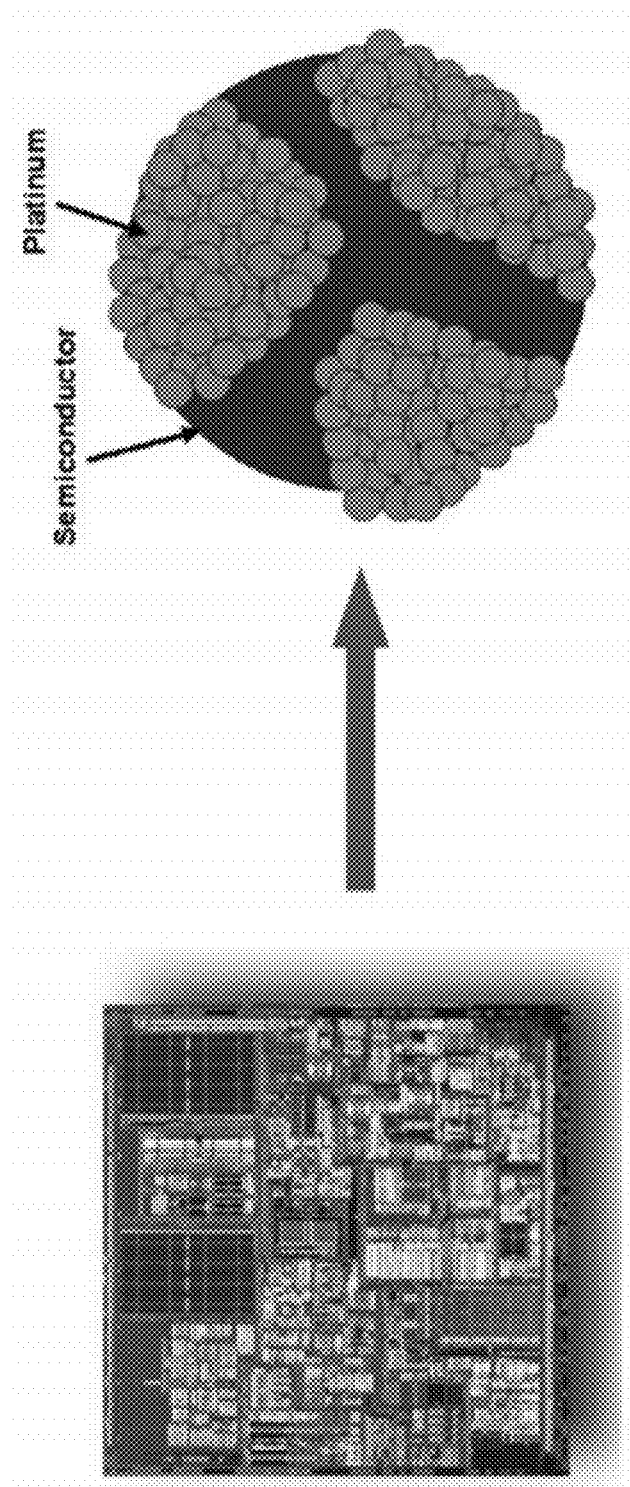
FIG. 105 provides a conceptual diagram indicating that the principles of integrated circuit design and processing can be adapted to create new heterogeneous catalysts.

FIG. 105 provides a drawing showing an analogy between a classical circuit device and a metal oxide-based "device". The metal oxide device comprises platinum islands on a semiconductor substrate.

Defect Engineering for Doping

Figure 106:
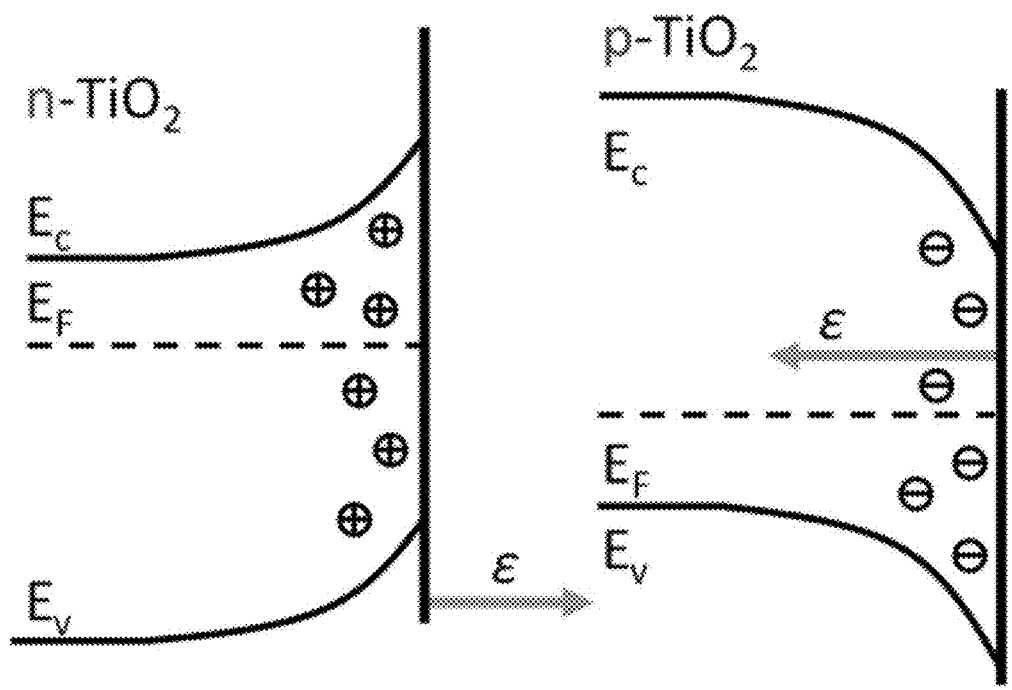
FIG. 106 provides electronic band diagrams as a function of position for $TiO_2$. The surface is the vertical line at the left of each diagram. Together, the figures show that changing the dominant type of dopant (n-type or p-type) in the $TiO_2$ reverses the direction of the electric field present at the free surface, and that changing the amount of dopant (which translates into the position of the Fermi level $E_F$) changes the magnitude of the field.

FIG. 106 provides energy level diagrams for n-TiO$_2$ and p-TiO$_2$. The diagrams plot $E_c$, $E_F$, and $E_v$ as a function of ∈. Together, the figures show that changing the dominant type of dopant (n-type or p-type) in the TiO$_2$ reverses the direction of the electric field present at the free surface, and that changing the amount of dopant (which translates into the position of the Fermi level $E_F$) changes the magnitude of the field.

Design of Supported Metal Catalysts: Concept

Figure 107:
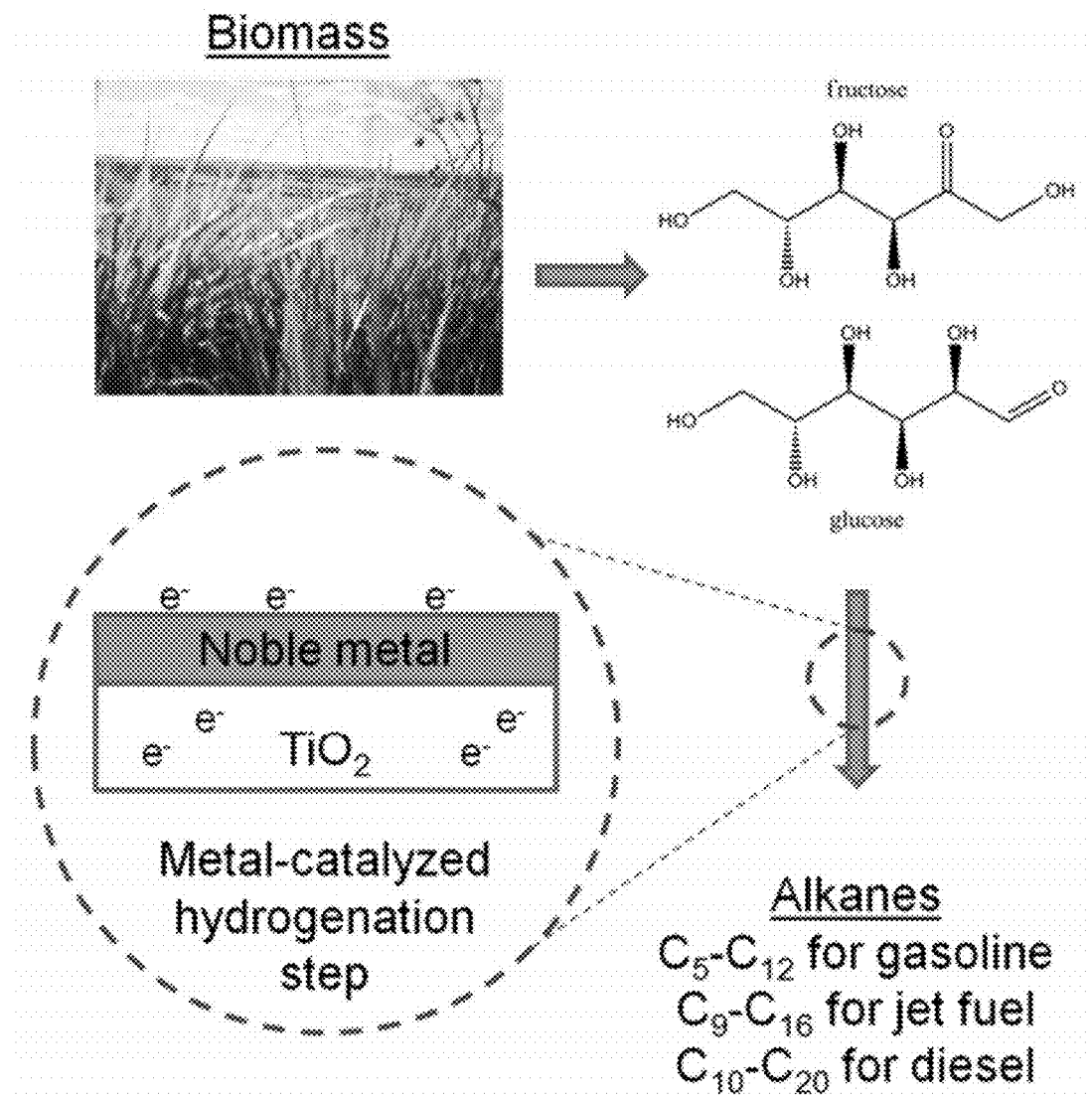
FIG. 107 provides a schematic showing the catalytic production of alkanes from biomass using a metal-catalyzed hydrogenation step, as described herein.

FIG. 107 provides a schematic diagram for the production of alkanes from biomass using a metal-catalyzed hydrogenation step. The top-left portion of FIG. 107 is an image of an example biomass (grass). The top-right portion of FIG. 107 provides the chemical structures for fructose and glucose. The step of transforming biomass into fructose and glucose is indicated by an arrow between the top-left and top-right portions of FIG. 107. The bottom-right portion of FIG. 107 provides carbon ranges for alkanes produced from glucose and fructose. The carbon ranges are $C_5$-$C_{12}$ for gasoline, $C_9$-$C_{16}$ for jet fuel, and $C_{10}$-$C_{20}$ for diesel. The step of converting fructose and glucose into alkanes is indicated by an arrow between the top-right and bottom-right portions of FIG. 107. The metal-catalyzed hydrogenation step of converting fructose and glucose to alkanes is indicated by an expanded view of the arrow between the top-right and bottom-right portions of FIG. 107. This expanded view provides an example of a catalyst material comprising a noble metal on a TiO$_2$ substrate. Electron density of the TiO$_2$ substrate bulk and the noble metal surface is indicated by e$^-$ in FIG. 107.

Design of Photocatalysts: Concept

Figure 108:
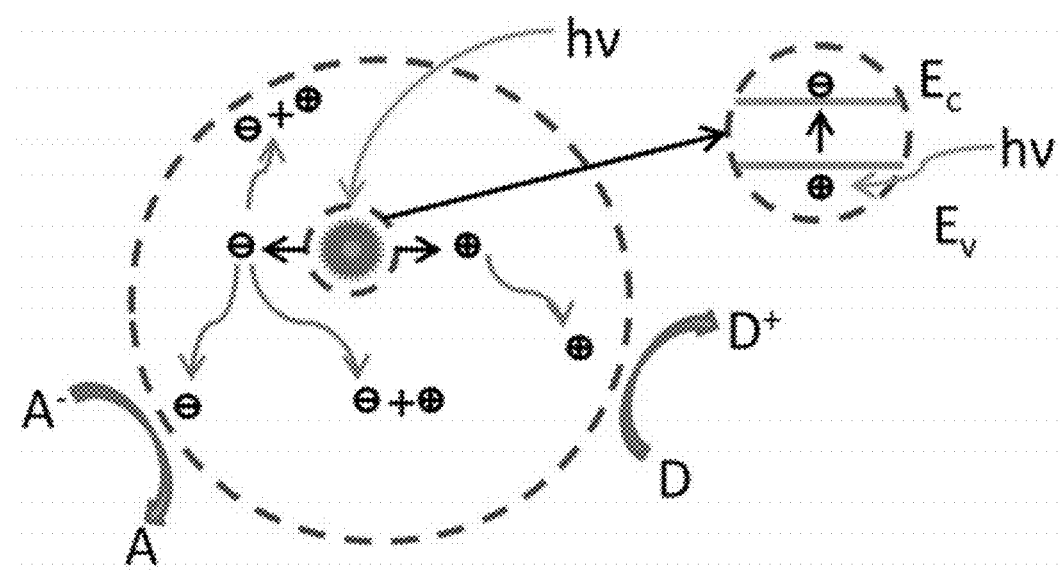
FIG. 108 provides a generic schematic diagram of heterogeneous photocatalysis, showing that photocatalytic creation of electrons in the conduction band and holes in the valence band of the semiconductor lead to hole donation to donor molecules D in the surrounding medium and electrons to acceptor molecules A.

FIG. 108 provides a schematic showing the creation of an electron-hole pair in a photocatalytic material by exposure to light having energy hv. An inset of FIG. 108 shows creation of the electron-hole pair by promotion of an electron from the valence band of the photocatalytic material to the conductance band of the photocatalytic material. This promotion is shown in the inset of FIG. 108 as occurring upon exposure of the photocatalytic material to light having energy hv. The mobile electron of the electron-hole pair is shown combining with another hole either in the bulk of the photocatalyst or on the surface in FIG. 108. Additionally, FIG. 108 also shows the electron of the electron-hole pair combining with an electron acceptor at the surface of the photocatalytic material. FIG. 108 further shows the hole of the electron-hole pair combining with an electron donor at the surface of the photocatalytic material.

General Approach

Figure 109:
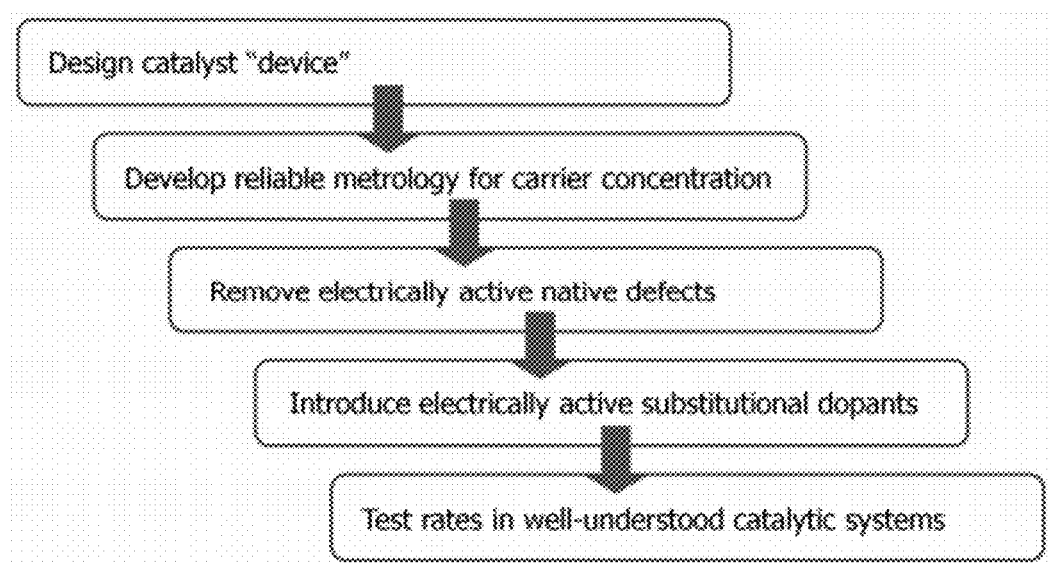
FIG. 109 provides a flow diagram showing a general approach for analyzing catalytic systems as described herein.

FIG. 109 provides a flow diagram for a general experimental approach to characterizing catalytic systems as described herein. The first step of FIG. 109 is to design a catalyst "device". The second step of FIG. 109 is to develop reliable metrology for carrier concentration. The third step of FIG. 109 is to remove electrically active native defects. The fourth step of FIG. 109 is to introduce electrically active substitutional dopants. The fifth step of FIG. 109 is to test rates in well-understood catalytic systems.

Strategy for Manipulating Generic Oxidation Rate

Figure 110:
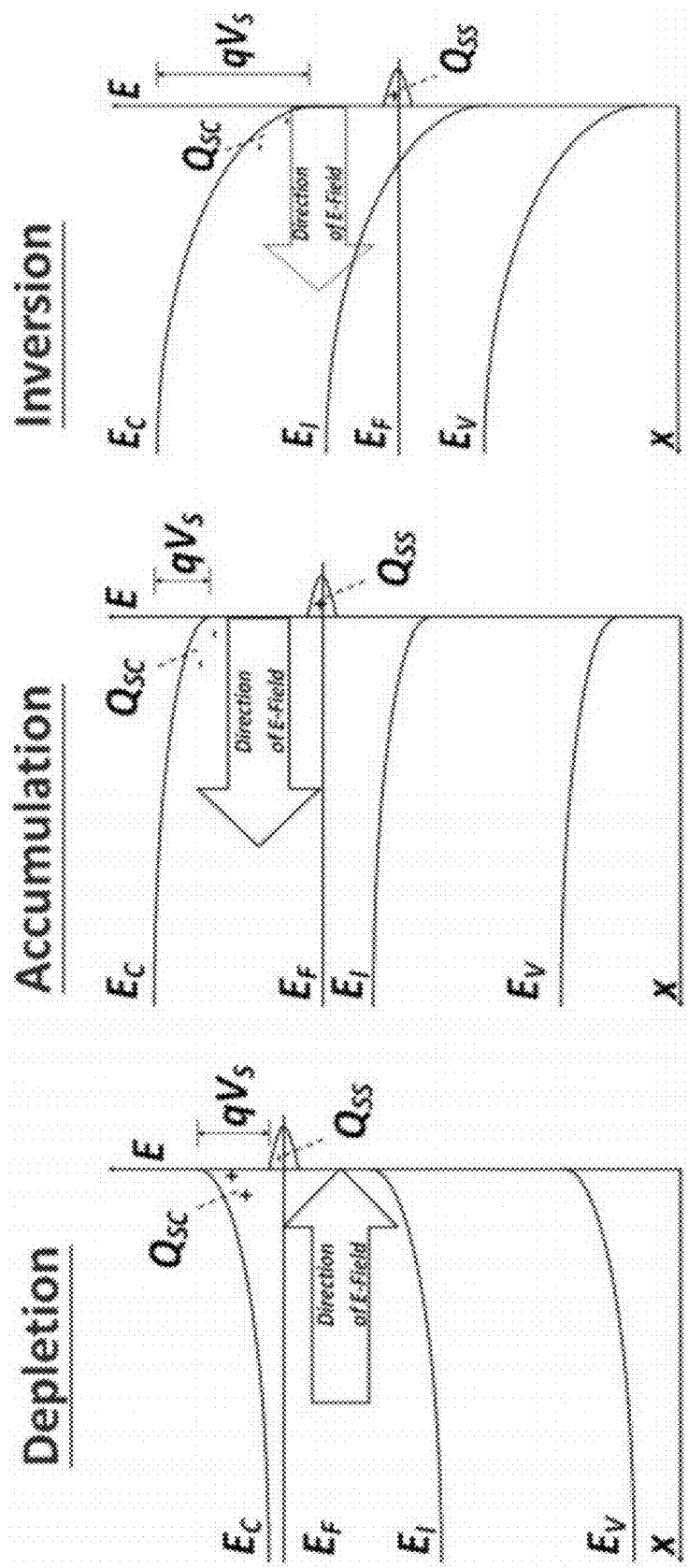
FIG. 110 provides generic schematic electronic band diagrams of the depletion, accumulation and inversion conditions at semiconductor surfaces, wherein the specific conditions are determined by the relative positions of the Fermi levels in the bulk and at the surface.

FIG. 110 provides typical energy level diagrams plotting $E_C$, $E_F$, $E_P$ and $E_V$ as a function of X under depletion, accumulation, and inversion conditions. $Q_{SC}$, $Q_{SS}$, the magnitude of $qV_S$, and the direction of the electric field are also indicated on each energy level diagram in FIG. 110.

Photocurrent Vs Doping Level

Figure 111:
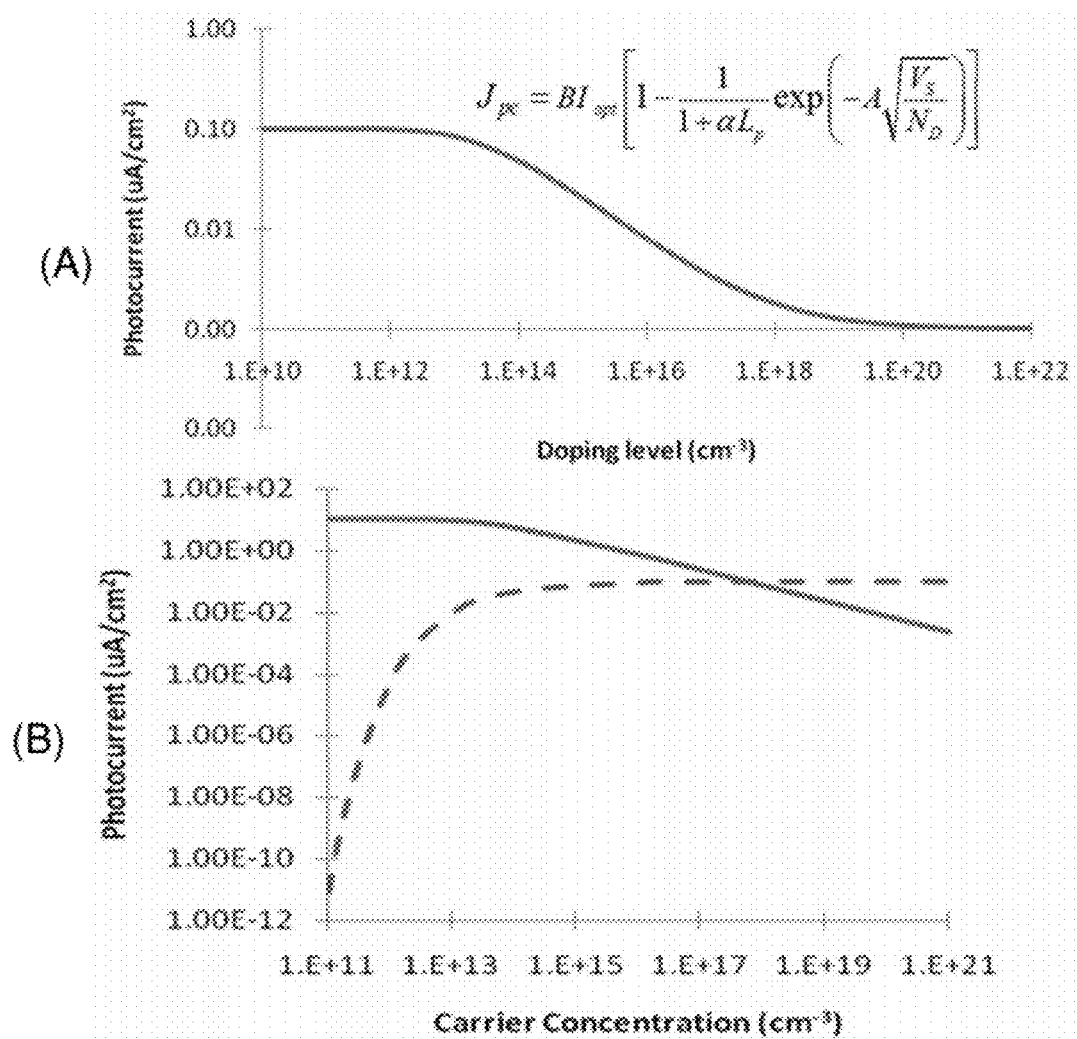
FIG. 111 provides (A) an example of the calculated hole photocurrent arriving at a rutile $TiO_2$ surface and available for photochemistry as a function of doping level (or n-type carrier concentration) of the $TiO_2$. Photocurrent was calculated according to the equation shown. Such diagrams form the basis for choosing the optimal doping concentration. (B) Shows the two principal contributions to the photocurrent at the surface: drift (blue solid curve) and diffusion (dashed red curve).

FIG. 111 provides plots showing calculated photocurrent at the rutile TiO$_2$ surface as a function of doping level and carrier concentration (with 100% of the dopant assumed to be active). Panel (A) provides the plot of photocurrent as a function of doping level and Panel (B) provides the plot of the two principle contributions to the photocurrent at the surface: drift (blue solid curve) and diffusion (dashed red curve). In Panel (A) photocurrent varies between 0.00 and 0.10 µA/cm² and doping level varies between 1E+10 and 1E+22 cm⁻³. In Panel (B) photocurrent varies between 1.00E−12 and 1E+02 µA/cm² and carrier concentration varies between 1E+11 and 1E+21 cm⁻³. Photocurrent was calculated according to the equation shown in Panel (A). Such diagrams form the basis for choosing the optimal doping concentration.

Electrical Characterization of $TiO_2$: C-V Measurements

Figure 112:
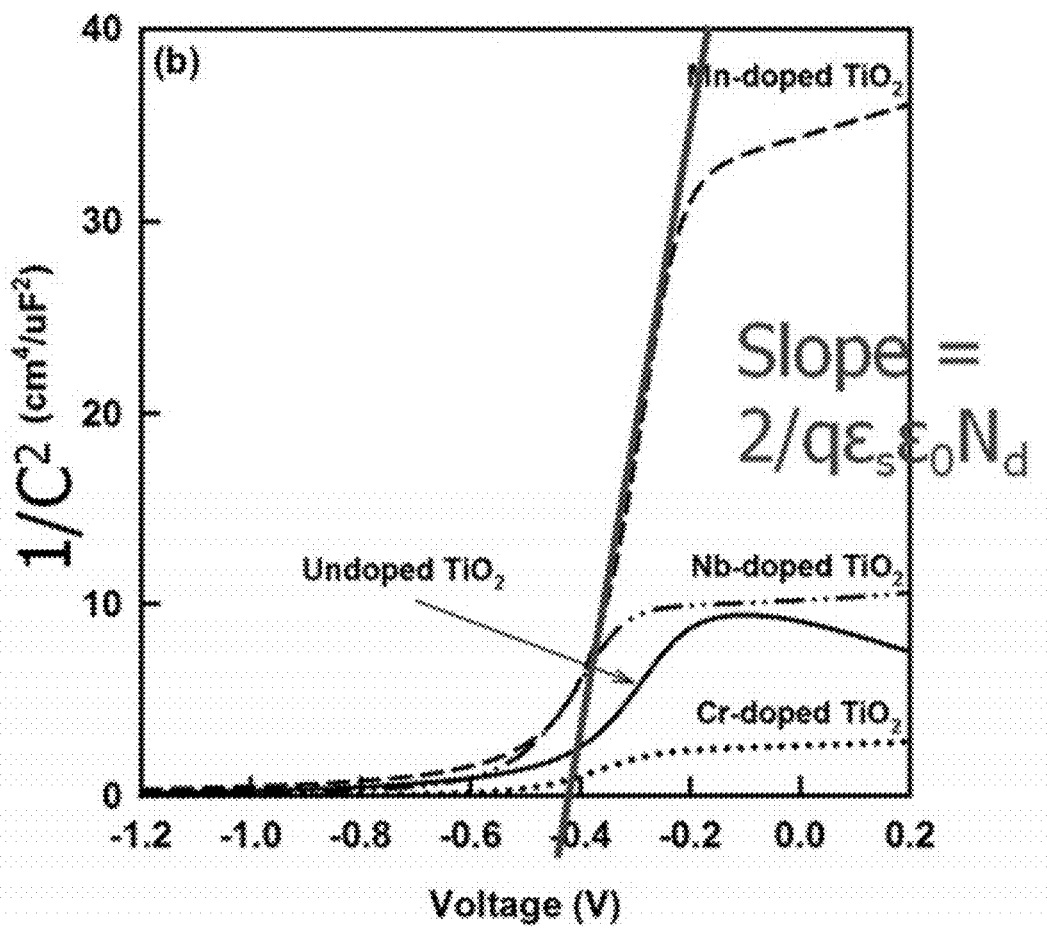
FIG. 112 provides a plot showing example capacitance-voltage data for thin-film polycrystalline anatase $TiO_2$ doped with various elements, together with the slope calculation that yields the carrier concentration in the film.

FIG. 112 provides a plot of $1/C^2$ as a function of voltage for undoped $TiO_2$ (solid line), Nb-doped $TiO_2$ (dot-dot-dash line), Mn-doped $TiO_2$ (dashed line), and Cr-doped $TiO_2$ (dotted line). The slope of the Mn-doped $TiO_2$ curve is indicated as $2/q\varepsilon_s\varepsilon_0 N_d$. In FIG. 112, $1/C^2$ varies between 0 and 40 cm⁴/µF² and voltage varies between −1.2 and 0.2 V.

Application to Oxygen Diffusion in $TiO_2$

Figure 113:
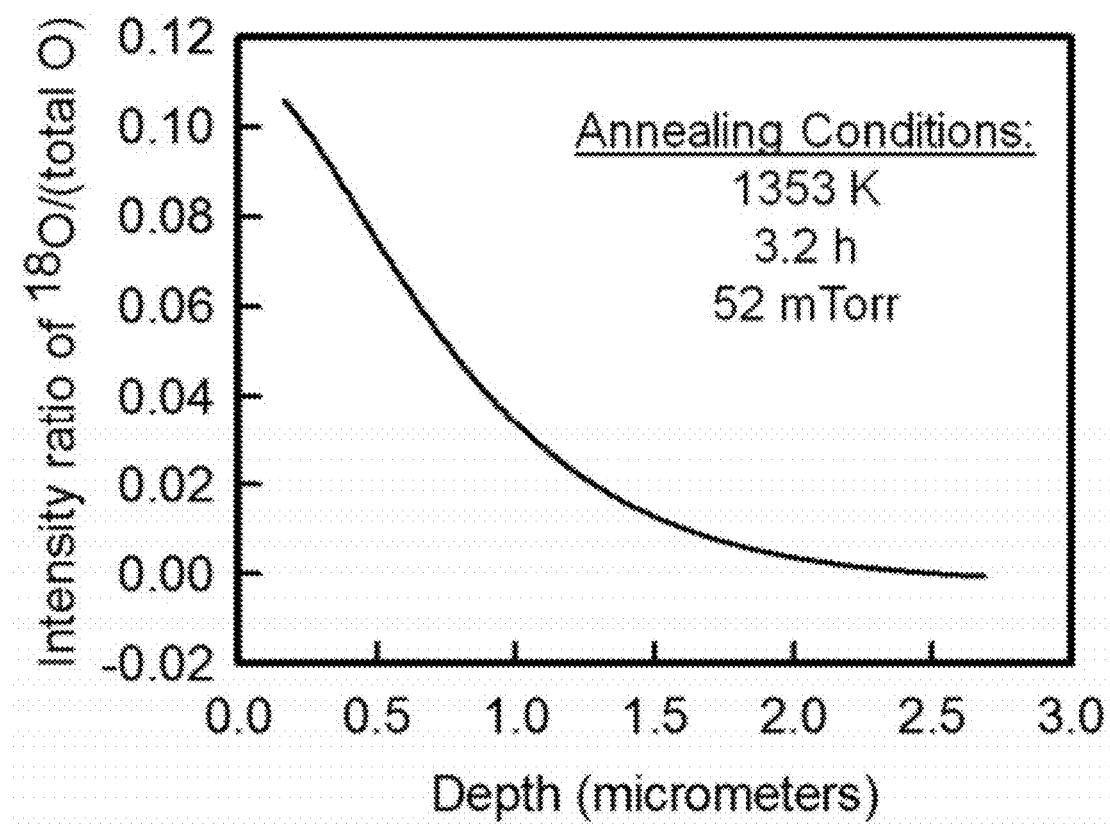
FIG. 113 provides a plot showing data from the literature (M. Arita et al., *J. Am. Ceram. Soc.* 62, (1979)) in which isotopically labeled oxygen was diffused into rutile $TiO_2$. The shape of the isotope profile obeys a complementary error function form characteristic of vacancy-mediated diffusion.

FIG. 113 provides a plot of intensity ratio of $^{18}O$ to total O as a function of depth under annealing conditions of 1353 K for 3.2 hours at 52 mTorr. In FIG. 113, the intensity ratio of $^{18}O$ to total O varies between −0.02 and 0.12 and depth varies between 0.0 and 3.0 micrometers. The shape of the isotope profile obeys a complementary error function form characteristic of vacancy-mediated diffusion.

Synthesis of Polycrystalline $TiO_2$ Via Atomic Layer Deposition

Figure 114:
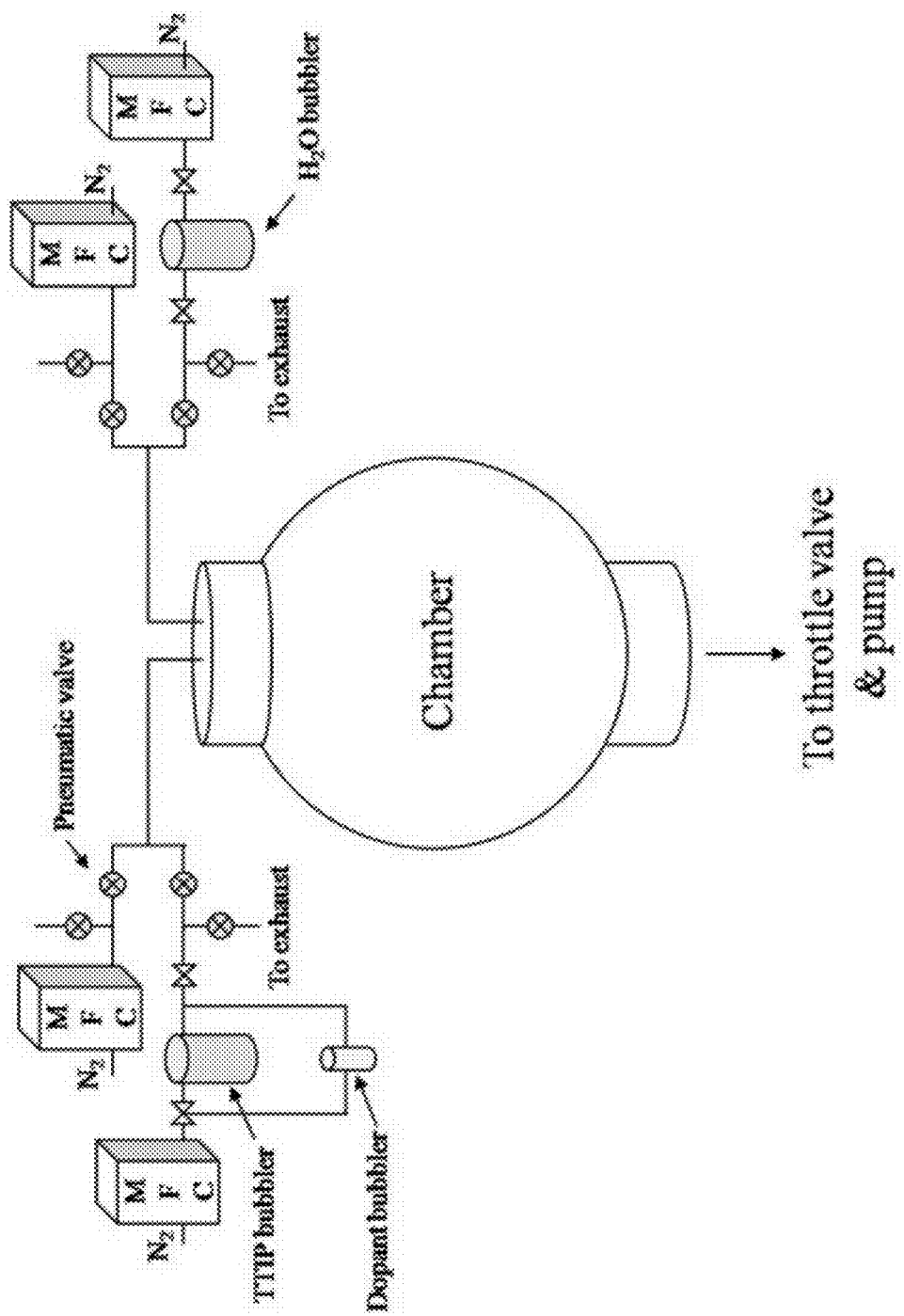
FIG. 114 provides a schematic of the apparatus used for atomic layer deposition of $TiO_2$, which was used to deposit the material having electrical characteristics shown in FIG. 112.

FIG. 114 provides a schematic of an apparatus for synthesis of polycrystalline $TiO_2$ via atomic layer deposition. The apparatus comprises a chamber connected to a throttle valve and pump. Connected to the chamber are two fluid lines. Each fluid line comprises two nitrogen lines provided by MFCs. One of the nitrogen lines of one of the fluid lines passes through a water bubbler. One of the nitrogen lines of the other fluid line passes through a TTIP bubbler and/or a dopant bubbler.

Figure 115:
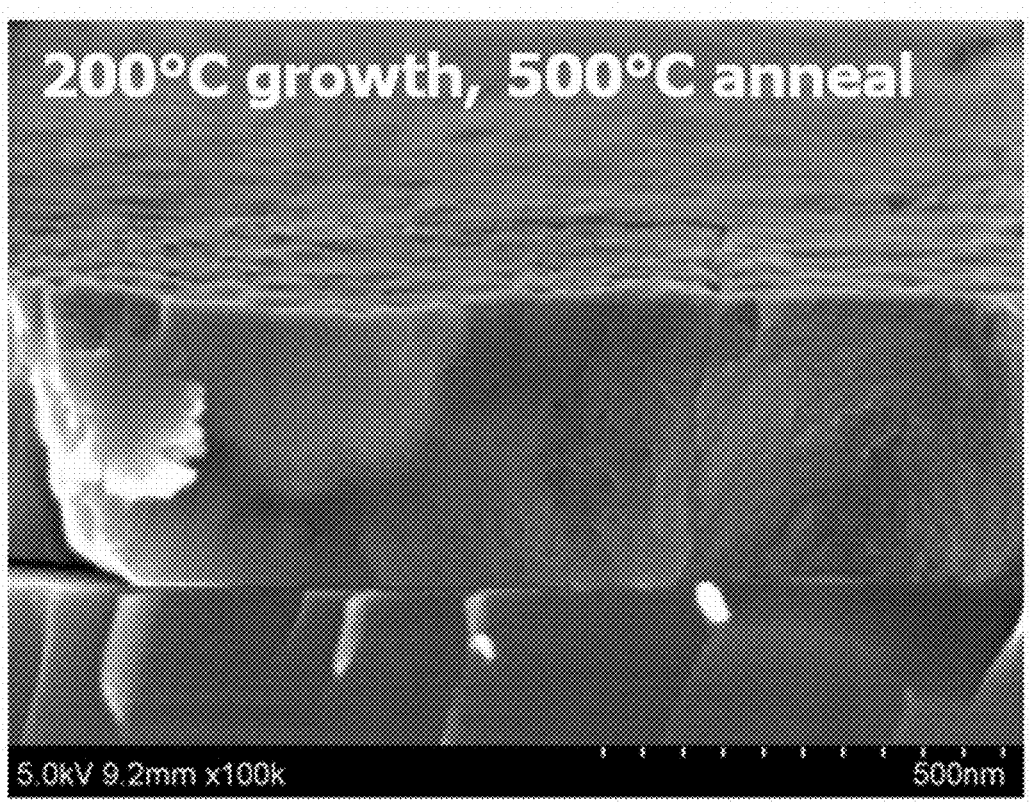
FIG. 115 provides a cross-sectional view of typical $TiO_2$ grown from the apparatus sketched in FIG. 114, taken by secondary electron microscopy. The material was grown amorphous at 200° C., and then annealed in air at 500° C. to crystallize it into anatase.

FIG. 115 provides a cross-sectional view of typical $TiO_2$ grown from the apparatus sketched in FIG. 114, taken by secondary electron microscopy. The material was grown amorphous at 200° C., and then annealed in air at 500° C. to crystallize it into anatase.

Dopant Selection: Problematic

Figure 116:
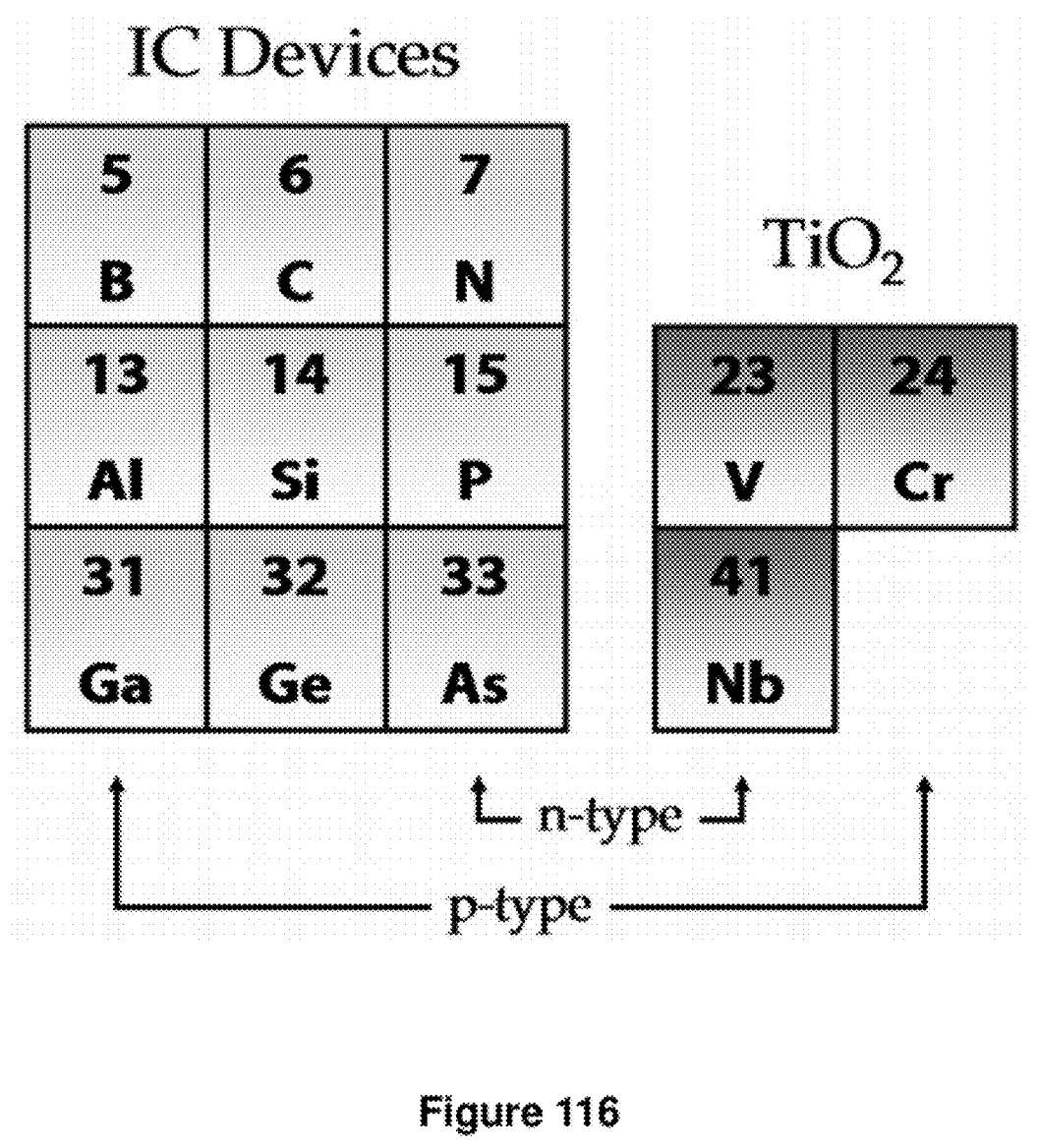

FIG. 116 provides a schematic showing p-type and n-type dopants for IC devices and $TiO_2$. For IC devices, B, Al, and Ga are identified as p-type dopants, while N, P, and As are identified as n-type dopants. For $TiO_2$, V and Nb are identified as possible n-type dopants while Cr is identified as a p-type dopant.

Example 6

Figure 117:
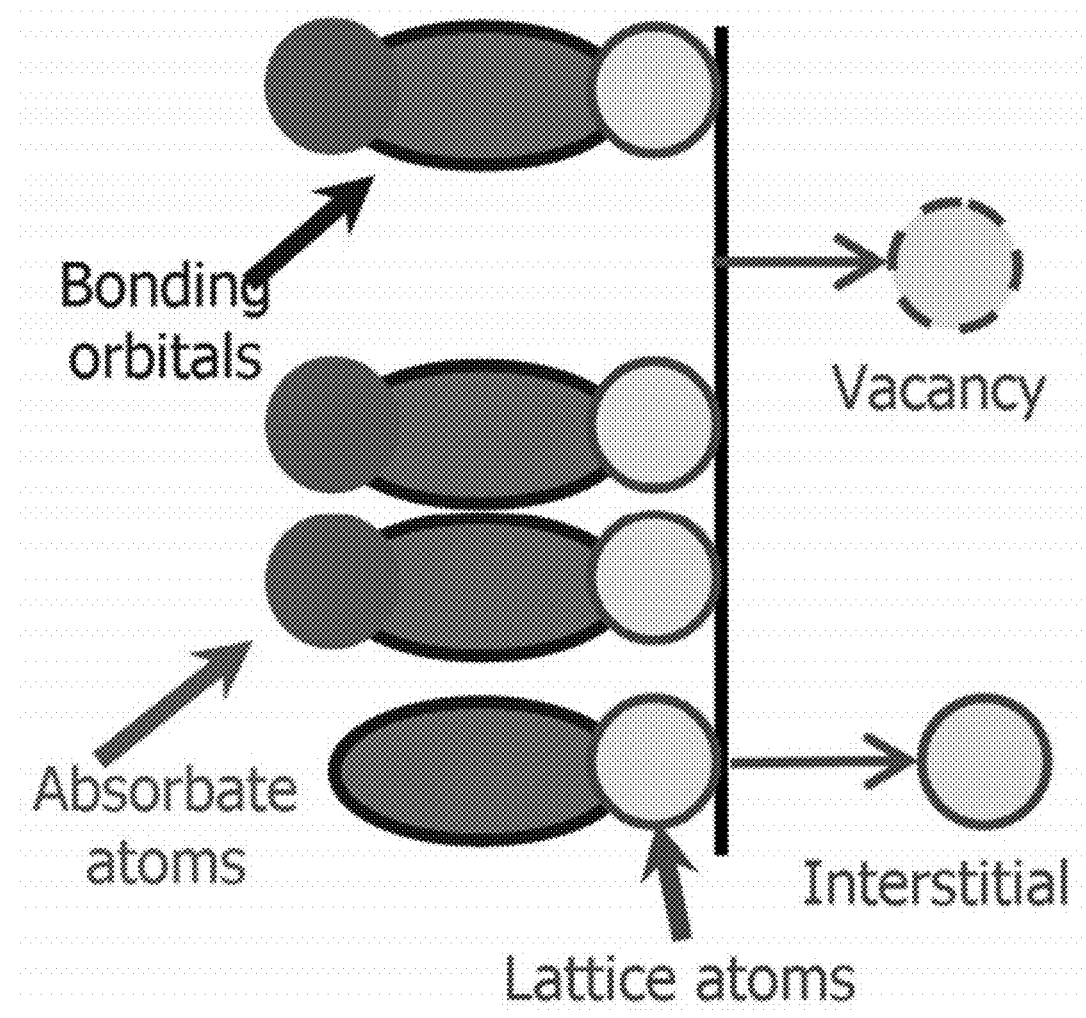
FIG. 117 provides a diagram showing how bulk interstitials and vacancies can be created at unsaturated surface sites more easily than within the bulk or at saturated surface sites. Fewer bonds need to be broken at unsaturated sites.

New Methods for Defect Manipulation in Semiconducting Oxides 6.1. Surface Defect Creation Mechanism for Oxygen in $TiO_2$ Experiments show [1] that surface chemical bonding state affects the self-diffusion rate in silicon by influencing the concentration of point defects within the solid. Solid-state diffusion measurements in the literature have typically been made in the presence of surfaces whose dangling bonds are unintentionally saturated with adsorbates of various kinds. The inventors found, however, that maintaining a chemically clean surface (with many dangling bonds) opens a pathway for native point defect formation at the surface that is more facile than corresponding pathways within the solid. FIG. 117 sketches this mechanism; at surface sites that are chemically unsaturated, fewer bonds need to be broken for creation of interstitials or vacancies than at saturated surface sites or within the bulk. Opening the clean-surface pathway yields much larger bulk defect concentrations than in conventional experiments (on a several-hour laboratory time scale) with correspondingly faster self-diffusion rates. Even submonolayer amounts of adsorbate can make an enormous difference (down to <1% of a monolayer for Si [2]). Data taken with the presence of unsaturated surface bonds therefore yield lower values for the defect formation energy, as the solid is closer to true equilibrium.

Figure 118:
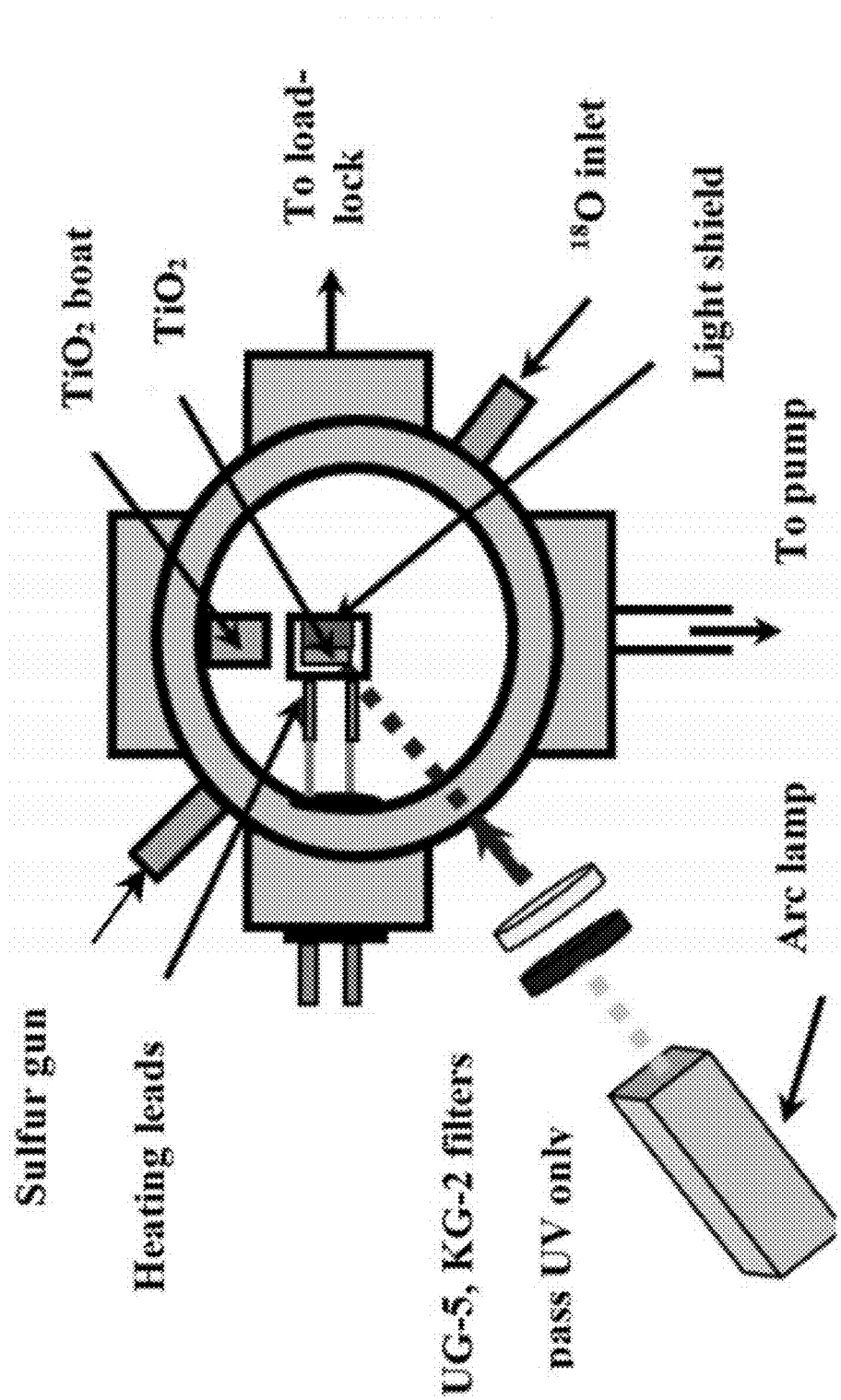
FIG. 118 provides an experimental setup for diffusion measurements showing oxide annealing of single-crystal oxides under controlled surface conditions, optionally under low-level photostimulation.

Strong evidence exists that such effects generalize to oxide semiconductors such as $TiO_2$. FIG. 118 shows a schematic of the experimental setup for diffusion experiments. Two custom-designed chambers with ultrahigh vacuum capability for surface treatment and annealing in controlled atmospheres are used, as well as several forms of surface and optical characterization [3] such as Auger spectroscopy, LEED and photoreflectance. Thus, surfaces can be analyzed before and after annealing for atomic composition. Single-crystal rutile $TiO_2$ (typically the (110) orientation) is heated by clamping to a resistively heated Si backing. In some experiments, the specimens are exposed to gases such as isotopically labeled $O_2$ at pressures of $10^{-6}$-$10^{-4}$ Torr, yet the overall ambient cleanliness for hydrocarbon and other typical gaseous contaminants remains comparable to ultrahigh vacuum. Before exposure to the isotopic label, defect concentrations within the solid are pre-equilibrated for several hours at the specified annealing temperature and pressure of natural-abundance oxygen. Diffusion profiles after annealing in the isotope are then measured with secondary ion mass spectroscopy (SIMS).

FIG. 49 shows a typical profile over several hundred nanometers for the atomically clean $TiO_2(110)$ surface. The $^{18}O$ profiles under such conditions have very clean-looking exponential-shaped tails (linear on the semilog scale) from about 30 nm down to >300 nm. One would normally expect instead a standard complementary error function form, which has indeed been observed in the literature [4]. The finding was unexpected for oxygen in rutile $TiO_2$. The available literature for this system has employed gas/solid isotope exchange between $^{16}O$ and $^{18}O$ [4, 5, 6, 7, 8], electrical measurements [9, 10], and surface-science techniques [11,12,13]. For isotope exchange measurements, several methods have been employed to profile $^{18}O$ diffusion including weight variation measurements [5], mass spectrometric determination [6,7], nuclear sectioning [8] and SIMS [4]. Based on that work, oxygen has long been thought to diffuse via a vacancy mechanism involving no special intermediate [14]. Yet several years ago exponential behavior for clean-surface Si was observed [1, 15]. Generally speaking, the shape is observed in the asymptotic limit of diffusion at short times when diffusion is mediated by a fast-moving intermediate [16, 17, 18]. Indeed, this shape is exceptionally strong evidence for such an intermediate, which is typically a lone interstitial or an interstitial paired with a vacancy. Interstitial oxygen species have been postulated in the literature based on quantum calculations [19]. The presence of the exponential shape suggests the surface has turned on an efficient pathway for forming such mobile interstitials.

Figure 119:
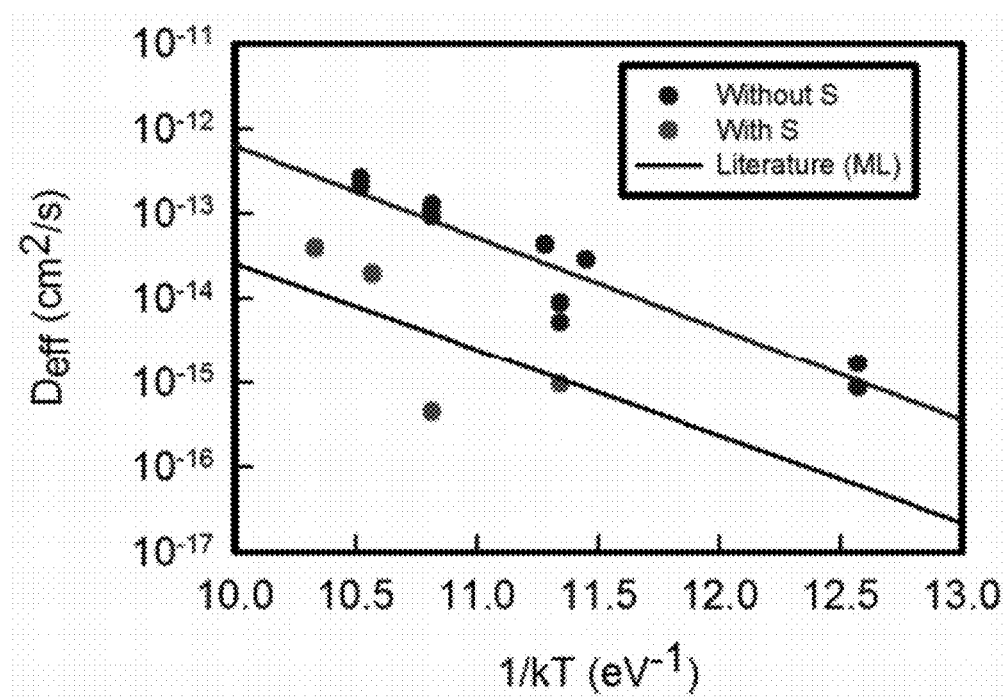
FIG. 119 provides a plot showing a typical Arrhenius plot ($10^{-5}$ Torr, 90 min) for $^{18}O$ diffusing in rutile $TiO_2$ with an atomically clean surface (above) and with about 0.2 mL of adsorbed sulfur (below). "ML" line represents the diffusivity calculated from an aggregate of literature reports with activation energy/prefactor computed by Maximum Likelihood estimation. Clean surface yields considerably faster diffusion than the literature, but adsorption of small amounts of sulfur that saturate dangling bonds pulls the diffusivities down into the range of the literature.

FIG. 119 shows an example Arrhenius plot of the effective diffusivity $D_{eff}$ for $^{18}O$ in $TiO_2$, extracted by a mathematical formalism developed for such profiles [20, 21]. The diffusivities are about a factor of 50 higher than those observed in the aggregate literature. To test whether the extra defects indeed originate at the surface, we compared diffusivities for an atomically clean surface with those for a surface having submonolayer quantities of a tightly bonded adsorbate. In the former case of Si, we exposed the surface to ammonia to yield surface N [1]. For the present case of $TiO_2$, we exposed the surface to elemental sulfur from a solid-state electrochemical gun [22]. In both cases, much faster diffusion occurs for the clean surface, and standard literature values for $D_{eff}$ can be recovered in the presence of the adsorbate.

Thus, the exponential profile shapes, coupled with the high diffusion rates for the clean surface and the ability to recover literature values in the presence of controlled adsorption, give strong evidence that the inventors have found a way to switch on and control a new surface pathway for point defect formation in $TiO_2$. In addition, preliminary evidence shows that such surface effects operate even more effectively (for O interstitials) using the (001) orientation. The clean (001) surface is more prone to form facets than the (110) [23], which presumably yields more dangling bonds.

6.2. Electrostatic Interaction Mechanism for Oxygen Defects

It has been shown previously that surfaces can couple to charged defects in the semiconductor bulk through direct electrostatic interaction [24-26]. Experiments and computations were performed using Si as the semiconductor. Atomically clean semiconductor surfaces often support electrically charged defects that induce near-surface band bending. One effect of the band bending is the creation of a near-surface electric field, as shown in FIG. 120 for a p-type semiconductor. When the background carrier concentration is sufficiently large, the electric potential between the surface and bulk drops over a narrow space charge region, meaning the local electric field near the surface is high. This field can attract or repel charged bulk defects from the surface, depending upon their charge state. In most typical cases, however, the direction of the field induces repulsion. Early work considered silicon, mainly in the context of doping by ion implantation. In that application, the electrostatic interaction tends to inhibit annihilation of implant-induced interstitials at the surface. The present application of O diffusing into $TiO_2$ is different, as diffusing defects originate at the surface and must break away into the bulk. Attraction between the surface and the defects would inhibit defect transfer into the bulk, whereas repulsion would enhance that transfer, which should manifest as changes in $D_{eff}$. However, such change would need to be disaggregated from other influences on $D_{eff}$.

Work with dopants in silicon showed that the electrostatic interaction has another, more definitive, effect on diffusion profiles: dopant pileup within the first 4-10 nm of the surface [25]. If the diffusing point defects are capable of assuming multiple charge states and the band bending is large enough, the defects near the surface change their charge state from the value of the deep bulk. In this way, near-surface defects that would otherwise be repelled from the surface might experience a neutral interaction or even an attraction. Computations and experiments for dopants in silicon demonstrated that pileup can occur near the surface as follows. Minority-abundance interstitials (i.e., of the dopants) are sequestered in the lattice by kick-in reactions, yielding mostly majority-abundance interstitials as products. But majority-abundance interstitials undergo such sequestration only rarely because the lattice already consists mostly of majority-abundance atoms. In other words, kick-in of majority-abundance interstitials produces more majority-isotope interstitials. Thus, the minority species is much more sensitive to the electrostatic interaction with the surface than the majority species, so that the minority species gets stuck in the lattice preferentially and piles up.

A related pile-up effect occurs for minority-species $^{18}O$ in $TiO_2$. The upturn in $^{18}O$ concentration near the surface in FIG. 49 is a low-resolution manifestation of this surface pile-up effect. FIG. 69B shows examples at higher spatial resolution. The difference due to photostimulation will be described further in the next section; for now, the most important aspect is the peak in the profiles at about 4 nm depth. Intuitively, one would expect profiles that decrease monotonically from the surface (where the $^{18}O$ enters) into the bulk. The profile shapes were examined carefully and various control experiments were performed, and the behavior was not consistent with SIMS-induced ion mixing [27] or other artifacts. The degree of pile-up varies from sample to sample, which is probably due to as-yet uncontrolled variables connected with the number and type of charged defects residing on the surface.

6.3. Photostimulated Diffusion of Oxygen in $TiO_2$

Nonthermally photostimulated diffusion was observed both in the Si bulk [28] and on the amorphous $TiO_2$ surface [29]. These phenomena are driven by photostimulated changes in the charge state of mobile defects (on the surface or in the bulk), which propagates into the number and/or mobility of the defects. To see whether such effects could also operate within rutile $TiO_2$, the experiments described above were replicated with super-band gap illumination having intensities on the order of 0.2 W/cm$^2$. Published quantum calculations suggest that the O interstitials can have more than one charge state [30]; thus, a nonthermal effect of photostimulation on diffusion should be possible. Example data are shown in FIG. 6 for the near-surface region, while FIGS. 121A and 121B show additional data for the deeper bulk as well as the near-surface. Indeed, the data show significant illumination effects on $^{18}O$ diffusion profiles. This finding confirms that photostimulation effects extend to semiconductors other than silicon, including metal oxides. However, sometimes illumination enhances the diffusion, and under other conditions there is inhibition. Concurrent work involving diffusion of dopants in Si near an $SiO_2$ interface shows similar behavior. That work has provided evidence that a new and distinct effect may be at play. Photostimulation may change the average charge state of defects on the surface. This change then affects the magnitude of electrostatic coupling between charged surface and charged bulk defects as outlined in the previous section. The experimental variability would be due to variations in the number and density-of-states of charged surface defects, which are known to depend sensitively on surface preparation conditions. These mechanisms apply to $TiO_2$ as well.

6.4. Systems-Based Modeling of Defect Diffusion and Reaction in $TiO_2$

To better understand these surface and photostimulation phenomena, a continuum simulator was developed for the behavior of point defects in $TiO_2$ based on the software package FLOOPS 2000 (by Mark E. Law of the University of Florida and Al Tasch of the University of Texas/Austin [31]). The package solves the time- and space-dependent differential equations for diffusion and reaction of the defects amongst themselves and the surface, and includes Poisson's equation governing the motion of charged species. The simulator incorporates the pre-annealed profile and a suite of activation energies/pre-exponential factors for each elementary step to yield annealed profiles as a function of temperature and ambient oxygen pressure. A model for bulk defect generation and annihilation at the surface has been built into the simulator, based upon Langmuir-type adsorption of $O_2$ on the surface and thermally activated creation of bulk defects from surface atoms. Some model parameters (such as formation energies and site-to-site hopping energies) have already been reported in the literature from experiments or quantum calculations. However, there is considerable scatter in the available numbers. Hence, the values were estimated through the computational technique from systems engineering called "Maximum Likelihood (ML) estimation." The ML method weights each value from the literature according to its standard deviation, forming a new "average" value that is based more heavily on the values in which the reported confidence interval is smaller. This approach was used with success for Si.

Formal parameter sensitivity analysis was also performed for the $TiO_2$ case to determine which parameters influence the model's behavior the most, and hence which elementary steps influence the overall mechanism the most. For the most sensitive parameters, the ML values have been combined with new experimental diffusion profiles. The combination is performed using another systems engineering method called Maximum a Posteriori (MAP) estimation, which yields greatly refined estimates. There are two leading candidates for the point defect that could give rise to these exponential profiles: a lone $^{18}O$ interstitial or an O interstitial paired with a Ti interstitial. Model discrimination techniques have tentatively pointed to the lone $^{18}O$ interstitial as the most likely cause, mainly due to the high formation energy of Ti interstitials.

Introduction

The technologically useful properties of a solid often depend upon the types and concentrations of the defects it contains. For example, defects such as vacancies and interstitial atoms mediate foreign-atom diffusion in semiconductors used for microelectronic devices [20], which would be nearly impossible to fabricate without the diffusion of these atoms. Defects also affect the performance of photoactive devices [33], the effectiveness of catalysts [34-39] including $TiO_2$ photocatalysts [40, 41], the sensitivity of solid-state electrolyte sensors [42], and the efficiency of $TiO_2$-based devices for converting sunlight to electrical power [43]. ZnO has received considerable attention [44,45] due to its wide range of conductivity (metallic to insulating), direct and wide band gap ($E_g$~3.4 eV), large exciton binding energy (60 meV) [46], piezoelectricity [47], room-temperature ferromagnetism, and chemical-sensing effects [48]. ZnO finds potential application in optoelectronic devices (laser diodes, green-blue LEDs) [109] and nanowire-based gas sensors ($NO_x$, $H_2$) [49, 50]. Room temperature green luminescence and gas sensing in ZnO are governed by point defects, and their motion and interactions remain poorly understood. Photoluminescence and gas sensing effects in ZnO are often attributed to oxygen vacancies either on the surface or in the bulk. Yet the evidence is indirect, based on luminescence changes in response to coating and conductivity changes due to annealing various gases [49]. The lack of clarity may actually result from rapid exchange between defects on the surface and in the bulk. Indeed, published studies suggest some form of fast-moving defect intermediate [51,52].

Current methods for controlling defect behavior in semiconductors suffer from problems with solid consumption, implantation damage, or foreign atom incorporation [53]. The present Example develops other recently discovered forms of defect manipulation in the oxide semiconductors $TiO_2$ and ZnO. Those forms involve two modes for bulk-surface coupling and one mode for optical stimulation of defect formation and migration. Regarding bulk-surface coupling, solid-state diffusion measurements [1,2], together with the work of Diebold et al. [23, 54, 55, 56] and Bartelt [57], have suggested that reactions of semiconductor surfaces with bulk point defects can exhibit chemistry that is comparable in richness to the reactions of surfaces with gases. Little attention has been paid to this alternative form of surface chemistry, even though it appears to play a primary role in regulating bulk defect concentrations. In semiconductors, both electrostatic and surface bond insertion/generation mechanisms can operate. Regarding optical stimulation, the inventors have shown that defect mobilities and concentrations can be non-thermally modulated in semiconductors by super-band gap illumination through photostimulated changes in the average defect charge state.

These effects were first discovered for silicon, but results strongly suggest they generalize to the generation and photostimulation of oxygen defects in $TiO_2$. That generalization may also include generation and photostimulation of titanium defects in $TiO_2$, as well as surface annihilation of O and Ti defects. In addition, this Example seeks to extend the effort to the generation and photostimulation of O-defects in ZnO— another metal oxide semiconductor in which defect manipulation would be useful. In both materials, specially synthesized structures can be used to measure generation and annihilation rates of point defects at surfaces. The effects of controllable adsorption and surface crystallographic orientation are examined. Such measurements have not been made aside from the inventors' work, although a few quantum-based computational estimates have been attempted [58, 59] for Si. Optical stimulation effects are quantified by analogous experiments performed under super-bandgap illumination. Detailed modeling of the defect diffusion-reaction networks underpin experimental interpretation.

Background

The Results from Prior Support offers a brief sketch of the mechanisms for defect manipulation discovered, first in Si and now in $TiO_2$. The following sections further describe these mechanisms.

Coupling Through Defect Exchange at the Surface

Scarce literature describes mechanisms by which bulk point defects can serve as mediators of surface-bulk coupling. A few reports have indicated how surface morphology on metals [60] and semiconductors [23, 54-57] change in response to interaction with bulk defects. However few published reports have discussed how to use the surface to control bulk defect behavior.

Experiments to show that the surface can act as a variable source of bulk point defects when the solid is undersaturated in those defects are outlined here. Undersaturation is easy to obtain—by simply heating the solid to a temperature at which thermodynamics drives the defect concentration to increase. The equilibrium concentration of both interstitials and vacancies rises, and so these defects must be created spontaneously—either from the bulk or at the surface. The mesoscale self-diffusivity $D_{eff}$ can be determined from the degree of spreading of an isotopic label from an initial step profile (as shown in Si [1]) or from the surface (by exposing $TiO_2$ to $^{18}O$). The spreading depends not only upon the site-to-site hopping rate of the point defects responsible for motion, but also upon their number [61-67]. The inventors' spreading experiments resemble profile-evolution methods employed in other laboratories [51, 52, 64-68]. However, a crucial distinguishing feature of the measurements is that experiments are performed in ultrahigh vacuum. Thus, unlike previous work, the surfaces can be made atomically clean (as confirmed by Auger spectroscopy). The self-diffusivities for both $TiO_2$ and Si are one or more orders of magnitude higher than all those previously reported. Profile analysis by methods described below points to a much larger concentration of point defects due to faster surface-driven equilibration.

Results for Si [1] (FIG. 59A) have indicated that the surface can be a controllable sink for point defects when the bulk is supersaturated. Supersaturation can occur when the solid is implanted with isotopically labeled atoms, so that the excess atoms aggregate into clusters or similar extended defects. Upon heating, the extended defects re-emit point defects, thereby inducing the implanted profile to spread. The point defect concentration typically exceeds the thermodynamic limit (with a sufficient degree of implantation and heating). But if the profile lies near a surface or interface, that boundary can annihilate the point defects at a rate that can be controlled by the degree of saturation by an adsorbate. Changing the amount of adsorbate changes the saturation of the dangling bonds and permits control over the probability of defect annihilation. Less profile spreading takes place for an atomically clean surface than for a saturated one because fewer defect interstitials are available in the bulk to promote diffusion and profile spreading.

Coupling Through Surface Electrostatics

The basic mechanism for electrostatic coupling was described briefly above. As shown in FIG. 120 for a p-type semiconductor, the band bending sets up a near-surface electric field pointing into the bulk. In the case of Si, interstitial atoms of Si and of a p-type dopant such as boron are positively charged under these conditions [69-72], so the field repels the interstitials from the surface. In fact, calculations with a process simulation model based on rigorous systems-based methods [73-78] showed that the field is sufficiently strong to halt the diffusion of positively charged B and Si interstitials toward the interface. An analogous effect would be observed for negatively charged defects diffusing in n-type material. The electric field transforms the surface from a significant sink into a good reflector, which translates into changes in the effective diffusivity. However, substantial defect modeling is required to disaggregate this effect from that of the bond exchange mechanism. The ability to model such phenomena in Si is quite advanced, but remains at an early stage for $TiO_2$. As mentioned above, the electrostatic interaction also results in pile-up near the surface for dopants implanted into Si, and apparently for $^{18}O$ diffusing into $TiO_2$.

For Si, it is possible to control the degree of band bending by the adsorption of oxygen (on a clean surface), the amount of ion bombardment (for the oxide interface), and the degree of annealing to heal interface defects (for the oxide interface). The control propagates into the observed values of $D_{eff}$ (for both self- and dopant-diffusion) as well as the amount of dopant pile-up. Experiments with sulfur adsorption on $TiO_2$ have marked the ability to control the state of the $TiO_2$ surface.

Optically Stimulated Diffusion

Several reports in the literature have suggested that optical illumination can influence bulk diffusion in semiconductors nonthermally [79-85]. In all these cases, however, heating by the probe light or changes in heating configuration as probe intensity varied cast doubt upon the interpretation. Definitive results awaited experimental configurations in which heating and illumination could be decoupled.

The inventors used the specimen configuration shown in FIG. 117 to show that low-level optical illumination can either enhance or inhibit diffusion of indium, germanium and antimony on Si surfaces by nearly two orders of magnitude, depending on the doping type (n or p) of the underlying substrate [86, 87]. Related effects for bulk self-diffusion in Si have been uncovered [29, 88]. For self-diffusion in n-type Si, diffusional enhancements rise to a factor of roughly 50 at an illumination intensity of 1.5 $W/cm^2$ (which does not appreciably heat the material). For p-type Si, however, illumination under the same conditions exerts no effect at all. Similar phenomena for diffusion on amorphous $TiO_2$ have recently been observed [29], wherein super-bandgap illumination enhances surface diffusion. Also, for rutile $TiO_2$, such illumination seems capable of inducing either enhancement or inhibition depending upon circumstances.

FIG. 122 sketches one mechanism that is operating on most or all of these cases. Illumination splits the thermal Fermi level $E_F$ into quasi-Fermi levels $F_n$ for electrons and $F_p$ for holes. At sufficiently high illumination intensities, $F_p$ moves past an ionization level for the point defect responsible for motion, changing its average charge state and consequently its concentration and/or its site-to-site hopping rate. These effects have been modeled quantitatively for Si self-diffusion through a model based on Shockley-Read statistics; a sample fit appears in FIG. 72A. As the data for $TiO_2$ suggest, these effects probably operate for oxide semiconductors (which have charged point defects) as well as for Si.

However, work with $Si-SiO_2$ interfaces as well as the results obtained for $TiO_2$, give evidence for another mechanism. Photostimulation may alter the charge state defects present at the surface or interface of an oxide. This change then affects the magnitude of electrostatic coupling between charged surface and charged bulk defects as outlined in the previous section. The experimental variability observed for both the $Si-SiO_2$ interface (FIG. 123) and the $TiO_2$ surface (FIGS. 69B and 121) would be due to variations in the number and density-of-states of charged surface defects, which are known to depend sensitively on preparation conditions.

Many experiments described so far have involved $TiO_2$ (based on work in Si), but important aspects of the defect control mechanisms are applicable to other materials and systems. Furthermore, the similar chemistry and physics should govern the behavior of other oxide semiconductors as well. For example, charged defects are also known to exist within ZnO [14], which means that electrostatic surface-bulk coupling and optically stimulated diffusion should be likely to occur under suitably chosen conditions. Surface-bulk coupling through defect addition to dangling bonds should occur regardless of charge state. These mechanisms should provide new ways for performing defect manipulation in a variety of metal oxides.

Experimental and Computational Methods

Since point defects in the solid are difficult to examine directly, diffusional profile spreading of a suitably chosen isotope as an indirect marker of defect concentrations and diffusion rates is measured. The diffusion profiles can be simulated using continuum diffusion equations that model the interaction between the isotope and the defect(s) being examined. The simulation outputs can be parameters such as point defect site-to-site hopping rates, and exchange rates with the lattice and surface. Experiments as a function of temperature can give effective activation energies for these elementary steps. It is then possible to examine how these parameters vary with surface treatment, crystallographic orientation, and photoexcitation. Specific sample configurations and methods are described throughout the following sections.

Generally speaking, diffusion profiles can be measured with secondary ion mass spectroscopy (Cameca IMS 5f and PHI Trift III TOF) using a custom-designed apparatus for specimen annealing in controlled atmospheres, and for performing certain forms of surface and optical characterization [89]. These chambers suppuration bombardment with a custom ion gun designed for narrow energy spread, which can be used for ion implantation. There is also a solid-state electrochemical source for sulfur [22] and an evaporation source for isotopically labeled $^{46}Ti$ (>90%, compared to 8% natural abundance) based on literature designs using $TiO_2$ powder [8]. Commercial single crystal substrates of $TiO_2$ are reused after diffusion experiments by regeneration in concentrated sulfuric acid at 200° C. followed by an extensive rinsing procedure that etches $TiO_2$ slowly and uniformly without significant contamination. Analogous procedures for single-crystal ZnO will be developed. The metal isotope of interest is $^{67}$Zn (as ZnO, isotopic enrichment >70% compared to 4% natural abundance).

Figure 104:
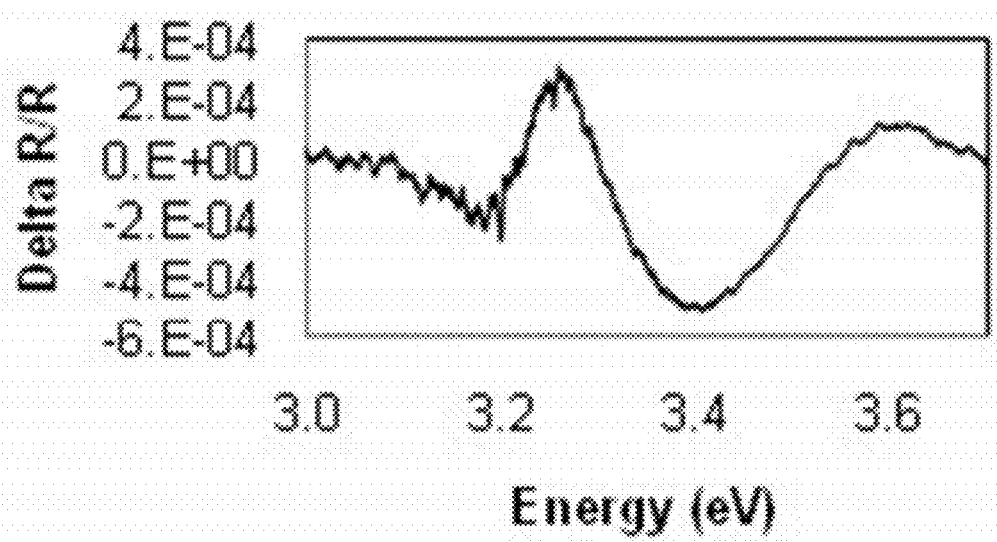
FIG. 104 provides a plot showing a typical PR spectrum of undoped polycrystalline anatase $TiO_2$ on silicon at 298K where the feature at ~3.25 eV is attributed to $TiO_2$.

For characterization of the band bending that drives electrostatic surface-bulk coupling, the chamber has an in situ method for measuring the near-surface electric field based on photoreflectance (PR). PR modulates the dielectric constant (and therefore the reflectance) with a very low intensity (mW/cm$^2$) chopped light source having hv greater than the fundamental band-gap energy $E_g$ [90, 91]. The experimental setup is shown in FIG. 124. Photogenerated minority carriers from laser illumination migrate to the interface and neutralize some charge stored there. The resulting small change in built-in field affects the surface reflectance R in narrow regions of wavelength corresponding to optical transitions of the substrate. The small reflectance change ΔR/R exhibits a spectral dependence that is monitored with a weaker, independent probe beam using phase sensitive detection. The inventors have developed a method for measuring the degree of band bending [87] through experiments that vary temperature and pump intensity. Measurement of band bending in TiO$_2$ has already been demonstrated by related electrode-based modulation spectroscopies [92], and the technique as recently implemented for TiO$_2$, as shown in FIG. 104. PR of ZnO has already been reported in the literature [93].

Integral to the data analysis is continued use of the simulator FLOOPS 2000 (by Mark E. Law of the University of Florida and Al Tasch of the University of Texas/Austin) [31]. This simulator solves the coupled mass balance equations for interstitial atoms, vacancies, and other defects. These equations have the general form for species j:

$$\frac{\partial N_j}{\partial t} = -\frac{\partial J_j}{\partial x} + G_j \quad (1)$$

where $N_j$ denotes concentration and $G_j$ is the net generation rate. The flux $J_j$ incorporates terms due to diffusion and drift (for charged species if electric fields are present). In previous work for Si, expressions for $G_j$ and $J_j$ incorporating activation energies obtained by Maximum Likelihood (ML) estimation were developed [73, 74, 93]. Quantitative parameter sensitivity analysis was also performed [75] to determine which of the activation energies are most important in determining the extent of diffusion. Based on this analysis, the original parameter set for the most sensitive parameters was refined through Maximum A Posteriori (MAP) estimation [78]. These tools can be used for TiO$_2$. This procedure is mathematically rigorous, and involves no arbitrary "curve fitting." FIGS. 49 and 59A show a simulated curve from FLOOPS for TiO$_2$ and Si, respectively, which match experiment closely.

Measurement of Defect Annihilation Kinetics at Surfaces

Using knowledge about the generation of O interstitials at the surface of TiO$_2$, it has been possible to exert control within bulk Si as shown in FIG. 59A, and to employ an analogous strategy with TiO$_2$. Annihilation at surfaces is influenced by two distinct effects: the ease of insertion into surface dangling bonds, and repulsion by charged surface defects. However, these effects can be disaggregated by suitable modeling, especially when near-surface pile-up effects are present.

Bond Insertion

To better understand the mechanisms for defect annihilation, annihilation rates were quantified using an approach developed [94] in terms of a surface annihilation probability S, which is defined as the probability that a defect impinging on the surface is incorporated. Thus, the annihilation probability bears a strong resemblance to a "sticking probability" from the gas phase. The parameter S scales the total defect flux $J_{total}$ to the surface, which can be calculated from hopping rates and statistical arguments. The resulting net flux can be computed as [94]:

$$-D\frac{\partial C}{\partial x}\bigg|_{x=0} = J_{total}S. \quad (2)$$

The flux $J_{total}$ and the concentration gradient ∂C/∂x are best obtained from simulations of defect behavior. To model these effects, a computational model already used for Si [73-75, 78] and TiO$_2$ is adapted.

Ti atoms diffuse by an interstitial mechanism [95, 96] (presumably including periodic lattice capture), and there is evidence that O diffusion for the experimental conditions is interstitial. It is possible to measure S for oxygen interstitials and for metal interstitials using methods substantially similar to those used for Si in the past. Interstitial excesses and good sensitivity in diffusion measurements can be achieved by implanting $^{18}$O or $^{46}$Ti. In the latter case, the metal can be evaporated into the source of the ion gun from the evaporation source. Subsequent heating can release O or Ti interstitials from the locations in which the implanted atoms are "frozen," yielding a flux of isotopic atoms to the surface. Measurement of the profile evolution, and modeling of the resulting shapes, should yield the annihilation probability. Variation of crystallographic orientation, or adsorption of a species such as sulfur, should indicate the extent to which the annihilation probability for these species can be controlled.

Ion implantation can affect the defect structure in the oxide in complicated ways. In the case of TiO$_2$, for example, even simple thermal heating can cause complications in principle. Departures from stoichiometry occur upon heating in vacuum, which in turn leads to defect formation. Rutile TiO$_2$ loses oxygen to the gas phase, resulting in gradual shifts in stoichiometry [23] such that the color of the crystal changes [97] and crystallographic shear planes (CSP) eventually form. The reduced oxide has the stoichiometry TiO$_{2-x}$ and contains both oxygen vacancies and Ti interstitials. There exists some debate as to which point defect dominates under various conditions of reduction [8, 98]. However, there is substantial evidence that for small degrees of reduction (x<10$^{-4}$), oxygen vacancies predominate, while for higher degrees of reduction Ti interstitials predominate. As the concentrations of the two defect types increase, they combine or cluster together to form line, plate and eventually plane (CSP) defects. However, these seem not to form until the Ti$^{3+}$ interstitial concentration reaches 2×10$^{19}$ cm$^{-3}$ [8, 98], which corresponds to a deviation from stoichiometry of x=6×10$^{-4}$. No evidence for such complication has been observed in the TiO$_2$ experiments. Ion implantation does additional violence to the crystal structure, so there is a need to watch for anomalies in the profiles themselves or the modeling results. In ZnO, as-grown single crystals have variable concentrations of zinc and oxygen defects depending on the growth method. The presence of trace amounts of Li and OH$^-$ ions (in hydrothermal growth) affects photoluminescence properties and forms native defect-impurity complexes.

Electrostatic Interaction

Once values of S are obtained for a given defect, the effects of electrostatic repulsion by the surface may be obtained by measuring the band bending by photoreflectance, and inserting the resulting value into the FLOOPS model. On TiO$_2$, electronic states associated with surface oxygen vacancies have been reported to fix the surface Fermi energy roughly 0.7 eV below the conduction band edge [99]. However, diffusion data suggest that this number could be variable depending upon conditions. FIG. 125 shows examples of near-surface $^{18}O$ diffusion profiles taken at roughly similar temperatures under different conditions of photostimulation. Sometimes the profiles decay monotonically into the bulk, and sometimes a pronounced "bump" appears within 5 nm of the surface. The "bump" may be a pile-up connected with electrostatic coupling between the surface and bulk defects. The considerably different shapes probably reflect subtle variations in surface preparation that propagates into the degree of band bending. Indeed, surface Fermi level pinning requires only about $10^{12}$ surface defects/cm$^2$, or about 0.1% of the total surface sites. PR measurements enable correlation of the degree of band bending directly with the profile shapes, and thereby disaggregate electrostatic effects from the bond exchange mechanism through modeling. The additional inputs needed for modeling beyond those discussed in the last section are the charge states of the diffusing species and their ionization levels. The FLOOPS simulator used in conjunction with systems-based methods such as Maximum a Posteriori estimation can quantify these effects.

Measurement of Surface Generation Rates

Generation rates of defects are measured most readily when the substrate contains a deficiency of the defects being examined—a deficiency that the surface then tries to make up. This approach has been employed for O diffusion into TiO$_2$, and generalized to Ti diffusion into TiO$_2$, O diffusion into ZnO, and Zn diffusion into ZnO. Evaporation of monolayer quantities of $^{46}$Ti onto the TiO$_2$ single crystal (or $^{67}$Zn onto ZnO) can permit the tracking of this element into the bulk through interstitial generation. By designing the experimental times and temperatures to keep the diffusion distances modest, a single monolayer can provide more than enough atoms to be visible with SIMS. Indeed, typical doping fluences for commercial implantation of Si are only on the order of $10^{15}$ atoms/cm$^2$, and the resulting profiles are easy to see. The diffused profiles can be analyzed using fitting with FLOOPS. However, to avoid some of the complexities of a complicated reaction-diffusion network of defects as modeled by FLOOPS, another approach can also be used as a supplement. The spreading of a mobile tracer atom in this situation (such as $^{18}$O or $^{46}$Ti) can involve hopping many atomic diameters before incorporating into the lattice. In such cases, it is possible to employ a mathematical framework developed [74] for the diffusional spreading of a step profile. The governing equations for mobile atoms are given by:

$$\partial C_M/\partial t = D_{hop}\nabla^2 C_M - K_{ann}C_M + K_{gen}C_S \quad (3)$$

$$\partial(C_S+C_M)/\partial t = D_{hop}\nabla^2 C_M \quad (4)$$

where $D_{hop}$ denotes the diffusivity of the mobile species, and $K_{ann}$ and $K_{gen}$ respectively denote the rate constants for volumetric annihilation and generation of the mobile species of isotope atom. It is believed that mobile isotope atoms M exist in much smaller concentrations than substitutional atoms "S," and can be considered as unstable intermediates in a chemical reaction. In quasi-equilibrium, Eqs. (3) and (4) can be solved to yield an analytical series expression in the variables $\xi=x/\lambda$ and $\theta=K_{gen}t$. The quantity $\theta$ equals the mean number of migration steps (or equivalently, lattice exchanges) of the foreign atoms, and $\lambda=\sqrt{D_{hop}/K_{ann}}$ equals the mean path length between the generation and annihilation events. This series solution can be fitted to experimental data by varying only the parameters $\lambda$ and $\theta$. $K_{gen}$ can be cast as a surface generation term. Thus, measurement of $K_{gen}$ (through $\theta$) yields a quick estimate of the surface generation rate.

For oxygen, surface generation is complicated by the need to include kinetics for adsorption from the gas phase. For TiO$_2$, it is assumed that the concentration of adsorbed O obeys Langmuir kinetics. Under the experimental conditions, the concentration is near saturation. Adsorbed O must then overcome an activation barrier to be converted into a bulk interstitial. Fortunately, parameter sensitivity analysis using the FLOOPS model shows that the profiles are most sensitive to the kinetics of this step and the hopping diffusivity of the mobile species. Indeed, for TiO$_2$, ML and MAP parameter estimation shows that the activation energies for these two processes are respectively 2.2 and 1.9 eV. It is possible to develop a similar formulation for O diffusion into ZnO. Some diffusion data in the literature for ZnO [100] suggest that O diffuses by a vacancy mechanism. Yet other literature reports suggest the operation of a fast-moving mobile intermediate [51, 52, 68, 111]. Preliminary data (FIG. 126) are consistent with a mobile intermediate.

Optical Effects

Another aspect of defect behavior that offers the prospect of control for defect manipulation is optical stimulation. The hopping rate and/or concentration of charged defects can be affected by illumination due to photostimulated changes in average charge state. (Semiconductor doping can lead to similar effects, as in ZnO [101]). For interstitials, the exchange rate with lattice atoms can also be affected. Although full-blown FLOOPS modeling yields a complete picture of the photostimulation effects, it is also possible to use Eqs. (3) and (4) to compare values of $\lambda$ and $\theta$ in the presence and absence of illumination.

There is reason to believe that either or both of two distinct mechanisms may mediate optical effects on the defects: direct changes in the charge states of bulk point defects, and changes in the charge states of surface defects that propagates indirectly into electrostatic coupling with the bulk defects.

Efforts can focus on Ti interstitials in TiO$_2$ (rutile) and O diffusion in ZnO, since there is a significant knowledge base regarding thermal diffusion. The large 3 eV band gap means that ultraviolet light can create photocarriers. An arc lamp has been used to generate such carriers. This approach has worked fairly well for optically driven surface diffusion on amorphous TiO$_2$, and required only modest photon fluxes.

Applications of Defect Manipulation

This Example provides new possibilities for manipulating bulk defects in a wide variety of applications. For example, such control can improve the properties of TiO$_2$ for solar hydrogen production by water splitting [102] and environmental water remediation by photocatalysis. In these cases, bulk defects left over from synthesis serve as unwanted electron-hole recombination sites. In another application, the reaction of defects with surfaces strongly affects doping processes for integrated circuits by thermal [103] and implantation [104] methods. Certain technology based on surface defect manipulation can be used to ameliorate such problems [105]. In gas sensor applications based on ZnO, point defects influence the sensitivity in ways that appear to be controlled by surface effects [51, 52, 111, 68, 49, 50]. Bulk defect generation at surfaces and interfaces also influences the behavior of solid-state sensor electrolytes such as ZrO$_2$ [42]. The effects of adsorption on bulk defect concentration and equilibration are especially important for strongly bonded solids such as semiconductors or insulators, where defect formation rates in the bulk are low so that surfaces play an important role [20]. The surface effects seen in silicon extend down at least 0.5 μm [1], and can go much further for pure, high-quality solids where there are few mechanisms for defect exchange with the lattice or with defect clusters.

Measurement of Solid Diffusivities in Metal Oxides

Bulk defects often serve as the primary mediators of solid-state diffusion [20, 61, 106]. Solid-state diffusivities find very widespread application in their own right for modeling processes and devices, and have long been used to estimate formation energies of both vacancies and interstitials in semiconductors. The rates of defect creation and annihilation at surfaces can become controlling factors for solid-state diffusion rates—when bulk defect formation rates are slow (as in semiconductors). Consistent and accurate measurement of solid-phase diffusion coefficients require that point defect concentrations be equilibrated, which is sometimes difficult to achieve [107,108]. As shown definitely for Si and tentatively for $TiO_2$, surfaces can play a dominant role in reaching equilibration. If defect exchange with the surface is slow, very long periods may be required for the bulk to reach equilibrium. Such effects may occur commonly for metal oxides, which would have important consequences for measuring both solid-phase diffusion coefficients and defect thermodynamics. Nonequilibrium effects may compromise many previous experimental numbers that did not account for surface adsorption. For example, the measured activation energy for spreading represents the sum of the defect site-to-site hopping energy and a second energy assumed equal to the thermodynamic formation energy. With a passivated surface, most interstitials and vacancies must be created pairwise from within the bulk. The measured "thermodynamic formation energy" may actually represent a kinetic activation barrier for defect formation.

References for Example 6

1. E. G. Seebauer, K. Dev, M. Y. L. Jung, R. Vaidyanathan, C. T. M. Kwok, J. W. Ager, E. E. Haller, and R. D. Braatz, "Controlling Defect Concentrations in Bulk Semiconductors through Surface Adsorption," Phys. Rev. Lett. 97 (2006) 055053.
2. Xiao Zhang, Min Yu, Charlotte T. M. Kwok, Ramakrishnan Vaidyanathan, Richard D. Braatz and Edmund G. Seebauer, "Precursor Mechanism for Interaction of Bulk Interstitial Atoms with Si(100)," Phys. Rev. B, 74 (2006) 235301.
3. M. A. Mendicino and E. G. Seebauer, "Detailed In-Situ Monitoring of Film Growth: Application to TiSi2 CVD", J. Crystal Growth, 134 (1993) 377-385.
4. M. Arita, M. Hosoya, M. Kobayashi and M. Someno, "Depth Profile Measurement by Secondary Ion Mass-Spectrometry for Determining the Tracer Diffusivity of Oxygen in Rutile", J. Am. Ceram. Soc. 62 (1979) 443.
5. T. Bak, J. Nowotny, M. Rekas and C. C. Sorell, "Defect Chemistry and Semiconducting Properties of Titanium Dioxide: II. Defect Diagrams", J. Phys. Chem. Solids 64 (2003) 1057.
6. A. N. Bagshaw and B. G. Hyde, "Oxygen Tracer Diffusion in Magneli Phases TiNO2n-1", J. Phys Chem. Solids 37 (1976) 835.
7. R. Haul and G. Dumbgen, "Sauerstoff-Selbstdiffusion in Rutilkristallen", J. Phys. Chem. Solids 26 (1965) 1.
8. D. J. Derry, D. G. Lees and L. M. Calvert, "A Study of Oxygen Self-Diffusion in the c-direction of Rutile using a Nuclear Technique", J. Phys. Chem. Solids 42 (1981) 57.
9. J-F. Marucco, J. Gautron and P. Lemasson, "Thermogravimetric and Electrical Study of Nonstoichiometric Titanium-Dioxide TiO2-X between 800 and 1100 Degrees-C", J. Phys. Chem. Solids 42 (1981) 363.
10. E. Iguchi and K. Yajima, "Diffusion of Oxygen Vacancies in Reduced Rutile (TiO2)", J. Phy. Soc. Jpn. 32 (1972) 1415.
11. M. A. Henderson, "A Surface Perspective on Self-diffusion in Rutile TiO2", Surface Science 419 (1999) 174.
12. M. Li, W. Hebenstreit, U. Diebold, A. M. Tyryshkin, M. K. Bowman, G. G. Dunham and M. A. Henderson, "The Influence of the Bulk Reduction State on the Surface Structure and Morphology of Rutile TiO2(110) Single Crystals", Journal of Physical Chemistry B 104 (2000) 4944.
13. M. Radecka, P. Sobas and M. Rekas, "Ambipolar diffusion in TiO2", Solid State Ionics 119 (1999) 55.
14. E. G. Seebauer and M. C. Kratzer, "Charged Defects in Semiconductors: Structure, Thermodynamics, and Diffusion", Engineering Materials and Processes Series (London, Springer-Verlag, 2009).
15. R. Vaidyanathan, M. Y. L. Jung and E. G. Seebauer, "Mechanism and Energetics of Self-Interstitial Formation and Diffusion in Silicon," Phys. Rev. B, 75 (2007) 195209.
16. N. E. B. Cowern, K. T. F. Janssen, G. F. A. van de Walle and D. J. Gravesteijn, "Impurity Diffusion via an Intermediate Species—The B-Si System", Phys. Rev. Lett. 65 (1990) 2434.
17. E. G. Seebauer and M. C. Kratzer, "Charged Point Defects in Semiconductors," Materials Science & Engineering Reviews, 55 (2006) 57.
18. R. Vaidyanathan, M. Y. L. Jung, R. D. Braatz and E. G. Seebauer, "Measurement of Defect-Mediated Diffusion: The Case of Silicon Self-Diffusion," AIChE J., 52 (2006) 366.
19. S. Na-Phattalung, M. F. Smith, K. Kwiseon, D. Mao-Hua, W. Su-Huai, S. B. Zhang and S. Limpijumnong, "First-principles study of native defects in anatase TiO2", Physical Review B 73 (2006) 125205.
20. Shewmon, P. Diffusion in Solids (Minerals, Metals, & Materials Soc., Warrendale, Pa., 1989).
21. R. Vaidyanathan, PhD dissertation (University of Illinois at Urbana-Champaign, 2003).
22. W. Heegemann, K. H. Meister, E. Bechtold and K. Hayek, "The Adsorption of Sulfur on the (100) and (111) Faces of Platinum: A LEED and AES Study", Surface Science 49 (1975) 161.
23. U. Diebold, "The Surface Science of Titanium Dioxide," Surface Science Reports, 48 (2003) 53.
24. K. Dev, M. Y. L. Jung, R. Gunawan, R. D. Braatz and E. G. Seebauer, "Mechanism for Coupling between Properties of Interfaces and Bulk Semiconductors," Phys. Rev. B 68 (2003) 195311.
25. M. Y. L. Jung, R. Gunawan, R. D. Braatz and E. G. Seebauer, "Effect of Near-Surface Band Bending on Dopant Profiles in Ion-Implanted Silicon," J. Appl. Phys. 95 (2004) 1134.
26. Kapil Dev and E. G. Seebauer, "Band Bending at the Si(111)-SiO2 Interface Induced by Low-Energy Ion Bombardment," Surface Sci. 550 (2004) 185.
27. M. A. Makeev and A. L. Barabasi, "Effect of Surface Roughness on the Secondary Ion Yield in Sputtering," Appl. Phys. Lett. 73 (1998) 1445.
28. M. Y. L. Jung and E. G. Seebauer, "Measurement of Nonthermal Illumination-Enhanced Self-Diffusion in Silicon," Proc. Fourth International Workshop on Junction Technology, (Fudan Univ Press, Shanghai, 2004) 87-89.
29. Yevgeniy V. Kondratenko and Edmund G. Seebauer, "Directed Self-Assembly by Photostimulation of an Amorphous Semiconductor Surface," AIChE J., in press.

30. I. E. Wachs and B. M. Weckhuysen, "Structure and Reactivity of Surface Vanadium Oxide Species on Oxide Supports," Appl. Catalysis A 157 (1997) 67.
31. See Mark Law, http://www.swamp.tec.ufl.edu/
32. Edmund G. Seebauer and Robert L. Barry, Fundamentals of Ethics for Scientists and Engineers (Oxford Univ. Press, New York, 2001).
33. H. Bracht, S. P. Nicols, W. Walukiewicz, J. P. Silveira, F. Briones and E. E. Haller, "Large Disparity between Gallium and Antimony Self-Diffusion in Gallium Antimonide," Nature 408 (2000) 69.
34. K. Watanabe, T. Taniguche and H. Kanda, "Direct-bandgap Properties and Evidence for Ultraviolet Lasing of Hexagonal Boron Nitride Single Crystal," Nature Materials 3 (2004) 404.
35. I. E. Wachs and B. M. Weckhuysen, "Structure and Reactivity of Surface Vanadium Oxide Species on Oxide Supports," Appl. Catalysis A 157 (1997) 67.
36. J. Haber, M. Witko and R. Tokarz, "Vanadium Pentoxide I: Structure and Properties," Appl. Catal. A 157 (1997) 3.
37. J. A. Rodriguez, T. Jirsak, G. Liu, J. Hrbek, D. Dvorak and A. Maiti, "Chemistry of NO2 on Oxide Surfaces: Formation of NO3 on TiO2(110) and NO2-O Vacancy Interactions, Journal of the American Chemical Society 123 (2001) 9597.
38. Y. Gao, Y. Liang and S. A. Chambers, "Thermal Stability and the Role of Oxygen Vacancy Defects in Strong Metal Support Interaction—Pt on Nb-doped TiO2(100)," Surface Science 365 (1996) 638.
39. J. A. Rodriguez, G. Liu, T. Jirsak, J. Hrbek, Z. Chang, J. Dvorak and A. Maiti, "Activation of gold on Titania: Adsorption and Reaction of SO2 on Au/TiO2(110)," Journal of the American Chemical Society 124 (2002) 5242.
40. T. Fukami, T. Naruoka, T. Momose and N. Bamba, "Effects of Sputtering Atmosphere Oxygen Pressure on Photocatalytic Phenomena in Anatase Films," Japanese Journal of Applied Physics, Part 2 (Letters) 41 (2002) L794.
41. S. Takeda, S. Suzuki, H. Okada and H. Hosono, "Photocatalytic TiO2 Thin Film Deposited onto Glass by DC Magnetron Sputtering," Thin Solid Films 392 (2001) 338.
42. H. Hener and L. W. Hobbs, Science and Technology of Zirconia, Adv. Ceramics 3 (Amer. Ceram. Soc., Columbus, 1981).
43. Gratzel, M., "Photoelectrochemical cells," Nature 414 (2001) 338.
44. J. Bao, M. A, Zimmler, F. Capasso, X. Wang and Z. F. Ren, "Broadband ZnO Single-Nanowire Light-Emitting Diode", Nano Letters 6 (2006), 1719.
45. A. B. Djuriscaroni and Y. H. Leung, "Optical Properties of ZnO Nanostructures", Small 2 (2006), 944.
46. U. Ozgur, Y. I. Alivov, C. Liu, A. Teke, M. A. Reshchikov, S. Dogan, V. Avrutin, S. J. Cho and H. Morkoc, "A Comprehensive Review of ZnO Materials and Devices", Journal of Applied Physics 98 (2005) 041301.
47. J. G. E. Gardeniers, Z. M. Rittersma and G. J. Burger, "Preferred Orientation and Piezoelectricity in Sputtered ZnO Films", Journal of Applied Physics 83 (1998) 7844.
48. P. Mitra, A. P. Chatterjee and H. S. Maiti, "ZnO Thin Film Sensor", Materials Letters 35 (1998), 33.
49. M. W. Ahn, K. S. Park, J. H. Heo, J. G. Park, D. W. Kim, K. J. Choi, J. H. Lee and S. H. Hong, "Gas Sensing Properties of Defect-controlled ZnO-nanowire Gas Sensor", Applied Physics Letters 93 (2008) 263103.
50. S. C. Navale, V. Ravi, I. S. Mulla, S. W. Gosavi and S. K. Kulkarni, "Low Temperature Synthesis and NOx Sensing Properties of Nanostructured Al-doped ZnO", Sensors and Actuators B: Chemical 126 (2007) 382.
51. H. Haneda, I. Sakaguchi, A. Watanabe, T. Ishigaki and J. Tanaka, "Oxygen Diffusion in Single and Poly-Crystalline Zinc Oxides", Journal of Electroceramics 4 (1999) 41.
52. A. C. S. Sabioni, M. J. F. Ramos and W. B. Ferraz, "Oxygen Diffusion in Pure and Doped ZnO", Materials Research 6 (2003) 173
53. M. I. Current, M. Inoue, S. Nakashima, N. Ohno, M. Kuribara, Y. Matsunaga, T. Hara, D. Wagner, S. Leung, B. Adibi, G. Lecouras, L. A. Larson and S. Prussin, "Defect Engineering of p+-junctions by Multiple-species Ion Implantation," Nucl. Instrum. Meth. Phys. Res. B 74 (1993) 175.
54. M. Li, W. Hebenstreit, U. Diebold, A. M. Tyryshkin, M. K. Bowman, G. G. Dunham and M. A. Henderson, "The Influence of the Bulk Reduction State on the Surface Structure and Morphology of Rutile TiO2(110) Single Crystals," J. Phys. Chem. B 104 (2000) 4944.
55. M. Li, W. Hebenstreit and U. Diebold, "Oxygen-induced Restructuring of the Rutile TiO2(110)(11) Surface," Surface Sci. 414 (1998) L951.
56. M. Li, W. Hebenstreit and U. Diebold, "Morphology Change of Oxygen-restructured TiO2(110) Surfaces by UHV Annealing: Formation of a Low-temperature (1 2) Structure," Phys. Rev. B 61 (2000) 4926.
57. K. F. McCarty and N. C. Bartelt, "Role of Bulk Thermal Defects in the Reconstruction Dynamics of the TiO2(110) Surface," Phys. Rev. Lett. 90 (2003) 046104.
58. T. A. Kirichenko, S. Banerjee, and G. S. Hwang, "Interactions of Neutral Vacancies and Interstitials with the Si(001) Surface," Phys. Rev. B 70 (2004) 045321.
59. T. A. Kirichenko, S. Banerjee, and G. S. Hwang, "Surface Chemistry Effects on Vacancy and Interstitial Annihilation on Si(001)," Phys. Status Solidi B 241 (2004) 2303.
60. K. F. McCarty, J. A. Nobel and N. C. Bartelt, "Vacancies in Solids and the Stability of Surface Morphologies," Nature 412 (2001) 622.
61. W. Frank, U. Goesele, H. Mehrer, and A. Seeger, "Diffusion in Silicon and Germanium," in Diffusion in Crystalline Solids, edited by G. E. Murch and A. S. Nowick (Academic, New York, 1984).
62. B. L. Sharma, "Diffusion in Silicon and Germanium," Defect and Diffusion Forum, 70 & 71 (1990) 1.
63. R. B. Fair, "Physics and Chemistry of Impurity Diffusion and Oxidation of Silicon," in Silicon Integrated Circuits, Part B, ed. D. Kahng (New York, Academic Press, 1981).
64. H. Bracht, E. E. Haller, and R. Clark-Phelps, "Silicon Self-diffusion in Isotope Heterostructures" Phys. Rev. Lett. 81 (1998) 393.
65. A. Ural, P. B. Griffin and J. D. Plummer, "Fractional Contributions of Microscopic Diffusion Mechanisms for Common Dopants and Self-diffusion in Silicon" J. Appl. Phys. 85 (1999) 6440.
66. A. Ural, P. B. Griffin, and J. D. Plummer, "Self-diffusion in Silicon: Similarity Between the Properties of Native Point Defects," Physical Review Letters 83 (1999) 3454.
67. A. Ural, P. B. Griffin, and J. D. Plummer, "Nonequilibrium Experiments on Self-diffusion in Silicon at Low Temperatures using Isotopically Enriched Structures," Physica B 273-274 (1999) 512.
68. G. W. Tomlins, J. L. Routbort and T. O. Mason, "Oxygen Diffusion in Single-Crystal Zinc Oxide", Journal of the American Ceramic Society 81 (1998) 869.
69. W.-C Lee, S.-G Lee and K. J. Chang, "First-principles Study of the Self-interstitial Diffusion Mechanism in Silicon," J. Phys.: Cond. Matter 10 (1998) 995.

70. G. D. Watkins, "Defects in Irradiated Silicon: EPR and Electron-nuclear Double Resonance of Interstitial Boron," Phys. Rev. B 12 (1975) 5824.

71. W. Windl, M. M. Bunea, R. Stumpf, S. T. Dunham and M. P. Masquelier, "First-Principles Study of Boron Diffusion in Silicon," Phys. Rev. Lett. 83 (1999) 4345.

72. M. Hakala, M. J. Puska and R. M. Niemenen, "First-principles Calculations of Interstitial Boron in Silicon" Phys. Rev. B 61 (2000) 8155.

73. M. Y. L. Jung, R. Gunawan, R. D. Braatz and E. G. Seebauer, "Pair Diffusion and Kick-out: Quantifying Relative Contributions to Diffusion of Boron in Silicon," AIChE J. 50 (2004) 3248.

74. M. Y. L. Jung, R. Gunawan, R. D. Braatz and E. G. Seebauer, "A Simplified Picture for Transient Enhanced Diffusion of Boron in Silicon," J. Electrochem. Soc. 151 (2004) G1.

75. M. Y. L. Jung, R. Gunawan, R. D. Braatz and E. G. Seebauer, "Parameter Sensitivity Analysis of Boron Activation and Transient Enhanced Diffusion in Silicon," J. Electrochem. Soc. 150 (2003) G758.

76. R. Gunawan, M. Y. L. Jung, E. G. Seebauer, and R. D. Braatz, "Optimal Control of Rapid Thermal Annealing in a Semiconductor Process," J. Process Control 14 (2004) 270.

77. M. Y. L. Jung, R. Gunawan, R. D. Braatz and E. G. Seebauer, "Ramp-Rate Effects on Transient Enhanced Diffusion and Dopant Activation: a Simple Explanation," J. Electrochem. Soc. 150 (2003) G838.

78. R. Gunawan, M. Y. L. Jung, E. G. Seebauer and R. D. Braatz, "Maximum A Posteriori Estimation of Transient Enhanced Diffusion Energetics," AIChE J. 49 (2003) 2114.

79. E. Wieser, H. Syhre, F. G. Rudenauer, and W. Steiger, "Influence of Flash-lamp Annealing on the Diffusion Behaviour of Ion Implanted Boron Profiles," Phys. Stat. Sol. A 81 (1984) 247.

80. Y. Ishikawa and M. Maruyama, "Diffusion of Phosphorus and Boron into Silicon at Low Temperatures by Heating with Light Irradiation" Jpn. J. Appl. Phys. 36 (1997) 7433.

81. J. Gyulai, H. Ryssel, L. P. Biro, L. Frey, A. Kuki, T. Kormany, G. Serfozo and N. Q. Khanh, "Athermal Effects in Ion-Implanted Layers", Radiation Effects and Defects in Solids 127 (1994) 397.

82. S. Noel, L. Ventura, A. Slaoui, J. C. Muller, B. Groh, R. Schindler, B. Froeschle and T. Theiler, "Optical Effects During Rapid Thermal Diffusion", J. Electron. Mat. 27 (1998) 1315.

83. S. Noel, L. Ventura, A. Slaoui, J. C. Muller, B. Groh, R. Schindler, B. Froeschle and T. Theiler, "Impact of Ultraviolet Light During Rapid Thermal Diffusion," Appl. Phys. Lett. 72 (1998) 2583.

84. R. B. Fair and S. Li, "Photonic Effects in the Deactivation of Ion Implanted Arsenic" J. Appl. Phys. 83 (1998) 4081.

85. B. Lojek, R. Whiteman and R. Ahrenkiel, "Athermal Annealing of Ion-implanted Silicon," Proc. 9th International Conference on Advanced Thermal Processing of Semiconductors (RTP2001 and IEEE, 2001) 125.

86. R. Ditchfield, D. Llera-Rodriguez, and E. G. Seebauer, "Nonthermal Effects of Photon Illumination on Surface Diffusion," Phys. Rev. Lett. 81 (1998) 1259.

87. R. Ditchfield, D. Llera-Rodriguez, and E. G. Seebauer, "Semiconductor Surface Diffusion: Nonthermal Effects of Photon Illumination," Phys. Rev. B 61 (2000) 13,710.

88. Y. Kondratenko, C. T. M. Kwok, R. Vaidyanathan and E. G. Seebauer, "Optically Stimulated Diffusion in Ultrashallow Junction Formation," Proc. 17th Intl Conference on Ion Implantation Technology (AIP, NY, 2008) 228.

89. M. A. Mendicino and E. G. Seebauer, "Detailed In-Situ Monitoring of Film Growth: Application to TiSi2 CVD", J. Crystal Growth 134 (1993) 377.

90. M. Cardona, K. L. Shaklee and F. H. Pollak, "Electroreflectance at semiconductor-electrolyte interface" Phys. Rev. 154 (1967) 696.

91. C. R. Carlson, W. F. Buechter, F. Che-Ibrahim and E. G. Seebauer, "Adsorption/Desorption Kinetics of H2O on GaAs(100) Measured by Photoreflectance," J. Chem. Phys. 99 (1993) 7190.

92. P. Salvador, "Dynamic Electrolyte Electroreflectance Measurements for the In-situ Detection of Flatband Potential Shifts," Electrochimica Acta. 37 (1992) 957.

93. J. V. Beck and K. J. Arnold, Parameter Estimation in Engineering and Science, (New York, Wiley, 1977).

94. C. T. M. Kwok, K. Dev, R. D. Braatz, and E. G. Seebauer, "A Method for Quantifying Annihilation Rates of Bulk Point Defects at Surfaces," J. Appl. Phys. 98 (2005) 013524.

95. D. A. Venkatu and L. E. Poteat, "Diffusion of Titanium in Single Crystal Rutile," Material Science and Engineering 5 (1970) 258.

96. K. Hoshino, N. L. Peterson and C. L. Wiley, "Diffusion and Point Defects in TiO2-x," Journal of Physics and Chemistry of Solids 46 (1985) 1397.

97. L. P. Zhang, M. Li and U. Diebold, "Characterization of Ca Impurity Segregation on the TiO2(110) Surface," Surface Sci. 412/413 (1998) 242.

98. M. Aono and R. R. Hasiguti, "Interaction and Ordering of Lattice Defects in Oxygen-deficient Rutile TiO2-x," Phys. Rev. B 48 (1993) 12406.

99. V. E. Heinrich, G. Dresselhaus and H. J. Zeiger, "Observation of Two-Dimensional Phases Associated with Defect States on the Surface of TiO2," Phys. Rev. Lett. 36 (1976) 1335.

100. G. W. Tomlins, J. L. Roubort and T. O. Mason, "Zinc self-diffusion, Electrical properties, and Defect Structure of Undoped, Single Crystal Zinc Oxide," Journal of Applied Physics 87, (2000) 117.

101. H. Haneda, J. Tanaka, S. Hishita, T. Ohgaki and N. Ohashi, "Oxygen Diffusion in Zinc Oxide Single Crystals," Key Engineering Materials 157-158 (1999) 221-6.

102. Y. Diamant, S. G. Chen, O. Melamed and A. Zaban, "Core-shell Nanoporous Electrode for Dye Sensitized Solar Cells," J. Phys. Chem. B 107 (2003) 1977.

103. S. A. Campbell, The Science and Engineering of Microelectronic Fabrication, 2nd ed. (New York, Oxford, 2001).

104. S. C. Jain, W. Schoenmaker, R. Lindsay, P. A. Stolk, S. Decoutere, M. Willander, and H. E. Maes. "Transient Enhanced Diffusion of Boron in Si," J. Appl. Phys. 91 (2002) 8919.

105. E. G. Seebauer, R. D. Braatz, M. Y. L. Jung and R. Gunawan, "Methods for Controlling Dopant Concentration and Activation in Semiconductor Structures," US patent application filed August 2004.

106. P. M. Fahey, P. B. Griffin, and J. D. Plummer, "Point Defects and Dopant Diffusion in Silicon," Rev. Mod. Phys. 61 (1989) 289.

107. W. Hirschwald, G. Neumann and P. Bonasewicz, "Diffusion of Zinc and Oxygen in Nonstoichiometric Zinc Oxide," Transport in Non-Stoichiometric Compounds. Proceedings of the First International Conference (1982) 153.

108. B. J. Wuensch and H. L. Tuller, "Lattice Diffusion, Grain Boundary Diffusion and Defect Structure of ZnO," J. Phys. Chem. Solids 55 (1994) 975.

109. Edmund G. Seebauer, "Whistleblowing: Is It Always Obligatory?" Chemical Engineering Progress, 100 (2004) 23.
110. E. G. Seebauer, "Blowing the Whistle: How Does Intention Count?" Chemical Engineering, 108 (April, 2001) 123.
111. P. Erhart and K. Albe, "First-principles study of intrinsic point defects in ZnO: Role of band structure, volume relaxation, and finite-size effects," Physical Review B 73 (2006) 115207.

Example 7

Semiconductor-Metal Interfaces in Memory Resistors

Semiconductor-Metal Interfaces in Memory Resistors

FIG. 127 provides a plot of current as a function of voltage in panel (A), a schematic of a device in panel (B), and an expanded view of the device in panel (C). In the plot of current as a function of voltage of panel (A), current ranges from −5 to 5 mA and voltage ranges from −1.5 to 1.5 V. In the schematic of a device of panel (B), islands of Pt are provided in a layer of $TiO_2$, which is provided on a layer of Pt, which is provided on a layer of $SiO_2$, which is provided on a layer of Si. In the expanded view of the device of panel (C), conductive nanofilaments are shown extending from the Pt islands, through the $TiO_2$ layer.

Semiconductor-Substrate Interfaces in Dye-Sensitized Solar Cells

FIG. 128 provides a schematic of a representation of the energy levels leading to current flow in a dye-sensitized solar cell in panel (A) and provides an electron micrograph of $TiO_2$ in a dye-sensitized solar cell in panel (B) adapted from Gratzel, J. Photochem. and Photobio. C 4 (2003) 145 and Ruhe, J. Phys. Chem. B 108 (2004) 17946. The schematic of a dye-sensitized solar cell of panel (A) comprises a conducting glass, $TiO_2$, a dye, an electrolyte, and a cathode. Also shown in panel (A) is an energy level diagram plotting $E_{VS}$ in volts for components of the dye-sensitized solar cell.

Application in Nanoelectronics: ZnO Nanowires for LEDs

FIG. 129 provides a plot of intensity as a function of wavelength for ZnO nanowires. Intensity for as-grown (top curve, solid line), Ar annealing (middle curve, dashed line), and $O_2$ annealing (bottom curve, dotted line) are presented. Intensity is in arbitrary units, while wavelength ranges from 350 nm to 650 nm.

Zinc Oxide Optical Gas Sensors

FIG. 130 provides a schematic representation of the fact that $NO_x$ adsorption on ZnO nanowires can change the emission intensity of luminescence in the green region of the spectrum in panel (A) and provides an optical micrograph of such emission from ZnO nanowires in panel (B) (Xudong Wang, Christopher J. Summers, and Zhong Lin Wang, Nano Letters, 2004, 4 (3), pp 423-426).

Example 8

Control of Oxygen Self-Diffusion in Metal Oxides for Nanoelectronics and Electrostatic Coupling of Surface Charge to Bulk Defect Behavior in Metal Oxides Point defects, such as vacancies and interstitials, strongly influence the performance of nanoelectronic devices including $NO_x$ gas sensors, ultraviolet LEDs, memory resistors and water splitting devices. These devices operate by conductivity, photoluminescence, bipolar switching, and photocatalysis mechanisms, respectively. Planar defects, such as crystallographic shear planes (CSPs), influence the performance of memory resistors operating via a switching mechanism, as discussed in Example 7.

In general, defect engineering seeks to control defect behavior; particularly diffusion rate and majority defect type and concentration. For metal oxides, like $TiO_2$ and ZnO, the majority point defect is O vacancy, and O-related defects typically dominate key properties, such as atomic diffusion rates and electrical behavior. In $TiO_2$, surface-based methods provide enhanced defect injection rates via "active" surfaces and enhanced near-surface concentrations mediated by electrostatics.

Chemically "active" surfaces (see FIG. 61) have dangling bonds leading to facile defect creation. The "active" surfaces can be created by a suitable sequence of preparation protocols, and once created can open pathways for new diffusing species and speed diffusion. Further, the diffusion can be controlled via suitable adsorbates, e.g., N on Si, S on $TiO_2$ (see FIG. 66C). For metal oxides, O interstitials can react with O vacancies that detrimentally affect $h^+$ in photocatalysis and do unwanted n-type self-doping in nanoelectronics.

The common mechanism for oxygen diffusion in many metal oxide semiconductors is a vacancy-mediated mechanism. Literature experiments studying $^{18}O$ diffusion in rutile $TiO_2$ (110) and ZnO <0001> show that site-to-site hopping of vacancies results in an error function shape in $^{18}O$ concentration profile curves (see FIGS. 113 and 131). In contrast, an "active" surface provides a new defect creation pathway that speeds up O diffusion and is manifested in exponentially shaped concentration profiles.

An apparatus for studying the mechanism of isotopic self-diffusion of oxygen is shown in FIG. 132. The apparatus is an ultra-high vacuum chamber attached to a turbomolecular pump for maintaining a clean, active surface. Rutile $TiO_2$ (110) or ZnO <0001> samples were mounted on a sample mount interfaced with resistive heating leads and a thermocouple. The samples were pre-annealed in $^{16}O_2$ for 6 hours to equilibrate, and subsequently isotopically annealed in $^{18}O_2$ at 650-800° C., $5\times10^{-4}$-$1\times10^{-6}$ torr for 90 minutes. O interstitials are injected directly from surface adsorbate. The $^{18}O_2$ profile was measured ex situ by SIMS and modeled.

For a diffusion mechanism mediated by fast-moving intermediates that exchange occasionally with the crystalline lattice, the concentration profile of the species diffusing takes on a particular shape. Specifically, a short-time kinetic limit, the solution of an analytical diffusion model has an exponential shape:

$$\ln\left(\frac{C_S(x,t) - C_{min}}{C_{max} - C_{min}}\right) = \ln(s) = \ln(K_{gen}t/2) - x/\lambda$$

The exponential shape is corroborated by experimental data shown in FIG. 133, and cannot be explained by a simple vacancy mechanism. Instead, pressure-dependent studies in $TiO_2$ suggest O diffusion via interstitials with diffusivities >10× faster than the literature average.

Previous calculations and experiments on polycrystalline ZnO have shown evidence for O interstitials, (Sabioni, Mat. Res. 2003; Haneda, J. Electroceram. 1999; Erhart, Phys. Rev. B 2006; Huang, J. Phys. Condens. Matter 2009), and the present inventors have identified a kick-in/kick-out mechanism for $O_i$ diffusion in $TiO_2$.

Here, experimental data taken in the presence of chemically active surfaces are shown in FIG. 126, which shows a near-exponential shape deep in ZnO with a slight upper concavity unlike a complementary error function. When plotted in semi-logarithmic form, the exponential shape manifests itself as a linear region. FIG. 126 also shows isotopic pile-up near the surface, which is mediated by a distinct electrostatic effect. (Ikeda, *J. Am. Ceram. Soc.*, 76 (1993) 2473; Souza, *Phys. Chem.*, 10 (2008) 2356.)

The electrostatic effect can be explained as follows. As shown in FIG. 134, the surface injects O interstitials in a −1 charge state, and a near-surface electric field retards motion of the $O_i$ diffusing into the bulk causing the $O_i$ to exchange into the lattice close to the surface. Over time, more kick-in of exchanged $^{18}O_i$ causes pile-up.

Near-surface isotopic O pile-up in metal oxides has been observed before but not well understood. For example, the formation of space-charge has previously been identified but not linked to O pile-up. (Ikeda, *J. Am. Ceram. Soc.*, 76 (1993) 2473.) And even when a vacancy-mediated O pile-up was proposed in $SrTiO_3$, the direct effects of electric drift on charged defect motion was neglected. (Souza, *Phys. Chem.*, 10 (2008) 2356.)

O pile-up behavior is observed to be similar in ZnO and $TiO_2$ (FIG. 135), and O pile-up is observed in the first 1-5 nm of $TiO_2$ after annealing (FIG. 136), but rigorous data interpretation requires numerical simulations. Thus, O pile-up in $TiO_2$ was modeled using FLOOPS (Law and Tasch, University of Florida), which includes continuum equations for defects, and utilizes parameters from systems-based estimation techniques along with an exponentially decaying electric potential near the surface:

$$J_j = -D \underbrace{\frac{\partial N_j}{\partial x}}_{\text{Diffusion}} + \underbrace{\mu \gamma_j \varepsilon(x) N_j}_{\text{Electric drift}}$$

$$\frac{\partial N_j}{\partial t} = -\underbrace{\frac{\partial J_j}{\partial x}}_{\text{Flux}} + \underbrace{G_j}_{\text{Defect reaction}}$$

The simulations (FIG. 137) show O pile-up in the first 3-4 nm, like the experiments, and with increasing surface potential, the residence time (~90 ns) rises by 20%. Notably, pile-up is absent if O interstitials are assumed neutral.

Summary

The O diffusion mechanisms of $TiO_2$ and ZnO are similar. Both display exponential profiles indicative of fast-moving oxygen interstitial intermediates injected by the active surface, and near-surface O pile-up, which suggests that other O-deficient metal oxides will have the same behavior. Understanding this mechanism of enhanced defect injection rates via "active" surfaces allows for surface-based defect engineering to inject O interstitials to eliminate O vacancies that destroy $h^+$ in photocatalysis and do unwanted n-type self-doping in nanoelectronics. Further, near-surface concentrations may be mediated by electrostatics to control the width of the space-charge region and optimize $e^-$-$h^+$ separation in photocatalysis and water splitting.

Example 9

Electrostatic Coupling of Surface Charge to Bulk Defect Behavior in Metal Oxides Semiconductor surfaces typically support electrical charge and the near-surface bulk supports charge of equal amount but opposite sign. This charge separation strongly affects the efficiency of photocatalysis (e.g., in $H_2O$ splitting to form hydrogen gas for fuel), the sensitivity of gas sensing devices (in which the electrical conductivity changes), and defect engineering (through the diffusion of point defects).

Within metal oxides, point defects such as interstitials and vacancies interact with the electric fields within regions of space charge because the defects are usually electrically charged. Most commonly, metal oxide point defects are O vacancies in the +2 charge state.

One direct consequence of defect charging is field-driven diffusion, which influences the fabrication of memory resistors (for bipolar switching). Indirect effects of charged defects result from changes in defect charge state as the defects encounter regions of substantially differing electron richness—a common occurrence in space charge regions. For example, when a defect is capable of taking on multiple charge states, the majority state may vary with local $e^-$ richness. This change in charge state affects a defect's diffusion and drift behavior. Such effects tend to be very pronounced in nanostructures where most of the structural volume is near a surface.

Pile-up of dopants and isotopes near surfaces has been observed experimentally, (See, e.g., Example 8), and two distinct mechanisms have been proposed. First, a change of interstitial charge state results from band bending that pushes $E_F$ across interstitial ionization levels and decreases the rate at which substitutional dopants are displaced. Second, the vacancy concentration can vary with position due to a surface potential-dependent formation energy, which leads to impeded diffusion flux near the surface. This Example, demonstrates a new electrostatic mechanism for charged interstitials.

Using the experimental set-up and simulation method discussed in Example 8, along with the fact that the surface can inject adsorbed $^{18}O$ as $^{18}O_i$ and also annihilate $O_i$ according to FIG. 138 and the equation:

it was possible to develop a kinetic model that describes the overall rate at which isotopic oxygen initially present in the gas phase takes on interstitial form in the bulk semiconductor.

The Langmuir kinetics of adsorption were modeled using:

$$\vartheta = \frac{\sqrt{bP}}{1 + \sqrt{bP}}$$

$$b = \nu e^{-\frac{\Delta H_{ads}}{kT}}$$

where θ is coverage and P is the partial pressure of $O_2$. An activation barrier for generation was optimized to match the SIMS profiles. Annihilation was quantified by:

$$-D \left.\frac{\delta C}{\delta x}\right|_{x=0} = J_{total} S$$

where S is the annihilation probability.

The surface potential Φ sets the near-surface electric field and displays an exponential spatial variation (FIG. 139) that is a typical functional form in equilibrated oxides (Gouy-Chapman approximation). Solving Poisson's equation for Φ(x), the main positive species was identified as $O_v^{+2}$ and the main negative species were identified as n and $^{18}O^{-1}$. When the initial spatial variation of n and $O_v$ were determined from equilibrium kinetics (Ikeda et al., J. Am. Ceram. Soc., 76 (1993)), the Debye screening length was determined to be δ~2-5 nm and band bending of ~0.66 eV was calculated from electroneutrality in the bulk.

Simulations show O pile-up in the first 3-4 nm (FIG. 137) from the surface. Without a surface charge, the average residence time is about 90 ns, whereas with a surface charge, the residence time increases by about 20%. Pile-up is absent if O interstitials are assumed to be neutral. The pile-up shape and width largely agree with SIMS profiles.

Summary

A new mechanism for O pile-up in metal oxides is provided in this Example. The mechanism operates when charged interstitials carry the flux. Electric field impedes motion into the bulk and increases the time for kick-in. This mechanism differs from other mechanisms mediated by a change in defect charge state or variable vacancy concentration. Wider and steeper pile-up leads to better charge separation that produces more efficient photocatalysis and gas sensing.

STATEMENTS REGARDING INCORPORATION BY REFERENCE AND VARIATIONS

All references cited throughout this application, for example patent documents including issued or granted patents or equivalents; patent application publications; and non-patent literature documents or other source material; are hereby incorporated by reference herein in their entireties, as though individually incorporated by reference, to the extent each reference is at least partially not inconsistent with the disclosure in this application (for example, a reference that is partially inconsistent is incorporated by reference except for the partially inconsistent portion of the reference). The following references relate generally to controlling defects in semiconductor materials and are hereby incorporated by reference in their entireties: (1) U.S. Pat. No. 7,846,822; (2) U.S. patent application publication no. 2010-0048005; (3) *Control of Defect Concentrations within a Semiconductor through Adsorption* in Physical Review Letters, 97, 055503 (2006); and (4) *Trends in semiconductor defect engineering at the nanoscale* in Materials Science and Engineering R, 70 (2010) 151-168.

The terms and expressions which have been employed herein are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments, exemplary embodiments and optional features, modification and variation of the concepts herein disclosed may be resorted to by those skilled in the art, and that such modifications and variations are considered to be within the scope of this invention as defined by the appended claims. The specific embodiments provided herein are examples of useful embodiments of the present invention and it will be apparent to one skilled in the art that the present invention may be carried out using a large number of variations of the devices, device components, methods and steps set forth in the present description. As will be obvious to one of skill in the art, methods and devices useful for the present methods can include a large number of optional composition and processing elements and steps.

When a group of substituents is disclosed herein, it is understood that all individual members of that group and all subgroups, including any isomers, enantiomers, and diastereomers of the group members, are disclosed separately. When a Markush group or other grouping is used herein, all individual members of the group and all combinations and subcombinations possible of the group are intended to be individually included in the disclosure. When a compound is described herein such that a particular isomer, enantiomer or diastereomer of the compound is not specified, for example, in a formula or in a chemical name, that description is intended to include each isomer and enantiomer of the compound described individually or in any combination. Additionally, unless otherwise specified, all isotopic variants of compounds disclosed herein are intended to be encompassed by the disclosure. For example, it will be understood that any one or more hydrogens in a molecule disclosed can be replaced with deuterium or tritium. Isotopic variants of a molecule are generally useful as standards in assays for the molecule and in chemical and biological research related to the molecule or its use. Methods for making such isotopic variants are known in the art. Specific names of compounds are intended to be exemplary, as it is known that one of ordinary skill in the art can name the same compounds differently.

It must be noted that as used herein and in the appended claims, the singular forms "a", "an", and "the" include plural reference unless the context clearly dictates otherwise. Thus, for example, reference to "a cell" includes a plurality of such cells and equivalents thereof known to those skilled in the art, and so forth. As well, the terms "a" (or "an"), "one or more" and "at least one" can be used interchangeably herein. It is also to be noted that the terms "comprising", "including", and "having" can be used interchangeably. The expression "of any of claims XX-YY" (wherein XX and YY refer to claim numbers) is intended to provide a multiple dependent claim in the alternative form, and in some embodiments is interchangeable with the expression "as in any one of claims XX-YY."

Unless defined otherwise, all technical and scientific terms used herein have the same meanings as commonly understood by one of ordinary skill in the art to which this invention belongs. Although any methods and materials similar or equivalent to those described herein can be used in the practice or testing of the present invention, the preferred methods and materials are now described. Nothing herein is to be construed as an admission that the invention is not entitled to antedate such disclosure by virtue of prior invention.

Every formulation or combination of components described or exemplified herein can be used to practice the invention, unless otherwise stated.

Whenever a range is given in the specification, for example, a temperature range, a time range, or a composition or concentration range, all intermediate ranges and subranges, as well as all individual values included in the ranges given are intended to be included in the disclosure. As used herein, ranges specifically include the values provided as endpoint values of the range. For example, a range of 1 to 100 specifically includes the end point values of 1 and 100. It will be understood that any subranges or individual values in a range or subrange that are included in the description herein can be excluded from the claims herein.

As used herein, "comprising" is synonymous with "including," "containing," or "characterized by," and is inclusive or open-ended and does not exclude additional, unrecited elements or method steps. As used herein, "consisting of" excludes any element, step, or ingredient not specified in the claim element. As used herein, "consisting essentially of" does not exclude materials or steps that do not materially affect the basic and novel characteristics of the claim. In each instance herein any of the terms "comprising", "consisting essentially of" and "consisting of" may be replaced with either of the other two terms. The invention illustratively described herein suitably may be practiced in the absence of any element or elements, limitation or limitations which is not specifically disclosed herein.

One of ordinary skill in the art will appreciate that starting materials, biological materials, reagents, synthetic methods, purification methods, analytical methods, assay methods, and biological methods other than those specifically exemplified can be employed in the practice of the invention without resort to undue experimentation. All art-known functional equivalents, of any such materials and methods are intended to be included in this invention. The terms and expressions which have been employed are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered to be within the scope of this invention as defined by the appended claims.

What is claimed is:

1. A method for controlling a concentration of O interstitials or complexes thereof in a metal oxide structure, said method comprising the steps of:
    providing said metal oxide structure having an exposed surface and a bulk, wherein said exposed surface is an atomically clean surface;
    treating said exposed surface of said metal oxide structure with a surface modifying agent, wherein interaction between said surface modifying agent and said metal oxide structure forms molecules or atoms on the exposed surface providing defect control groups on said exposed surface;
    generating a selected surface abundance of said molecules or atoms on said exposed surface; and
    annealing said exposed surface populated by said selected surface abundance of said molecules or atoms at a temperature of at least 500° C. under a partial pressure of oxygen gas to provide a source of O atoms from said exposed surface to the bulk of said metal oxide structure; thereby controlling the concentration of said O interstitials or complexes thereof in said metal oxide structure.

2. The method of claim 1, wherein said metal oxide is $TiO_2$ or ZnO.

3. The method of claim 2, wherein said selected surface abundance of said molecules or atoms on the exposed surface controls a rate that said O interstitials or complexes thereof are injected into, or otherwise generated in, said $TiO_2$ or ZnO structure.

4. The method of claim 2, wherein said selected surface abundance of said molecules or atoms on the exposed surface eliminates between 0.1% and 80% of dangling bonds on said exposed surface of said $TiO_2$ or ZnO structure.

5. The method of claim 2, wherein said selected surface abundance of said molecules or atoms on the exposed surface controls a spatial distribution of said O interstitials or complexes thereof in said $TiO_2$ or ZnO structure.

6. The method of claim 2, wherein said step of treating said exposed surface of said $TiO_2$ or ZnO structure with said surface modifying agent generates a selected surface abundance of chemisorbed atoms or molecules on said exposed surface of said $TiO_2$ or ZnO structure.

7. The method of claim 2, wherein said step of treating said exposed surface of said $TiO_2$ or ZnO structure with said surface modifying agent generates sulfur atoms or sulfur-containing molecules on said exposed surface of said $TiO_2$ or ZnO structure.

8. The method of claim 7, wherein said surface modifying agent is a sulfur-containing gas or a sulfur-containing liquid.

9. The method of claim 7, wherein said surface modifying agent is elemental sulfur, $CS_2$, $H_2S$, $SO_2$, $SO_3$, $SCl_2$, $S_2Cl_2$, $SOCl_2$, $SO_2Cl_2$, $HSO_3Cl$, a thiol, a sulfoxide, a sulfone, $SF_6$ or any combination of these, wherein the surface modifying agent is applied to the exposed surface as a gas.

10. The method of claim 7, wherein said surface modifying agent is $H_2SO_4$, $SOCl_2$, $SO_2Cl_2$, $HSO_3Cl$, a thiol, a sulfoxide, or a sulfone, wherein the surface modifying agent is applied to the exposed surface as a liquid in a purified state or dissolved in a solvent.

11. The method of claim 7, wherein said surface modifying agent is dimethyl sulfoxide, sulfolane or methanethiol provided as a gas or liquid.

12. The method of claim 2, wherein said $TiO_2$ or ZnO structure is a single crystalline material or a polycrystalline material, having a slight excess or deficiency in oxygen atoms.

13. The method of claim 12, wherein said $TiO_2$ structure has the chemical formula $TiO_{2-x}$, wherein x is less than 0.05.

14. The method of claim 2, wherein said $TiO_2$ or ZnO structure is a $TiO_2$ or ZnO layer or a $TiO_2$ or ZnO particle having a cross sectional dimension selected from the range of 1 nanometer to 10 microns.

15. The method of claim 2, wherein said step of treating said exposed surface of said $TiO_2$ or ZnO structure with said surface modifying agent comprises:
    determining said selected surface abundance of said molecules or atoms on the exposed surface selected from the range of $5 \times 10^{12}$ molecules or atoms $cm^{-2}$ to $2 \times 10^{15}$ molecules or atoms $cm^{-2}$ or from the range of 0.01 monolayer to 3 monolayers, wherein said selected surface abundance of said molecules or atoms on the exposed surface is selected so as to control the concentration of said O interstitials or complexes thereof in said $TiO_2$ or ZnO structure so as to achieve a selected spatial distribution of said O interstitials or complexes thereof in said $TiO_2$ or ZnO structure; and
    terminating said treating step when said selected surface abundance of said molecules or atoms on the exposed surface is reached.

16. The method of claim 2, wherein the step of treating said exposed surface of said $TiO_2$ or ZnO structure with said surface modifying agent is carried out while the $TiO_2$ or ZnO structure is exposed to electromagnetic radiation, wherein said surface modifying agent is a photoactive surface modifying agent.

17. The method of claim 2, wherein said $TiO_2$ or ZnO structure is a component of a memory resistor, a dye-sensitized solar cell, a light-emitting diode, an optical gas sensor, a photocatalytic water splitting assembly or a solid-state sensor.

18. The method of claim 1, wherein said molecules or atoms on the exposed surface are selected from the group consisting of C, N, P, As, Sb, Bi, S, Se, Te, F, Cl, Br, and I and molecules containing C, N, P, As, Sb, Bi, S, Se, Te, F, Cl, Br, or I.

19. The method of claim 1, wherein said selected surface abundance of said molecules or atoms on the exposed surface is selected from the range of 0.01 monolayer to 3 monolayers or is selected from the range of $5\times10^{12}$ molecules or atoms $cm^{-2}$ to $2\times10^{15}$ molecules or atoms $cm^{-2}$.

20. The method of claim 1, wherein the partial pressure of oxygen gas is selected from a range of $10^{-6}$ Torr to 1500 Torr.

21. A method for controlling a concentration of defects in a material, said method comprising the steps of:
   providing said material having an exposed surface and a bulk;
   treating said exposed surface of said material with a surface modifying agent, wherein interaction between said surface modifying agent and said material forms molecules or atoms on the exposed surface selected from the group consisting of C, N, P, Bi, S, Se, Te, F, Cl, Br, and I and molecules containing C, N, P, Bi, S, Se, Te, F, Cl, Br, or I providing defect control groups on said exposed surface;
   generating a selected surface abundance of said molecules or atoms on the exposed surface; and
   annealing said exposed surface populated by said selected surface abundance of said molecules or atoms at a temperature of at least 500° C. under a partial pressure of oxygen gas to provide a source of O atoms from said exposed surface to the bulk of said material; thereby controlling the concentration of defects in said material.

22. The method of claim 21, wherein said selected surface abundance of said molecules or atoms on the exposed surface is selected from the range of 0.01 monolayer to 3 monolayers or is selected from the range of $5\times10^{12}$ molecules or atoms $cm^{-2}$ to $2\times10^{15}$ molecules or atoms $cm^{-2}$.

23. The method of claim 21, wherein said material is a metal oxide selected from the group consisting of $TiO_2$, $ZrO_2$, ZnO, $Co_3O_4$, and cobalt spinels having the formula $CoX_2O_4$, wherein X is Al, Ga, or In, and wherein said metal oxide has a slight excess or deficiency of oxygen atoms.

24. The method of claim 21, wherein said material has the formula $TiO_{2-x}$, wherein x is less than 0.05; or wherein said material is a perovskite having a slight excess or deficiency of oxygen atom; or wherein said material is a multiferroic thin film, a ferroelectric thin film, a piezoelectric thin film, or a pyroelectric thin film; or wherein said material is a superconducting thin film.

25. The method of claim 21, wherein the partial pressure of oxygen gas is selected from a range of $10^{-6}$ Torr to 1500 Torr.

26. A method for decreasing a concentration of vacancies in a metal oxide structure, said method comprising the steps of:
   providing said metal oxide structure having an exposed surface and a bulk;
   cleaning said exposed surface to produce an atomically clean surface;
   providing a partial pressure of oxygen gas as a source of O atoms from said exposed surface to the bulk of the metal oxide structure, wherein at least a portion of said O atoms combine with said vacancies, thereby decreasing said concentration of vacancies in said metal oxide structure;
   treating said exposed surface of said metal oxide structure with a surface modifying agent, wherein interaction between said surface modifying agent and said metal oxide structure forms molecules or atoms on the exposed surface providing defect control groups on said exposed surface;
   generating a selected surface abundance of said molecules or atoms on said exposed surface; and
   annealing said exposed surface populated by said selected surface abundance of said molecules or atoms at a temperature of at least 500° C.

27. The method of claim 26, further comprising a step of equilibrating a first defect concentration within a bulk of said metal oxide structure with a second defect concentration on said atomically clean surface of said metal oxide structure.

28. The method of claim 27, further comprising a step of monitoring the second defect concentration on said atomically clean surface of said metal oxide structure.

29. The method of claim 28, wherein said monitoring step is performed using photoreflectance.

30. The method of claim 26, wherein said metal oxide is $TiO_2$ or ZnO.

31. The method of claim 26, wherein said metal oxide structure is a particle or thin film.

32. The method of claim 31, wherein said particle or said thin film has a cross sectional dimension selected from the range of 1 nanometer to 10 microns.

33. The method of claim 31, wherein said particle or said thin film has a cross sectional dimension selected from the range of 1 nanometer to 1000 nanometers.

34. The method of claim 31, wherein said particle or said thin film has a cross sectional dimension selected from the range of 1 nanometer to 500 nanometers.

35. The method of claim 26, wherein said metal oxide structure has a ratio of surface area to volume greater than or equal to $0.2$ $nm^{-1}$.

36. The method of claim 26, wherein said metal oxide structure has a ratio of surface area to volume selected over the range of $0.2$ $nm^{-1}$ to $0.002$ $nm^{-1}$.

37. The method of claim 26, wherein a space charge region at said exposed surface has a thickness selected from the range of 1 nm to 100 nm provided that the thickness of the space charge region is 80% or less of a characteristic dimension of said metal oxide structure.

38. The method of claim 26, wherein the partial pressure of oxygen gas is selected from a range of $10^{-6}$ Torr to 1500 Torr.

* * * * *